US011839138B2

(12) United States Patent
Nishimura

(10) Patent No.: US 11,839,138 B2
(45) Date of Patent: Dec. 5, 2023

(54) ORGANIC ELECTROLUMINESCENT ELEMENT AND ELECTRONIC DEVICE

(71) Applicant: IDEMITSU KOSAN CO., LTD., Tokyo (JP)

(72) Inventor: Kazuki Nishimura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 673 days.

(21) Appl. No.: 16/850,111

(22) Filed: Apr. 16, 2020

(65) Prior Publication Data

US 2020/0335709 A1 Oct. 22, 2020

(30) Foreign Application Priority Data

Apr. 17, 2019 (JP) ................................ 2019-078931
Apr. 17, 2019 (JP) ................................ 2019-078935

(51) Int. Cl.

| | |
|---|---|
| ***H10K 85/30*** | (2023.01) |
| ***C09K 11/06*** | (2006.01) |
| ***C09K 11/02*** | (2006.01) |
| ***H10K 85/40*** | (2023.01) |
| ***H10K 85/60*** | (2023.01) |
| *H10K 50/11* | (2023.01) |
| *H10K 50/15* | (2023.01) |
| *H10K 50/16* | (2023.01) |
| *H10K 50/12* | (2023.01) |
| *H10K 101/10* | (2023.01) |

(52) U.S. Cl.

CPC ............ *H10K 85/342* (2023.02); *C09K 11/02* (2013.01); *C09K 11/06* (2013.01); *H10K 85/322* (2023.02); *H10K 85/346* (2023.02); *H10K 85/40* (2023.02); *H10K 85/636* (2023.02); *H10K 85/6572* (2023.02); *H10K 85/6574* (2023.02); *C09K 2211/1007* (2013.01); *C09K 2211/1029* (2013.01); *C09K 2211/1044* (2013.01); *C09K 2211/1088* (2013.01); *C09K 2211/185* (2013.01); *H10K 50/11* (2023.02); *H10K 50/121* (2023.02); *H10K 50/15* (2023.02); *H10K 50/16* (2023.02); *H10K 2101/10* (2023.02)

(58) Field of Classification Search

CPC ............. H01L 51/0061; H01L 51/0071; H01L 51/008; H01L 51/5016; H01L 51/0087; H01L 51/0085; C09K 2211/1029; C09K 2211/185; C09K 11/00

See application file for complete search history.

(56) References Cited

U.S. PATENT DOCUMENTS

| | | | |
|---|---|---|---|
| 2012/0104940 A1 | 5/2012 | Shin et al. | |
| 2013/0221338 A1* | 8/2013 | Kawamura | H01L 51/006 257/40 |
| 2014/0175419 A1 | 6/2014 | Nakano et al. | |
| 2014/0183486 A1 | 7/2014 | Nakano et al. | |
| 2014/0183500 A1 | 7/2014 | Ikeda et al. | |
| 2015/0155498 A1 | 6/2015 | Ahn et al. | |
| 2015/0236274 A1 | 8/2015 | Hatakeyama et al. | |
| 2017/0324043 A1 | 11/2017 | Ikeda et al. | |
| 2019/0058124 A1 | 2/2019 | Hatakeyama et al. | |

FOREIGN PATENT DOCUMENTS

| | | |
|---|---|---|
| WO | WO-2012/153780 A1 | 11/2012 |
| WO | WO-2013/038650 A1 | 3/2013 |
| WO | WO-2014/104144 A1 | 7/2014 |
| WO | WO-2015/091716 A1 | 6/2015 |
| WO | WO-2016/193243 A1 | 12/2016 |

* cited by examiner

*Primary Examiner* — Gregory D Clark
(74) *Attorney, Agent, or Firm* — Foley & Lardner LLP

(57) ABSTRACT

An organic electroluminescence device includes an anode, an emitting layer, and a cathode, in which the emitting layer contains a first compound and a second compound, the second compound satisfying (a), (b), (c), and (d) of: (a) a half bandwidth being 30 nm or less; (b) ionization potential being 6.0 eV or less; (c) a singlet energy $S_1$(M2) being 2.6 eV or more; and (d) a peak top in a toluene solution being 465 nm or less.

37 Claims, No Drawings

ORGANIC ELECTROLUMINESCENT ELEMENT AND ELECTRONIC DEVICE

The entire disclosure of Japanese Patent Application No. 2019-078935, filed Apr. 17, 2019 and Japanese Patent Application No. 2019-078931, filed Apr. 17, 2019, are expressly incorporated by reference herein.

TECHNICAL FIELD

The present invention relates to an organic electroluminescence device and an electronic device.

BACKGROUND ART

When a voltage is applied to an organic electroluminescence device (hereinafter, occasionally referred to as "organic EL device"), holes and electrons are injected from an anode and a cathode, respectively, into an emitting layer. The injected electrons and holes are recombined in the emitting layer to form excitons. Specifically, according to the electron spin statistics theory, singlet excitons and triplet excitons are generated at a ratio of 25%:75%.

Organic EL device finds its application in full-color displays of cellular phones, televisions, and the like. In order to enhance the performance of the organic EL device, various studies have been made for compounds used in the organic EL device (see, for instance, Patent Literature 1 (WO 2015/091716) and Patent Literature 2 (WO 2016/193243)). The performance of the organic EL device is evaluatable in terms of, for instance, luminance, emission wavelength, chromaticity, half width, emission efficiency, drive voltage, and lifetime.

SUMMARY OF THE INVENTION

An object of the invention is to provide an organic electroluminescence device capable of enhancing device performance thereof and an electronic device including the organic electroluminescence device.

According to an aspect of the invention, an organic electroluminescence device including an anode, an emitting layer, and a cathode is provided, in which the emitting layer contains a first compound and a second compound, the second compound satisfying (a), (b), (c), and (d) below;

(a) a half bandwidth being 30 nm or less;

(b) ionization potential being 6.0 eV or less;

(c) a singlet energy $S_1$(M2) being 2.6 eV or more; and (d) a peak top in a toluene solution being 465 nm or less.

According to another aspect of the invention, an organic electroluminescence device including an anode, an emitting layer, and a cathode is provided, in which the emitting layer contains a first compound and a second compound, the second compound being at least one compound selected from the group consisting of compounds represented by a formula (11), a formula (21), a formula (31), a formula (41), a formula (51), a formula (61), a formula (71) and a formula (81) is provided,

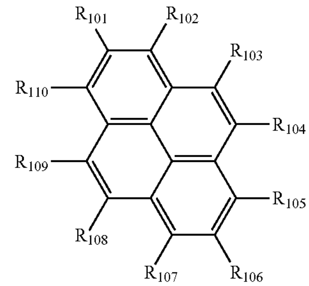

(11)

where, in the formula (11): at least one combination of adjacent two or more of $R_{101}$ to $R_{110}$ are mutually bonded to form a substituted or unsubstituted monocyclic ring, mutually bonded to form a substituted or unsubstituted fused ring, or not mutually bonded;

$R_{101}$ to $R_{110}$ not forming the substituted or unsubstituted monocyclic ring and not forming the substituted or unsubstituted fused ring each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

at least one of $R_{101}$ to $R_{110}$ not forming the substituted or unsubstituted monocyclic ring and not forming the substituted or unsubstituted fused ring is a monovalent group represented by a formula (12) below;

$R_{901}$, $R_{902}$, $R_{903}$, $R_{904}$, $R_{905}$, $R_{906}$, and $R_{907}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different;

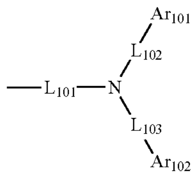

(12)

where, in the formula (12): $Ar_{101}$ and $Ar_{102}$ are each independently a substituted or unsubstituted aryl group having 6 to 50 ring carbon atoms, or a substituted or unsubstituted heterocyclic group having 5 to 50 ring atoms; and $L_{101}$ to $L_{103}$ are each independently a single bond, a substituted or unsubstituted arylene group having 6 to 30 ring carbon atoms, or a substituted or unsubstituted divalent heterocyclic group having 5 to 30 ring atoms;

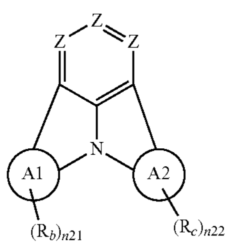

(21)

where, in the formula (21): Z are each independently $CR_a$ or N, a plurality of Z being mutually the same or different;

A1 ring and A2 ring are each independently a substituted or unsubstituted aromatic hydrocarbon ring having 6 to 50 ring carbon atoms or a substituted or unsubstituted heterocycle having 5 to 50 ring atoms;

when a plurality of $CR_a$ are present, at least one combination of adjacent two or more of $CR_a$ are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of $R_b$ are present, at least one combination of adjacent two or more of $R_b$ are mutually bonded to form a substituted or unsubstituted monocyclic ring, mutually bonded to form a substituted or unsubstituted fused ring, or not mutually bonded;

when a plurality of $R_a$ are present, at least one combination of adjacent two or more of $R_a$ are mutually bonded to form a substituted or unsubstituted monocyclic ring, mutually bonded to form a substituted or unsubstituted fused ring, or not mutually bonded;

$R_a$, $R_b$ and $R_c$ not forming the substituted or unsubstituted monocyclic ring and not forming the substituted or unsubstituted fused ring each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formula (21) respectively represent the same as $R_{901}$ to $R_{907}$ of the formula (11);

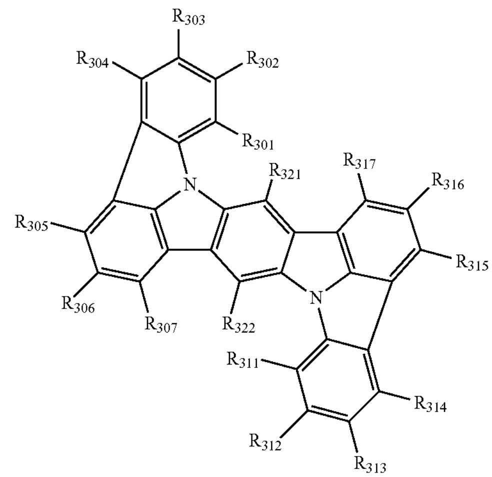

(31)

where, in the formula (31): at least one combination of adjacent two or more of $R_{301}$ to $R_{307}$ and $R_{311}$ to $R_{317}$ are mutually bonded to form a substituted or unsubstituted monocyclic ring, mutually bonded to form a substituted or unsubstituted fused ring, or not mutually bonded;

$R_{301}$ to $R_{307}$ and $R_{311}$ to $R_{317}$ not forming the substituted or unsubstituted monocyclic ring and not forming the substituted or unsubstituted fused ring each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{321}$ and $R_{322}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formula (31) respectively represent the same as $R_{901}$ to $R_{907}$ of the formula (11);

(41)

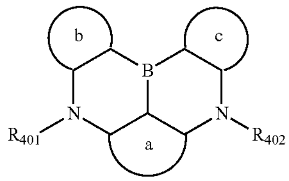

where, in the formula (41): a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{401}$ and $R_{402}$ are each independently bonded with the a ring, b ring, or c ring to form a substituted or unsubstituted heterocycle having 5 to 50 ring atoms, or not bonded with the a ring, b ring or c ring;

$R_{401}$ and $R_{402}$ not forming the substituted or unsubstituted heterocycle having 5 to 50 ring atoms each independently are a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

(51)

p-q-r-s-t (52)

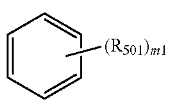

(53)

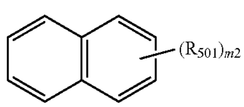

(54)

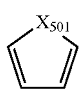

(55)

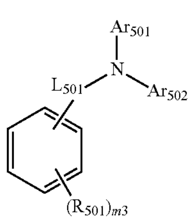

(56)

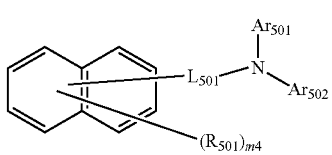

where, in the formula (51): r ring is a ring represented by the formula (52) or the formula (53), the r ring being fused at any positions of respective adjacent rings;

q ring and s ring are each independently a ring represented by the formula (54) and fused at any positions of respective adjacent rings;

p ring and t ring are each independently a ring represented by the formula (55) or the formula (56) and fused at any positions of respective adjacent rings;

m1 in the formula (52) is 2;

m2 in the formula (53) is 4;

m3 in the formula (55) is 3;

m4 in the formula (56) is 5;

when a plurality of $R_{501}$ are present, the plurality of $R_{501}$ are mutually the same or different;

when a plurality of $R_{501}$ are present in the formula (52), the formula (53), the formula (55) or the formula (56), at least one combination of adjacent two or more of the plurality of $R_{501}$ are mutually bonded to form a substituted or unsubstituted monocyclic ring, mutually bonded to form a substituted or unsubstituted fused ring, or not mutually bonded;

$X_{501}$ in the formula (54) is an oxygen atom, a sulfur atom, or $NR_{502}$;

when a plurality of $X_{501}$ are present, the plurality of $X_{501}$ are mutually the same or different;

when a plurality of $R_{502}$ are present, the plurality of $R_{502}$ are mutually the same or different;

$R_{501}$ not forming the substituted or unsubstituted monocyclic ring and not forming the substituted or unsubstituted fused ring and $R_{502}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (52) to (54) respectively represent the same as $R_{901}$ to $R_{907}$ of the formula (11);

in the formulae (55) and (56):

$Ar_{501}$ and $Ar_{502}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $Ar_{501}$ are present, the plurality of $Ar_{501}$ are mutually the same or different;

when a plurality of Arson are present, the plurality of Arson are mutually the same or different;

$L_{501}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms; and when a plurality of $L_{501}$ are present, the plurality of $L_{501}$ are mutually the same or different;

(61)

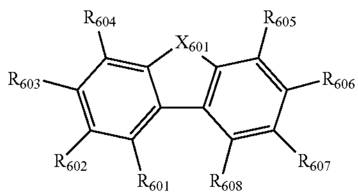

where, in the formula (61): $X_{601}$ is an oxygen atom, a sulfur atom, or $NR_{609}$;

at least one combination of adjacent two or more of $R_{601}$ to $R_{604}$ are mutually bonded to form a substituted or unsubstituted monocyclic ring, mutually bonded to form a substituted or unsubstituted fused ring, or not mutually bonded;

the at least one combination of the adjacent two or more of $R_{601}$ to $R_{604}$ are mutually bonded to form a divalent group represented by a formula (62) below;

at least one combination of adjacent two or more of $R_{605}$ to $R_{608}$ are mutually bonded to form a substituted or unsubstituted monocyclic ring, mutually bonded to form a substituted or unsubstituted fused ring, or not mutually bonded;

the at least one combination of the adjacent two or more of $R_{605}$ to $R_{608}$ are mutually bonded to form a divalent group represented by a formula (63) below;

(62)

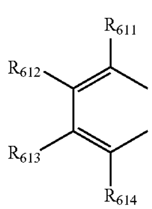

(63)

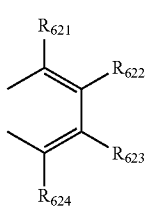

at least one of $R_{601}$ to $R_{604}$ not forming the divalent group represented by the formula (62), not forming the substituted or unsubstituted monocyclic ring and not forming the substituted or unsubstituted fused ring, and $R_{611}$ to $R_{614}$ in the formula (62) are each a monovalent group represented by a formula (64) below, at least one of $R_{605}$ to $R_{608}$ not forming the divalent group represented by the formula (63), not forming the substituted or unsubstituted monocyclic ring and not forming the substituted or unsubstituted fused ring, and $R_{621}$ to $R_{624}$ in the formula (63) are each a monovalent group represented by a formula (64) below, (64)

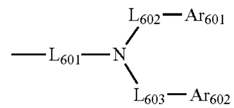

$R_{601}$ to $R_{608}$ not forming the divalent group represented by the formula (62) or (63), not being the monovalent group represented by the formula (64), not forming the substituted or unsubstituted monocyclic ring and not forming the substituted or unsubstituted fused ring, $R_{611}$ to $R_{614}$ and $R_{621}$ to $R_{624}$ not being the monovalent group represented by the formula (64), and $R_{609}$ are each independently:

a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (61) to (64) respectively represent the same as $R_{901}$ to $R_{907}$ of the formula (11);

in the formula (64): $Ar_{601}$ and $Ar_{602}$ are each independently a substituted or unsubstituted aryl group having 6 to 50 ring carbon atoms, or a substituted or unsubstituted heterocyclic group having 5 to 50 ring atoms; and $L_{601}$ to $L_{603}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of the substituted or unsubstituted arylene group having 6 to 30 ring carbon atoms and the substituted or unsubstituted divalent heterocyclic group having 5 to 30 ring atoms;

(71)

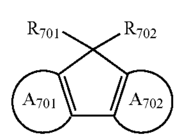

where, in the formula (71): a combination of $R_{701}$ and $R_{702}$ are mutually bonded to form a substituted or unsubstituted monocyclic ring, mutually bonded to form a substituted or unsubstituted fused ring, or not mutually bonded;

$A_{701}$ ring and $A_{702}$ ring are each independently a substituted or unsubstituted aromatic hydrocarbon ring having 6 to 50 ring carbon atoms or a substituted or unsubstituted heterocycle having 5 to 50 ring atoms; and at least one of a ring selected from the group consisting of $A_{701}$ ring and $A_{702}$ ring is bonded to a bond * of a structure represented by a formula (72) below;

(72)

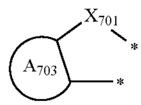

where, in the formula (72): $A_{70}3$ ring is each independently a substituted or unsubstituted aromatic hydrocarbon ring having 6 to 50 ring carbon atoms or a substituted or unsubstituted heterocycle having 5 to 50 ring atoms;

$X_{701}$ is $NR_{703}$, $C(R_{704})(R_{705})$, $Si(R_{706})(R_{707})$, $Ge(R_{708})(R_{709})$, an oxygen atom, a sulfur atom, or a selenium atom;

$R_{701}$ and $R_{702}$ not forming the substituted or unsubstituted monocyclic ring and not forming the substituted or unsubstituted fused ring and $R_{703}$ to $R_{709}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (71) to (72) respectively represent the same as $R_{901}$ to $R_{907}$ of the formula (11);

(81)

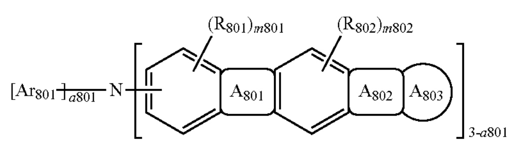

(82)

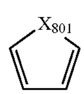

(83)

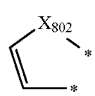

where, in the formula (81): $A_{801}$ ring is a ring represented by the formula (82) and fused at any positions of adjacent rings;

$A_{802}$ ring is a ring represented by the formula (83) and fused at any positions of adjacent rings, two bonds * of the $A_{802}$ ring being bonded to any positions of $A_{803}$ ring;

$X_{801}$ and $X_{802}$ are each independently $C(R_{803})(R_{804})$, $Si(R_{805})(R_{806})$, an oxygen atom, or a sulfur atom;

$A_{803}$ ring is a substituted or unsubstituted aromatic hydrocarbon ring having 6 to 50 ring carbon atoms or a substituted or unsubstituted heterocycle having 5 to 50 ring atoms;

$Ar_{501}$ is a substituted or unsubstituted aryl group having 6 to 50 ring carbon atoms, or a substituted or unsubstituted heterocyclic group having 5 to 50 ring atoms;

$R_{801}$ to $R_{806}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (81) to (83) respectively represent the same as $R_{901}$ to $R_{907}$ of the formula (11);

m801 and m802 are each independently 0, 1, or 2;

when m801 is 2, the two $R_{801}$ are mutually the same or different;

when m802 is 2, the two $R_{802}$ are mutually the same or different;

a801 is 0, 1, or 2;

when a801 is 0 or 1, the structures enclosed by brackets with a subscript of "3-a801" are mutually the same or different; and when m801 is 2, the two $Ar_{801}$ are mutually the same or different.

According to still another aspect of the invention, an electronic device including the organic electroluminescence device according to the above aspect of the invention is provided.

According to the above aspect of the invention, an organic electroluminescence device capable of improving device performance can be provided. According to the further aspect of the invention, an electronic device installed with the organic electroluminescence device can be provided.

BRIEF EXPLANATION OF DRAWING(S)

A FIGURE schematically illustrates an arrangement of an organic electroluminescence device according to an exemplary embodiment.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a protium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B) (Herein, an unsubstituted aryl group refers to an "unsubstituted aryl group" in a "substituted or unsubstituted aryl group," and a substituted aryl group refers to a "substituted aryl group" in a "substituted or unsubstituted aryl group.") A simply termed "aryl group" herein includes both of "unsubstituted aryl group" and "substituted aryl group."

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by substituting a hydrogen atom bonded to a carbon atom of a skeleton of a "substituted aryl group" in the specific example group G1B below, and a group derived by substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived by removing one hydrogen atom from cyclic structures represented by formulae (TEMP-1) to (TEMP-15) below.

(TEMP-1)

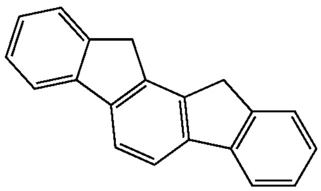

(TEMP-2)

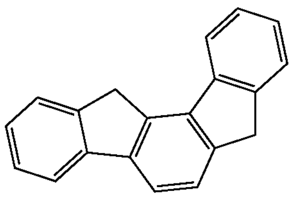

(TEMP-3)

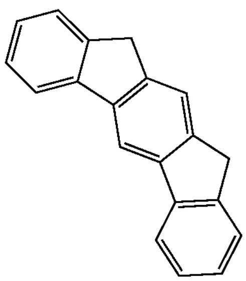

(TEMP-4)

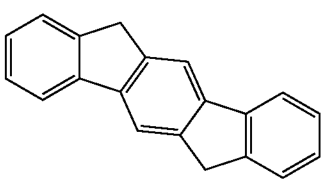

(TEMP-5)

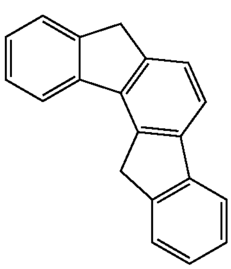

(TEMP-6)

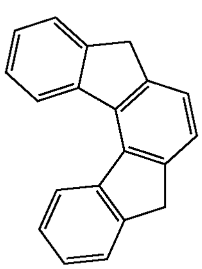

-continued (TEMP-7)

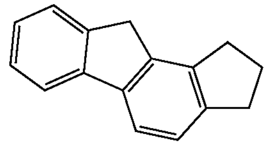

(TEMP-8)

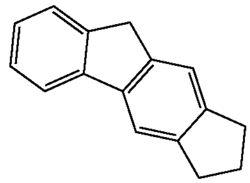

(TEMP-9)

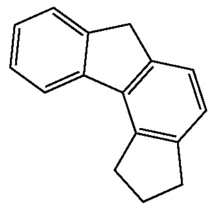

(TEMP-10)

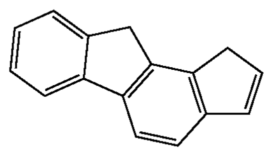

(TEMP-11)

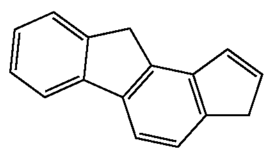

(TEMP-12)

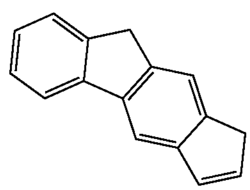

(TEMP-13)

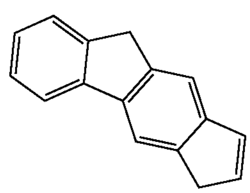

(TEMP-14)

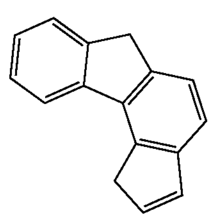

-continued (TEMP-15)

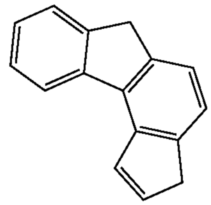

Substituted Aryl Group (Specific Example Group G1B): o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B) (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by substituting a hydrogen atom bonded to a ring atom of a skeleton of a "substituted heterocyclic group" in the specific example group G2B below, and a group derived by substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazinyl group, pyrimidinyl group, pyrazinyl group, a triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing a Hydrogen Atom from Cyclic Structures Represented by Formulae (TEMP-16) to (TEMP-33) Below (Specific Example Group G2A4):
(TEMP-16)
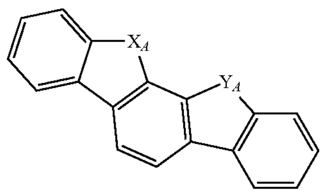
(TEMP-17)
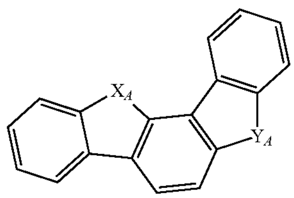
(TEMP-18)
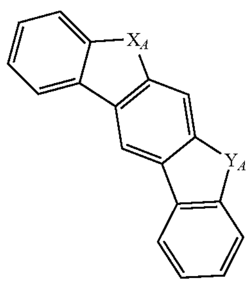
(TEMP-19)
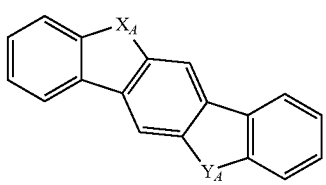
(TEMP-20)
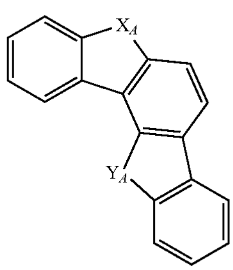
(TEMP-21)
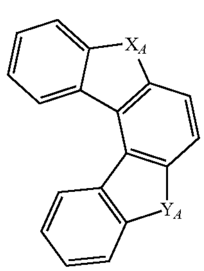
-continued
(TEMP-22)
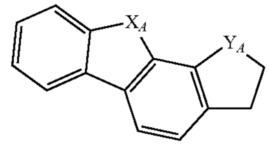
(TEMP-23)
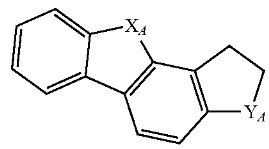
(TEMP-24)
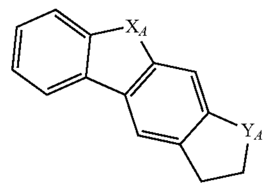
(TEMP-25)
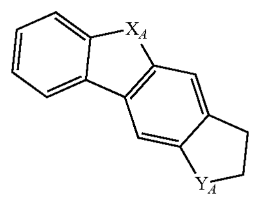
(TEMP-26)
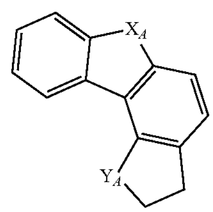
(TEMP-27)
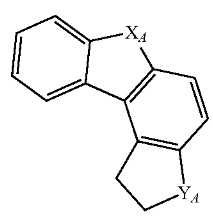
(TEMP-28)
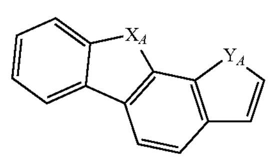
(TEMP-29)
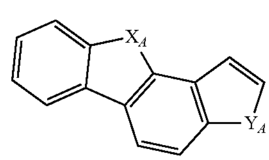

-continued (TEMP-30)

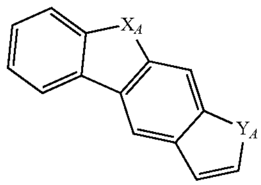

(TEMP-31)

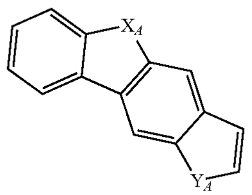

(TEMP-32)

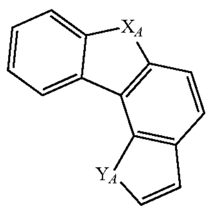

(TEMP-33)

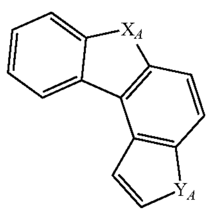

In the formulae (TEMP-16) to (TEMP-33), XA and YA are each independently an oxygen atom, a sulfur atom, NH or $CH_2$, with a proviso that at least one of XA and YA is an oxygen atom, a sulfur atom, or NH.

When at least one of XA and YA in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

phenyldibenzothiophenyl group, methyldibenzothiophenyl group, t-butyldibenzothiophenyl group, and monovalent residue of spiro[9H-thioxanthene-9,9'-[9H]fluorene].

Groups Derived by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of XA or YA in a form of NH, and a hydrogen atom of one of XA and YA in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B below) (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by substituting a hydrogen atom bonded to a carbon atom of a skeleton of the "substituted alkyl group" in the specific example group G3B, and a group derived by substituting a hydrogen atom of a substituent of the "substituted alkyl group" in the specific example group G3B.

Unsubstituted Alkyl Group (Specific Example Group G3A):

methyl group, ethyl group, n-propyl group, isopropyl group, n-butyl group, isobutyl group, s-butyl group, and t-butyl group.

Substituted Alkyl Group (Specific Example Group G3B):

heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B) (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by substituting a hydrogen atom of a skeleton of the "substituted alkenyl group" in the specific example group G4B with a substituent, and a group derived by substituting a hydrogen atom of a substituent of the "substituted alkenyl group" in the specific example group G4B with a substituent.

Unsubstituted Alkenyl Group (Specific Example Group G4A):

vinyl group, allyl group, 1-butenyl group, 2-butenyl group, and 3-butenyl group.

Substituted Alkenyl Group (Specific Example Group G4B):

1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below (Herein, an unsubstituted alkynyl group refers to an "unsubstituted alkynyl group" in the "substituted or unsubstituted alkynyl group.") A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

ethynyl group

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B) (Herein, an unsubstituted cycloalkyl group refers to an "unsubstituted cycloalkyl group" in the "substituted or unsubstituted cycloalkyl group," and a substituted cycloalkyl group refers to the "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

4-methylcyclohexyl group.

Group Represented by "—Si($R_{901}$)($R_{902}$)($R_{903}$)"

Specific examples (specific example group G7) of the group represented herein by —Si($R_{901}$)($R_{902}$)($R_{903}$) include:

—Si(G1)(G1)(G1);
—Si(G1)(G2)(G2);
—Si(G1)(G1)(G2);
—Si(G2)(G2)(G2);
—Si(G3)(G3)(G3); and
—Si(G6)(G6)(G6), where:

G1 represents a "substituted or unsubstituted aryl group" in the specific example group G1;
G2 represents a "substituted or unsubstituted heterocyclic group" in the specific example group G2;
G3 represents a "substituted or unsubstituted alkyl group" in the specific example group G3; and
G6 represents a "substituted or unsubstituted cycloalkyl group" in the specific example group G6.
the plurality of G1 in —Si(G1)(G1)(G1) are mutually the same or different;
the plurality of G2 in —Si(G1)(G2)(G2) are mutually the same or different;
the plurality of G1 in —Si(G1)(G1)(G2) are mutually the same or different;
the plurality of G2 in —Si(G2)(G2)(G2) are mutually the same or different;
the plurality of G3 in —Si(G3)(G3)(G3) are mutually the same or different; and
the plurality of G6 in —Si(G6)(G6)(G6) are mutually the same or different.

Group Represented by "—O—($R_{904}$)"

Specific examples (specific example group G8) of a group represented by —O—($R_{904}$) herein include —O(G1);
—O(G2);
—O(G3); and
—O(G6), where:

G1 represents a "substituted or unsubstituted aryl group" in the specific example group G1;
G2 represents a "substituted or unsubstituted heterocyclic group" in the specific example group G2;
G3 represents a "substituted or unsubstituted alkyl group" in the specific example group G3; and
G6 represents a "substituted or unsubstituted cycloalkyl group" in the specific example group G6.

Group Represented by "—S—($R_{905}$)"

Specific examples (specific example group G9) of a group represented herein by —S—($R_{905}$) include:

—S(G1);
—S(G2);
—S(G3); and
—S(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by "—N($R_{906}$)($R_{907}$)"

Specific examples (specific example group G10) of a group represented herein by —N($R_{906}$)($R_{907}$) include:

—N(G1)(G1);

—N(G2)(G2);

—N(G1)(G2);

—N(G3)(G3); and

—N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

the plurality of G1 in —N(G1)(G1) are mutually the same or different;

the plurality of G2 in —N(G2)(G2) are mutually the same or different;

the plurality of G3 in —N(G3)(G3) are mutually the same or different; and the plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom of the "substituted or unsubstituted alkyl group" with a fluorine atom, and also includes a group (perfluoro group) derived by substituting all of the hydrogen atoms bonded to a carbon atom(s) of the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by substituting at least one hydrogen atom bonded to a carbon atom of an alkyl chain of a "substituted fluoroalkyl group" with a substituent, and a group derived by substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom of the "substituted or unsubstituted alkyl group" with a halogen atom, and also includes a group derived by substituting all of the hydrogen atoms bonded to a carbon atom(s) of the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by substituting at least one hydrogen atom bonded to a carbon atom of an alkyl chain of a "substituted haloalkyl group" with a substituent, and a group derived by substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

(TEMP-Cz1)

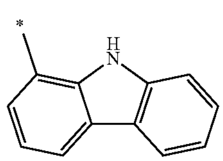

(TEMP-Cz2)

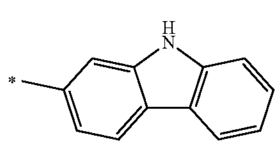

-continued (TEMP-Cz3)

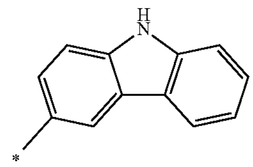

(TEMP-Cz4)

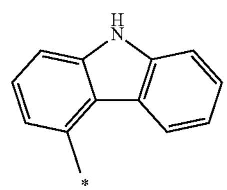

(TEMP-Cz5)

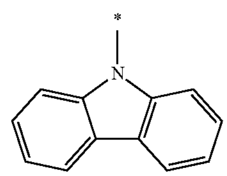

The (9-phenyl)carbazolyl group mentioned herein is, unless otherwise specified herein, specifically a group represented by one of formulae below.

(TEMP-Cz6)

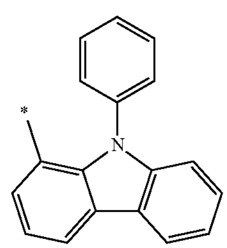

(TEMP-Cz7)

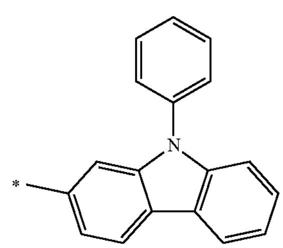

(TEMP-Cz8)

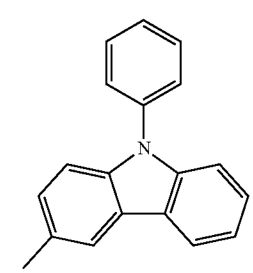

-continued (TEMP-Cz9)

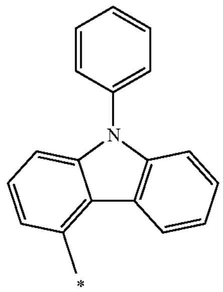

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

(TEMP-34)

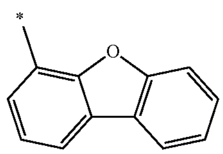

(TEMP-35)

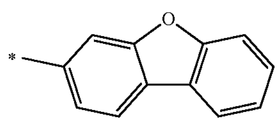

(TEMP-36)

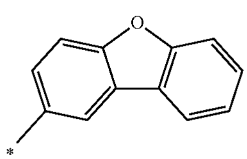

(TEMP-37)

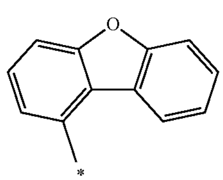

(TEMP-38)

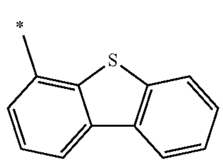

(TEMP-39)

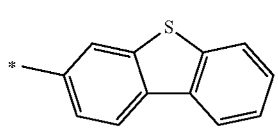

(TEMP-40)

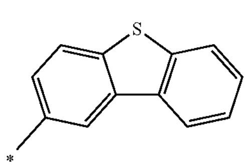

-continued (TEMP-41)

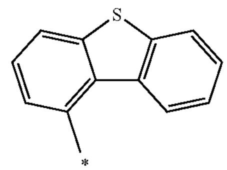

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted heterocyclic group" (specific example group G13) include a divalent group derived by removing one hydrogen atom on a heterocycle of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

(TEMP-42)

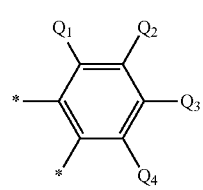

-continued
(TEMP-43)
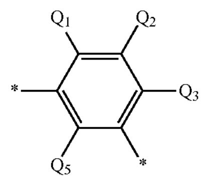
(TEMP-44)
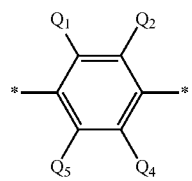
(TEMP-45)
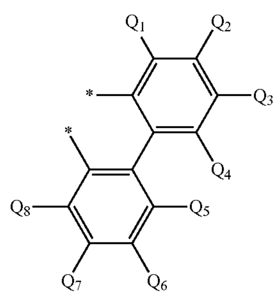
(TEMP-46)
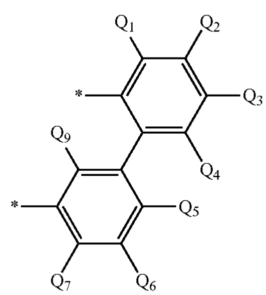
(TEMP-47)
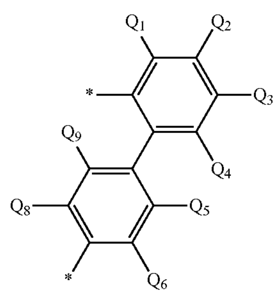
(TEMP-48)
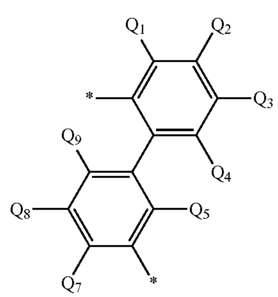
-continued
(TEMP-49)
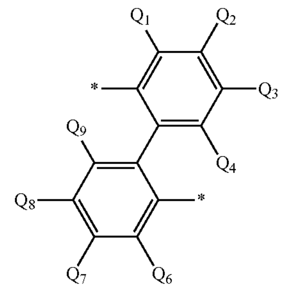
(TEMP-50)
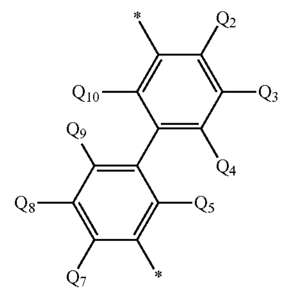
(TEMP-51)
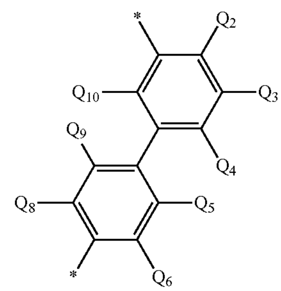
(TEMP-52)
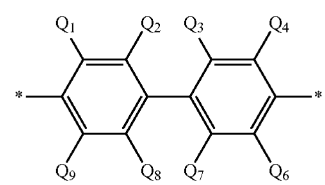
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
(TEMP-53)
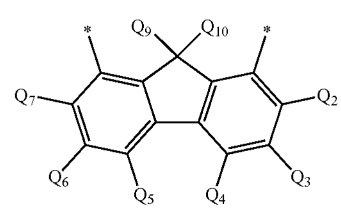

-continued
(TEMP-54)
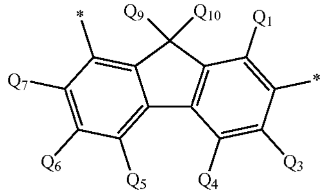
(TEMP-55)
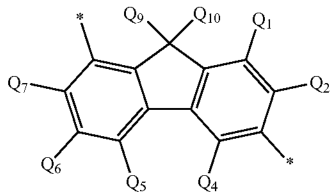
(TEMP-56)
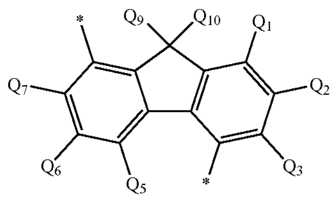
(TEMP-57)
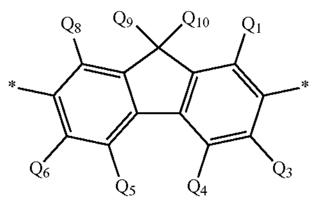
(TEMP-58)
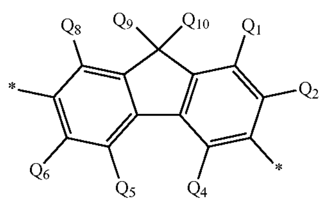
(TEMP-59)
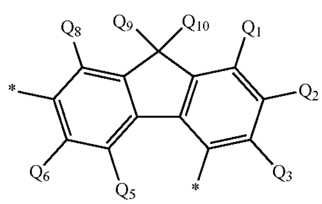
(TEMP-60)
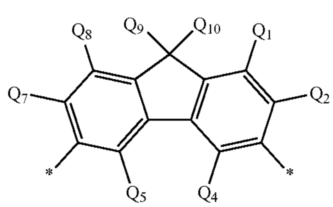
(TEMP-61)
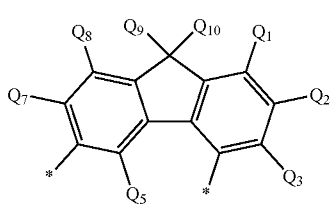
-continued
(TEMP-62)
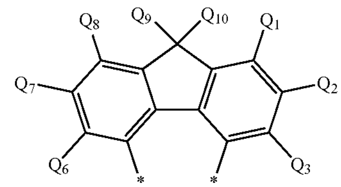
In the formulae (TEMP-53) to (TEMP-62), $Q_1$ to $Q_{10}$ each independently are a hydrogen atom or a substituent.
In the formulae, $Q_9$ and $Q_{10}$ may be mutually bonded through a single bond to form a ring.
In the formulae (TEMP-53) to (TEMP-62), * represents a bonding position.
(TEMP-63)
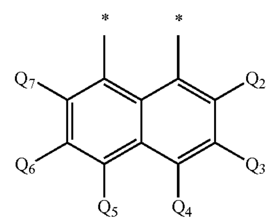
(TEMP-64)
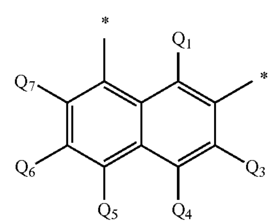
(TEMP-65)
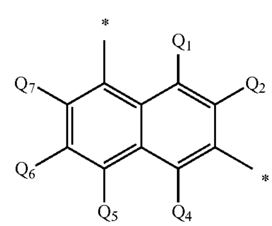
(TEMP-66)
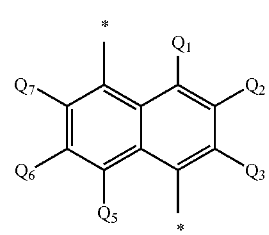
(TEMP-67)
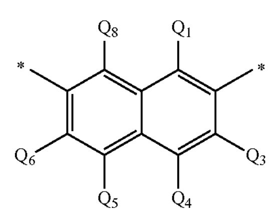

(TEMP-68)

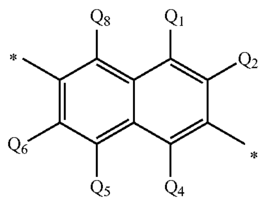

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

(TEMP-69)

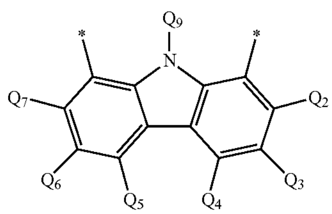

(TEMP-70)

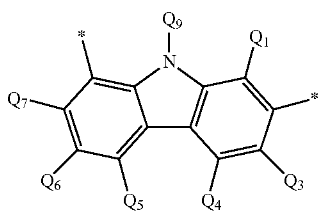

(TEMP-71)

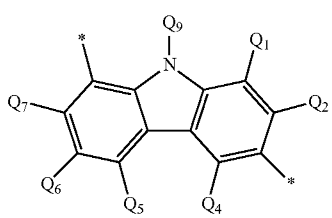

(TEMP-72)

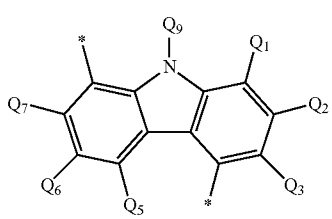

(TEMP-73)

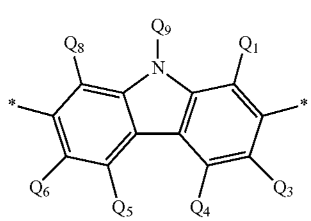

(TEMP-74)

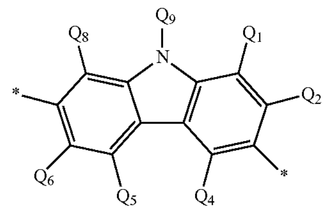

(TEMP-75)

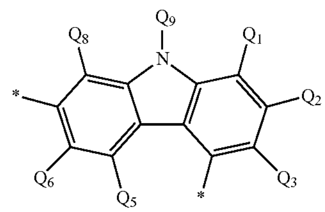

(TEMP-76)

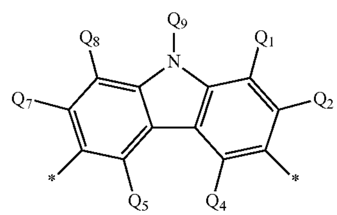

(TEMP-77)

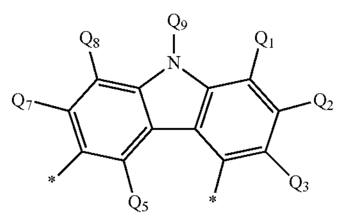

(TEMP-78)

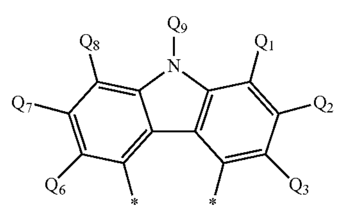

(TEMP-79)

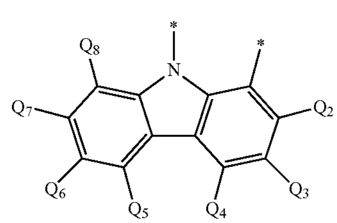

(TEMP-80)

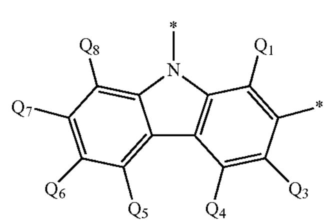

-continued
(TEMP-81)
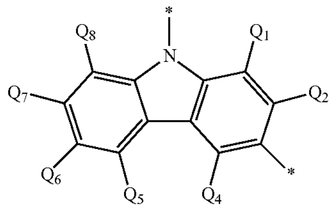
(TEMP-82)
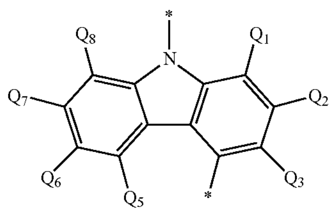
In the formulae (TEMP-69) to (TEMP-82), $Q_1$ to $Q_9$ each independently are a hydrogen atom or a substituent.
(TEMP-83)
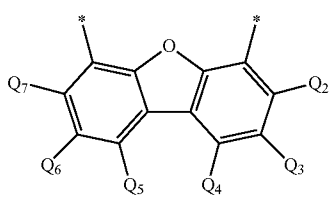
(TEMP-84)
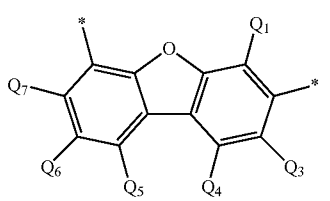
(TEMP-85)
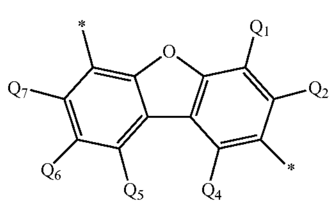
(TEMP-86)
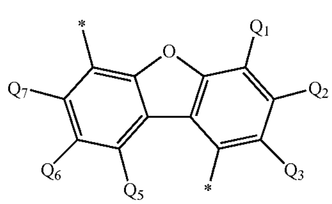
(TEMP-87)
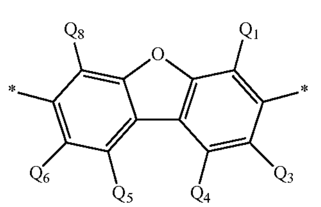
-continued
(TEMP-88)
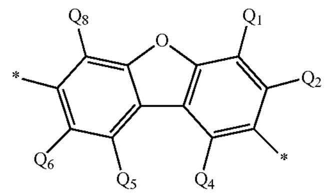
(TEMP-89)
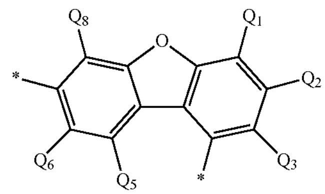
(TEMP-90)
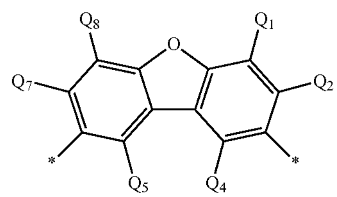
(TEMP-91)
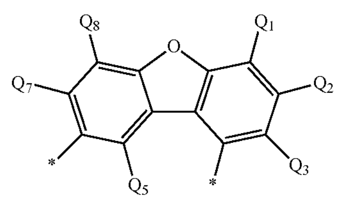
(TEMP-92)
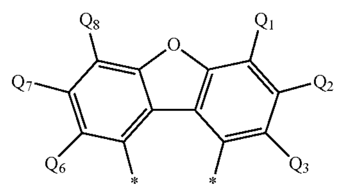
(TEMP-93)
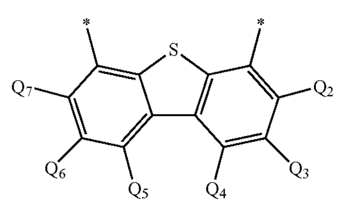
(TEMP-94)
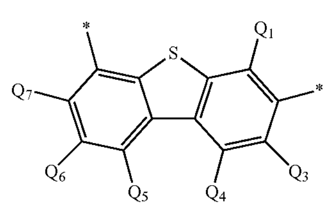
(TEMP-95)
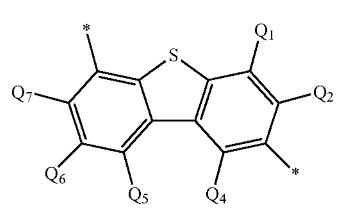

-continued (TEMP-96)

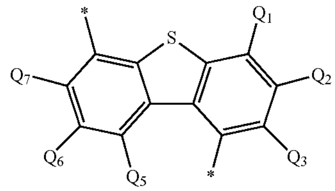

(TEMP-97)

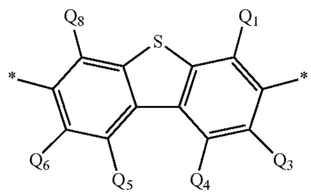

(TEMP-98)

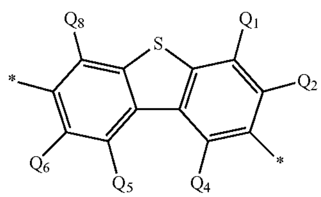

(TEMP-99)

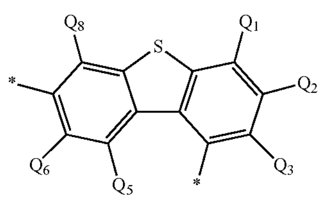

(TEMP-100)

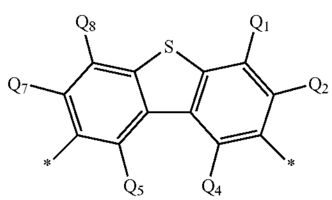

(TEMP-101)

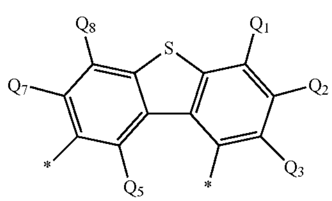

(TEMP-102)

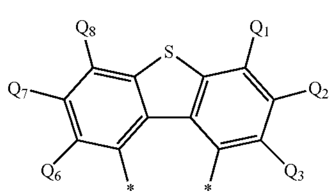

In the formulae (TEMP-83) to (TEMP-102), $Q_1$ to $Q_8$ each independently are a hydrogen atom or a substituent.

The substituent mentioned herein has been described above.

Instance "Bonded to Form a Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance "bonded to form a ring" hereinafter) will be described below. An anthracene compound having a basic skeleton in a form of an anthracene ring and represented by a formula (TEMP-103) below will be used as an example for the description.

(TEMP-103)

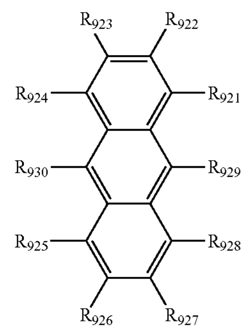

For instance, when "at least one combination of adjacent two or more of" $R_{921}$ to $R_{930}$ "are mutually bonded to form a ring," the pair of adjacent ones of $R_{921}$ to $R_{930}$ (i.e. the combination at issue) is a pair of $R_{921}$ and a pair of $R_{922}$, $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, or a pair of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

(TEMP-104)

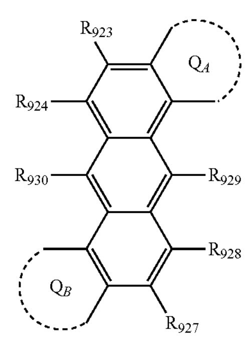

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

(TEMP-105)

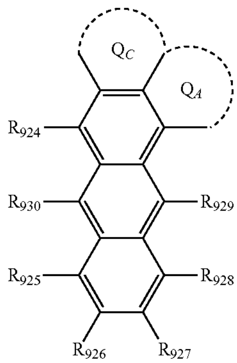

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formulae (TEMP-104) and (TEMP-105) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Substituent Meant by "Substituted or Unsubstituted"

In an exemplary embodiment herein, the substituent meant by the phrase "substituted or unsubstituted" (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms, where:

$R_{901}$ to $R_{907}$ each independently are a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent meant by "substituted or unsubstituted" is selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent meant by "substituted or unsubstituted" is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are mutually the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

First Exemplary Embodiment

Device Arrangement of Organic EL Device

Arrangement(s) of an organic EL device according to a first exemplary embodiment will be detailed below.

The organic EL device includes an organic layer between a pair of electrodes. The organic layer includes a plurality of layers formed of an organic compound(s). The organic layer may further contain an inorganic compound.

At least one layer of the organic layer of the organic EL device of the exemplary embodiment is an emitting layer. Accordingly, the organic layer may be, for instance, composed of a single emitting layer or may include layers (e.g. a hole injecting layer, a hole transporting layer, an electron injecting layer, an electron transporting layer, and a blocking layer) usable in an organic EL device.

An exemplary structure of the organic EL device of the present exemplary embodiment is schematically shown in the FIGURE.

The organic EL device 1 includes a light-transmissive substrate 2, an anode 3, a cathode 4, and an organic layer 10 provided between the anode 3 and the cathode 4.

The organic layer 10 includes an emitting layer 5, a hole injecting/transporting layer 6 provided between the emitting layer 5 and the anode 3, and an electron injecting/transporting layer 7 provided between the emitting layer 5 and the cathode 4. The emitting layer 5 of the organic EL device of the present exemplary embodiment contains a first compound and a second compound.

The above "hole injecting/transporting layer" means "at least one of a hole injecting layer or a hole transporting layer." The "electron injecting/transporting layer" means "at least one of an electron injecting layer or an electron transporting layer." When the hole injecting layer and the hole transporting layer are provided, the hole injecting layer is preferably provided between the anode and the hole transporting layer. When the electron injecting layer and the electron transporting layer are provided, the electron injecting layer is preferably provided between the cathode and the electron transporting layer. The hole injecting layer, hole transporting layer, electron transporting layer, and electron injecting layer may each be provided by a single layer or a laminate of a plurality of layers.

Emitting Layer

First Compound

The first compound is preferably a metal complex.

The metal complex for the first compound is preferably an iridium complex, a copper complex, a platinum complex, an osmium complex or a gold complex, more preferably an iridium complex, a copper complex or a platinum complex.

The metal complex for the first compound is preferably represented by a formula (100) below.

(100)

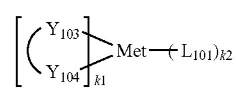

In the formula (100): Met represents a metal atom;

($Y_{103}$-$Y_{104}$) is a bidentate ligand;

$Y_{103}$ and $Y_{104}$ are each independently selected from C (carbon atom), N (nitrogen atom), 0 (oxygen atom), P (phosphorus atom) and S (sulfur atom);

$L_{101}$ is a ligand different from the bidentate ligand represented by ($Y_{103}$-$Y_{104}$) and;

k1 is an integer ranging from 1 to a maximum number of the ligand capable of being coordinated with the metal Met, and k1+k2 is the maximum number of the ligand capable of being coordinated with the metal Met.

In the formula (100), the "($Y_{103}$-$Y_{104}$)" as the bidentate ligand represents a ligand represented by a formula (100a) below.

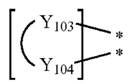

(100a)

In the formula (100a), $Y_{103}$ and $Y_{104}$ are each independently selected from C, N, O, P and S, and two marks * each represent a bonding position with the metal.

In the formula (100), the "($Y_{103}$-$Y_{104}$)" as the bidentate ligand is also preferably a ligand represented by a formula (100b) or a formula (100c) below.

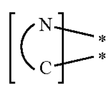

(100b)

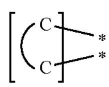

(100c)

In the formulae (100b) and (100c), two marks * each represent a bonding position with the metal.

The metal Met is preferably iridium, copper, platinum, osmium, or gold, more preferably iridium, copper, or platinum.

The first compound is also preferably a phosphorescent metal complex.

The metal complex for the first compound is preferably a phosphorescent metal complex having a monoanionic bidentate ligand represented by a formula (101) below. The metal in the phosphorescent metal complex for the first compound is selected from non-radioactive metals having an atomic number of more than 40. The monoanionic bidentate ligand represented by the formula (101) below may be bonded with other ligand(s) to form a tridentate, quadridentate, pentadentate, or hexadentate ligand.

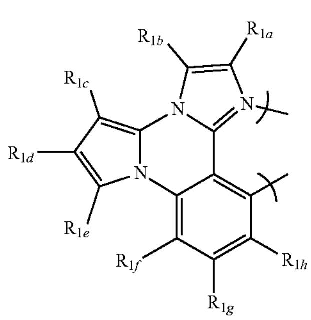

(101)

In the formula (101):

at least one combination of adjacent two or more of $R_{1a}$, $R_{1b}$, $R_{1c}$, $R_{1d}$, $R_{1e}$, $R_{1f}$, $R_{1g}$, and $R_{1h}$ are mutually bonded to form a substituted or unsubstituted monocyclic ring, mutually bonded to form a substituted or unsubstituted fused ring, or not mutually bonded;

$R_{1a}$, $R_{1b}$, $R_{1c}$, $R_{1d}$, $R_{1e}$, $R_{1f}$, $R_{1g}$, and $R_{1h}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a group represented by —B($R_{908}$)($R_{909}$), a halogen atom, a cyano group, a nitro group, a substituted or unsubstituted aryl group having 6 to 50 ring carbon atoms, or a substituted or unsubstituted heterocyclic group having 5 to 50 ring atoms;

at least one combination of adjacent two or more of $R_{1a}$, $R_{1b}$, $R_{1c}$, $R_{1d}$, $R_{1e}$, $R_{1f}$, $R_{1g}$, $R_{1h}$, $R_{901}$, $R_{902}$, $R_{903}$, $R_{904}$, $R_{905}$, $R_{906}$, $R_{907}$, $R_{908}$, and $R_{909}$ are mutually bonded to form a substituted or unsubstituted monocyclic ring, mutually bonded to form a substituted or unsubstituted fused ring, or not mutually bonded;

$R_{901}$, $R_{902}$, $R_{903}$, $R_{904}$, $R_{905}$, $R_{906}$, $R_{907}$, $R_{908}$, and $R_{909}$ not forming the substituted or unsubstituted monocyclic ring and not forming the substituted or unsubstituted fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atom.

"Group represented by —B($R_{908}$)($R_{909}$)"

Specific examples (specific example group G12) of a group represented herein by —B($R_{908}$)($R_{909}$) include:

—B(G1)(G1);

—B(G2)(G2);

—B(G1)(G2);

—B(G3)(G3); and

—B(G6)(G6), where G1 is the group described in the specific example group G1, G2 is the group described in the specific example group G2, G3 is the group described in the specific example group G3, and G6 is the group described in the specific example group G6.

The plurality of G1 in —B(G1)(G1) are mutually the same or different.

The plurality of G2 in —B(G2)(G2) are mutually the same or different.

The plurality of G3 in —B(G3)(G3) are mutually the same or different.

The plurality of G6 in —B(G6)(G6) are mutually the same or different.

The metal in the phosphorescent metal complex including the monoanionic bidentate ligand represented by the formula (101) is preferably a metal selected from the group consisting of rhenium, ruthenium, osmium, rhodium, iridium, palladium, platinum, copper, and gold, more preferably a metal selected from the group consisting of iridium, osmium, platinum, copper, and gold.

The metal complex for the first compound is preferably represented by a formula (102) below.

(102)

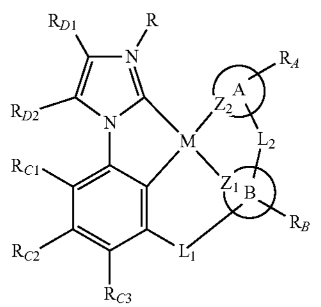

In the formula (102):

M represents a metal atom;

A ring and B ring are each independently a pentacyclic or hexacyclic aromatic ring;

$Z_1$ and $Z_2$ are each independently selected from the group consisting of C and N;

$L_1$ and $L_2$ are each independently a single bond, $BR_{121}$, $NR_{122}$, $PR_{123}$, an oxygen atom, a sulfur atom, a selenium atom, C═O, S═O, $SO_2$, a substituted or unsubstituted alkylene group having 1 to 50 carbon atoms, a substituted or unsubstituted alkenylene group having 2 to 50 carbon atoms, a substituted or unsubstituted cycloalkylene group having 3 to 50 ring carbon atoms, $Si(R_{124})(R_{125})$, $Ge(R_{126})(R_{127})$, and a combination of the above groups;

a combination of $R_A$ and $L_2$ are mutually bonded to form a substituted or unsubstituted monocyclic ring, mutually bonded to form a substituted or unsubstituted fused ring, or not mutually bonded;

a combination of $R_B$ and $L_2$ are mutually bonded to form a substituted or unsubstituted monocyclic ring, mutually bonded to form a substituted or unsubstituted fused ring, or not mutually bonded;

when a plurality of $R_A$ are present, at least one combination of adjacent two or more of $R_A$ are mutually bonded to form a substituted or unsubstituted monocyclic ring, mutually bonded to form a substituted or unsubstituted fused ring, or not mutually bonded;

when a plurality of $R_B$ are present, at least one combination of adjacent two or more of $R_B$ are mutually bonded to form a substituted or unsubstituted monocyclic ring, mutually bonded to form a substituted or unsubstituted fused ring, or not mutually bonded;

at least one combination of adjacent two or more of $R_{C1}$, $R_{C2}$, and $R_{C3}$ are mutually bonded to form a substituted or unsubstituted monocyclic ring, mutually bonded to form a substituted or unsubstituted fused ring, or not mutually bonded;

a combination of $R_{D1}$ and $R_{D2}$ are mutually bonded to form a substituted or unsubstituted monocyclic ring, mutually bonded to form a substituted or unsubstituted fused ring, or not mutually bonded;

$R_{121}$ to $R_{127}$ and $R_A$, $R_B$, $R_{C1}$, $R_{C2}$, $R_{C3}$, $R_{D1}$, and $R_{D2}$ not forming the substituted or unsubstituted monocyclic ring and not forming the substituted or unsubstituted fused ring are each independently selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, an acyl group, a carbonyl group, a carboxy group, an ester group, an isonitrile group, a sulfanyl group, a sulfinyl group, a sulfonyl group, a phosphino group, a substituted or unsubstituted aryl group having 6 to 50 ring carbon atoms, a substituted or unsubstituted heterocyclic group having 5 to 50 ring atoms, and a combination of the above groups;

R is selected from the group consisting of a hydrogen atom, a substituted or unsubstituted alkyl group having 1 to 50 carbon atoms, a substituted or unsubstituted cycloalkyl group having 3 to 50 ring carbon atoms, a substituted or unsubstituted aralkyl group, a group represented by —$Si(R_{901})(R_{902})(R_{903})$, a substituted or unsubstituted aryl group having 6 to 50 ring carbon atoms, a substituted or unsubstituted heterocyclic group having 5 to 50 ring atoms, and a combination of the above groups; and $R_{901}$, $R_{902}$, $R_{903}$, $R_{904}$, $R_{905}$, $R_{906}$, $R_{907}$, $R_{908}$, and $R_{909}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The metal M in the formula (102) is preferably a metal selected from the group consisting of rhenium, ruthenium, osmium, rhodium, iridium, palladium, platinum, copper, and gold, more preferably a metal selected from the group consisting of iridium, osmium, platinum, copper, and gold.

The metal complex for the first compound is preferably represented by a formula (103) below.

(103)

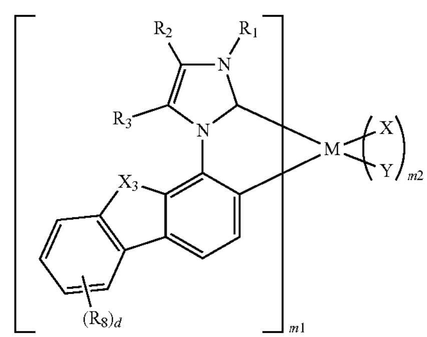

In the formula (103): M represents a metal atom;

$X_3$ is an oxygen atom, sulfur atom, $NR_{X1}$ or $C(R_{X2})(R_{X3})$;

$R_{X1}$, $R_{X2}$ and $R_{X3}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

a combination of $R_1$ and $R_2$ or a combination of $R_2$ and $R_3$ are mutually bonded to form a substituted or unsubstituted five-membered ring, mutually bonded to form a substituted or unsubstituted six-membered ring, or not mutually bonded;

at least one combination of adjacent two or more of a plurality of $R_8$ are mutually bonded to form a substituted or unsubstituted five-membered ring, mutually bonded to form a substituted or unsubstituted six-membered ring, or not mutually bonded;

the substituted or unsubstituted five-membered ring and the substituted or unsubstituted six-membered ring are each independently a cycloalkyl, a cycloheteroalkyl, an aryl, or a heteroaryl;

the substituted five-membered ring and the substituted six-membered ring each independently include one or more substituents J, a plurality of substituents J, when present, being mutually the same or different;

at least one combination of adjacent two or more of the plurality of substituents J are mutually bonded to form a substituted or unsubstituted five-membered ring, mutually bonded to form a substituted or unsubstituted six-membered ring, or not mutually bonded;

the substituent(s) J not forming the substituted or unsubstituted five-membered ring and the substituted or unsubstituted six-membered ring are each independently $R_{J1}$, CN, $CF_3$, $C(O)OR_{J2}$, $C(O)R_{J3}$, $C(O)N(R_{J4})(R_{J5})$, $NR(R_{J6})(R_{J7})$, $NO_2$, $ORJ_8$, $SRJ_9$, $SO_2$, $SORJ_{10}$, or $SO_3RJ_{11}$;

$R_{J1}$, $R_{J2}$, $R_{J3}$, $R_{J4}$, $R_{J5}$, $R_{J6}$, $R_{J7}$, $R_{J8}$, $R_{J9}$, $R_{J10}$, and $R_{J11}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

$R_1$ not forming the substituted or unsubstituted five-membered ring and the substituted or unsubstituted six-membered ring are a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a substituted or unsubstituted aryl group having 6 to 50 ring carbon atoms, or a substituted or unsubstituted heterocyclic group having 5 to 50 ring atoms;

$R_2$, $R_3$, and $R_8$ not forming the substituted or unsubstituted five-membered ring and the substituted or unsubstituted six-membered ring are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a cyano group, a trifluoromethyl group, a group represented by $CO_2R_{131}$, a group represented by $C(O)R_{132}$, a group represented by $C(O)N(R_{133})(R_{134})$, a group represented by $N(R_{135})(R_{136})$, $NO_2$, a group represented by $OR_{137}$, a group represented by $SR_{138}$, $SO_2$, a group represented by $SOR_{139}$, a group represented by $SO_3R_{140}$, a halogen atom, a substituted or unsubstituted aryl group having 6 to 50 ring carbon atoms, or a substituted or unsubstituted heterocyclic group having 5 to 50 ring atoms;

$R_{131}$ to $R_{140}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

(X—Y) is selected from a photoactive ligand or an auxiliary ligand;

d is 0, 1, 2, 3, or 4;

m1 is a number ranging from 1 to a maximum number of the ligand bondable with the metal M; and m1+m2 is the maximum number of the ligand bondable with the metal M.

The metal M in the formula (103) is preferably a metal selected from the group consisting of rhenium, ruthenium, osmium, rhodium, iridium, palladium, platinum, copper, and gold, more preferably a metal selected from the group consisting of iridium, osmium, platinum, copper, and gold.

$X_3$ in the formula (103) is preferably an oxygen atom.

Specific Examples of First Compound

Specific examples of the first compound according to the present exemplary embodiment is exemplified by compounds below. It should however be noted that the invention is not limited by the specific examples of the first compound.

(BE-1)

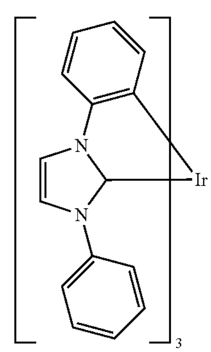

(BE-2)

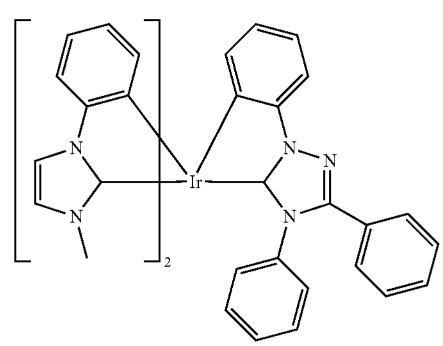

-continued
(BE-3)
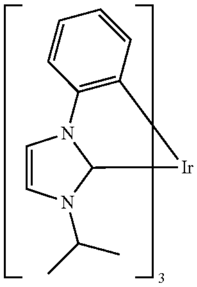
(BE-4)
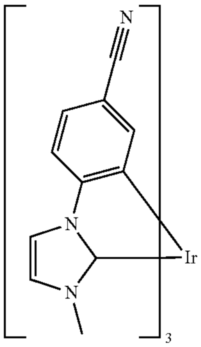
(MC1)
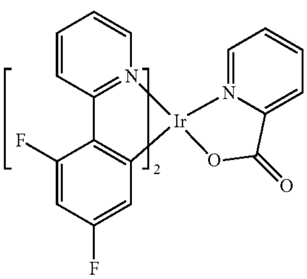
(MC2)
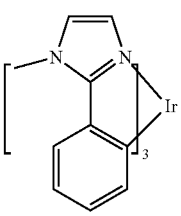
(MC3)
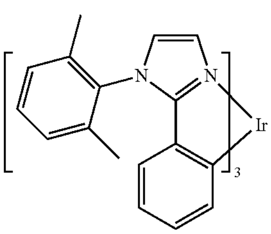
(MC4)
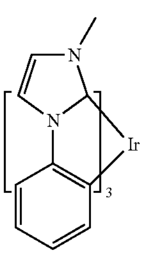
-continued
(MC-5)
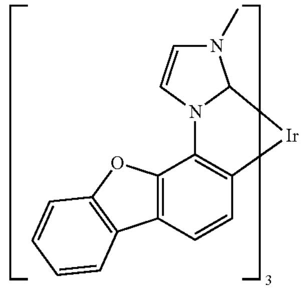
(MC-6)
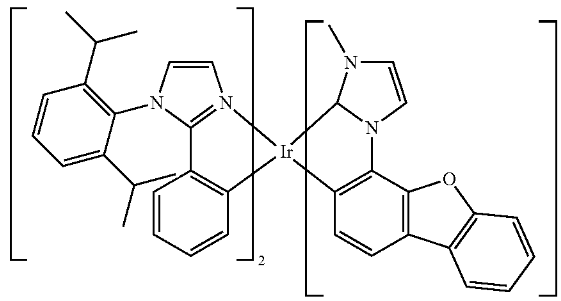
(MC7)
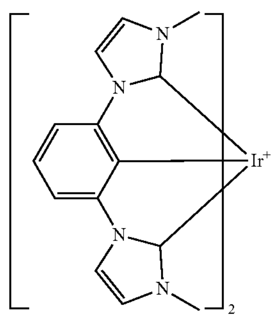
(MC8)
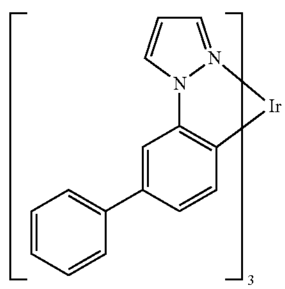
(MC9)
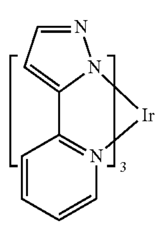

(MC10)
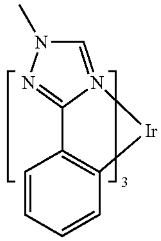
(MC11)
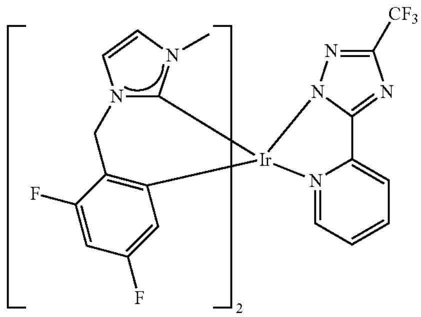
(MC12)
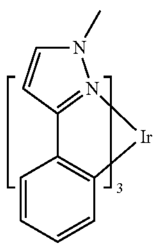
(MC13)
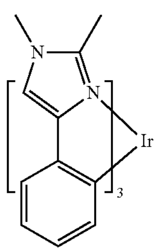
(MC14)
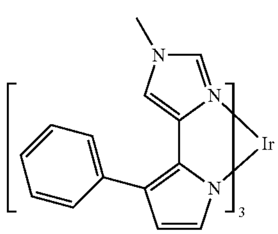
(MC15)
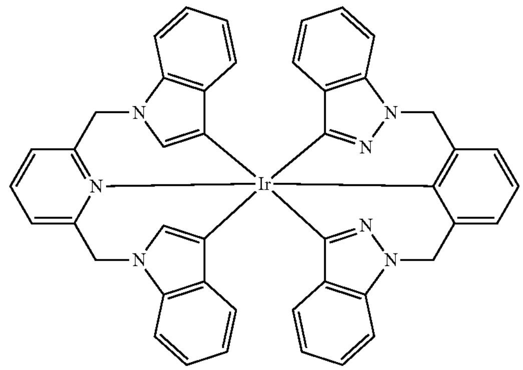
(MC16)
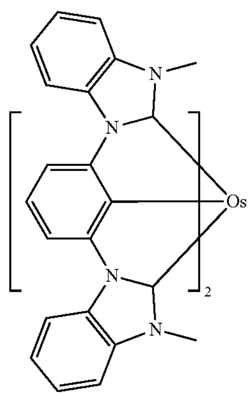
(MC17)
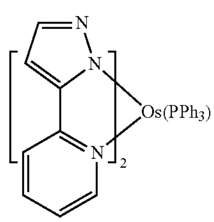
(MC18)
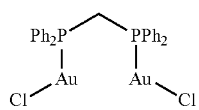
(MC19)
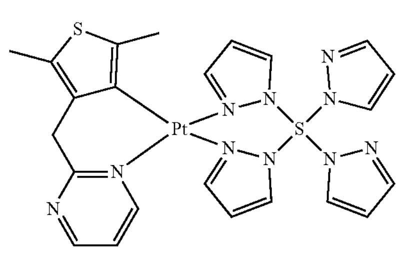

-continued (MC20)

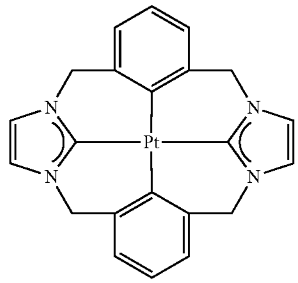

It is not necessary for the emission color of the first compound to be specifically limited. However, the emission of the first compound is preferably a phosphorescence whose main peak wavelength is 560 nm or less, desirably 520 nm or less, further desirably 460 nm or less.

The main peak wavelength refers to a peak wavelength of an emission spectrum at which the emission spectrum measured for a toluene solution dissolved with the first compound at a concentration ranging from $10^{-5}$ mol/l to $10^{-6}$ mol/l is maximized.

The first compound preferably shows blue phosphorescence.

Method of Preparing First Compound

The first compound can be prepared by a known synthesis method, or by application of known substitution reactions and/or materials depending on a target compound.

Second Compound

The second compound according to the present exemplary embodiment is a compound satisfying (a), (b), (c), and (d) below.

(a) a half bandwidth being 30 nm or less;

(b) ionization potential being 6.0 eV or less;

(c) a singlet energy $S_1$(M2) being 2.6 eV or more; and (d) a peak top in a toluene solution being 465 nm or less.

The use of the combination of the second compound satisfying (a), (b), (c), and (d) mentioned above and the above-described first compound in the emitting layer reduces an interaction between the first compound and the second compound, thereby improving the performance of the organic EL device. Specifically, the luminous efficiency is improved, the lifetime is prolonged, and a peak half bandwidth of the light emitted by the organic EL device is narrowed, meaning that the emission chromatic purity is improved.

The half bandwidth of the second compound is preferably 28 nm or less, more preferably 25 nm or less.

The measurement method of the half bandwidth of the second compound is as mentioned in later-described Examples.

The ionization potential of the second compound is preferably 5.9 eV or less, more preferably 5.8 eV or less.

The measurement method of the ionization potential of the second compound is as mentioned in later-described Examples.

The peak top of the second compound in a toluene solution is preferably 460 nm or less, more preferably 458 nm or less.

The measurement method of the peak top of the second compound in a toluene solution is as mentioned in later-described Examples.

A singlet energy $S_1$(M2) of the second compound is preferably 2.65 eV or more, more preferably 2.70 eV or more.

Singlet Energy $S_1$

A method of measuring the singlet energy $S_1$ with use of a solution (occasionally referred to as a solution method) is exemplified by a method below.

A 10 μmol/L toluene solution of a measurement target compound is prepared and put in a quartz cell. An absorption spectrum (ordinate axis: luminous intensity, abscissa axis: wavelength) of the thus-obtained sample is measured at a normal temperature (300K). A tangent is drawn to the fall of the absorption spectrum on the long-wavelength side, and a wavelength value fledge (nm) at an intersection of the tangent and the abscissa axis is assigned to a conversion equation (F2) below to calculate singlet energy.

$$S_1\,[\text{eV}]=1239.85/\lambda\text{edge} \qquad \text{Conversion Equation (F2)}$$

Any device for measuring absorption spectrum is usable. For instance, a spectrophotometer (U3310 manufactured by Hitachi, Ltd.) is usable.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve is checked. An inclination of the tangent is decreased as the curve fell (i.e., a value of the ordinate axis is decreased) and increased in a repeated manner. A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less is not included in the above-mentioned maximum absorbance on the long-wavelength side.

The second compound according to the present exemplary embodiment is preferably a fluorescent compound.

The second compound preferably shows blue fluorescence.

The second compound is preferably at least one compound selected from the group consisting of compounds represented by formulae (21), (31), (41), (51), and (61) below.

Compound Represented by Formula (21)

The compound represented by the formula (21) will be described below.

(21)

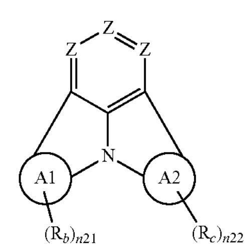

where, in the formula (21): Z are each independently $CR_a$ or N, a plurality of Z being mutually the same or different;

$A_1$ ring and $A_2$ ring are each independently a substituted or unsubstituted aromatic hydrocarbon ring having 6 to 50 ring carbon atoms or a substituted or unsubstituted heterocycle having 5 to 50 ring atoms;

when a plurality of $R_a$ are present, at least one combination of adjacent two or more of $R_a$ are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of $R_b$ are present, at least one combination of adjacent two or more of $R_b$ are mutually bonded to form a substituted or unsubstituted monocyclic ring, mutually bonded to form a substituted or unsubstituted fused ring, or not mutually bonded;

when a plurality of $R_c$ are present, at least one combination of adjacent two or more of $R_c$ are mutually bonded to form a substituted or unsubstituted monocyclic ring, mutually bonded to form a substituted or unsubstituted fused ring, or not mutually bonded;

$R_a$, $R_b$ and $R_c$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$, $R_{902}$, $R_{903}$, $R_{904}$, $R_{905}$, $R_{906}$, and $R_{907}$ in the formula (21) are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

When a plurality of $R_a$ are present, the plurality of $R_a$ are mutually the same or different.

When a plurality of $R_b$ are present, the plurality of $R_b$ are mutually the same or different.

When a plurality of $R_c$ are present, the plurality of $R_c$ are mutually the same or different.

The "aromatic hydrocarbon ring" for the $A_1$ ring and $A_2$ ring has the same structure as the compound formed by introducing a hydrogen atom to the "aryl group" described above under the subtitle "Substituent Mentioned Herein." Ring atoms of the "aromatic hydrocarbon ring" for the $A_1$ ring and the $A_2$ ring include two carbon atoms on a fused bicyclic structure at the center of the formula (21). Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the $A_1$ ring and $A_2$ ring has the same structure as the compound formed by introducing a hydrogen atom to the "heterocyclic group" described above under the subtitle "Substituent Mentioned Herein." Ring atoms of the "heterocycle" for the $A_1$ ring and the $A_2$ ring include two carbon atoms on the fused bicyclic structure at the center of the formula (21). Specific examples of the "substituted or unsubstituted heterocycle having 5 to 50 ring atoms" include a compound formed by introducing a hydrogen atom to the "heterocyclic group" described in the specific example group G2.

$R_b$ is bonded to any one of carbon atoms forming the aromatic hydrocarbon ring for the $A_1$ ring or any one of the atoms forming the heterocycle for the $A_1$ ring.

$R_c$ is bonded to any one of carbon atoms forming the aromatic hydrocarbon ring for the $A_2$ ring or any one of the atoms forming the heterocycle for the $A_2$ ring.

At least one of $R_a$ to $R_c$ is preferably a group represented by a formula (21a) below. More preferably, two of $R_a$ to $R_c$ are groups represented by the formula (21a) below.

$$-L_{201}-Ar_{201} \quad (21a)$$

In the formula (21a): $L_{201}$ is a single bond, a substituted or unsubstituted arylene group having 6 to 30 ring carbon atoms, or a substituted or unsubstituted divalent heterocyclic group having 5 to 30 ring atoms;

$Ar_{201}$ is a substituted or unsubstituted aryl group having 6 to 50 ring carbon atoms, a substituted or unsubstituted heterocyclic group having 5 to 50 ring atoms, or a group represented by a formula (21b) below.

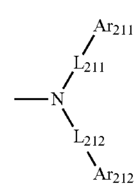

(21b)

In the formula (21b): $L_{211}$ and $L_{212}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{211}$ and $Ar_{212}$ are mutually bonded to form a substituted or unsubstituted monocyclic ring, mutually bonded to form a substituted or unsubstituted fused ring, or not mutually bonded;

$Ar_{211}$ and $Ar_{212}$ not forming the substituted or unsubstituted monocyclic ring and not forming the substituted or unsubstituted fused ring each independently are a substituted or unsubstituted aryl group having 6 to 50 ring carbon atoms, or a substituted or unsubstituted heterocyclic group having 5 to 50 ring atoms.

In some embodiments, the compound represented by the formula (21) is represented by a formula (22) below.

(22)

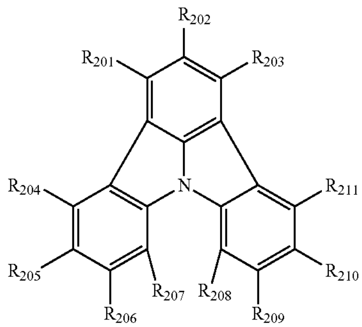

In the formula (22): at least one combination of adjacent two or more of $R_{201}$ to $R_{211}$ are mutually bonded to form a substituted or unsubstituted monocyclic ring, mutually bonded to form a substituted or unsubstituted fused ring, or not mutually bonded;

$R_{201}$ to $R_{211}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ of the formula (22) respectively represent the same as $R_{901}$ to $R_{907}$ of the formula (22).

At least one of $R_{201}$ to $R_{211}$ is preferably a group represented by the formula (21a). More preferably, at least two of $R_{201}$ to $R_{211}$ are groups represented by the formula (21a). Preferably, $R_{204}$ and $R_{211}$ are groups represented by the formula (21a).

In some embodiments, the compound represented by the formula (21) is a compound formed by bonding a moiety represented by a formula (21-1) or a formula (21-2) below to the $A_1$ ring.

Further, in some embodiments, the compound represented by the formula (22) is a compound formed by bonding the moiety represented by the formula (21-1) or the formula (21-2) to the ring bonded with $R_{204}$ to $R_{207}$.

(21-1)

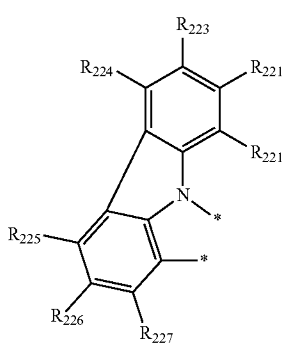

-continued (21-2)

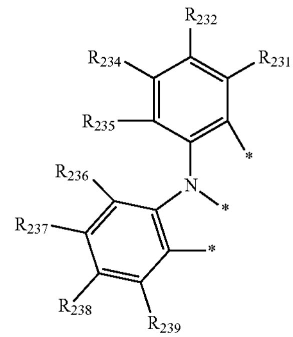

In the formula (21-1), two bonds * are each independently bonded to the ring-forming carbon atom of the aromatic hydrocarbon ring or the ring atom of the heterocycle for the $A_1$ ring in the formula (21) or bonded to one of $R_{204}$ to $R_{207}$ in the formula (22).

In the formula (21-2), three bonds * are each independently bonded to the ring-forming carbon atom of the aromatic hydrocarbon ring or the ring atom of the heterocycle for the $A_1$ ring in the formula (22) or bonded to one of $R_{204}$ to $R_{207}$ in the formula (22).

at least one combination of adjacent two or more of $R_{221}$ to $R_{227}$ and $R_{231}$ to $R_{239}$ are mutually bonded to form a substituted or unsubstituted monocyclic ring, mutually bonded to form a substituted or unsubstituted fused ring, or not mutually bonded;

$R_{221}$ to $R_{227}$ and $R_{231}$ to $R_{239}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ of the formulae (21-1) and (21-2) respectively represent the same as $R_{901}$ to $R_{907}$ of the formula (21).

In some embodiments, the compound represented by the formula (21) is a compound represented by a formula (21-3), a formula (21-4) or a formula (21-5) below.

(21-3)

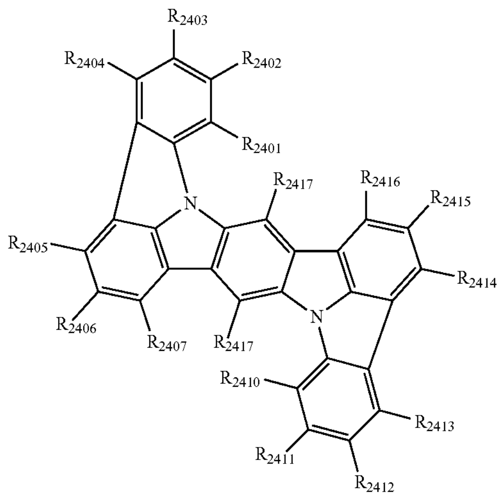

(21-4)

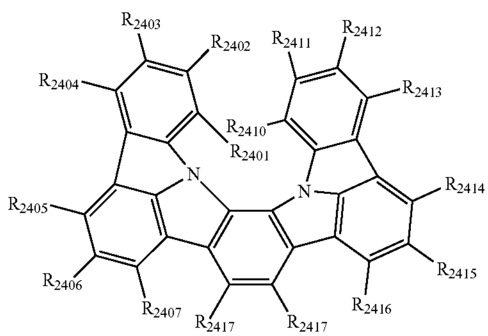

(21-5)

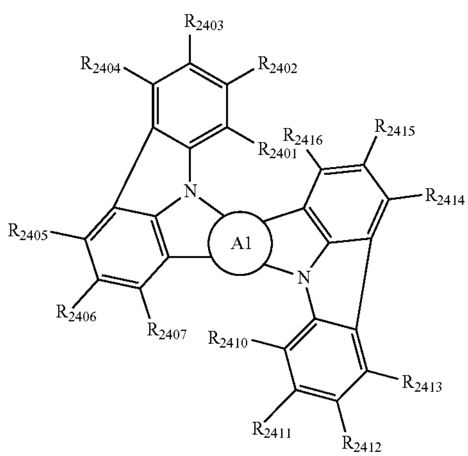

In the formulae (21-3), (21-4), and (21-5):

$A_1$ ring is as defined for the formula (21);

$R_{2401}$ to $R_{2407}$ represent the same as $R_{221}$ to $R_{227}$ in the formula (21-1) and the formula (21-2);

$R_{2410}$ to $R_{2417}$ represent the same as $R_{201}$ to $R_{211}$ in the formula (22); and the two $R_{2417}$ are mutually the same or different.

In some embodiments, the substituted or unsubstituted aromatic hydrocarbon ring having 6 to 50 ring carbon atoms for the $A_1$ ring in the formula (21-5) is a substituted or unsubstituted naphthalene ring, or a substituted or unsubstituted fluorene ring.

In some embodiments, the substituted or unsubstituted heterocycle having 5 to 50 ring atoms for the $A_1$ ring in the formula (21-5) is a substituted or unsubstituted dibenzofuran ring, a substituted or unsubstituted carbazole ring, or a substituted or unsubstituted dibenzothiophene ring.

In some embodiments, the compound represented by the formula (21) or the formula (22) is a compound selected from the groups consisting of compounds represented by formulae (21-6-1) to (21-6-7) below.

(21-6-1)

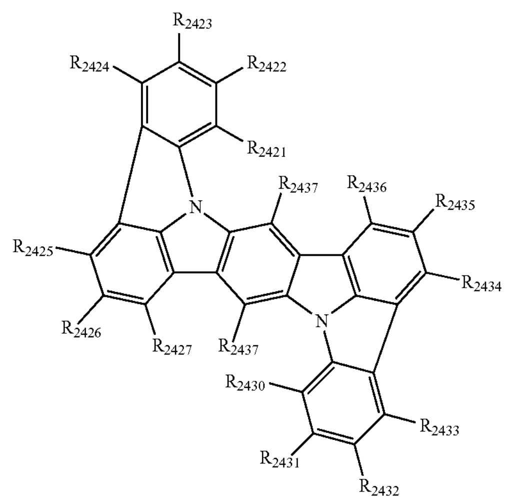

(21-6-2)

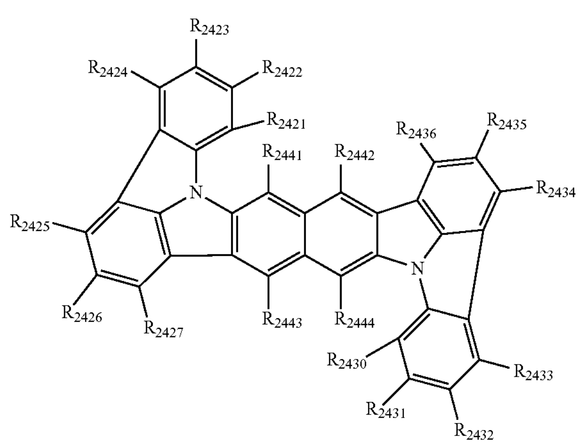

-continued (21-6-3)

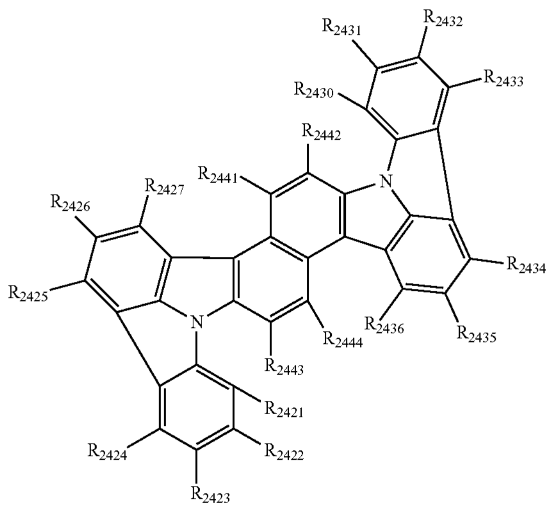

(21-6-4)

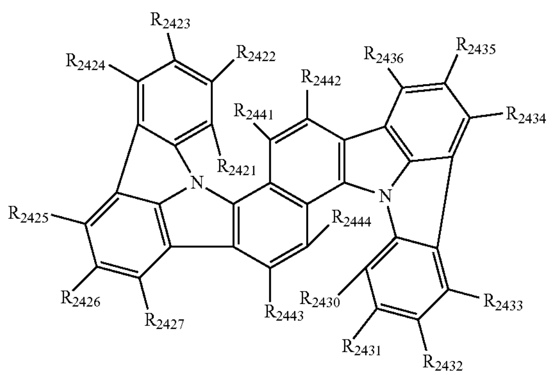

(21-6-5)

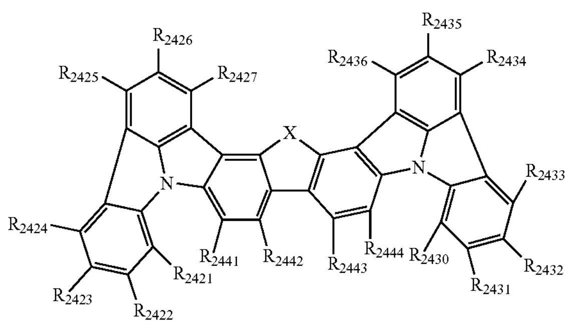

(21-6-6)

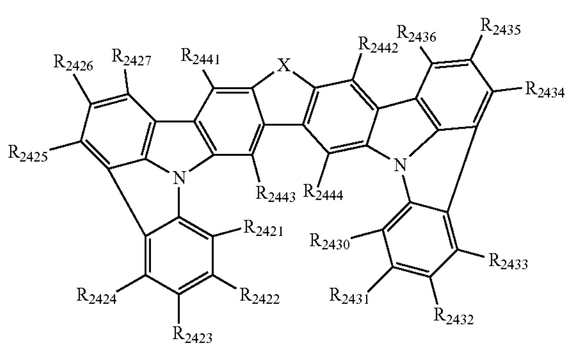

-continued (21-6-7)

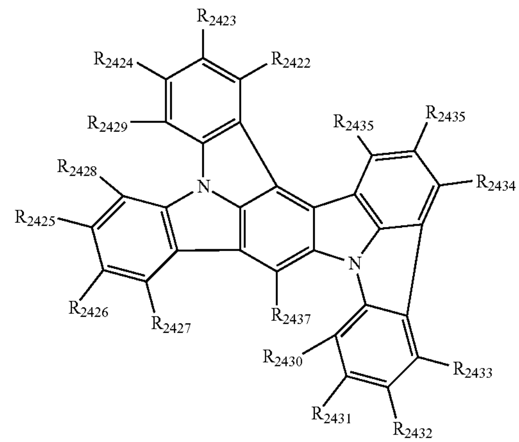

In the formulae (21-6-1) to (21-6-7):

$R_{2421}$ to $R_{2427}$, $R_{2428}$, and $R_{2429}$ represent the same as $R_{221}$ to $R_{227}$ in the formula (21-1);

$R_{2430}$ to $R_{2437}$ and $R_{2442}$ to $R_{2444}$ represent the same as $R_{201}$ to $R_{211}$ in the formula (22);

two $R_{2437}$ are mutually the same or different;

X is an oxygen atom, $NR_{901}$, or $C(R_{902})(R_{903})$; and $R_{901}$ to $R_{903}$ respectively represent the same as $R_{901}$ to $R_{903}$ of the formula (21).

In some embodiments, in the compound represented by the formula (22), at least one combination of adjacent two or more of $R_{201}$ to $R_{211}$ are mutually bonded to form a substituted or unsubstituted monocyclic ring, or mutually bonded to form a substituted or unsubstituted fused ring. This embodiment will be detailed below as a formula (25).

Compound Represented by Formula (25)

The compound represented by the formula (25) will be described below.

(25)

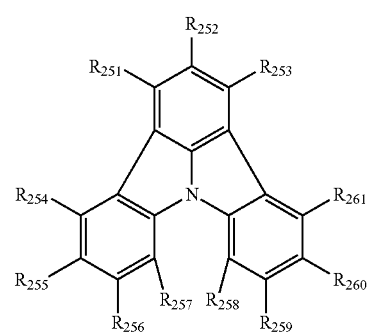

In the formula (25): two ore more of combinations selected from the group consisting of a combination of $R_{251}$ and $R_{252}$, a combination of $R_{252}$ and $R_{253}$, a combination of $R_{254}$ and $R_{255}$, a combination of $R_{255}$ and $R_{256}$, a combination of $R_{256}$ and $R_{257}$, a combination of $R_{258}$ and $R_{259}$, a combination of $R_{259}$ and $R_{260}$, and a combination of $R_{260}$ and $R_{261}$ are mutually bonded to form a substituted or unsubstituted monocyclic ring or mutually bonded to form a substituted or unsubstituted fused ring.

However, the combination of $R_{251}$ and $R_{252}$ and the combination of $R_{252}$ and $R_{253}$ do not simultaneously form a ring; the combination of $R_{254}$ and $R_{255}$ and the combination of $R_{255}$ and $R_{256}$ do not simultaneously form a ring; the combination of $R_{255}$ and $R_{256}$ and the combination of $R_{256}$ and $R_{257}$ do not simultaneously form a ring; the combination of $R_{258}$ and $R_{259}$ and the combination of $R_{259}$ and $R_{260}$ do not simultaneously form a ring; and the combination of $R_{259}$ and $R_{260}$ and the combination of $R_{260}$ and $R_{261}$ do not simultaneously form a ring.

The two or more rings formed by $R_{251}$ to $R_{261}$ may be mutually the same or different.

$R_{251}$ to $R_{261}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms.

$R_{901}$ to $R_{907}$ respectively represent the same as $R_{901}$ to $R_{907}$ of the formula (21).

In the formula (25), $R_n$ and $R_{n+1}$ (n being an integer selected from 251, 252, 254 to 256, and 258 to 260) are mutually bonded to form a substituted or unsubstituted monocyclic ring or fused ring together with two ring-forming carbon atoms bonded with $R_n$ and $R_{n+1}$. The monocyclic ring or the fused ring is preferably formed of atoms selected from a carbon atom, an oxygen atom, a sulfur atom, and a nitrogen atom, and is formed of 3 to 7, more preferably 5 or 6 atoms.

The number of the cyclic structures formed by mutually bonding the combinations of $R_n$ and $R_{n+1}$ in the compound represented by the formula (25) is, for instance, 2, 3, or 4. Two or more of the cyclic structures may be present on the same benzene ring on the basic skeleton represented by the formula (25) or may be present on different benzene rings. For instance, when three cyclic structures are present, each of the cyclic structures may be present on corresponding one of the three benzene rings shown in the formula (25).

Examples of the above cyclic structures formed by mutually bonding the combinations of $R_n$ and $R_{n+1}$ in the compound represented by the formula (25) include structures represented by formulae (251) to (260) below.

(251)

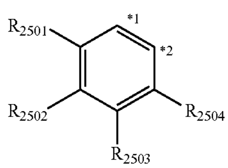

(252)

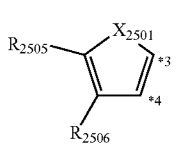

-continued (253)

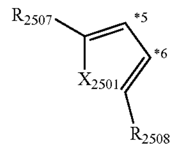

(254)

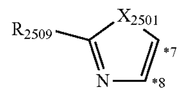

(255)

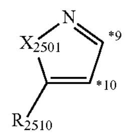

(256)

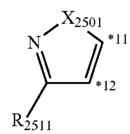

(257)

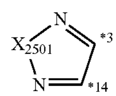

In the formulae (251) to (257): *1 and *2, *3 and *4, *5 and *6, *7 and *8, *9 and *10, *11 and *12, and *13 and *14 each represent the two ring-forming carbon atoms bonded with $R_n$ and $R_{n+1}$, and the ring-forming carbon atom bonded with $R_n$ may be any one of the two ring-forming carbon atoms represented by *1 and *2, *3 and *4, *5 and *6, *7 and *8, *9 and *10, *11 and *12, and *13 and *14;

$X_{2501}$ is C($R_{2512}$)($R_{2513}$), $NR_{2514}$, an oxygen atom or a sulfur atom;

at least one combination of adjacent two or more of $R_{2501}$ to $R_{2506}$ and $R_{2512}$ to $R_{2513}$ are mutually bonded to form a substituted or unsubstituted monocyclic ring, mutually bonded to form a substituted or unsubstituted fused ring, or not mutually bonded; and $R_{2501}$ to $R_{2514}$ not forming the substituted or unsubstituted monocyclic ring and not forming the substituted or unsubstituted fused ring each independently represent the same as $R_{251}$ to $R_{261}$.

(258)

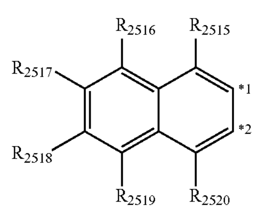

(259)

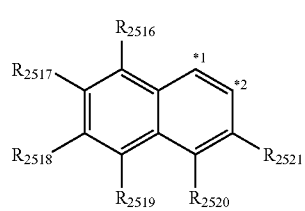

-continued (260)

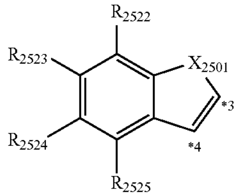

In the formulae (258) to (260): each of the combination of *1 and *2 and the combination of *3 and *4 represents the two ring-forming carbon atoms bonded with $R_n$ and $R_{n+1}$, and the ring-forming carbon atom bonded with $R_n$ may be any one of the two ring-forming carbon atoms represented by the combination of *1 and *2 and the combination of *3 and *4.

$X_{2501}$ is $C(R_{2512})(R_{2513})$, $NR_{2514}$, an oxygen atom or a sulfur atom;

at least one combination of adjacent two or more of $R_{2515}$ to $R_{2525}$ are mutually bonded to form a substituted or unsubstituted monocyclic ring, mutually bonded to form a substituted or unsubstituted fused ring, or not mutually bonded; and $R_{2515}$ to $R_{2521}$ and $R_{2522}$ to $R_{2525}$ not forming the substituted or unsubstituted monocyclic ring and not forming the substituted or unsubstituted fused ring each independently represent the same as $R_{251}$ to $R_{261}$.

In the formula (25), it is preferable that at least one of $R_{252}$, $R_{254}$, $R_{255}$, $R_{260}$ or $R_{261}$ (preferably, at least one of $R_{252}$, $R_{255}$ or $R_{260}$, more preferably $R_{252}$) is a group not forming the cyclic structure.

(i) A substituent, if present, of the cyclic structure formed by $R_n$ and $R_n$+1 of the formula (25), (ii) $R_{251}$ to $R_{261}$ not forming the cyclic structure in the formula (25), and (iii) $R_{2501}$ to $R_{2514}$, $R_{2515}$ to $R_{2525}$ in the formulae (251) to (260) are each independently any one of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, a substituted or unsubstituted aryl group having 6 to 50 ring carbon atoms, a substituted or unsubstituted heterocyclic group having 5 to 50 ring atoms, or a group selected from the group below.

(261)

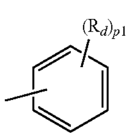

(262)

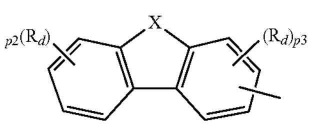

(263)

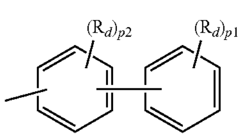

-continued (264)

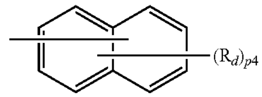

In the formulae (261) to (264): $R_d$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted monovalent heterocyclic group having 5 to 50 ring atoms;

X is $C(R_{901})(R_{902})$, $NR_{903}$, an oxygen atom or a sulfur atom;

$R_{901}$ to $R_{907}$ respectively represent the same as $R_{901}$ to $R_{907}$ of the formula (21);

p1 is 1 to 5;

p2 is 1 to 4;

p3 is 1 to 3; and p4 is 1 to 7.

In some embodiments, the compound represented by the formula (25) is represented by one of formulae (25-1) to (25-6) below.

(25-1)

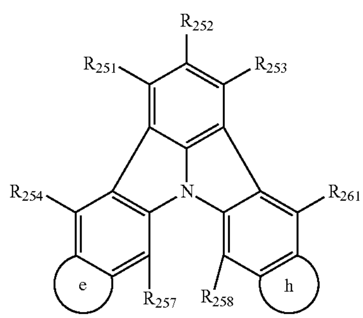

(25-2)

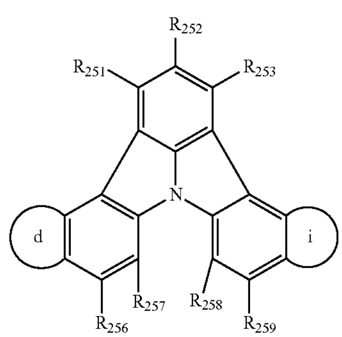

-continued (25-3)

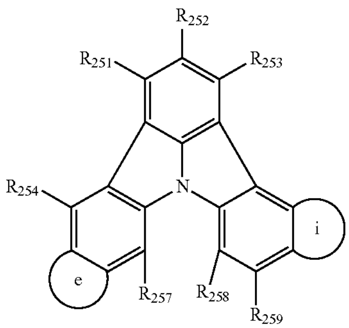

(25-4)

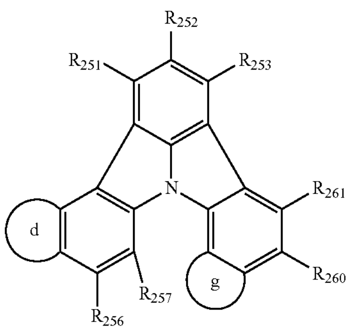

(25-5)

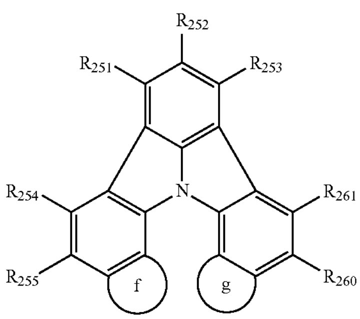

(25-6)

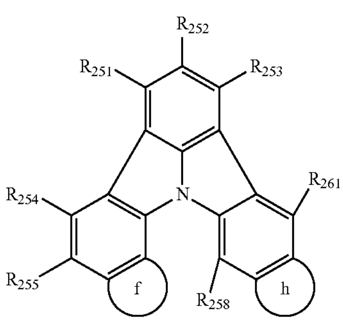

In the formulae (25-1) to (25-6), a ring d, ring e, ring f, ring g, ring h and ring i are each independently a substituted or unsubstituted monocyclic ring or a substituted or unsubstituted fused ring, the monocyclic ring and fused ring being saturated or unsaturated ring; and $R_{251}$ to $R_{261}$ respectively represent the same as $R_{251}$ to $R_{261}$ of the formula (25).

In some embodiments, the compound represented by the formula (25) is represented by one of formulae (25-7) to (25-12) below.

(25-7)

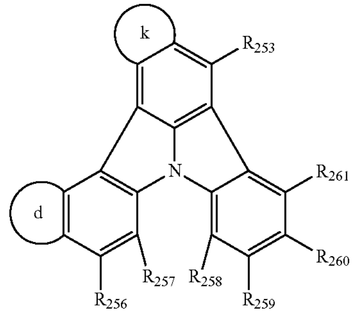

(25-8)

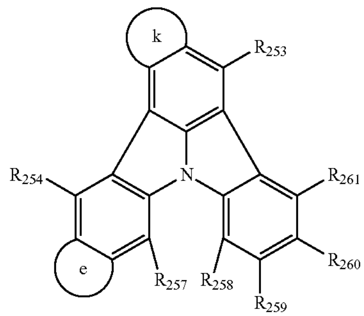

(25-9)

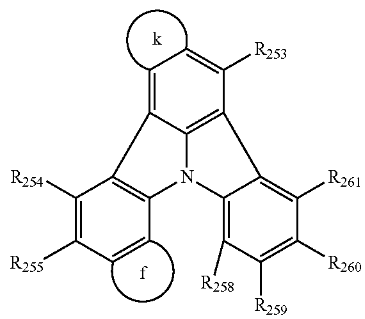

(25-10)

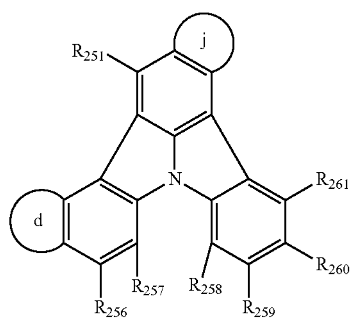

(25-11)

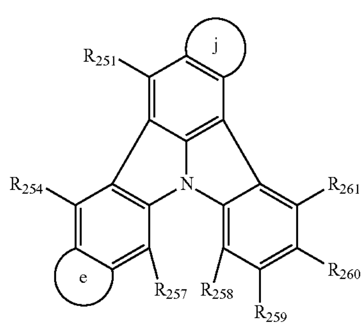

-continued (25-12)

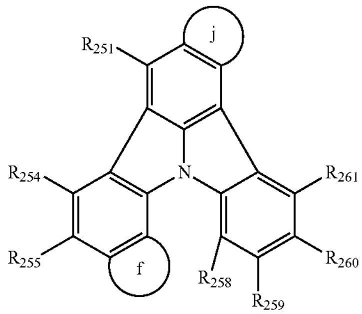

In the formulae (25-7) to (25-12), a ring d, ring e, ring f, ring k, and ring j are each independently a substituted or unsubstituted monocyclic ring or a substituted or unsubstituted fused ring, the monocyclic ring and fused ring being saturated or unsaturated ring; and $R_{251}$ to $R_{261}$ respectively represent the same as $R_{251}$ to $R_{261}$ of the formula (25).

In some embodiments, the compound represented by the formula (25) is represented by one of formulae (25-13) to (25-21) below.

(25-13)

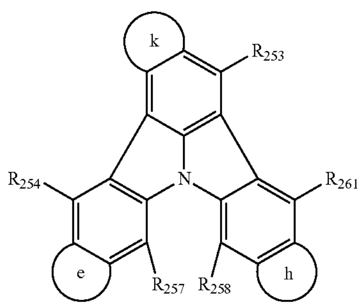

(25-14)

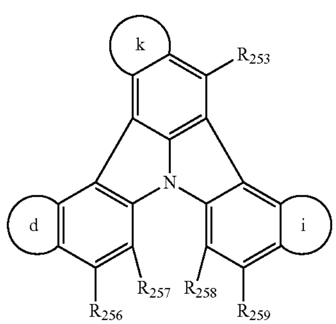

(25-15)

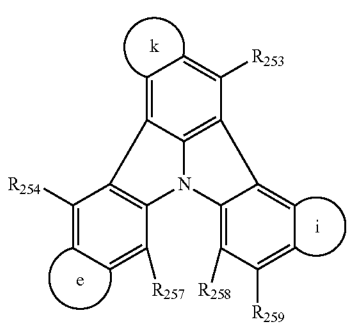

-continued (25-16)

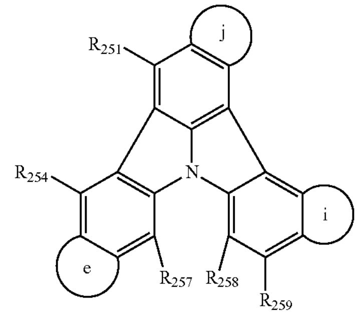

(25-17)

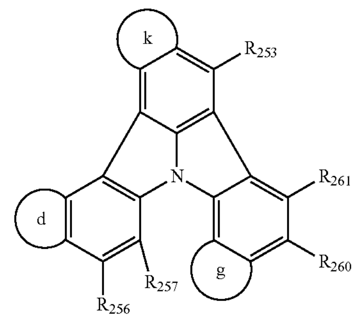

(25-18)

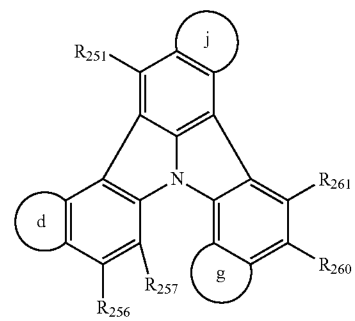

(25-19)

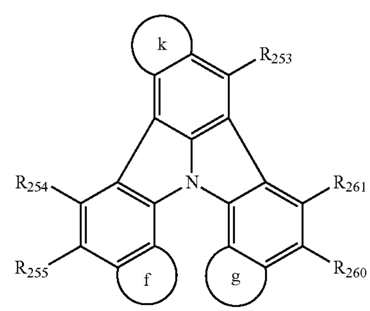

(25-20)

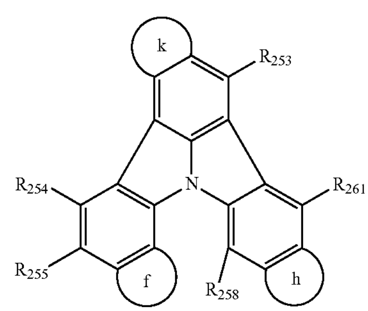

-continued (25-21)

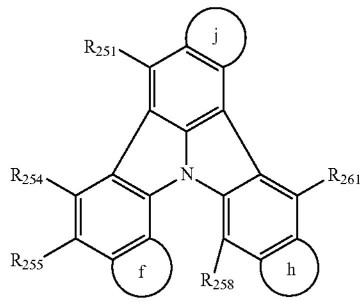

In the formulae (25-13) to (25-21), a ring d, ring e, ring f, ring g, ring h, ring i and ring j are each independently a substituted or unsubstituted monocyclic ring or a substituted or unsubstituted fused ring, the monocyclic ring and fused ring being saturated or unsaturated ring; and $R_{251}$ to $R_{261}$ respectively represent the same as $R_{251}$ to $R_{261}$ of the formula (25).

When the ring g or the ring h further has a substituent, examples of the substituent include a substituted or unsubstituted alkyl group having 1 to 50 carbon atoms, a substituted or unsubstituted aryl group having 6 to 50 ring carbon atoms, a group represented by the formula (261), a group represented by the formula (263), and a group represented by the formula (264).

In some embodiments, the compound represented by the formula (25) is represented by one of formulae (25-22) to (25-25) below.

(25-22)

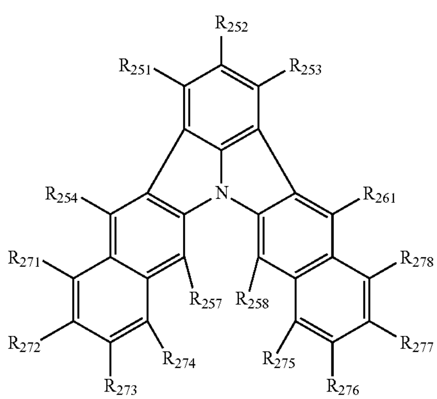

(25-23)

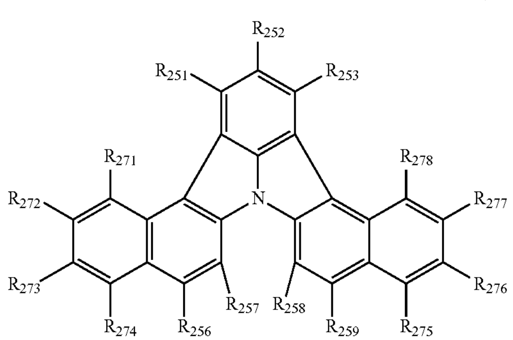

-continued (25-24)

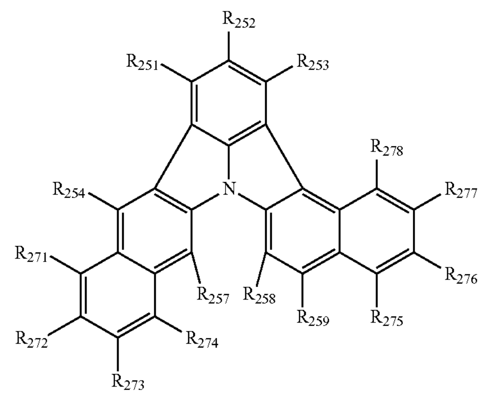

(25-25)

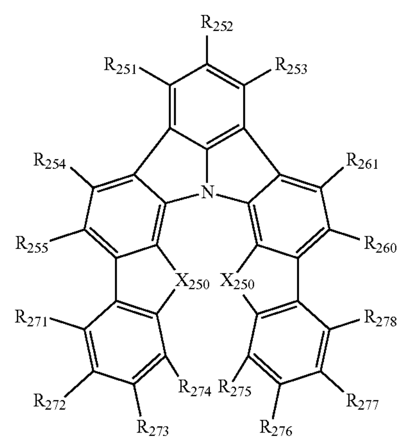

In the formulae (25-22) to (25-25):

$X_{250}$ is $C(R_{901})(R_{902})$, $NR_{903}$, an oxygen atom or a sulfur atom;

two $X_{250}$ are mutually the same or different;

$R_{251}$ to $R_{261}$ and $R_{271}$ to $R_{278}$ each independently represent the same as $R_{251}$ to $R_{261}$ of the formula (25); and $R_{901}$ to $R_{903}$ each independently represent the same as $R_{901}$ to $R_{907}$ of the formula (21).

In some embodiments, the compound represented by the formula (25) is represented by a formula (25-26) below.

(25-26)

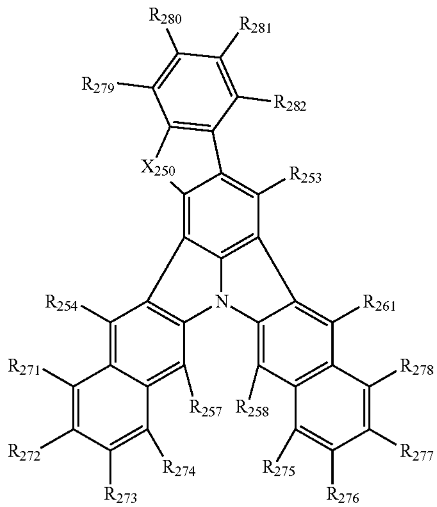

In the formula (25-26): $X_{250}$ is $C(R_{901})(R_{902})$, $NR_{903}$, an oxygen atom or a sulfur atom;

$R_{253}$, $R_{254}$, $R_{257}$, $R_{258}$, $R_{261}$, and $R_{271}$ to $R_{282}$ each independently represent the same as $R_{251}$ to $R_{261}$ of the formula (25); and $R_{901}$ to $R_{903}$ each represent the same as $R_{901}$ to $R_{907}$ of the formula (21).

Specific Examples of Compound Represented by Formula (21)

Specific examples of the compound represented by the formula (21) include compounds shown below. In the specific examples below, Ph represents a phenyl group, and D represents a deuterium atom. It should however be noted that the invention is not limited by the specific examples of the second compound.

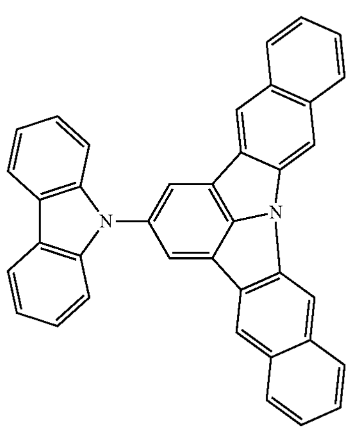

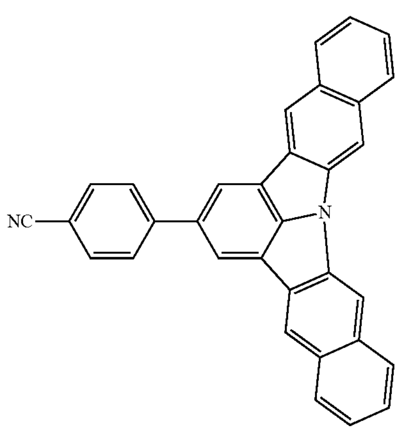

-continued
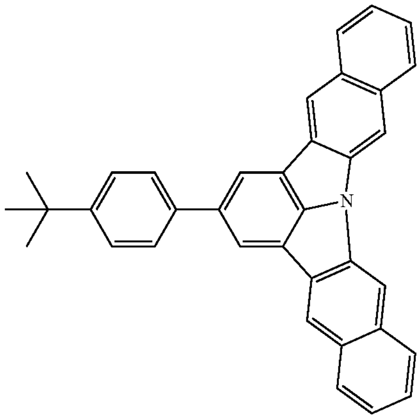
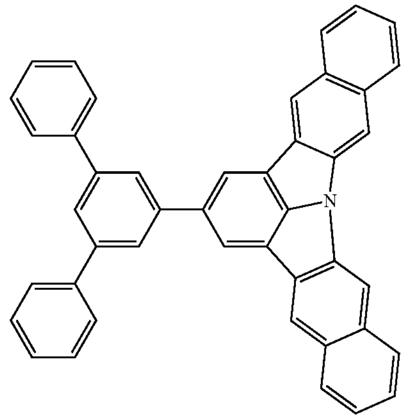
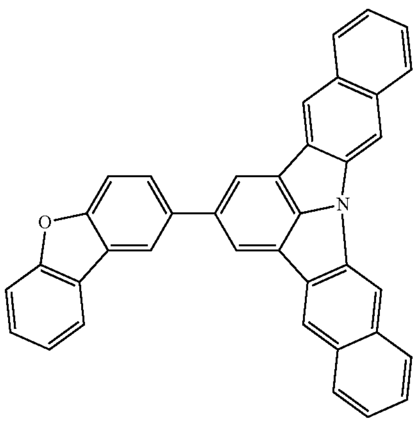
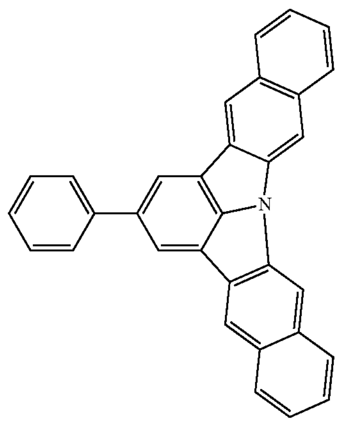
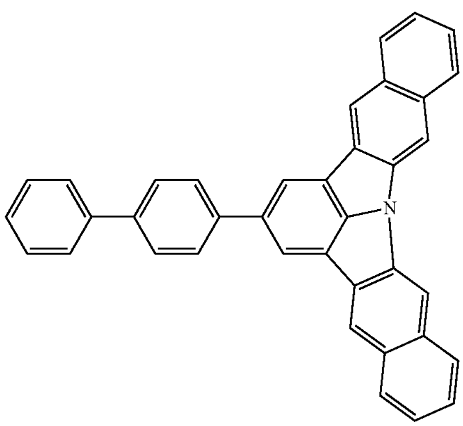
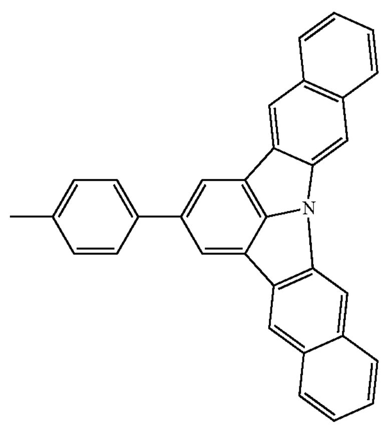
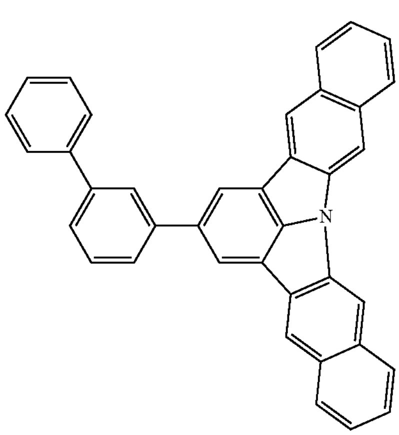
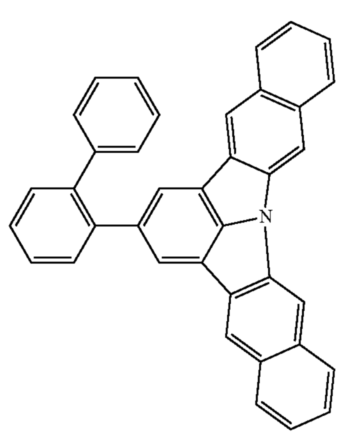

-continued
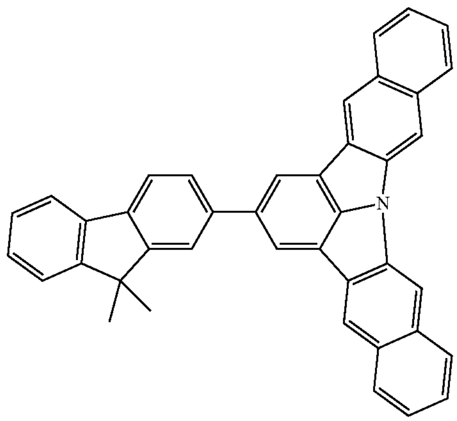
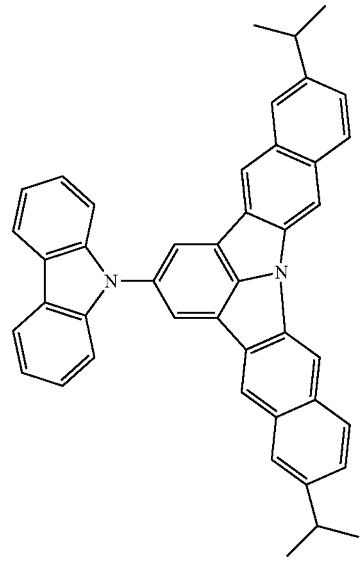
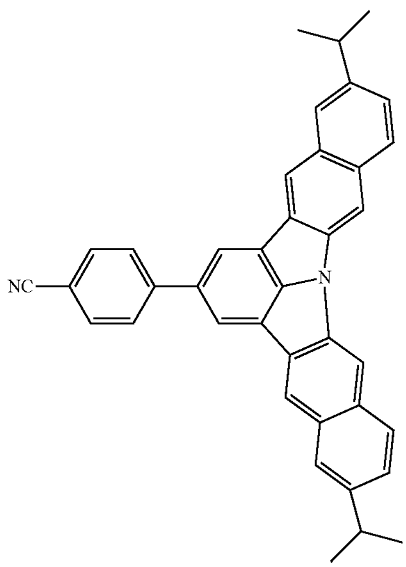
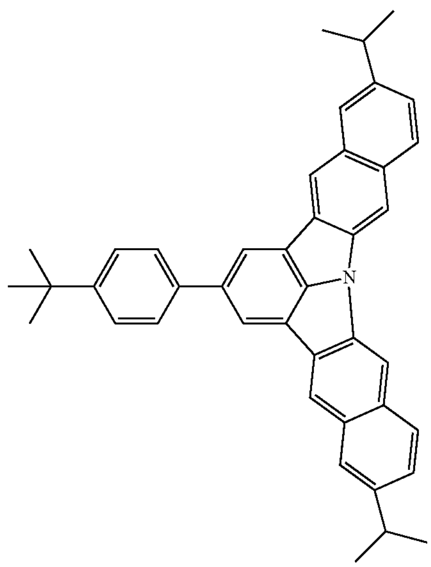
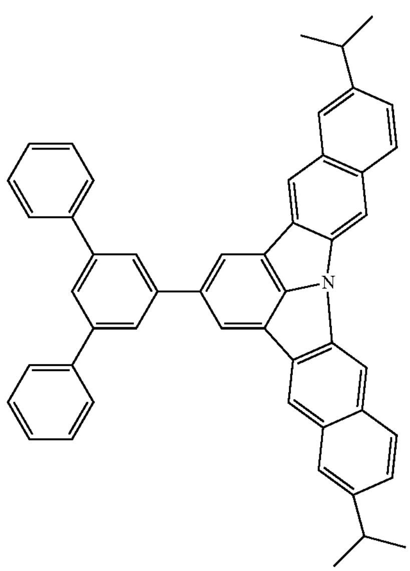
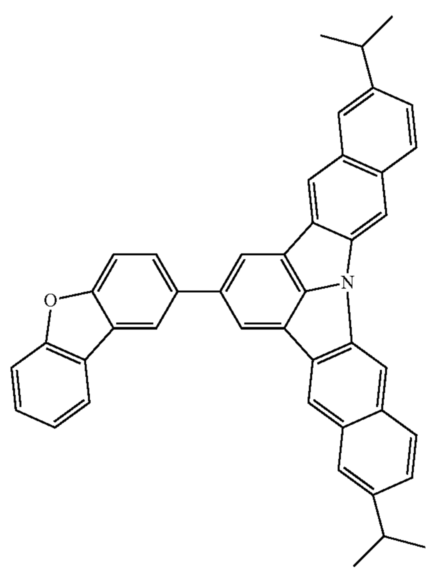

-continued
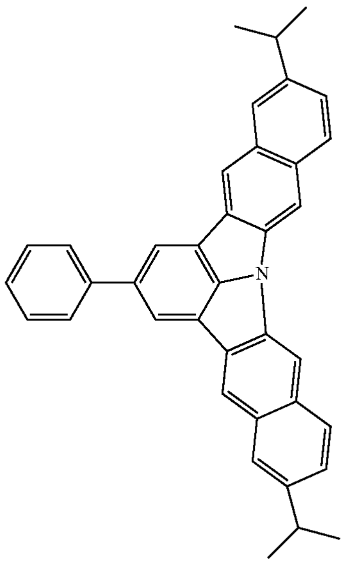
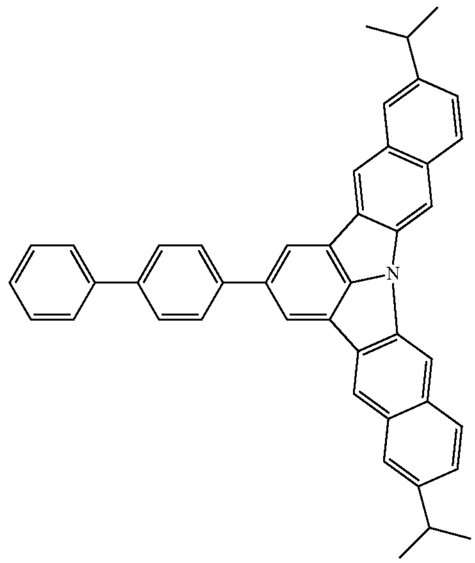
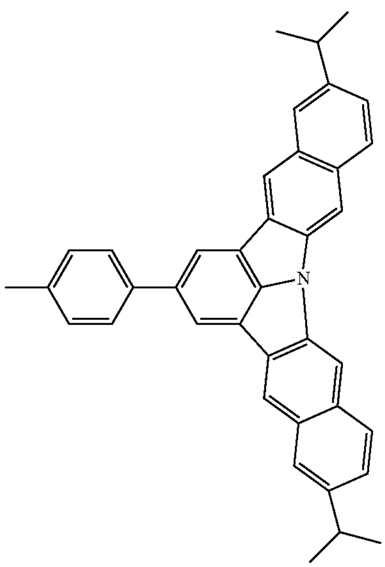
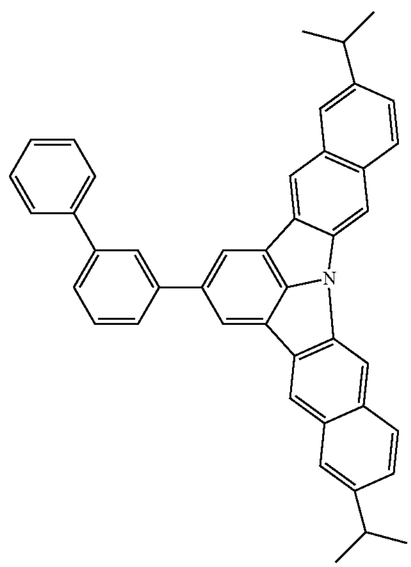
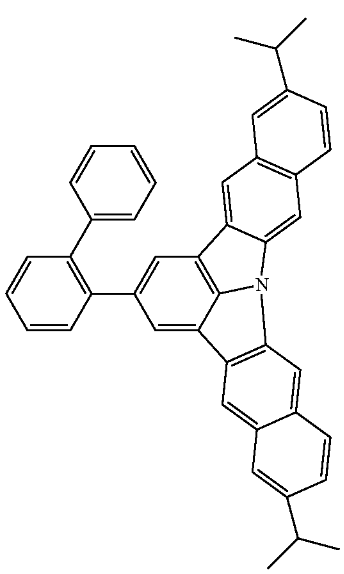
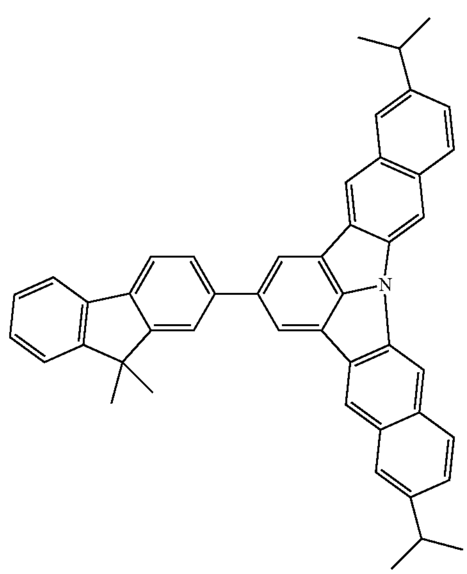

-continued
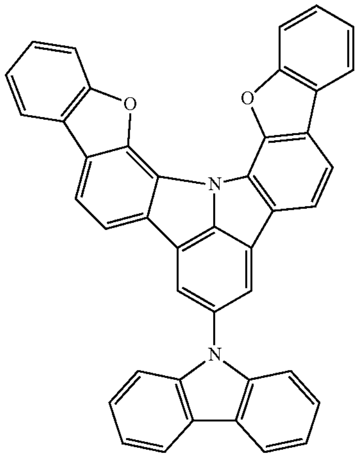
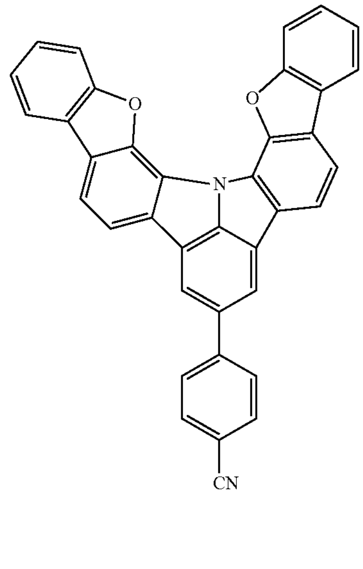
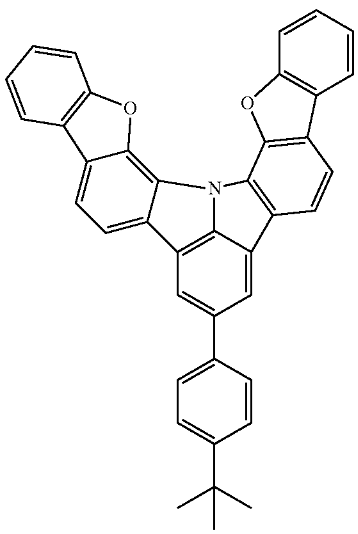
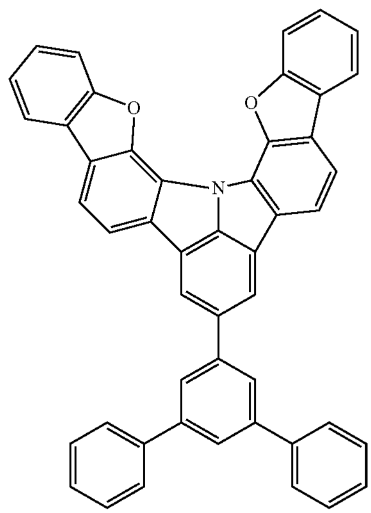
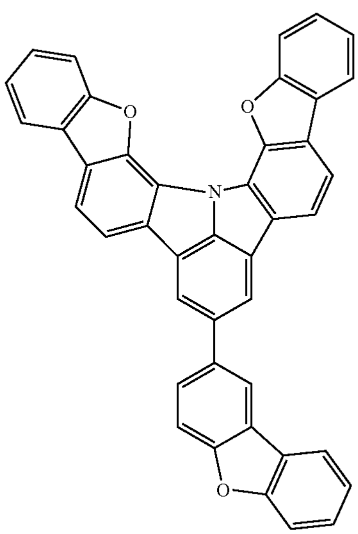
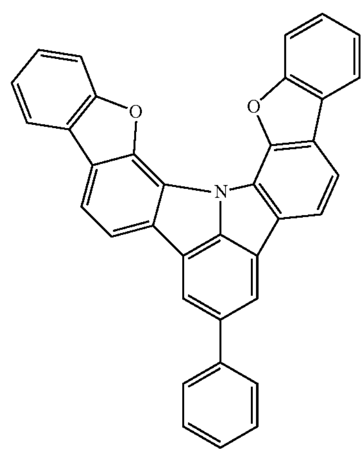

-continued
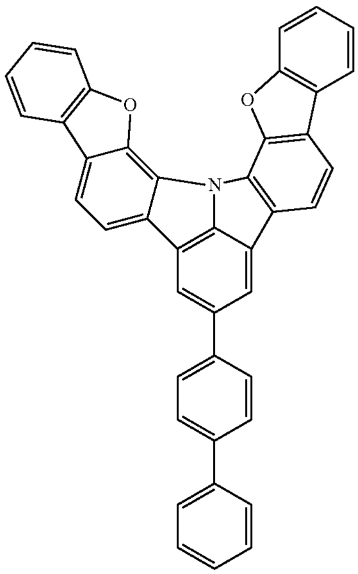
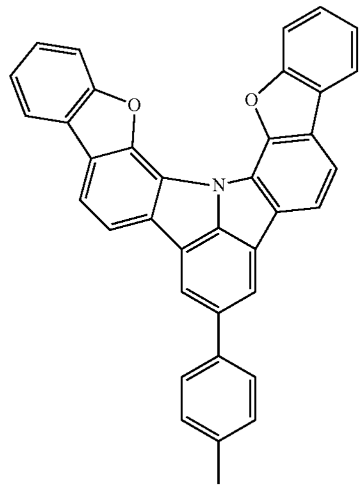
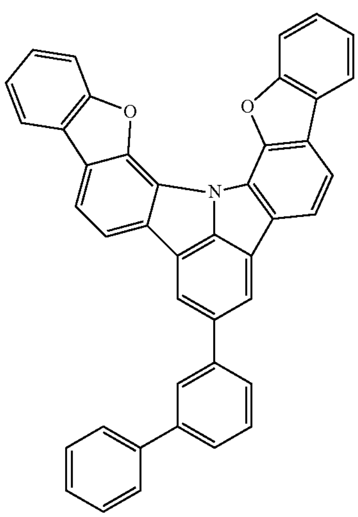
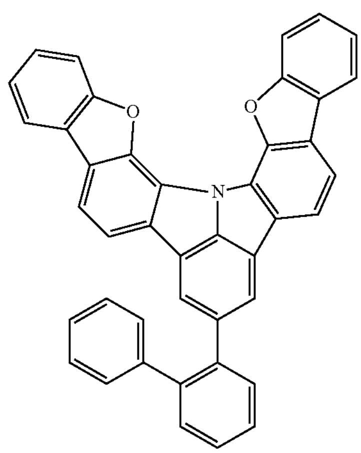
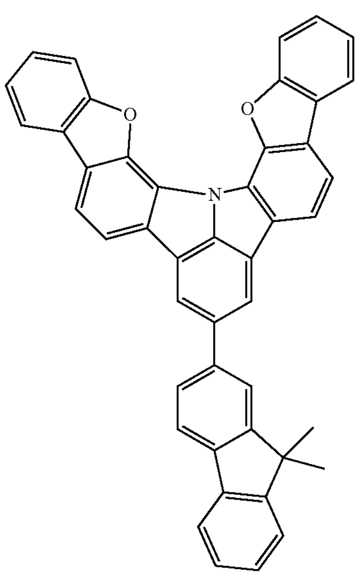
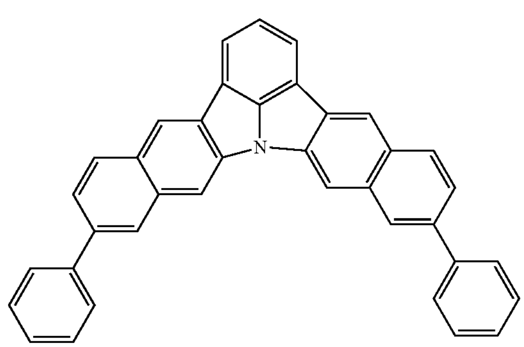

-continued
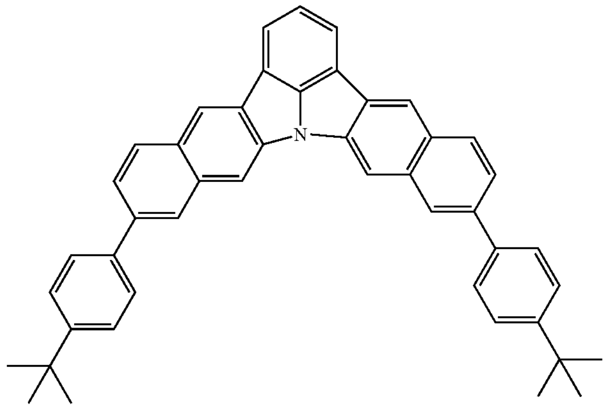
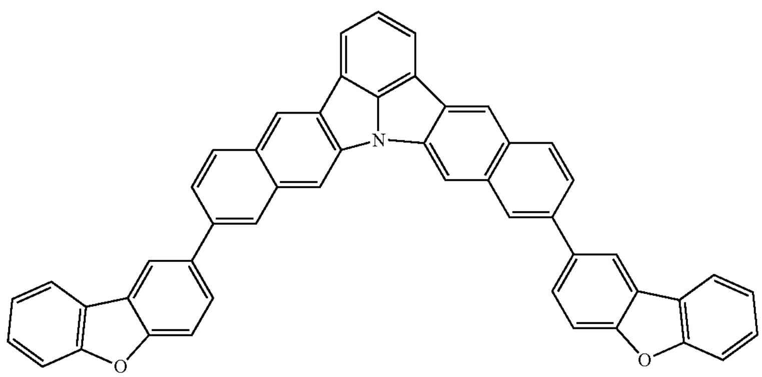
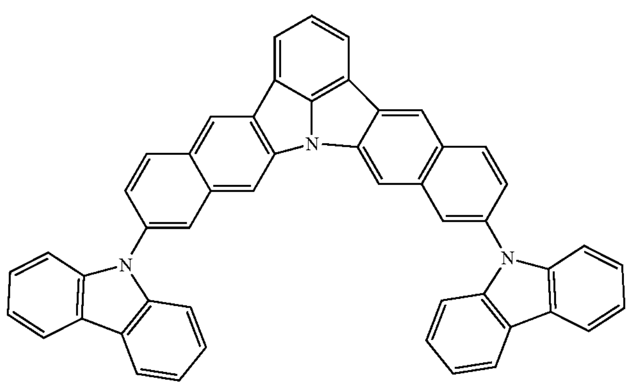
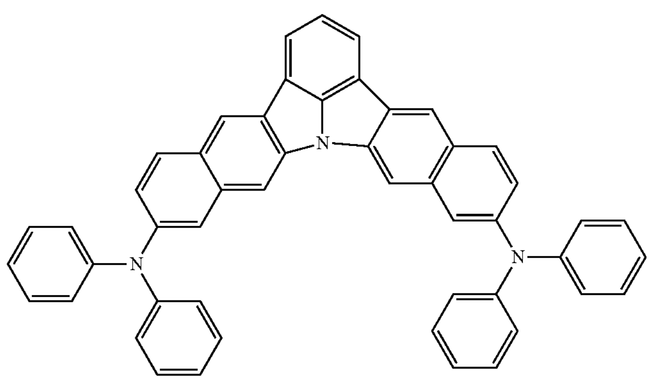

-continued
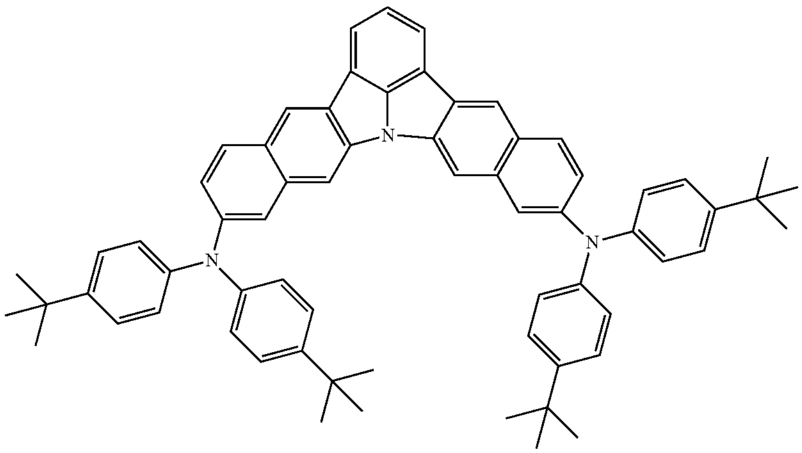
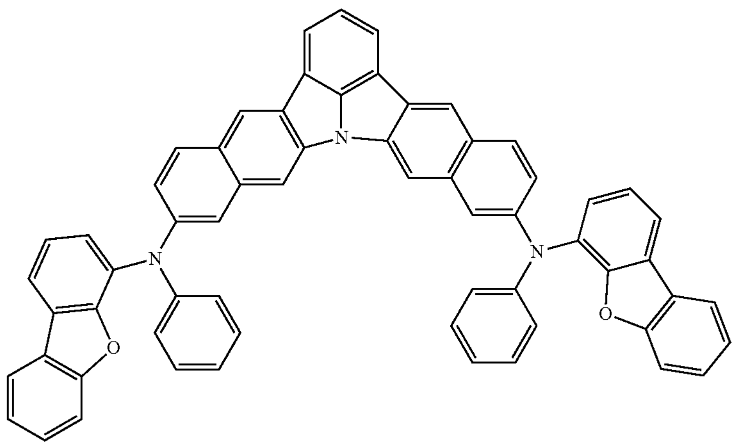
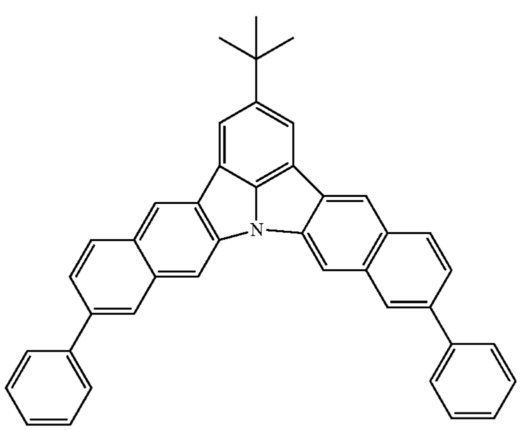
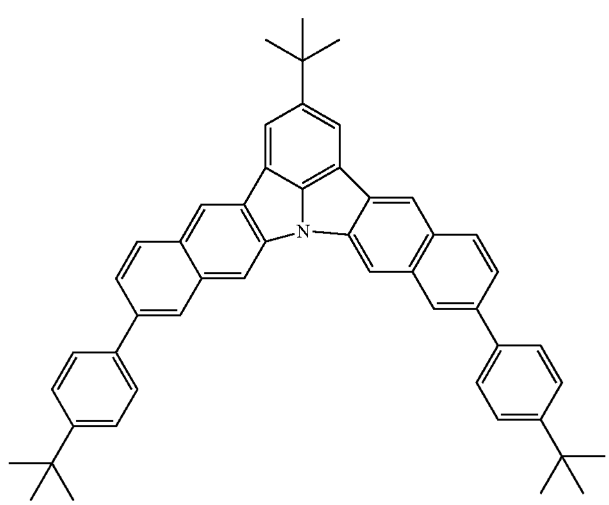

-continued
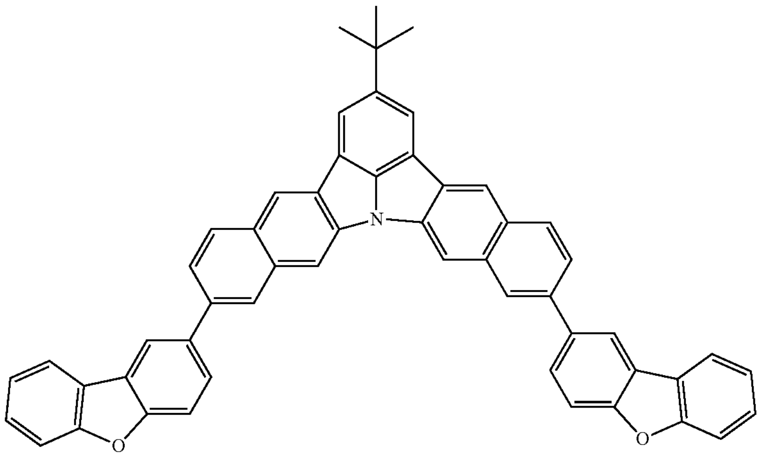
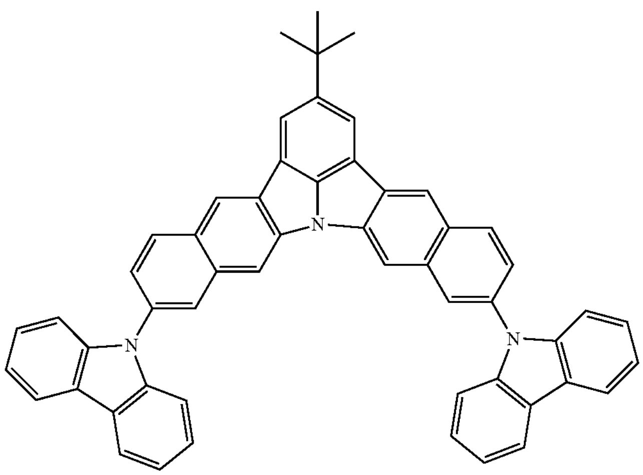
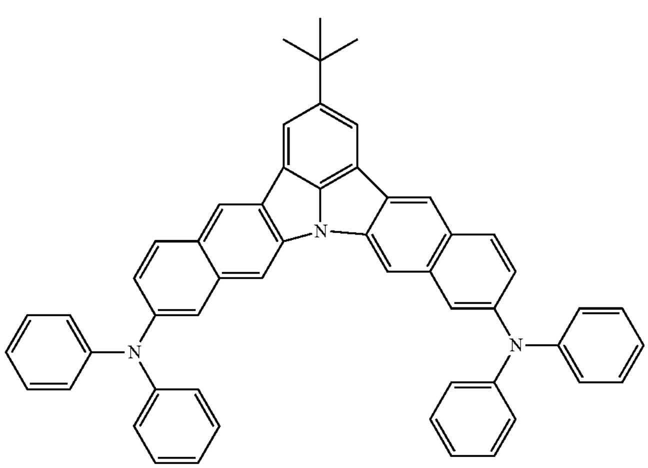

-continued
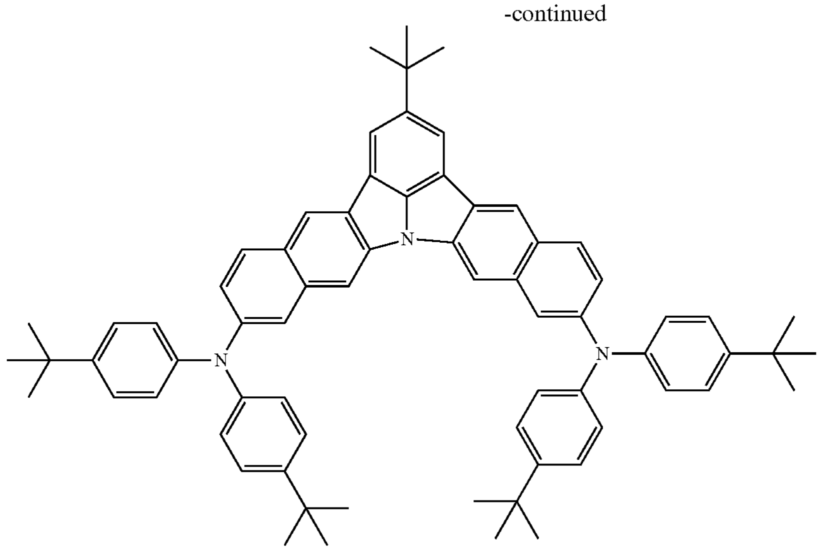
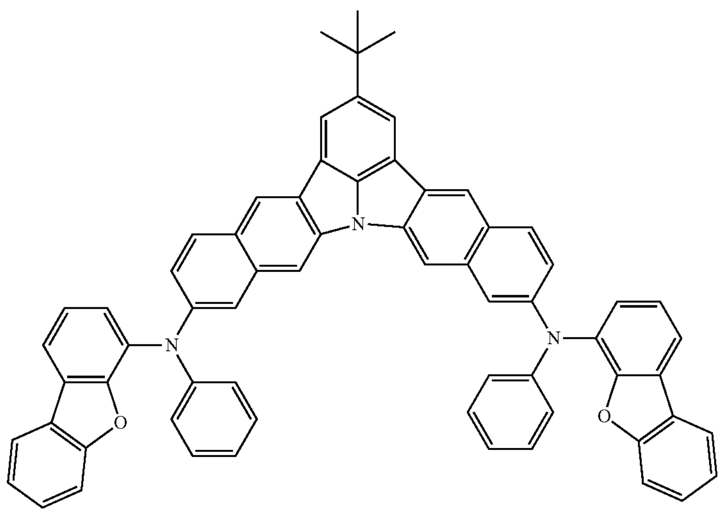
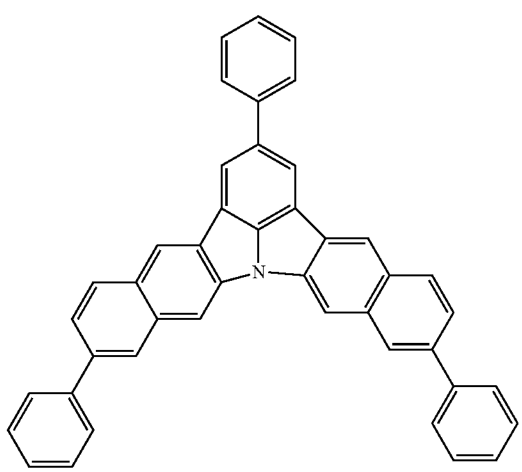
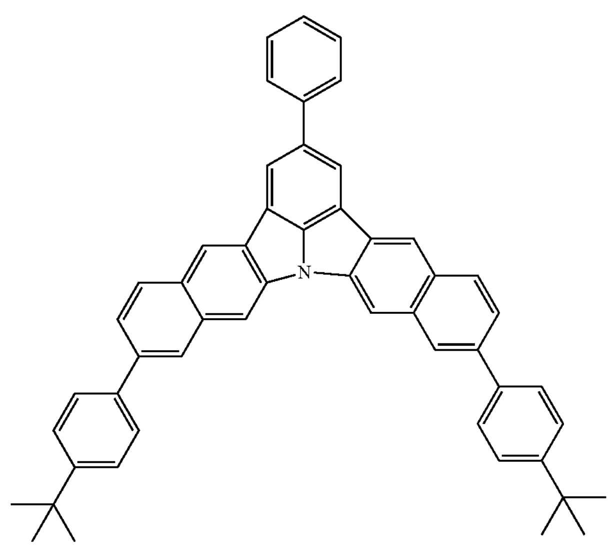

-continued
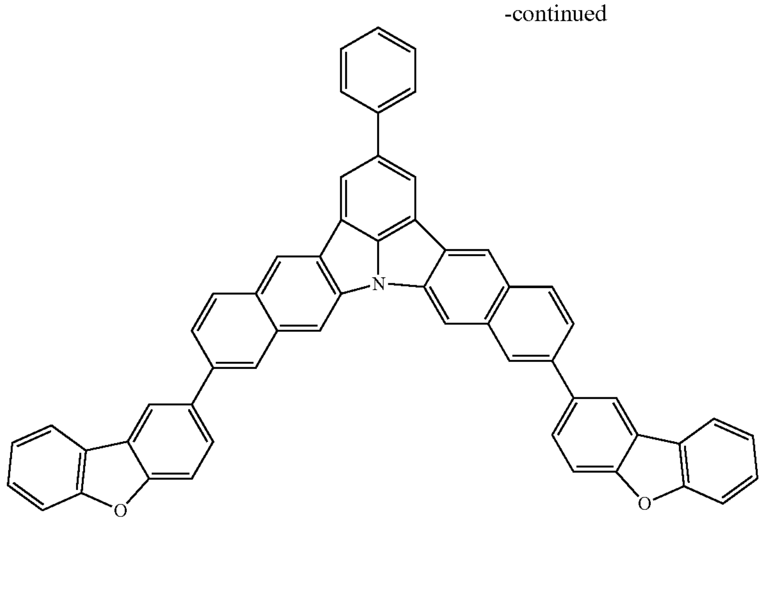
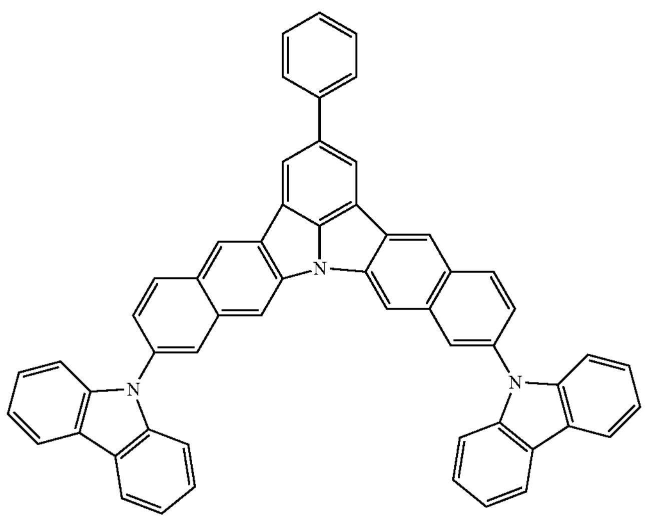
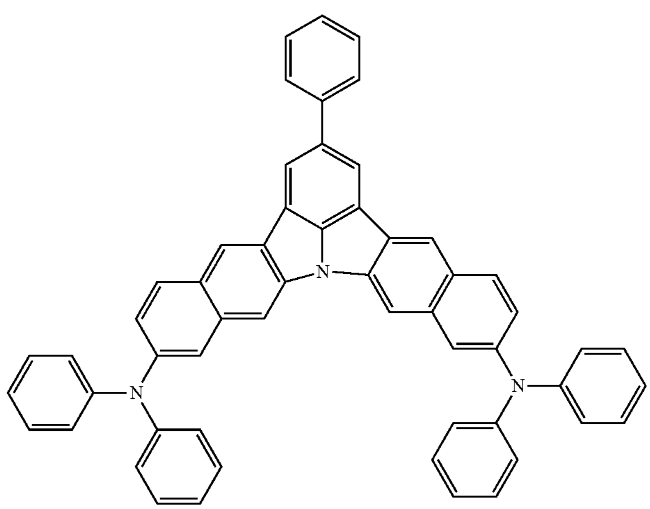

-continued
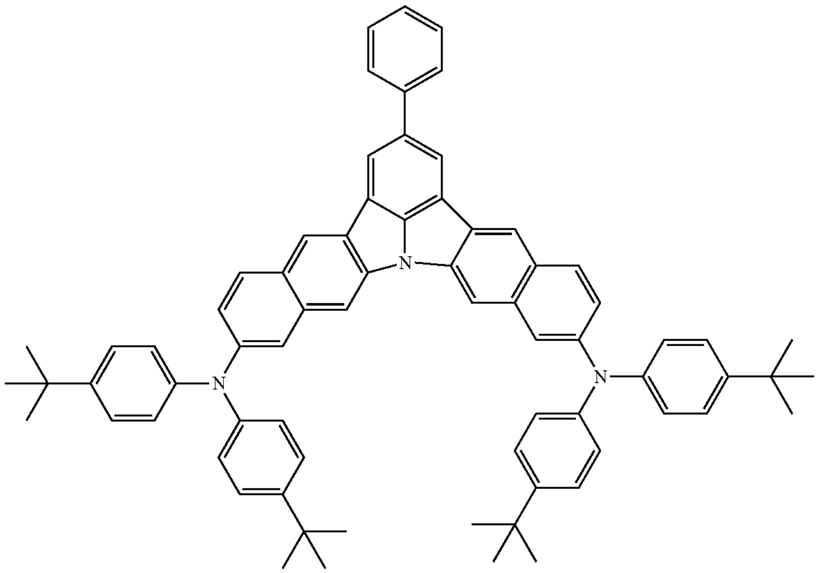
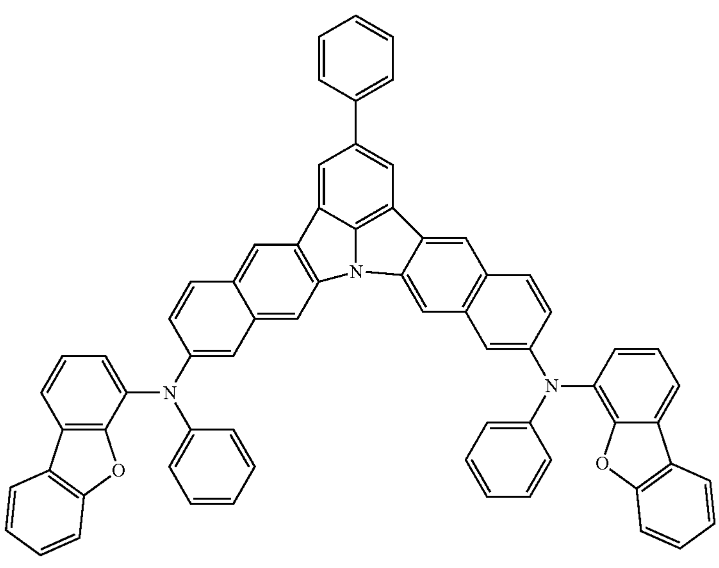

-continued
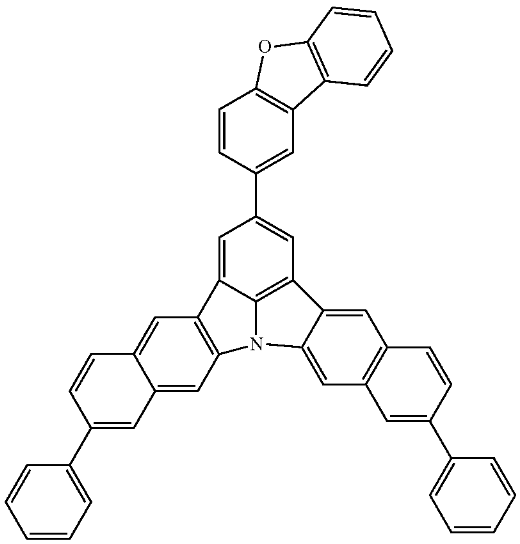
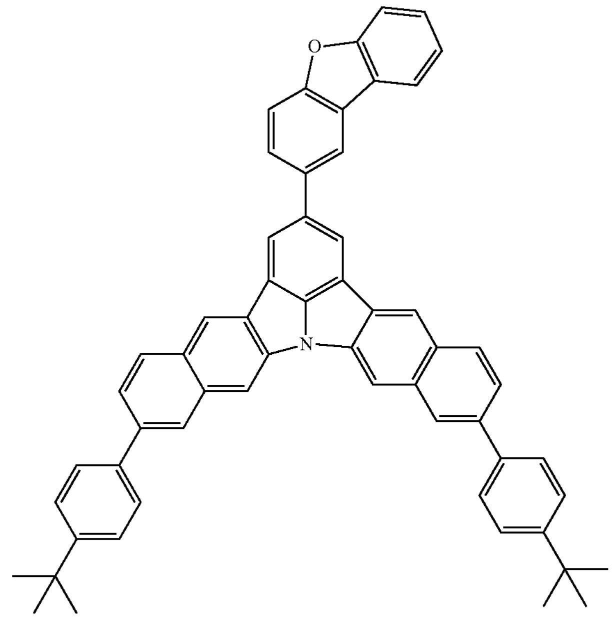
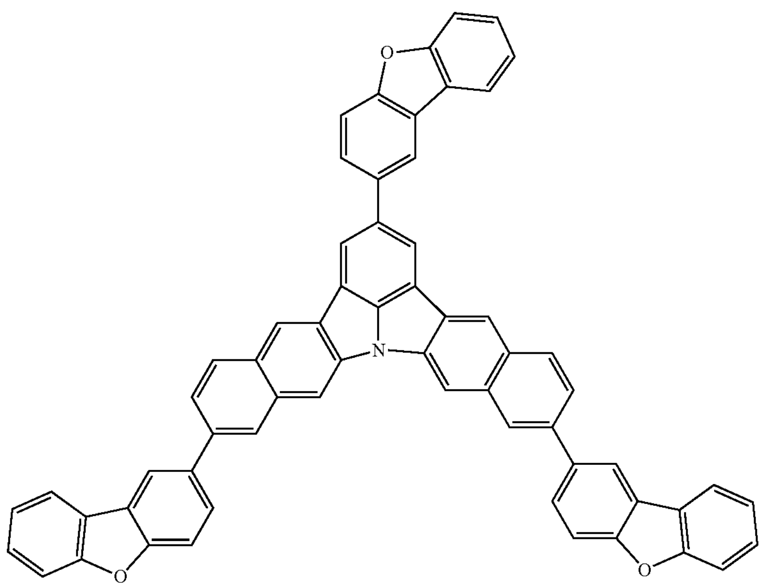
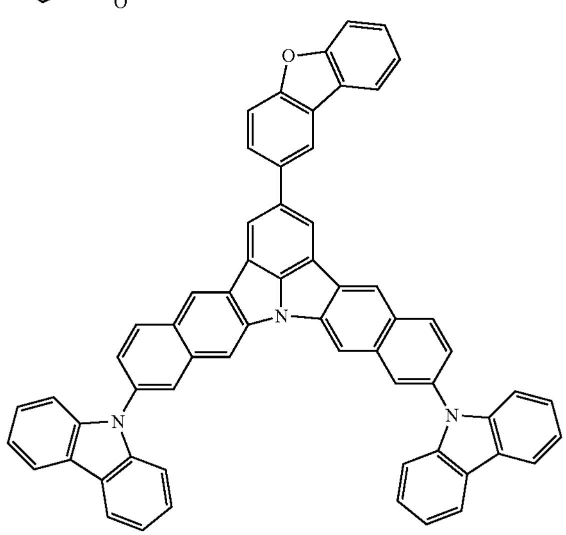
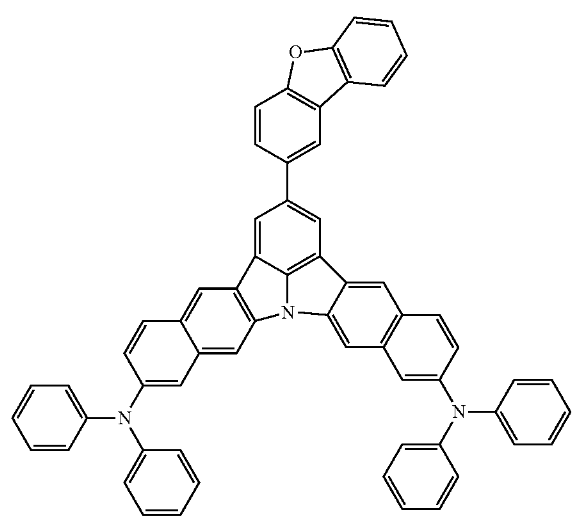

-continued
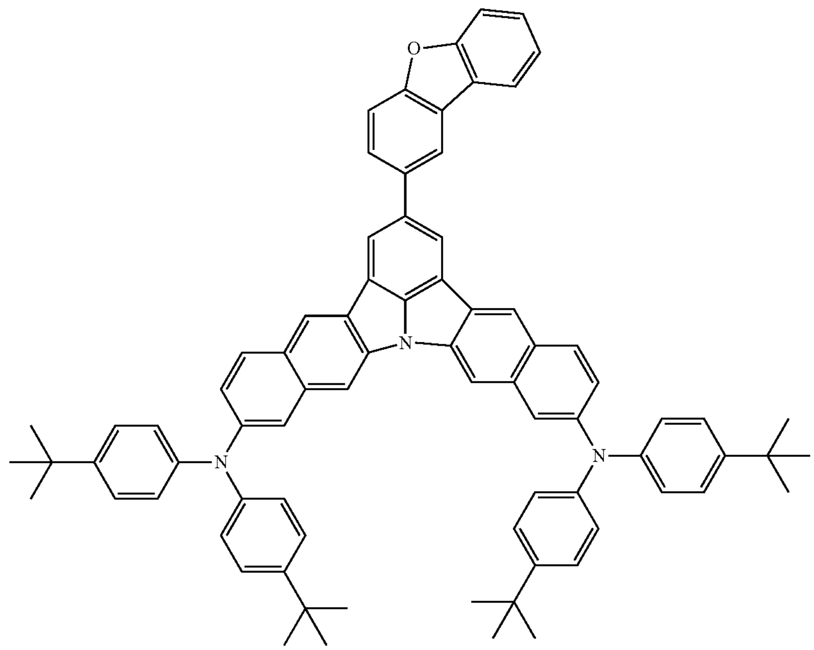
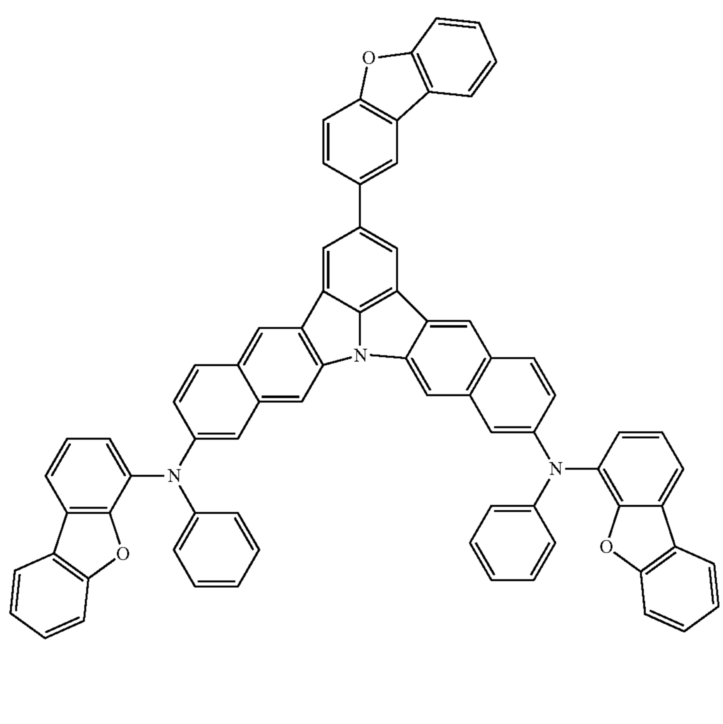

-continued
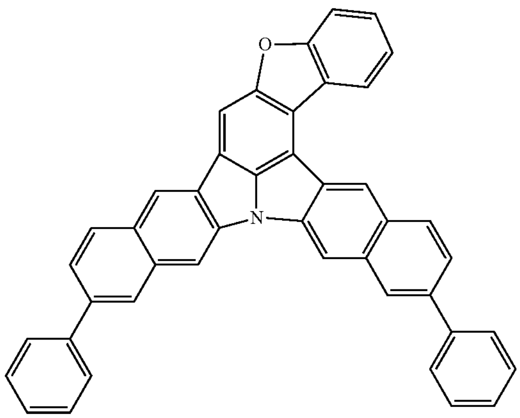
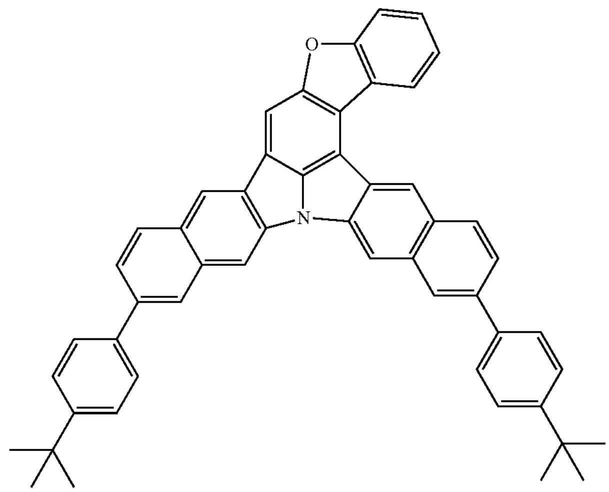
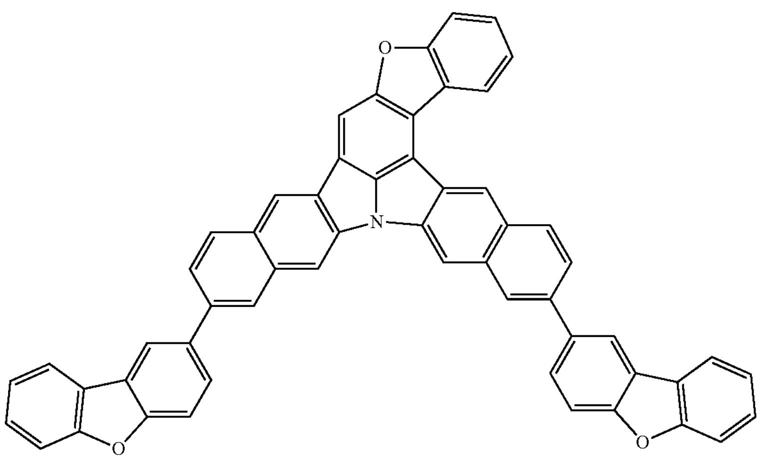
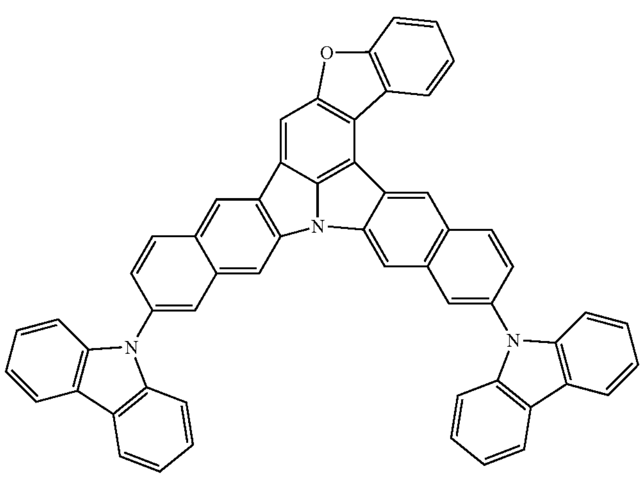

-continued
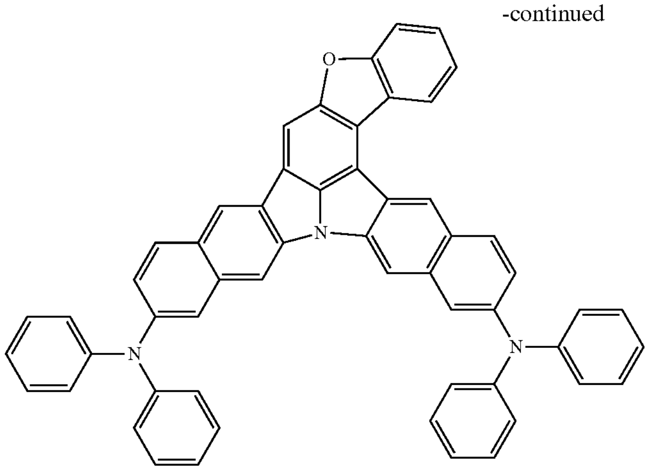
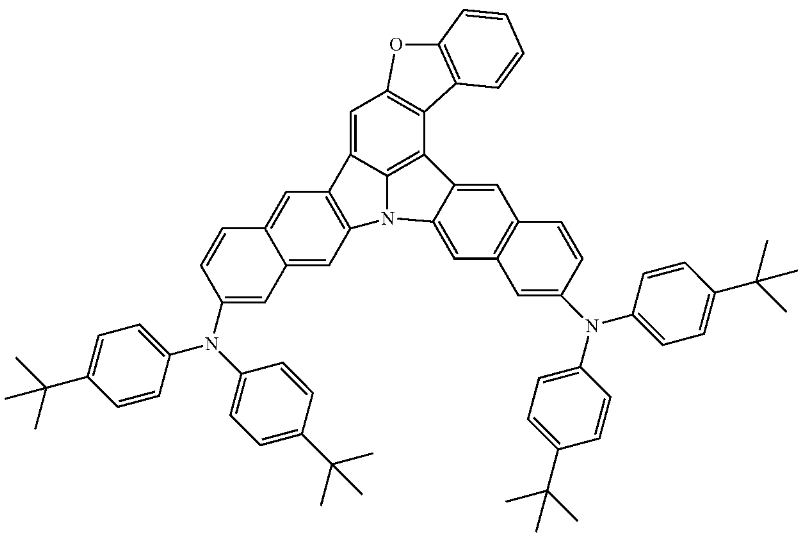
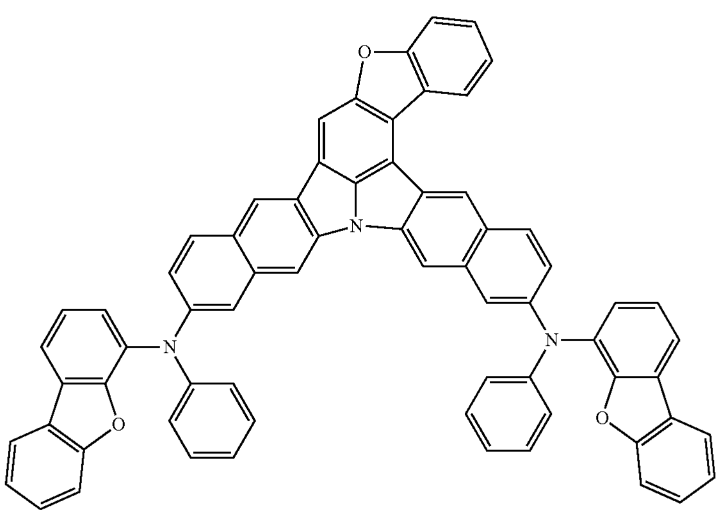

-continued
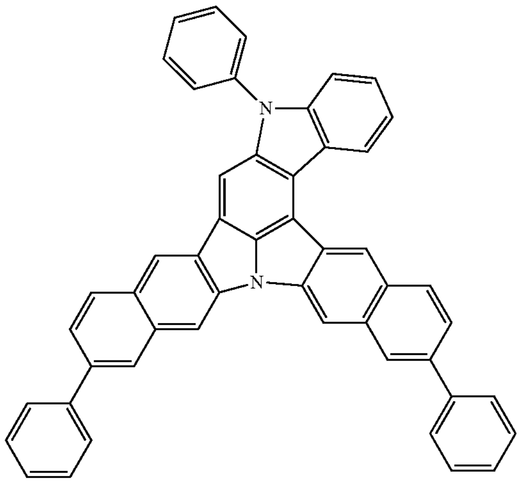
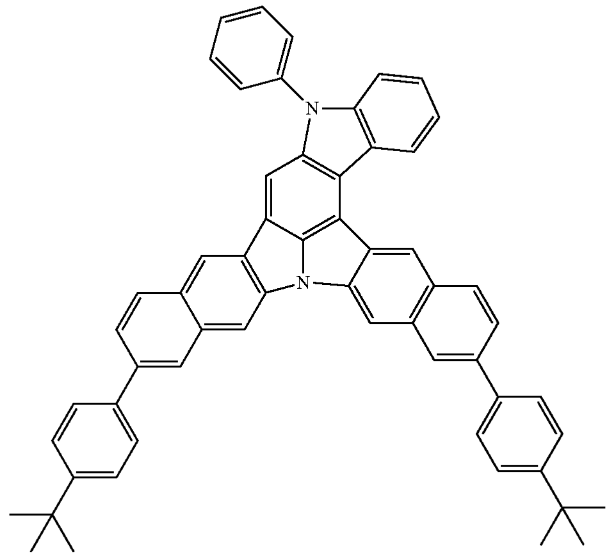
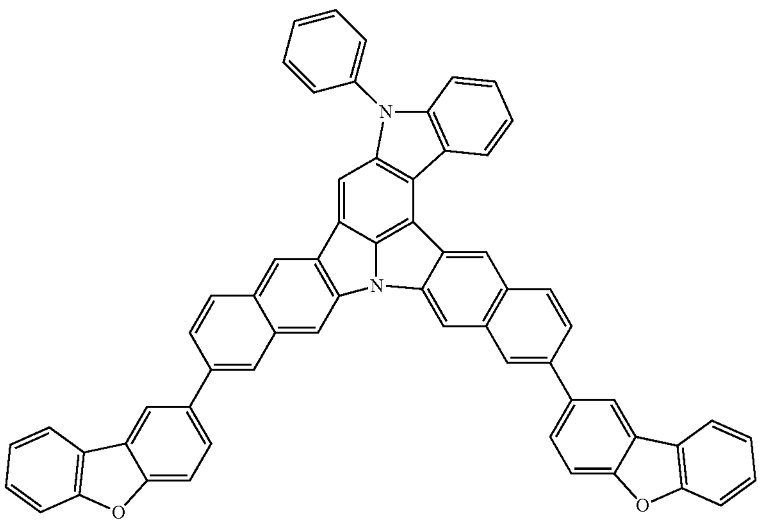
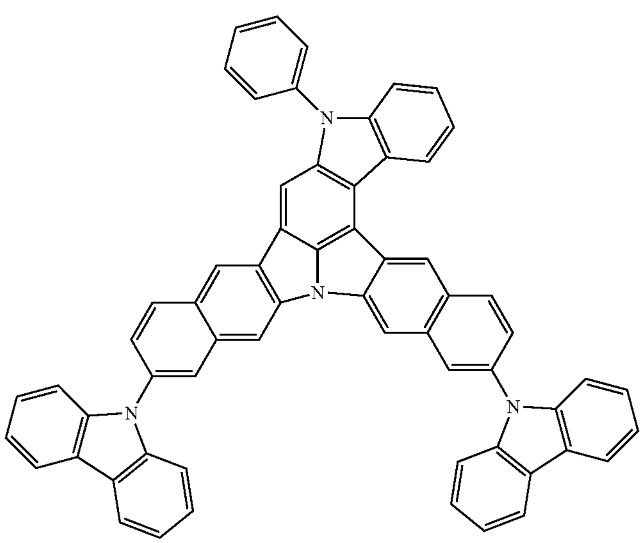

-continued
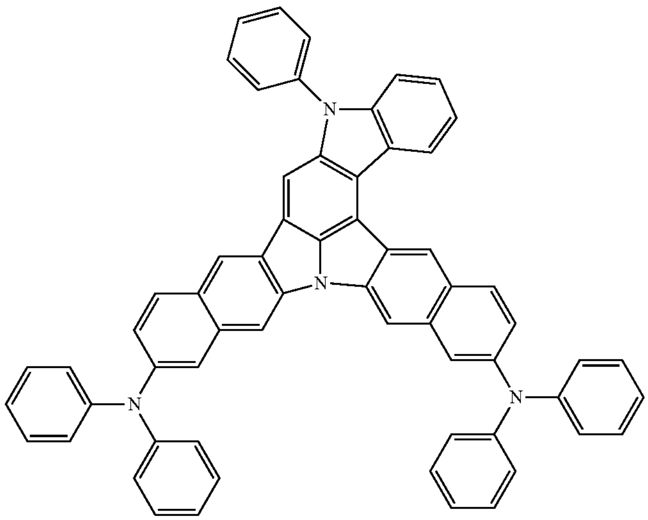
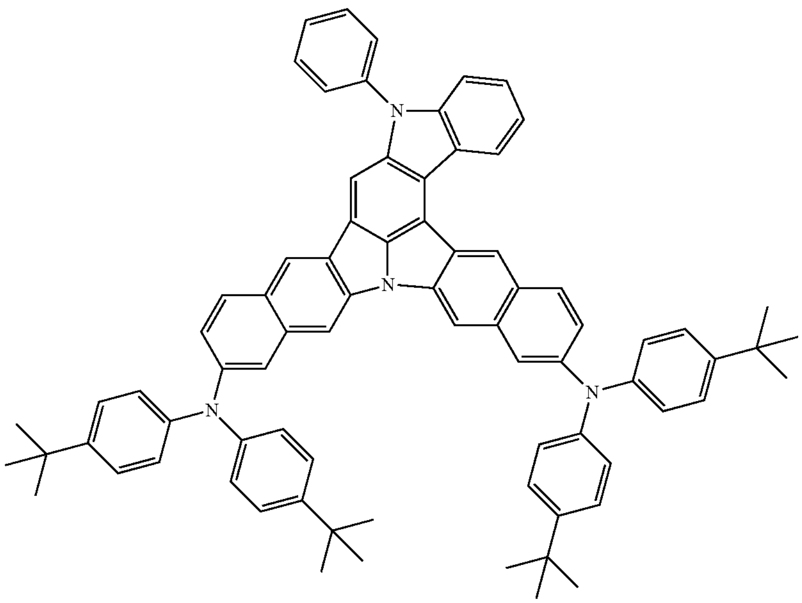
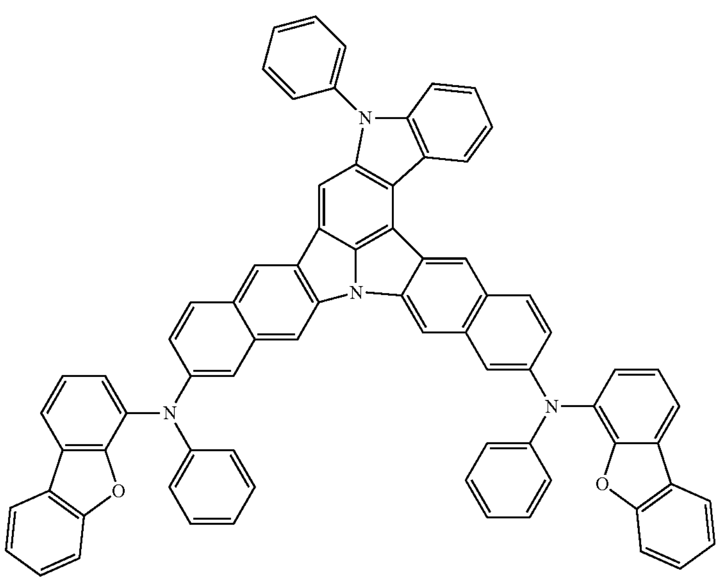

-continued
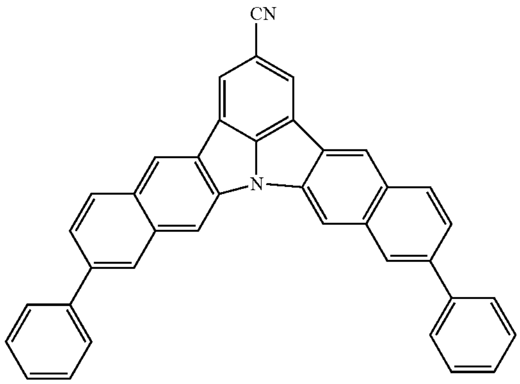
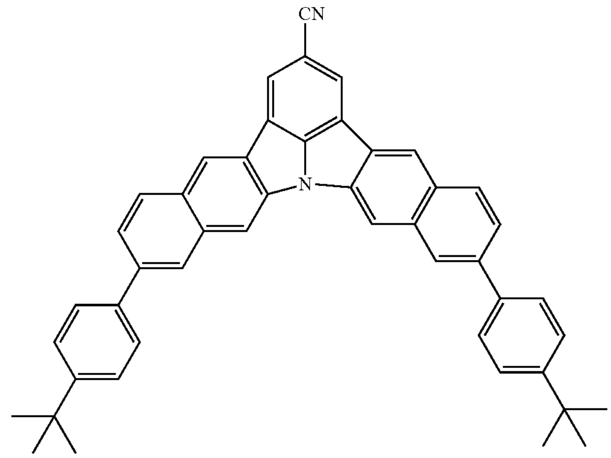
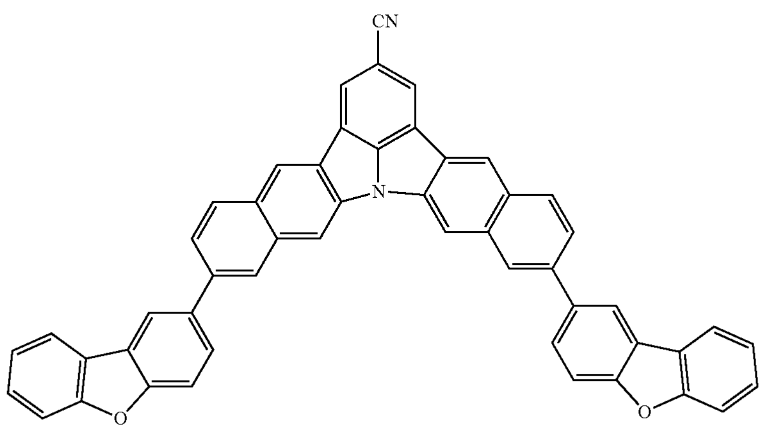
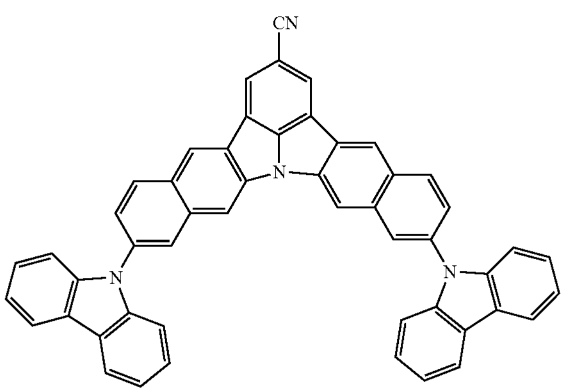
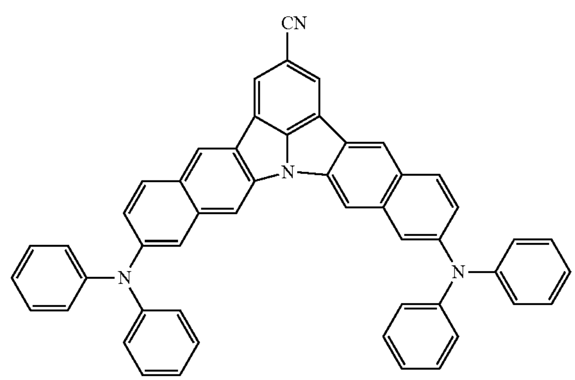

-continued
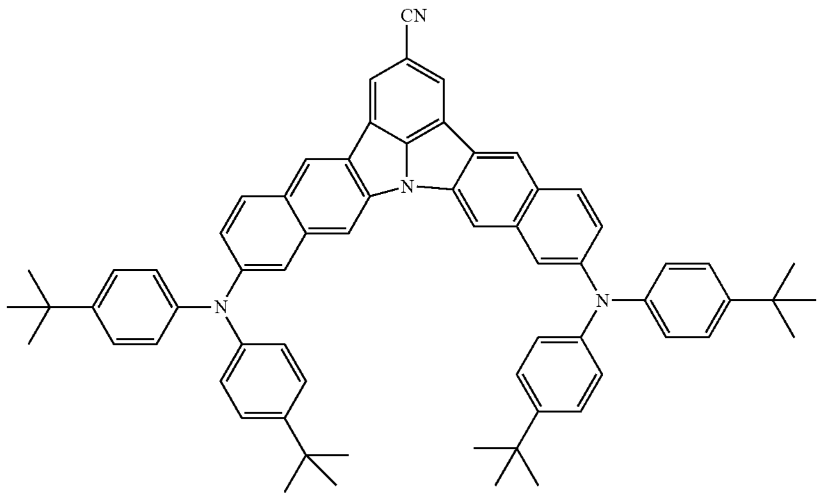
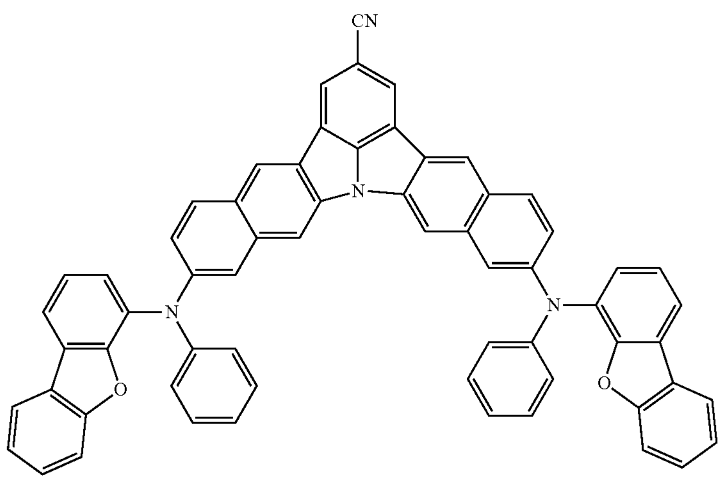
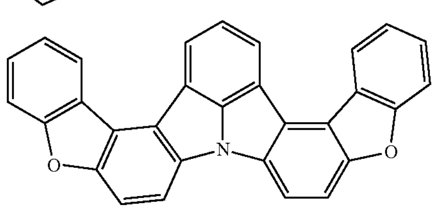
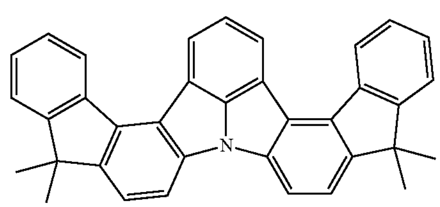
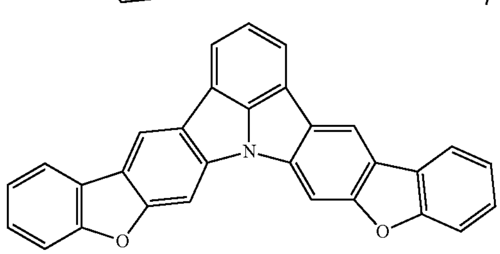
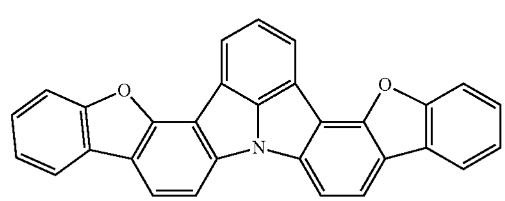
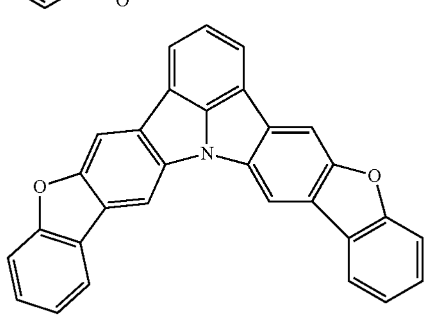
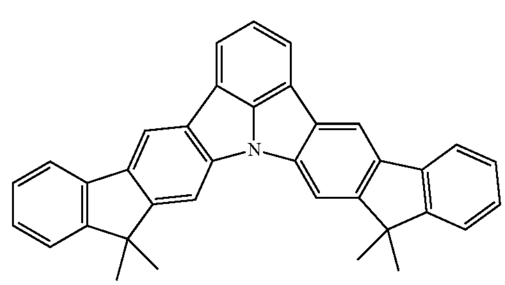

-continued
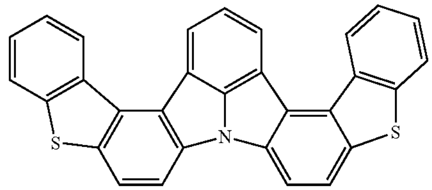
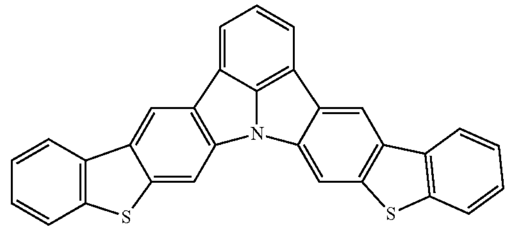
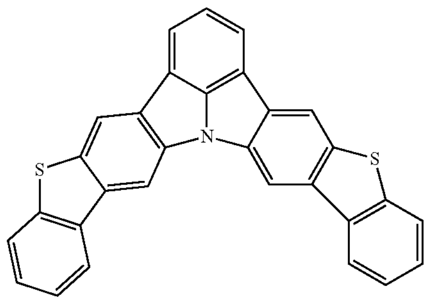
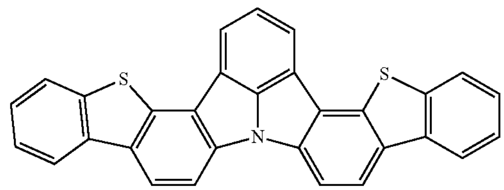
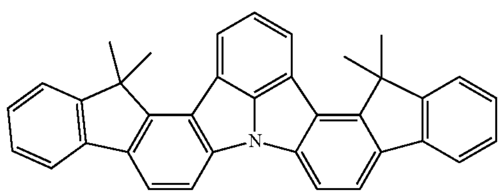
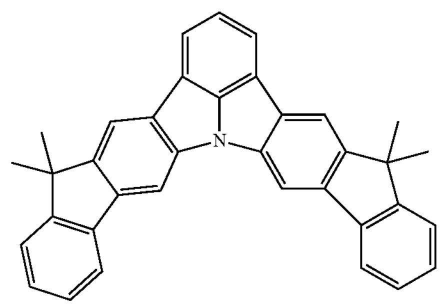
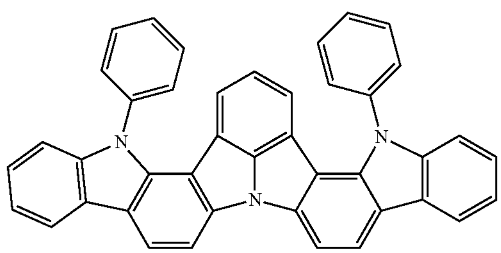
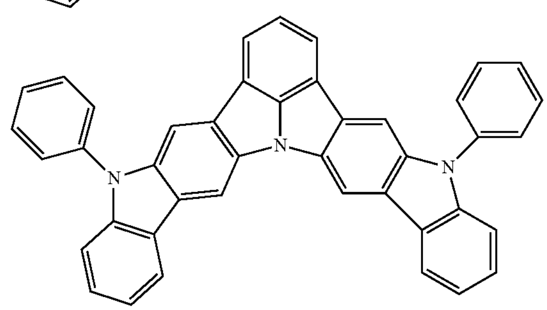
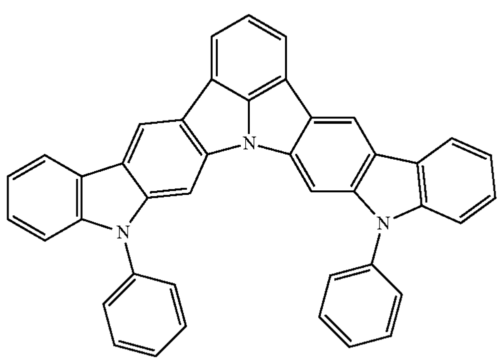
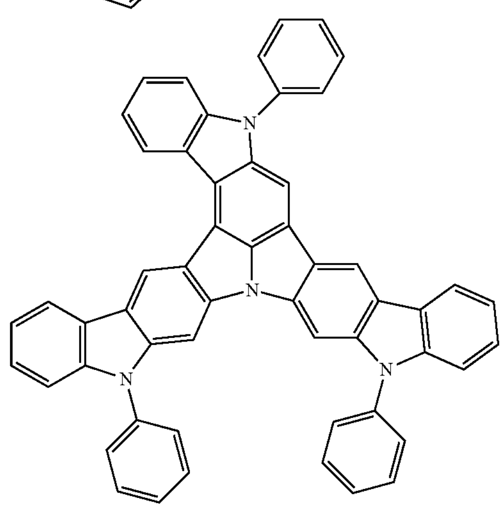

-continued
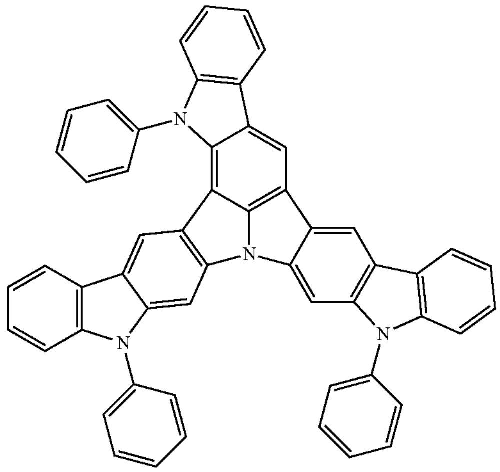
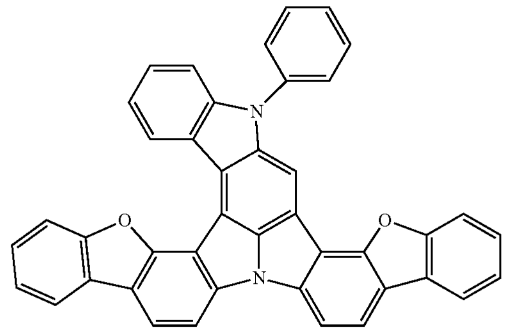
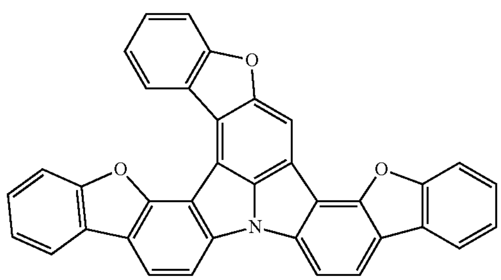
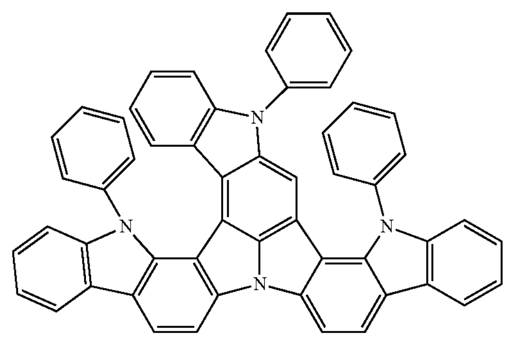
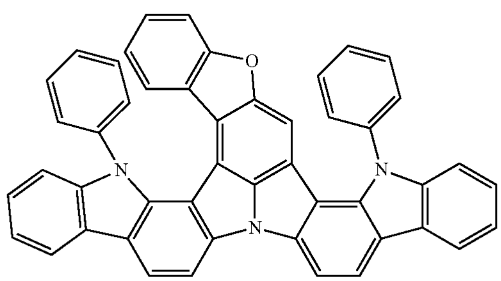
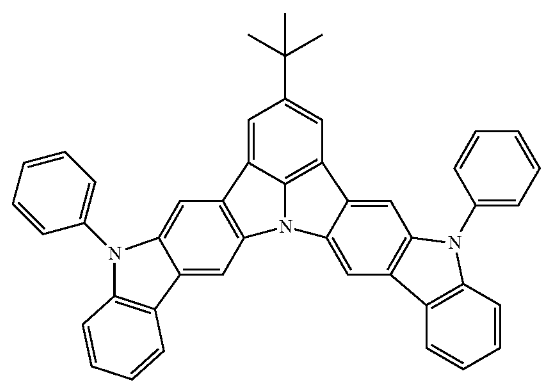
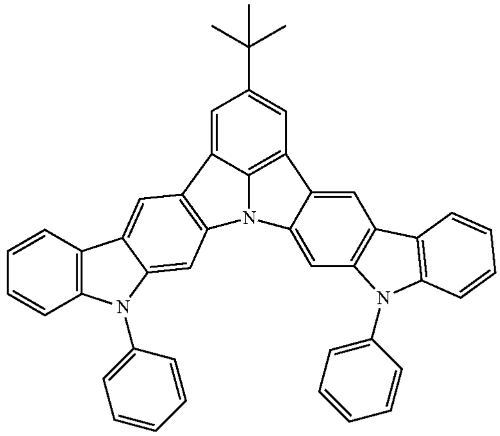
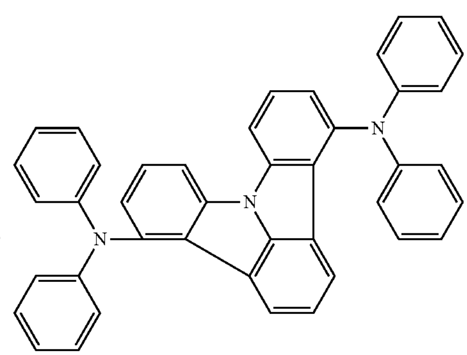

-continued
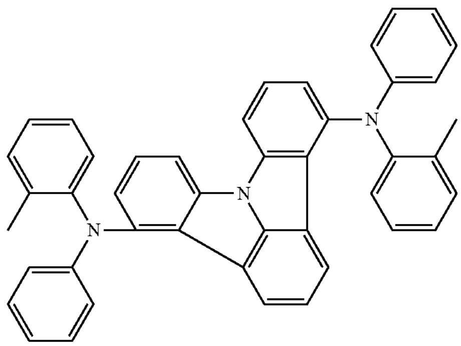
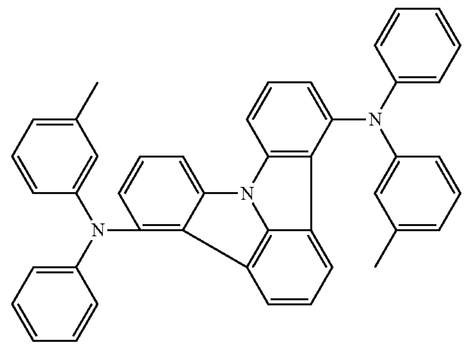
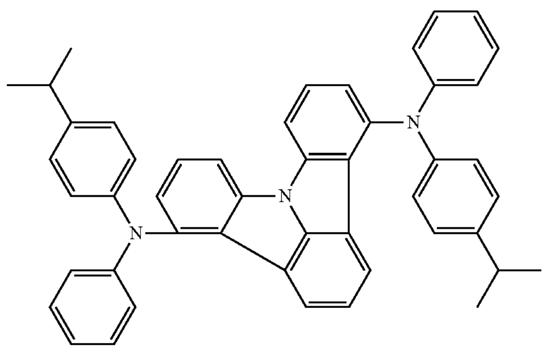
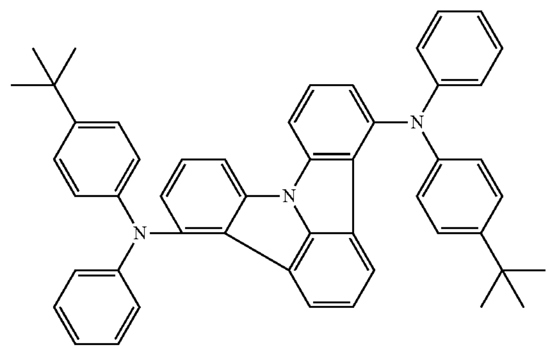
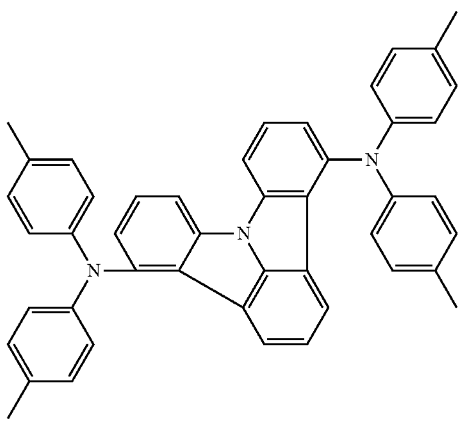
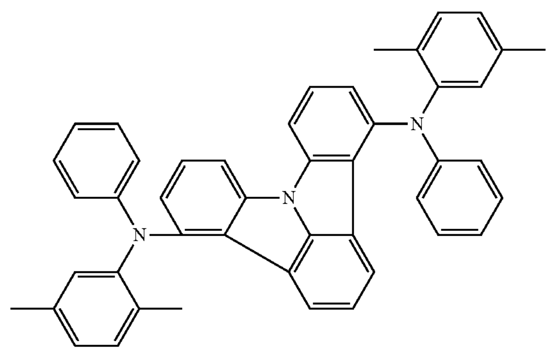
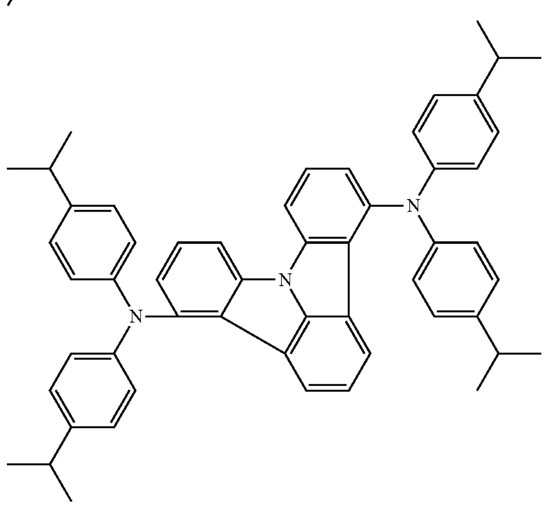
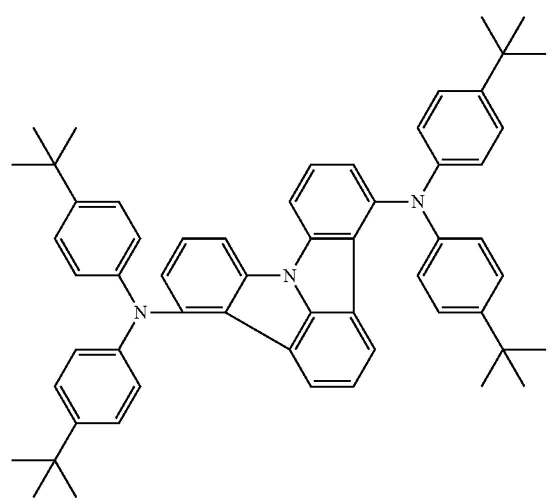

-continued
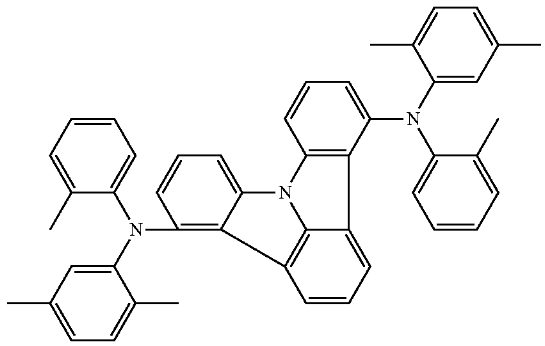
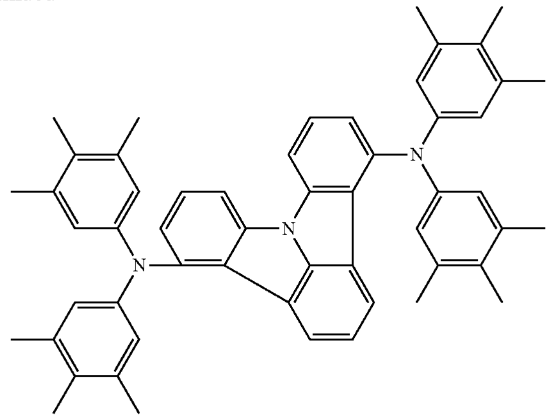
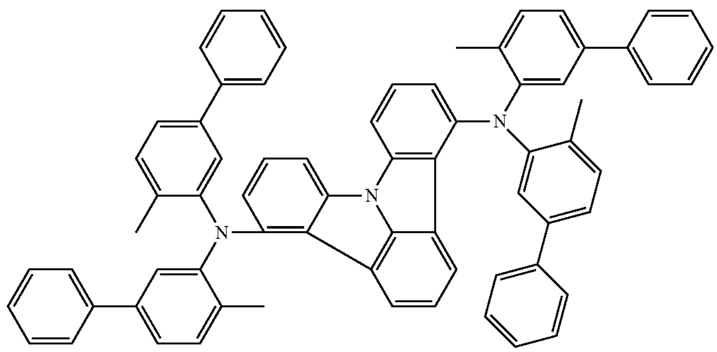
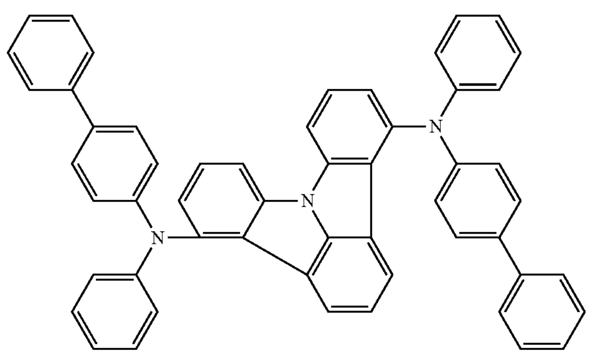
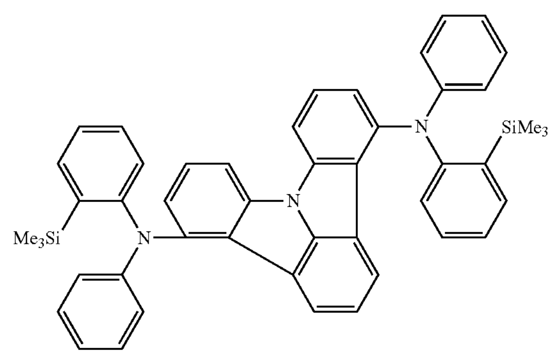
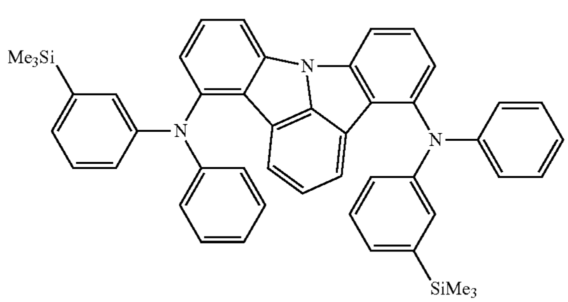
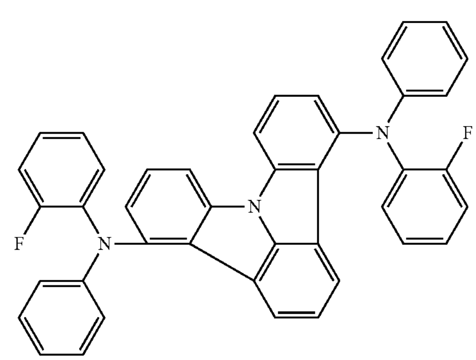

-continued
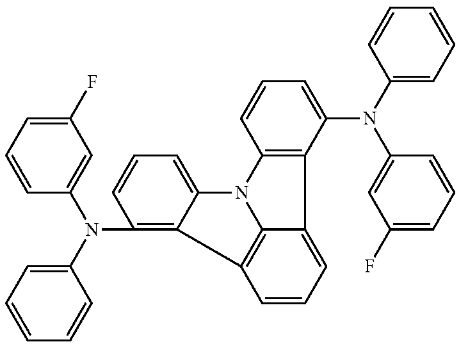
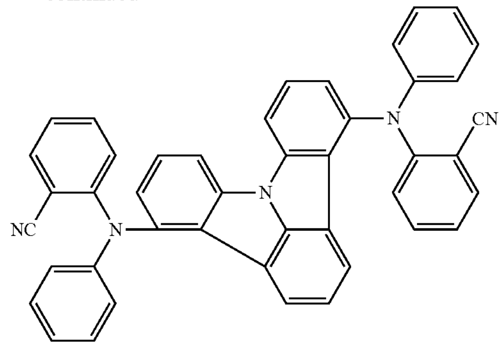
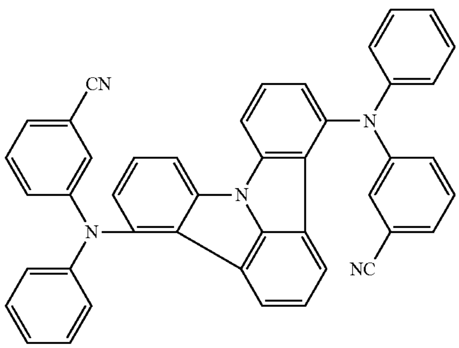
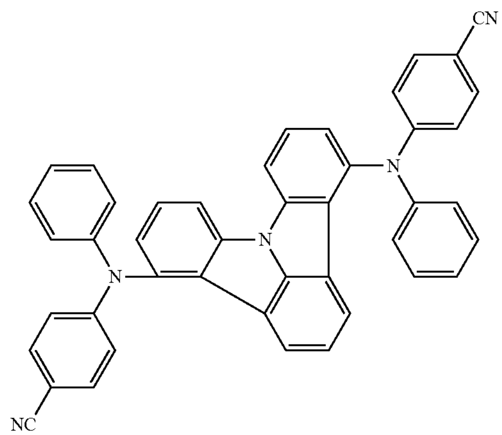
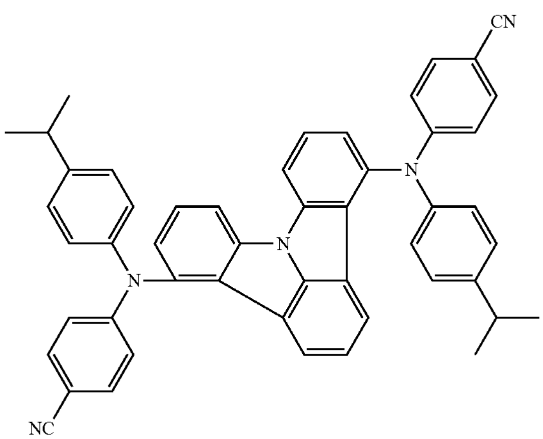
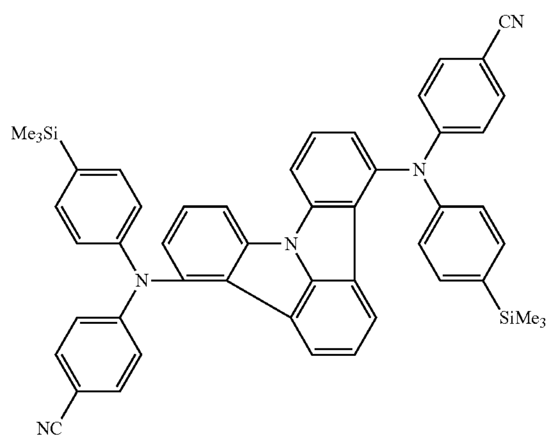
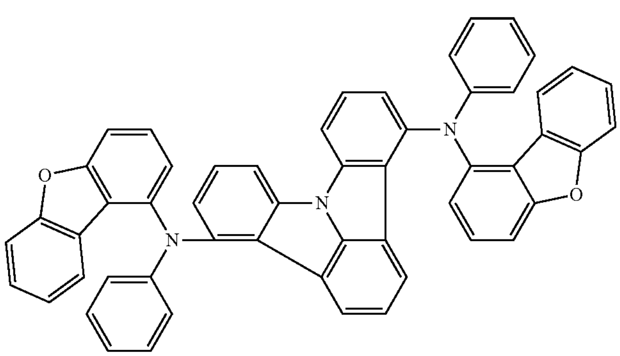

-continued
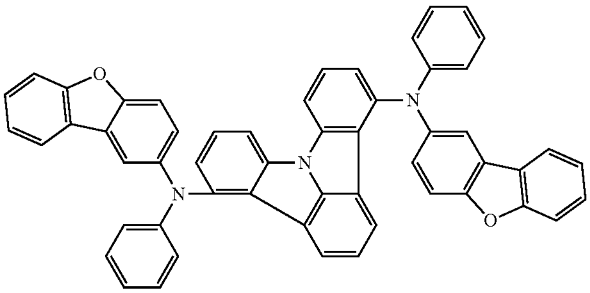
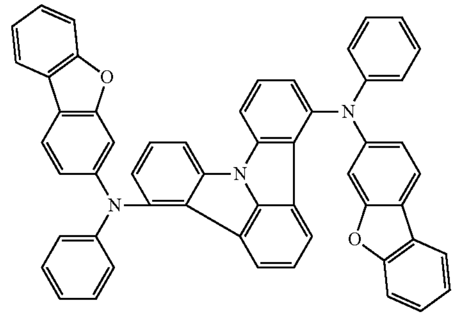
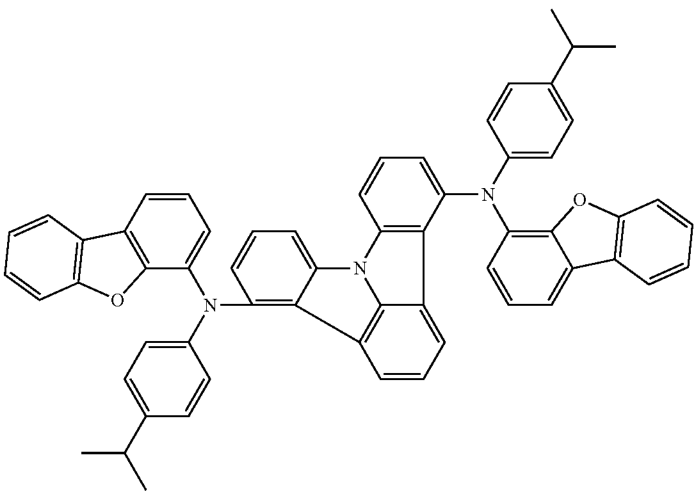
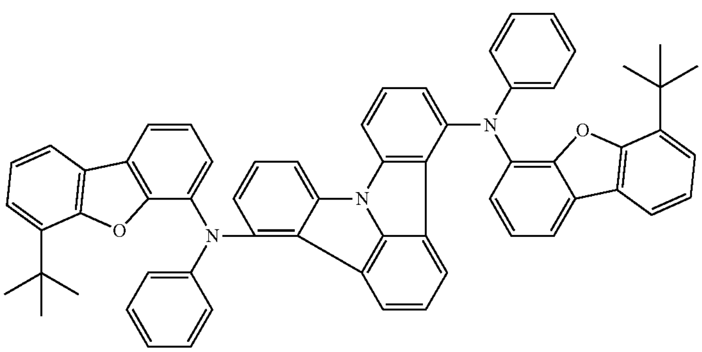
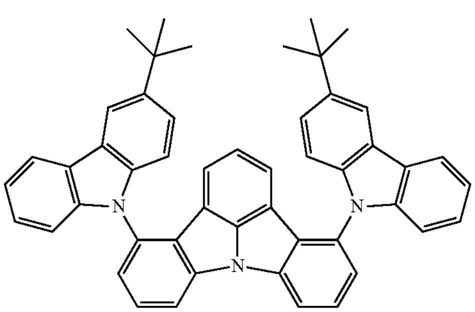
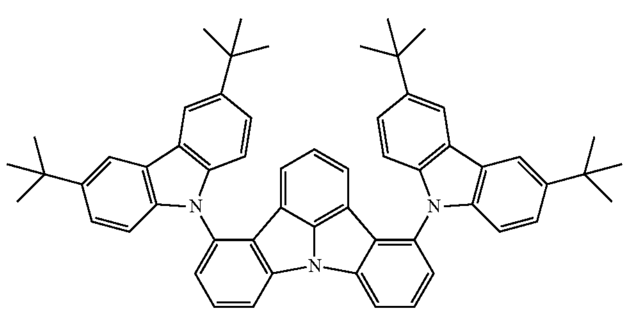

-continued
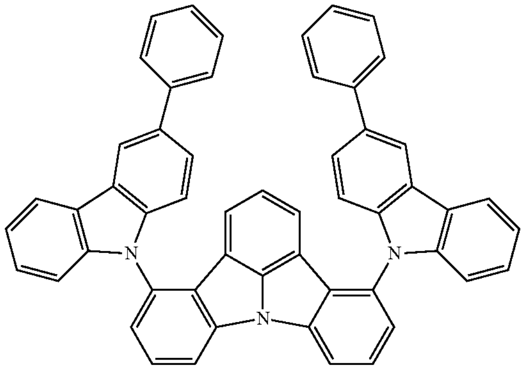
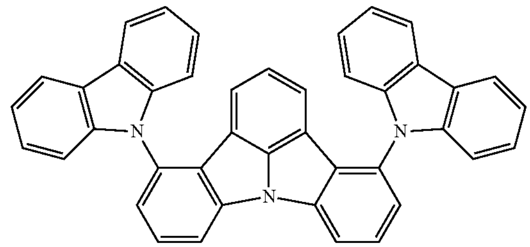
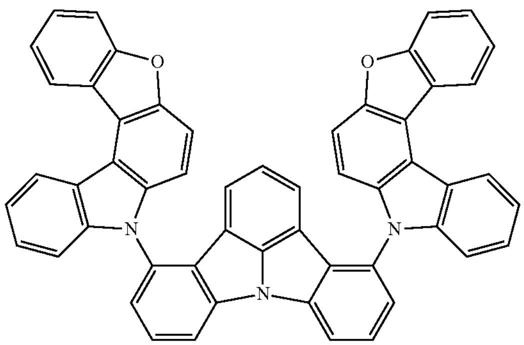
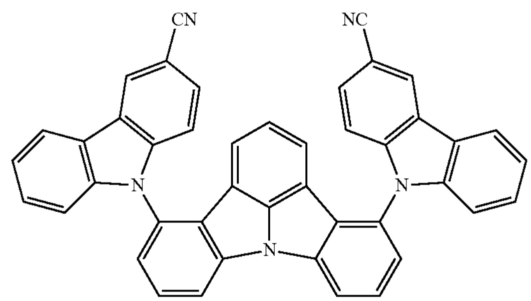
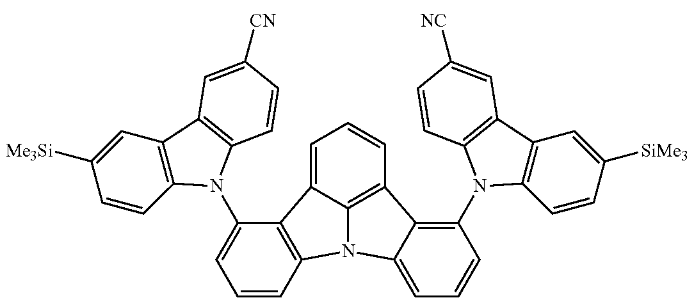
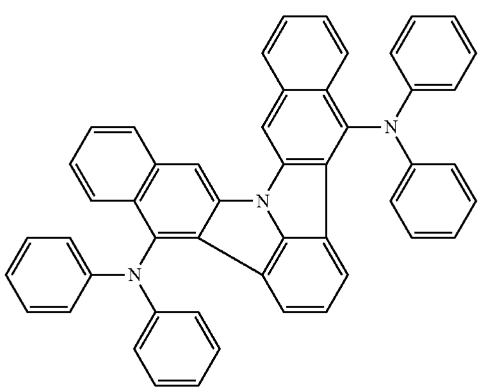
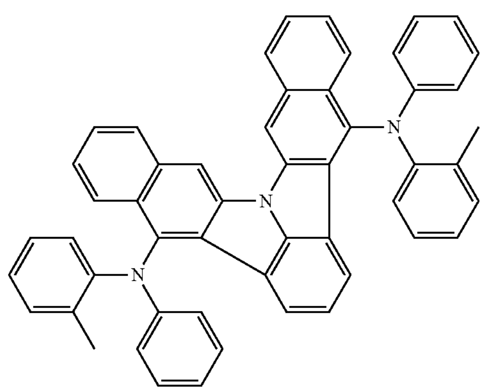

-continued
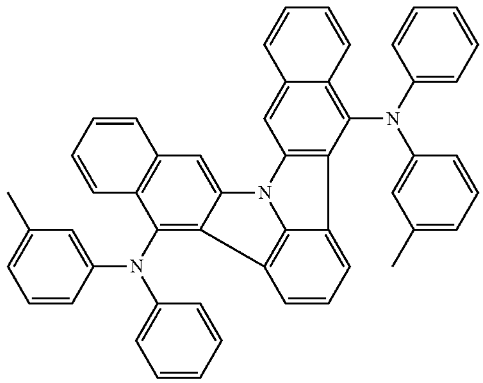
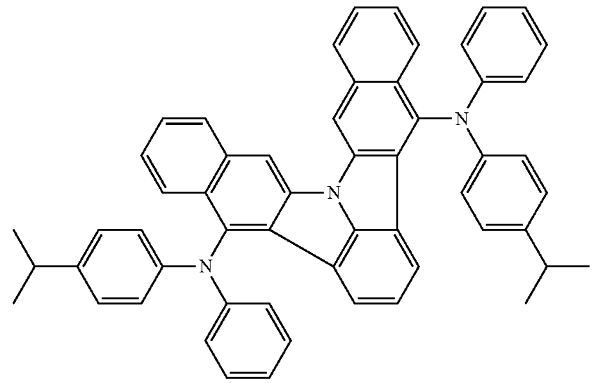
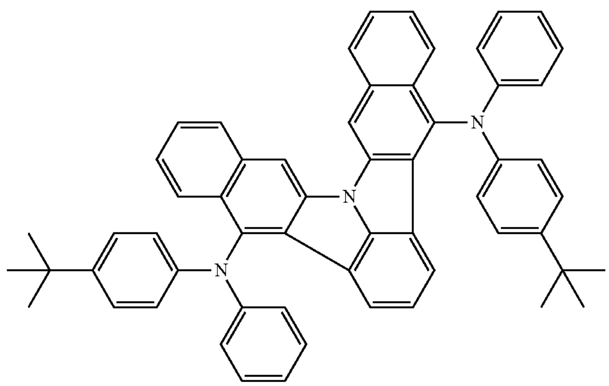
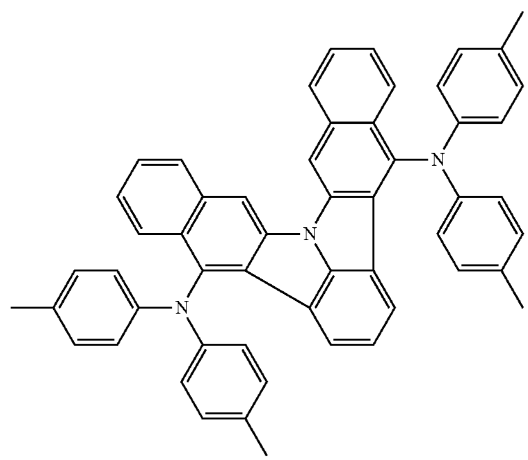
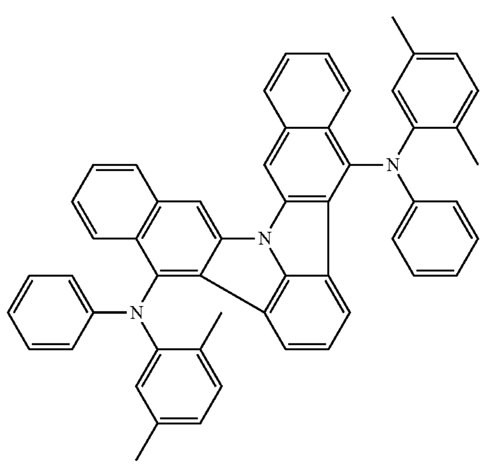
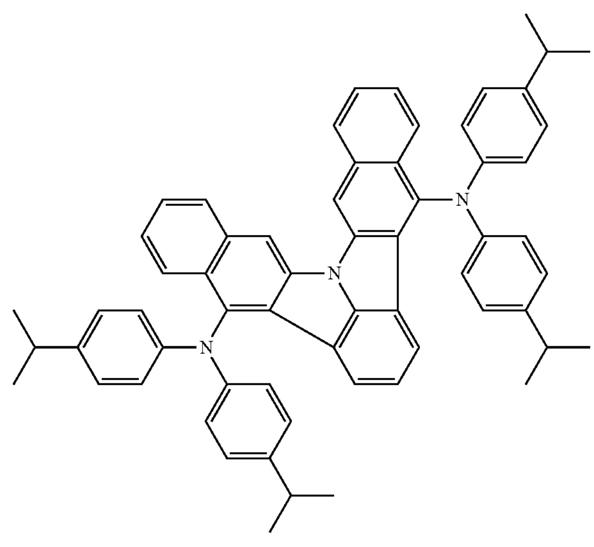

-continued
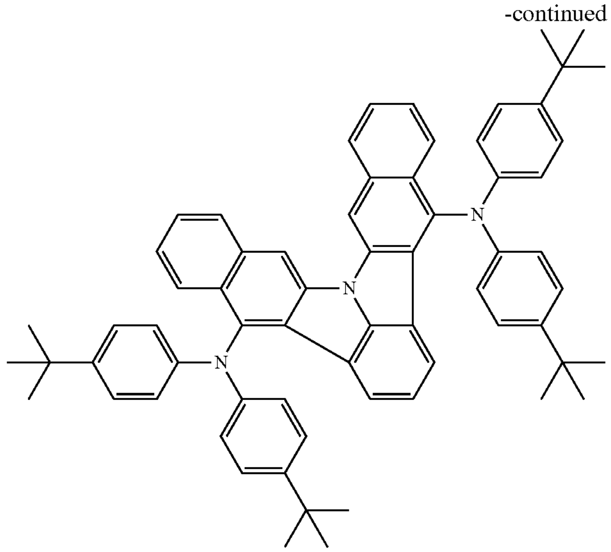
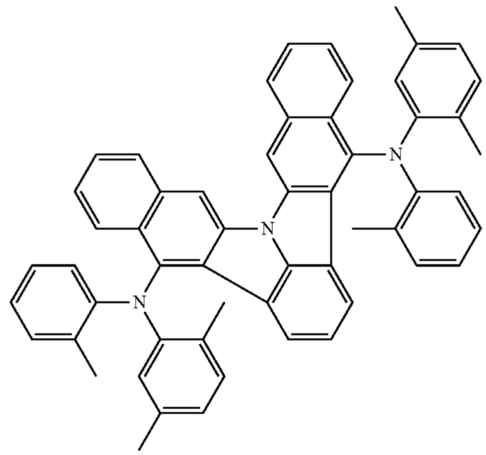
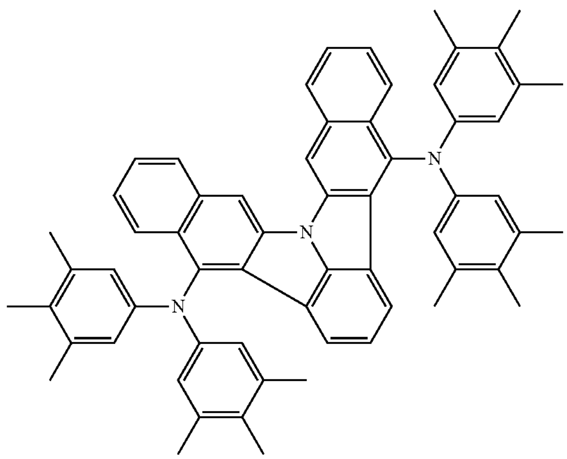
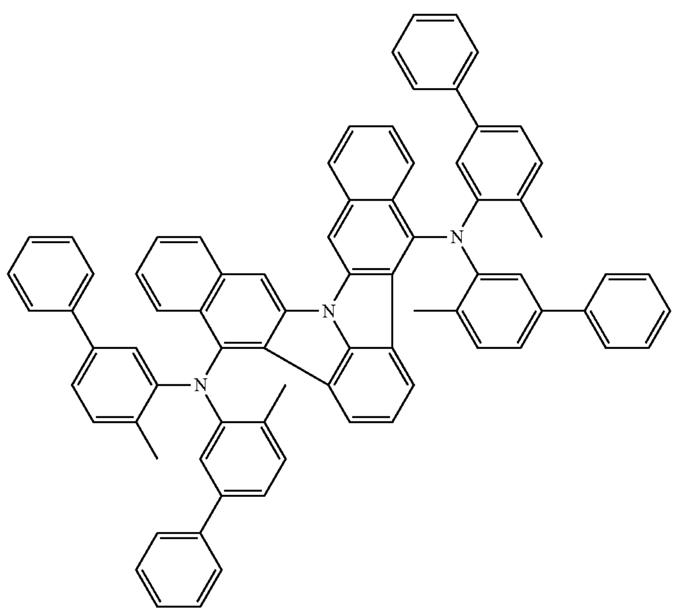

-continued
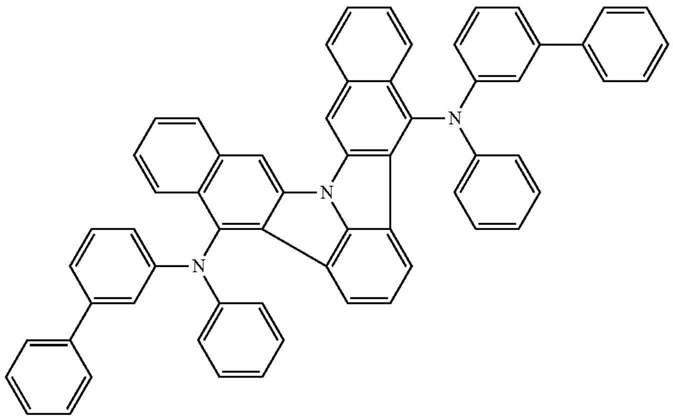
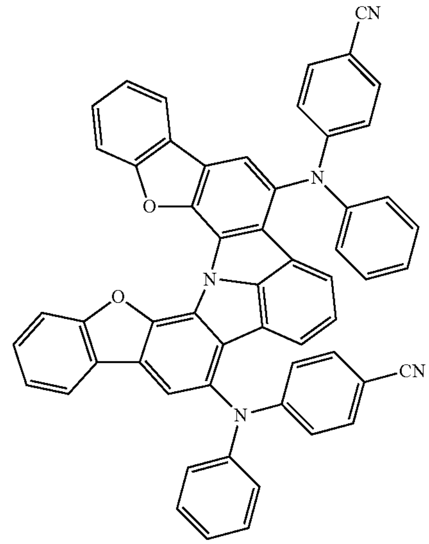
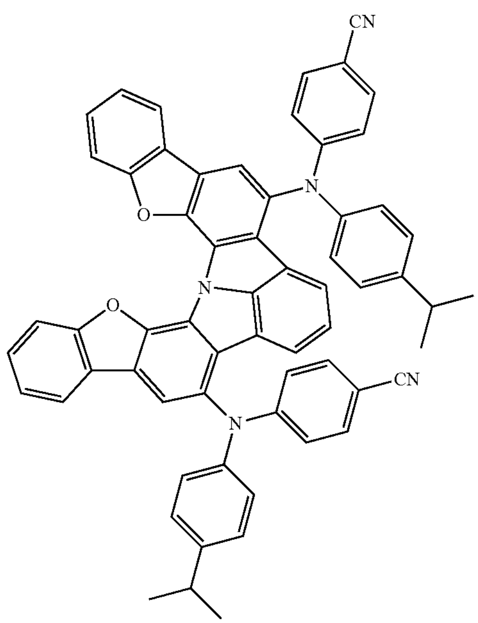
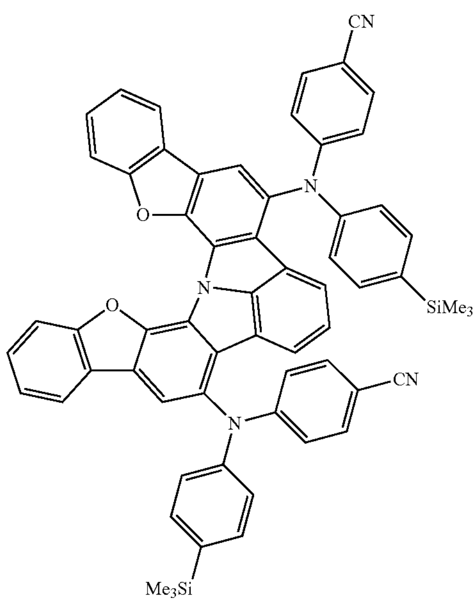

-continued
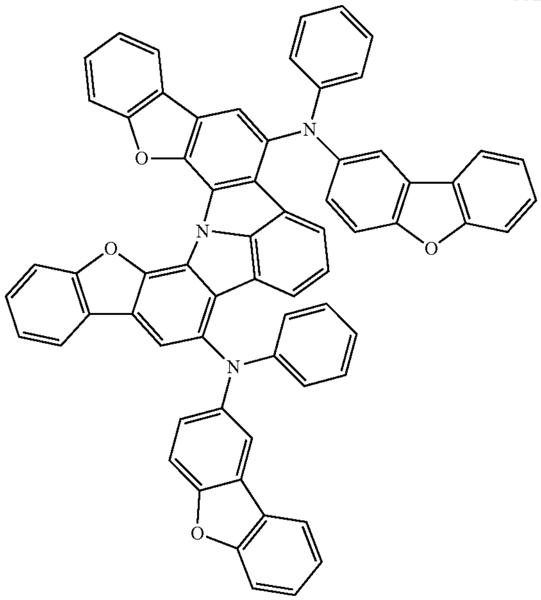
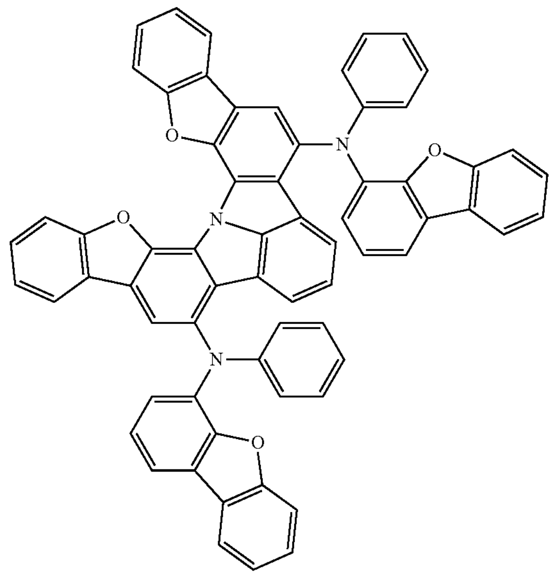
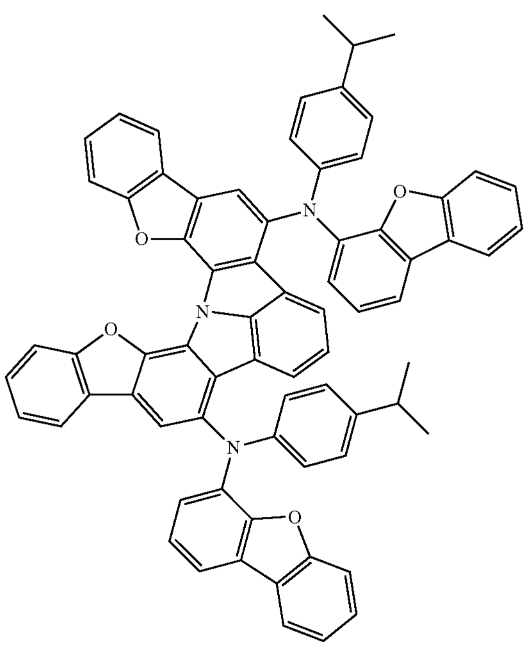
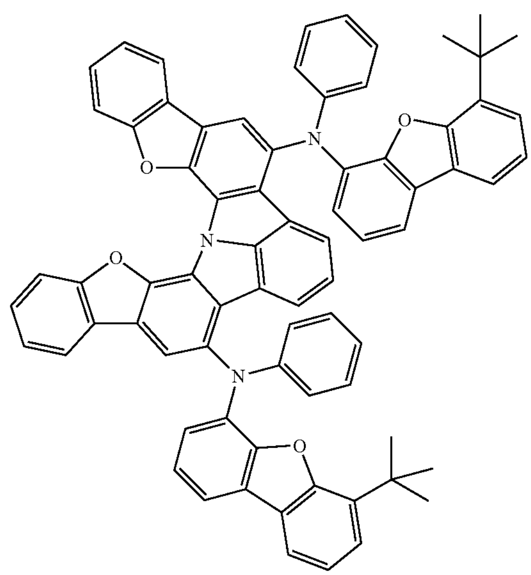

-continued
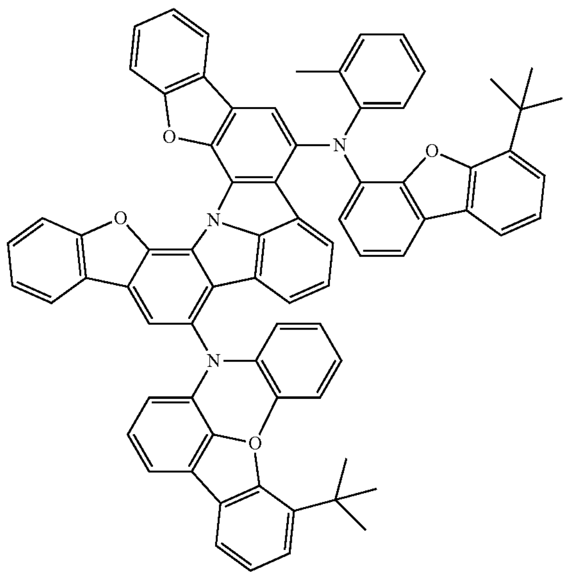
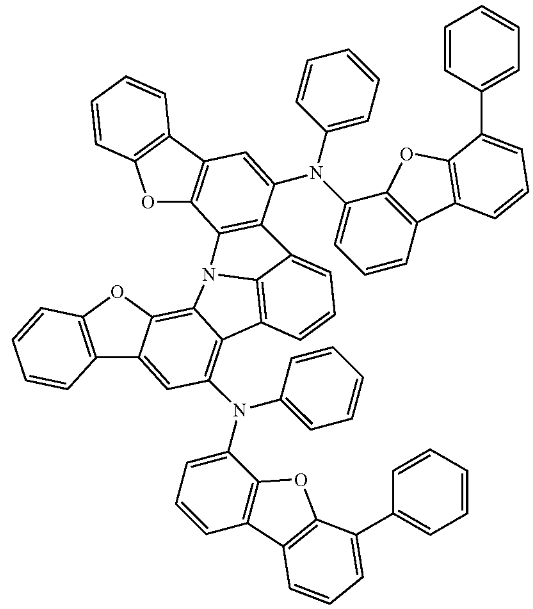
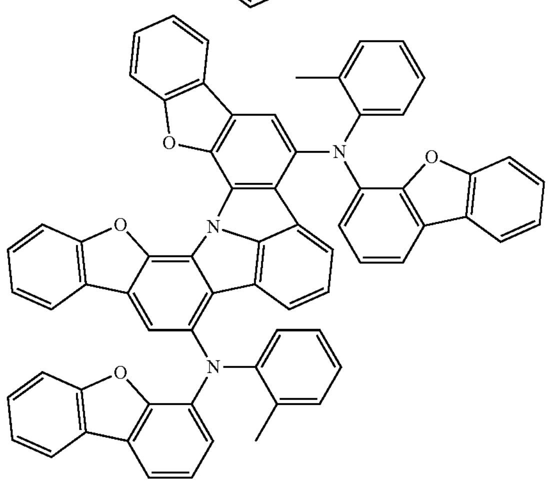
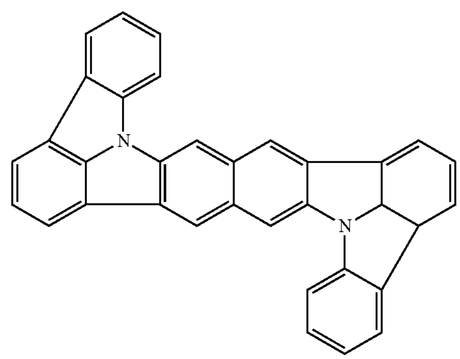
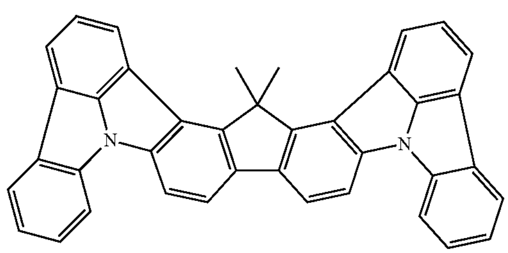
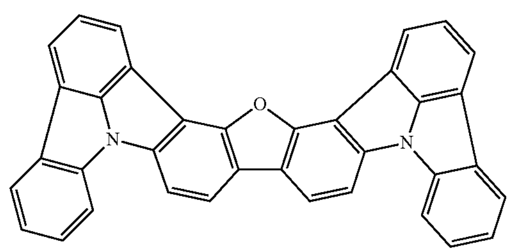
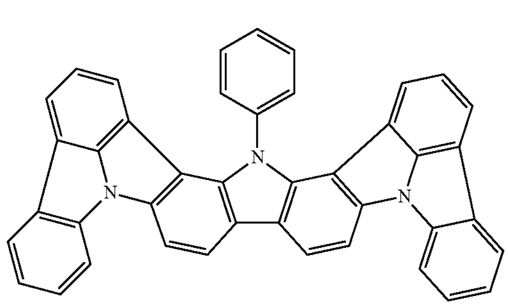
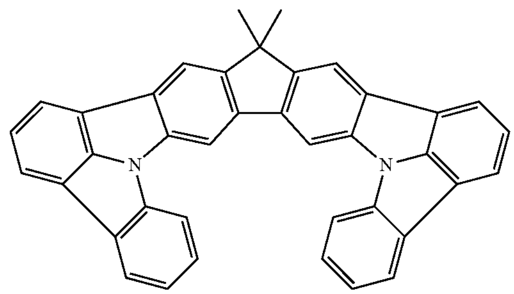

-continued
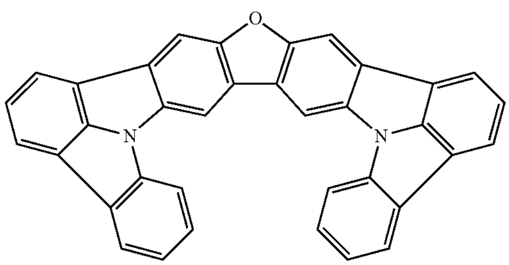
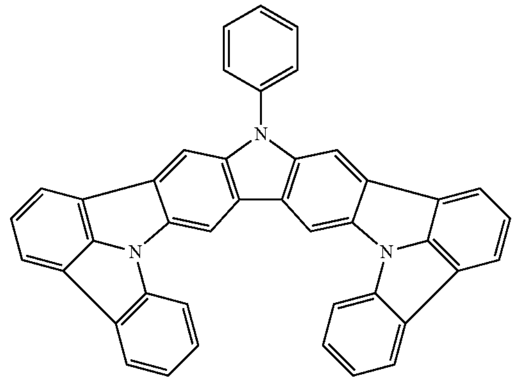
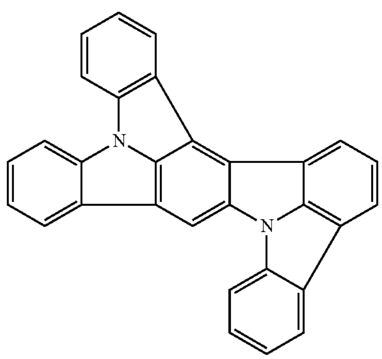
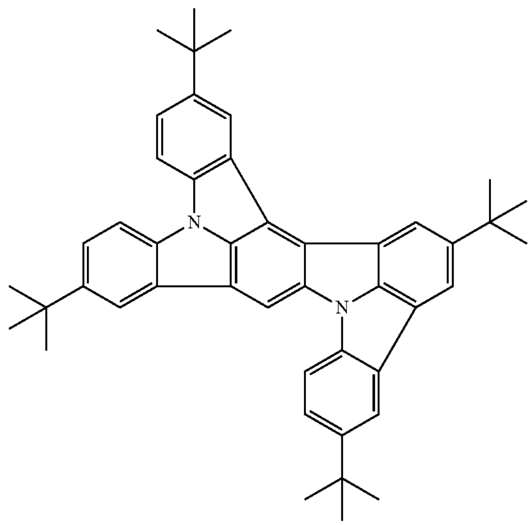
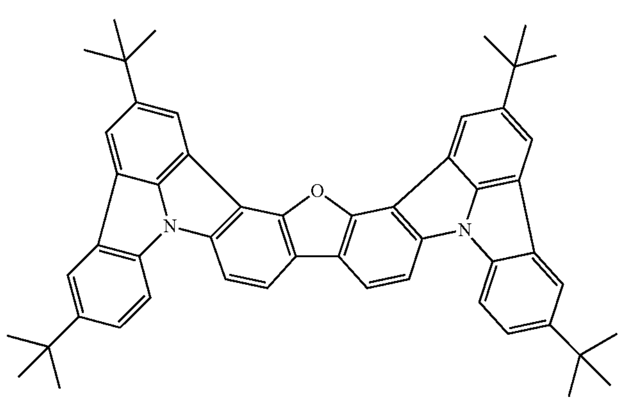

Compound Represented by Formula (31)

The compound represented by the formula (31) will be described below. The compound represented by the formula (31) corresponds to the compound represented by the above-described formula (21-3).

(31)

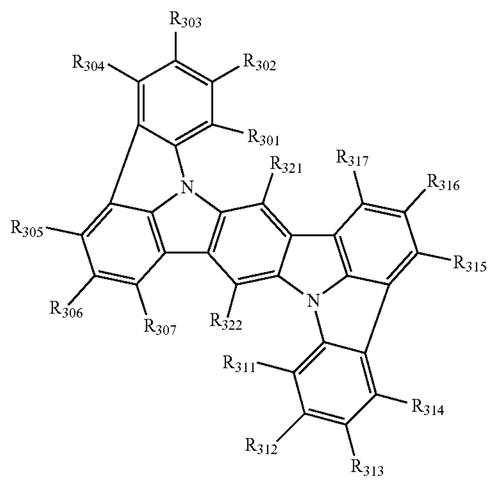

In the formula (31): at least one combination of adjacent two or more of $R_{301}$ to $R_{307}$ and $R_{311}$ to $R_{317}$ are mutually bonded to form a substituted or unsubstituted monocyclic ring, mutually bonded to form a substituted or unsubstituted fused ring, or not mutually bonded;

one or more of $R_{301}$ to $R_{307}$ and $R_{311}$ to $R_{317}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{321}$ and $R_{322}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formula (31) respectively represent the same as $R_{901}$ to $R_{907}$ of the formula (21);

"A combination of adjacent two or more of $R_{301}$ to $R_{307}$ and $R_{311}$ to $R_{317}$" refers to, for instance, a pair of $R_{301}$ and $R_{302}$, a pair of $R_{302}$ and $R_{303}$, a pair of $R_{303}$ and $R_{304}$, a pair of $R_{305}$ and $R_{306}$, a pair of $R_{306}$ and $R_{307}$, and a combination of $R_{301}$, $R_{302}$, and $R_{303}$.

In some embodiments, at least one of $R_{301}$ to $R_{307}$ and $R_{311}$ to $R_{317}$ is a group represented by —N($R_{906}$)($R_{907}$). Preferably, two of $R_{301}$ to $R_{307}$ and $R_{311}$ to $R_{317}$ are groups represented by —N($R_{906}$)($R_{907}$).

In some embodiments, $R_{301}$ to $R_{307}$ and $R_{311}$ to $R_{317}$ are each independently a hydrogen atom, a substituted or unsubstituted aryl group having 6 to 50 ring carbon atoms, or a substituted or unsubstituted heterocyclic group having 5 to 50 ring atoms.

In some embodiments, the compound represented by the formula (31) is represented by a formula (32) below.

(32)

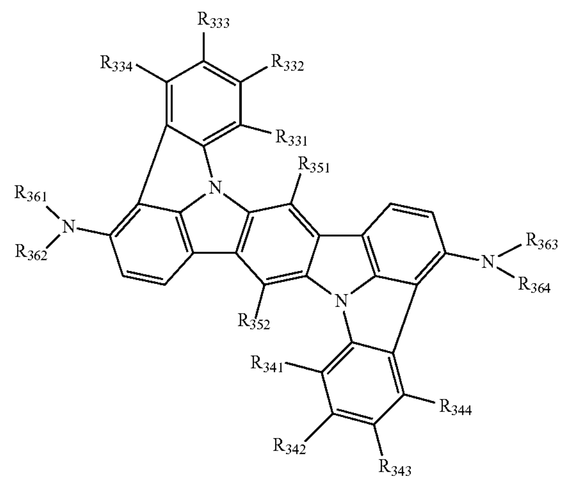

In the formula (32): at least one combination of adjacent two or more of $R_{331}$ to $R_{334}$ and $R_{341}$ to $R_{344}$ are mutually bonded to form a substituted or unsubstituted monocyclic ring, mutually bonded to form a substituted or unsubstituted fused ring, or not mutually bonded;

$R_{331}$ to $R_{334}$, $R_{341}$ to $R_{344}$, $R_{351}$, and $R_{352}$ not forming the substituted or unsubstituted monocyclic ring and not forming the substituted or unsubstituted fused ring are each independently a hydrogen atom, a substituted or unsubstituted aryl group having 6 to 50 ring carbon atoms, or a substituted or unsubstituted heterocyclic group having 5 to 50 ring atoms; and $R_{361}$ to $R_{364}$ are each independently a substituted or unsubstituted aryl group having 6 to 50 ring carbon atoms, or a substituted or unsubstituted heterocyclic group having 5 to 50 ring atoms.

In some embodiments, the compound represented by the formula (31) is represented by a formula (33) below.

(33)

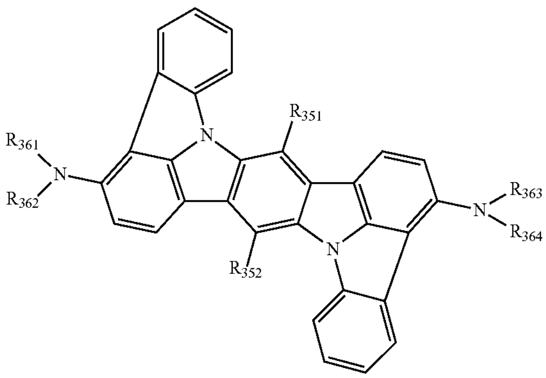

In the formula (33), $R_{351}$, $R_{352}$, and $R_{361}$ to $R_{364}$ are as defined in the formula (32).

In some embodiments, $R_{361}$ to $R_{364}$ in the formulae (32) and (33) are each independently a substituted or unsubstituted aryl group having 6 to 50 ring carbon atoms, preferably a substituted or unsubstituted phenyl group.

In some embodiments, $R_{321}$ and $R_{322}$ in the formula (31), and $R_{351}$ and $R_{352}$ in the formulae (32) and (33) are each a hydrogen atom.

In some embodiments, the substituent meant by "substituted or unsubstituted" in the formulae (31) to (33) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

Specific Examples of Compound Represented by Formula (31)

Specific examples of the compound represented by the formula (31) include compounds shown below. It should however be noted that the invention is not limited by the specific examples of the second compound.

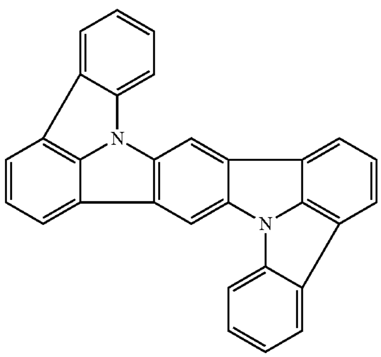

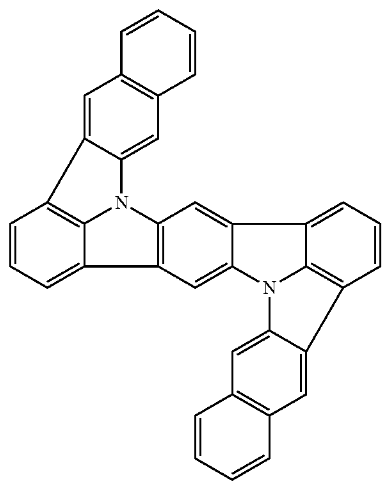

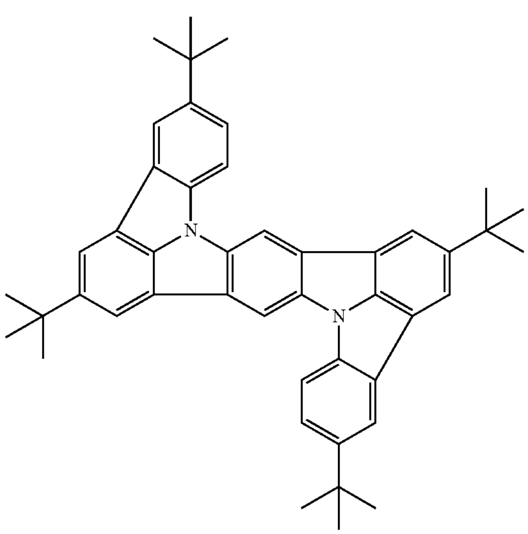

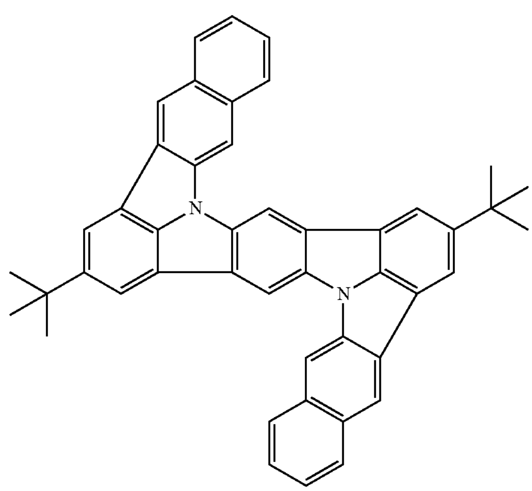

-continued
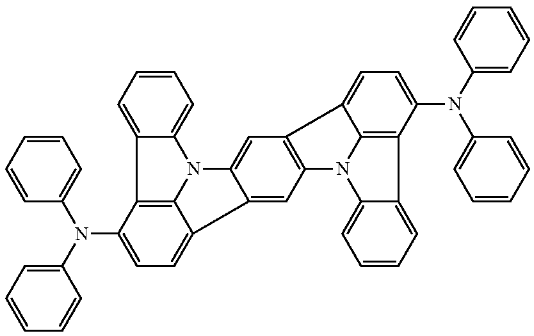
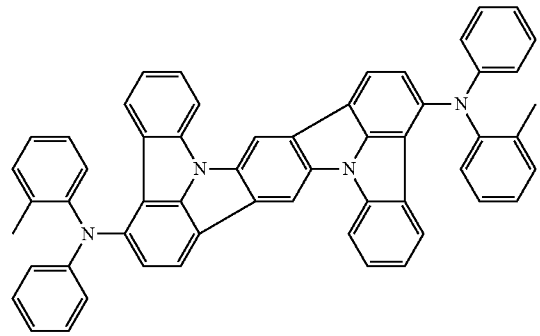
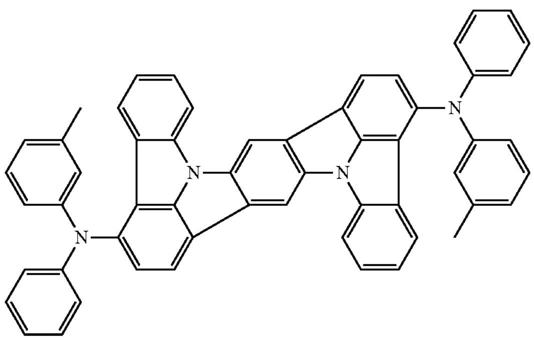
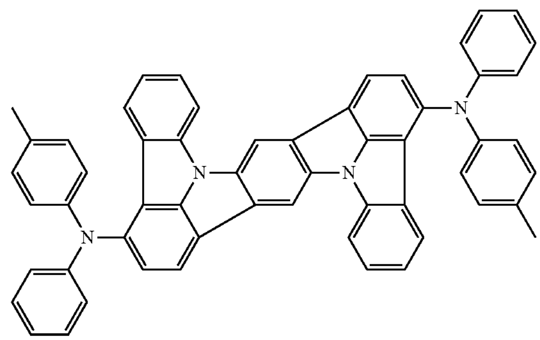
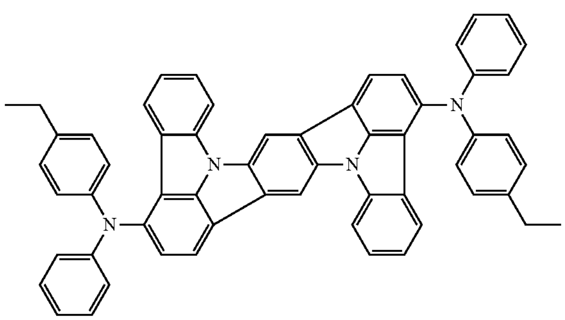
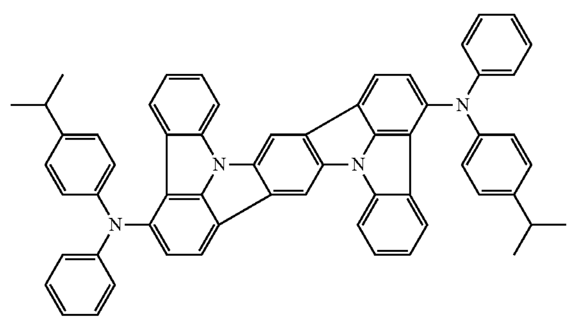
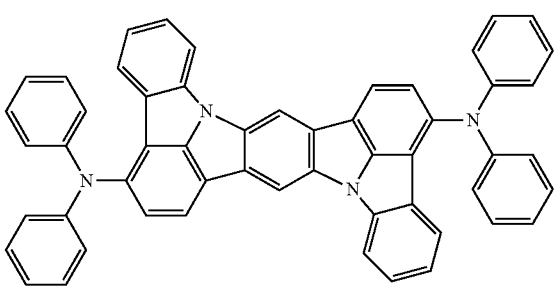
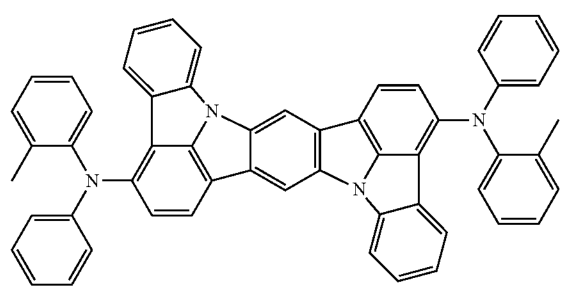
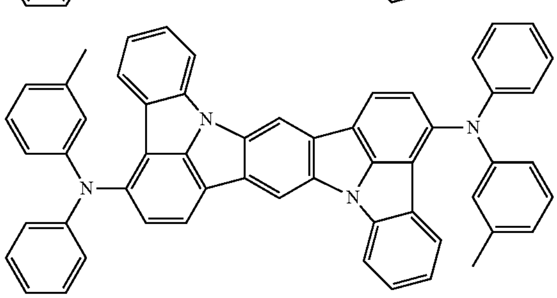
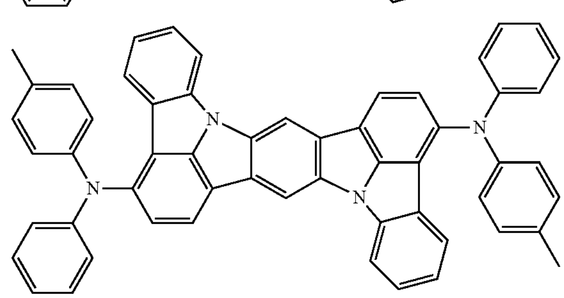

-continued
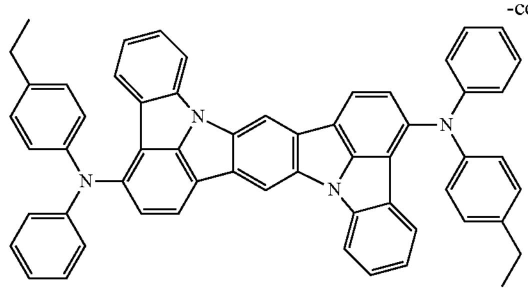
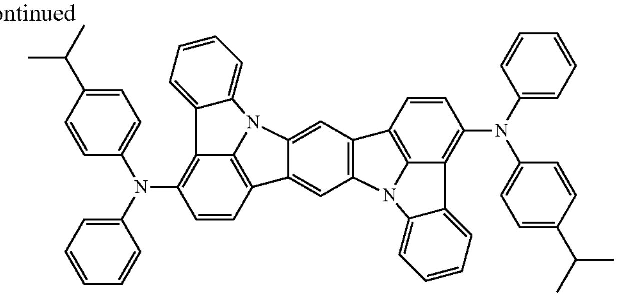
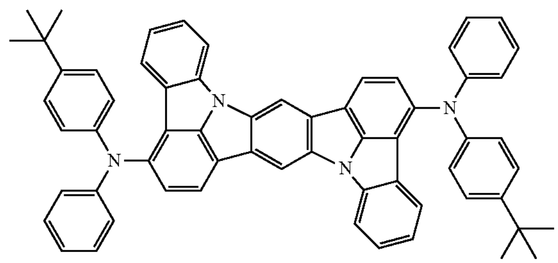
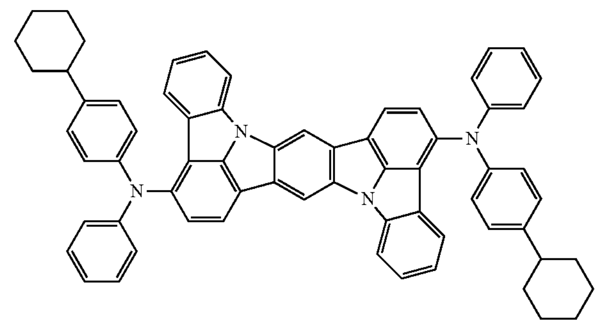
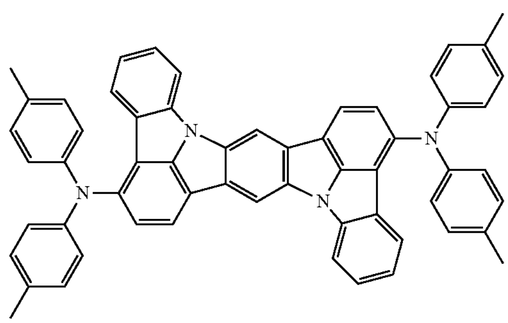
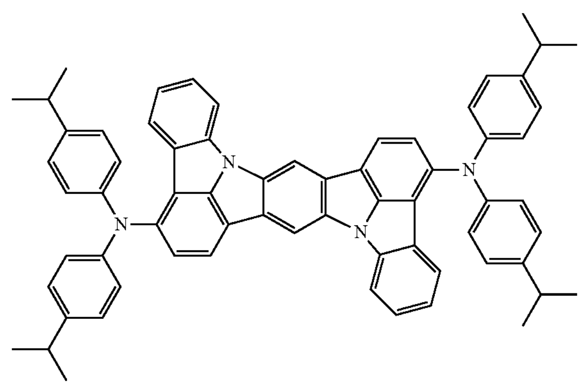
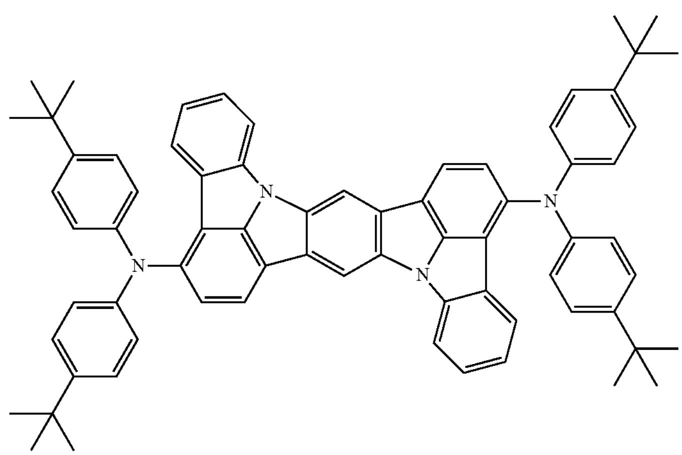

-continued
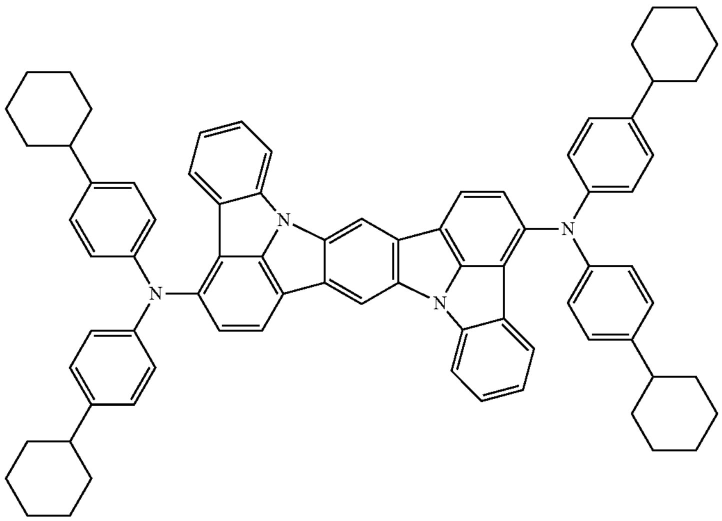
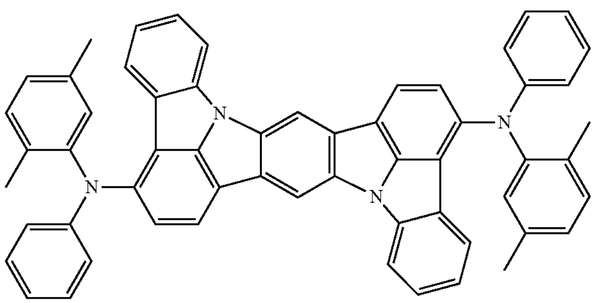
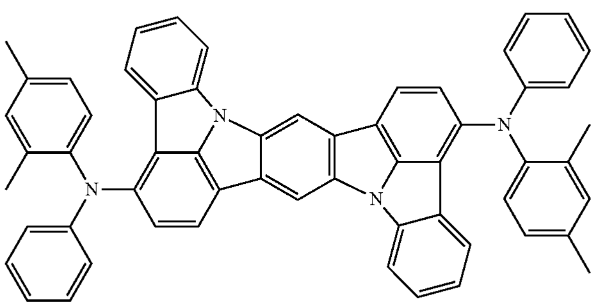
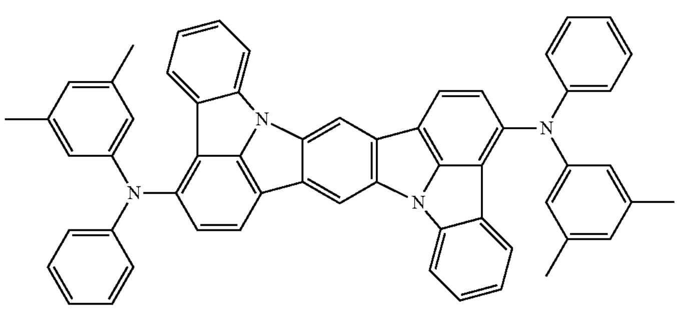
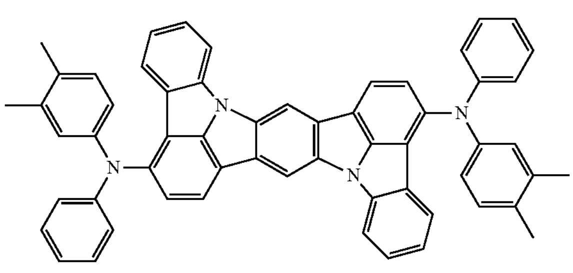
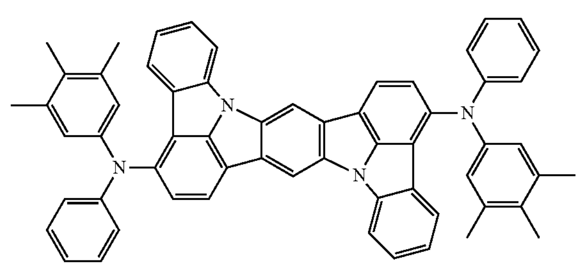

-continued
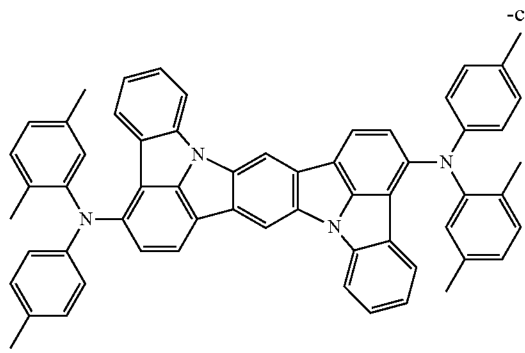
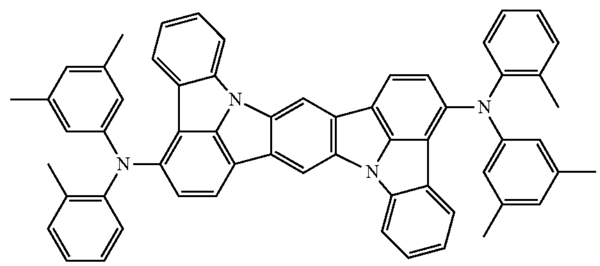
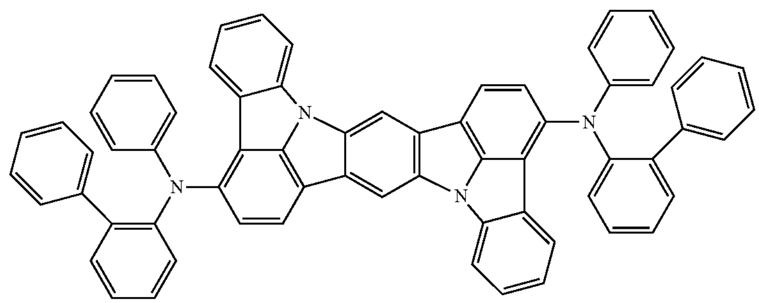
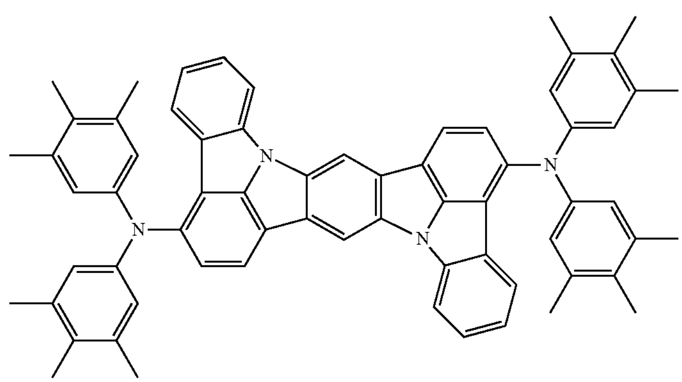
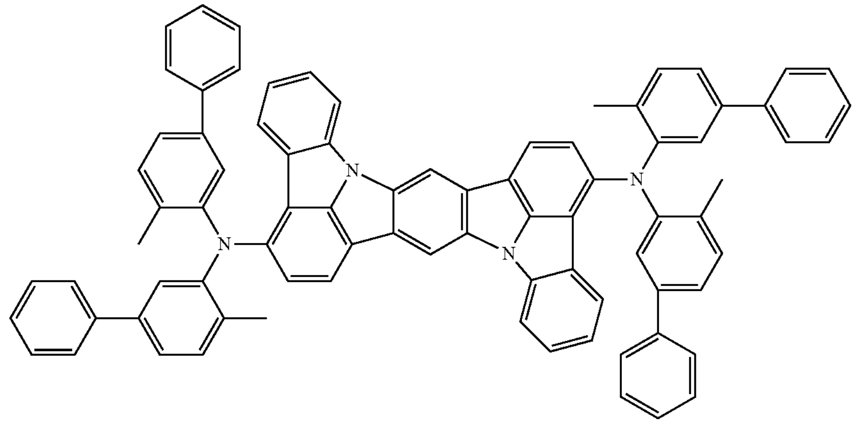

-continued
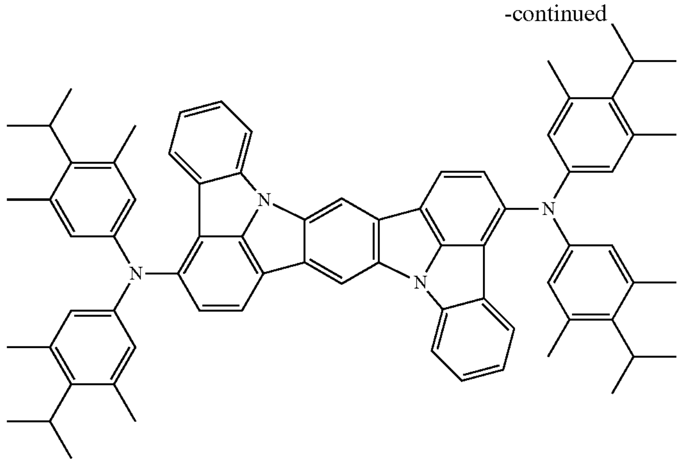
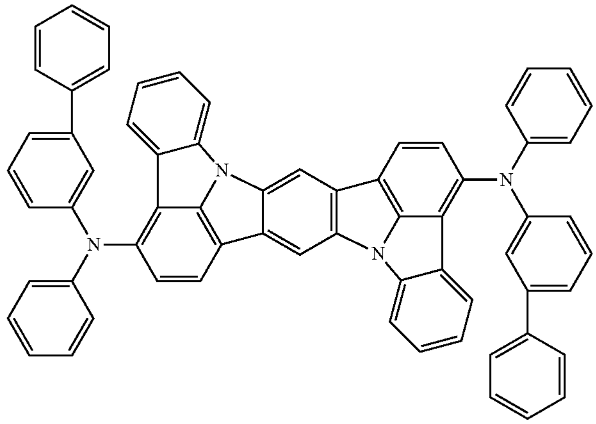
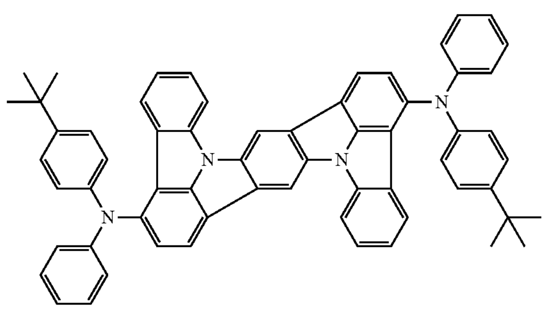
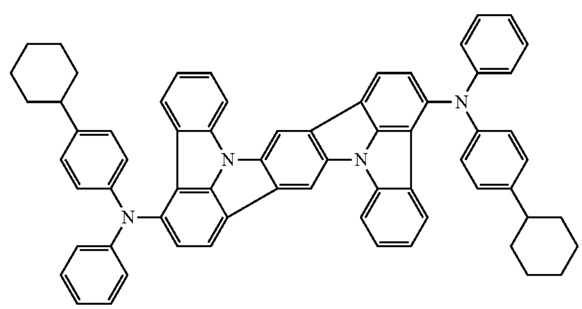
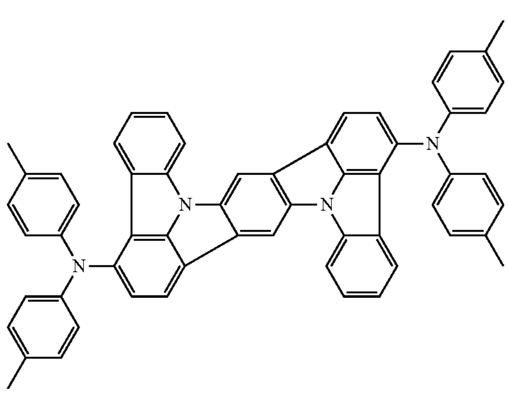
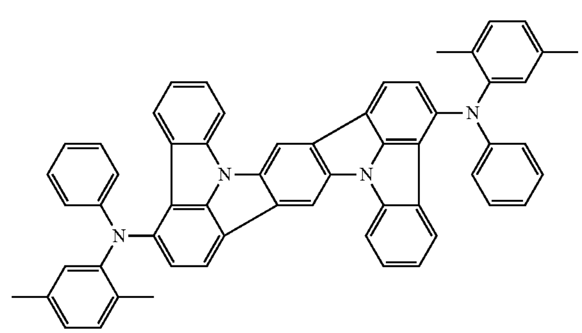

-continued
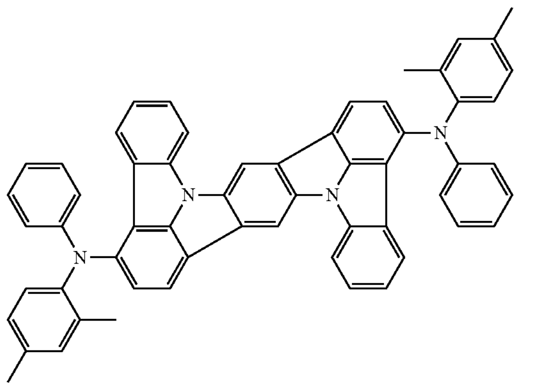
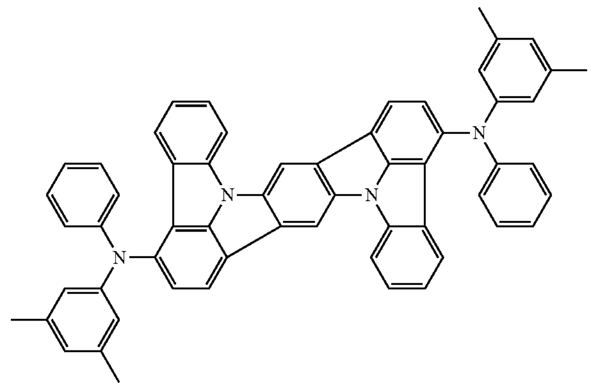
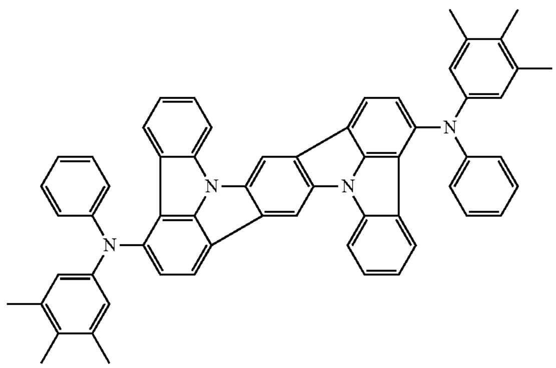
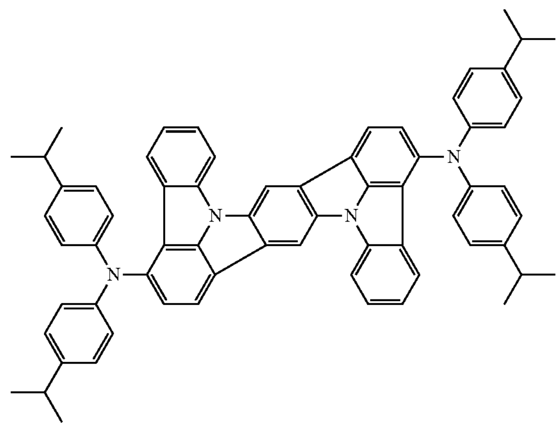
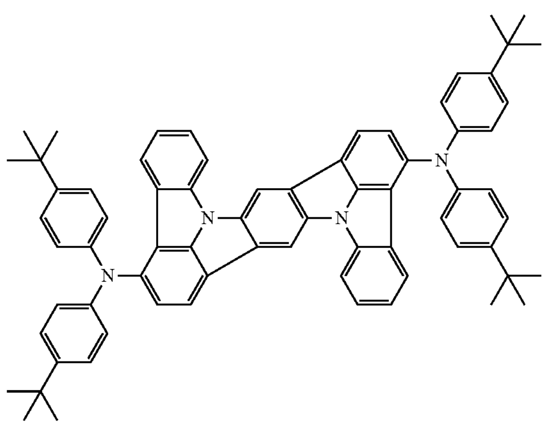
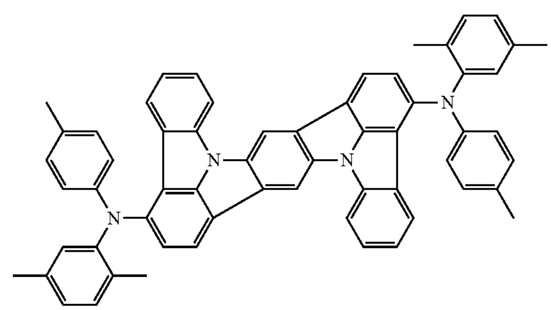
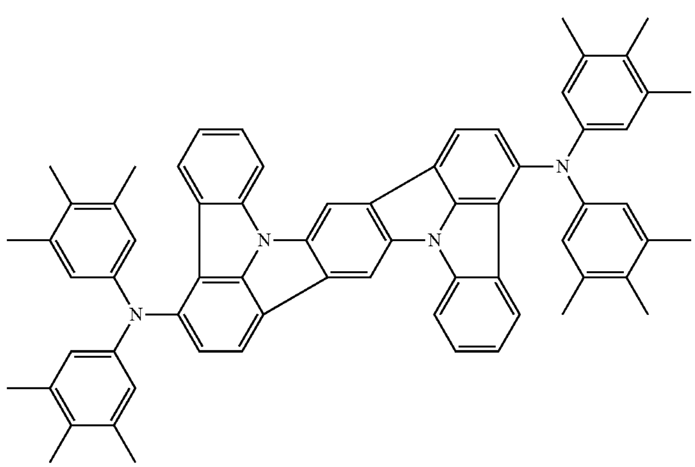

-continued
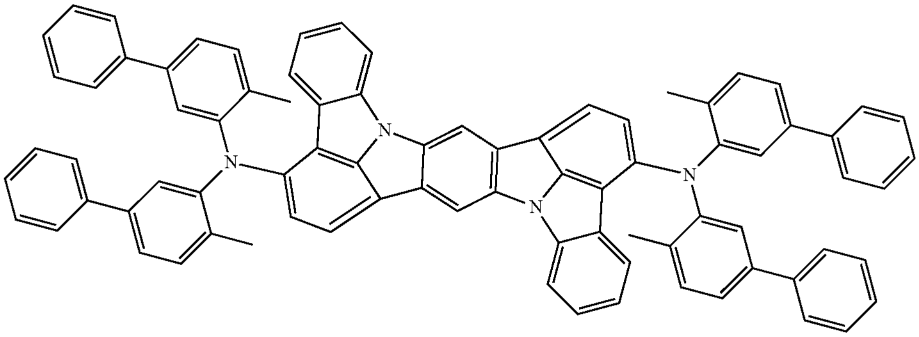
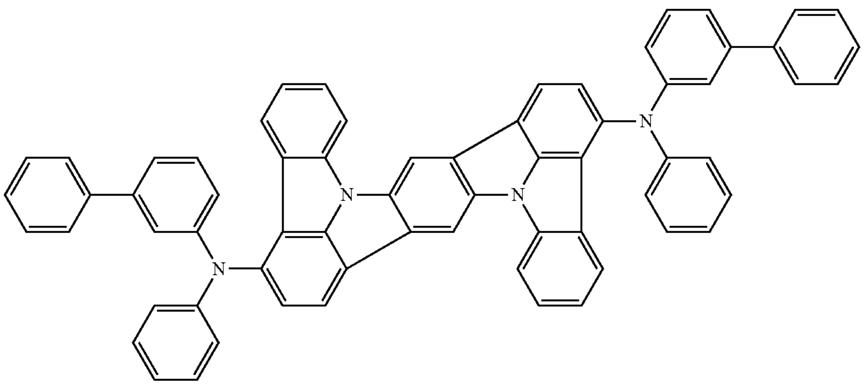
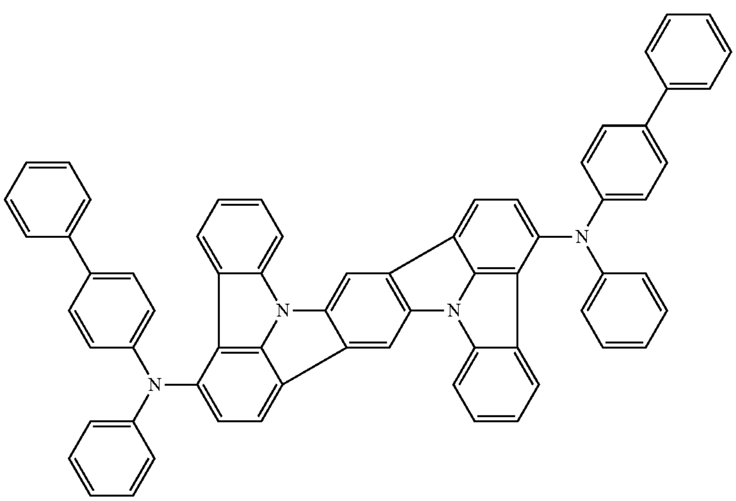
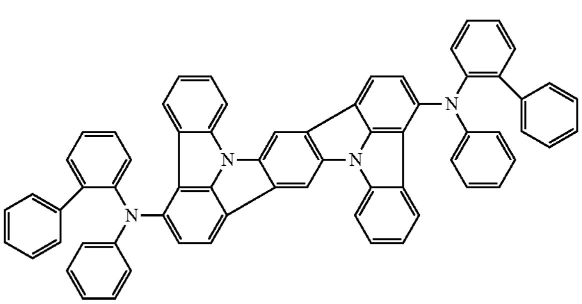
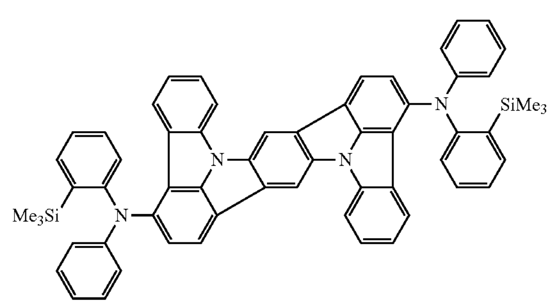

-continued
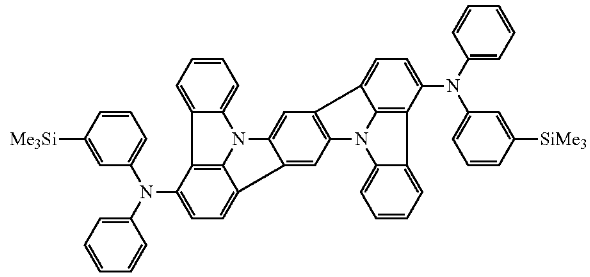
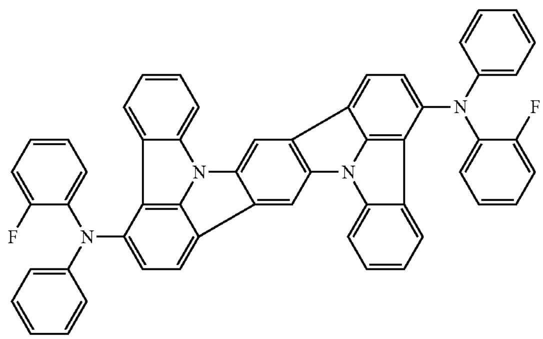
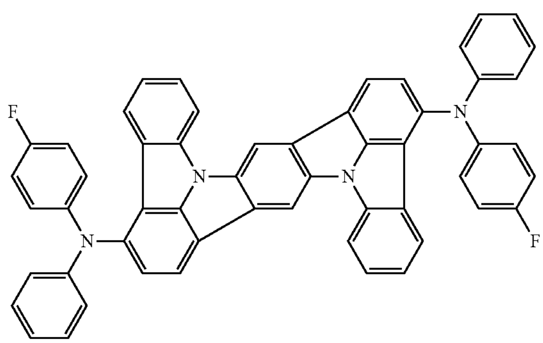
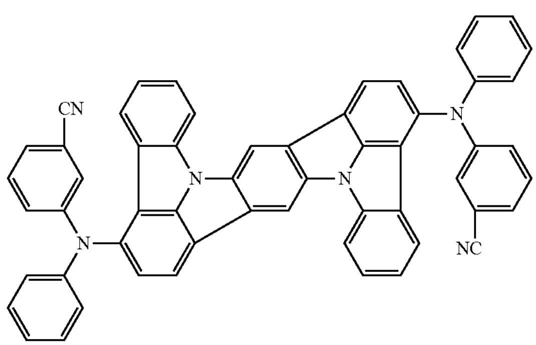
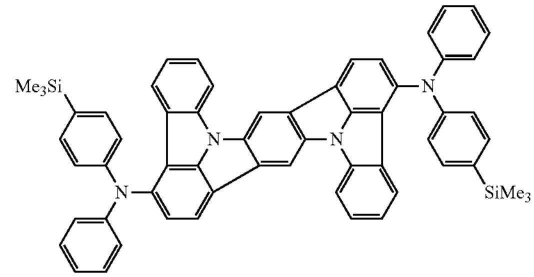
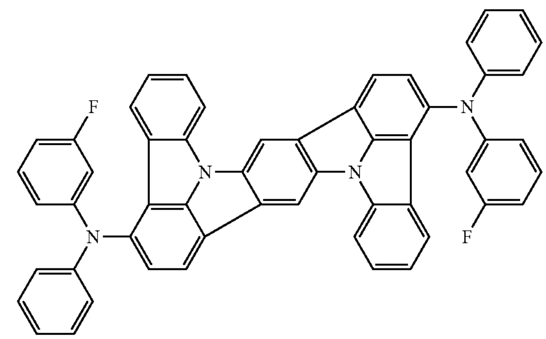
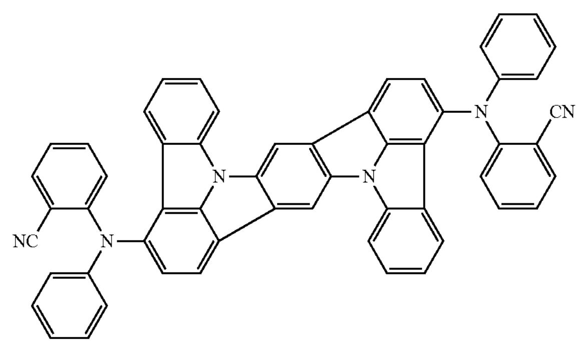
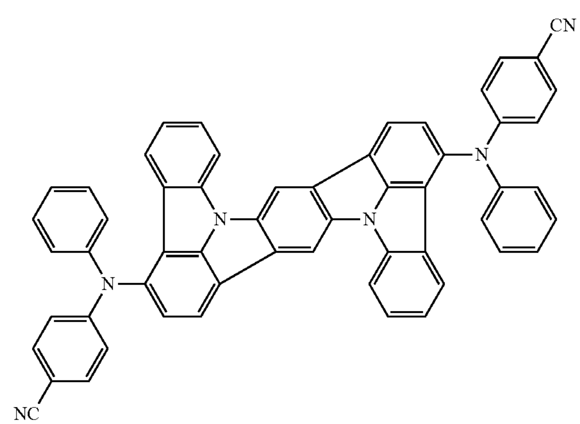

-continued
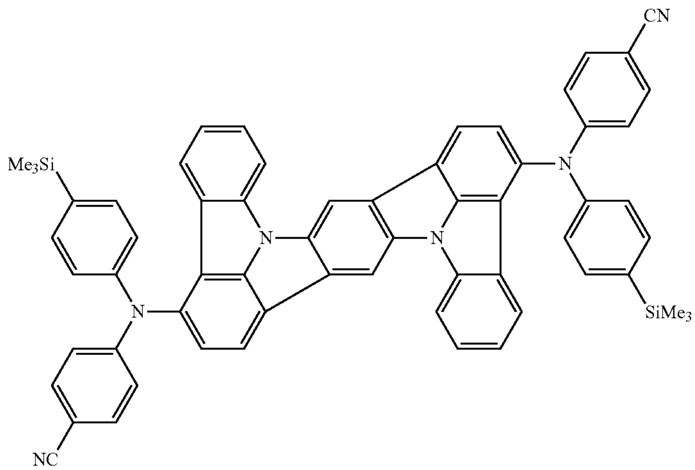
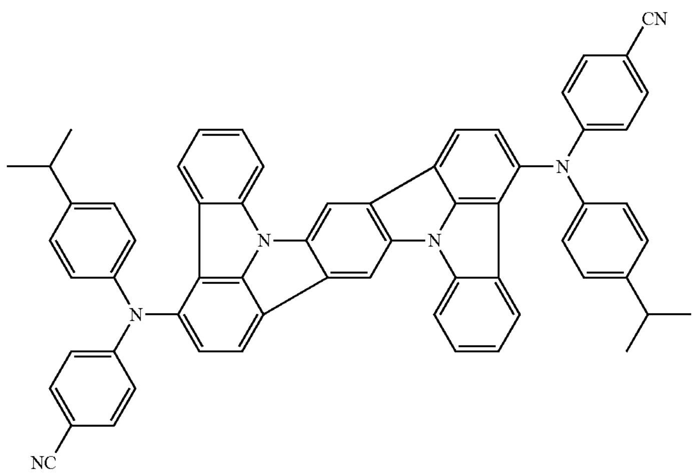
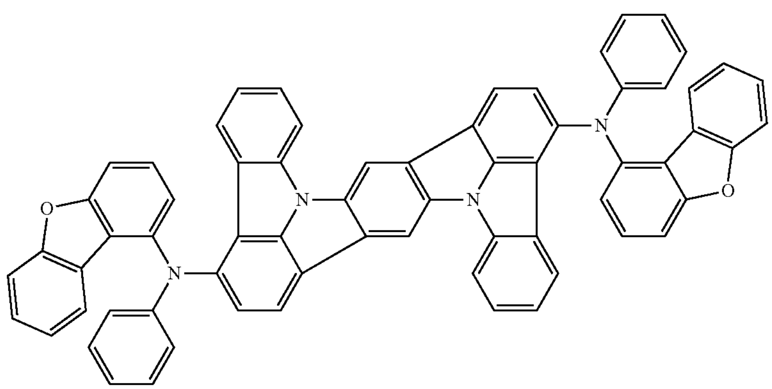
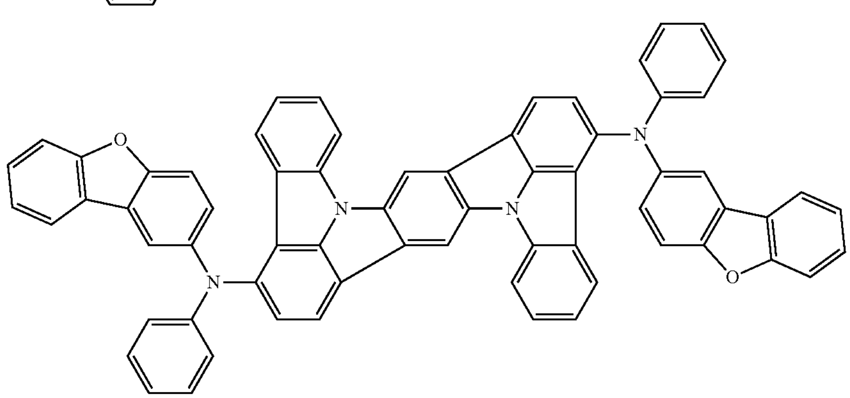

-continued
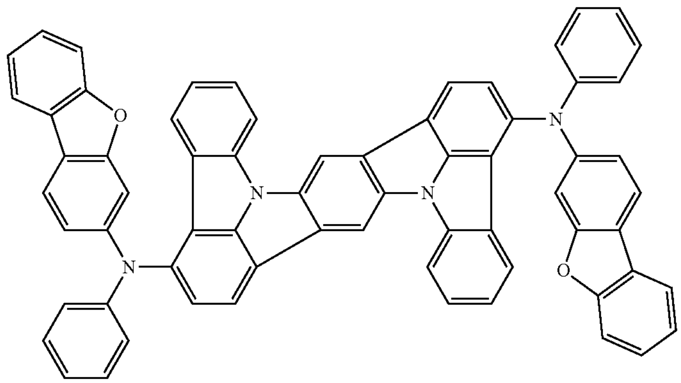
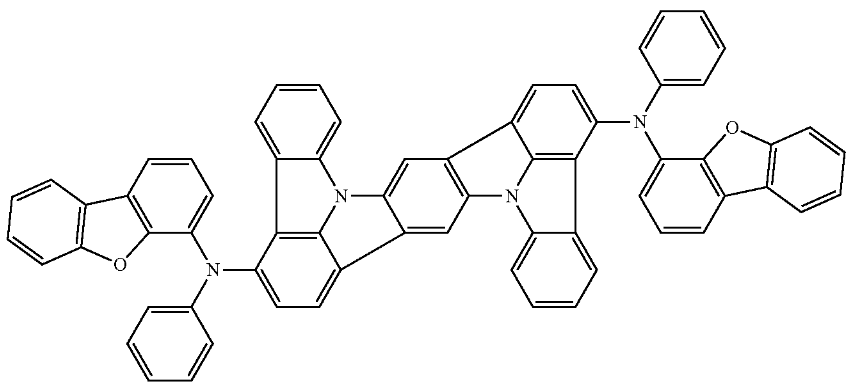
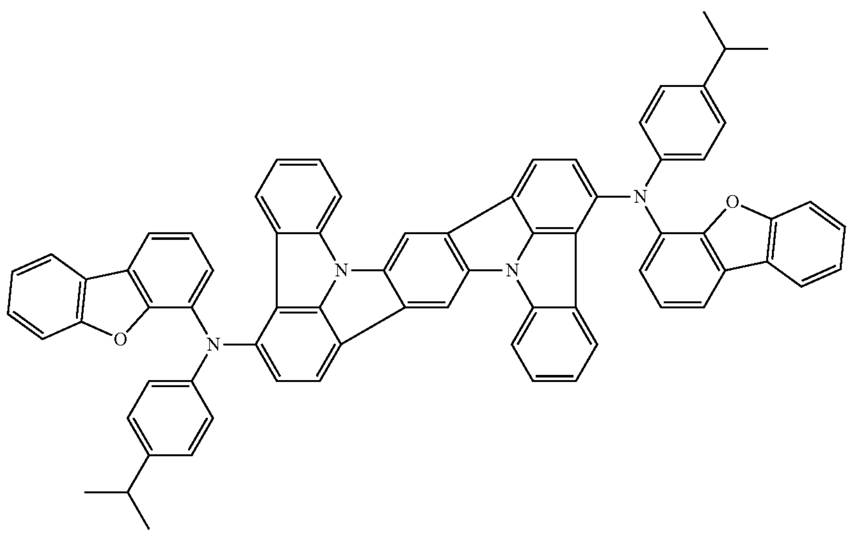
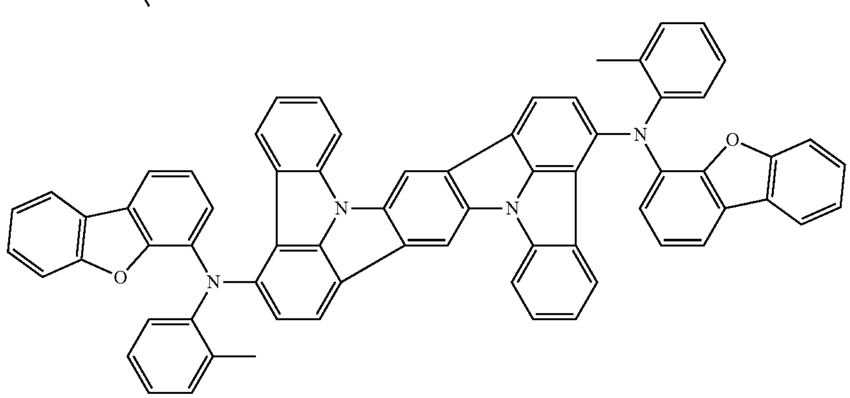

-continued
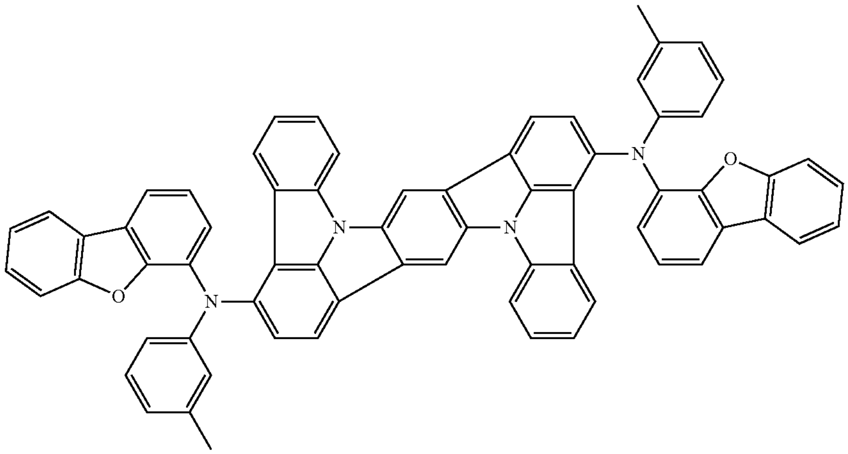
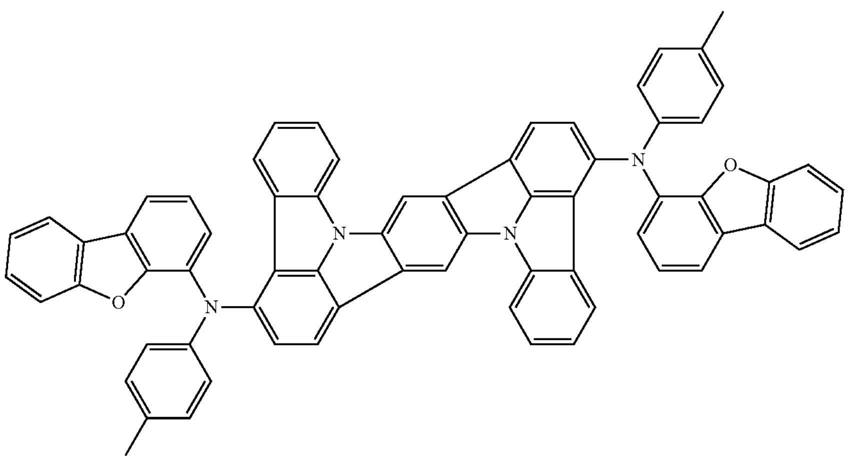
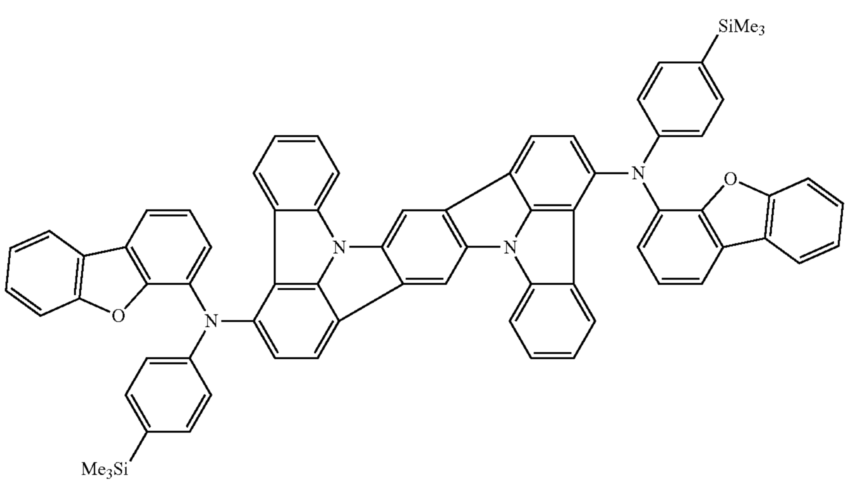

-continued
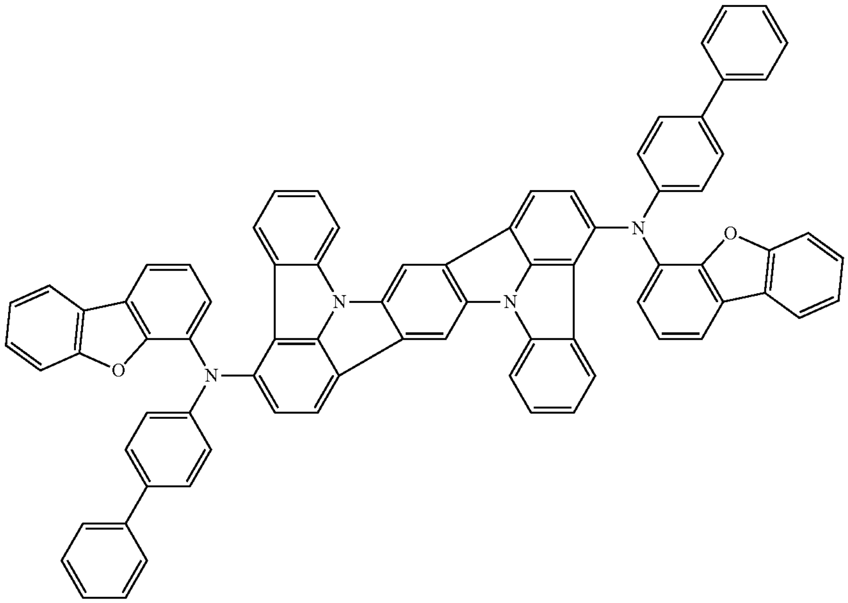
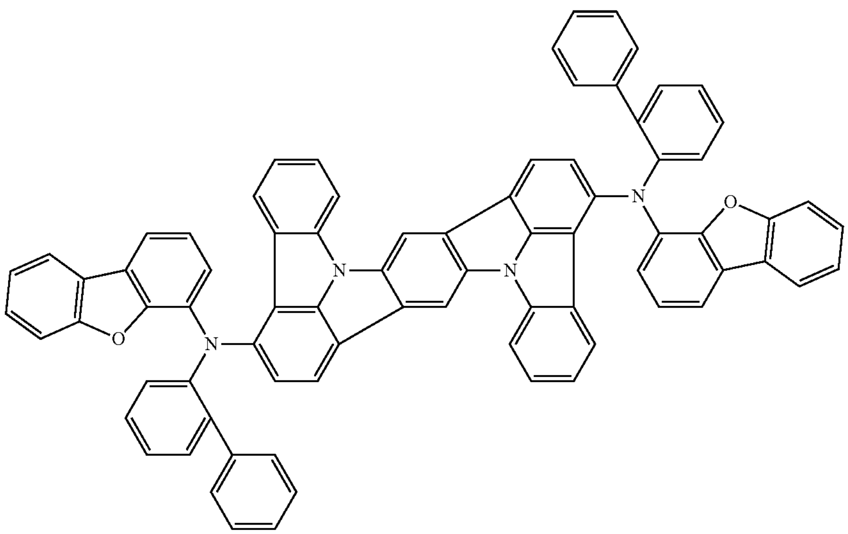
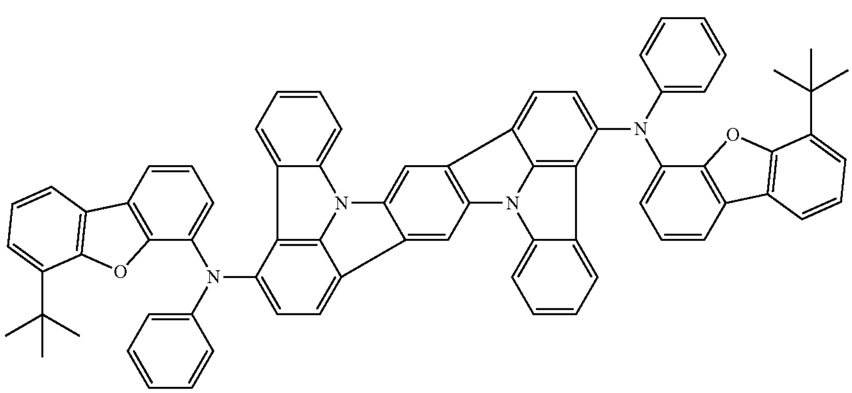

-continued
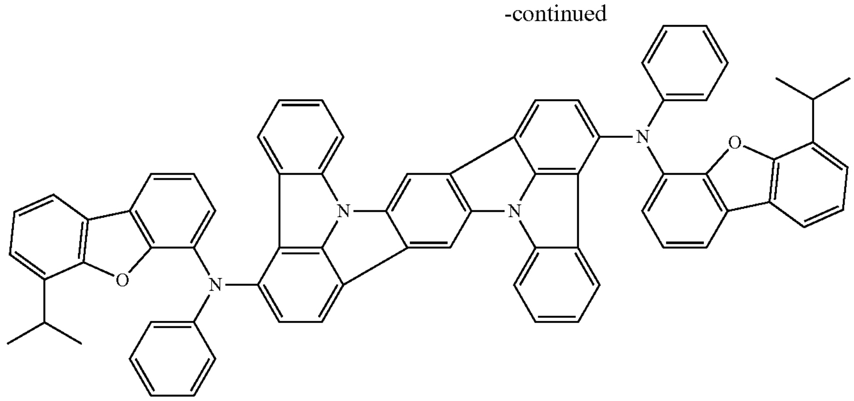
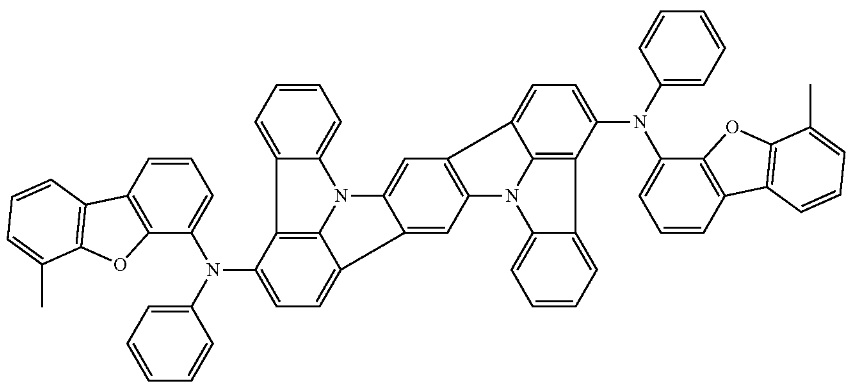
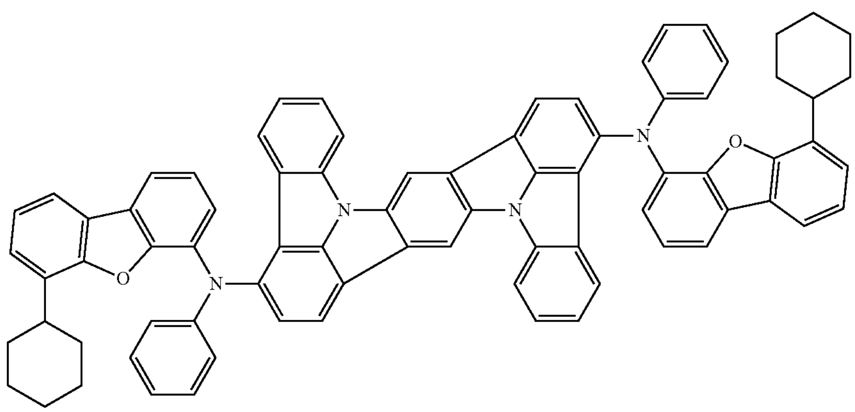
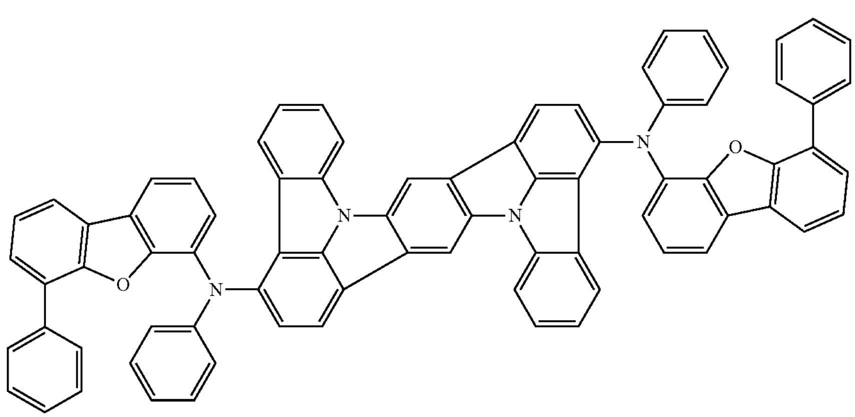

-continued
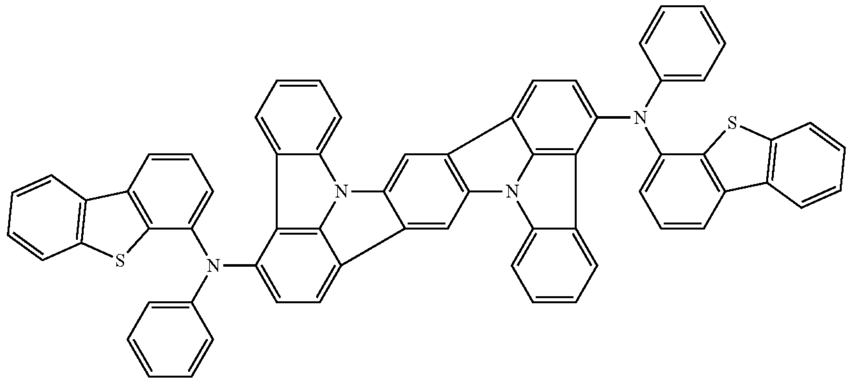
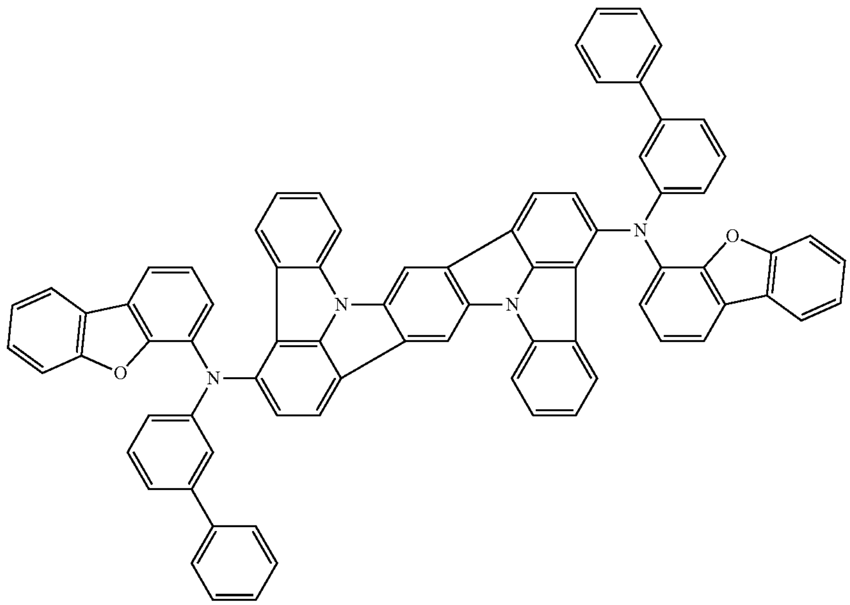
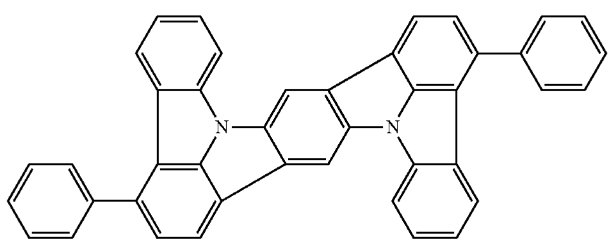
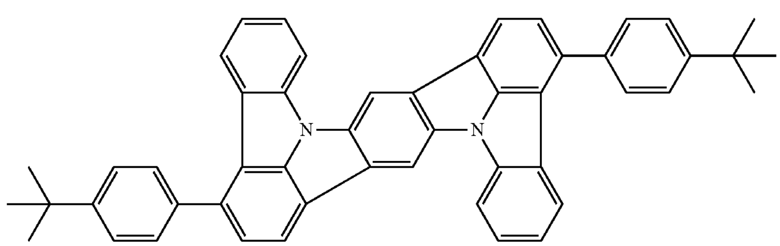
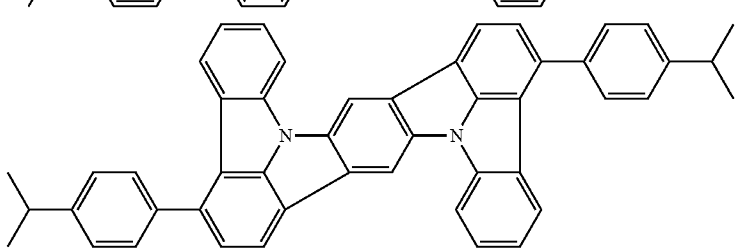

-continued
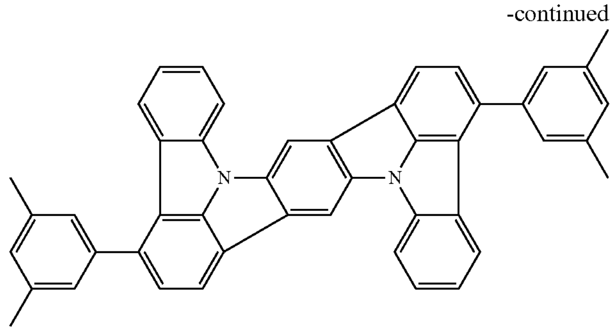
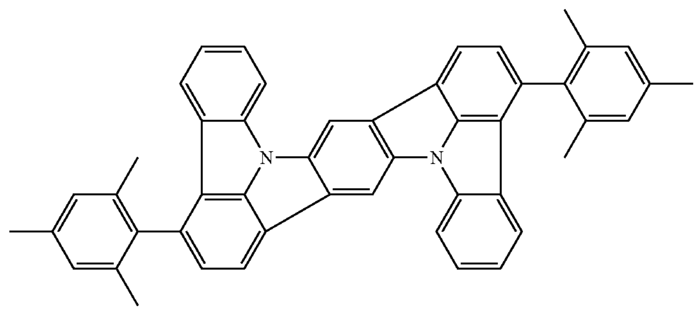
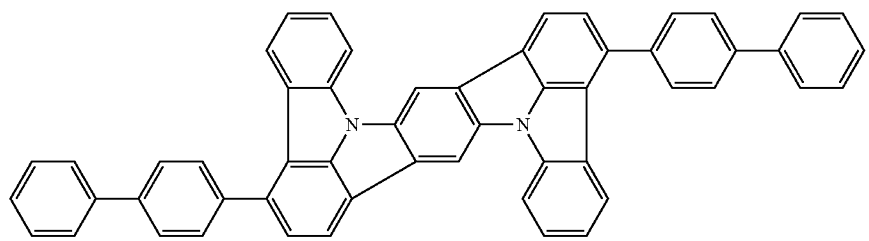
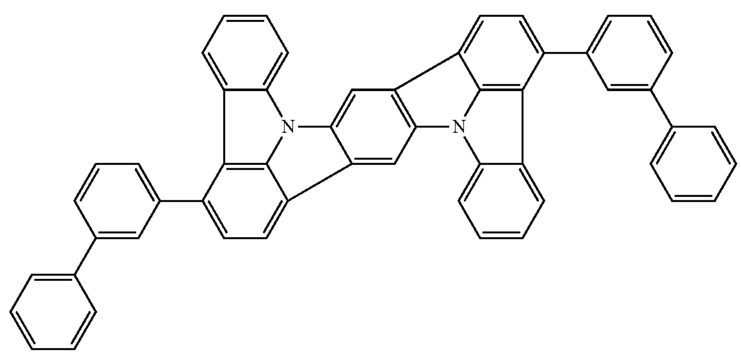
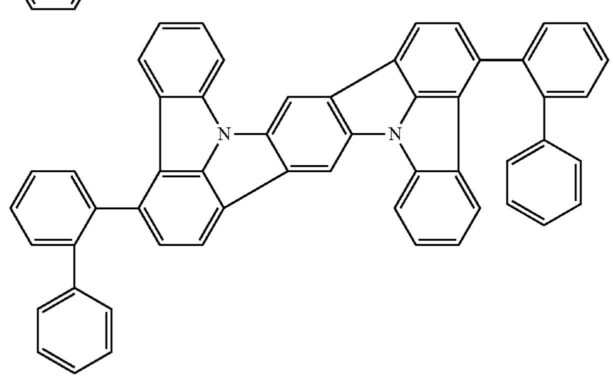

-continued
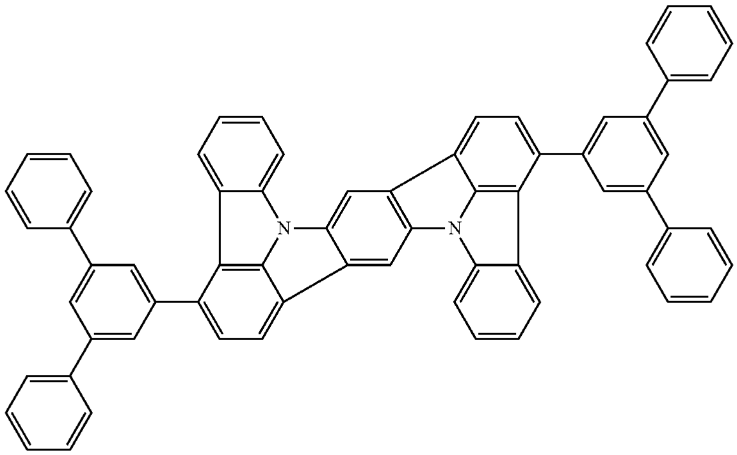
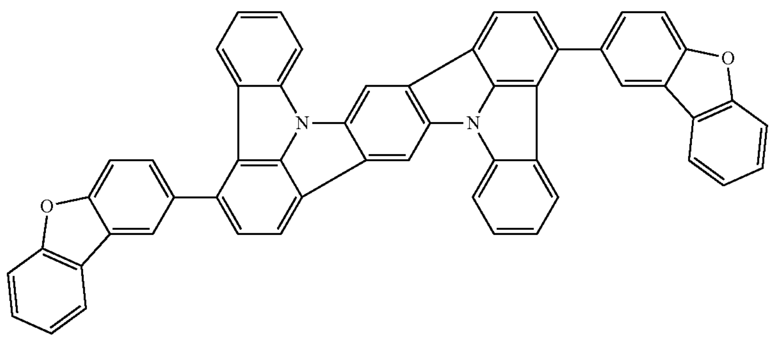
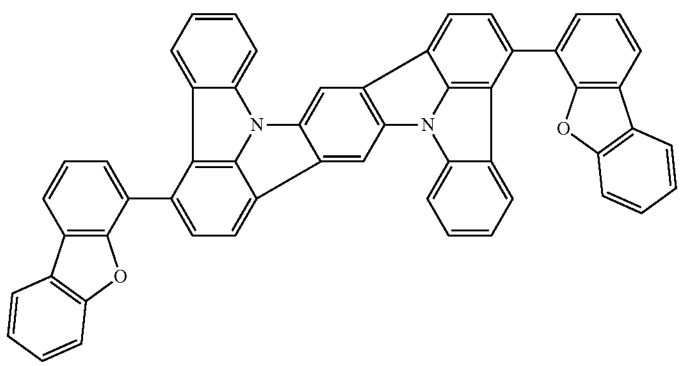
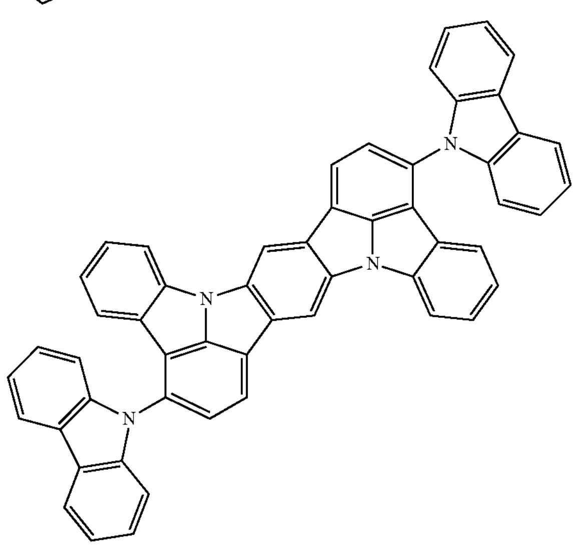

-continued

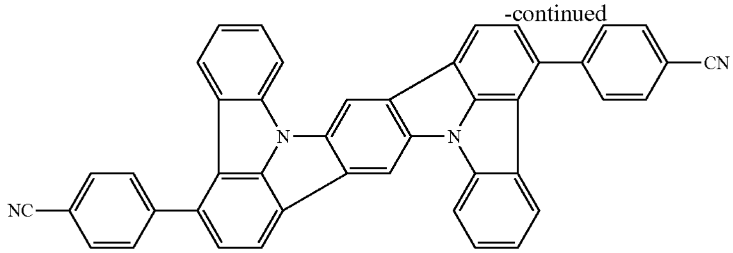

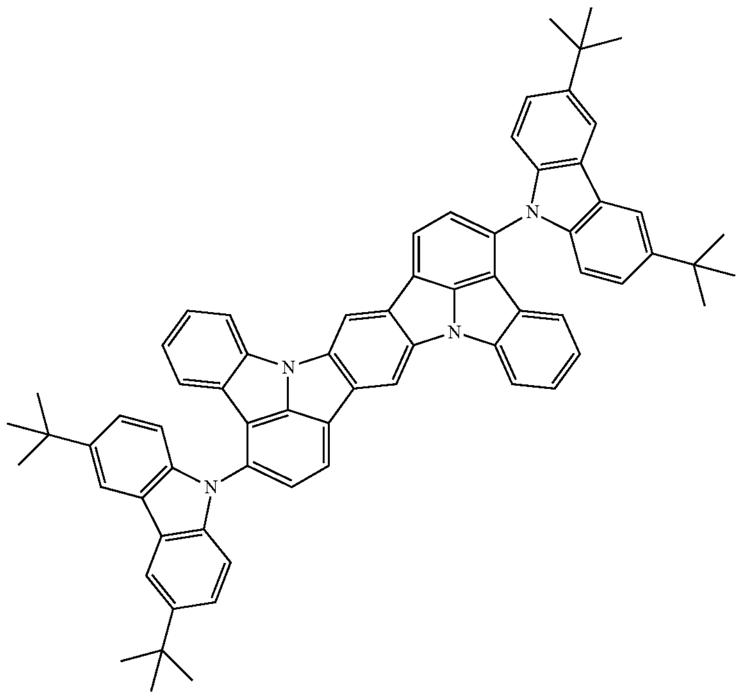

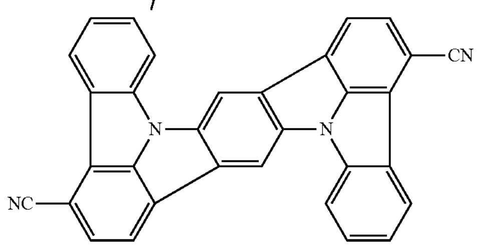

Compound Represented by Formula (41)

The compound represented by the formula (41) will be described below.

(41)

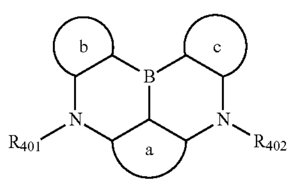

In the formula (41): a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{401}$ and $R_{402}$ are each independently bonded with the a ring, b ring, or c ring to form a substituted or unsubstituted heterocyclic group having 5 to 50 ring atoms, or not bonded with the a ring, b ring or c ring;

$R_{401}$ and $R_{402}$ not forming the substituted or unsubstituted heterocycle having 5 to 50 ring atoms each independently are a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

The a ring, b ring and c ring are each a ring (a substituted or unsubstituted aromatic hydrocarbon ring having 6 to 50 ring carbon atoms, or a substituted or unsubstituted heterocycle having 5 to 50 ring atoms) fused at the fused bicyclic moiety formed of a boron atom and two nitrogen atoms at the center of the formula (41).

The "aromatic hydrocarbon ring" for the a ring, b ring, and c ring has the same structure as the compound formed by introducing a hydrogen atom to the "aryl group" described above under the subtitle "Substituent Mentioned Herein."

Ring atoms of the "aromatic hydrocarbon ring" for the a ring include three carbon atoms on the fused bicyclic structure at the center of the formula (41).

Ring atoms of the "aromatic hydrocarbon ring" for the b ring and the c ring include two carbon atoms on the fused bicyclic structure at the center of the formula (41).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the a ring, b ring, and c ring has the same structure as the compound formed by introducing a hydrogen atom to the "heterocyclic group" described above under the subtitle "Substituent Mentioned Herein."

Ring atoms of the "heterocycle" for the a ring include three carbon atoms on the fused bicyclic structure at the center of the formula (41).

Ring atoms of the "heterocycle" for the b ring and the c ring include two carbon atoms on the fused bicyclic structure at the center of the formula (41).

Specific examples of the "substituted or unsubstituted heterocycle having 5 to 50 ring atoms" include a compound formed by introducing a hydrogen atom to the "heterocyclic group" described in the specific example group G2.

$R_{401}$ and $R_{402}$ are optionally each independently bonded with the a ring, b ring, or c ring to form a substituted or unsubstituted heterocycle having 5 to 50 ring atoms. The "heterocycle" in this arrangement includes the nitrogen atom on the fused bicyclic structure at the center of the formula (41). The heterocycle in the above arrangement optionally include a hetero atom other than the nitrogen atom. $R_{401}$ and $R_{402}$ bonded with the a ring, b ring, or c ring specifically means that atoms forming $R_{401}$ and $R_{402}$ are bonded with atoms forming the a ring, b ring, or c ring. For instance, $R_{401}$ may be bonded to the a ring to form a bicyclic (or tri-or-more cyclic) fused nitrogen-containing heterocycle, in which the ring including $R_{401}$ and the a ring are fused. Specific examples of the nitrogen-containing heterocycle include a compound corresponding to the nitrogen-containing bi(or-more)cyclic heterocyclic group in the specific example group G2.

The same applies to $R_{401}$ bonded with the b ring, $R_{402}$ bonded with the a ring, and $R_{402}$ bonded with the c ring.

In some embodiments, the a ring, b ring and c ring in the formula (41) are each independently a substituted or unsubstituted aromatic hydrocarbon ring having 6 to 50 ring carbon atoms.

In some embodiments, the a ring, b ring and c ring in the formula (41) are each independently a substituted or unsubstituted benzene ring or a substituted or unsubstituted naphthalene ring.

In some embodiments, $R_{401}$ and $R_{402}$ in the formula (41) are each independently a substituted or unsubstituted aryl group having 6 to 50 ring carbon atoms, or a substituted or unsubstituted monovalent heterocyclic group having 5 to 50 ring atoms, preferably a substituted or unsubstituted aryl group having 6 to 50 ring carbon atoms.

In some embodiments, the compound represented by the formula (41) is represented by a formula (42) below.

(42)

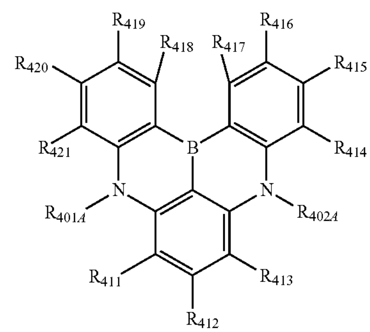

In the formula (42): $R_{401A}$ is bonded with at least one moiety selected from the group consisting of $R_{411}$ and $R_{421}$ to form a substituted or unsubstituted heterocycle, or to form no substituted or unsubstituted heterocycle;

$R_{402A}$ is bonded with at least one moiety selected from the group consisting of $R_{413}$ and $R_{414}$ to form a substituted or unsubstituted heterocycle, or to form no substituted or unsubstituted heterocycle;

$R_{401A}$ and $R_{402A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{411}$ to $R_{421}$ are mutually bonded to form a substituted or unsubstituted monocyclic ring, mutually bonded to form a substituted or unsubstituted fused ring, or not mutually bonded;

$R_{411}$ to $R_{421}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ respectively represent the same as $R_{901}$ to $R_{907}$ of the formula (21).

$R_{401A}$ and $R_{402A}$ in the formula (42) are groups corresponding to $R_{401}$ and $R_{402}$ in the formula (41).

For instance, $R_{401A}$ and $R_{411}$ may be bonded with each other to form a bicyclic (or tri-or-more cyclic) nitrogen-containing heterocycle, in which the ring including $R_{401A}$ and $R_{411}$ and a benzene ring corresponding to the a ring are fused. Specific examples of the nitrogen-containing heterocycle include a compound corresponding to the nitrogen-containing bi(or-more)cyclic heterocyclic group in the specific example group G2. The same applies to $R_{401A}$ bonded with $R_{421}$, $R_{402A}$ bonded with $R_{413}$, and $R_{402A}$ bonded with $R_{414}$.

At least one combination of adjacent two or more of $R_{411}$ to $R_{421}$ are optionally mutually bonded to form a substituted or unsubstituted monocyclic ring or a substituted or unsubstituted fused ring. For instance, $R_{411}$ and $R_{412}$ are optionally mutually bonded to form a structure in which a benzene ring, indole ring, pyrrole ring, benzofuran ring, benzothiophene ring or the like is fused to the six-membered ring bonded with $R_{411}$ and $R_{412}$, the resultant fused ring forming a naphthalene ring, carbazole ring, indole ring, dibenzofuran ring, dibenzothiophene ring, respectively.

In some embodiments, $R_{411}$ to $R_{421}$ not contributing to ring formation (i.e. not mutually bonded) are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In some embodiments, $R_{411}$ to $R_{421}$, which do not contribute to ring formation (i.e. are not mutually bonded) are each independently a hydrogen atom, a substituted or unsubstituted aryl group having 6 to 50 ring carbon atoms, or a substituted or unsubstituted heterocyclic group having 5 to 50 ring atoms.

In some embodiments, $R_{411}$ to $R_{421}$, which do not contribute to ring formation (i.e. are not mutually bonded) are each independently a hydrogen atom, or a substituted or unsubstituted alkyl group having 1 to 50 carbon atoms.

In some embodiments, $R_{411}$ to $R_{421}$, which do not contribute to ring formation (i.e. are not mutually bonded) are each independently a hydrogen atom or a substituted or unsubstituted alkyl group having 1 to 50 carbon atoms, at least one of $R_{411}$ to $R_{421}$ being a substituted or unsubstituted alkyl group having 1 to 50 carbon atoms.

In some embodiments, the compound represented by the formula (42) is represented by a formula (43) below.

(43)

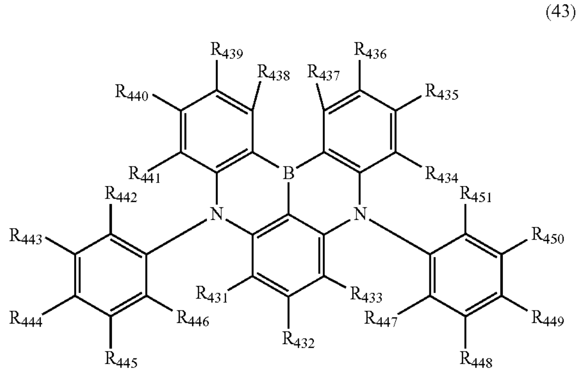

In the formula (43): a combination of $R_{431}$ and $R_{446}$ are mutually bonded to form a substituted or unsubstituted heterocycle, or not mutually bonded;

a combination of $R_{433}$ and $R_{447}$ are mutually bonded to form a substituted or unsubstituted heterocycle, or not mutually bonded;

a combination of $R_{434}$ and $R_{451}$ are mutually bonded to form a substituted or unsubstituted heterocycle, or not mutually bonded;

a combination of $R_{441}$ and $R_{442}$ are mutually bonded to form a substituted or unsubstituted heterocycle, or not mutually bonded;

at least one combination of adjacent two or more of $R_{431}$ to $R_{451}$ are mutually bonded to form a substituted or unsubstituted monocyclic ring, mutually bonded to form a substituted or unsubstituted fused ring, or not mutually bonded;

$R_{431}$ to $R_{451}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ respectively represent the same as $R_{901}$ to $R_{907}$ of the formula (21).

$R_{431}$ may be mutually bonded with $R_{446}$ to form a substituted or unsubstituted heterocycle. For instance, $R_{431}$ and $R_{446}$ may be bonded with each other to form a tri-or-more cyclic nitrogen-containing heterocycle, in which a benzene ring bonded with $R_{46}$, a ring including a nitrogen atom, and a benzene ring corresponding to the a ring are fused. Specific examples of the nitrogen-containing heterocycle include a compound corresponding to the nitrogen-containing tri(-or-more)cyclic heterocyclic group in the specific example group G2. The same applies to $R_{433}$ bonded with $R_{447}$, $R_{434}$ bonded with $R_{451}$, and $R_{441}$ bonded with $R_{442}$.

In some embodiments, $R_{431}$ to $R_{451}$, which do not contribute to ring formation (i.e. are not mutually bonded) are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In some embodiments, $R_{431}$ to $R_{451}$, which do not contribute to ring formation (i.e. are not mutually bonded) are each independently a hydrogen atom, a substituted or unsubstituted aryl group having 6 to 50 ring carbon atoms, or a substituted or unsubstituted heterocyclic group having 5 to 50 ring atoms.

In some embodiments, $R_{431}$ to $R_{451}$, which do not contribute to ring formation (i.e. are not mutually bonded) are each independently a hydrogen atom, or a substituted or unsubstituted alkyl group having 1 to 50 carbon atoms.

In some embodiments, $R_{431}$ to $R_{451}$, which do not contribute to ring formation (i.e. are not mutually bonded) are each independently a hydrogen atom or a substituted or unsubstituted alkyl group having 1 to 50 carbon atoms, at least one of $R_{431}$ to $R_{451}$ being a substituted or unsubstituted alkyl group having 1 to 50 carbon atoms.

In some embodiments, the compound represented by the formula (43) is represented by a formula (43A) below.

(43A)

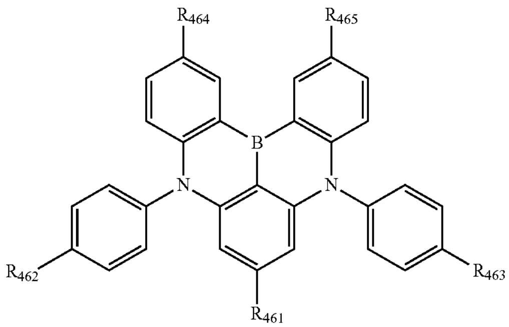

In the formula (43A): $R_{461}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms;

$R_{462}$ to $R_{465}$ each independently represent a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In some embodiments, $R_{461}$ to $R_{465}$ are each independently a substituted or unsubstituted alkyl group having 1 to 50 carbon atoms, or a substituted or unsubstituted aryl group having 6 to 50 ring carbon atoms.

In some embodiments, $R_{461}$ to $R_{465}$ are each independently a substituted or unsubstituted alkyl group having 1 to 50 carbon atoms.

In some embodiments, the compound represented by the formula (43) is represented by a formula (43B) below.

(43B)

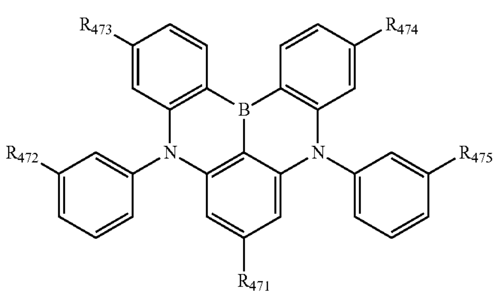

In the formula (43B): $R_{471}$ and $R_{472}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms;

$R_{473}$ to $R_{475}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms; and $R_{906}$ and $R_{907}$ respectively represent the same as $R_{906}$ and $R_{907}$ of the formula (21).

In some embodiments, the compound represented by the formula (43) is represented by a formula (43B') below.

(43B')

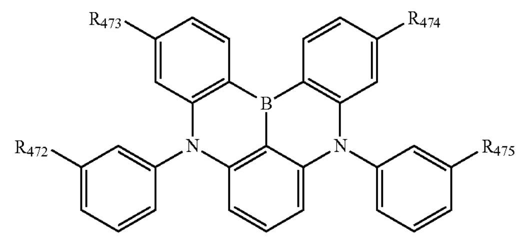

In the formula (43B'), $R_{472}$ to $R_{475}$ are as defined in the formula (43B).

In some embodiments, at least one of $R_{471}$ to $R_{475}$ is:

a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), or a substituted or unsubstituted aryl group having 6 to 50 ring carbon atoms.

In some embodiments: $R_{472}$ is a hydrogen atom, a substituted or unsubstituted alkyl group having 1 to 50 carbon atoms, a group represented by —N($R_{906}$)($R_{907}$), or a substituted or unsubstituted aryl group having 6 to 50 ring carbon atoms;

$R_{471}$ and $R_{473}$ to $R_{475}$ are each independently a substituted or unsubstituted alkyl group having 1 to 50 carbon atoms, a group represented by —N($R_{906}$)($R_{907}$), or a substituted or unsubstituted aryl group having 6 to 50 ring carbon atoms.

In some embodiments, the compound represented by the formula (43) is represented by a formula (43C) below.

(43C)

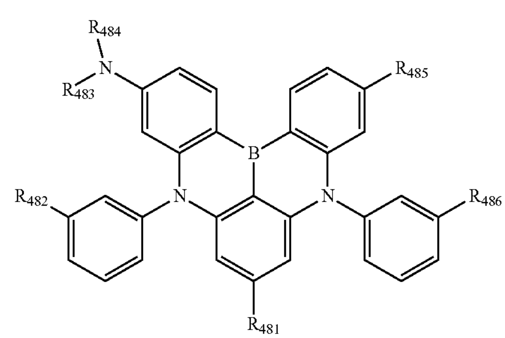

In the formula (43C): $R_{481}$ and $R_{482}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{483}$ to $R_{486}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In some embodiments, the compound represented by the formula (43) is represented by a formula (43C') below.

(43C')

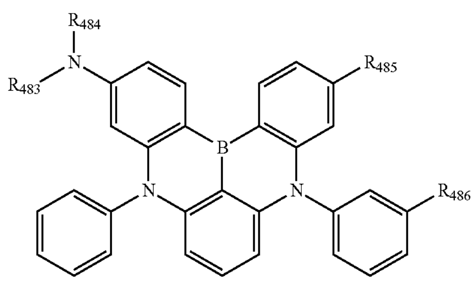

In the formula (43C'), $R_{483}$ to $R_{486}$ are as defined in the formula (43C).

In some embodiments, $R_{481}$ to $R_{486}$ are each independently a substituted or unsubstituted alkyl group having 1 to 50 carbon atoms, or a substituted or unsubstituted aryl group having 6 to 50 ring carbon atoms.

In some embodiments, $R_{481}$ to $R_{486}$ are each independently a substituted or unsubstituted aryl group having 6 to 50 ring carbon atoms.

The compound represented by the formula (41) is producible by initially bonding the a ring, b ring and c ring with linking groups (a group including N—$R_{401}$ and a group including N—$R_{402}$) to form an intermediate (first reaction), and bonding the a ring, b ring and c ring with a linking group (a group including a boron atom) to form a final product (second reaction). In the first reaction, an amination reaction (e.g. Buchwald-Hartwig reaction) is applicable. In the second reaction, Tandem Hetero-Friedel-Crafts Reactions or the like is applicable.

Specific Examples of Compound Represented by Formula (41)

Specific examples of the compound represented by the formula (41) are shown below. It should however be noted that the invention is not limited by the specific examples of the second compound.

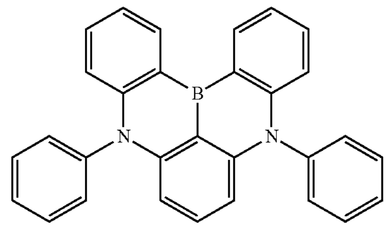

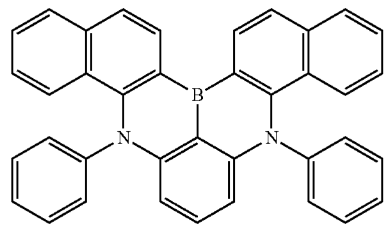

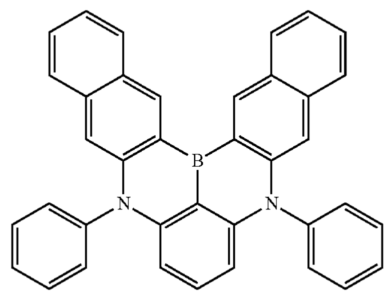

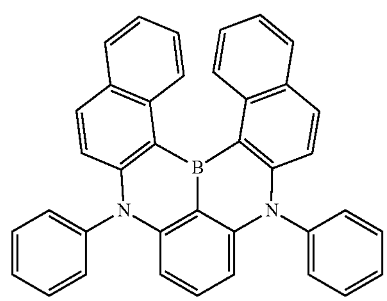

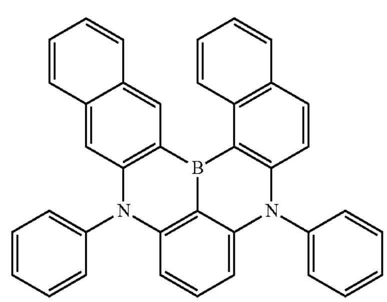

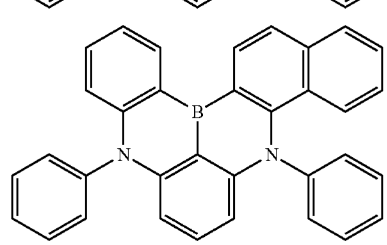

-continued
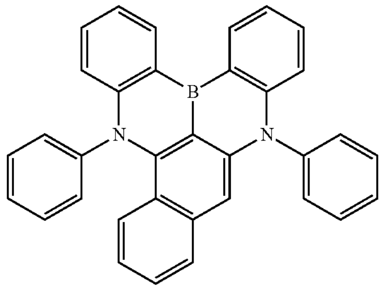
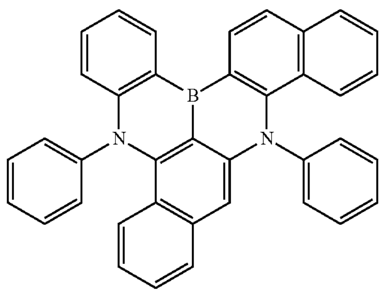
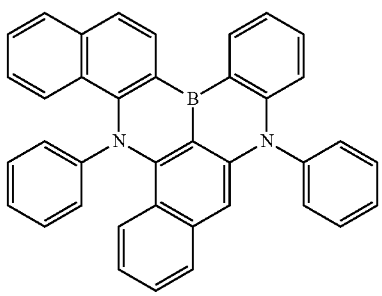
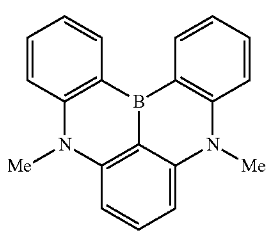
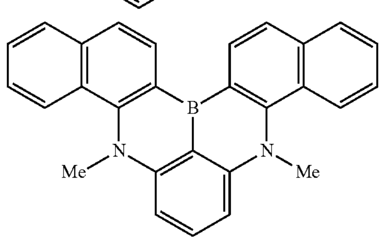
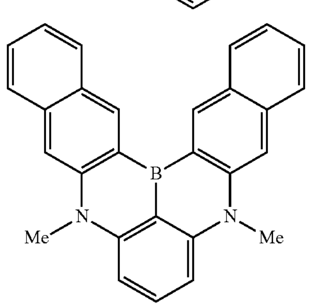
-continued
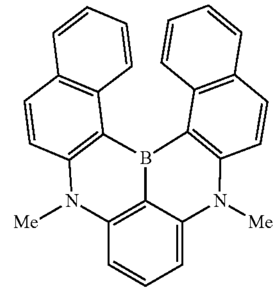
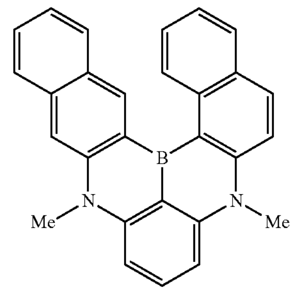
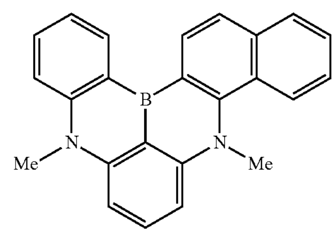
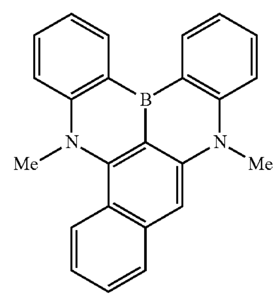
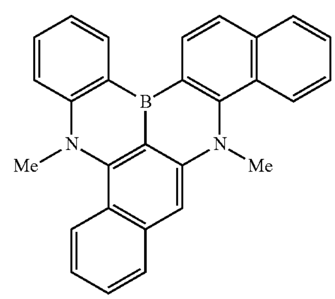
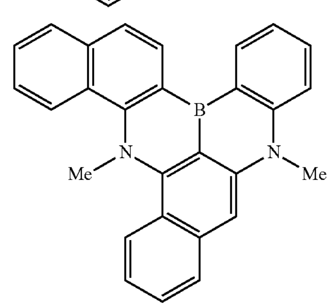

-continued
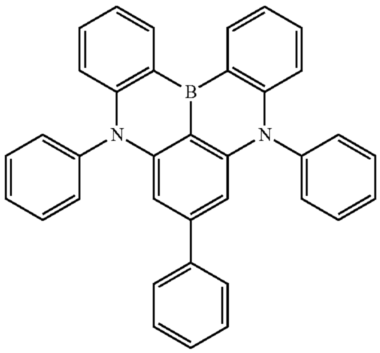
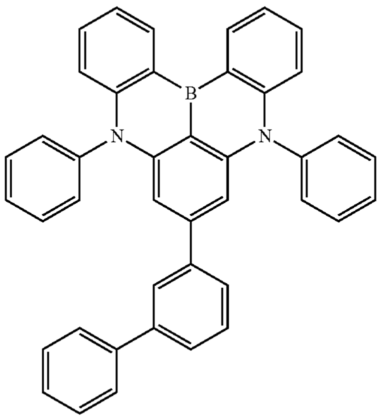
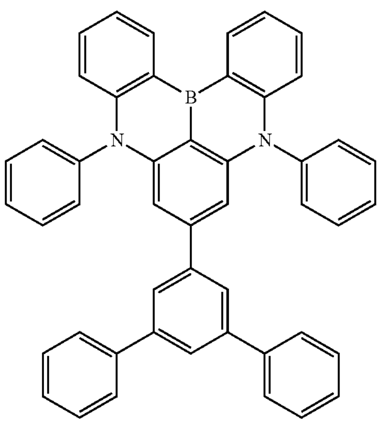
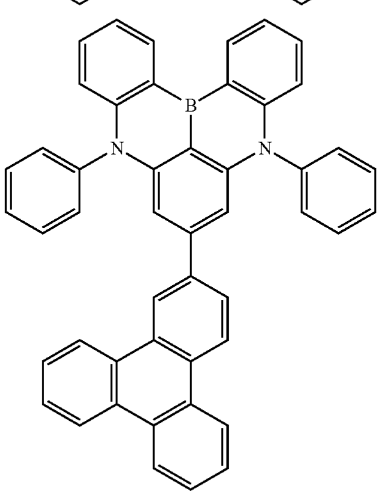
-continued
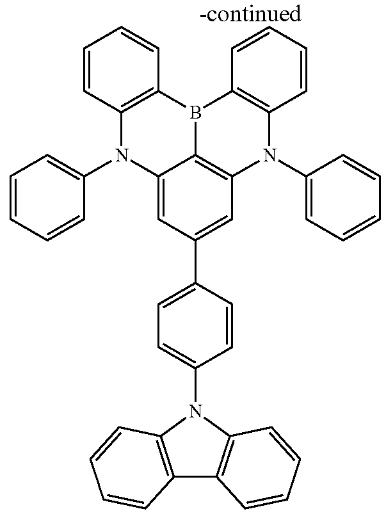
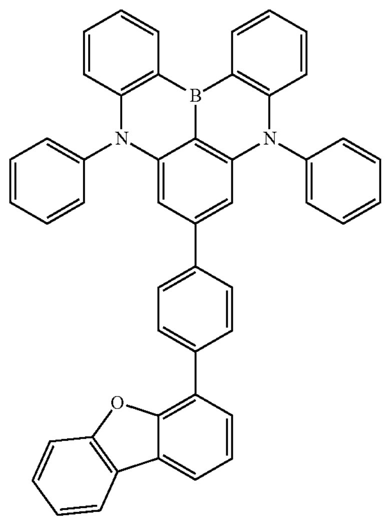
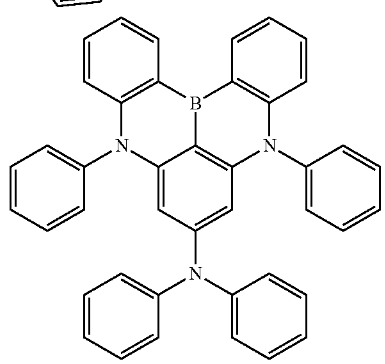
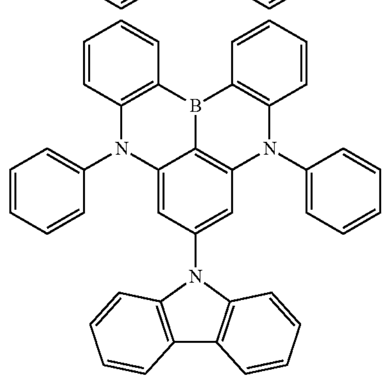

-continued
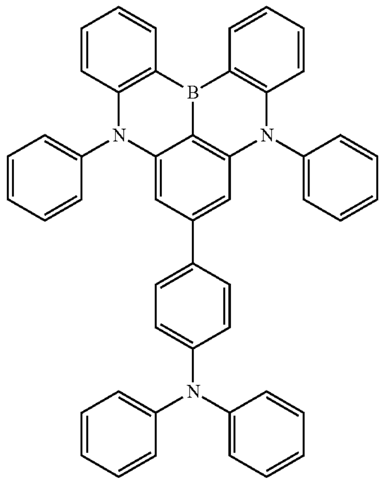
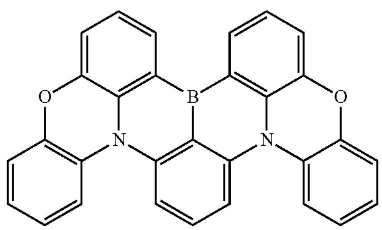
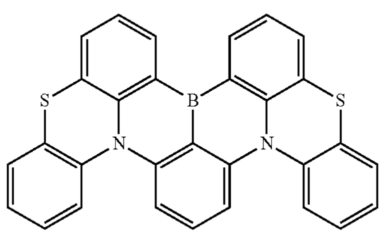
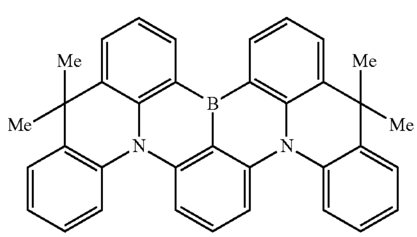
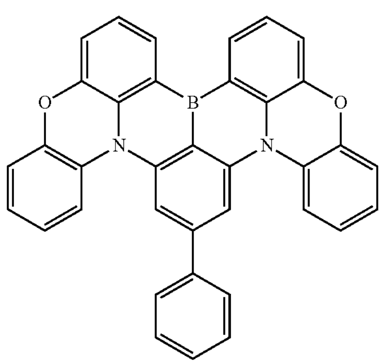
-continued
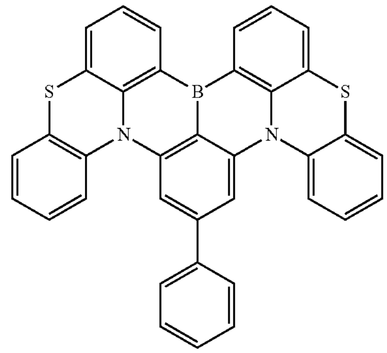
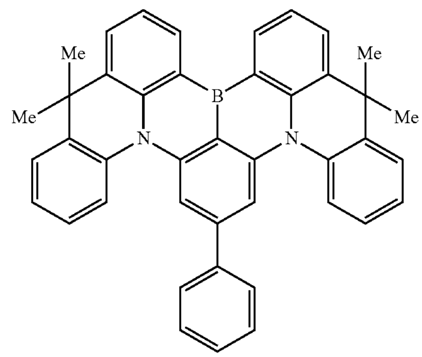
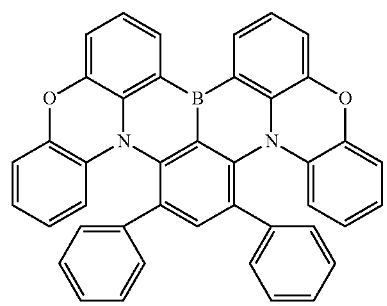
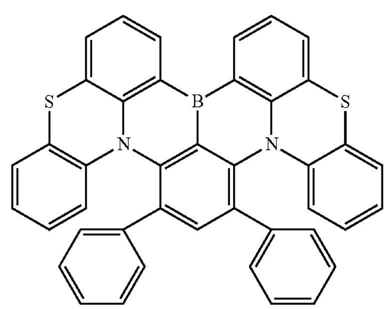
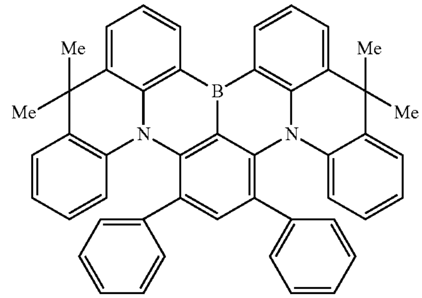

-continued
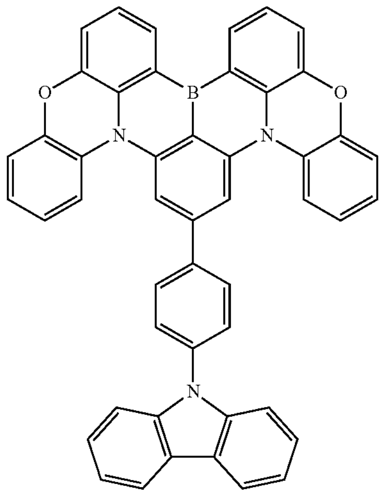
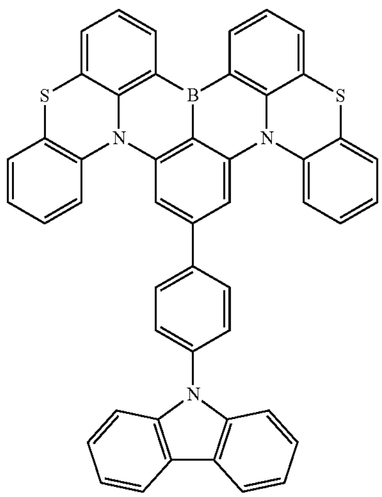
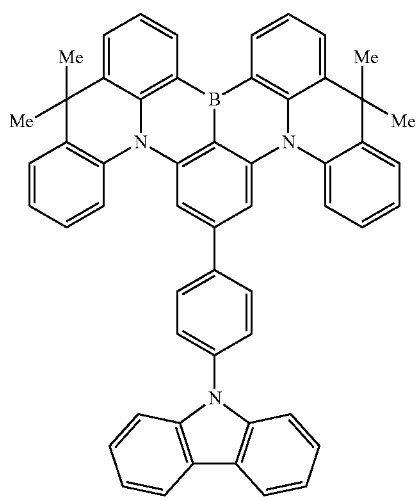
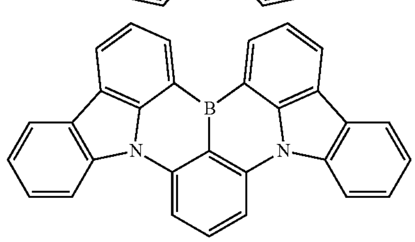
-continued
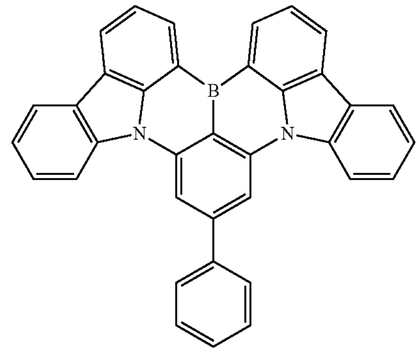
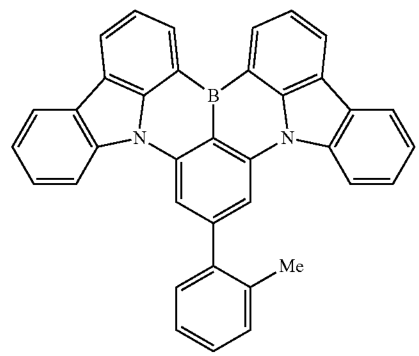
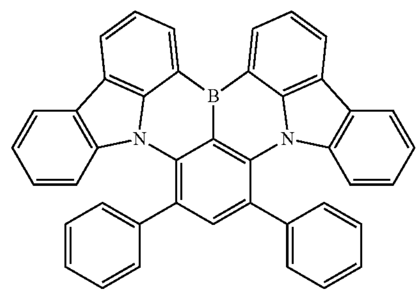
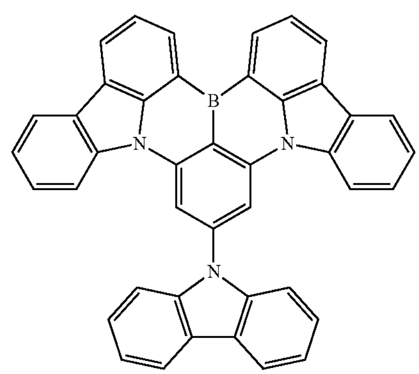
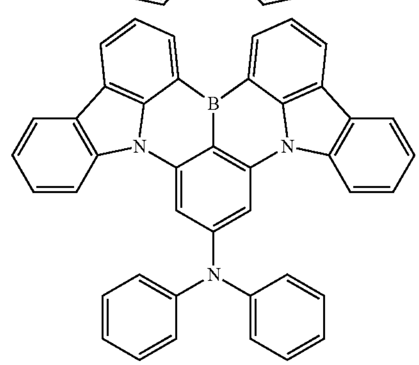

-continued
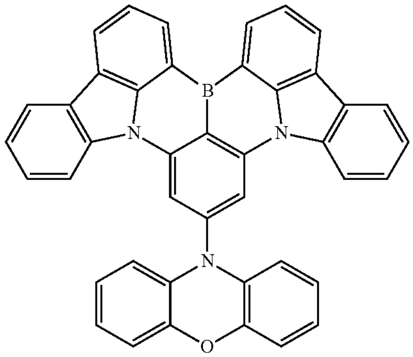
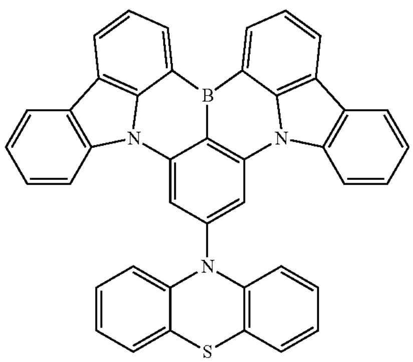
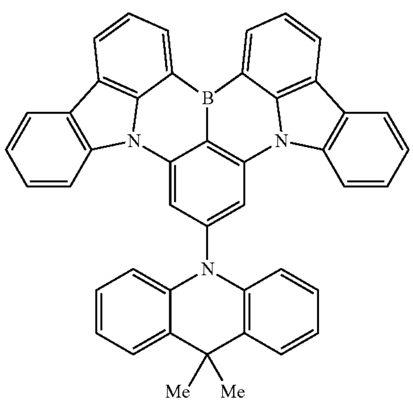
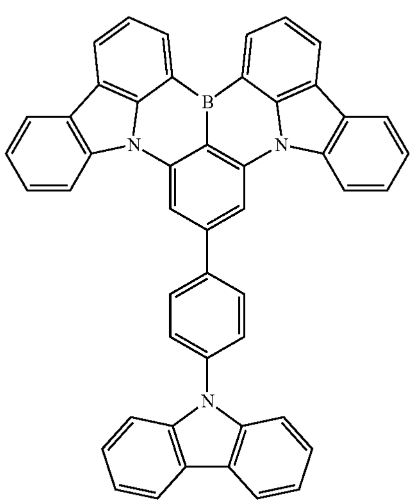
-continued
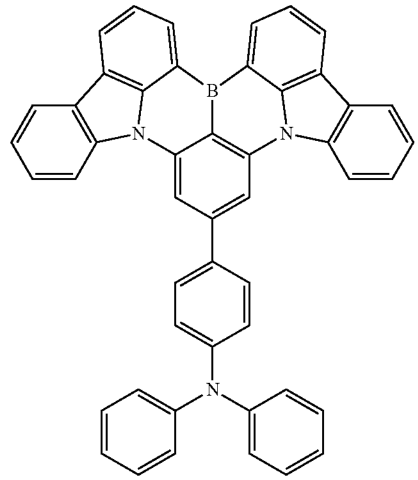
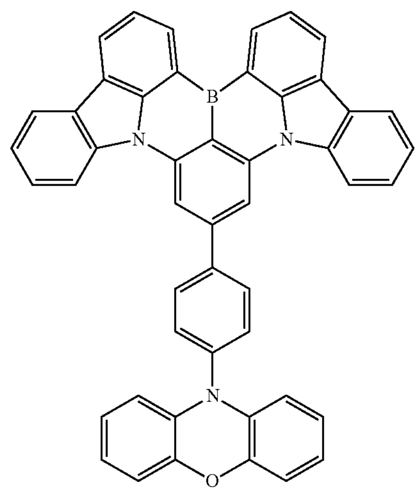
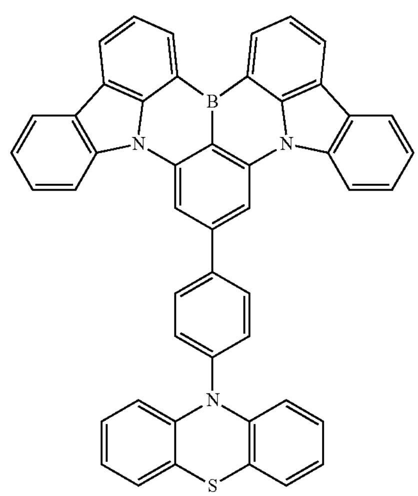

-continued
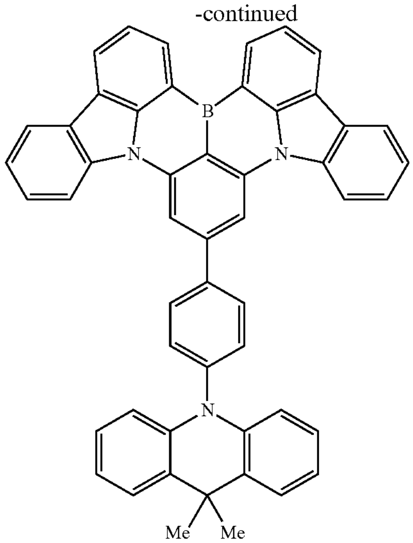
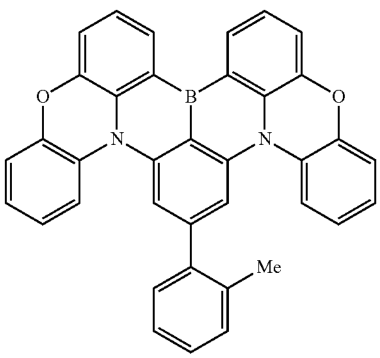
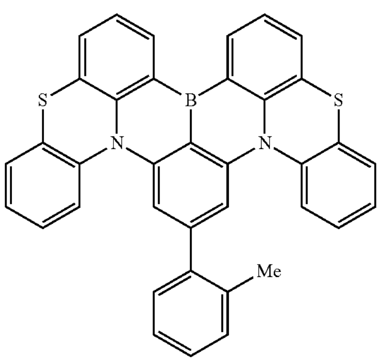
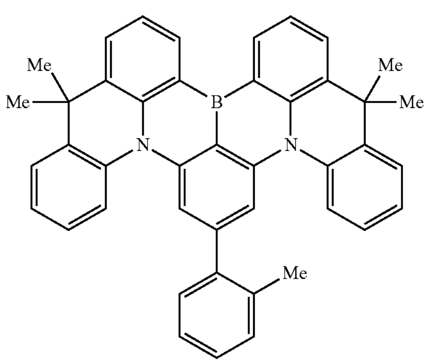
-continued
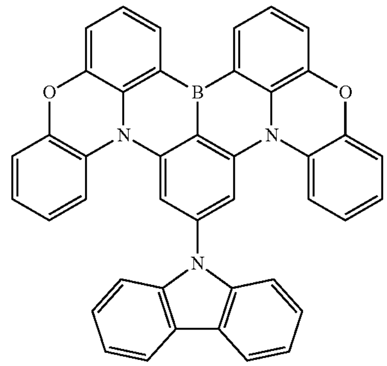
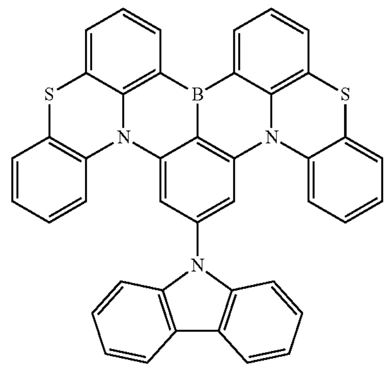
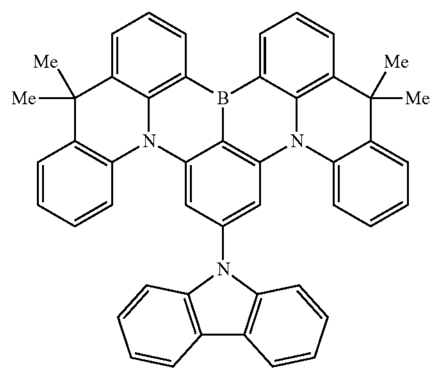
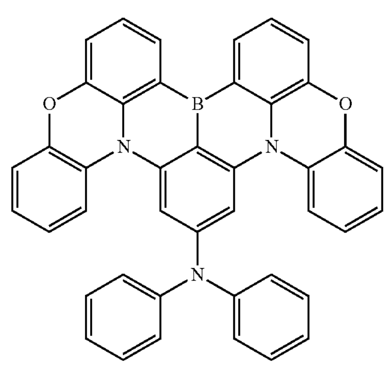

-continued
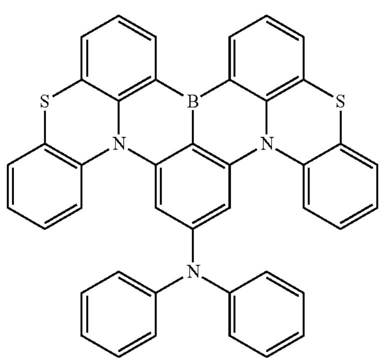
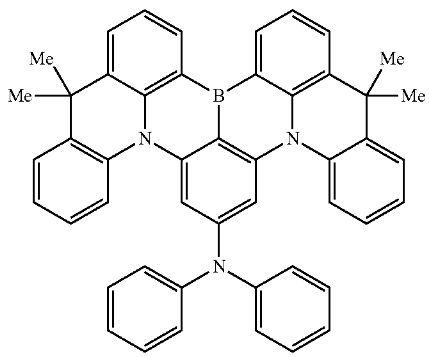
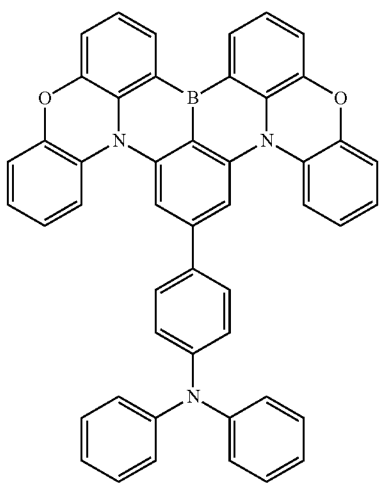
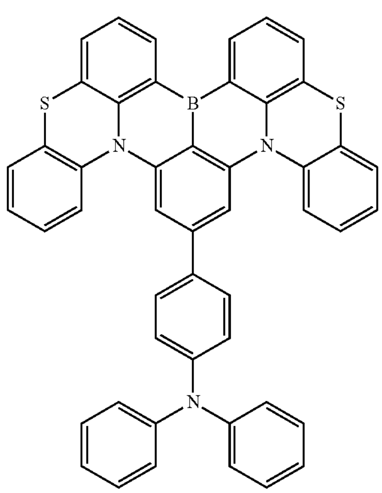
-continued
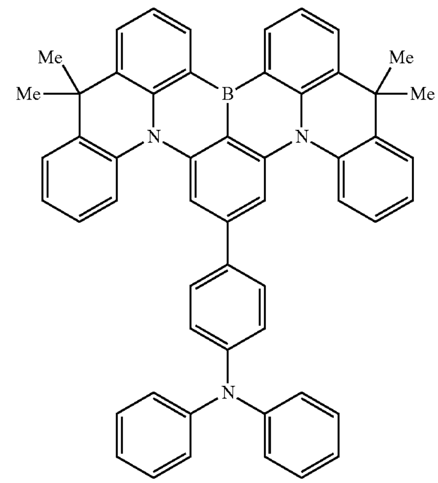
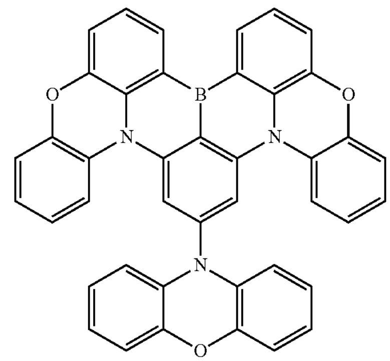
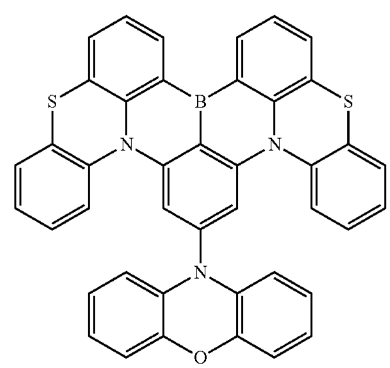
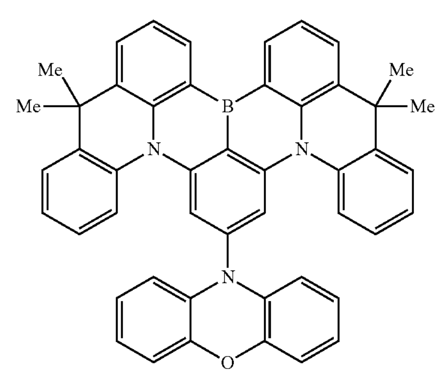

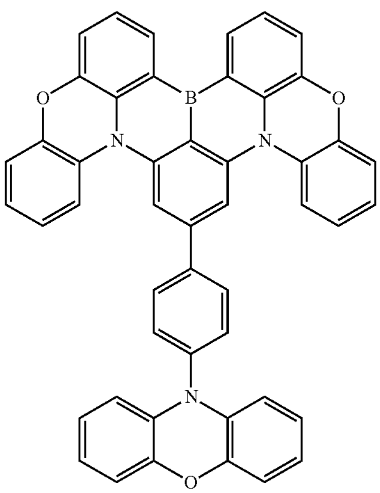
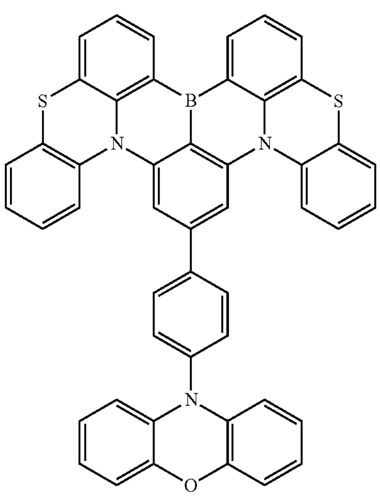
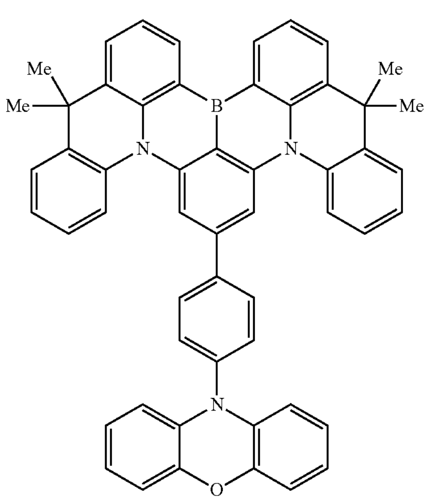
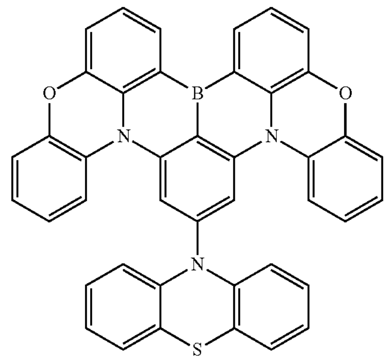
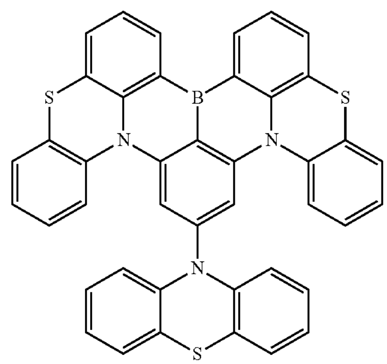
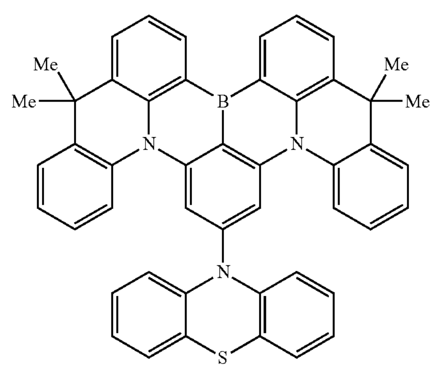
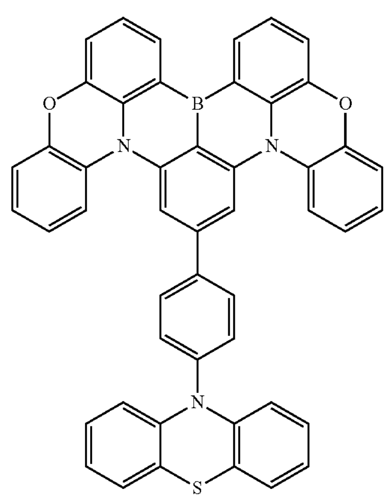

-continued
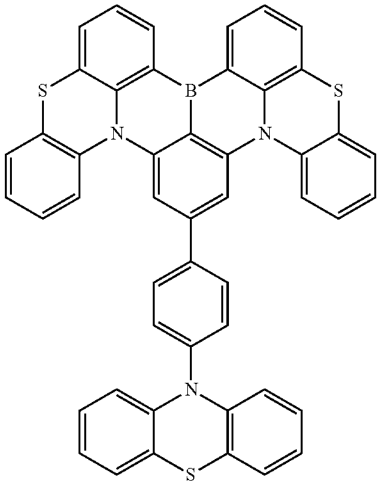
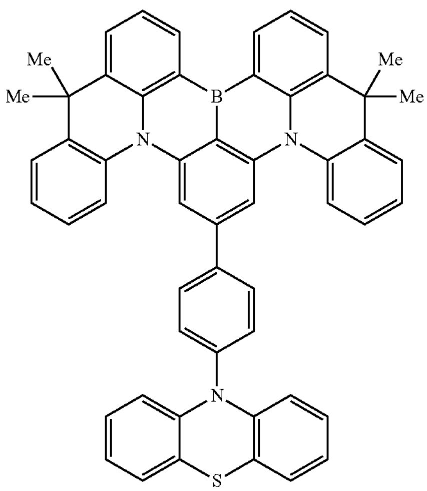
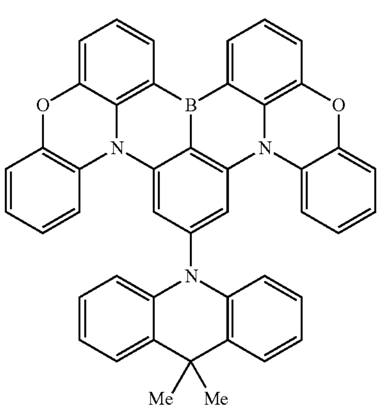
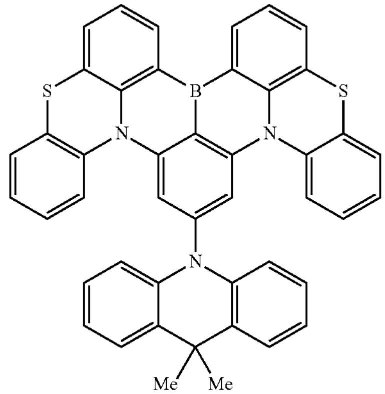
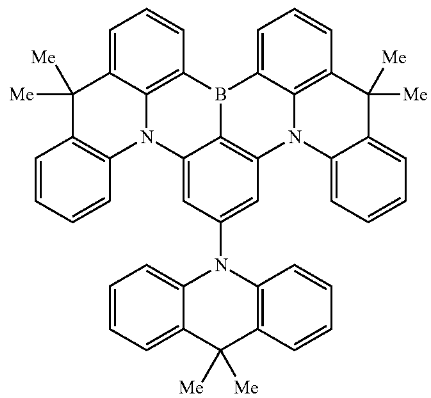
-continued
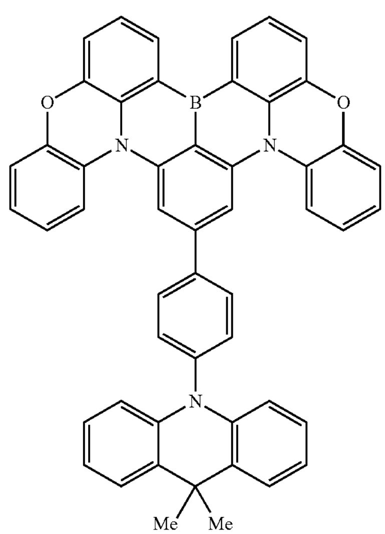

-continued
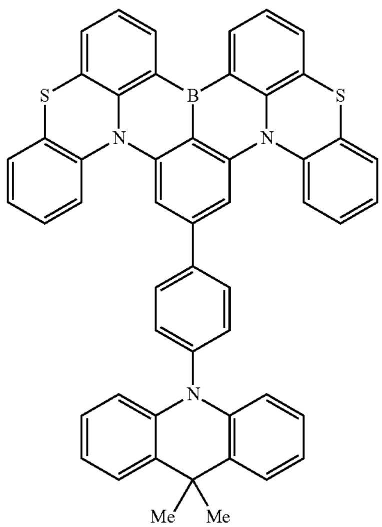
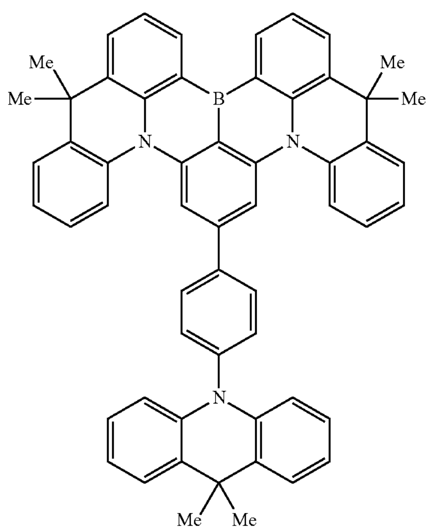
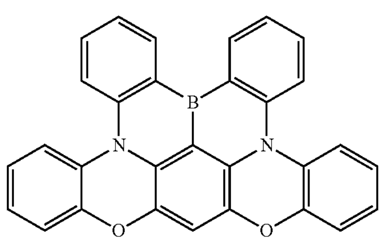
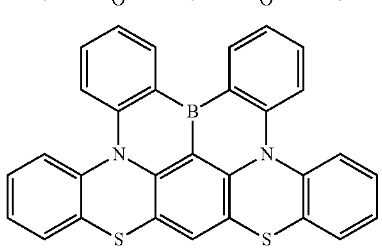
-continued
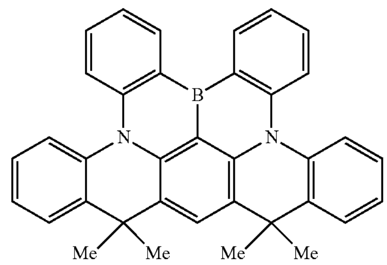
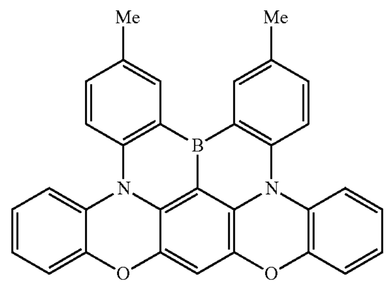
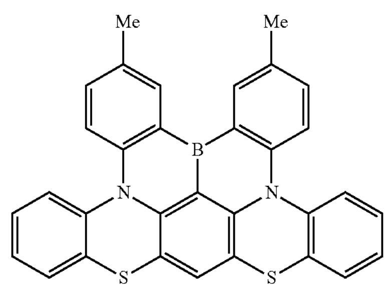
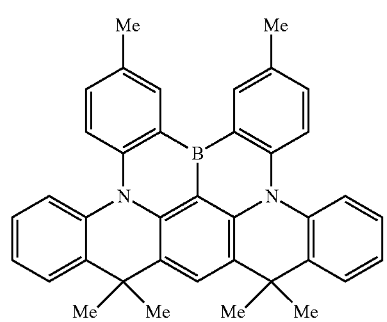
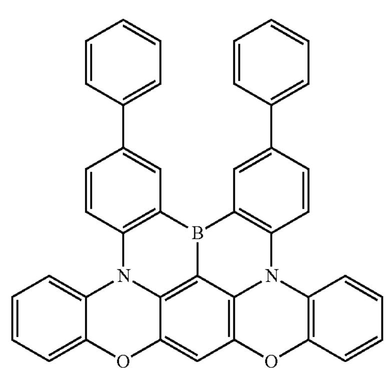

-continued
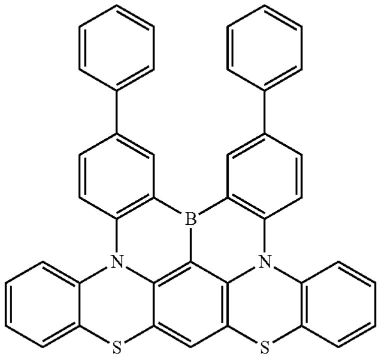
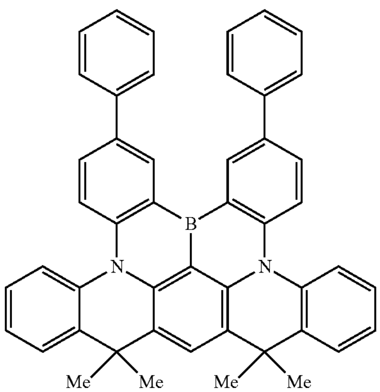
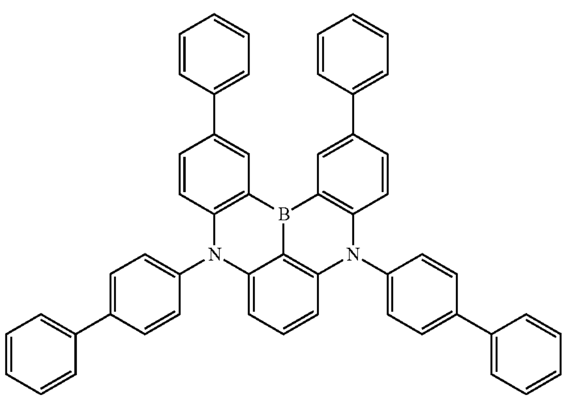
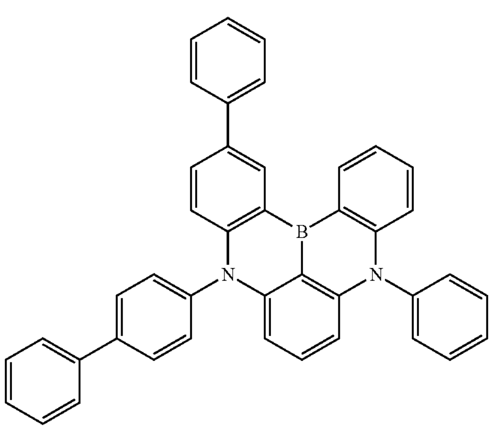
-continued
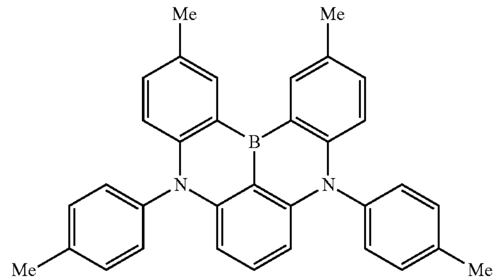
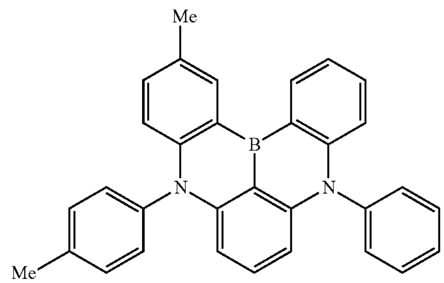
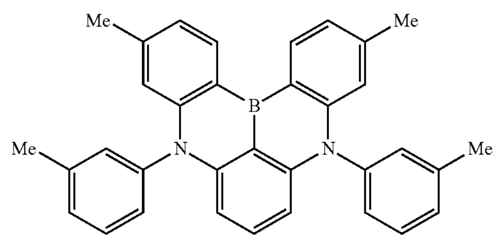
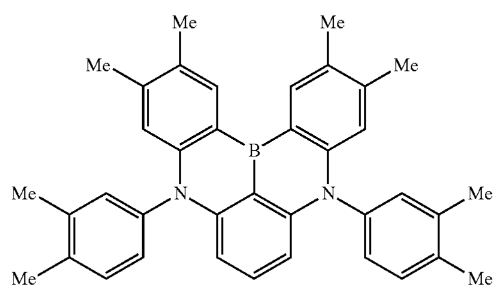
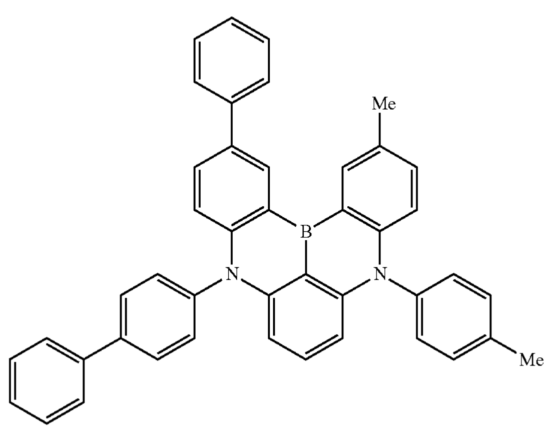

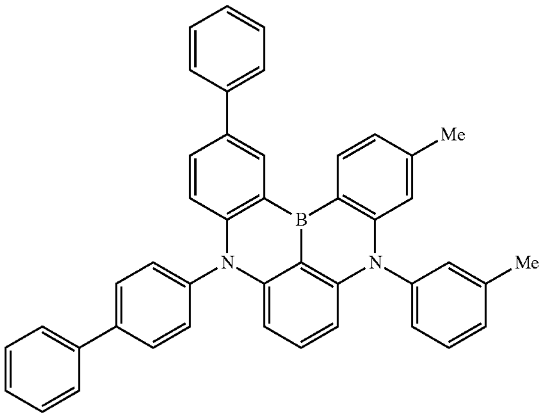
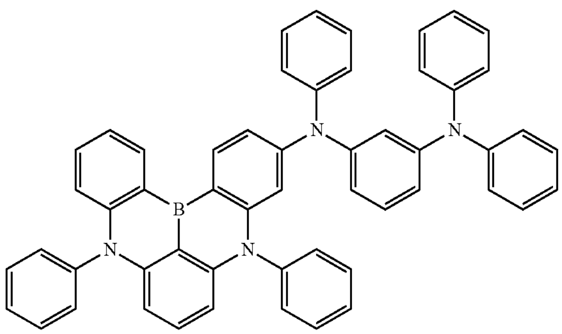
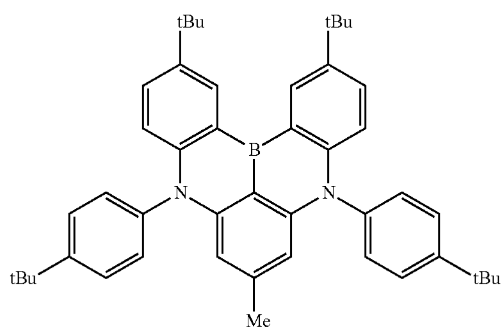
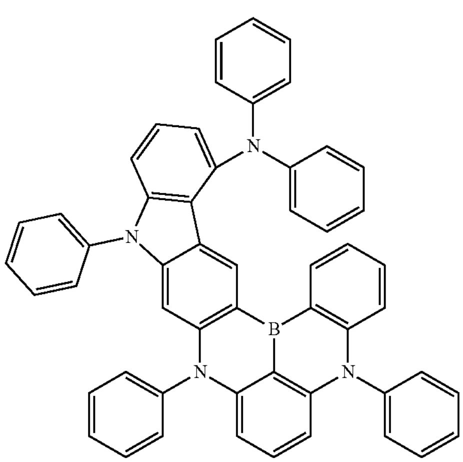
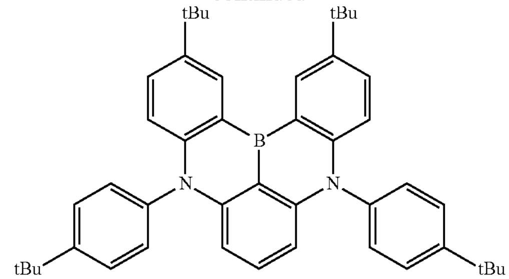
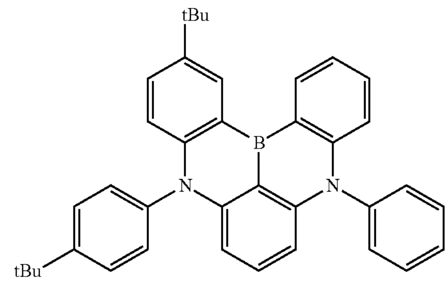
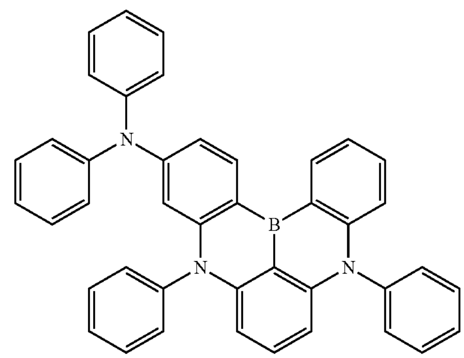
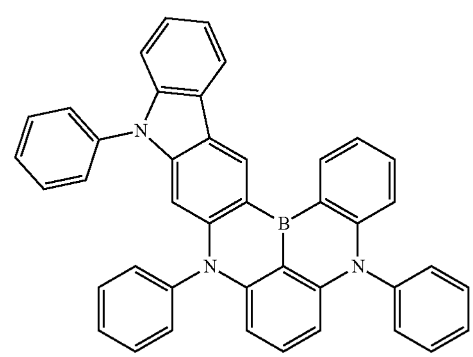
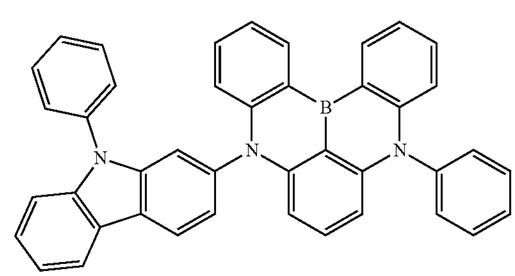

-continued
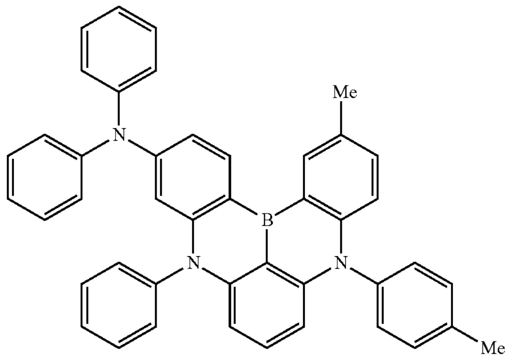
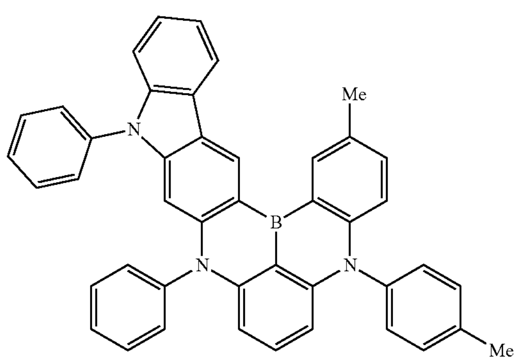
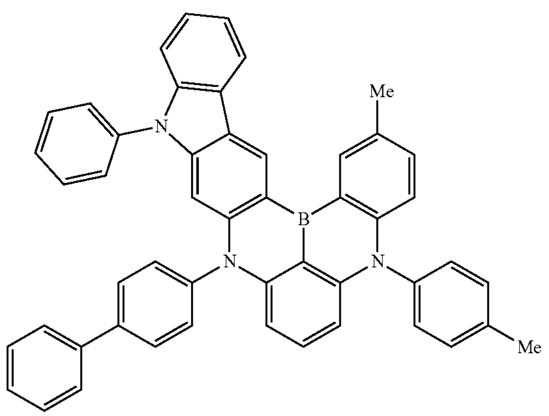
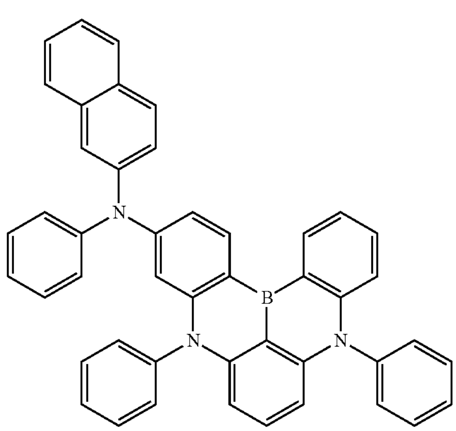
-continued
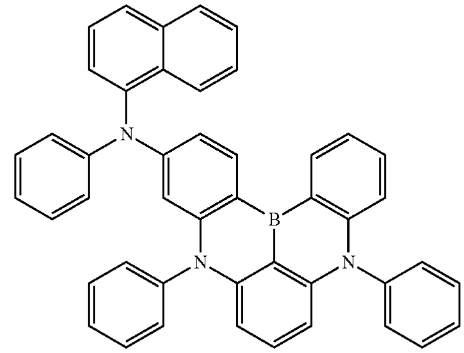
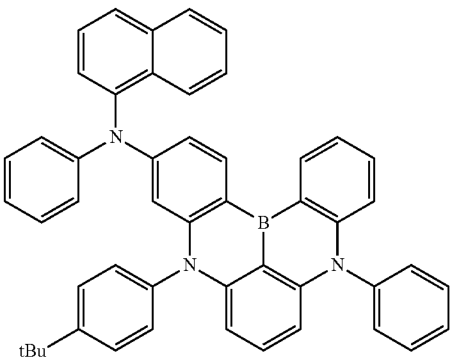
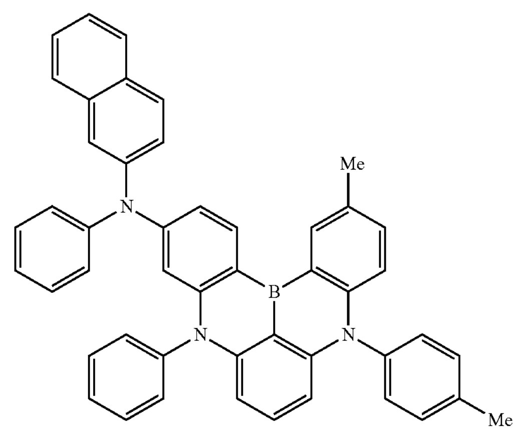
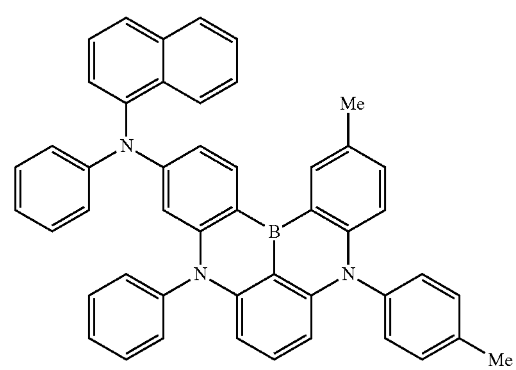

-continued
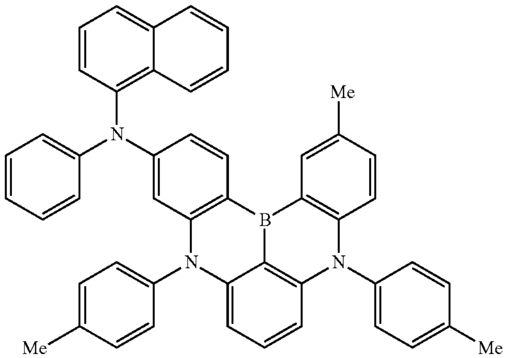
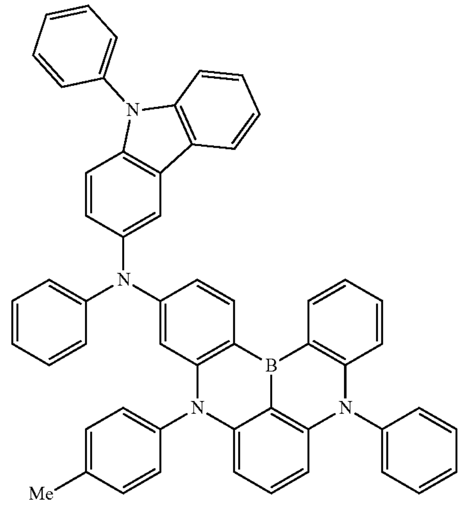
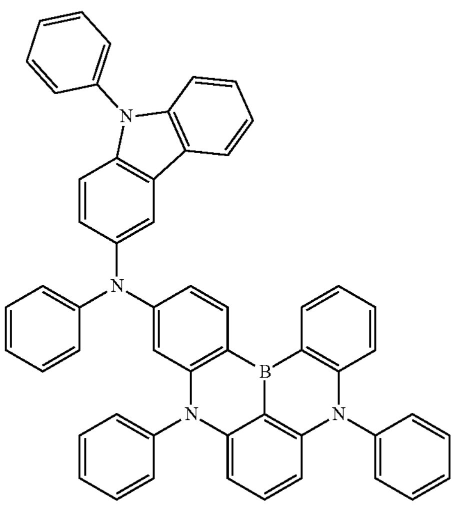
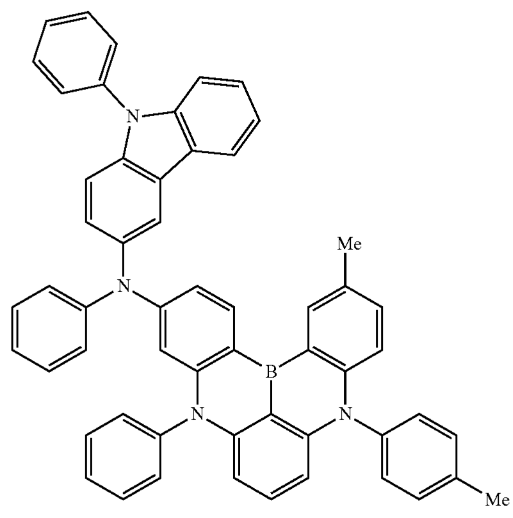
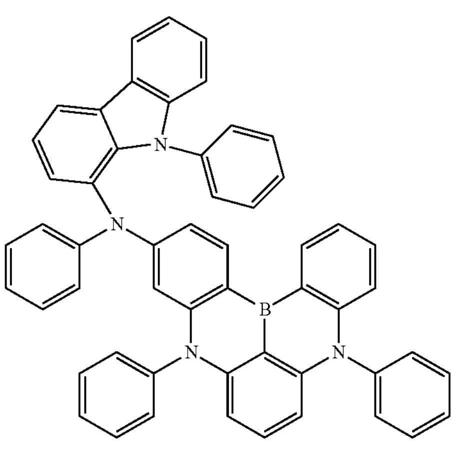
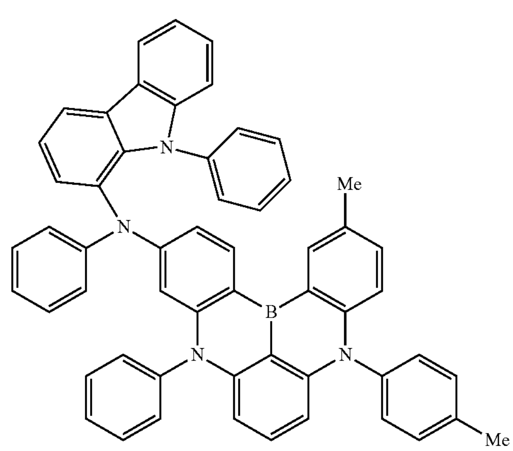

-continued
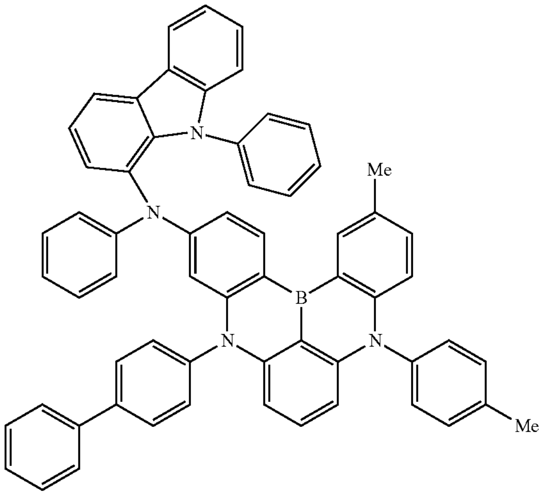
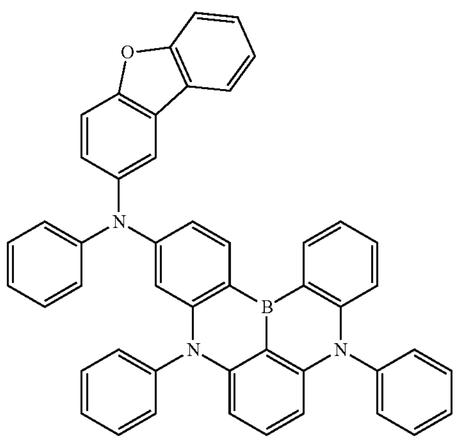
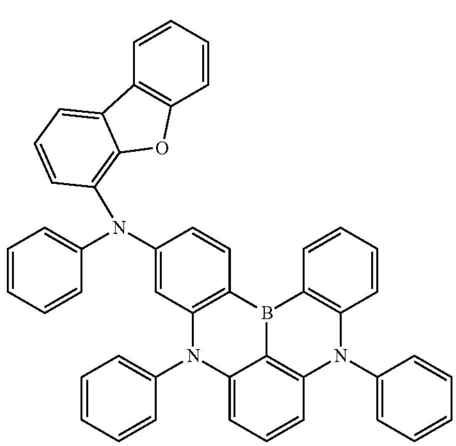
-continued
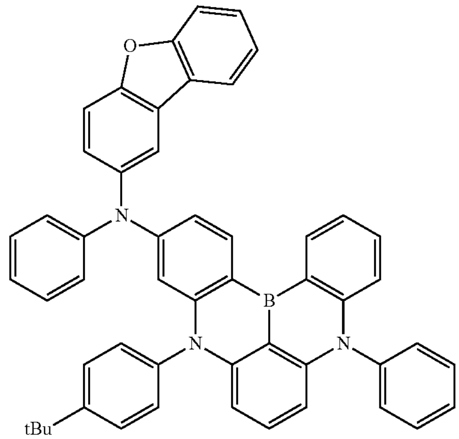
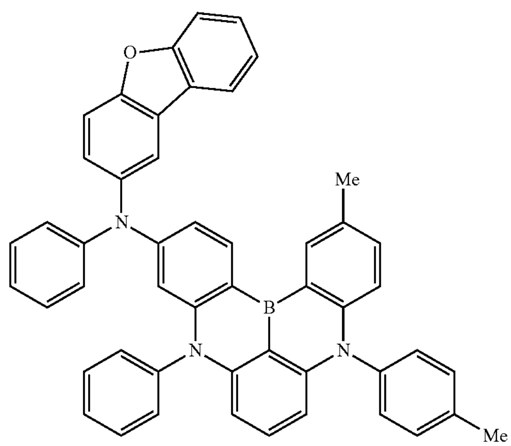
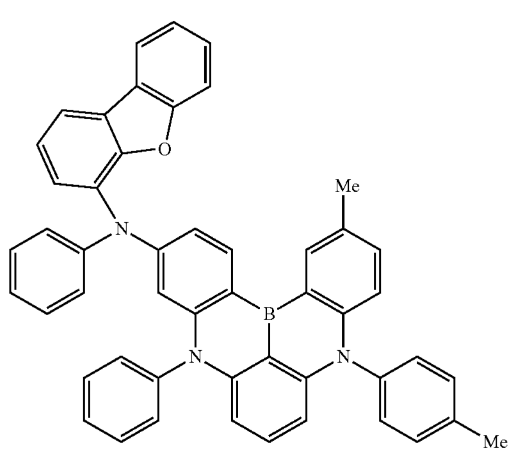

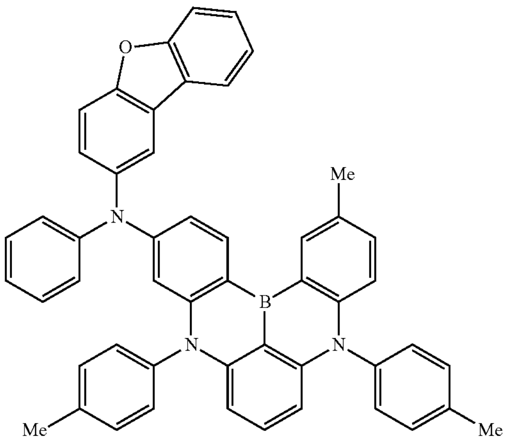
O
N
B
N
N
Me
Me
Me
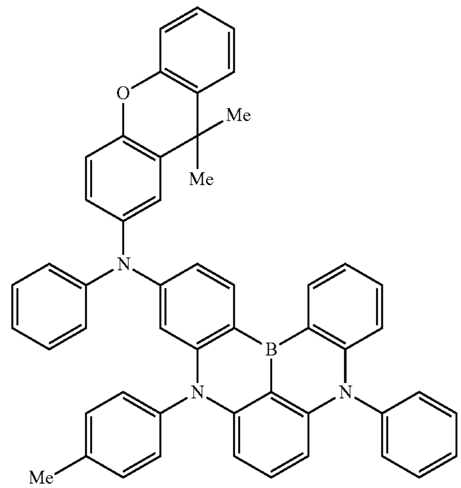
O
Me
Me
N
B
N
N
Me
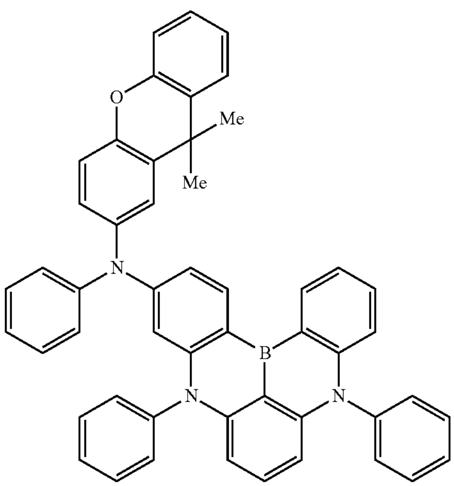
O
Me
Me
N
B
N
N
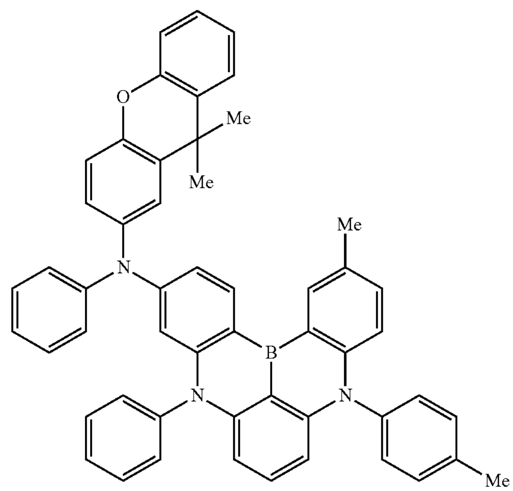
O
Me
Me
Me
N
B
N
N
Me
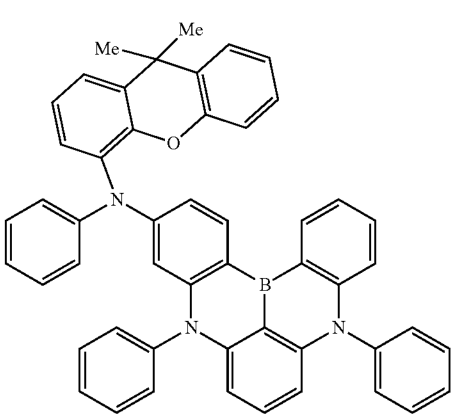
Me
Me
O
N
B
N
N
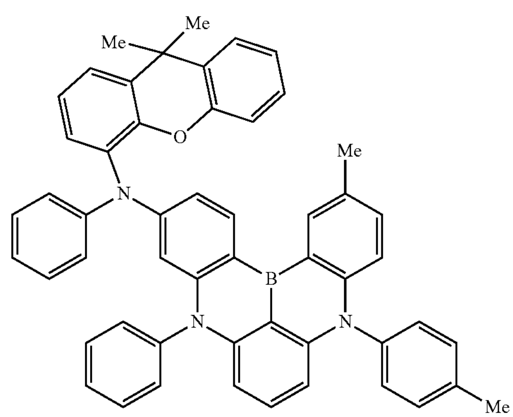
Me
Me
O
Me
N
B
N
N
Me -continued
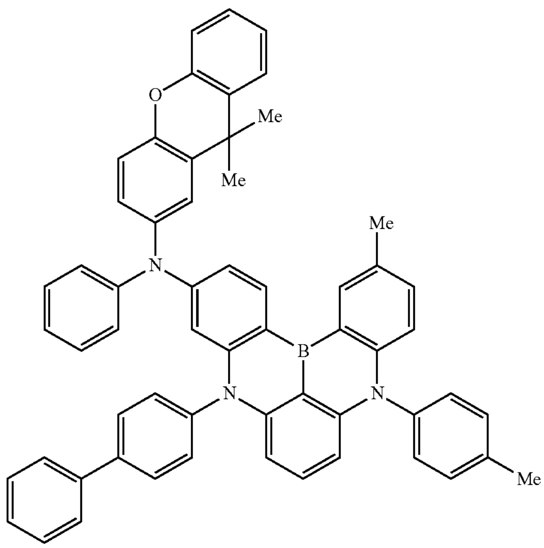
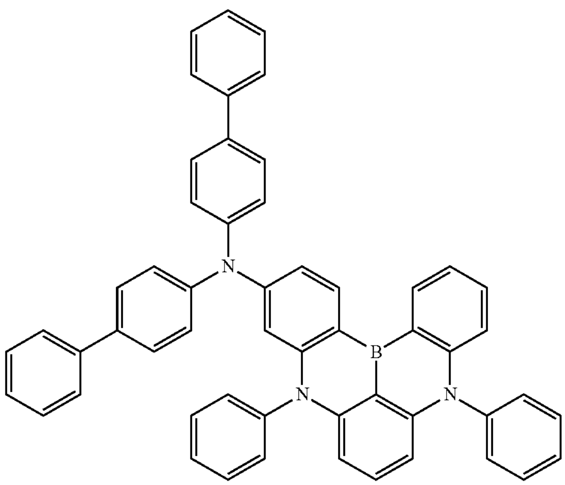
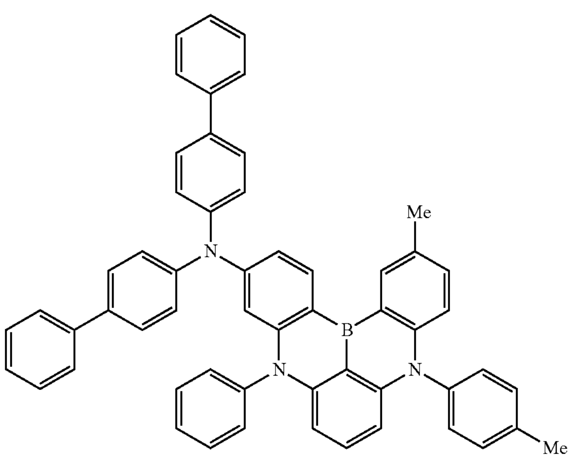
-continued
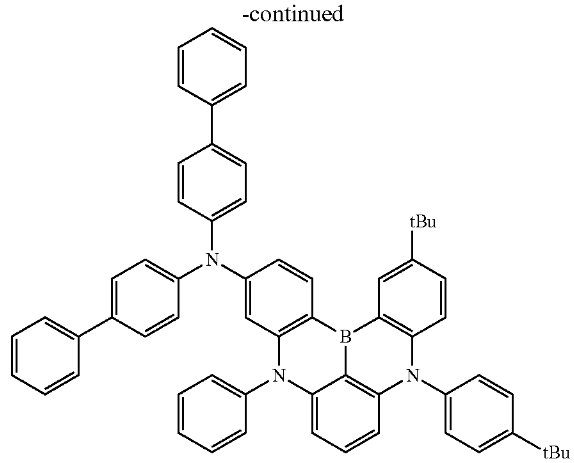
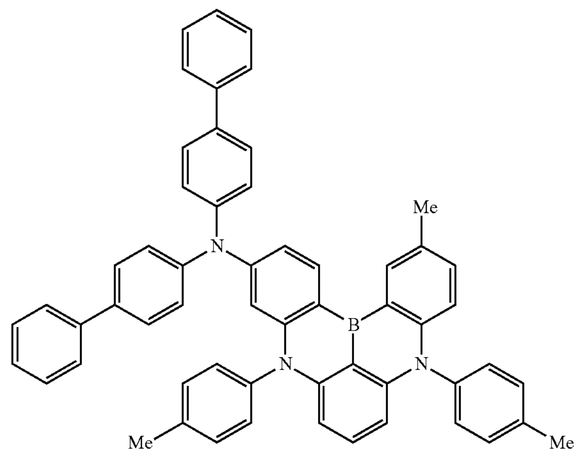
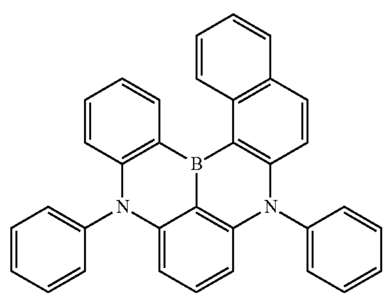
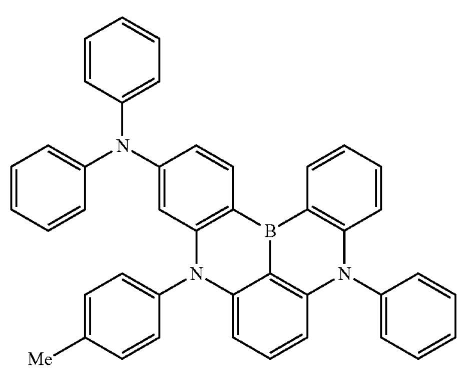

-continued
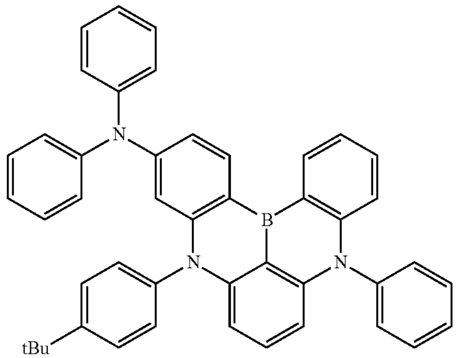
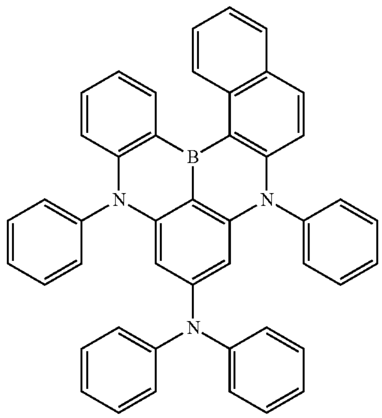
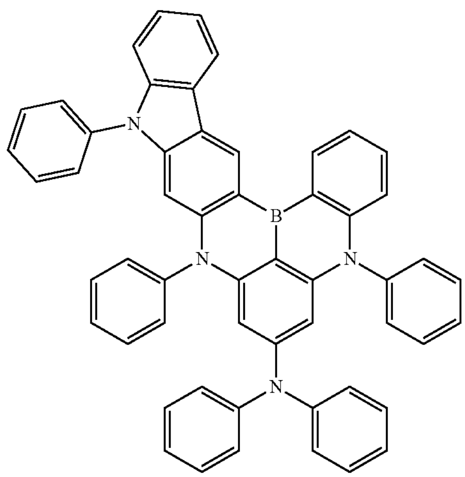
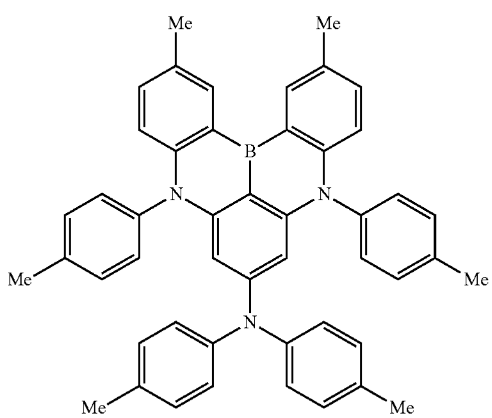
-continued
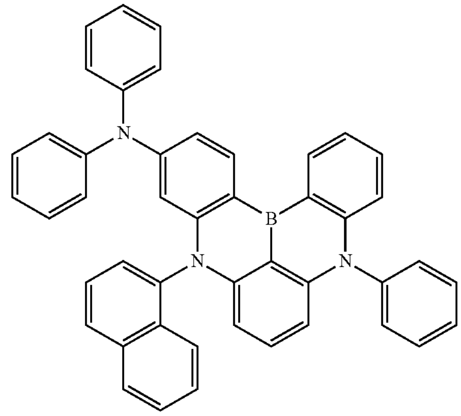
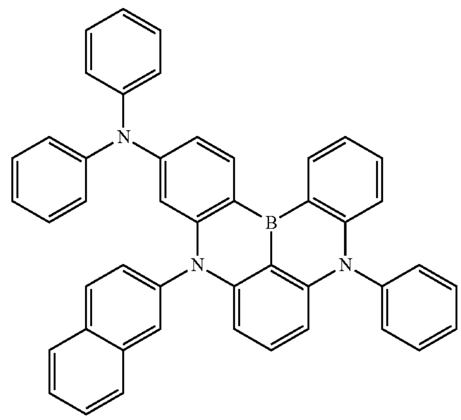
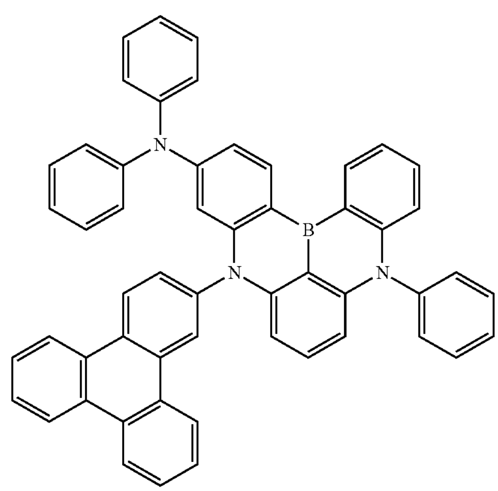

-continued
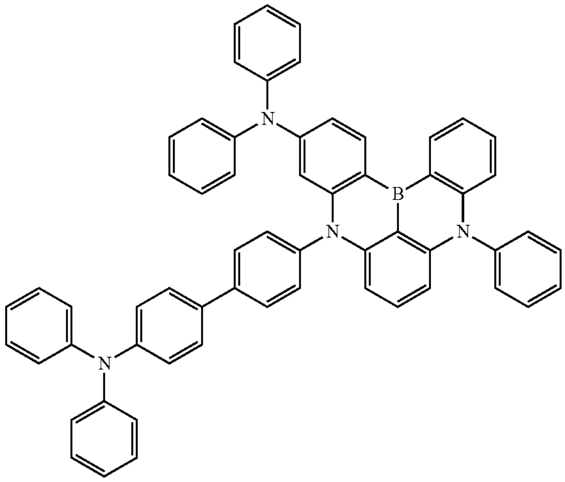
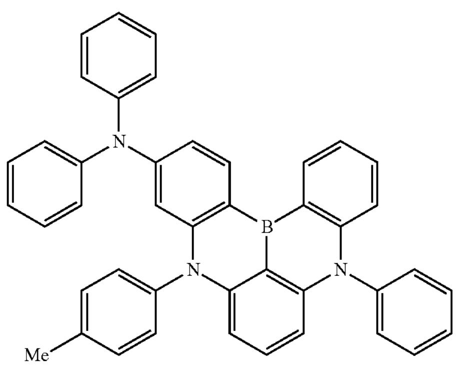
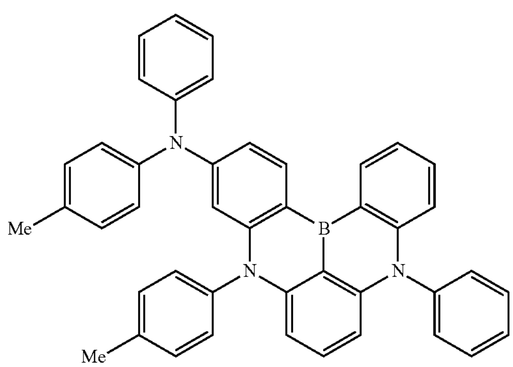
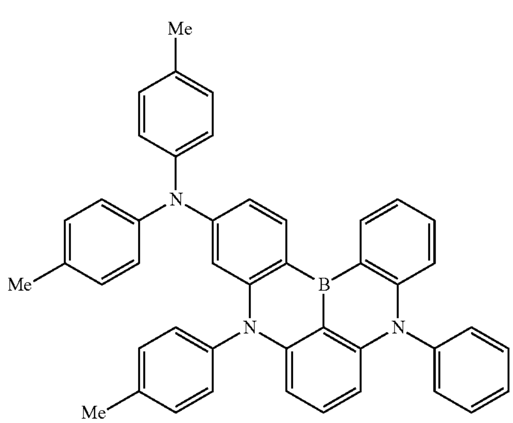
-continued
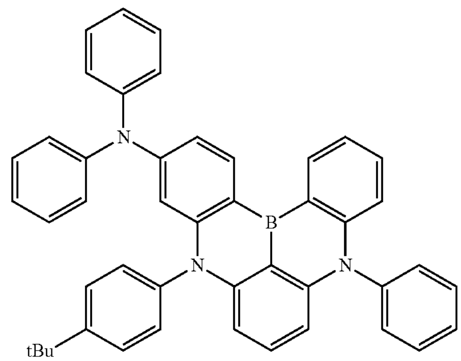
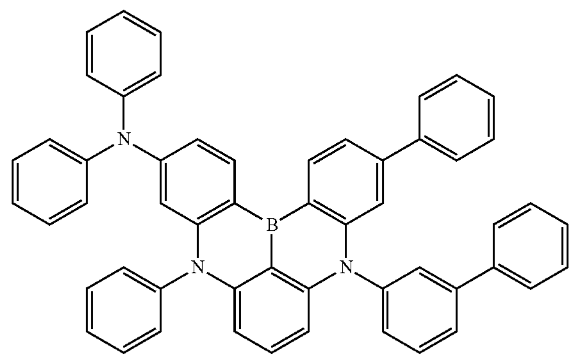
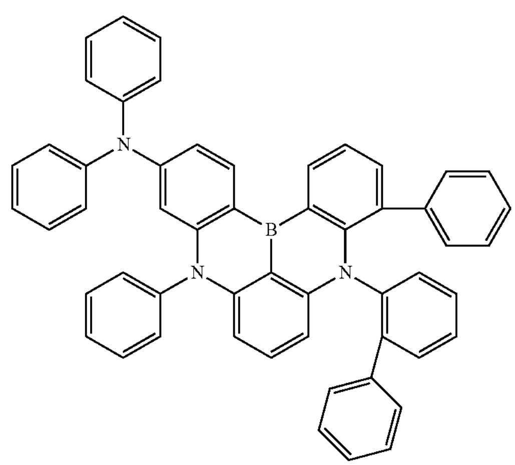
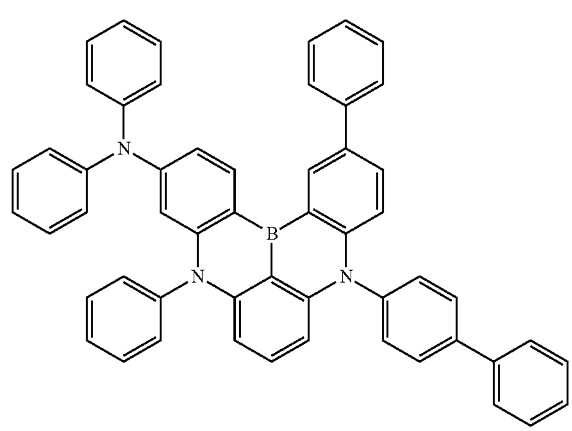

-continued
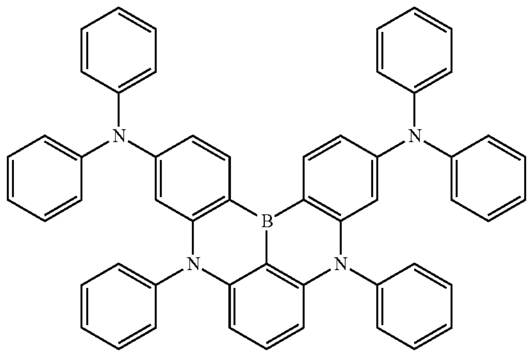
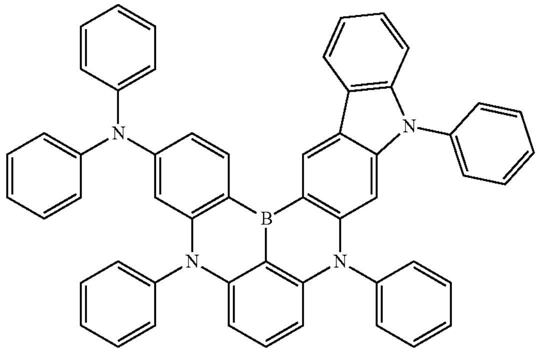
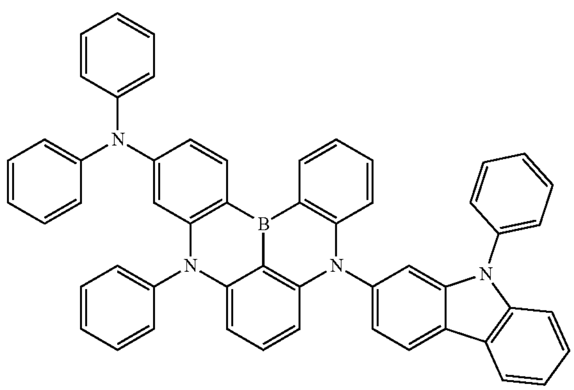
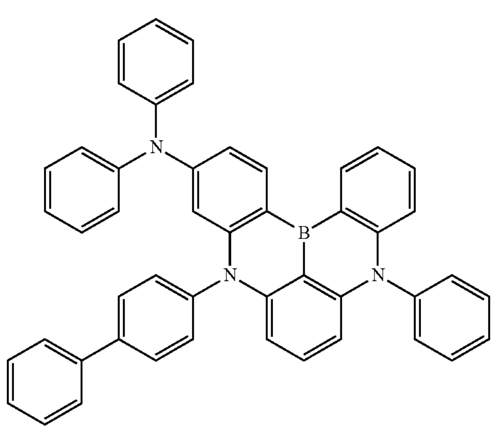
-continued
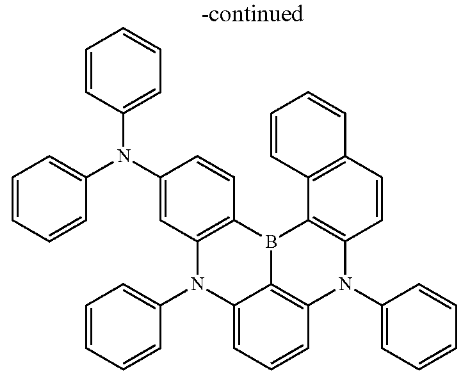
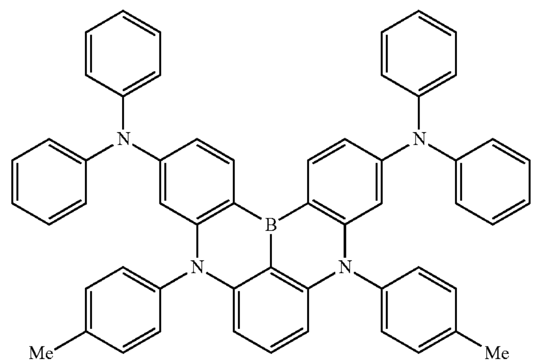
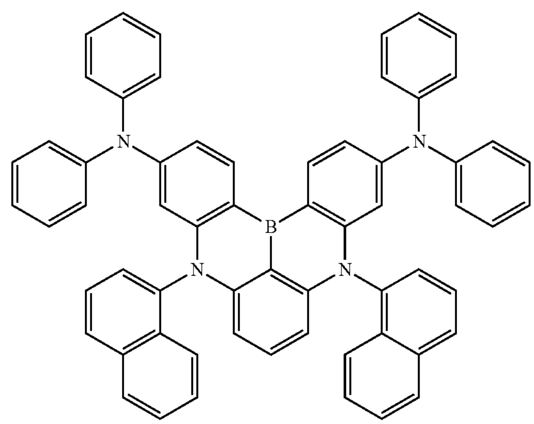
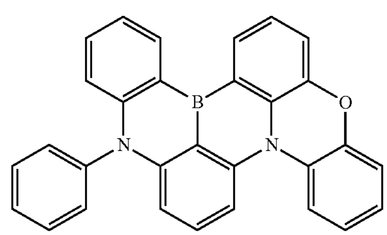
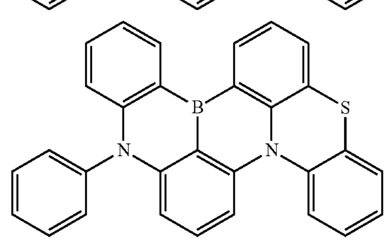

-continued
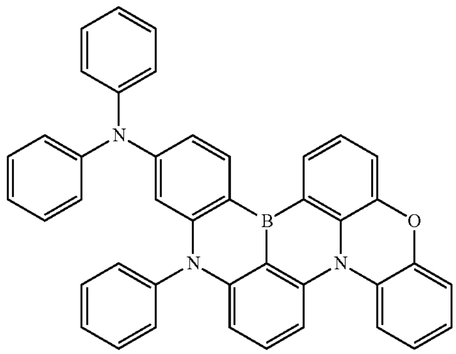
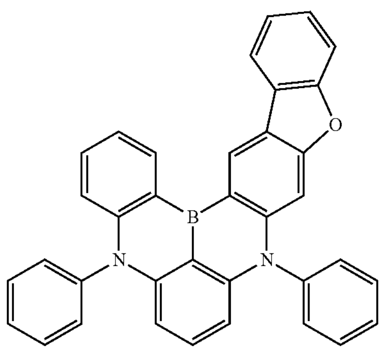
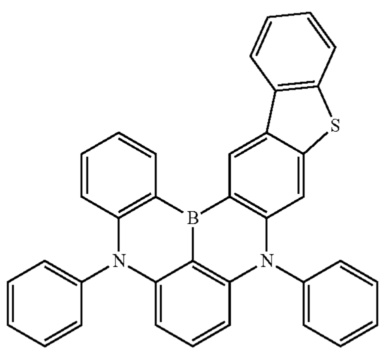
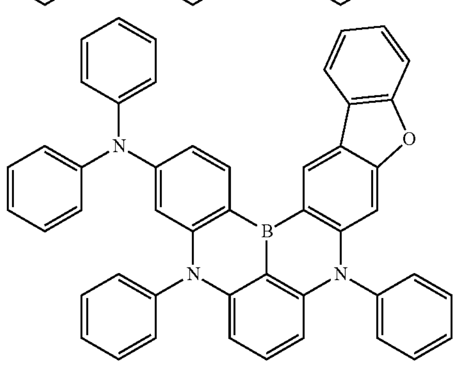
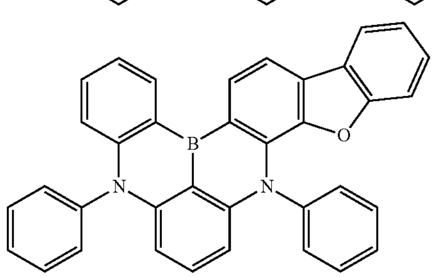
-continued
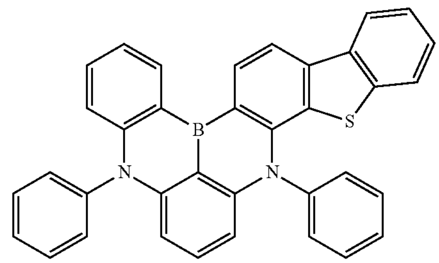
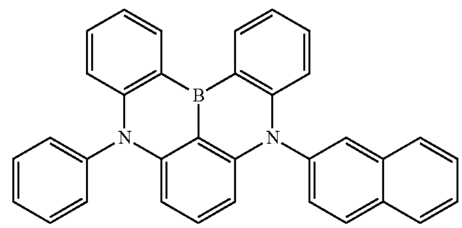
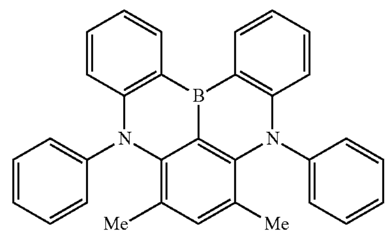
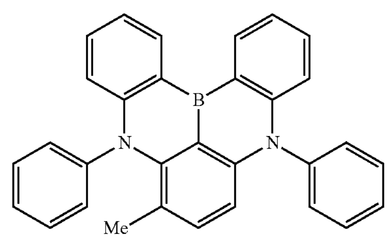
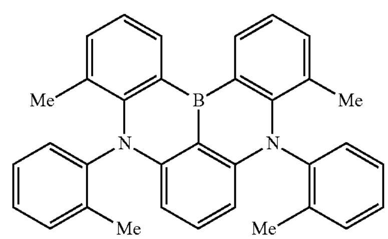
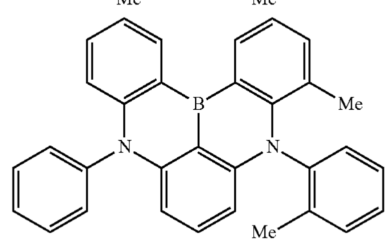
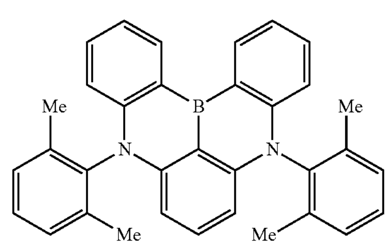

-continued

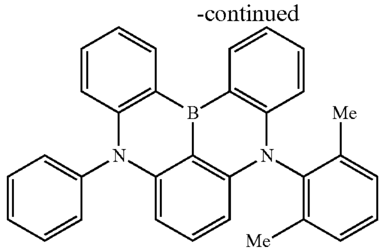

Compound Represented by Formula (51)

The compound represented by the formula (51) will be described below.

(51)

p-q-r-s-t (52)

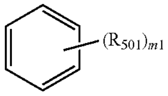

(53)

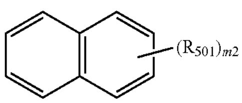

(54)

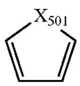

(55)

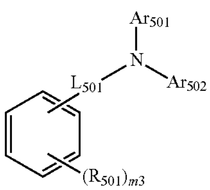

(56)

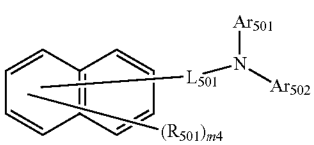

In the formula (51): r ring is a ring represented by the formula (52) or the formula (53), the r ring being fused at any position of respective adjacent rings;

q ring and s ring are each independently a ring represented by the formula (54) and fused at any position of respective adjacent rings;

p ring and t ring are each independently a ring represented by the formula (55) or the formula (56) and fused at any position of respective adjacent rings;

m1 in the formula (52) is 2;

m2 in the formula (53) is 4;

m3 in the formula (55) is 3;

m4 in the formula (56) is 5;

when a plurality of $R_{501}$ are present, the plurality of $R_{501}$ are mutually the same or different;

when a plurality of $R_{501}$ are present in the formula (52), the formula (53), the formula (55) or the formula (56), at least one combination of adjacent two or more of the plurality of $R_{501}$ are mutually bonded to form a substituted or unsubstituted monocyclic ring, mutually bonded to form a substituted or unsubstituted fused ring, or not mutually bonded;

$X_{501}$ in the formula (54) is an oxygen atom, a sulfur atom, or $NR_{502}$;

when a plurality of $X_{501}$ are present, the plurality of $X_{501}$ are mutually the same or different;

when a plurality of $R_{502}$ are present, the plurality of $R_{502}$ are mutually the same or different;

$R_{501}$ not forming the substituted or unsubstituted monocyclic ring and not forming the substituted or unsubstituted fused ring and $R_{502}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (52) to (54) respectively represent the same as $R_{901}$ to $R_{907}$ of the formula (21);

in the formulae (55) and (56):

$Ar_{501}$ and $Ar_{502}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; and when a plurality of $Ar_{501}$ are present, the plurality of $Ar_{501}$ are mutually the same or different;

when a plurality of Arson are present, the plurality of Arson are mutually the same or different;

$L_{501}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms; and when a plurality of $L_{501}$ are present, the plurality of $L_{501}$ are mutually the same or different.

In the formula (51), each of the p ring, q ring, r ring, s ring, and t ring is fused at an adjacent ring(s) sharing two carbon atoms. The fused position and orientation are not limited but may be defined as required.

In some embodiments, $R_{501}$ in the formula (52) or the formula (53) for the r ring is a hydrogen atom.

In some embodiments, the compound represented by the formula (51) is represented by any one of formulae (51-1) to (51-6) below.

-continued
(51-1)
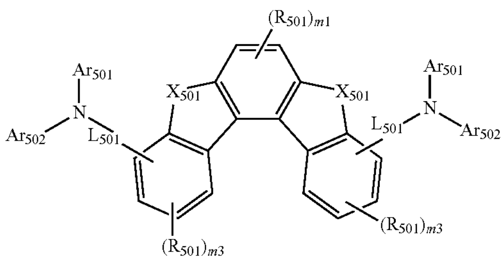
(51-2)
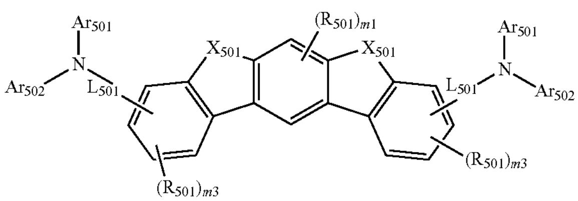
(51-3)
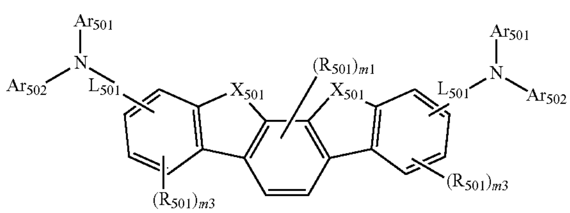
(51-4)
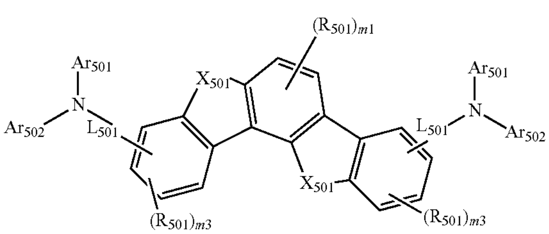
(51-5)
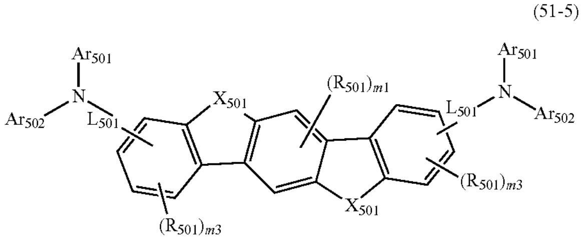
(51-6)
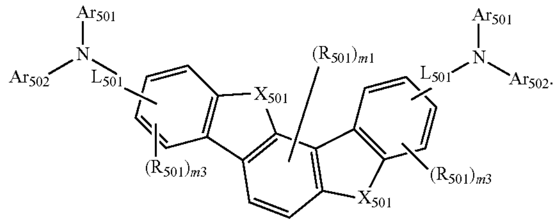
In the formulae (51-1) to (51-6), $R_{501}$, $X_{501}$, $Ar_{501}$, $Ar_{502}$, $L_{501}$, m1, and m3 are as defined in the formula (51).
In some embodiments, the compound represented by the formula (51) is represented by any one of formulae (51-11) to (51-13) below.
(51-11)
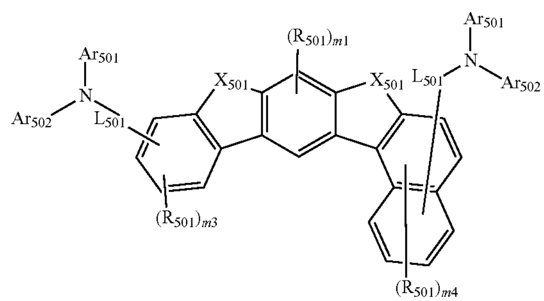
(51-12)
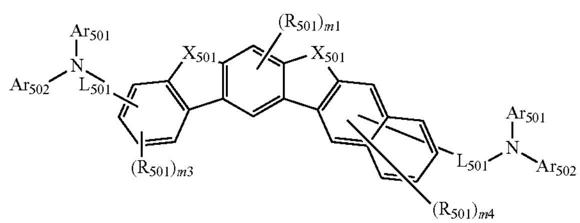
(51-13)
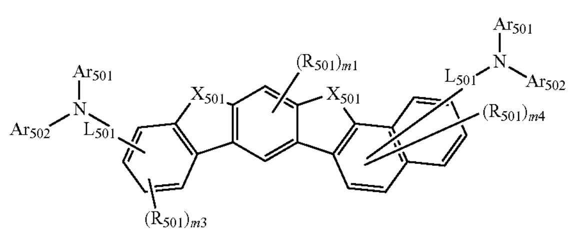
In the formulae (51-11) to (51-13), $R_{501}$, $X_{501}$, $Ar_{501}$, $Ar_{502}$, $L_{501}$, m1, m3, and m4 are as defined in the formula (51).

In some embodiments, the compound represented by the formula (51) is represented by any one of formulae (51-21) to (51-25) below.
(51-21)
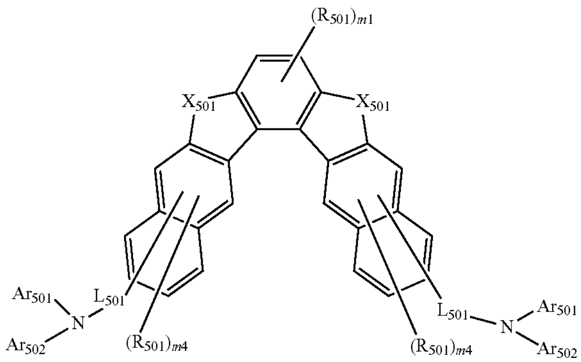
(51-22)
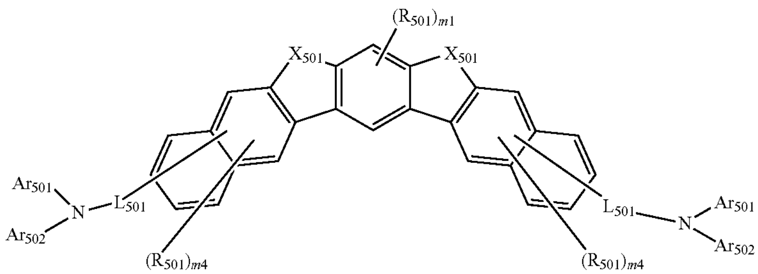
(51-23)
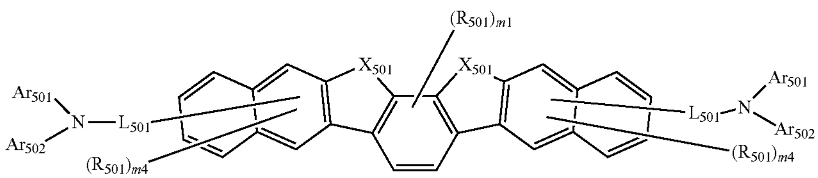
(51-24)
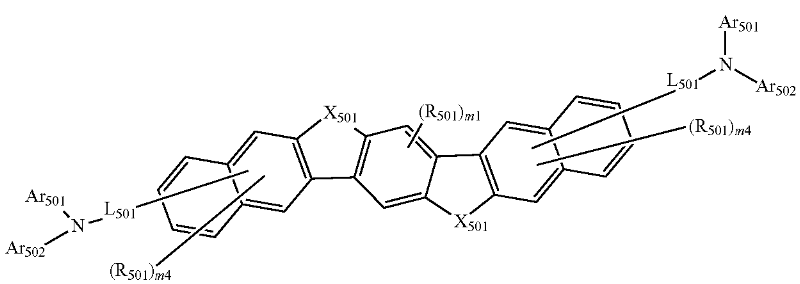
(51-25)
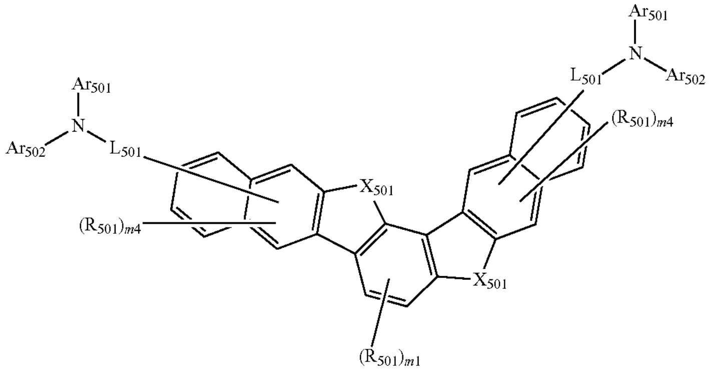

In the formulae (51-21) to (51-25), $R_{501}$, $X_{501}$, $Ar_{501}$, $Ar_{502}$, $L_{501}$, m1, and m4 are as defined in the formula (51).

In some embodiments, the compound represented by the formula (51) is represented by any one of formulae (51-31) to (51-33) below.

(51-31)

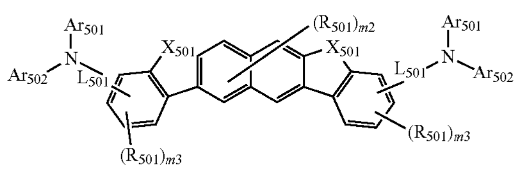

(51-32)

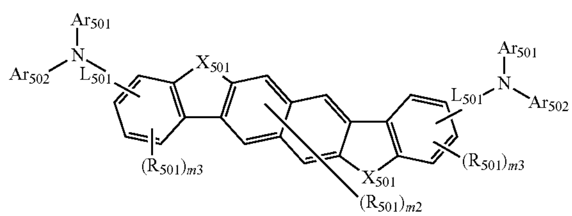

(51-33)

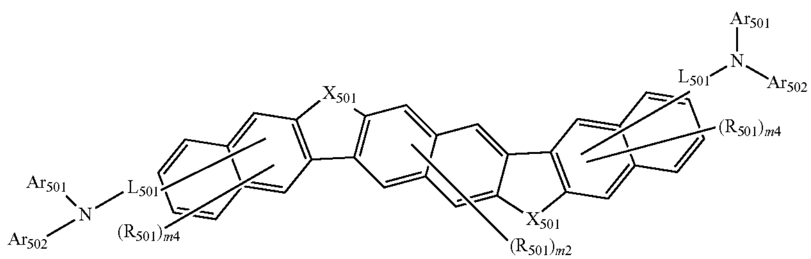

In the formulae (51-31) to (51-33), $R_{501}$, $X_{501}$, $Ar_{501}$, $Ar_{502}$, $L_{501}$, m2, m3, and m4 are as defined in the formula (51).

In some embodiments, $Ar_{501}$ and $Ar_{502}$ are each independently a substituted or unsubstituted aryl group having 6 to 50 ring carbon atoms.

In some embodiments, one of $Ar_{501}$ and $Ar_{502}$ is a substituted or unsubstituted aryl group having 6 to 50 ring carbon atoms, and the other of $Ar_{501}$ and $Ar_{502}$ is a substituted or unsubstituted monovalent heterocyclic group having 5 to 50 ring atoms.

Specific Examples of Compound Represented by Formula (51)

Specific examples of the compound represented by the formula (51) include compounds shown below. It should however be noted that the invention is not limited by the specific examples of the second compound.

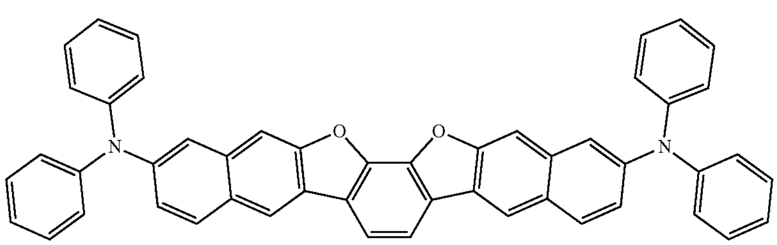

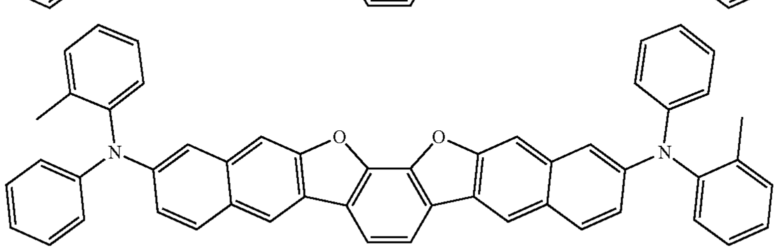

-continued
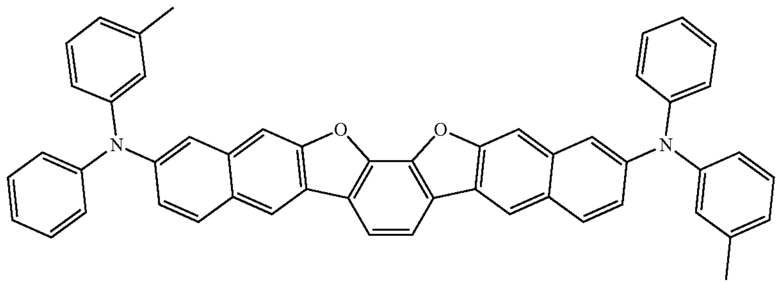
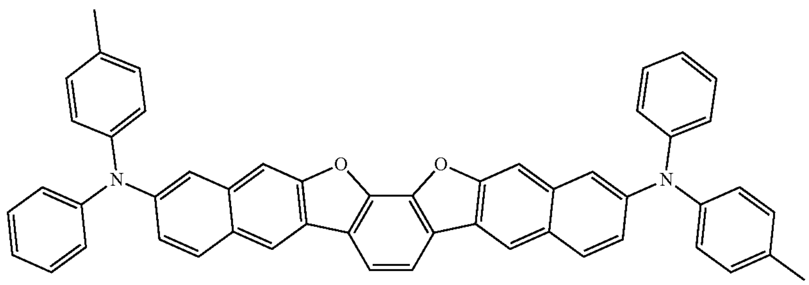
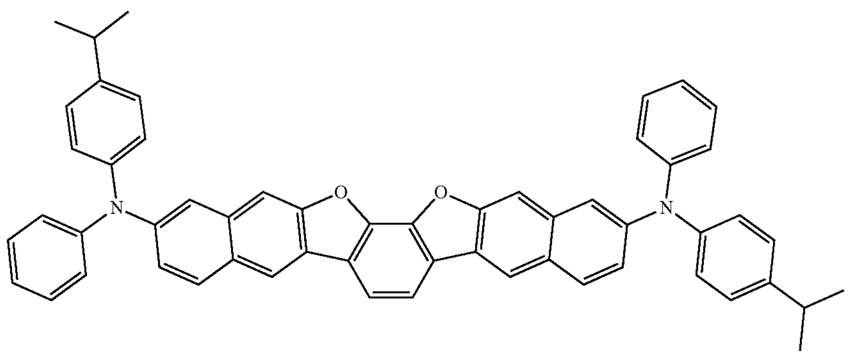
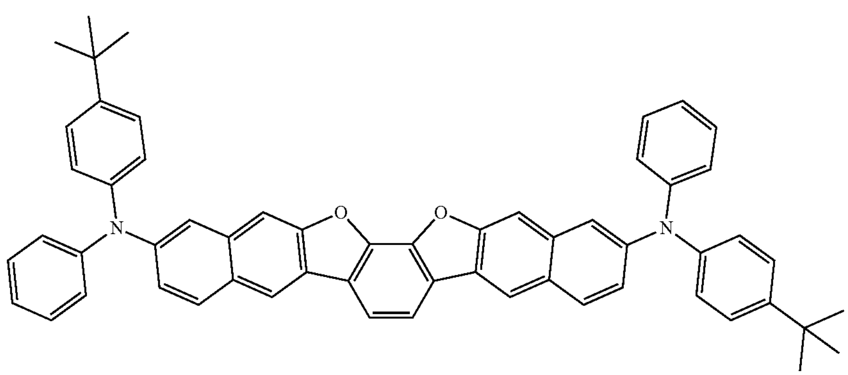
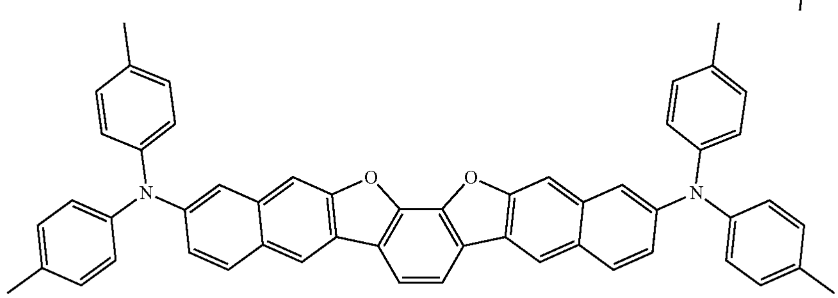

-continued
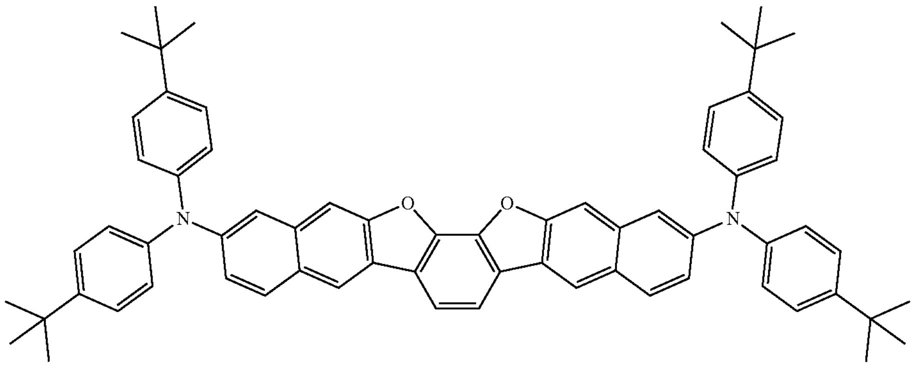
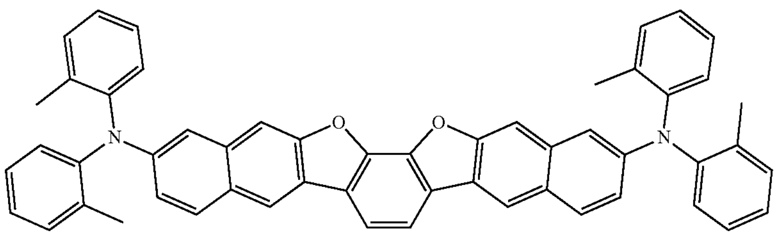
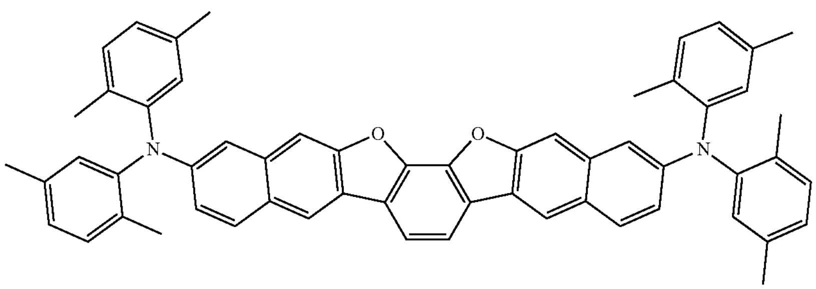
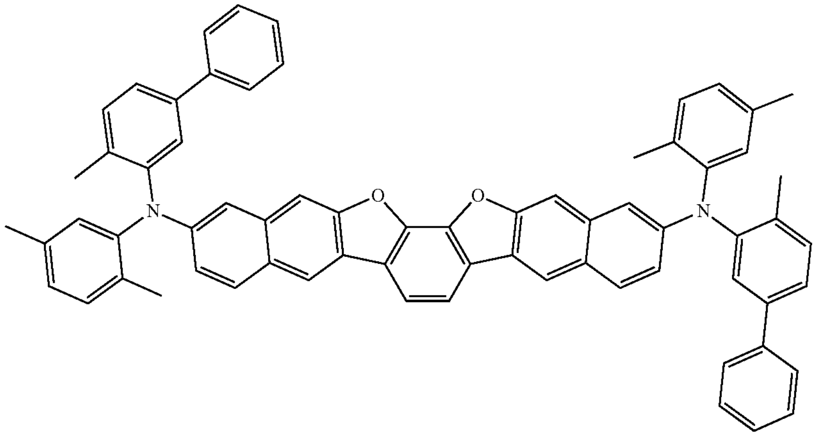

-continued
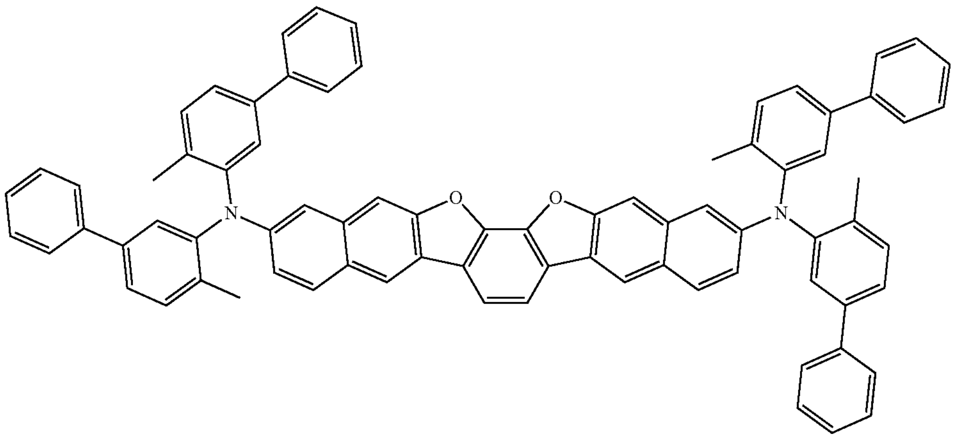
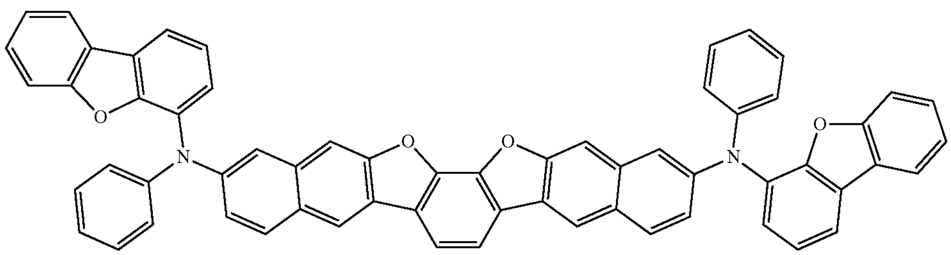
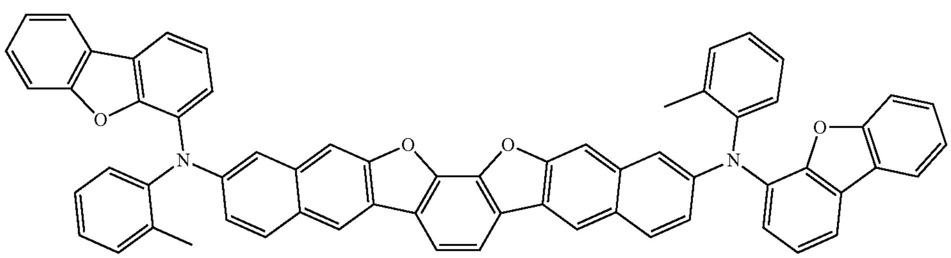
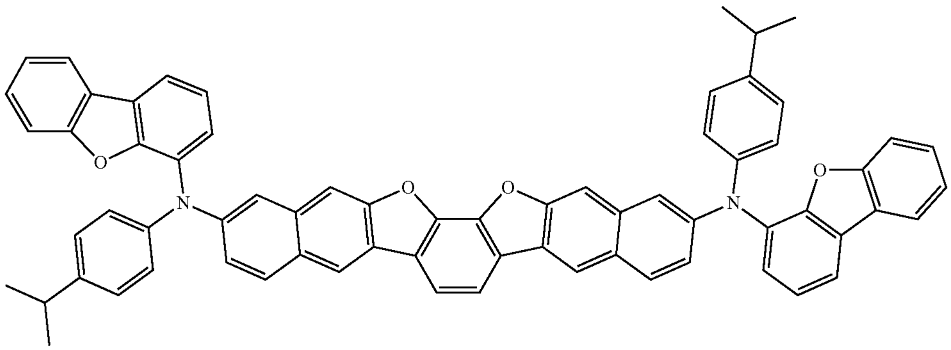
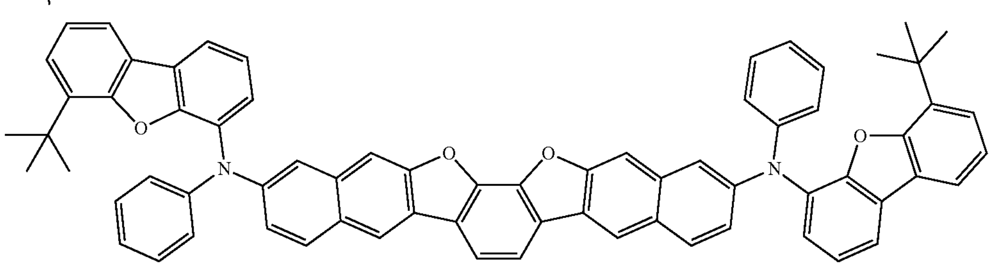

-continued
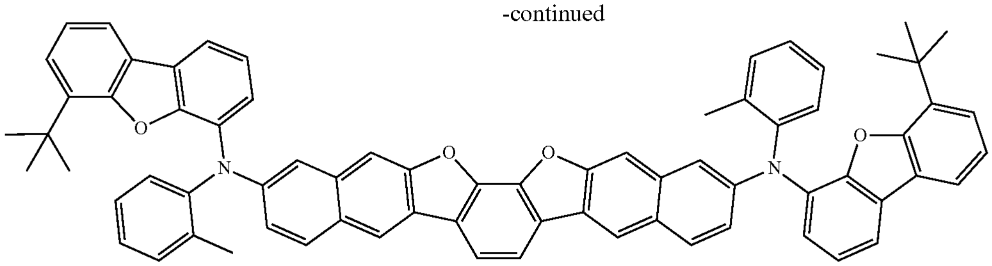
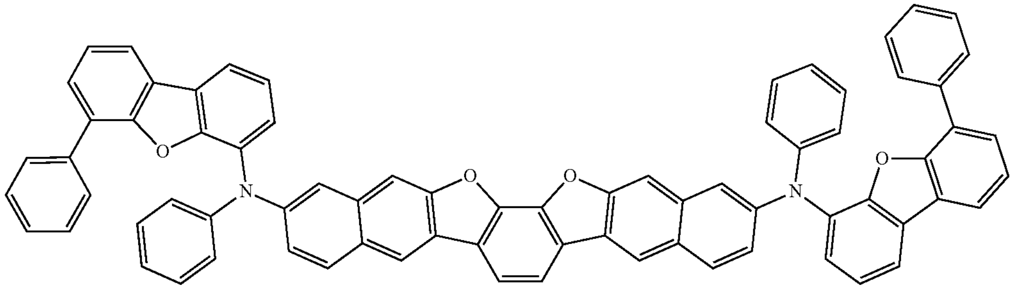
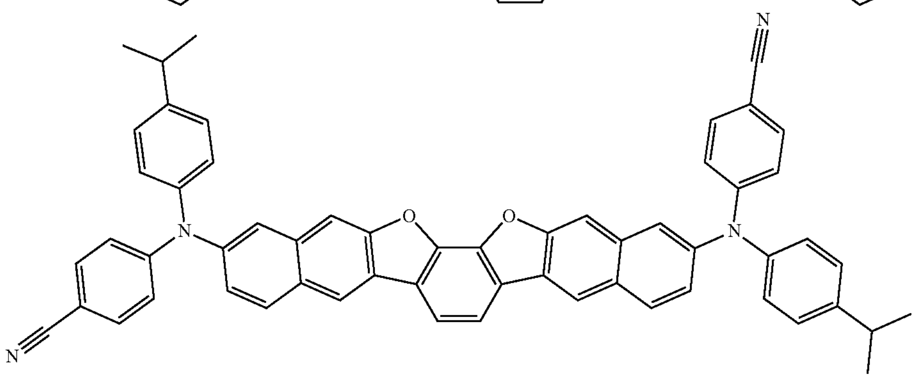
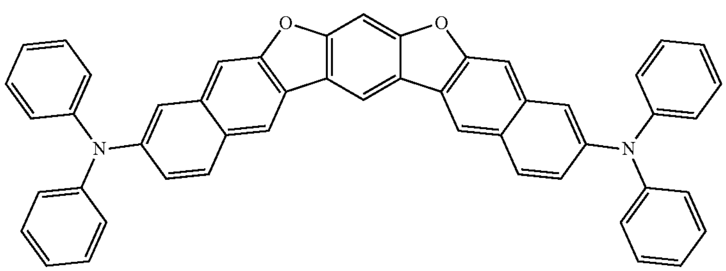
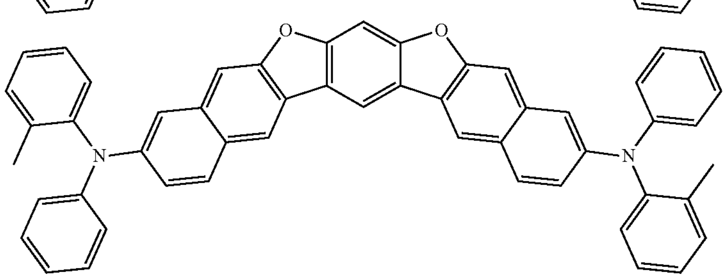
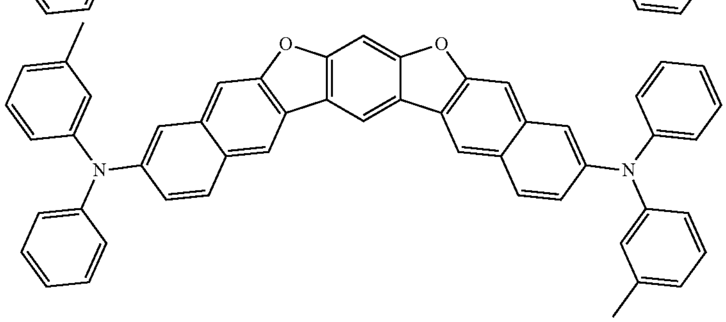

-continued
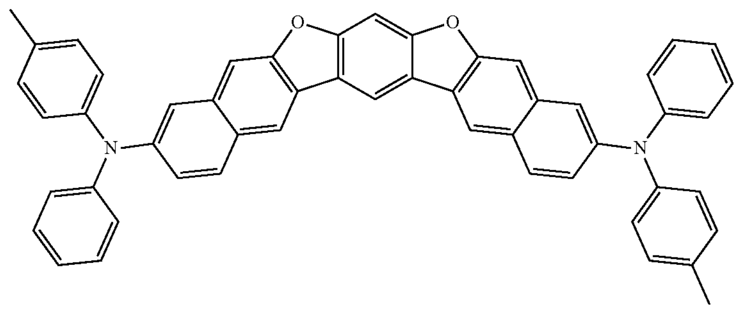
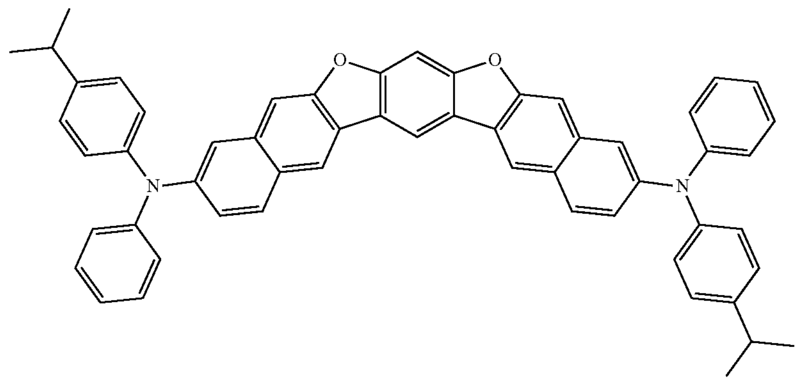
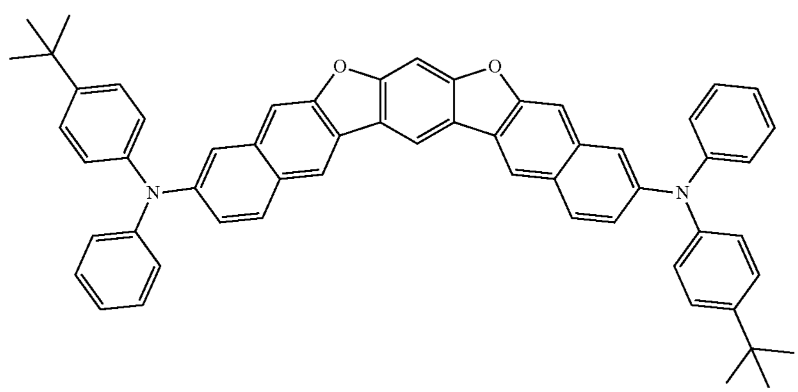
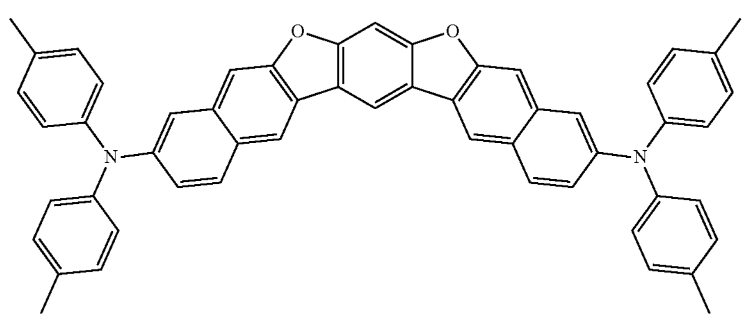

-continued
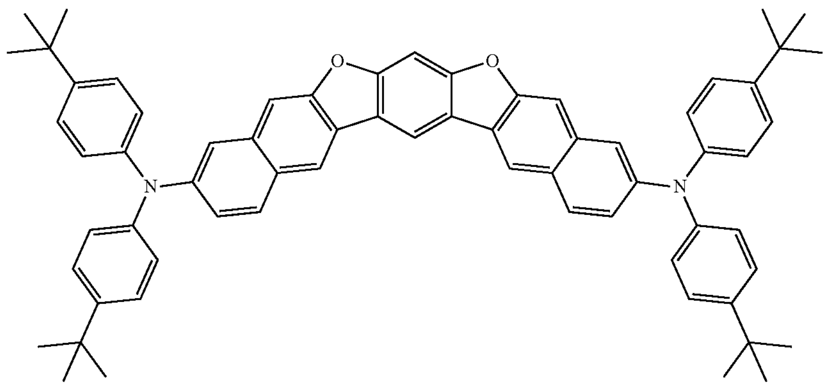
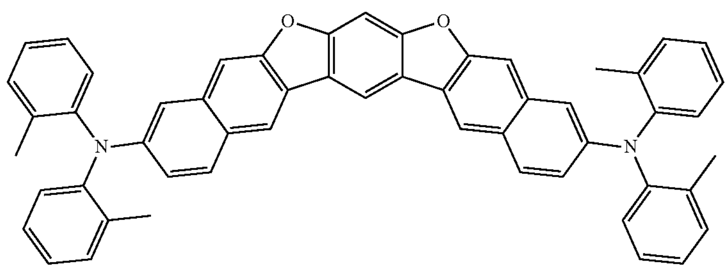
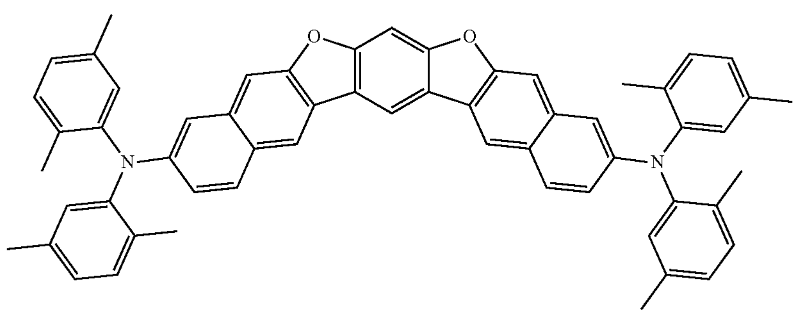
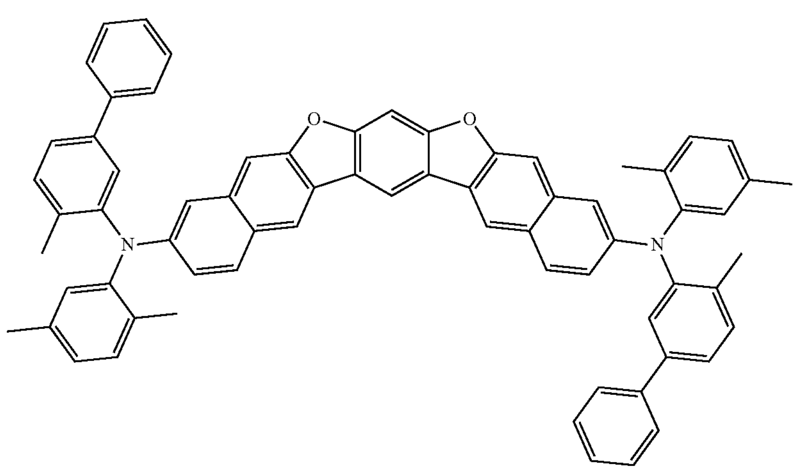

-continued
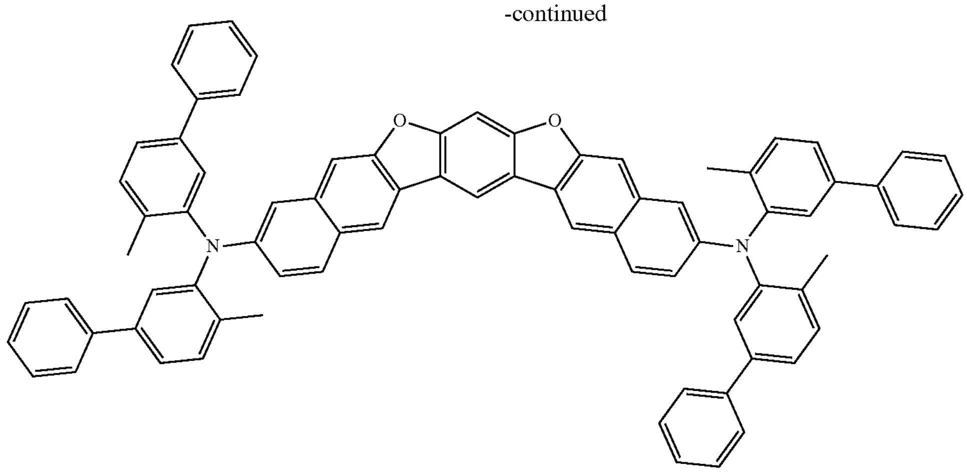
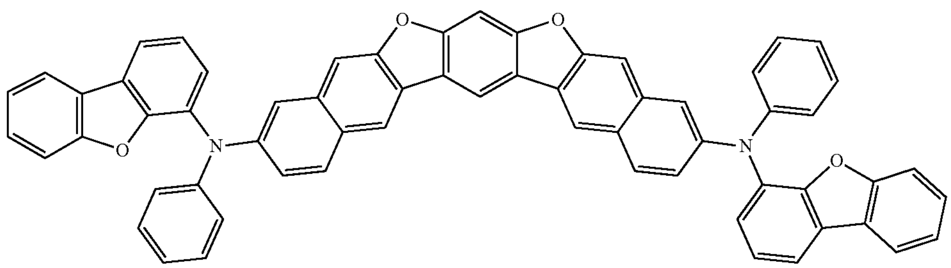
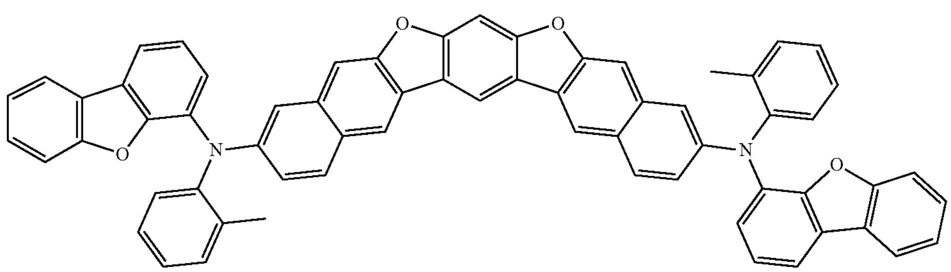
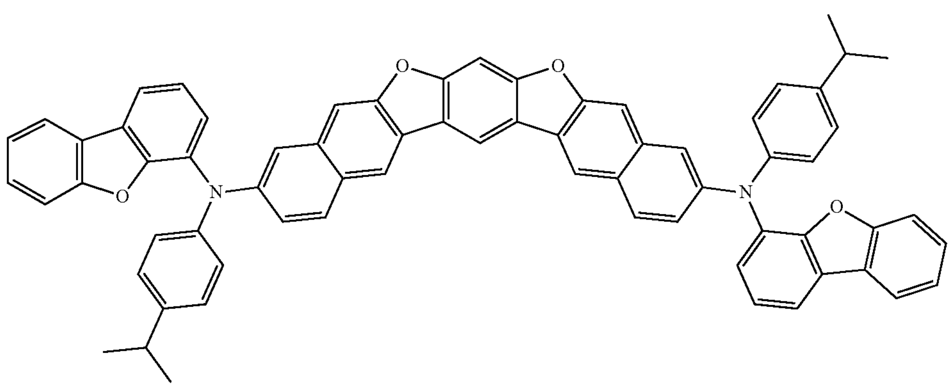
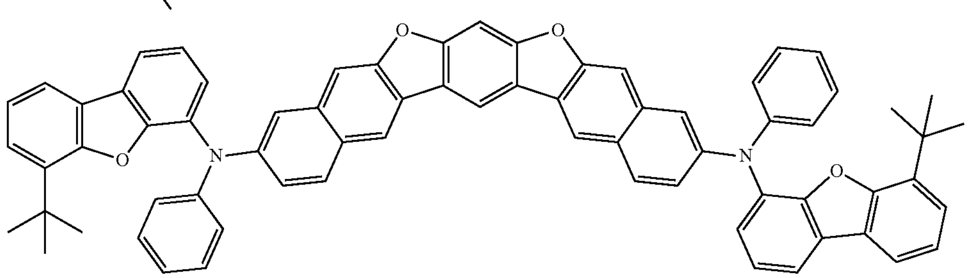

-continued
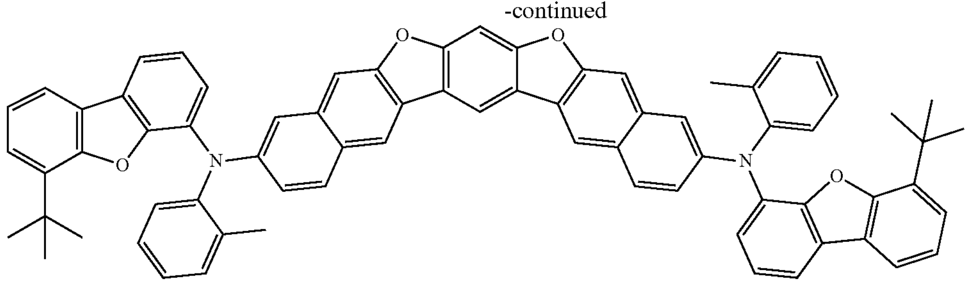
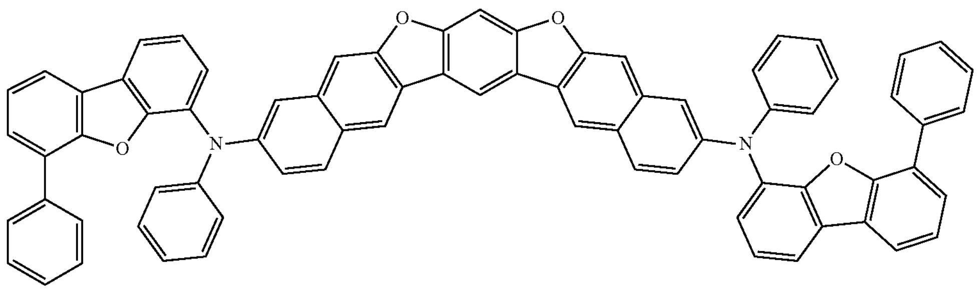
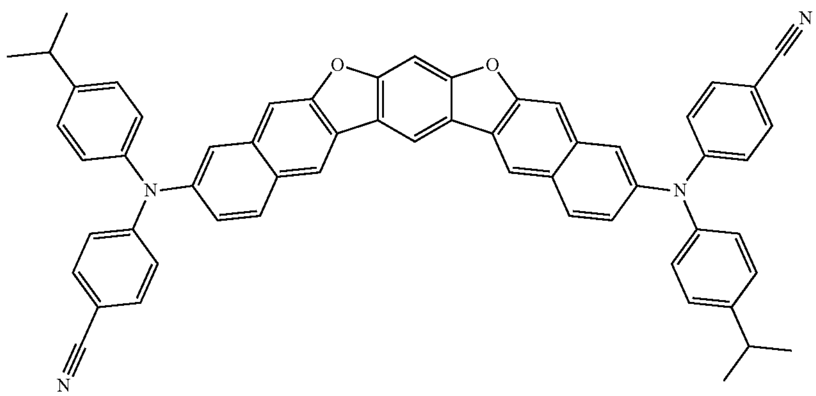
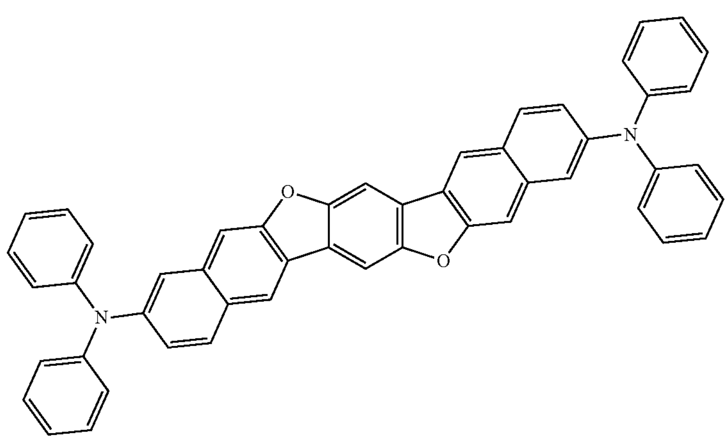

-continued
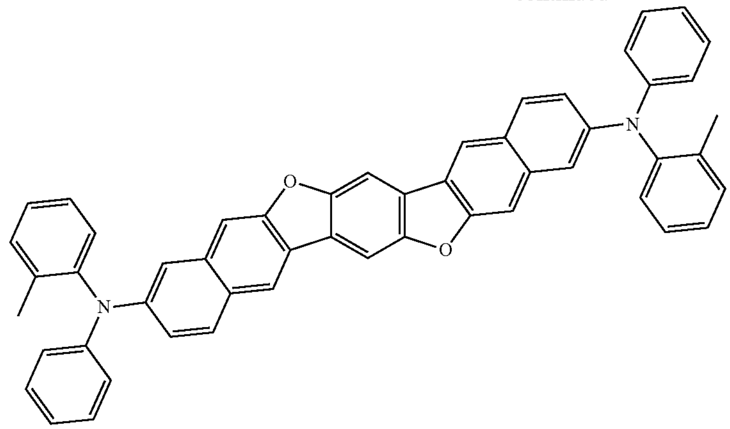
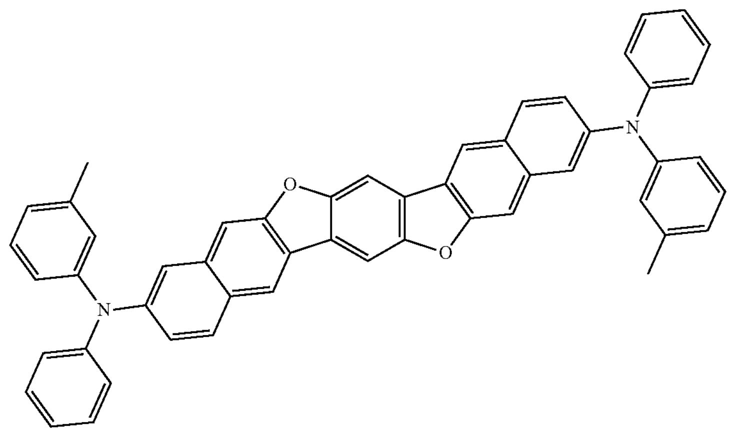
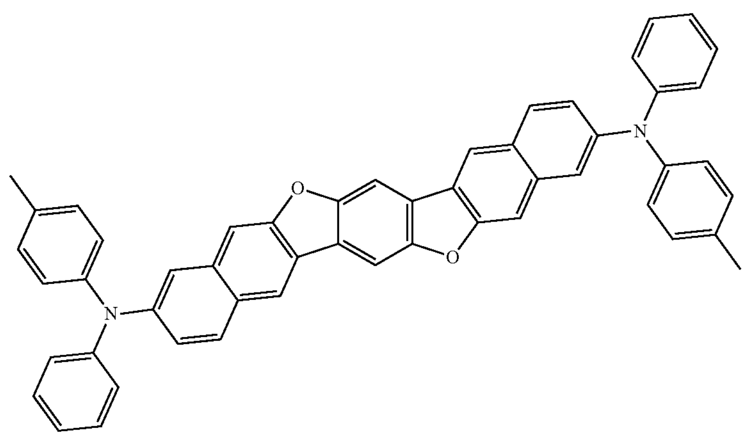
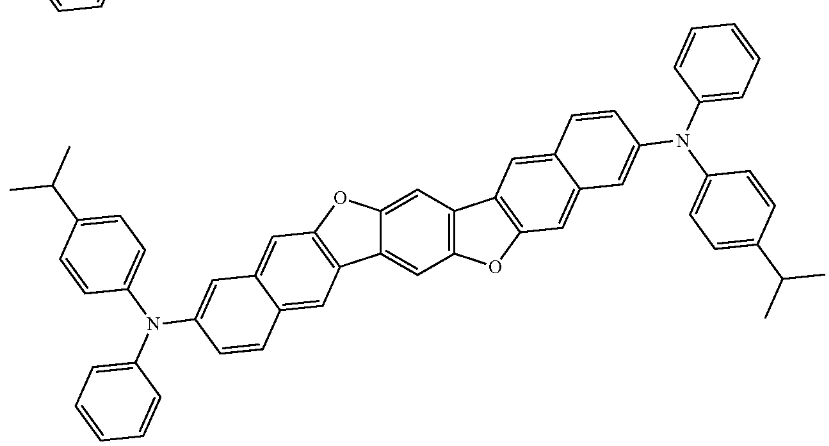

-continued
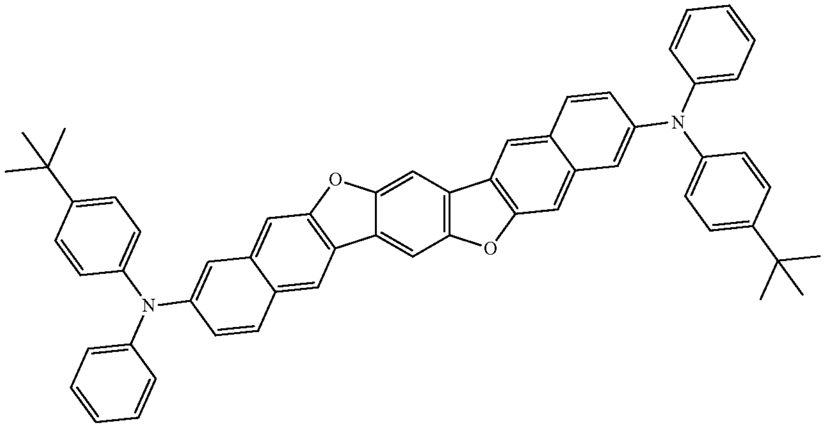
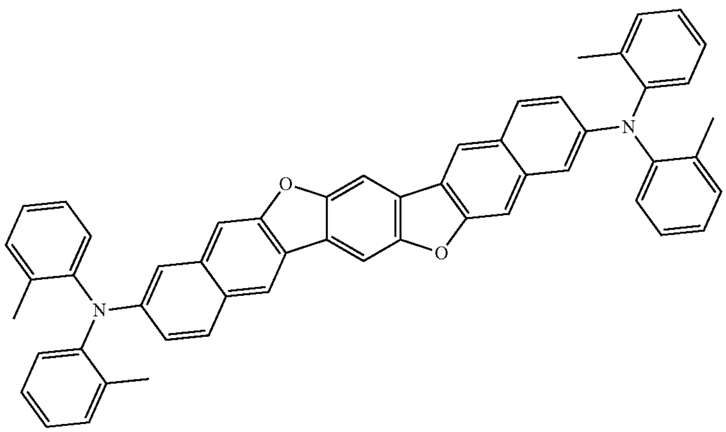
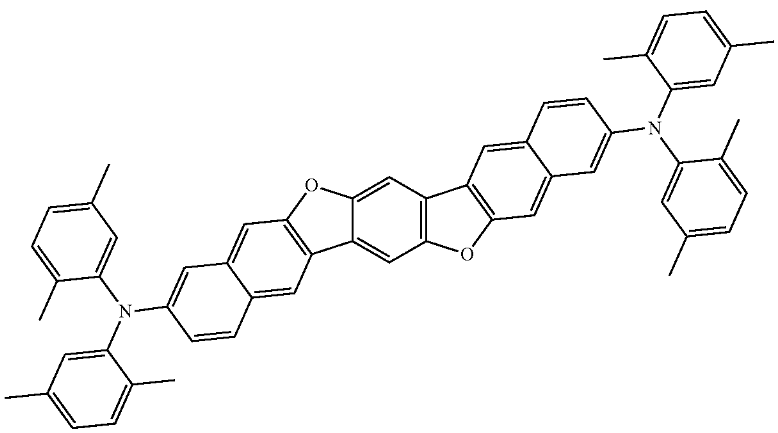
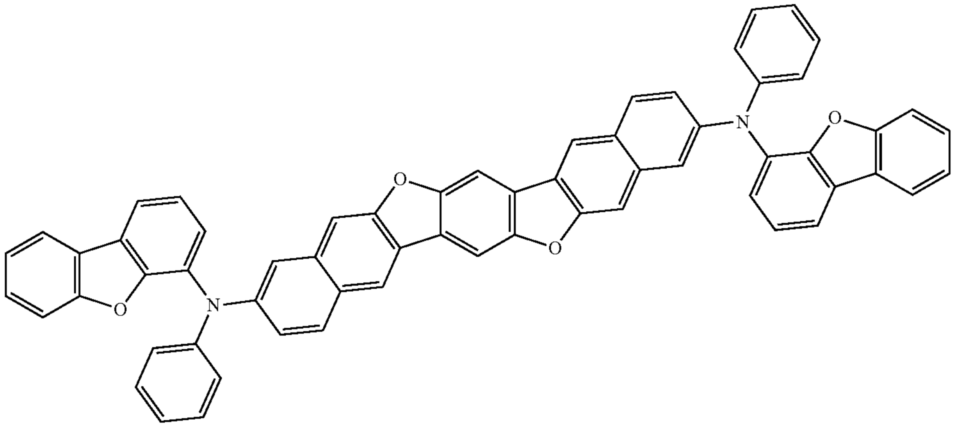

-continued
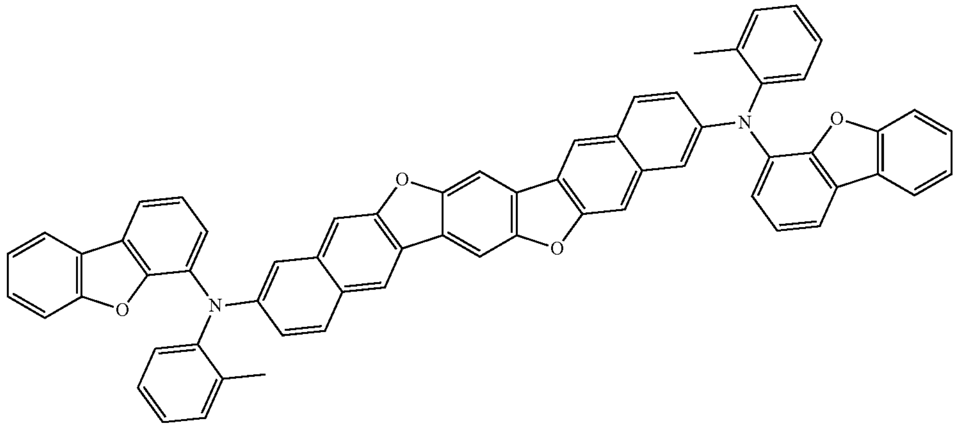
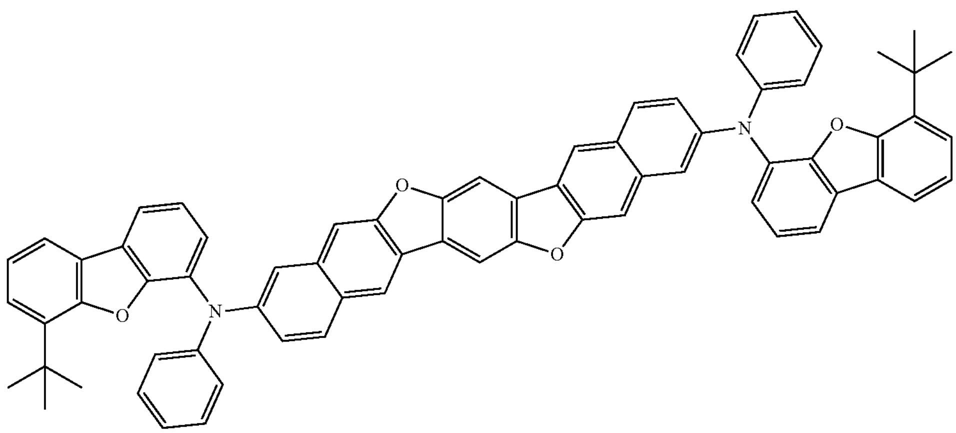
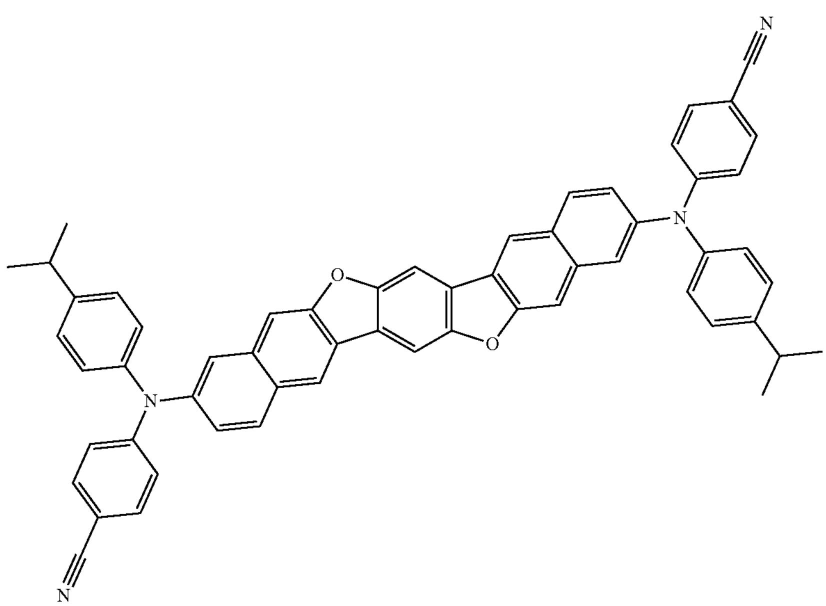

-continued
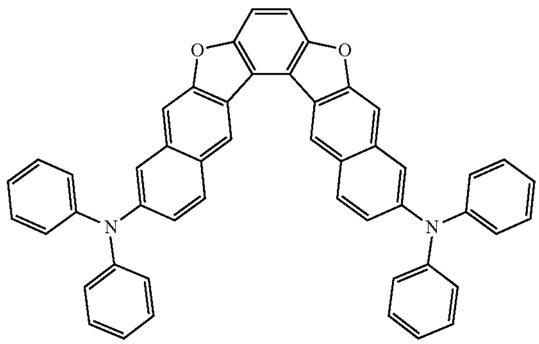
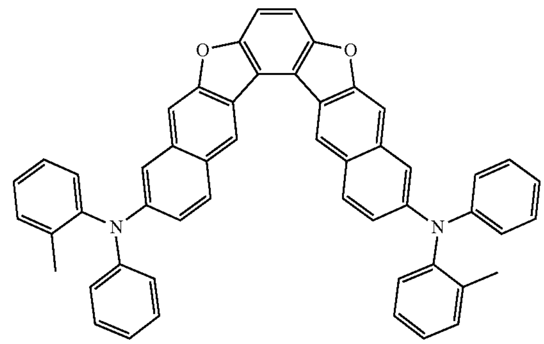
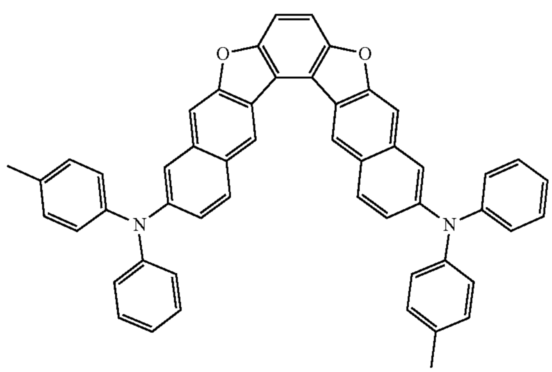
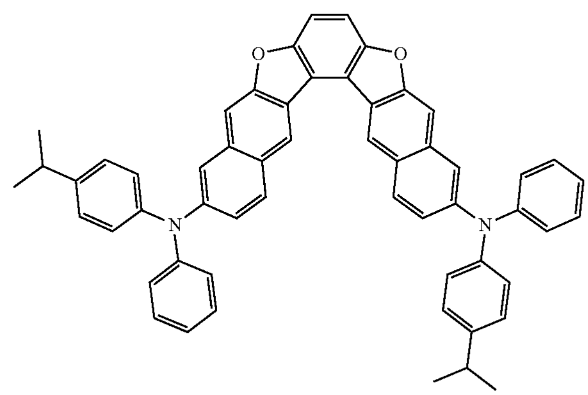
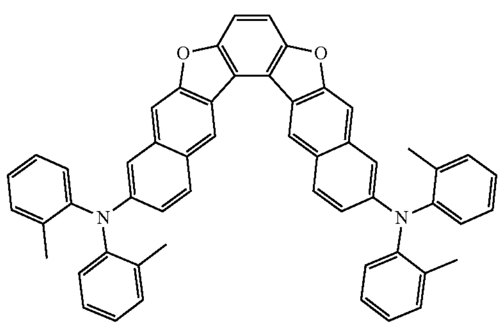
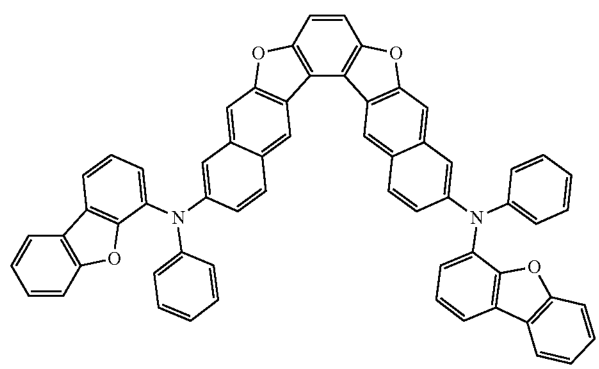
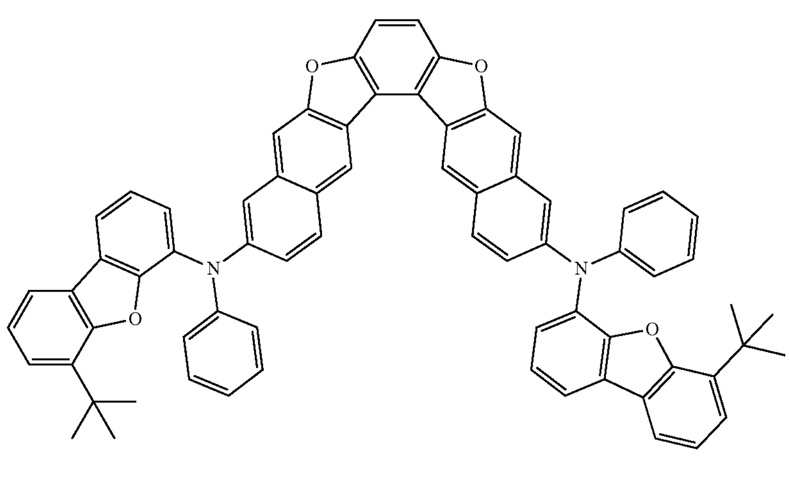

-continued
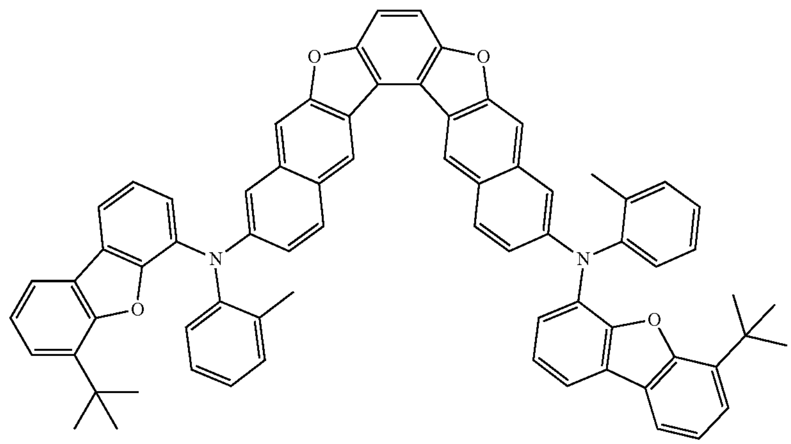
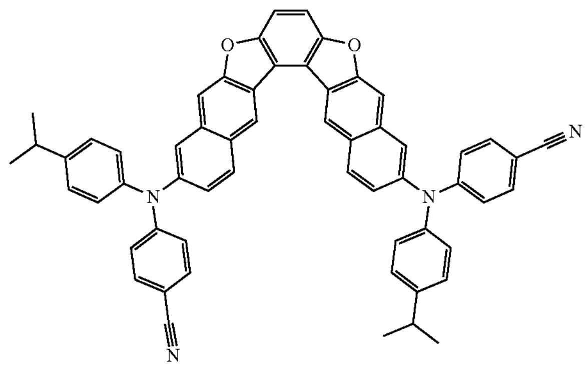
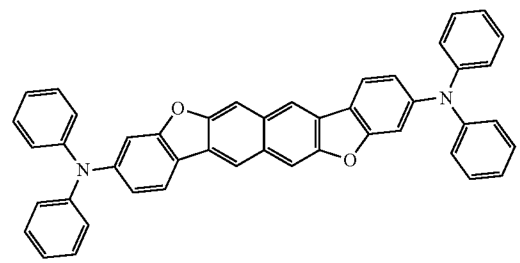
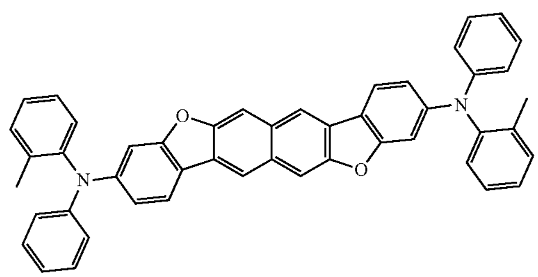
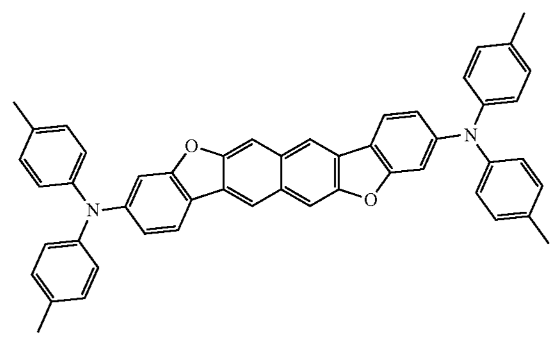
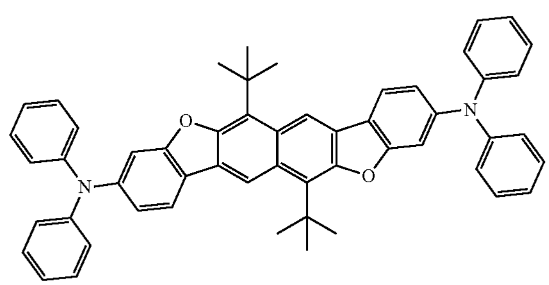
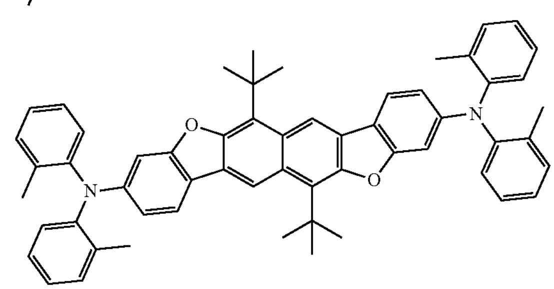
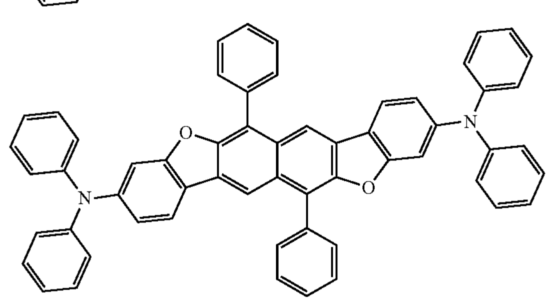
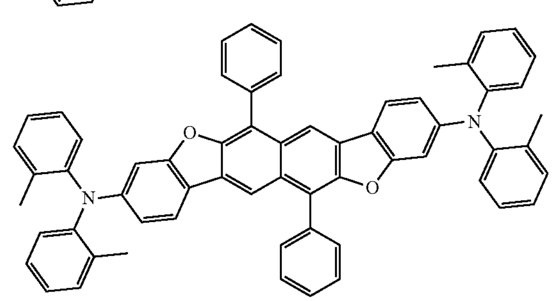

-continued
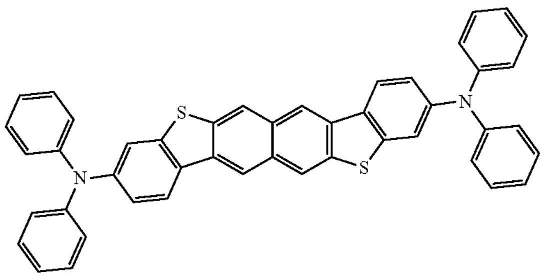
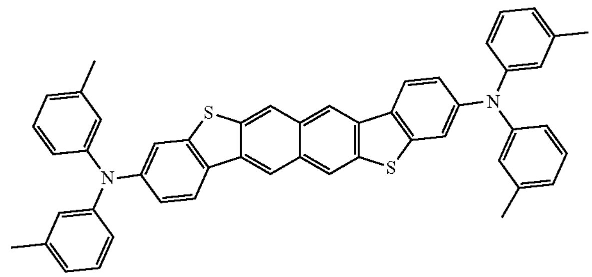
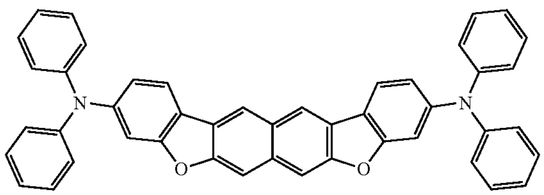
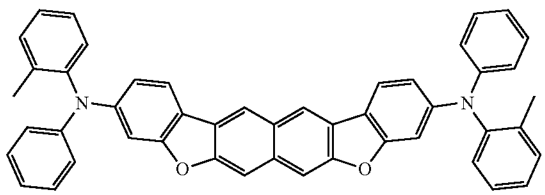
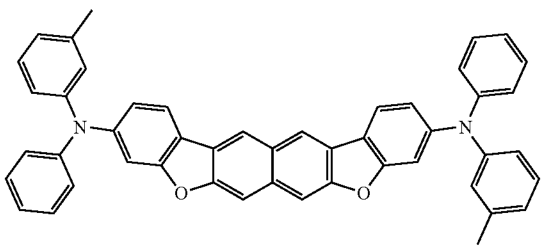
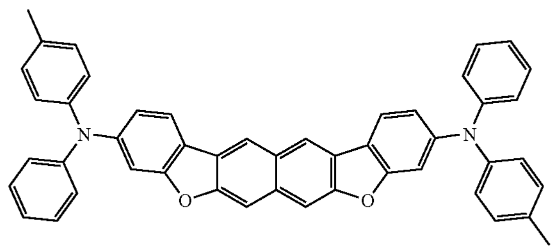
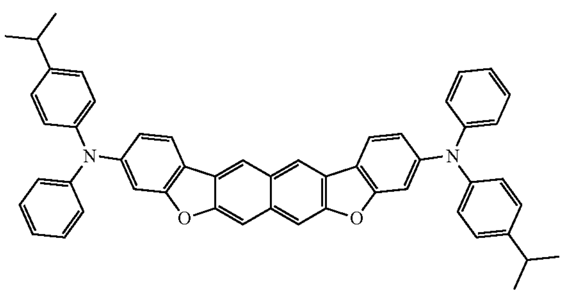
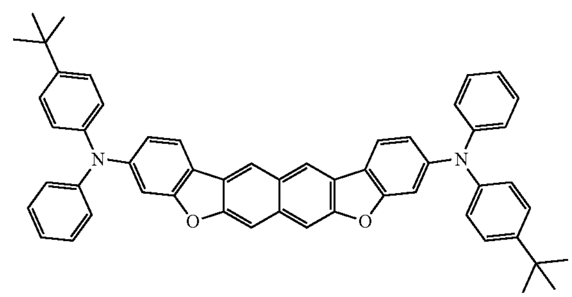
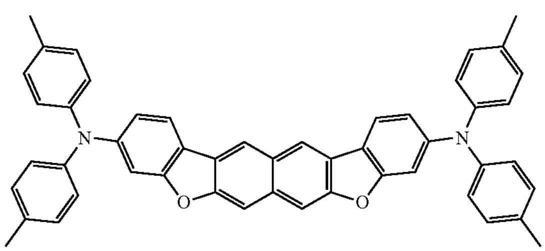
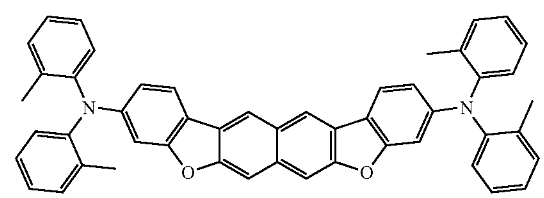
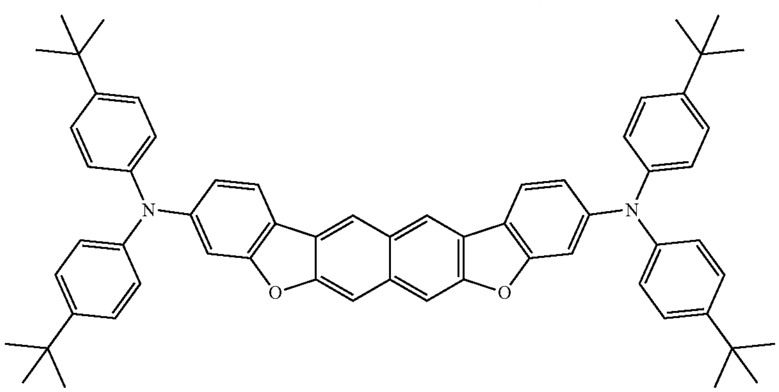

-continued
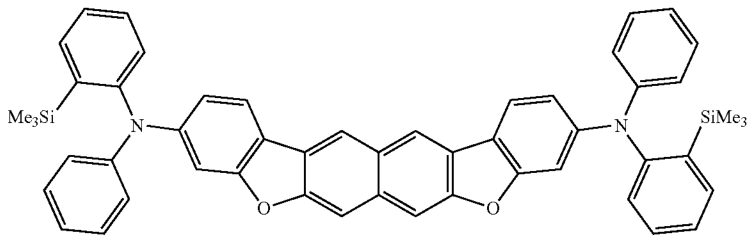
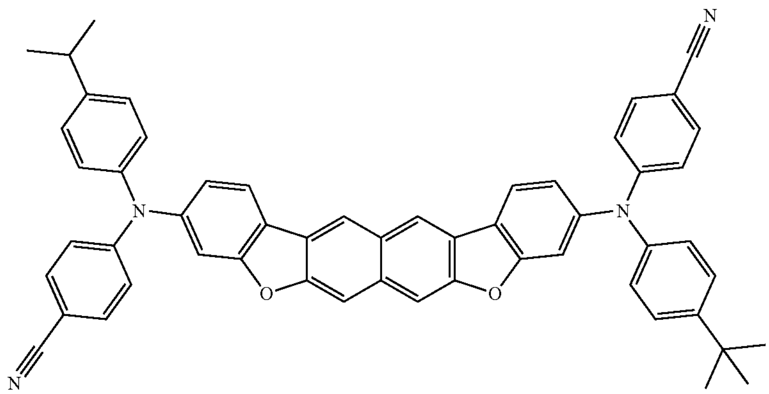
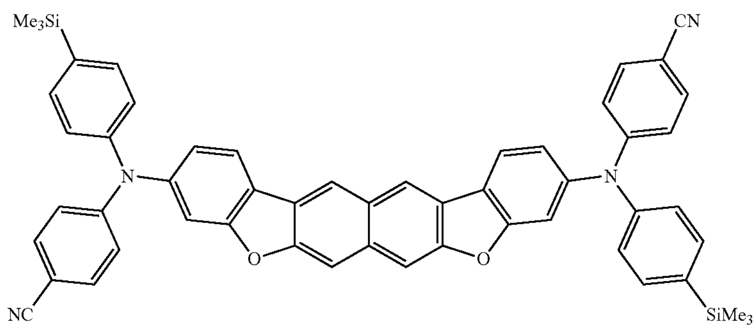
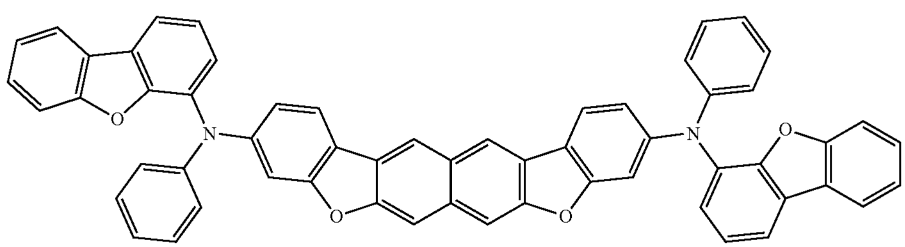
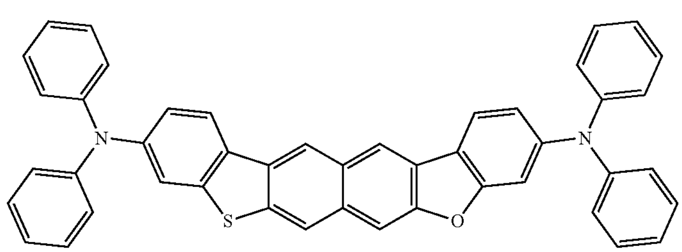

-continued
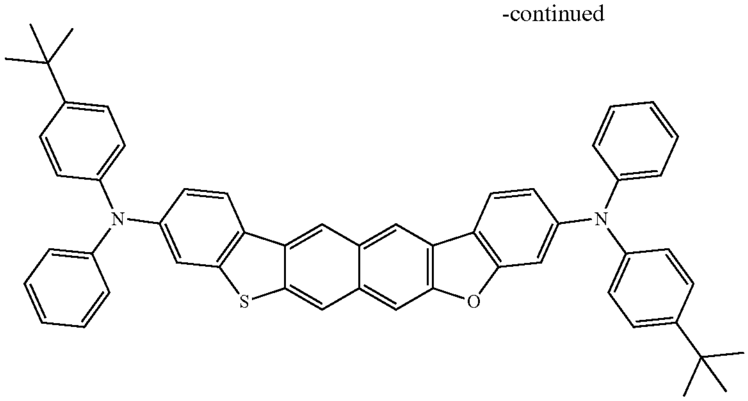
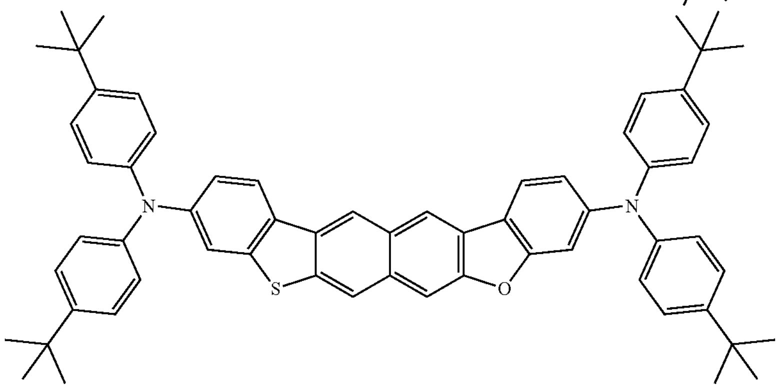
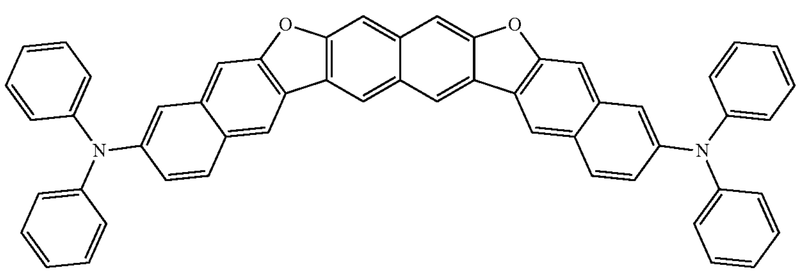
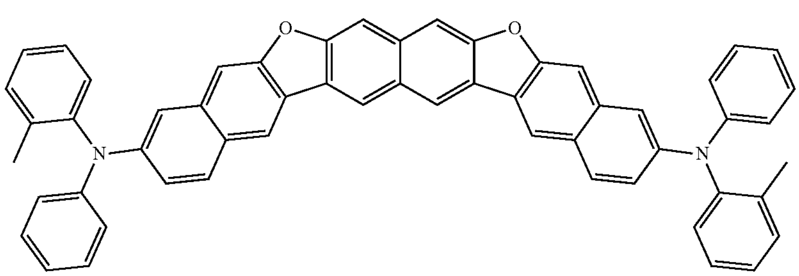
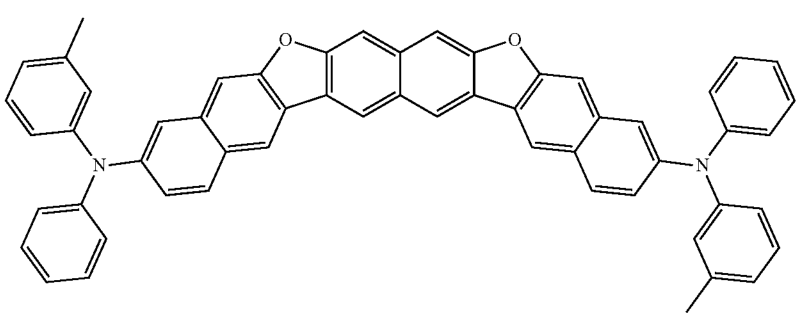

-continued
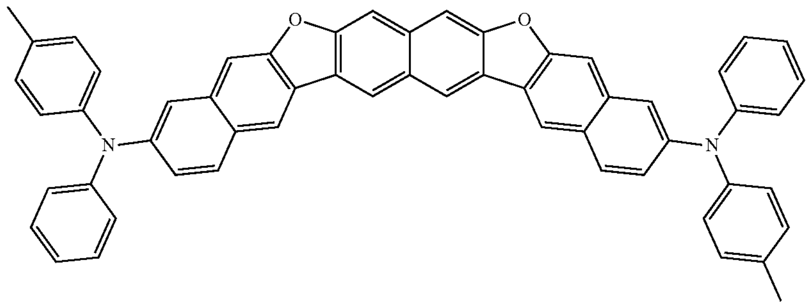
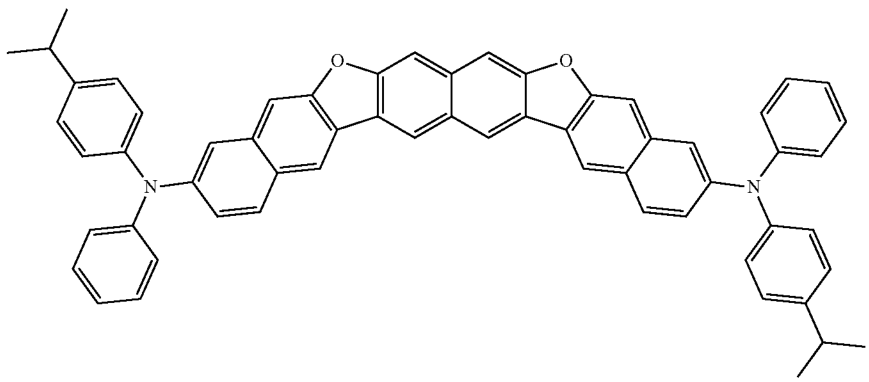
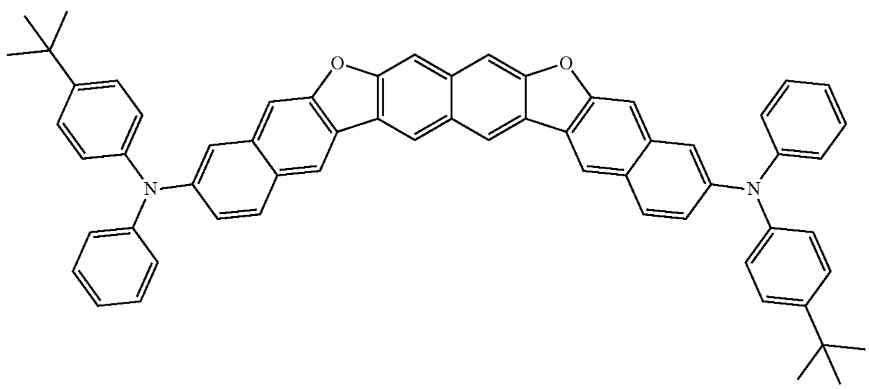
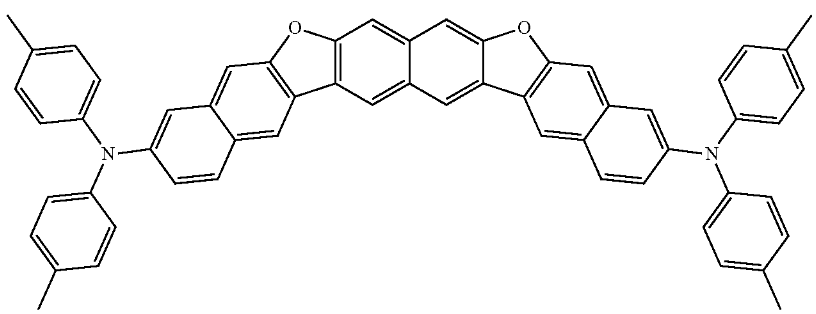
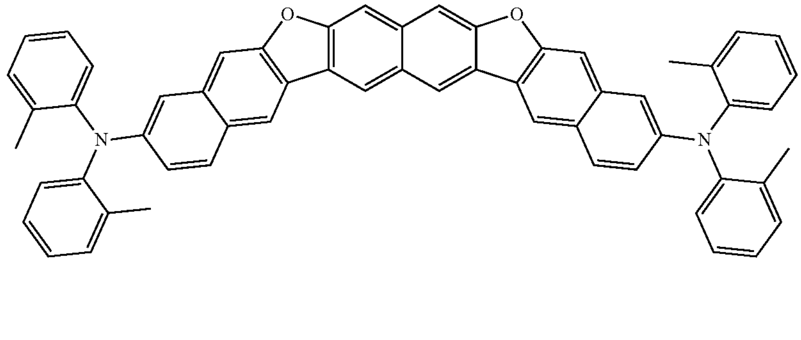

-continued

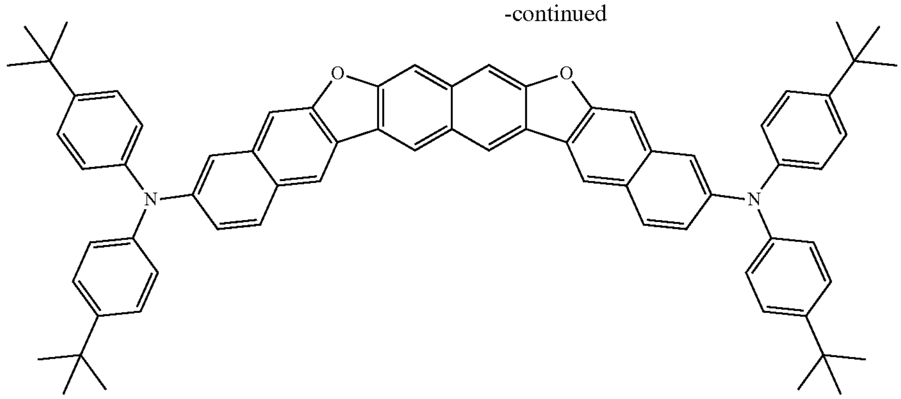

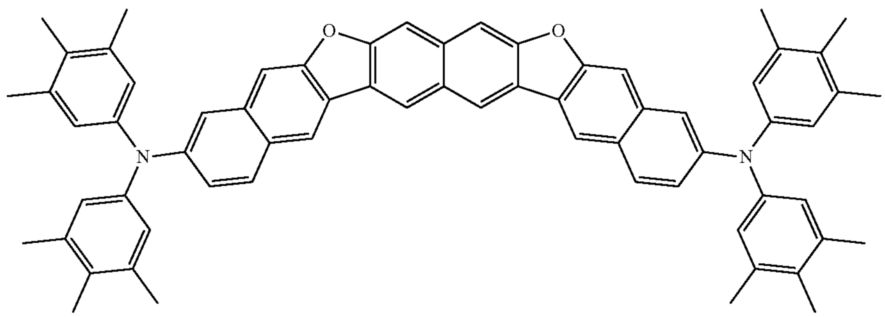

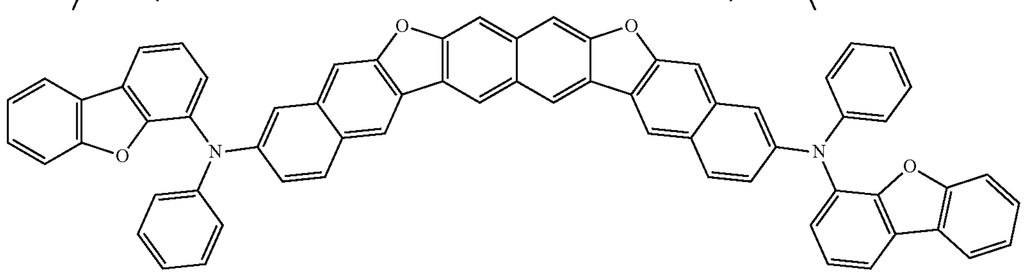

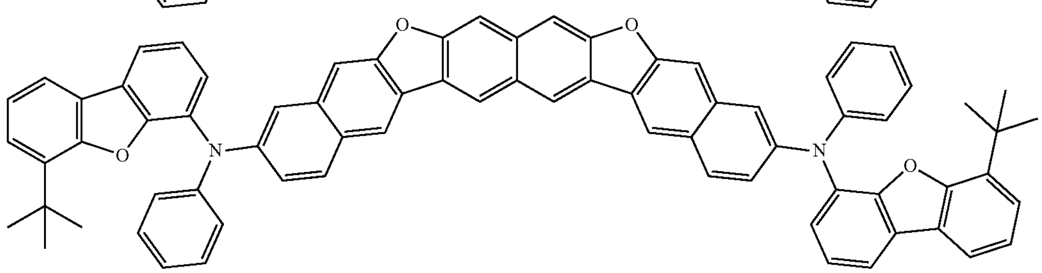

Compound Represented by Formula (61)

The compound represented by the formula (61) will be described below.

(61)

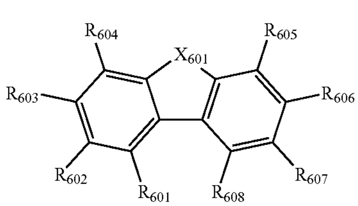

In the formula (61): $X_{601}$ is an oxygen atom, a sulfur atom, or $NR_{609}$;

at least one combination of adjacent two or more of $R_{601}$ to $R_{604}$ are mutually bonded to form a substituted or unsubstituted monocyclic ring, mutually bonded to form a substituted or unsubstituted fused ring, or not mutually bonded;

the at least one combination of the adjacent two or more of $R_{601}$ to $R_{604}$ are mutually bonded to form a divalent group represented by a formula (62) below;

at least one combination of adjacent two or more of $R_{605}$ to $R_{608}$ are mutually bonded to form a substituted or unsubstituted monocyclic ring, mutually bonded to form a substituted or unsubstituted fused ring, or not mutually bonded; and the at least one combination of the adjacent two or more of $R_{605}$ to $R_{608}$ are mutually bonded to form a divalent group represented by a formula (63) below;

(62)

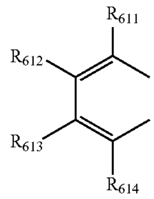

(63)

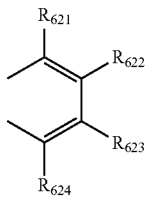

$R_{601}$ to $R_{604}$ not forming the divalent group represented by the formula (62), not forming the substituted or unsubstituted monocyclic ring and not forming the substituted or unsubstituted fused ring and at least one of $R_{611}$ to $R_{614}$ in the formula (62) are each a monovalent group represented by a formula (64) below, and at least one of $R_{605}$ to $R_{608}$ not forming the divalent group represented by the formula (63), not forming the substituted or unsubstituted monocyclic ring and not forming the substituted or unsubstituted fused ring and at least one of $R_{621}$ to $R_{624}$ in the formula (63) are each a monovalent group represented by a formula (64) below.

(64)

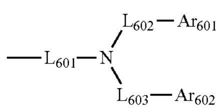

$R_{601}$ to $R_{608}$ not forming the divalent group represented by the formula (62) or (63), not being the monovalent group represented by the formula (64), not forming the substituted or unsubstituted monocyclic ring and not forming the substituted or unsubstituted fused ring, $R_{611}$ to $R_{614}$ and $R_{621}$ to $R_{624}$ not being the monovalent group represented by the formula (64), and $R_{609}$ are each independently:

a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (61) to (64) respectively represent the same as $R_{901}$ to $R_{907}$ of the formula (21).

In the formula (64): $Ar_{601}$ and $Ar_{602}$ are each independently a substituted or unsubstituted aryl group having 6 to 50 ring carbon atoms, or a substituted or unsubstituted heterocyclic group having 5 to 50 ring atoms; and $L_{601}$ to $L_{603}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of the substituted or unsubstituted arylene group having 6 to 30 ring carbon atoms and the substituted or unsubstituted divalent heterocyclic group having 5 to 30 ring atoms.

When a plurality of $Ar_{601}$ are present, the plurality of $Ar_{601}$ are mutually the same or different.

When a plurality of $Ar_{602}$ are present, the plurality of $Ar_{602}$ are mutually the same or different.

When a plurality of $L_{601}$ are present, the plurality of $L_{601}$ are mutually the same or different.

When a plurality of $L_{602}$ are present, the plurality of $L_{602}$ are mutually the same or different.

When a plurality of $L_{603}$ are present, the plurality of $L_{603}$ are mutually the same or different.

In the formula (61), the positions for the divalent group represented by the formula (62) and the divalent group represented by the formula (63) to be formed are not specifically limited but the divalent groups may be formed at any possible positions on $R_{601}$ to $R_{608}$.

In some embodiments, the compound represented by the formula (61) is represented by any one of formulae (61-1) to (61-6) below.

(61-1)

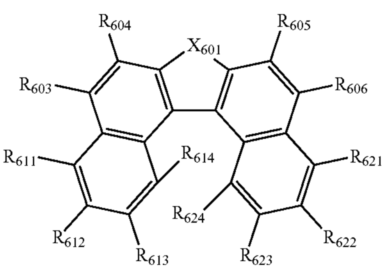

(61-2)

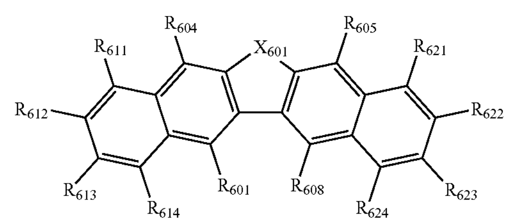

(61-3)

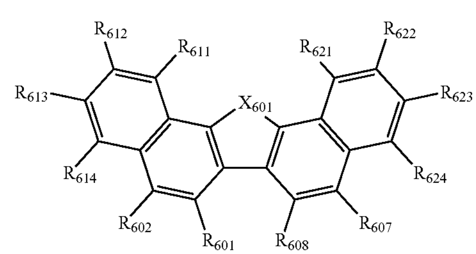

-continued (61-4)

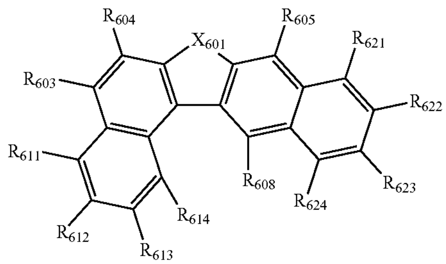

(61-5)

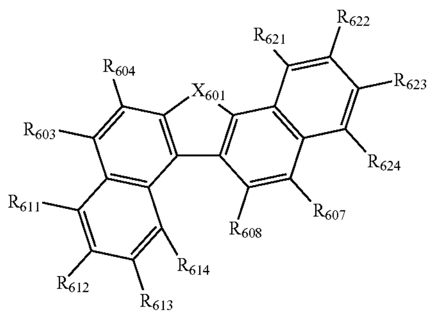

(61-6)

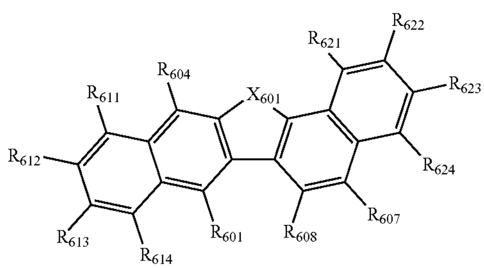

In the formulae (61-1) to (61-6), $X_{601}$ is as defined in the formula (61);

at least two of $R_{601}$ to $R_{624}$ are each a monovalent group represented by the formula (64);

$R_{601}$ to $R_{624}$ that are not the monovalent group represented by the formula (64) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ respectively represent the same as $R_{901}$ to $R_{907}$ of the formula (21).

In some embodiments, the compound represented by the formula (61) is represented by any one of formulae (61-7) to (61-18) below.

(61-7)

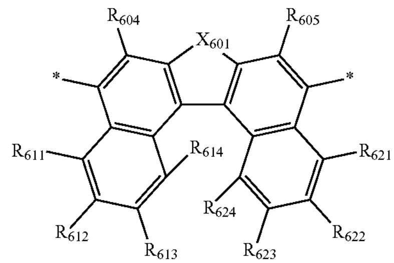

(61-8)

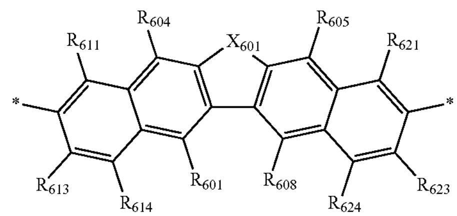

(61-9)

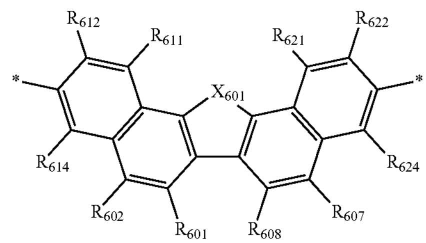

(61-10)

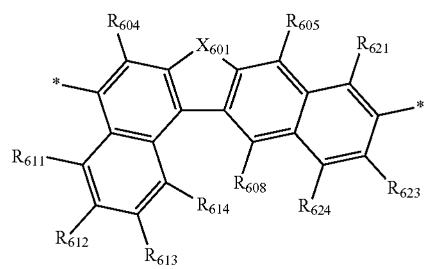

(61-11)

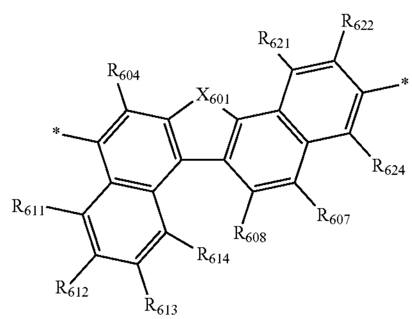

(61-12)

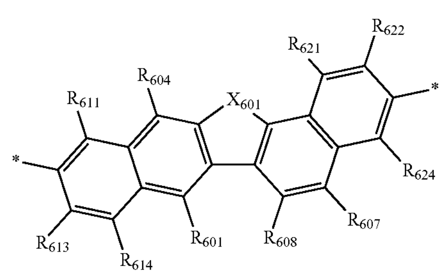

-continued (61-13)

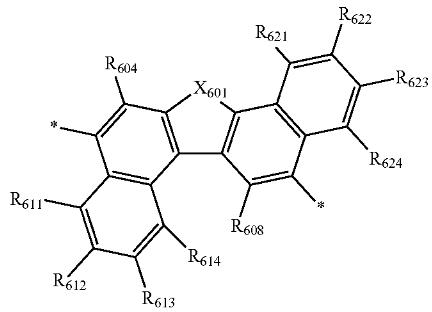

(61-14)

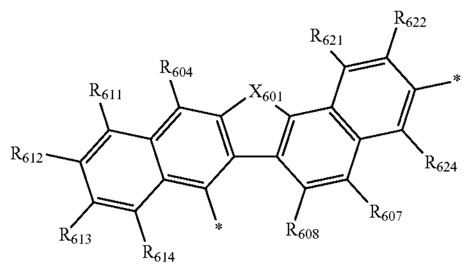

(61-15)

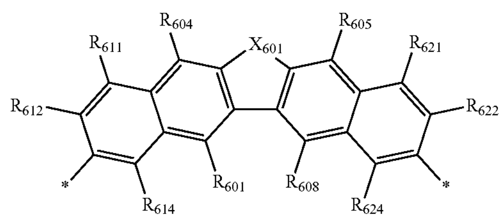

(61-16)

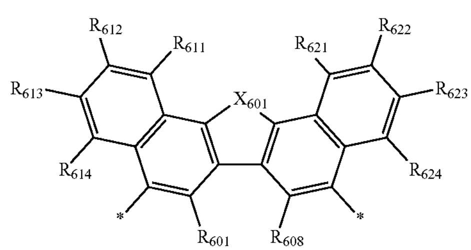

(61-17)

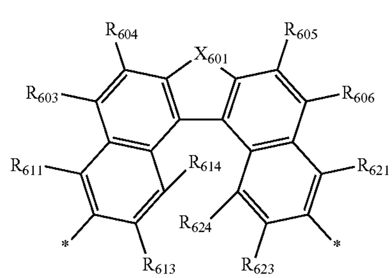

-continued (61-18)

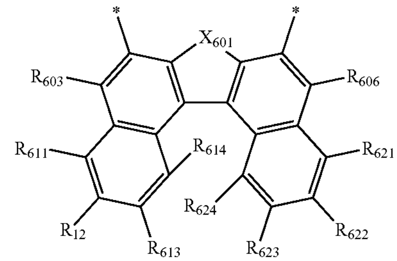

In the formulae (61-7) to (61-18):

$X_{601}$ is as defined for the formula (61);

* is a single bond to be bonded with the monovalent group represented by the formula (64); and $R_{601}$ to $R_{624}$ represent the same as $R_{601}$ to $R_{624}$ that are not the monovalent group represented by the formula (64).

$R_{601}$ to $R_{608}$ not forming the divalent group represented by the formula (62) or (63) and not being the monovalent group represented by the formula (64), and $R_{611}$ to $R_{614}$ and $R_{621}$ to $R_{624}$ not being the monovalent group represented by the formula (64) are each independently:

a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The monovalent ring represented by the formula (64) is preferably represented by a formula (65) or (66) below.

(65)

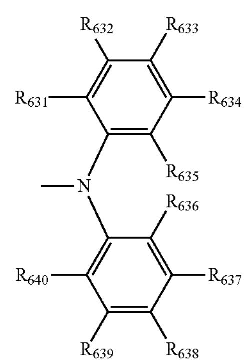

In the formula (65): $R_{631}$ to $R_{640}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ respectively represent the same as $R_{901}$ to $R_{907}$ of the formula (21).

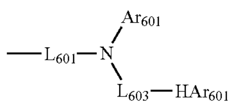

(66)

In the formula (66), $Ar_{601}$, $L_{601}$ and $L_{603}$ are as defined in the formula (64), and $HAr_{601}$ is a moiety represented by a formula (67) below.

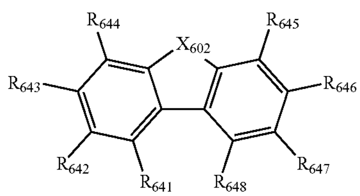

(67)

In the formula (67): $X_{602}$ is an oxygen atom or a sulfur atom;

one of $R_{641}$ to $R_{648}$ is a single bond with $L_{603}$;

$R_{641}$ to $R_{648}$ not being the single bond are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ respectively represent the same as $R_{901}$ to $R_{907}$ of the formula (21).

Specific Examples of Compound Represented by Formula (61)

Specific examples of the compound represented by the formula (61) include compounds shown below as well as the compounds described in WO.2014/104144. It should however be noted that the invention is not limited by the specific examples of the second compound.

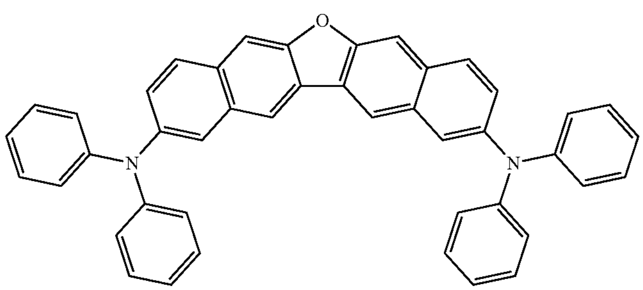

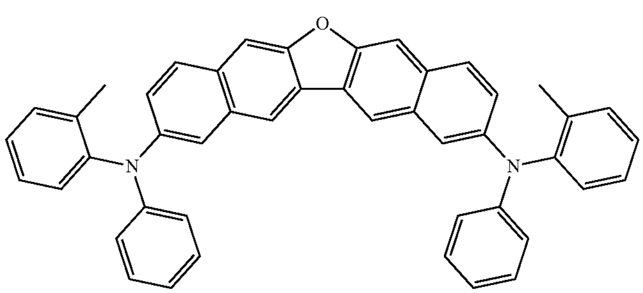

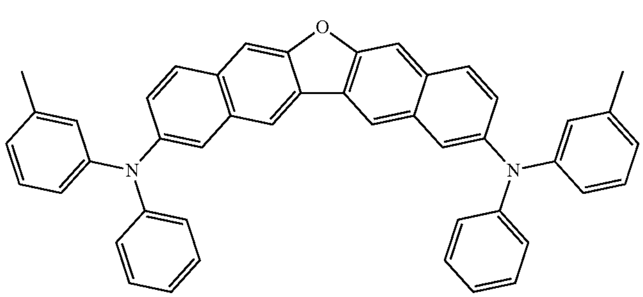

-continued
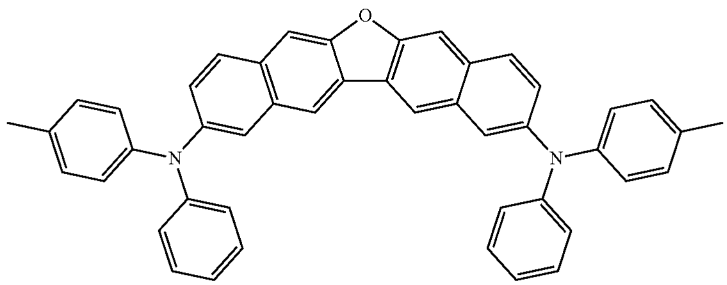
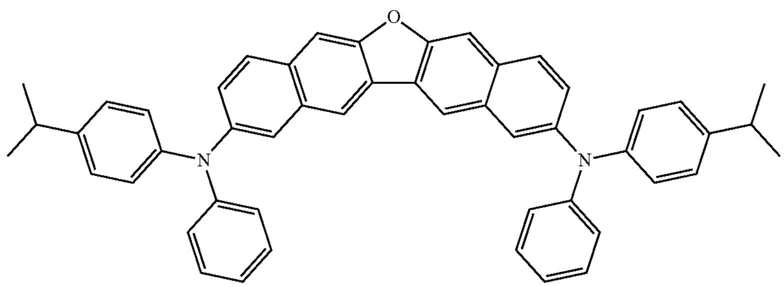
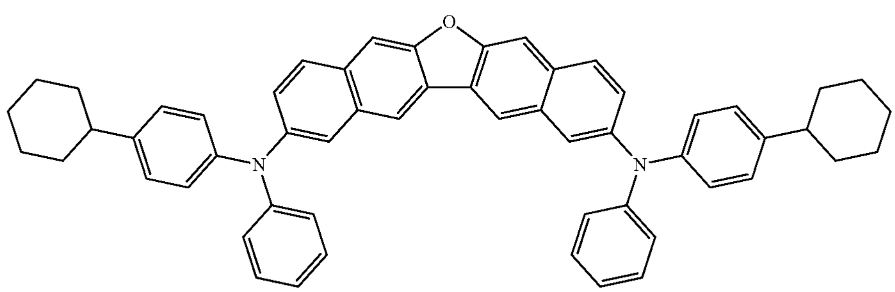
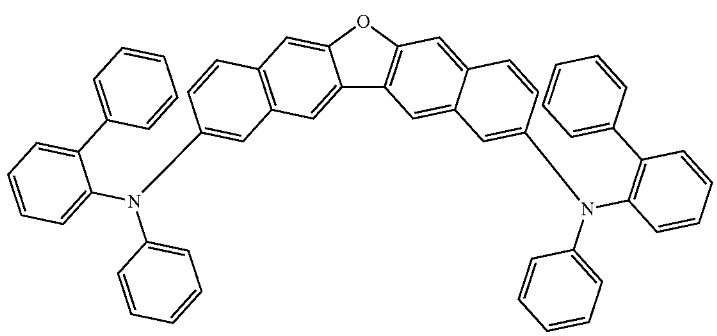
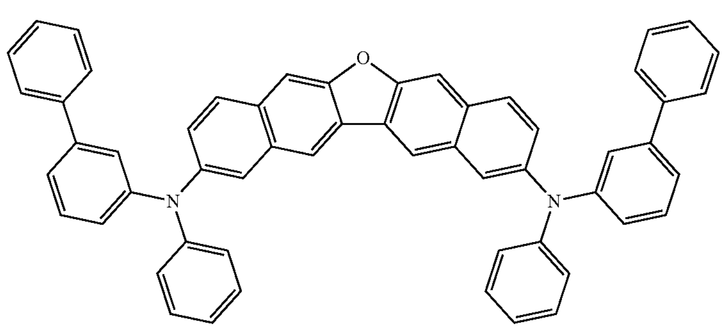

-continued
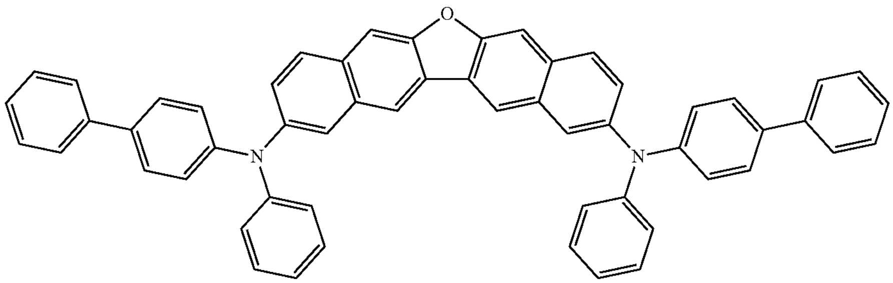
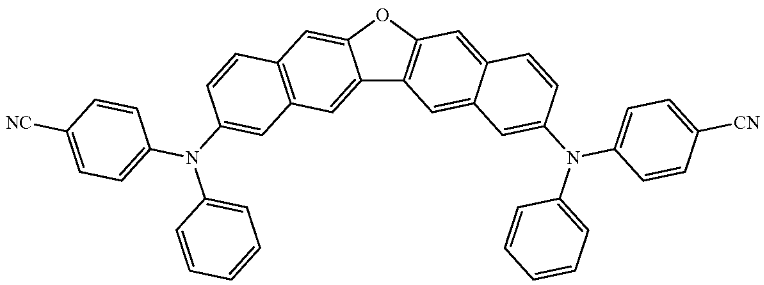
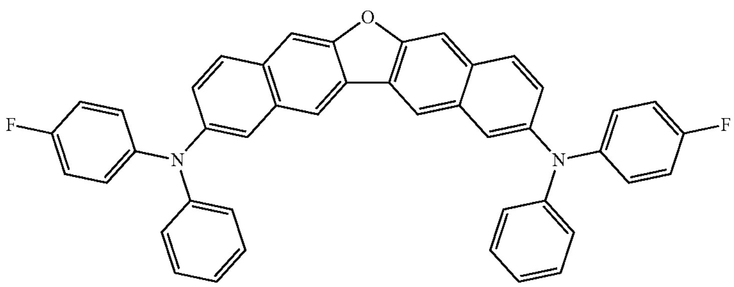
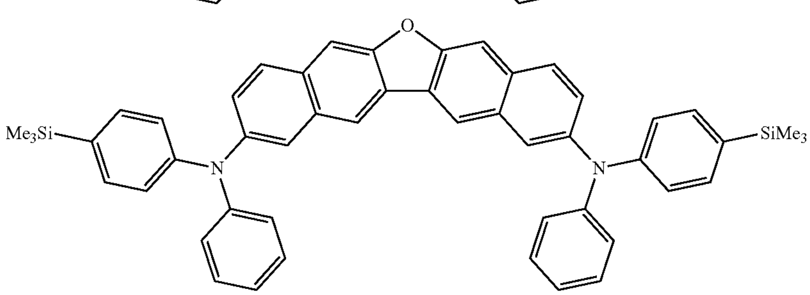
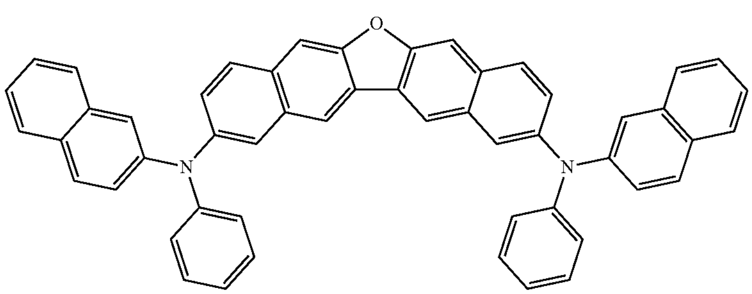
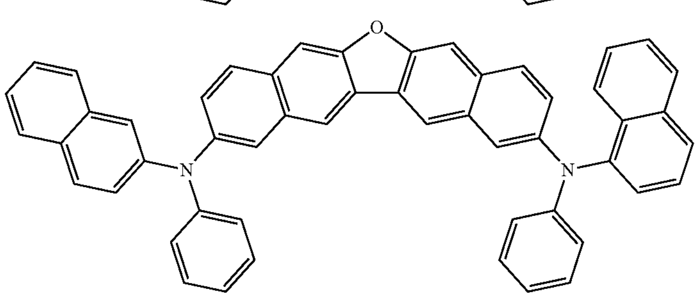

-continued
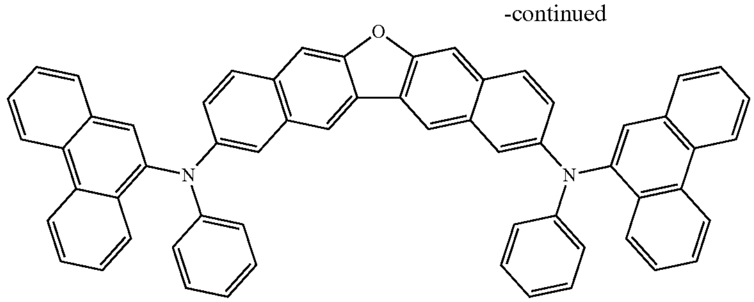
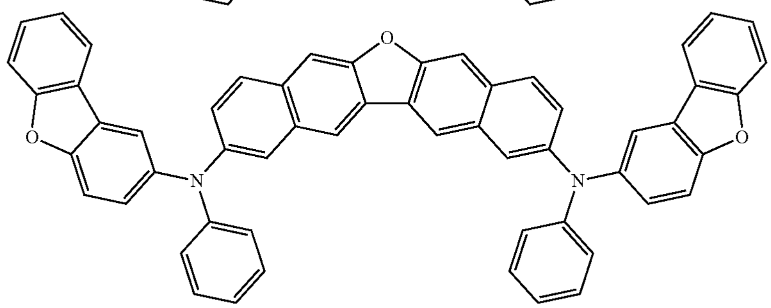
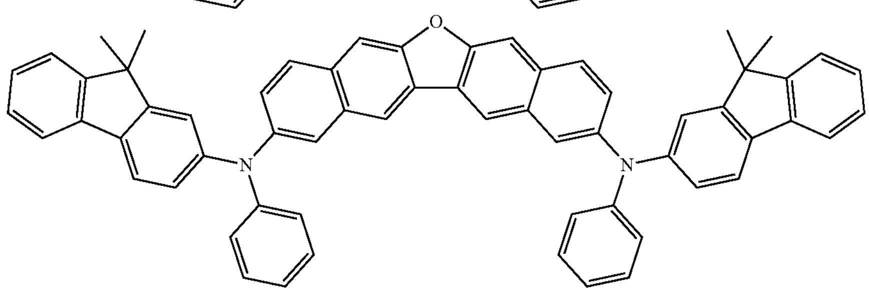
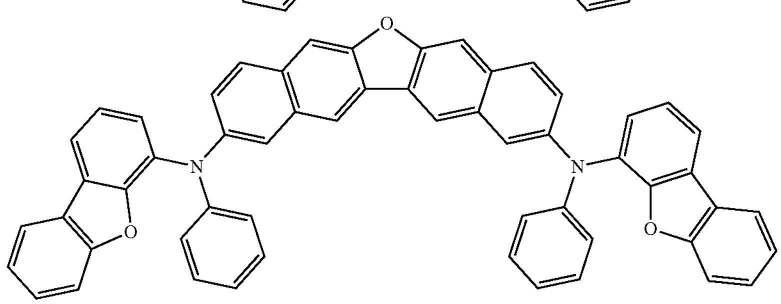
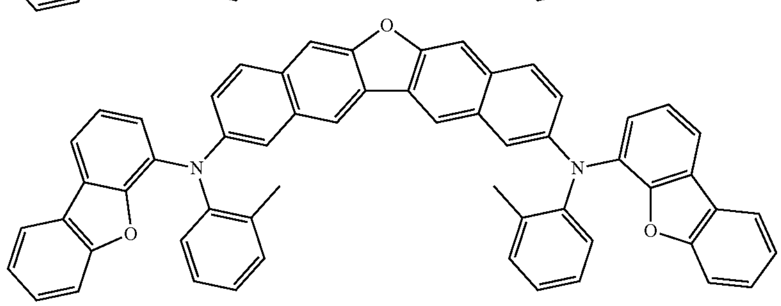
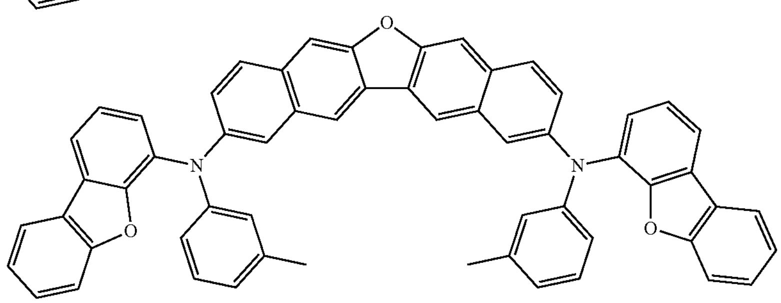

-continued
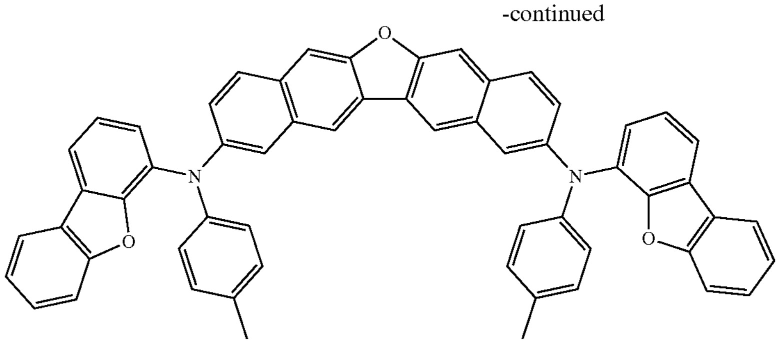
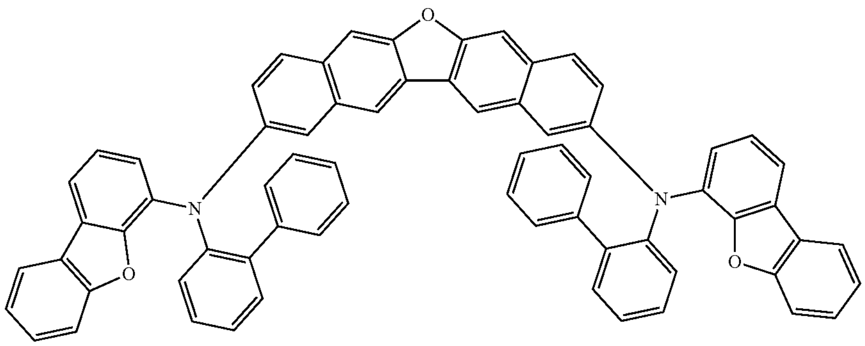
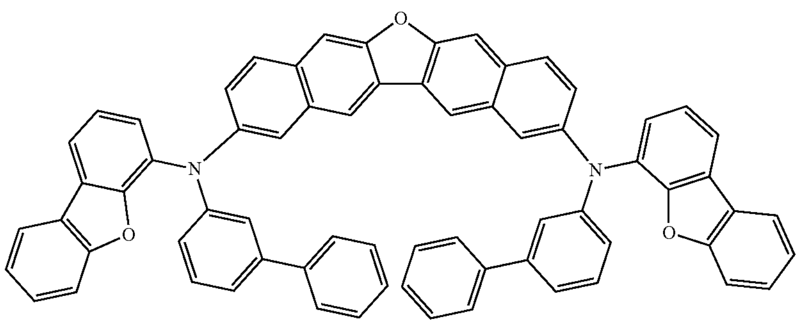
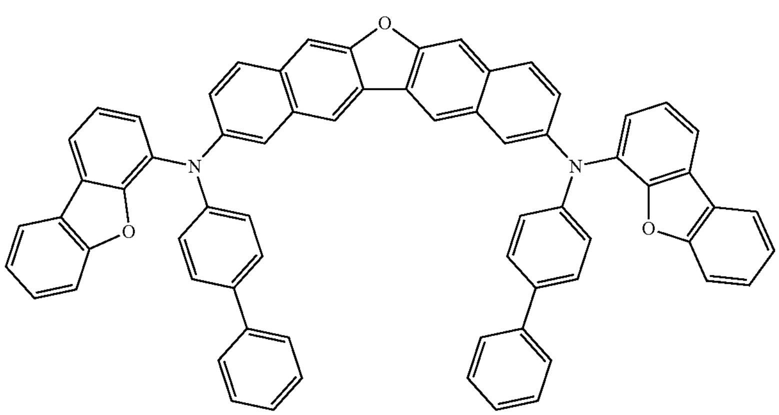
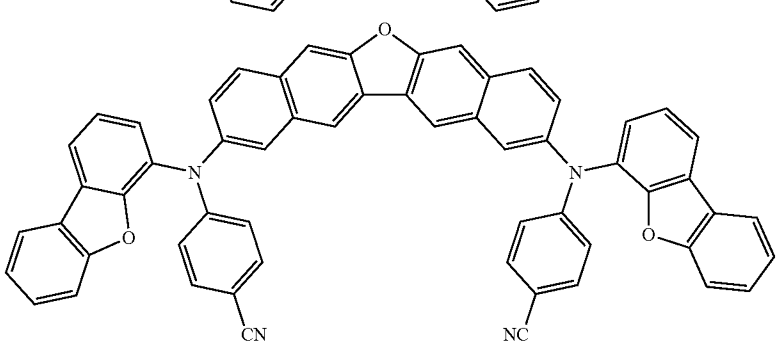

-continued
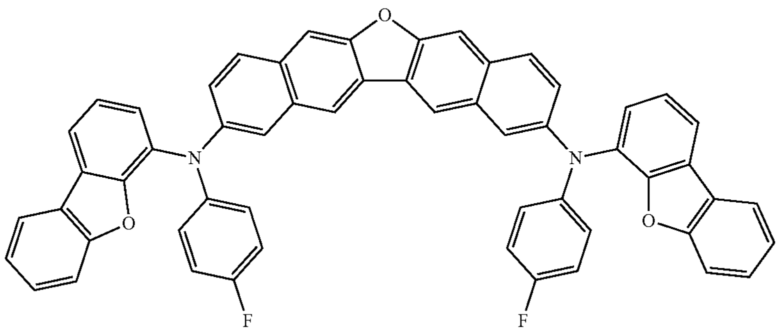
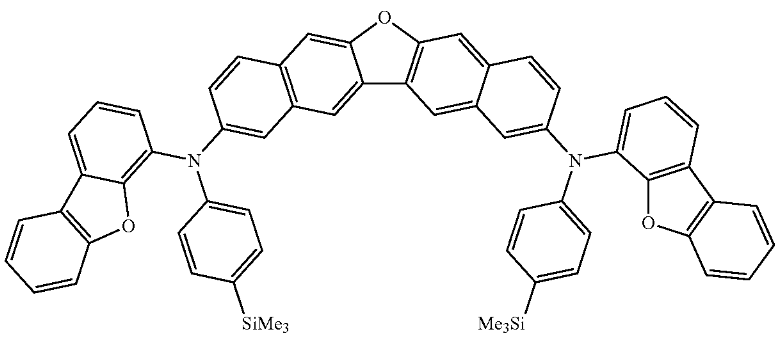
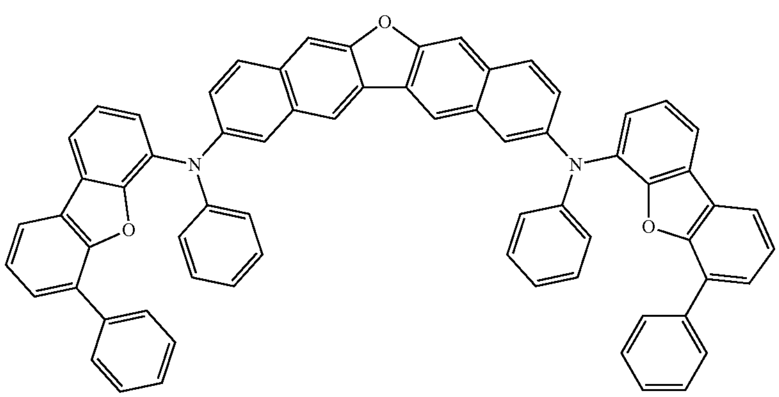
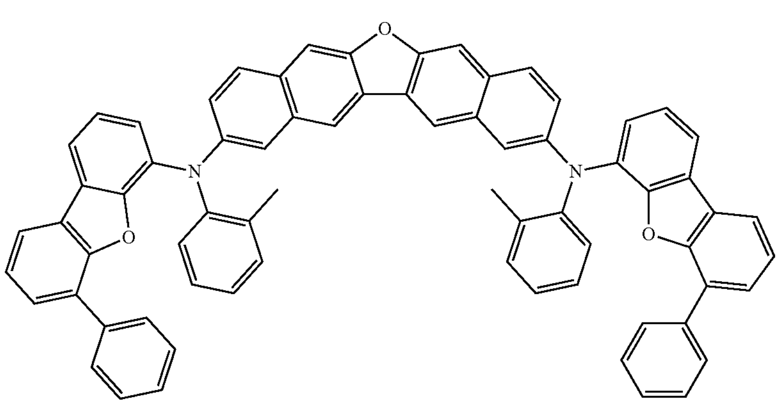

-continued
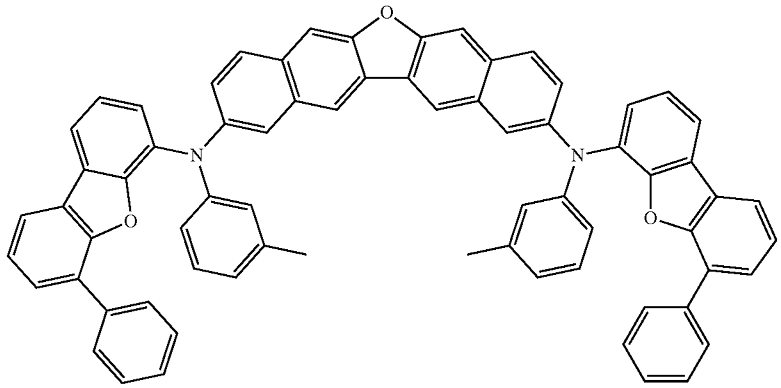
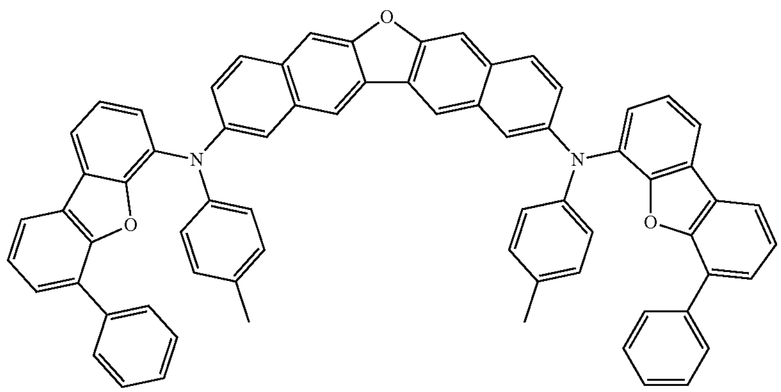
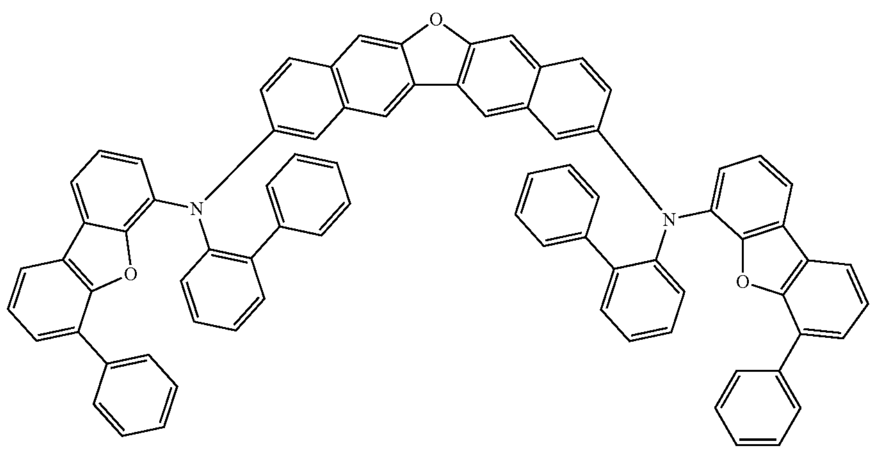
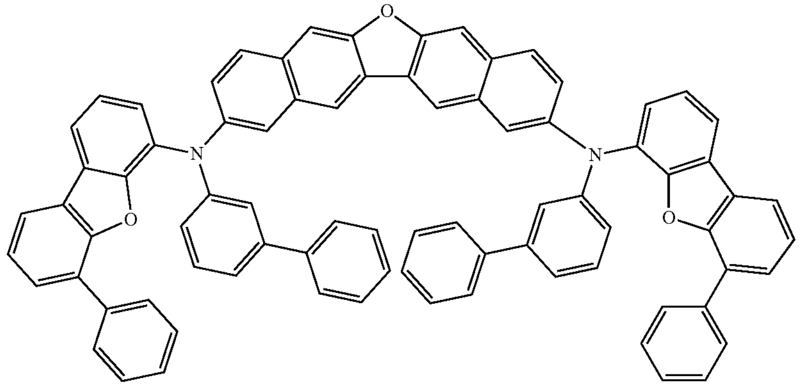

-continued
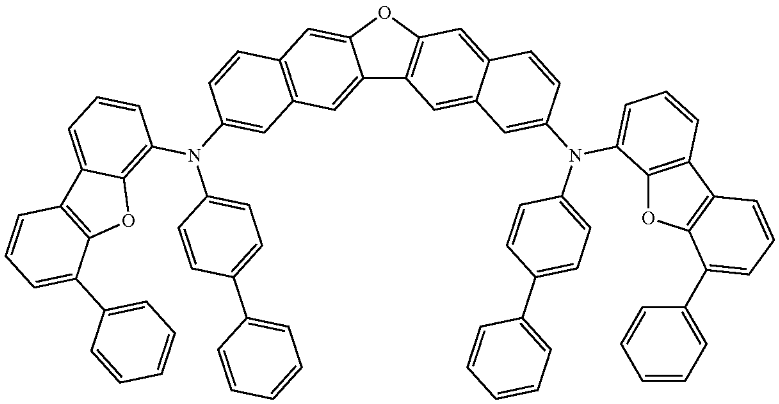
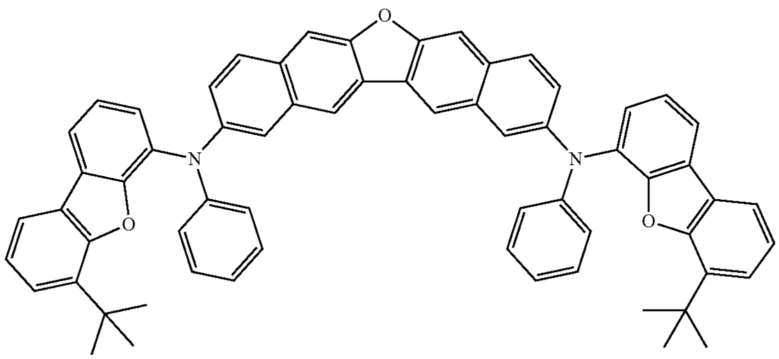
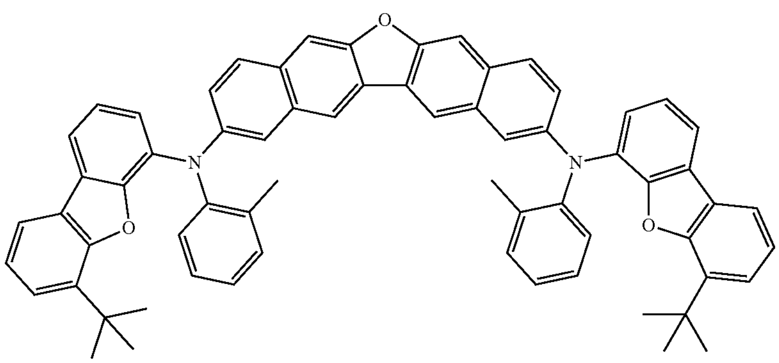
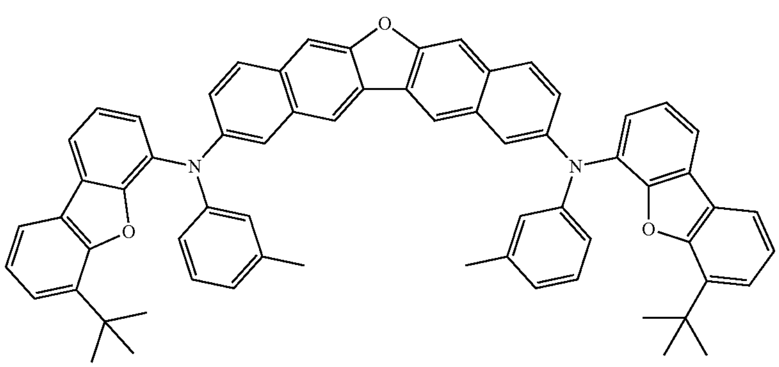

-continued
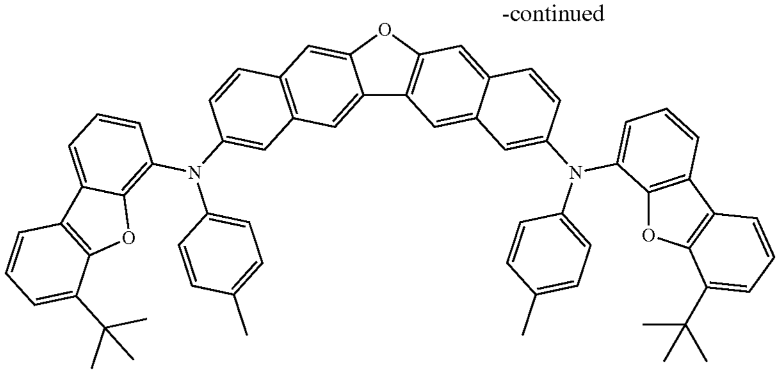
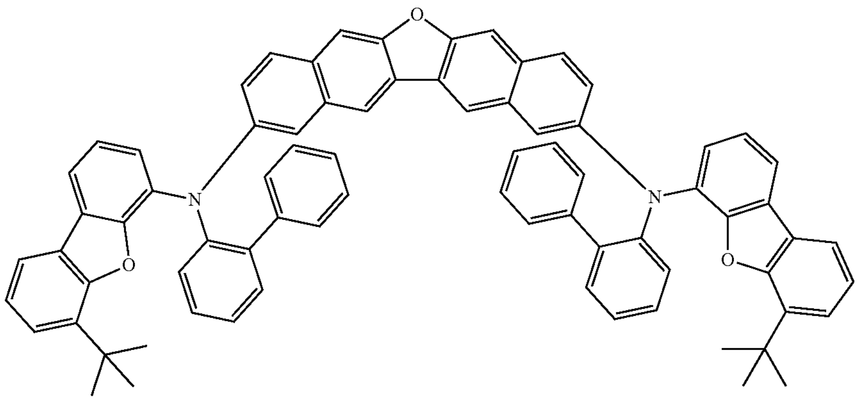
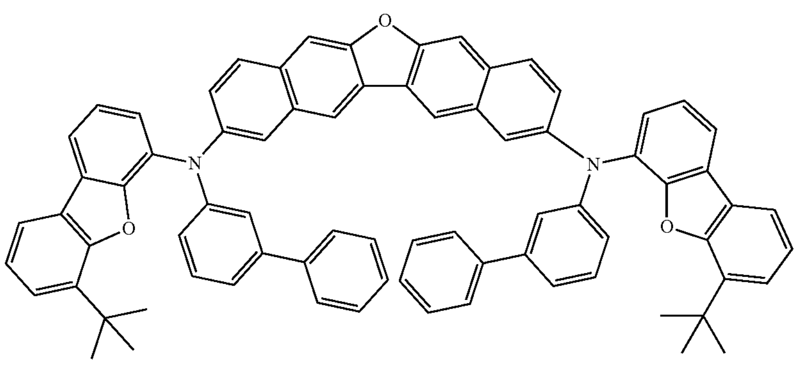
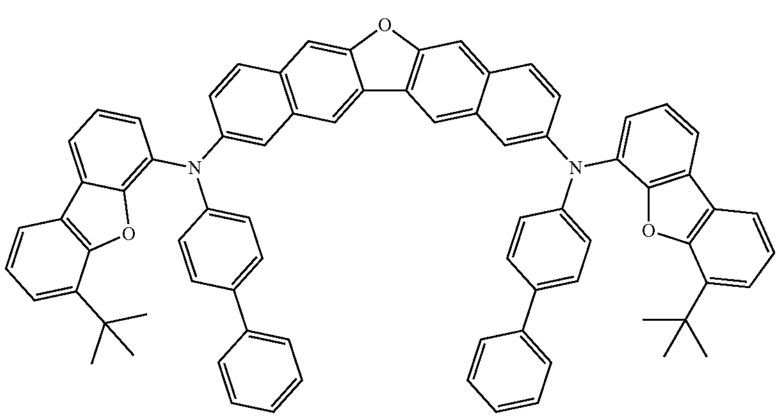

-continued
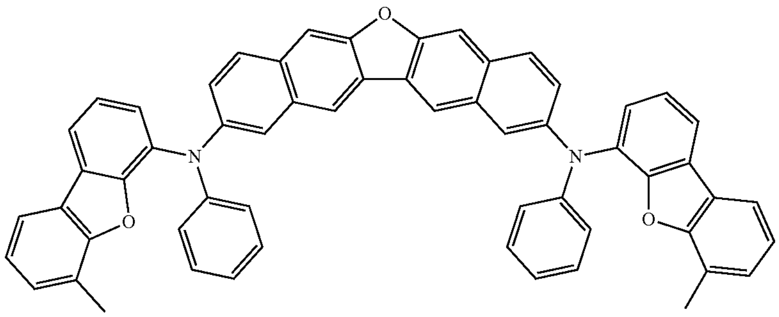
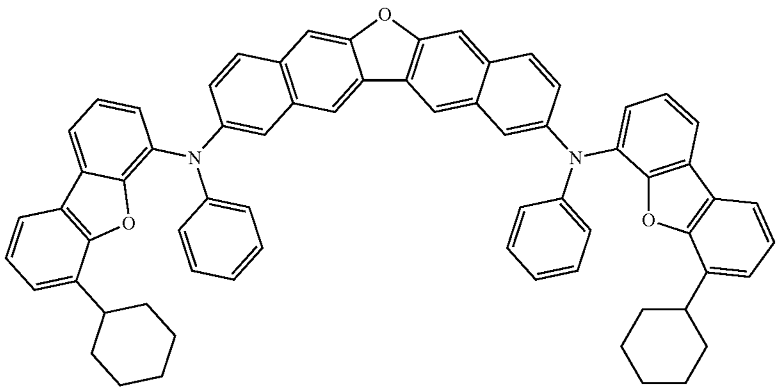
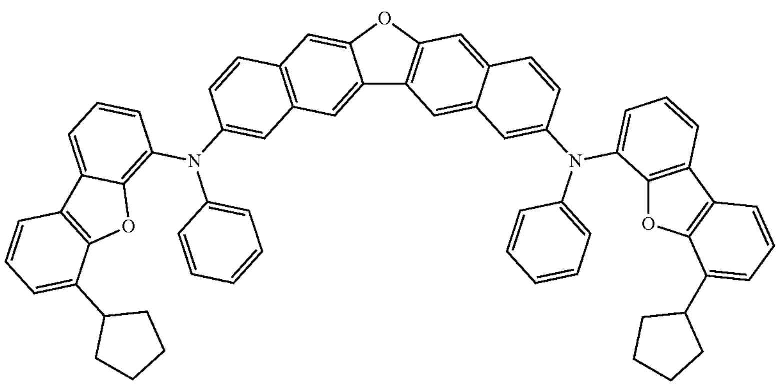
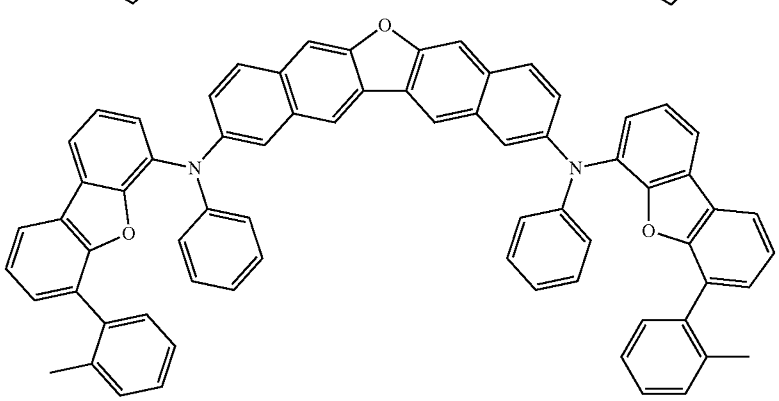
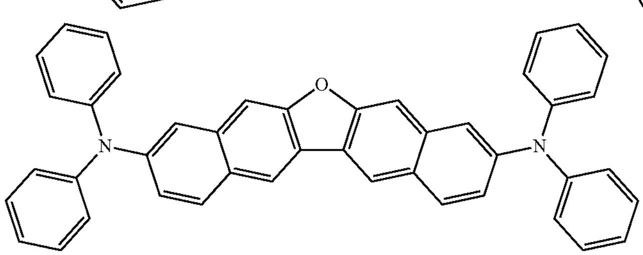

-continued
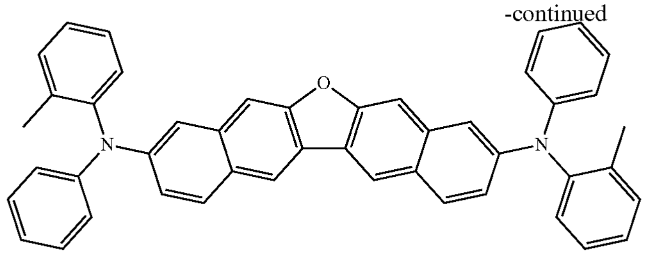
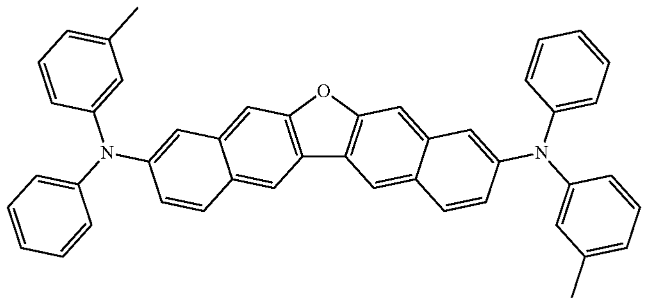
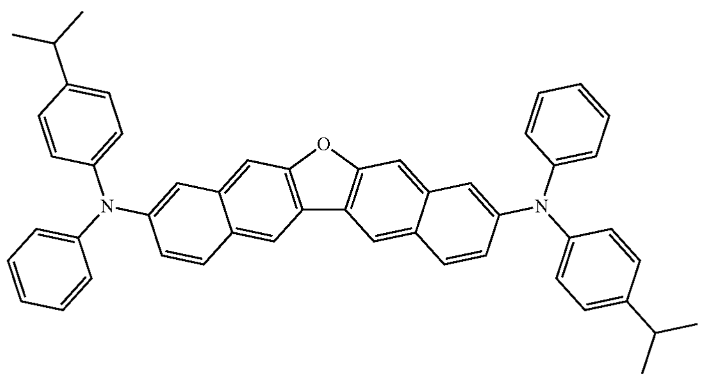
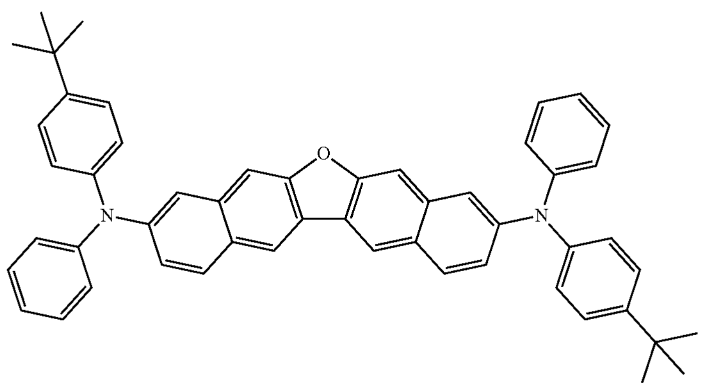
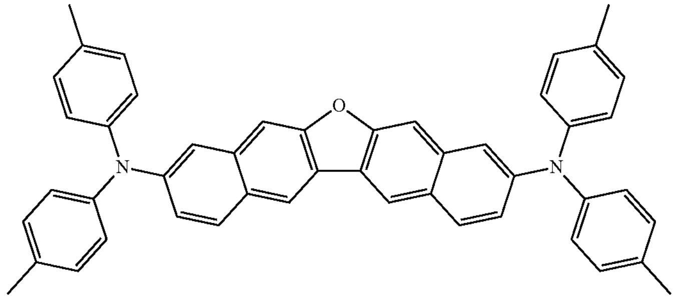

-continued
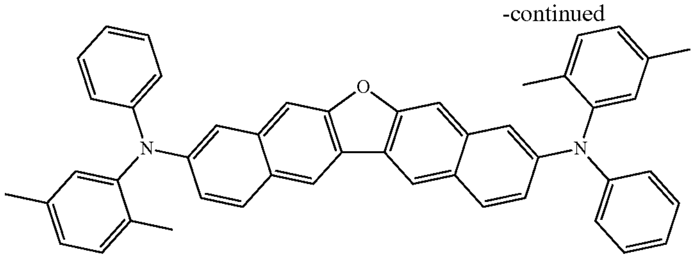
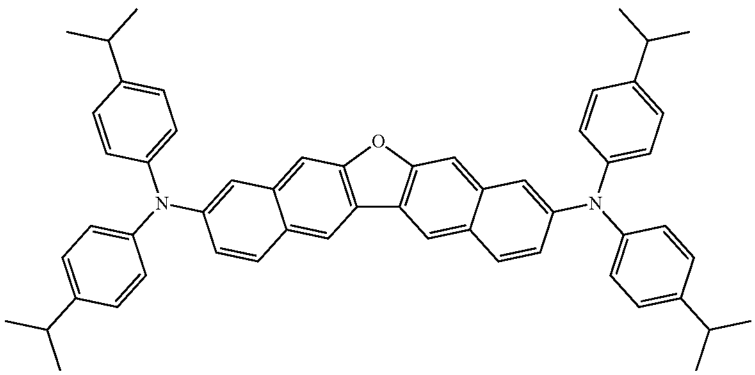
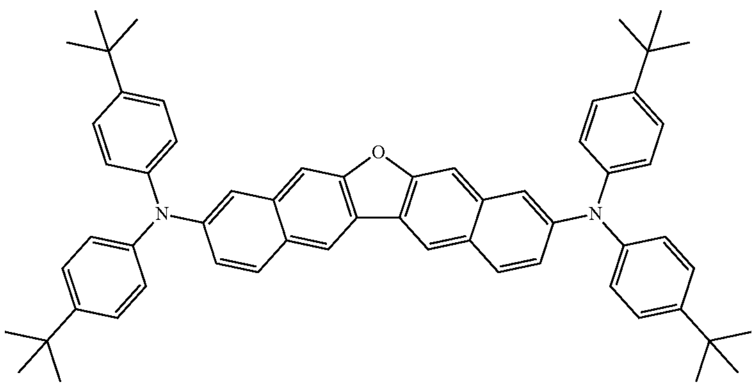
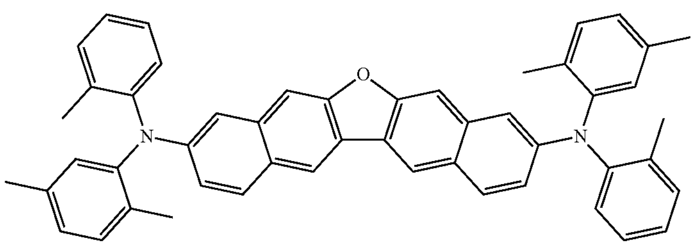
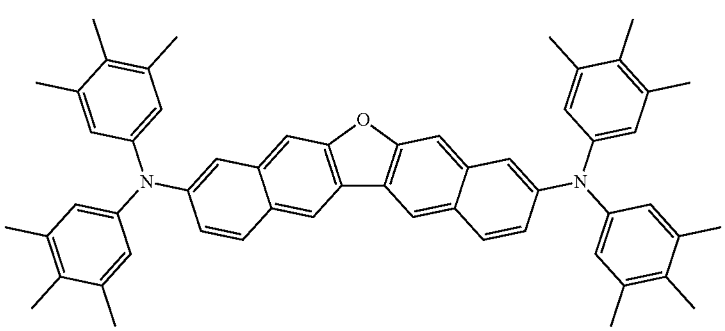

-continued
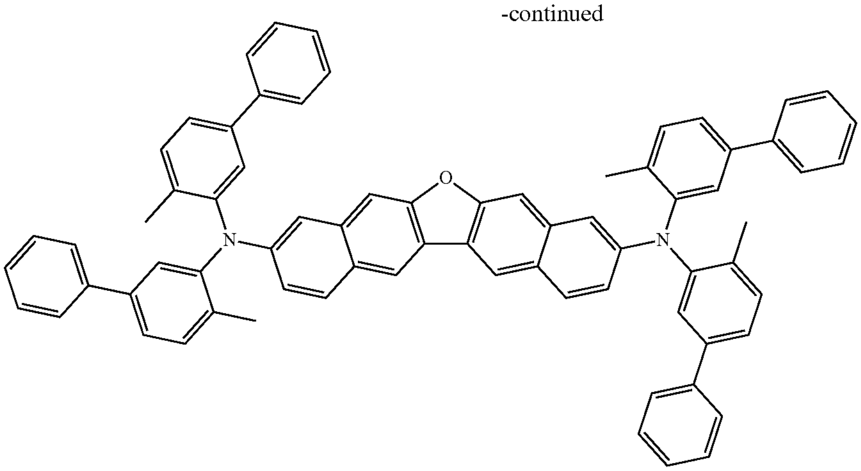
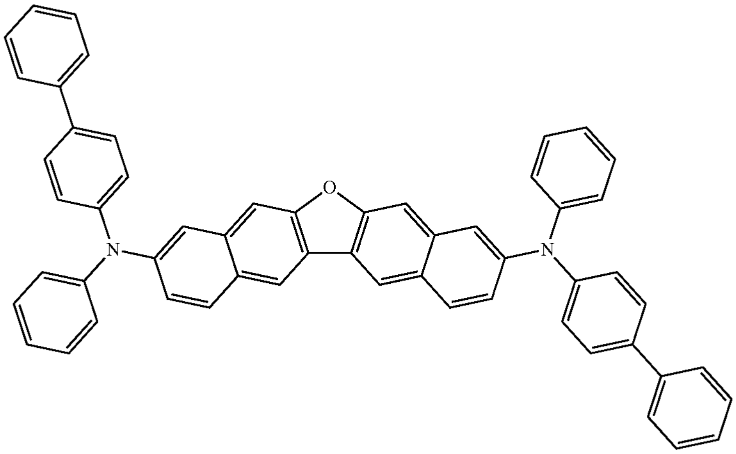
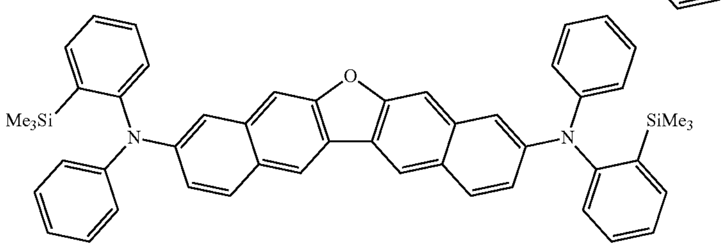
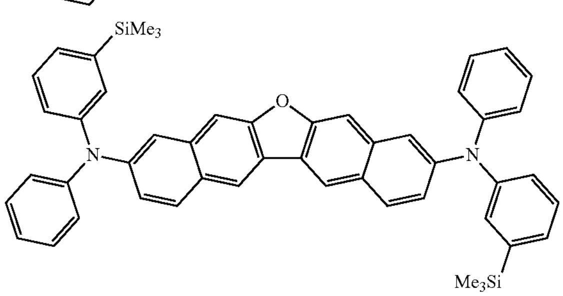
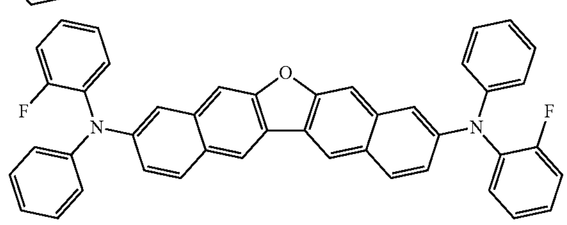
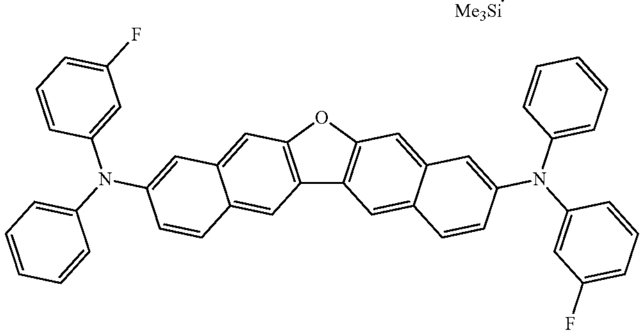

-continued
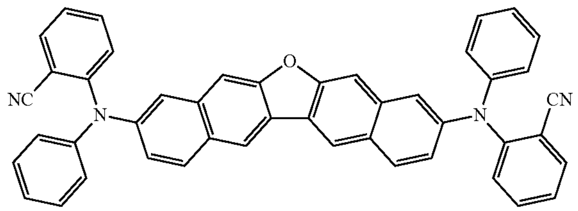
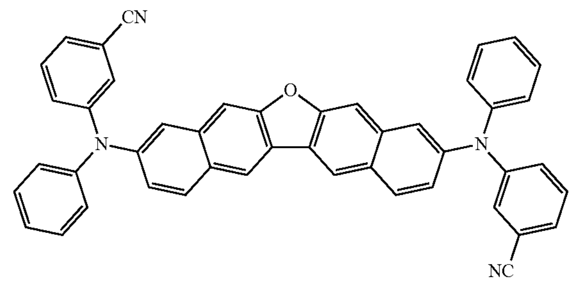
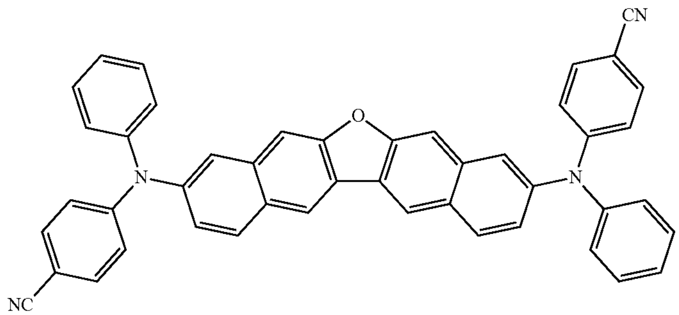
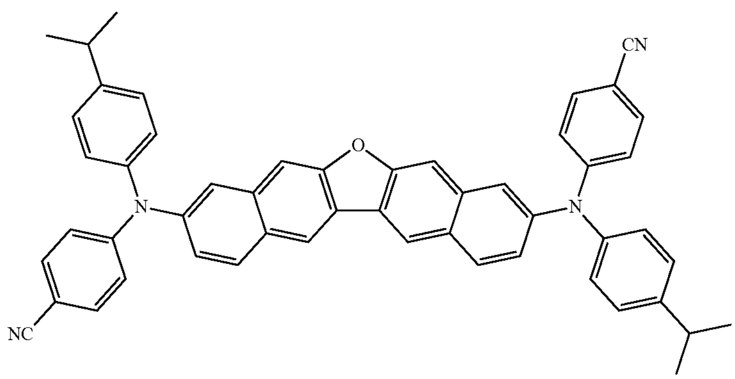
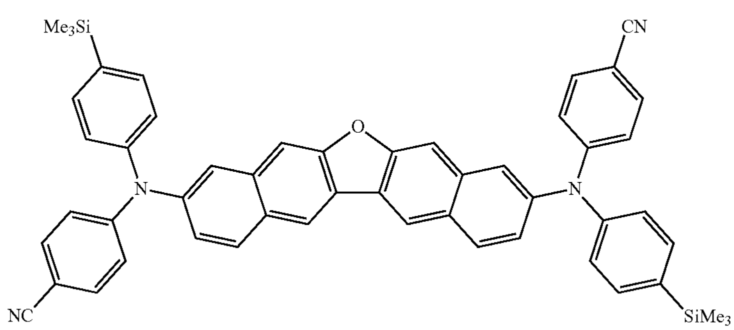
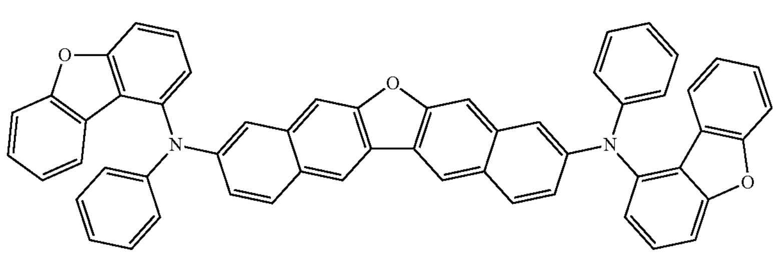

-continued
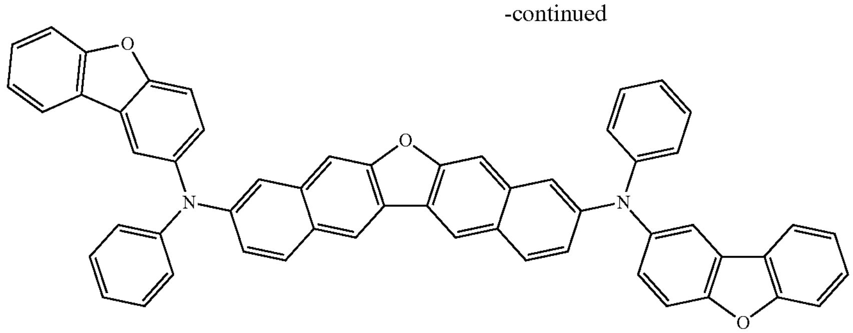
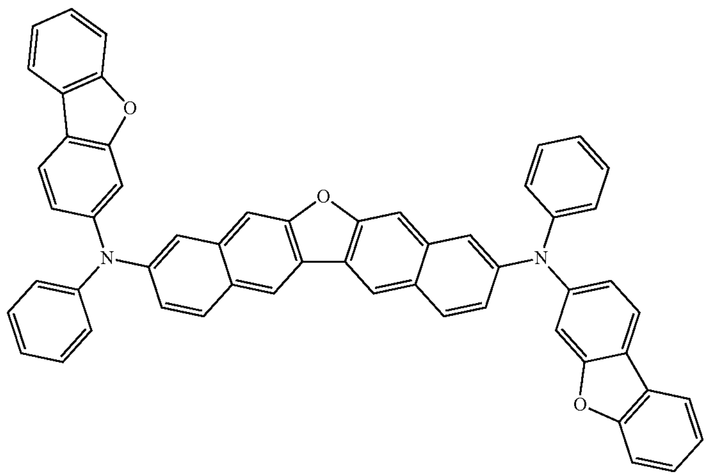
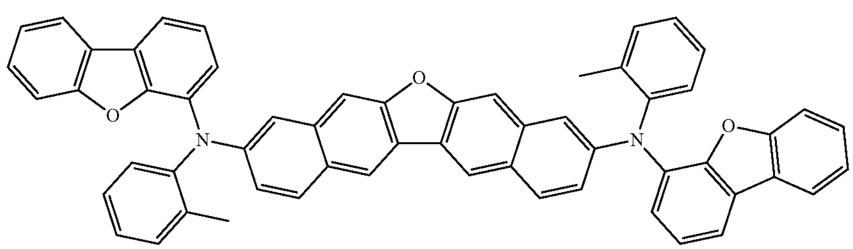
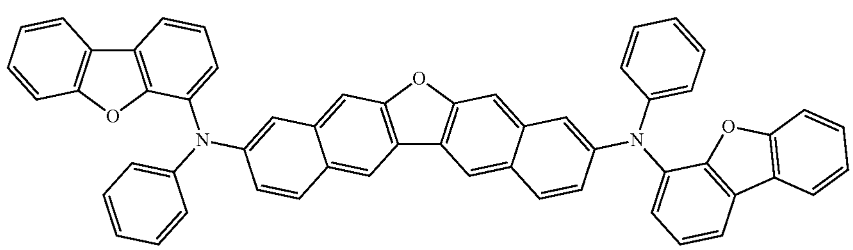
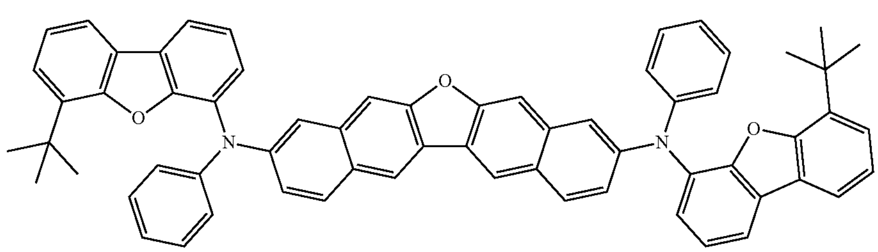

-continued
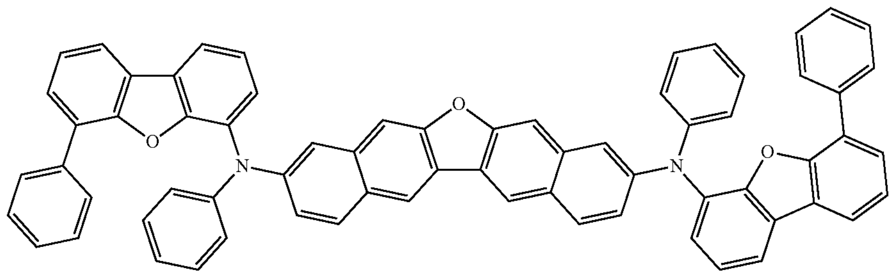
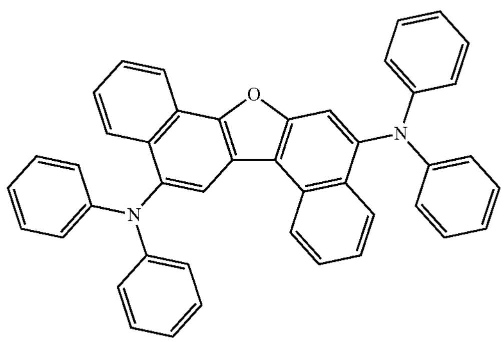
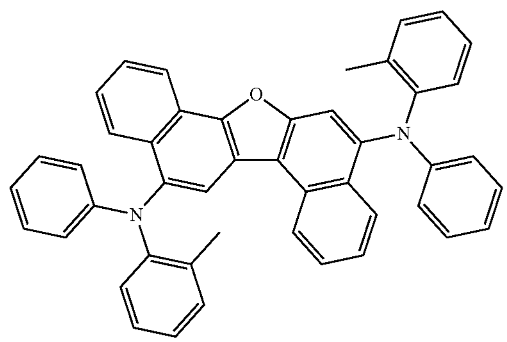
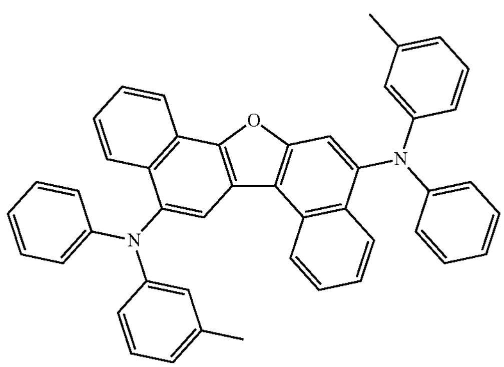
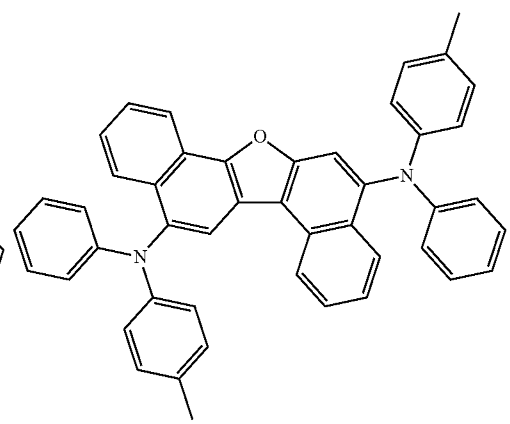
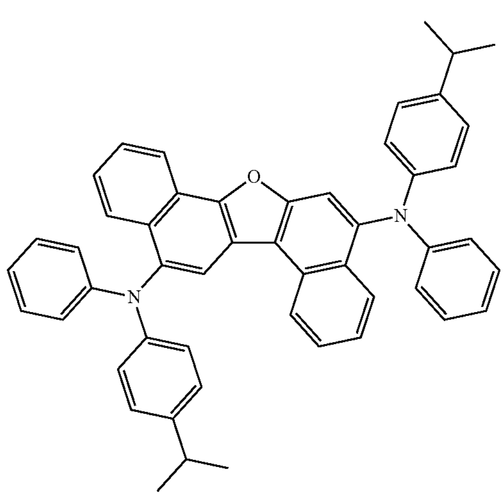
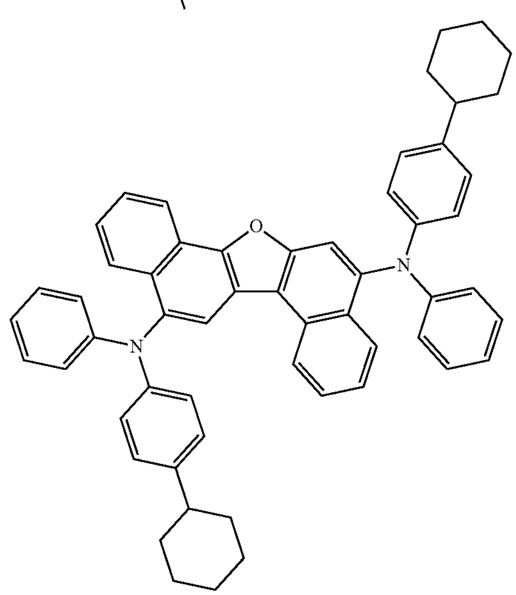

-continued
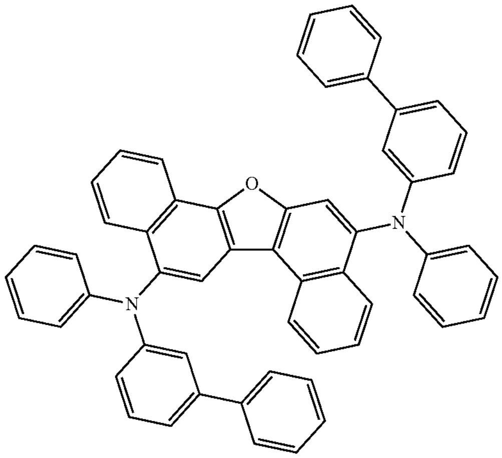
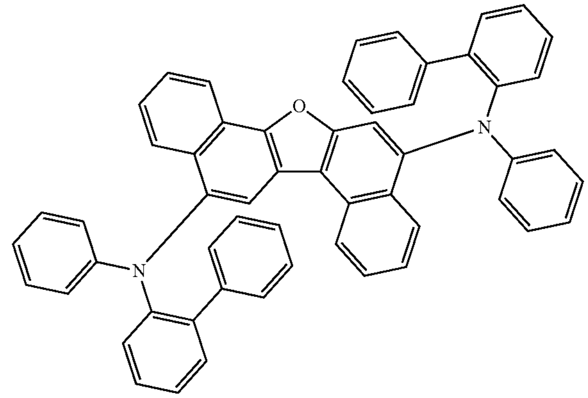
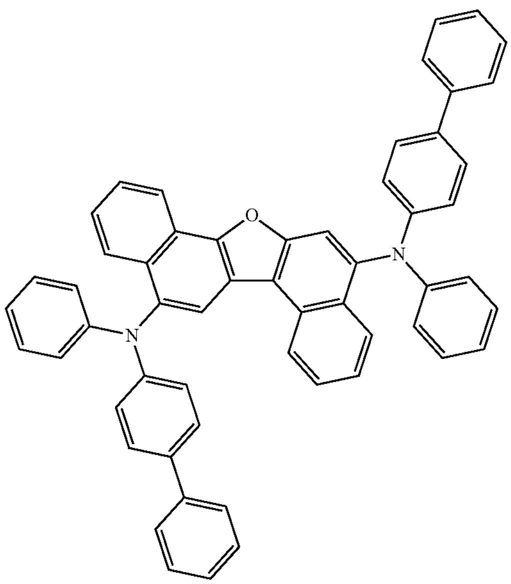
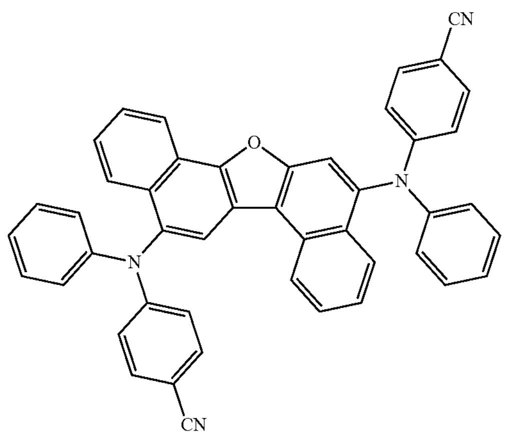
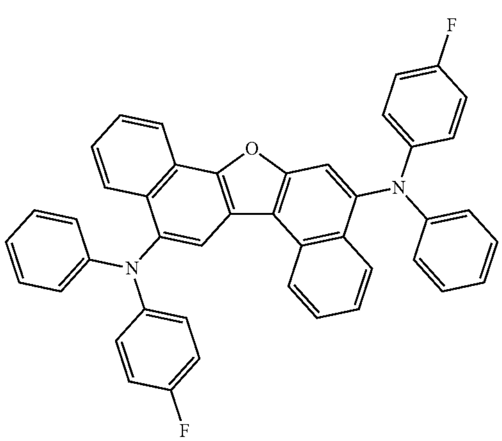
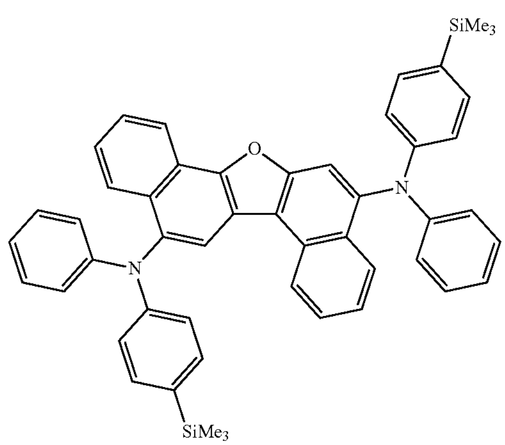

-continued
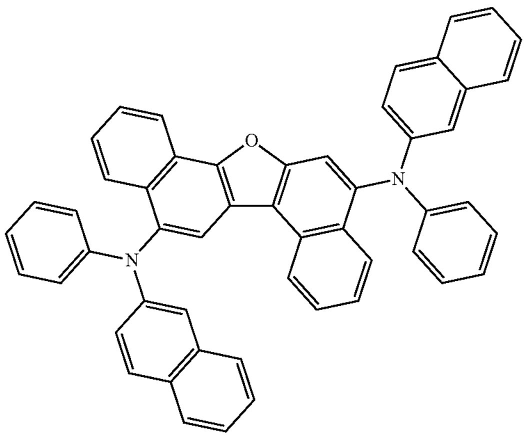
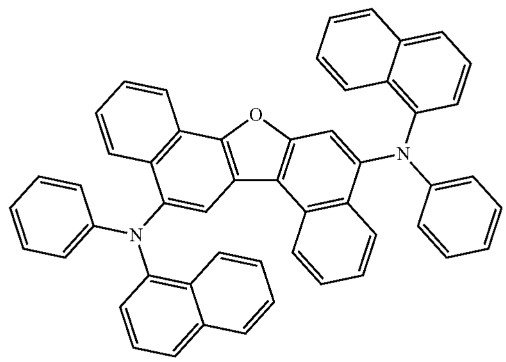
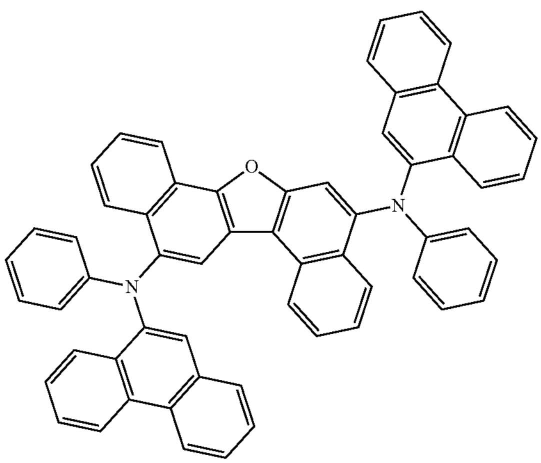
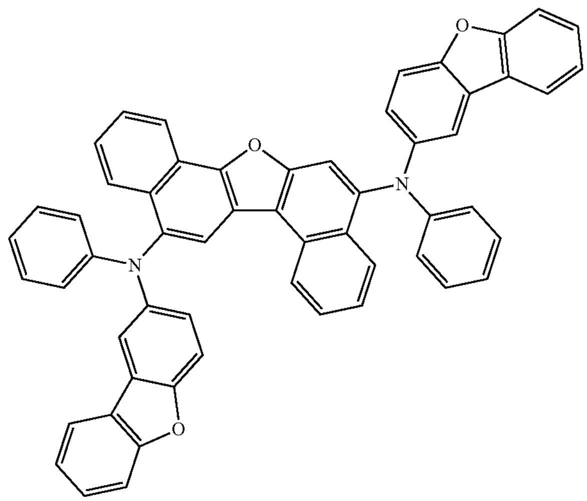
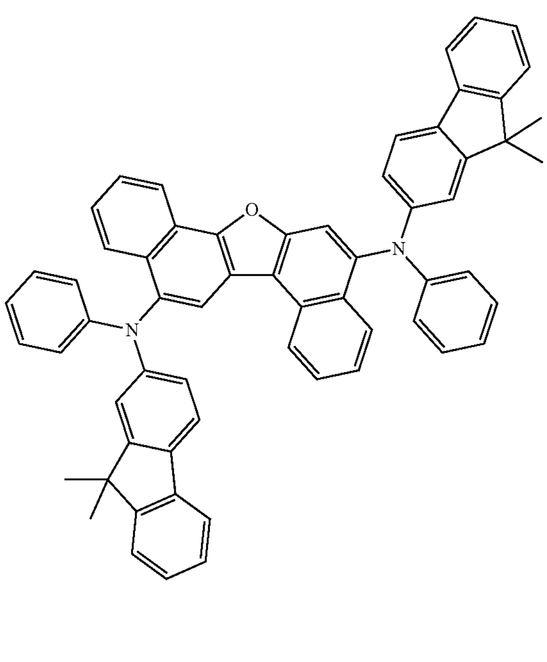
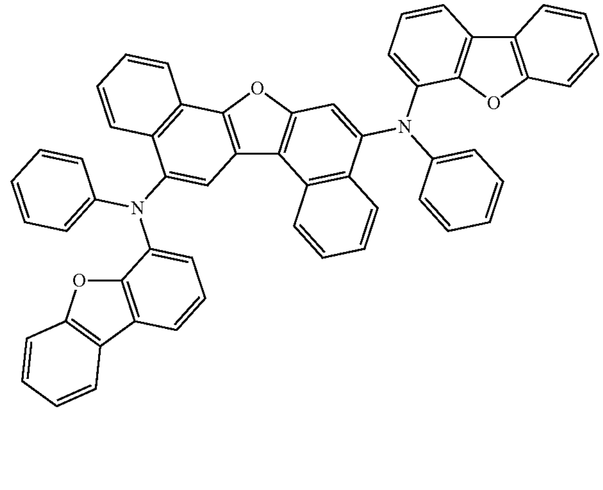

-continued
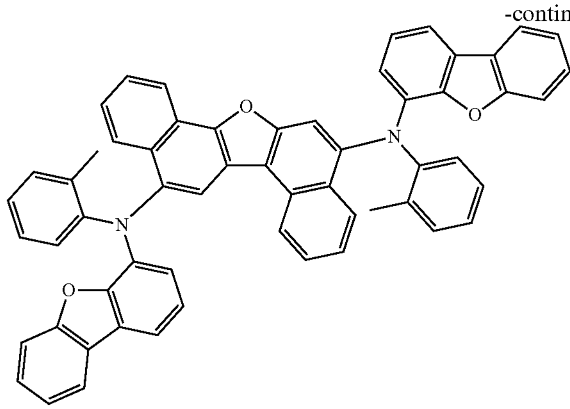
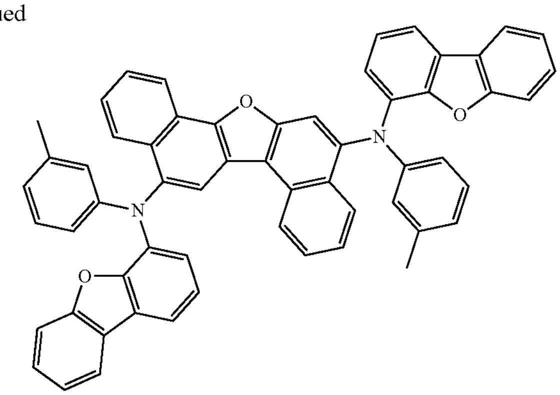
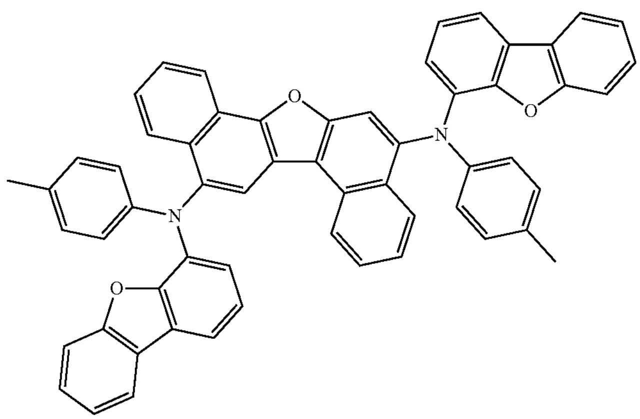
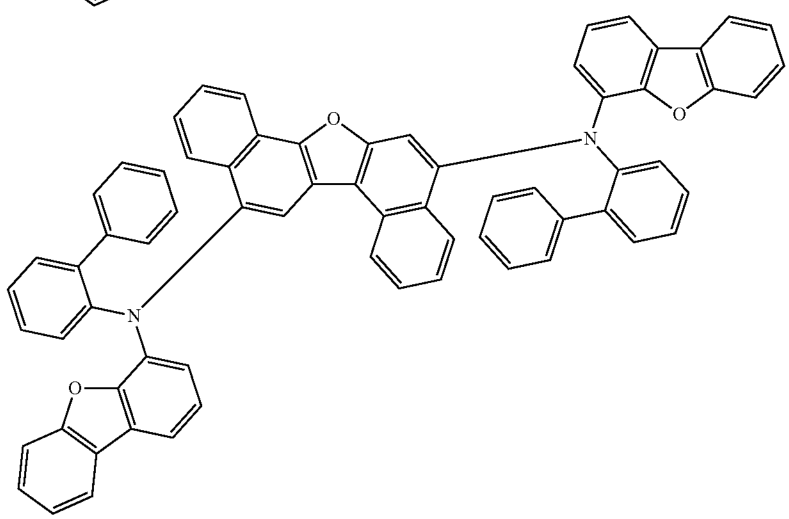
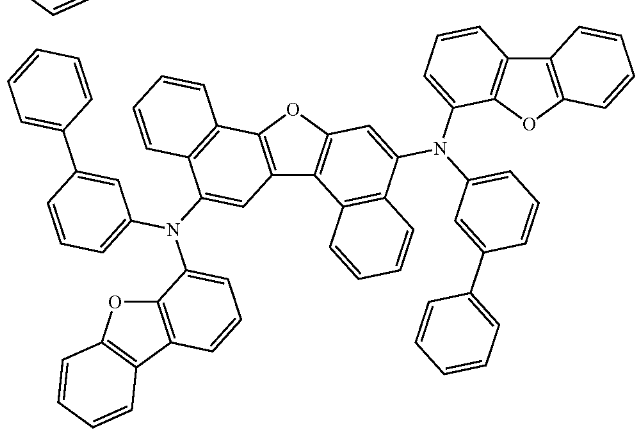

-continued
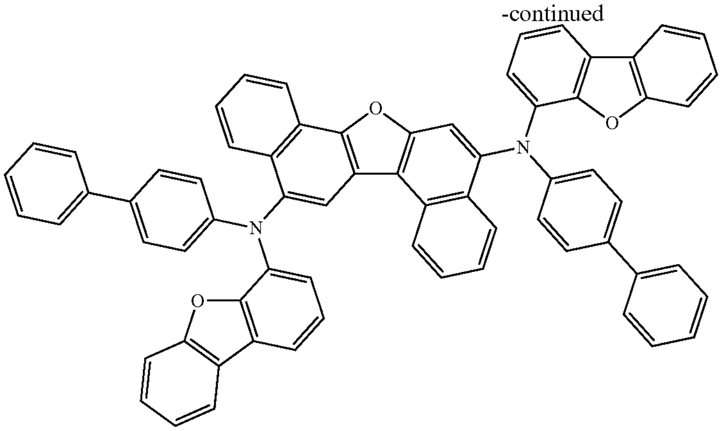
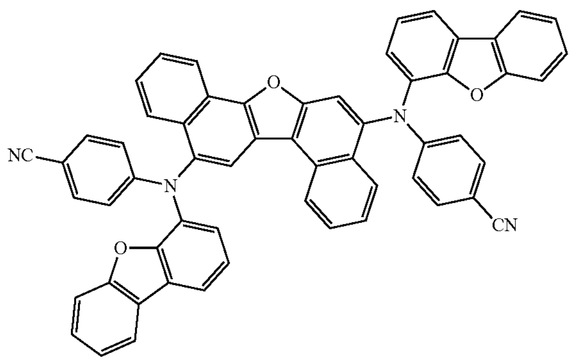
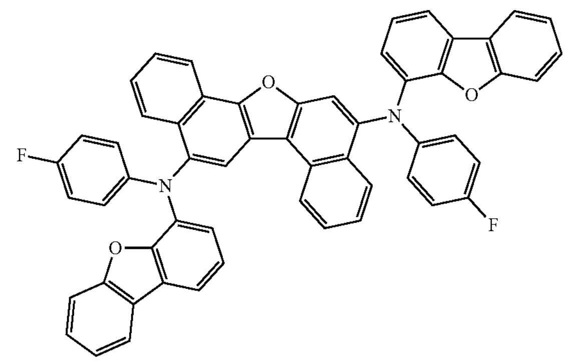
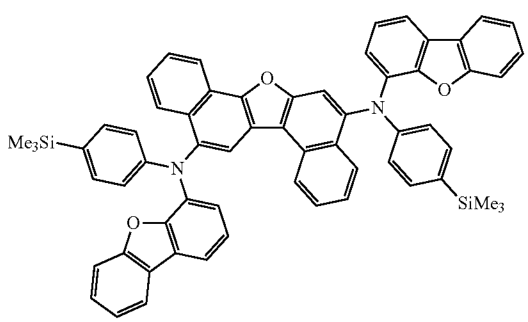
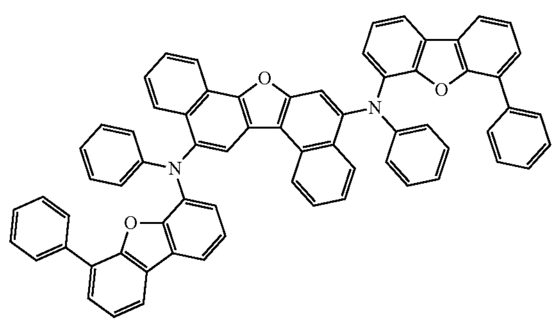
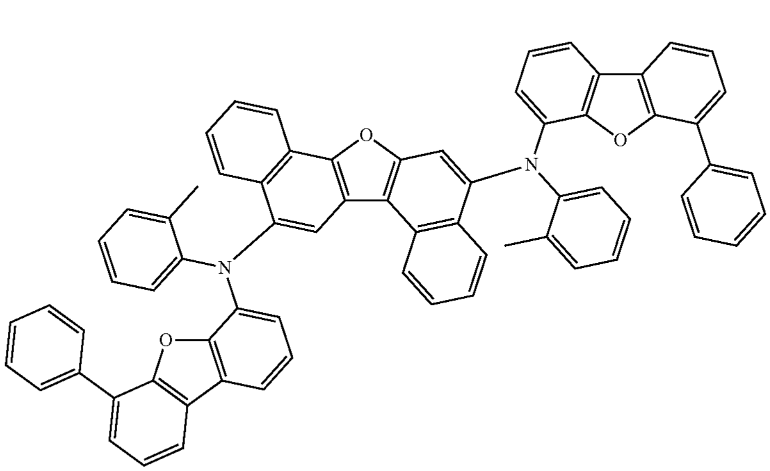

-continued
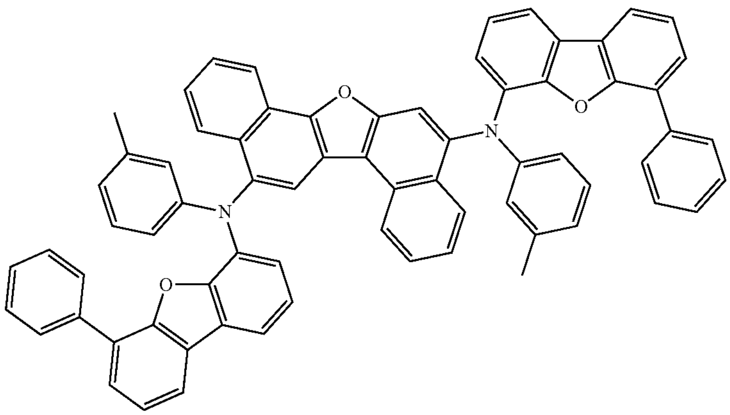
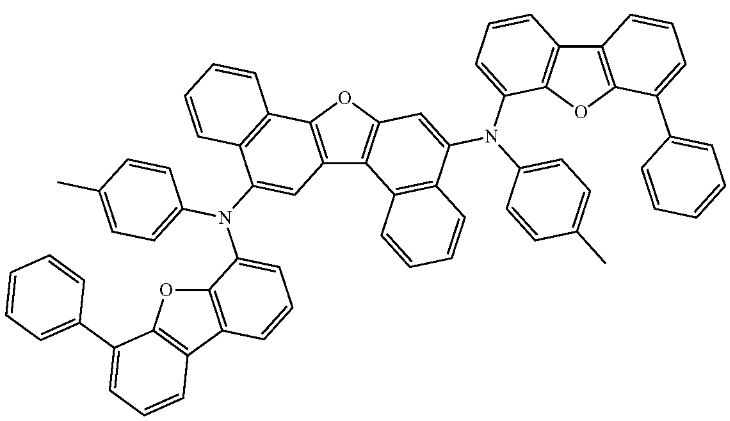
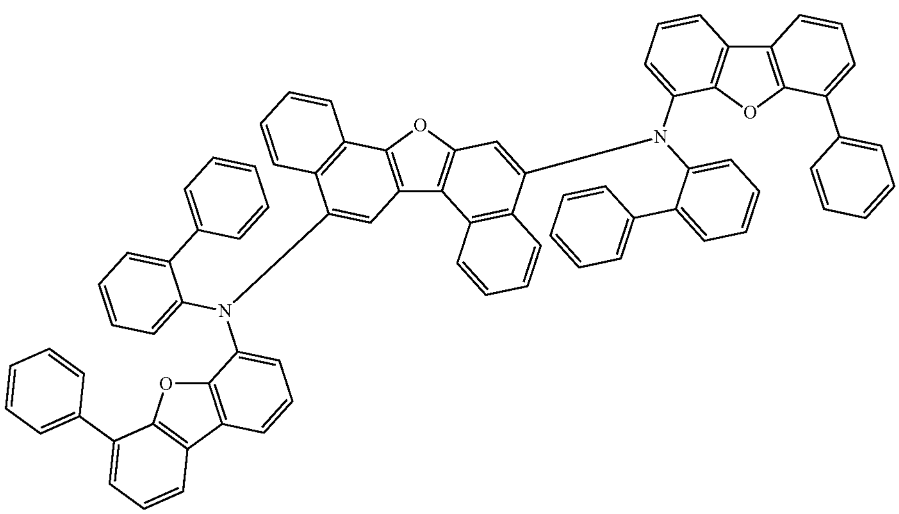

-continued
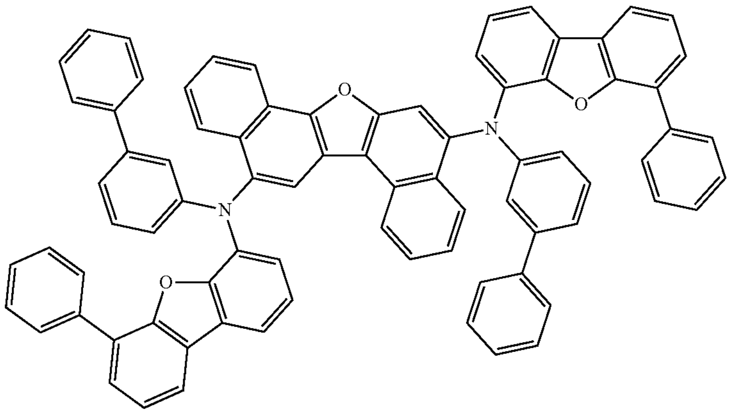
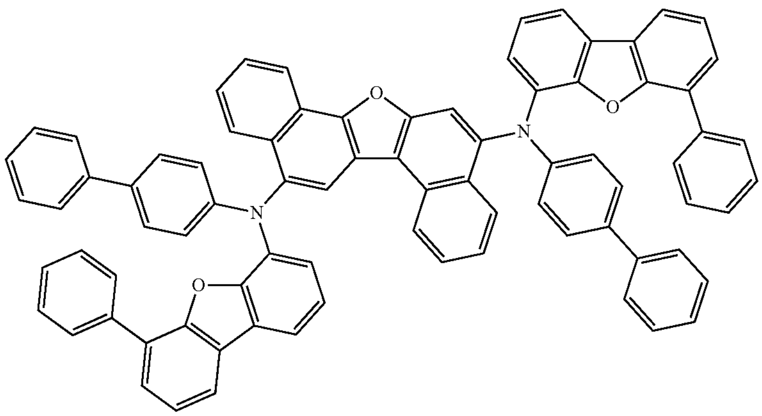
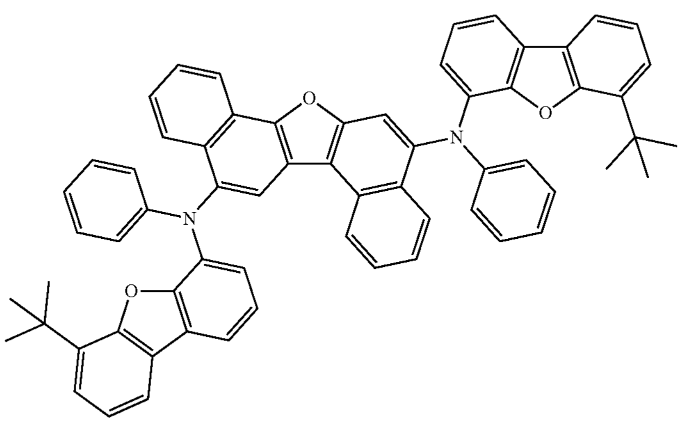
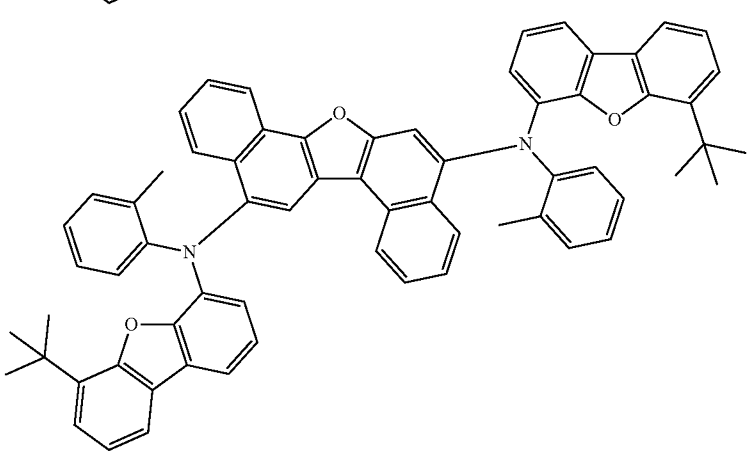

-continued
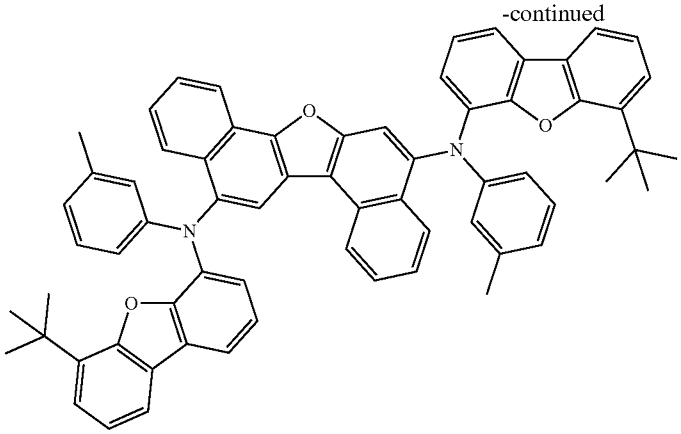
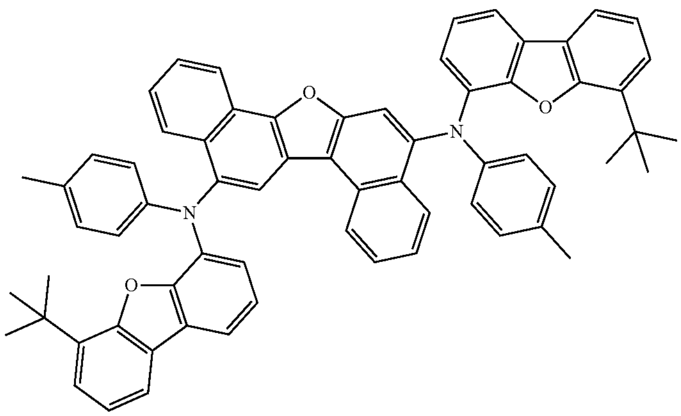
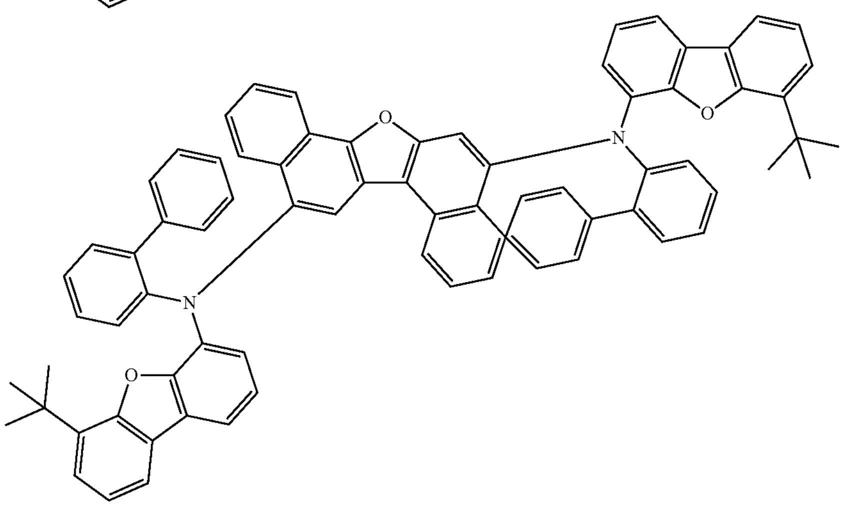
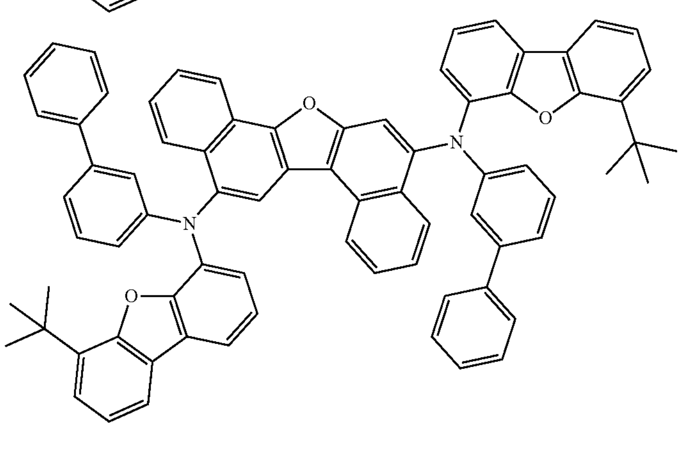

-continued
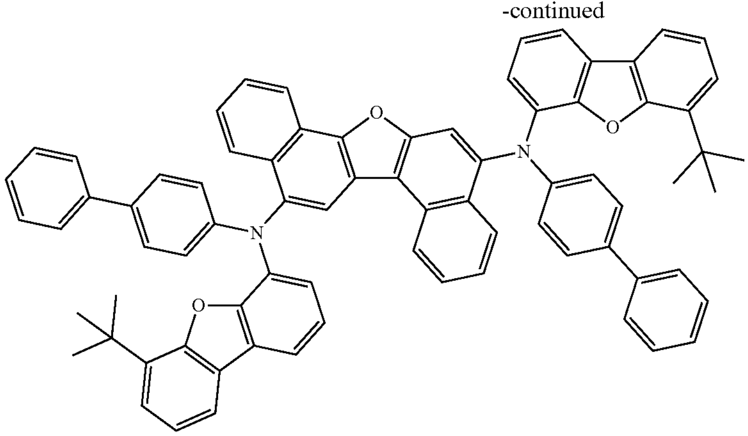
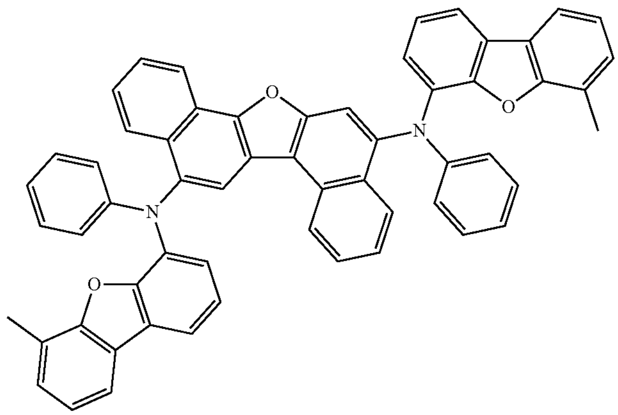
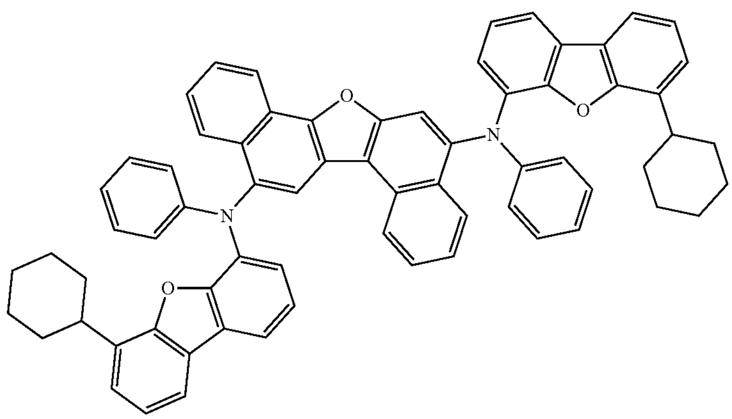
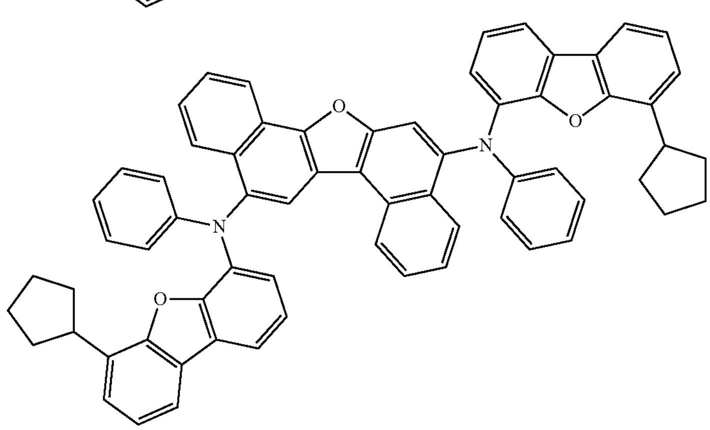

-continued
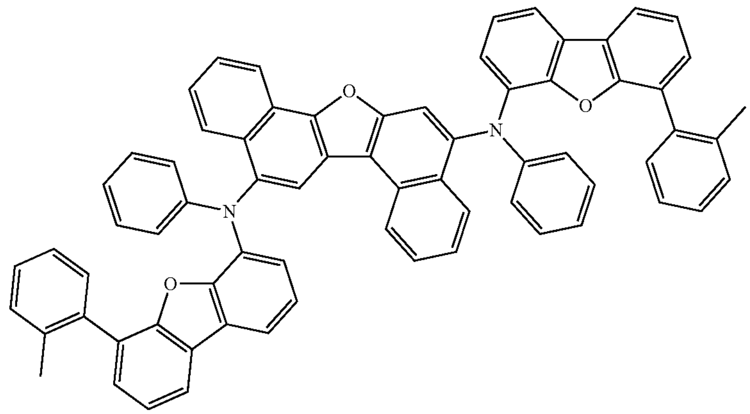
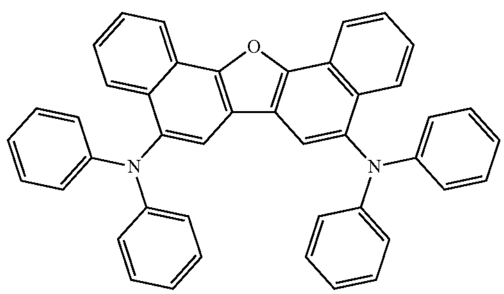
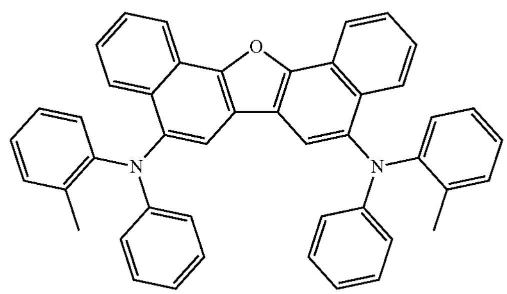
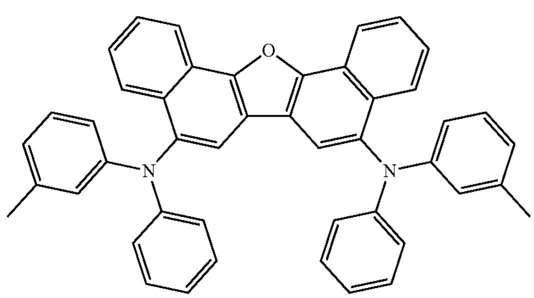
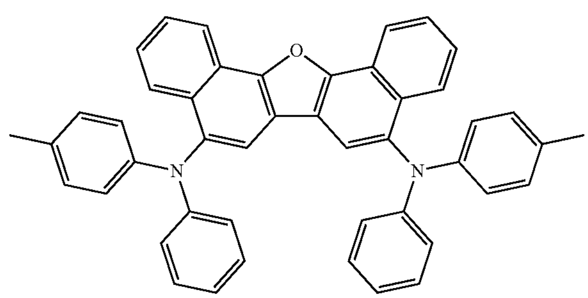
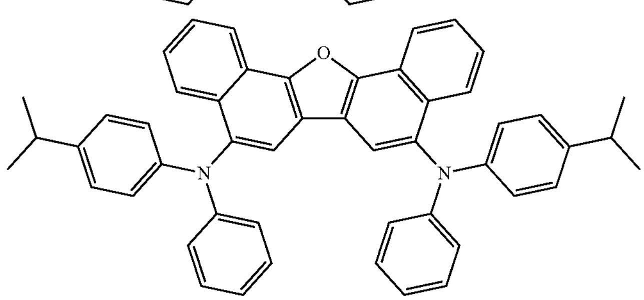
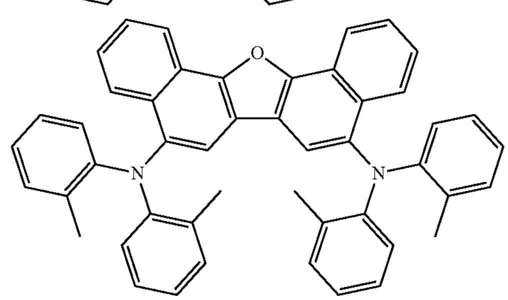
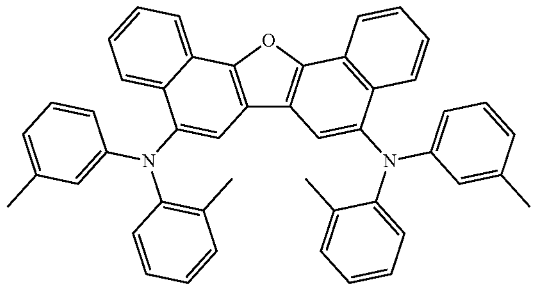
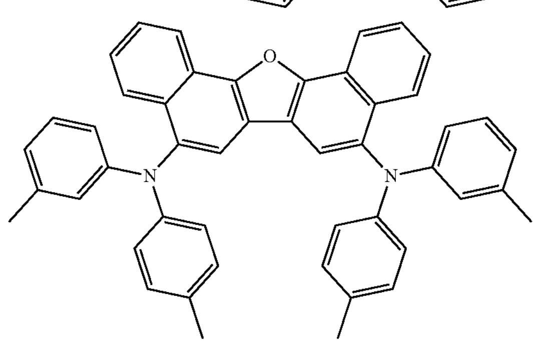

-continued
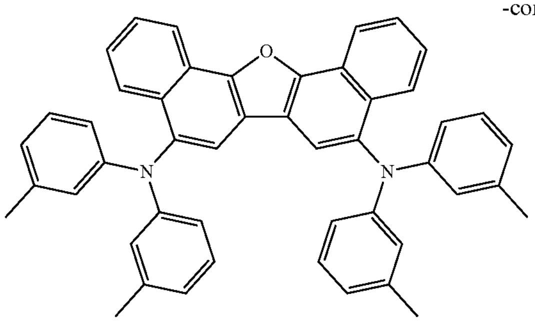
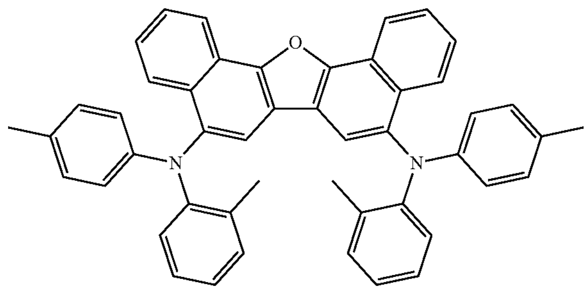
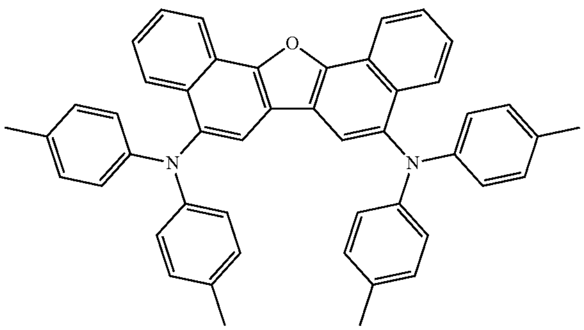
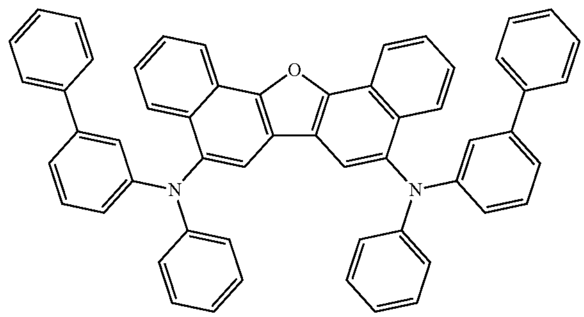
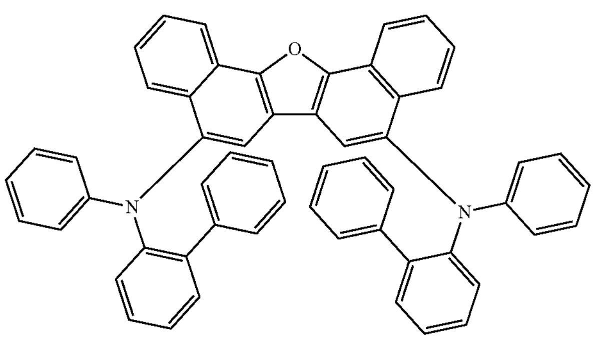
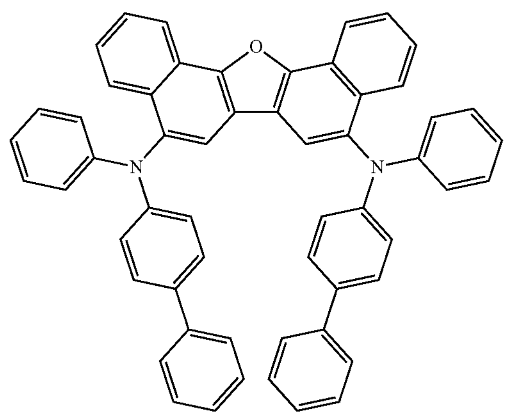
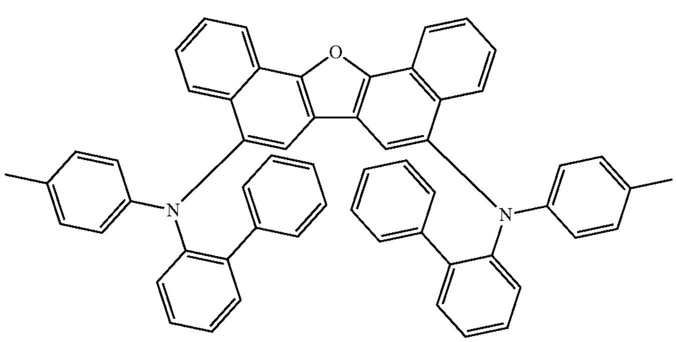

-continued
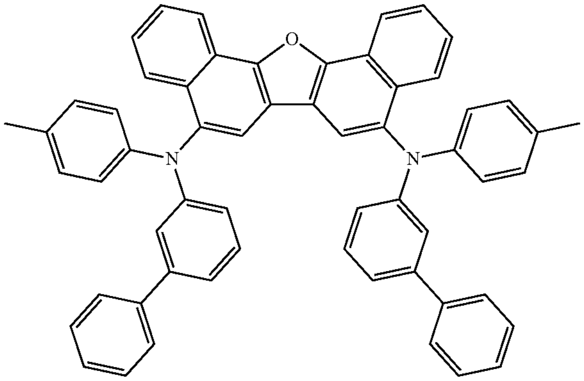
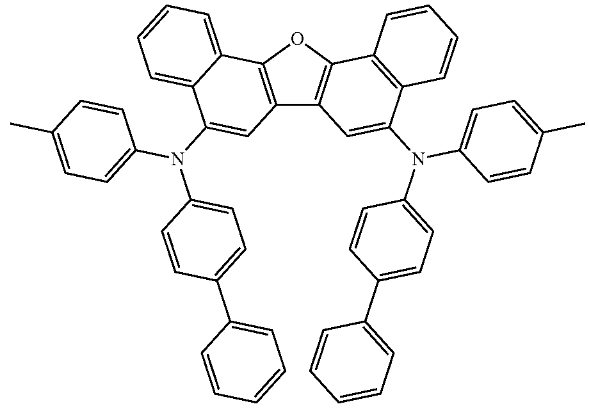
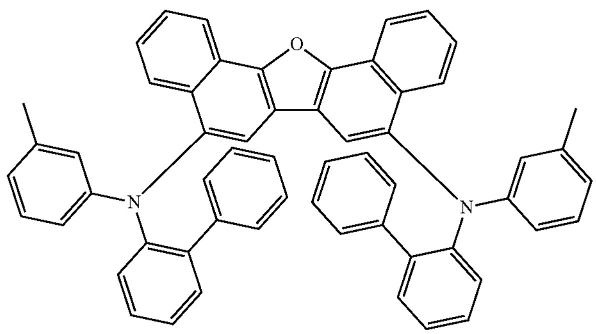
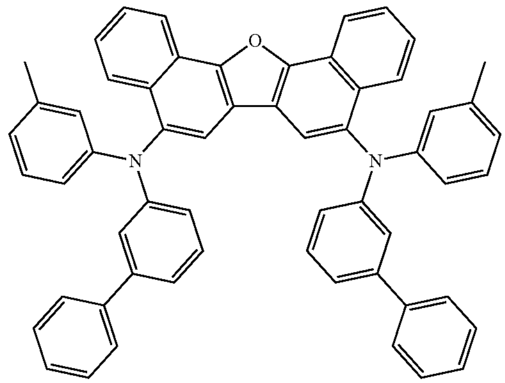
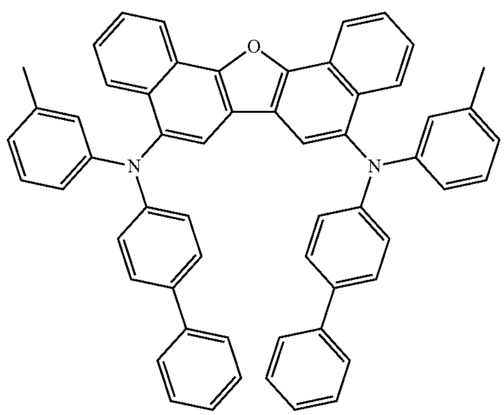
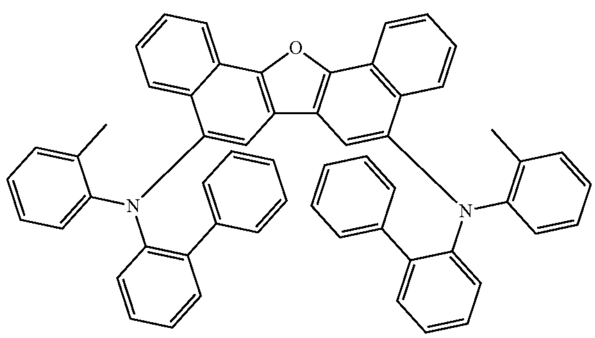
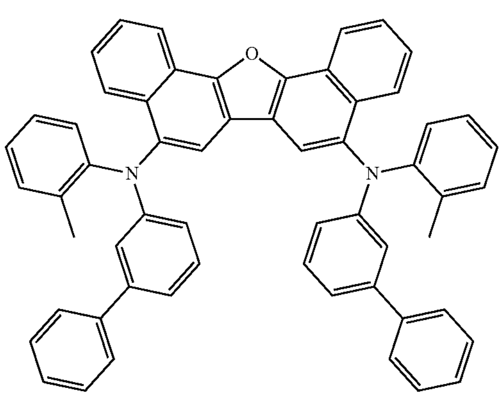
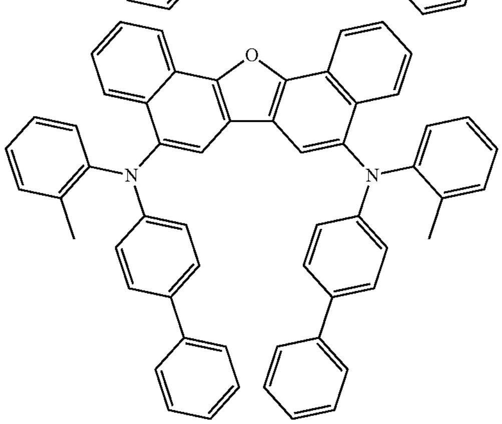

-continued
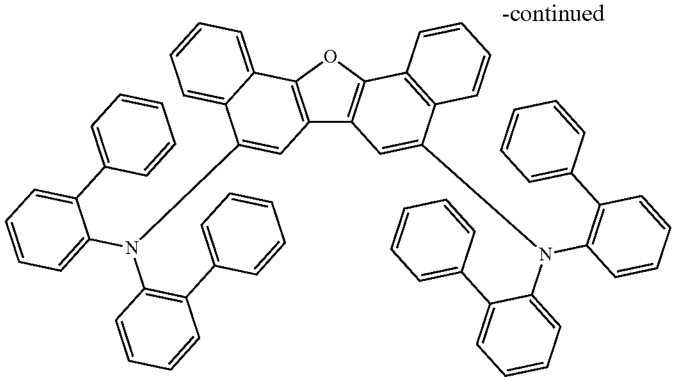
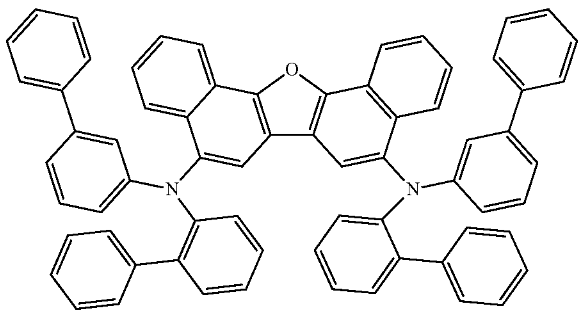
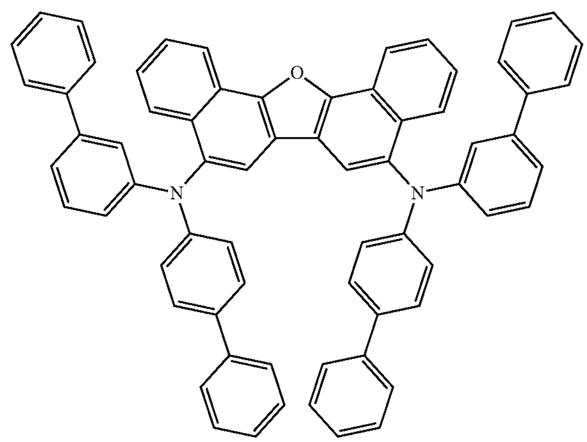
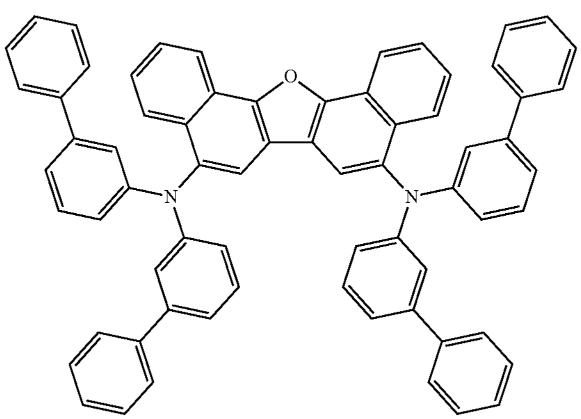
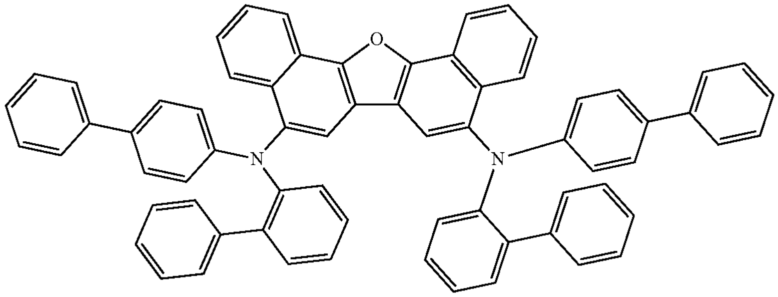

-continued
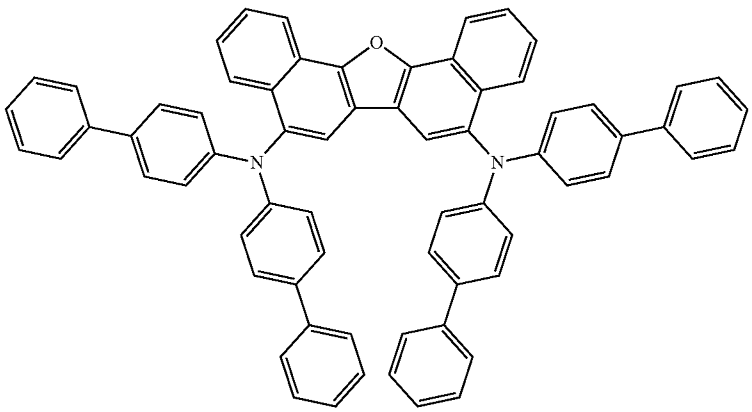
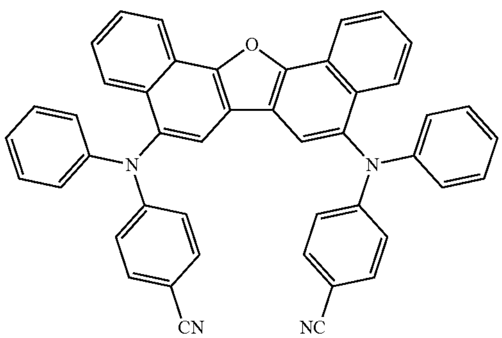
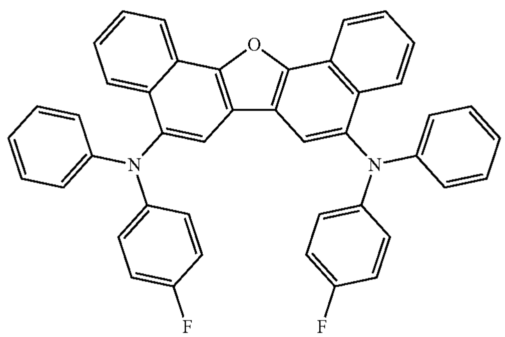
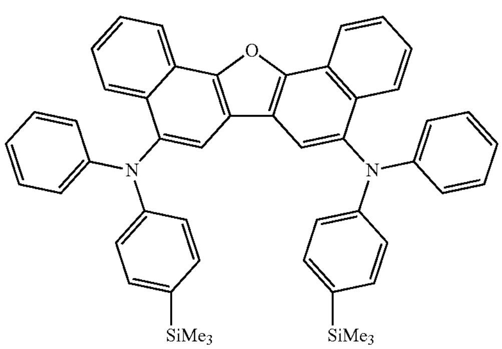
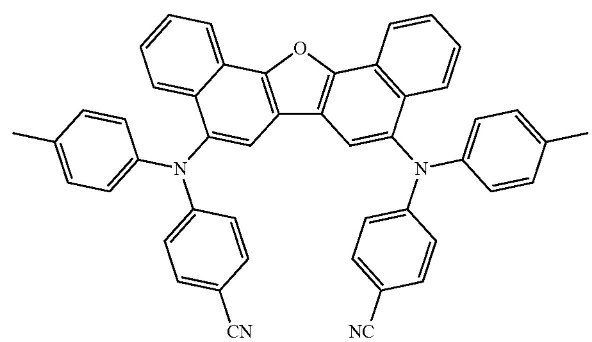
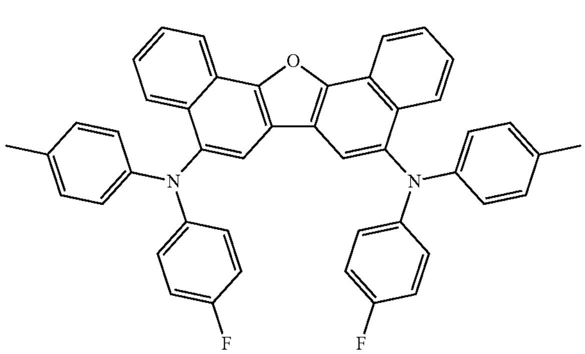
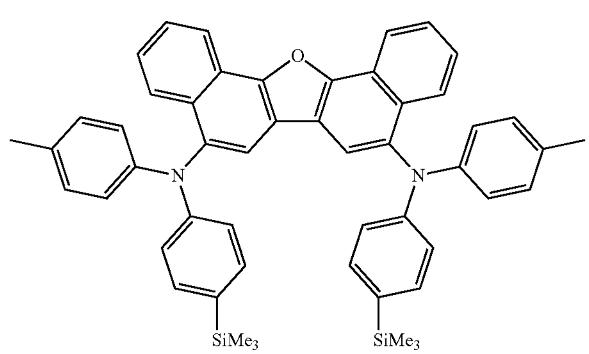

-continued
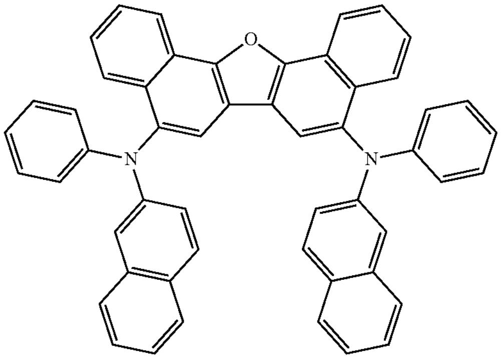
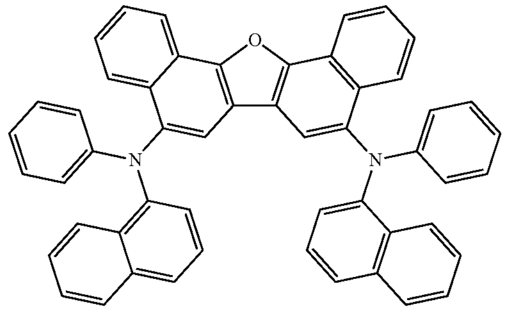
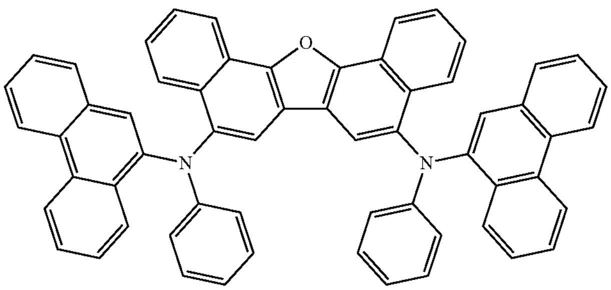
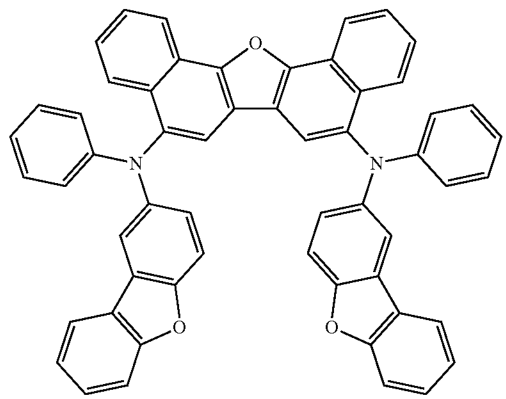
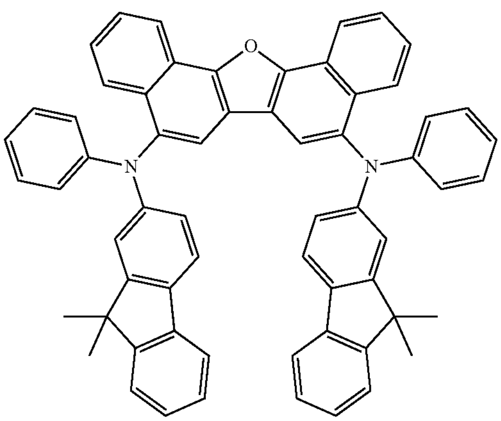
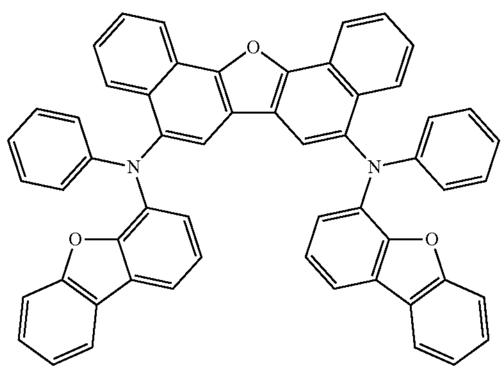
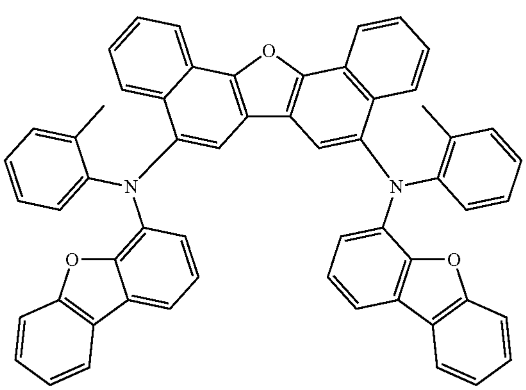
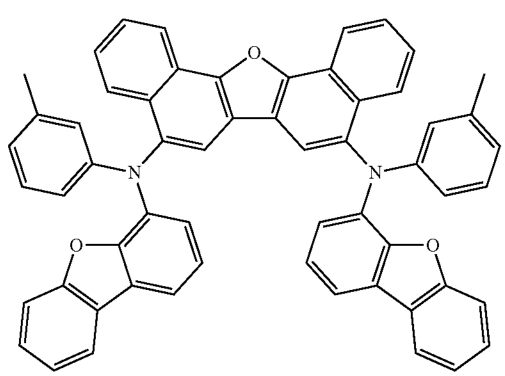

-continued
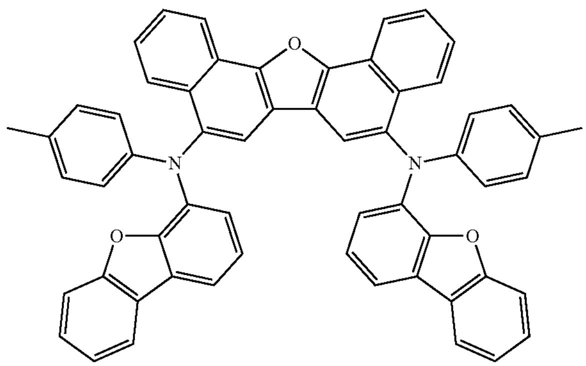
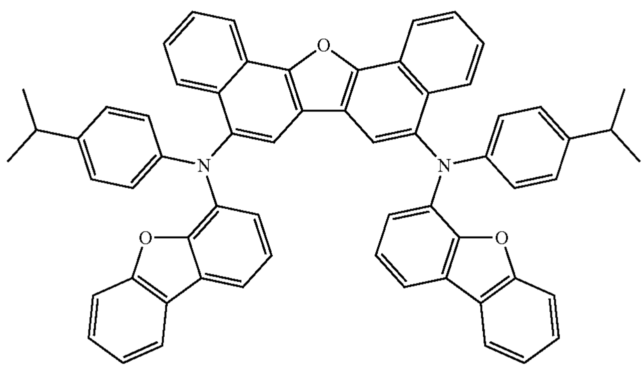
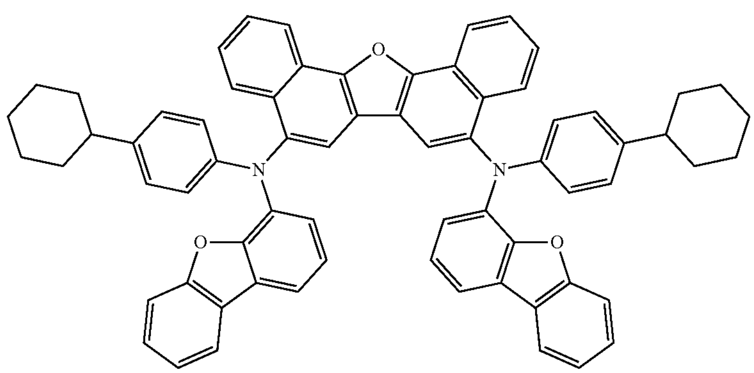
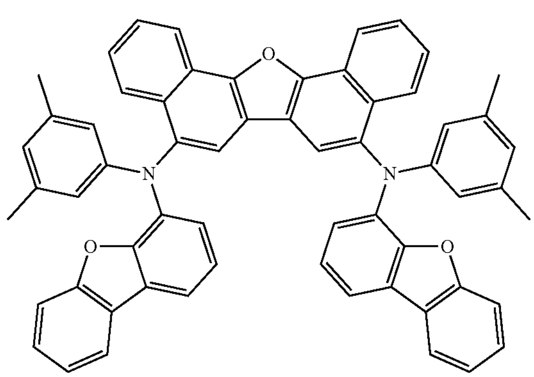
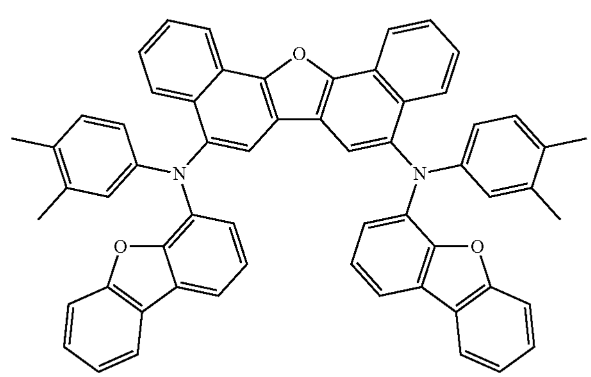

-continued
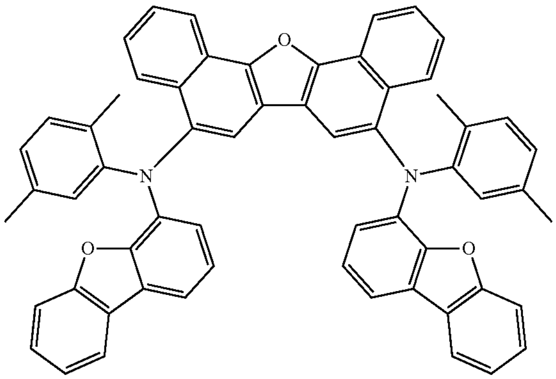
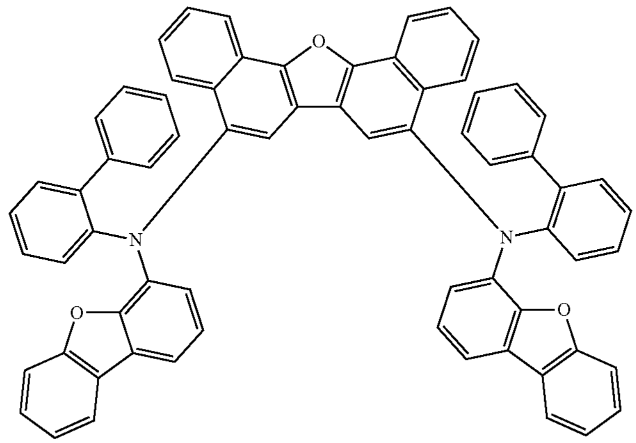
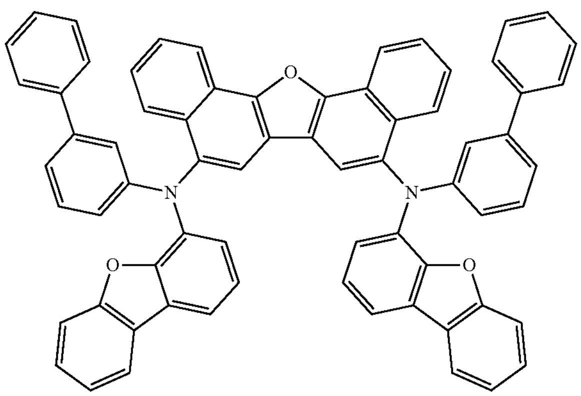
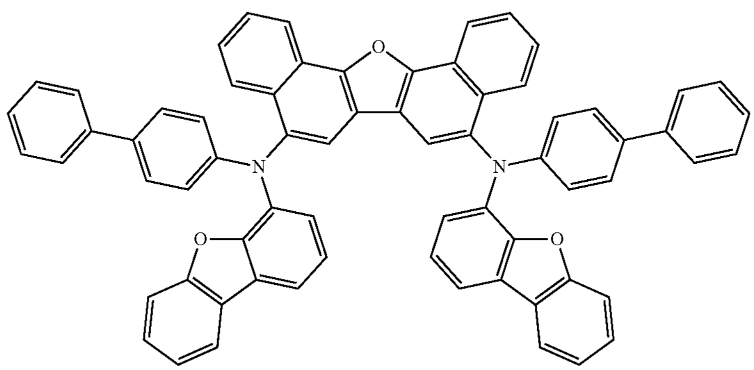
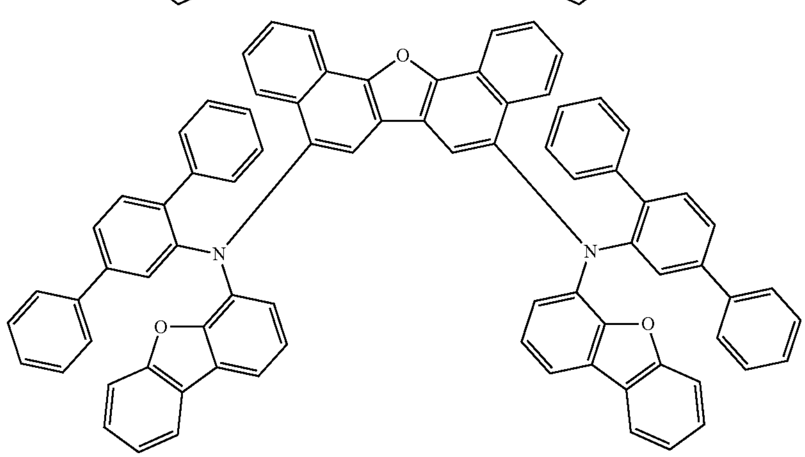

-continued
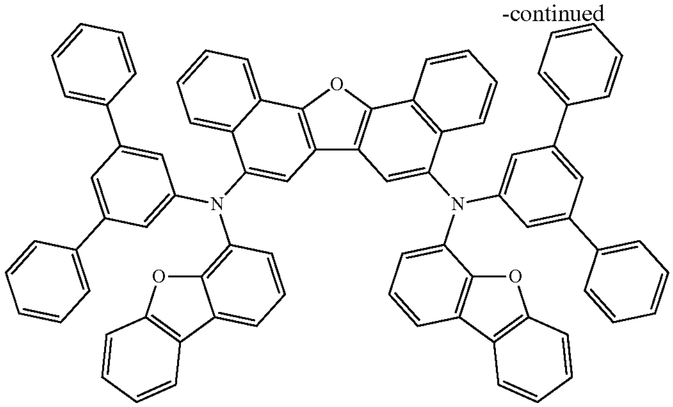
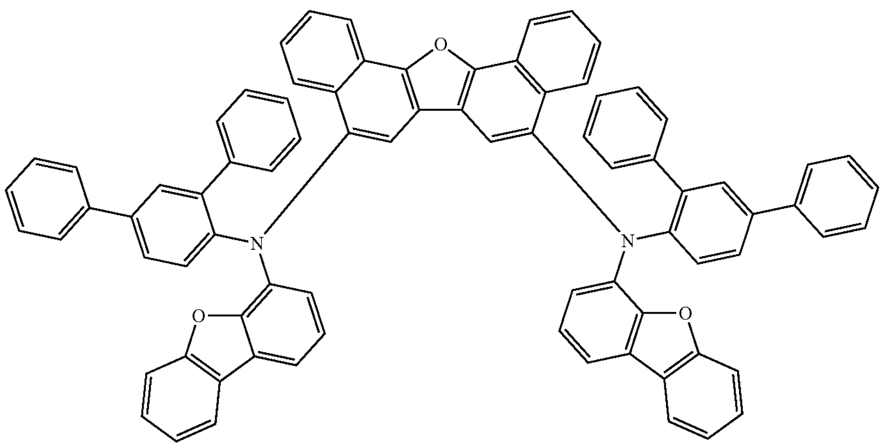
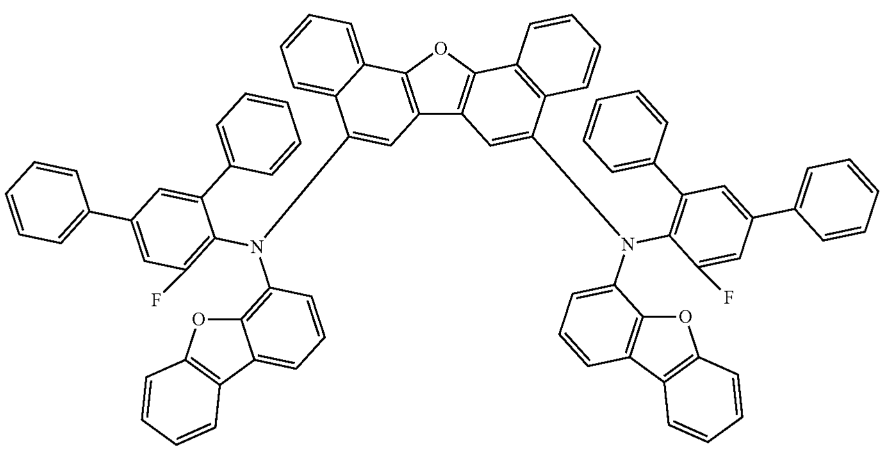
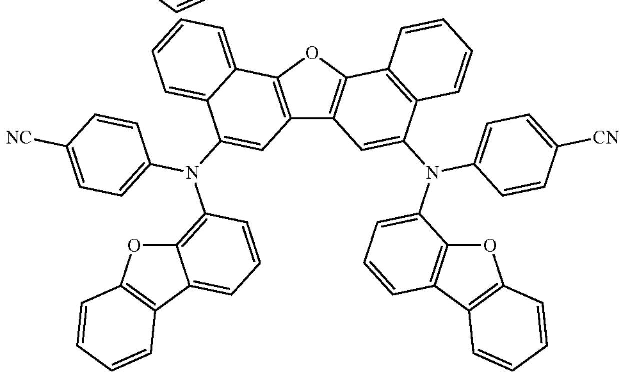

-continued
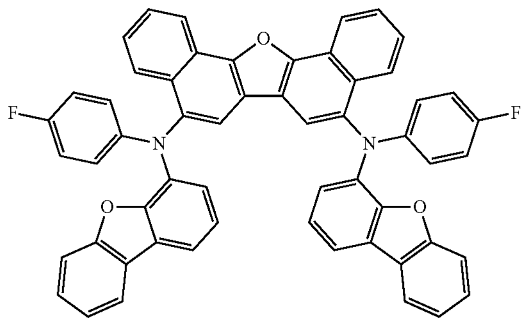
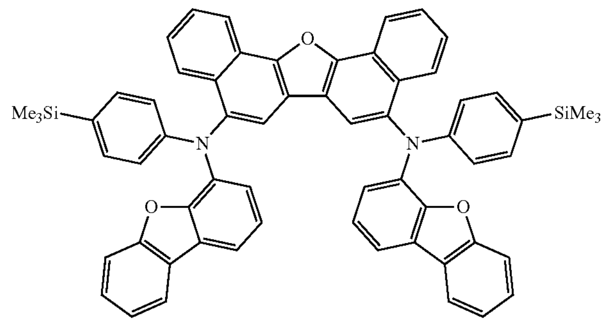
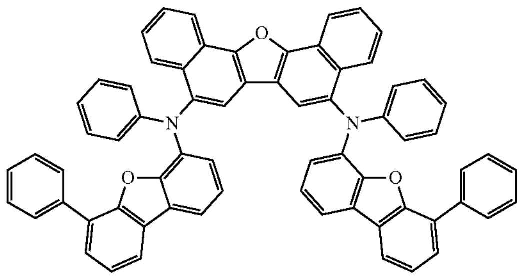
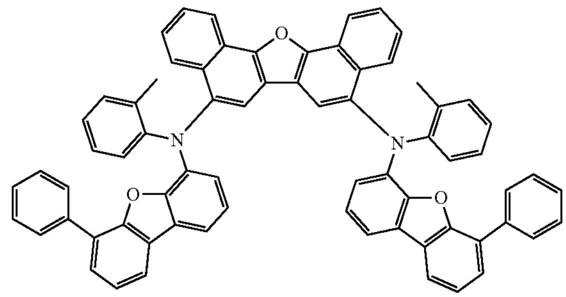
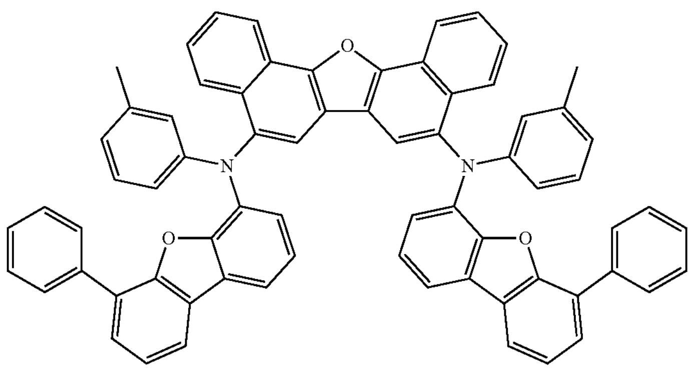
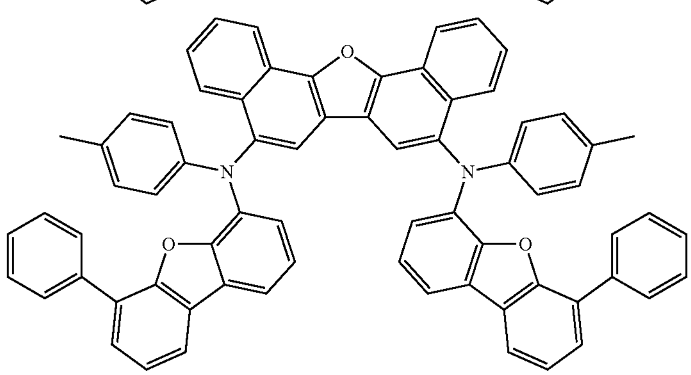
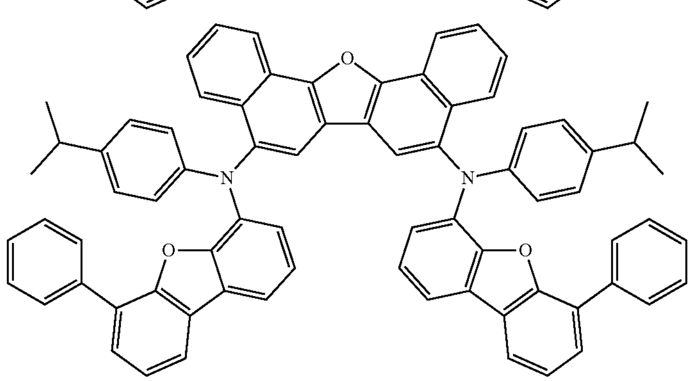

-continued
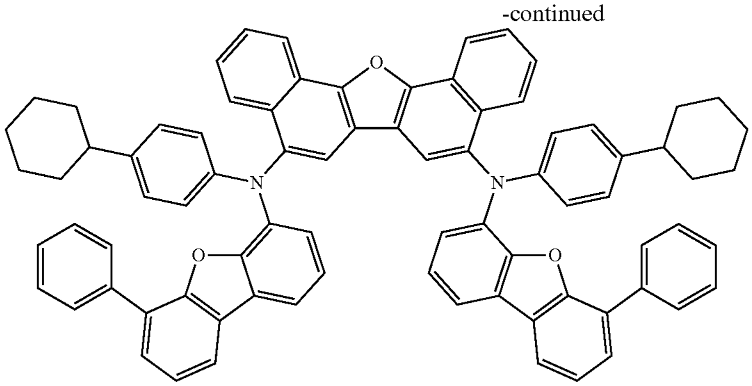
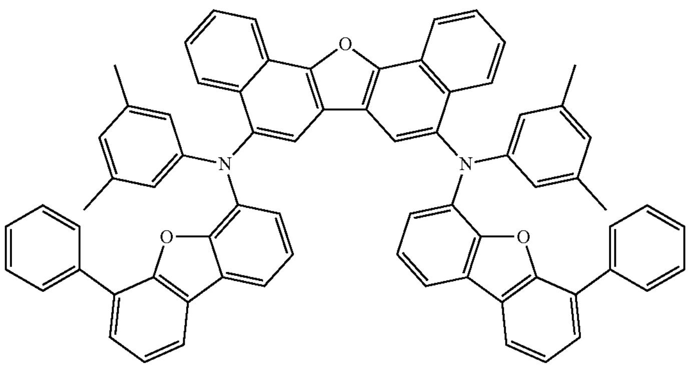
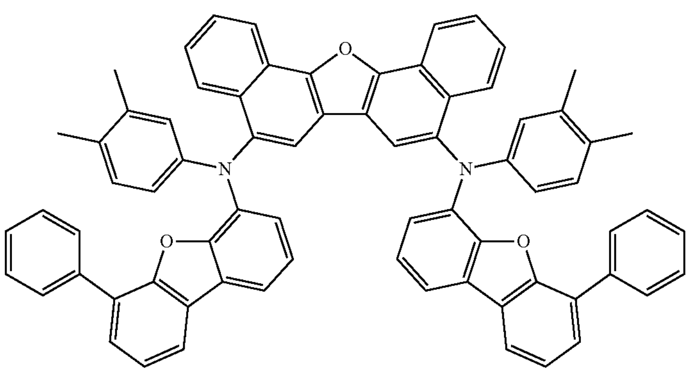
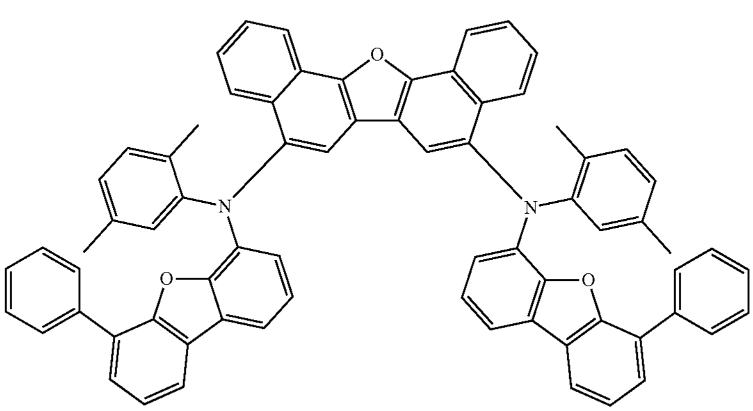

-continued
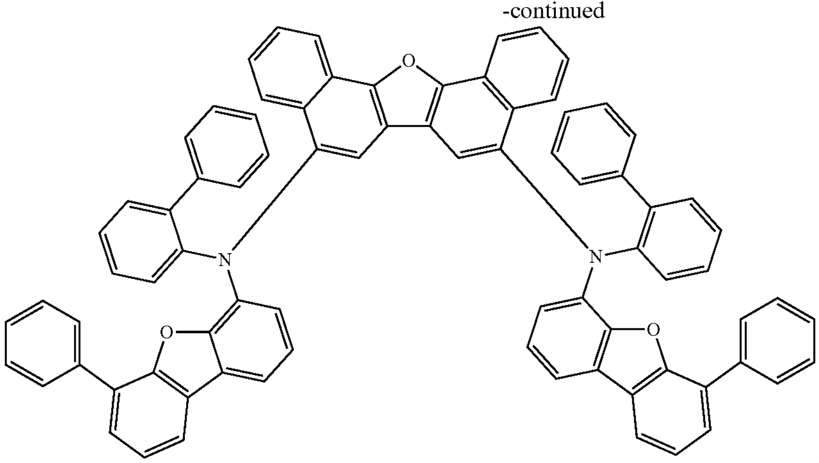
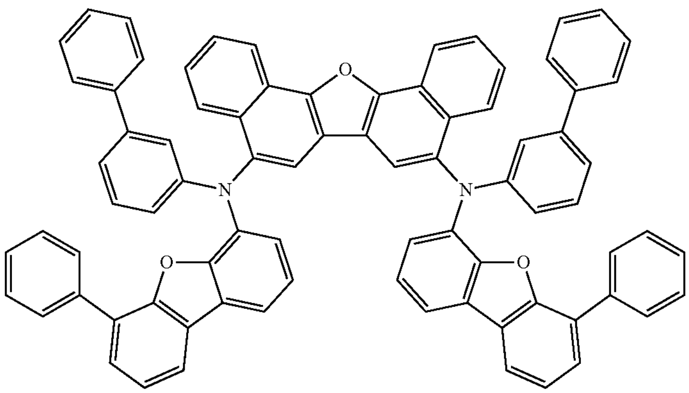
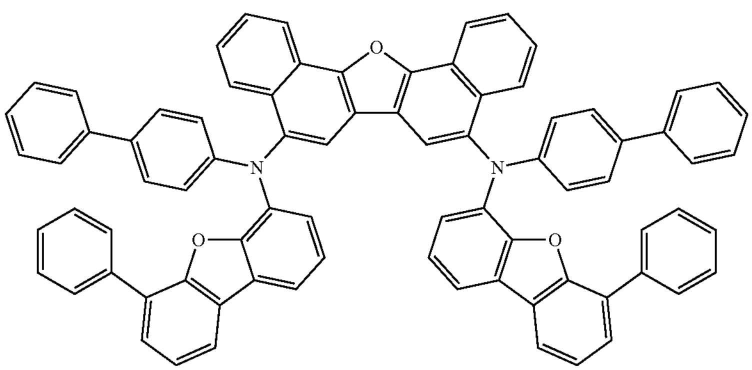
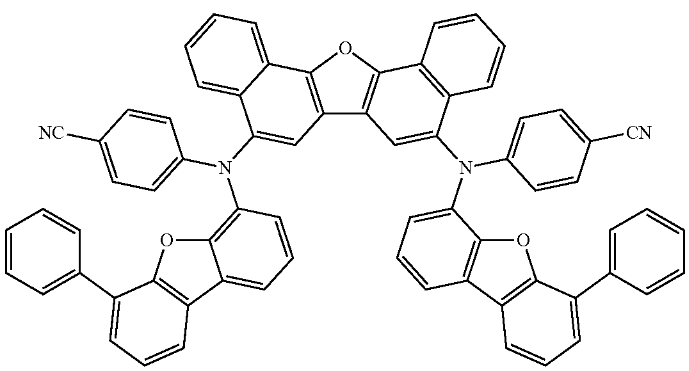

-continued
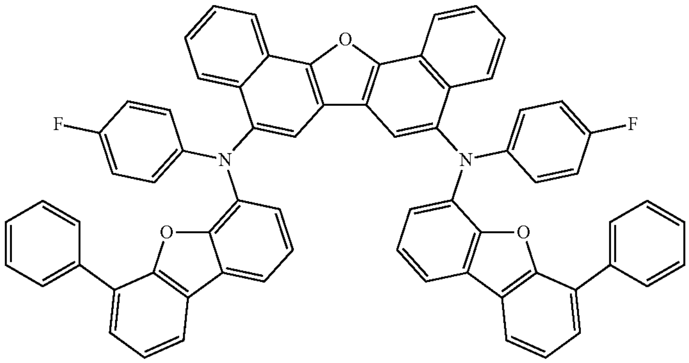
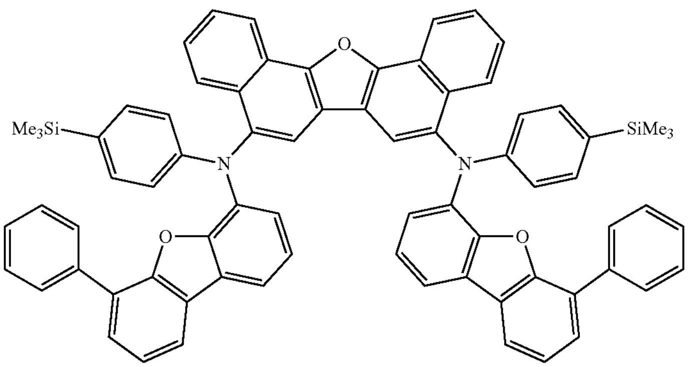
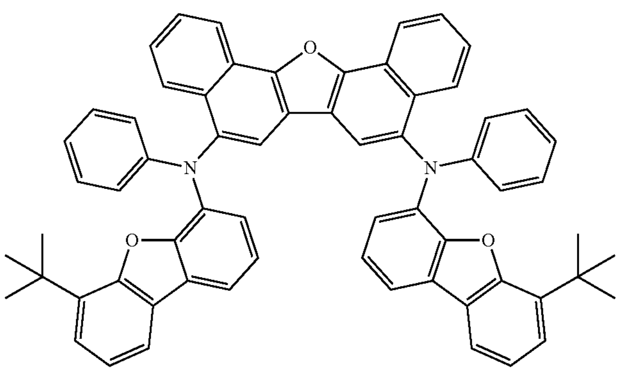
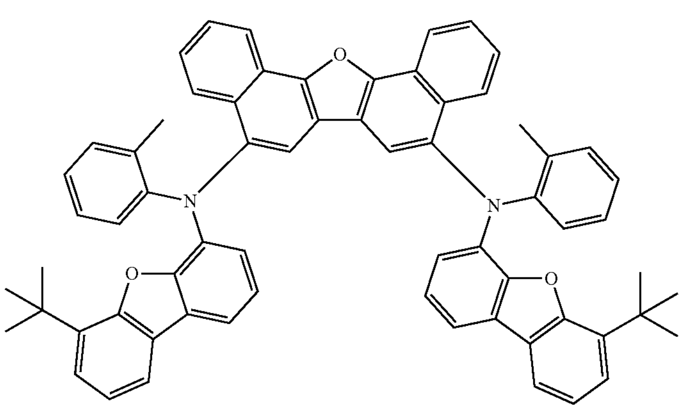

-continued
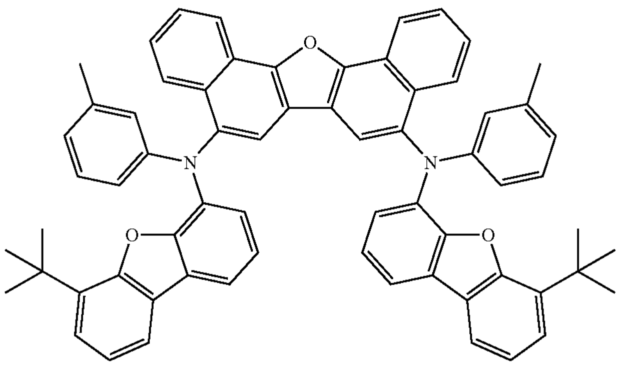
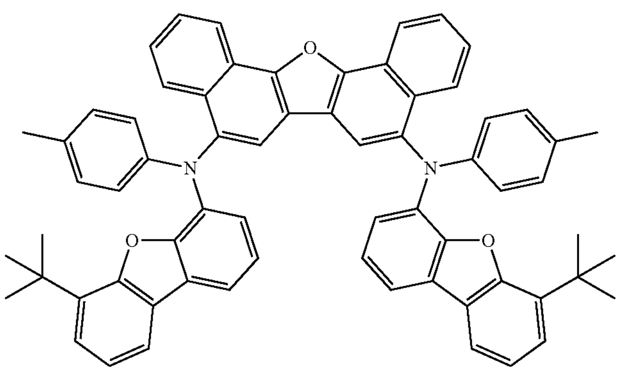
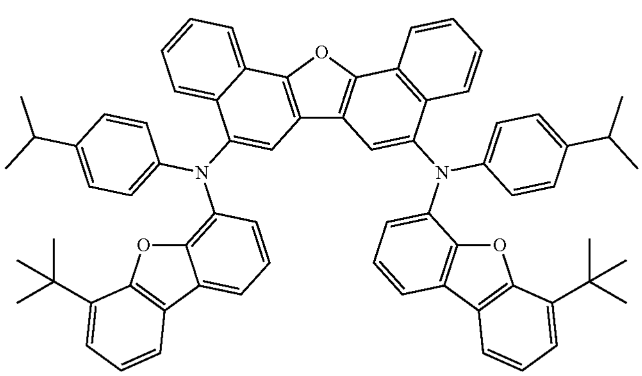
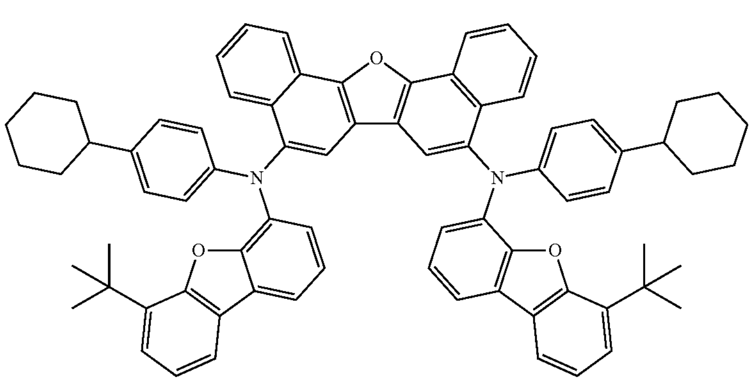

-continued
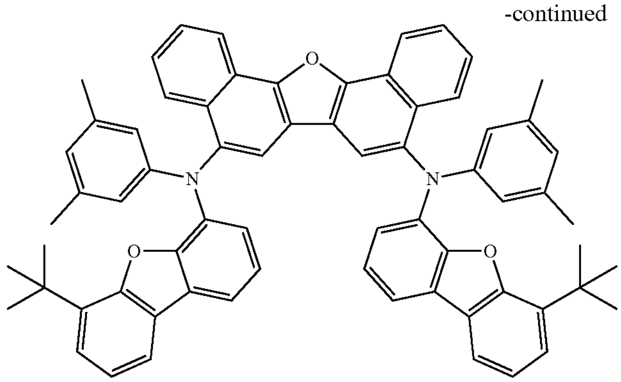
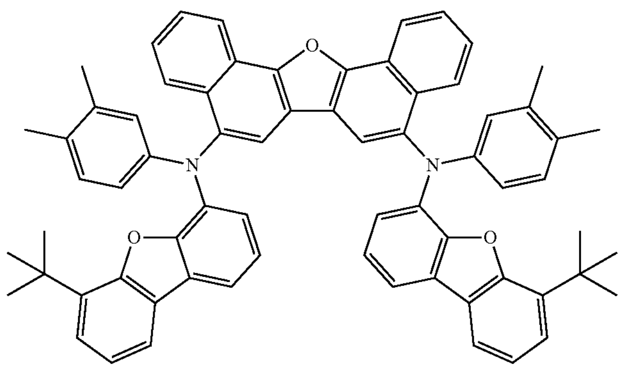
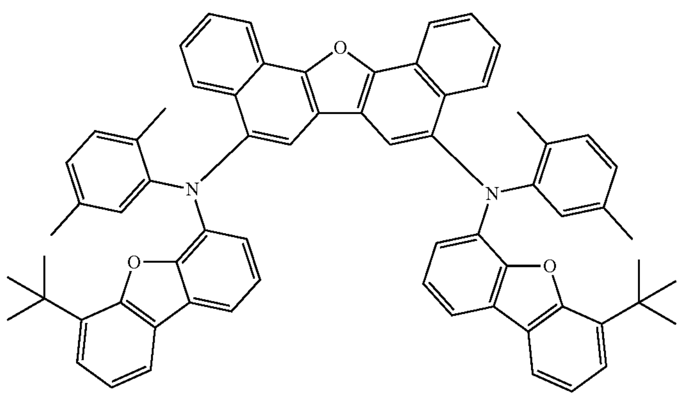
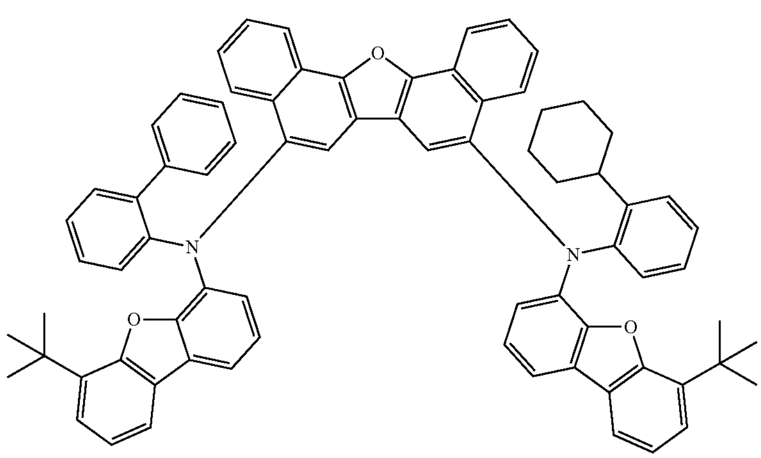

-continued
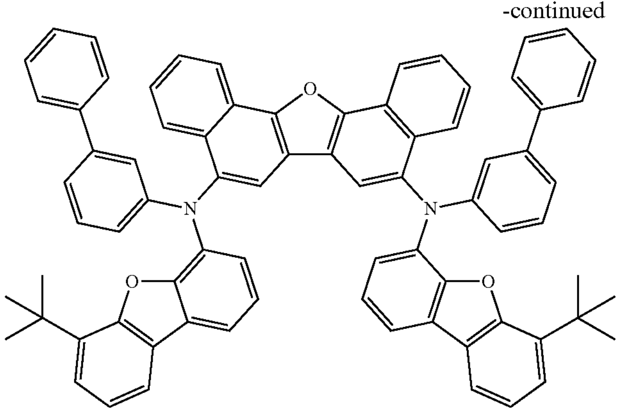
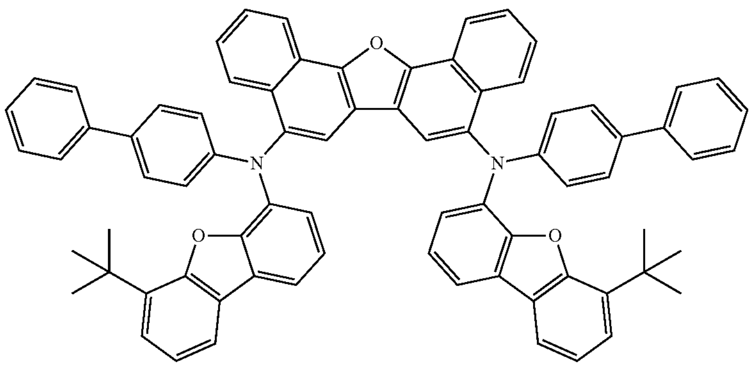
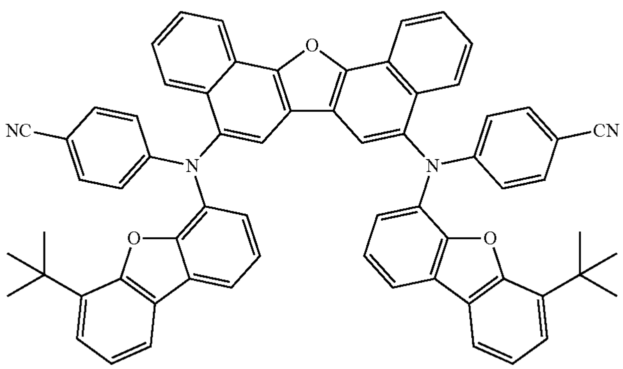
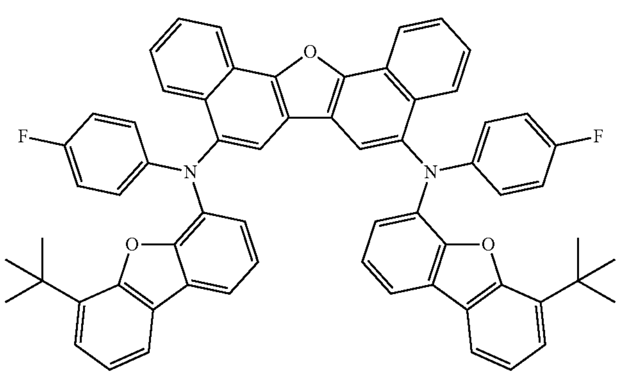

-continued
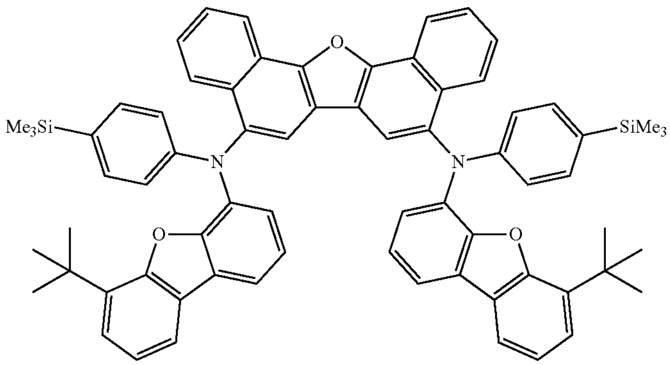
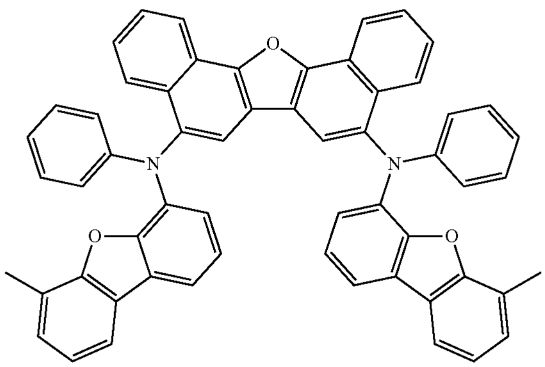
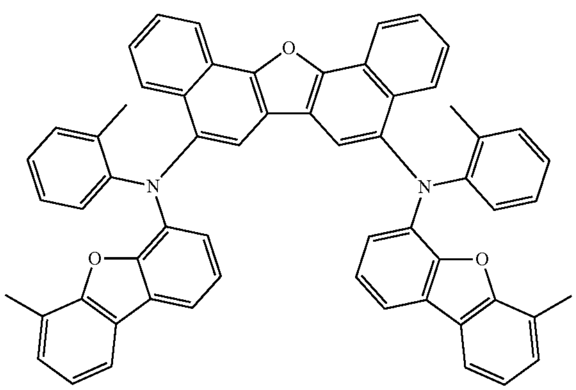
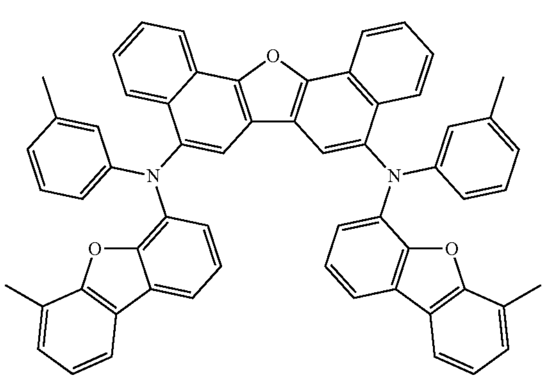

-continued
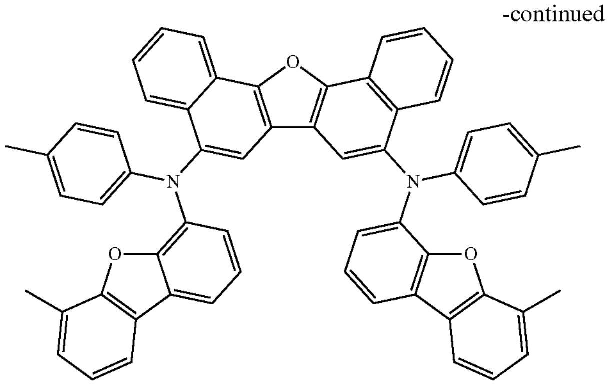
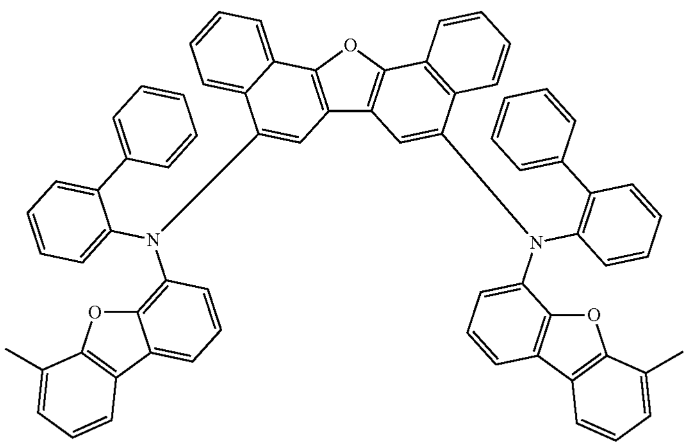
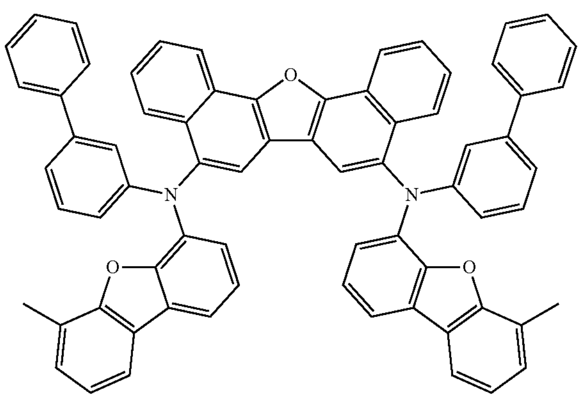
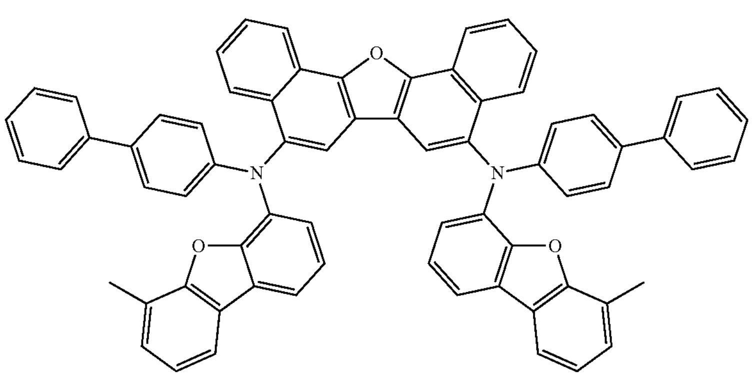

-continued
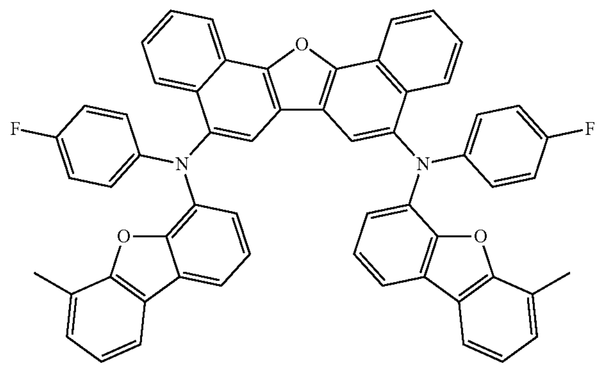
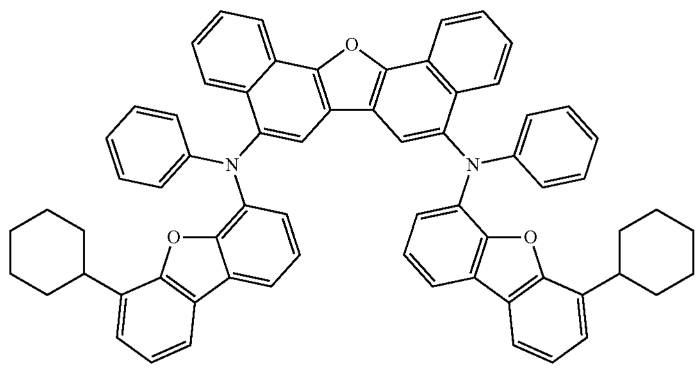
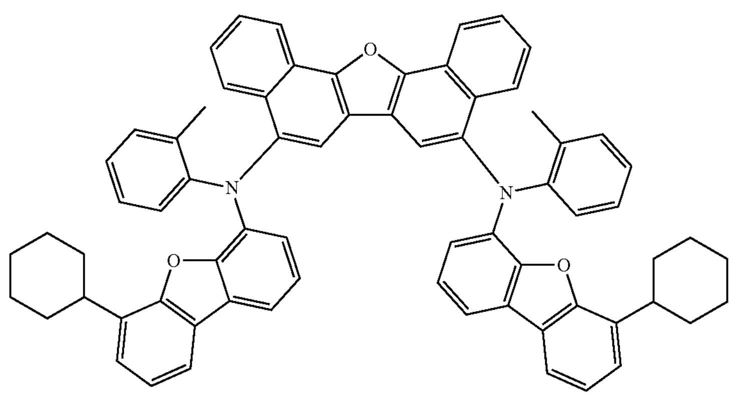
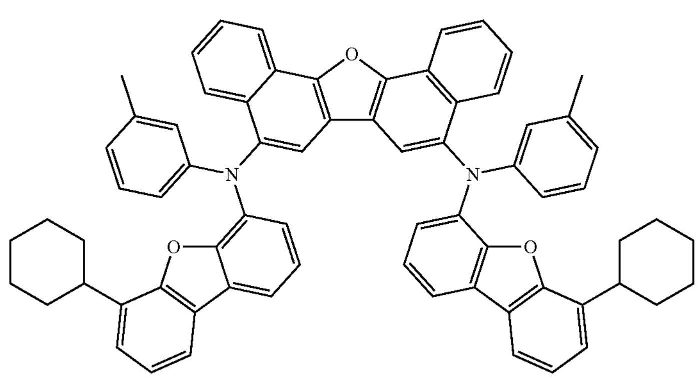

-continued
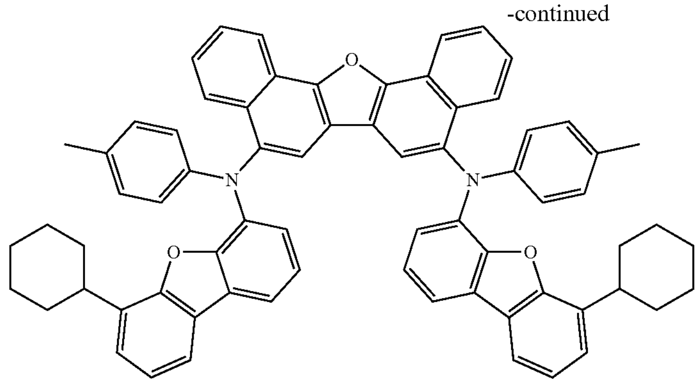
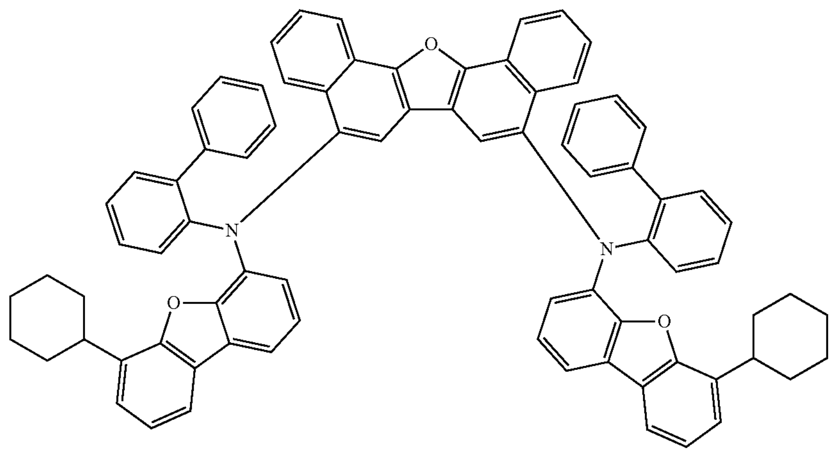
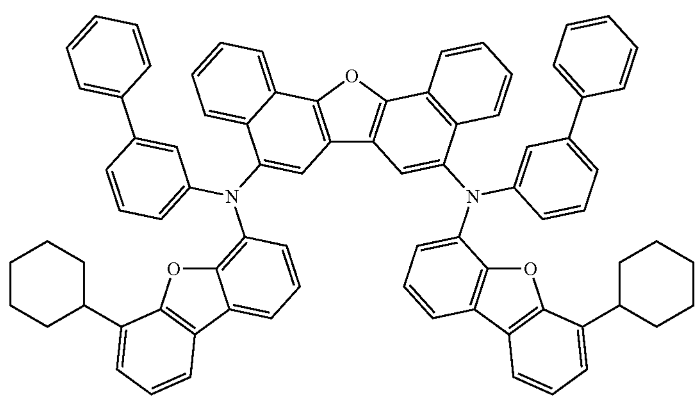
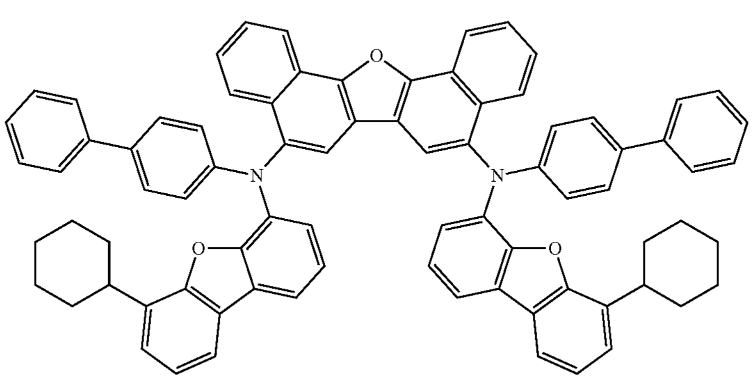

-continued
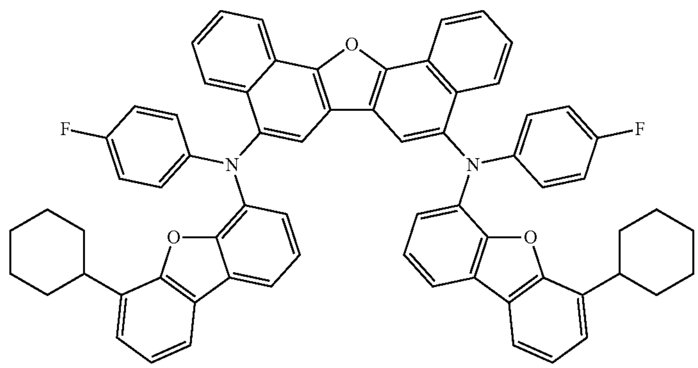
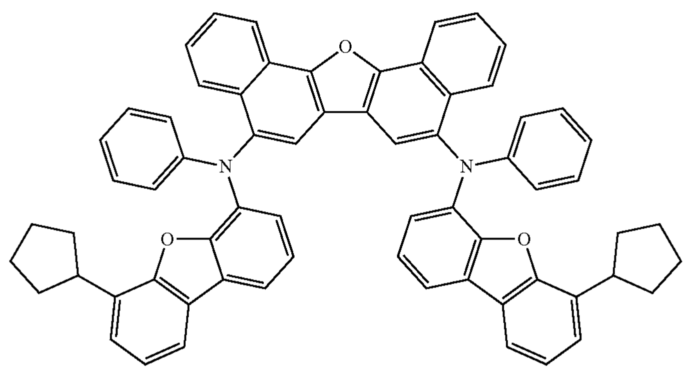
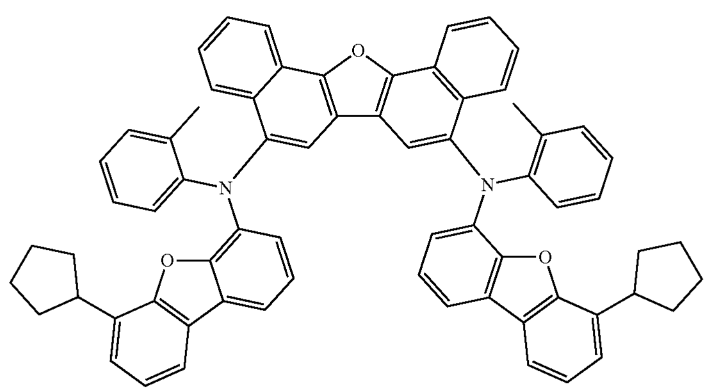
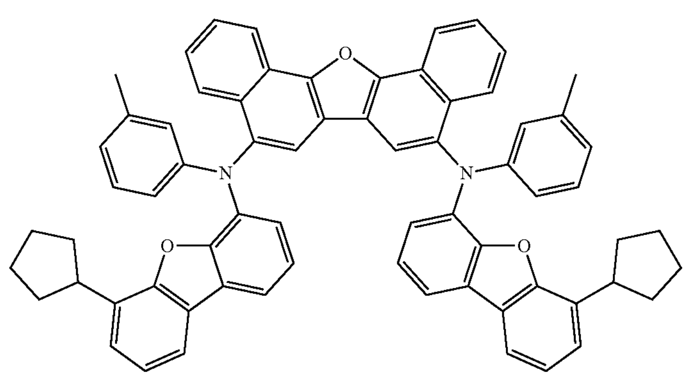

-continued
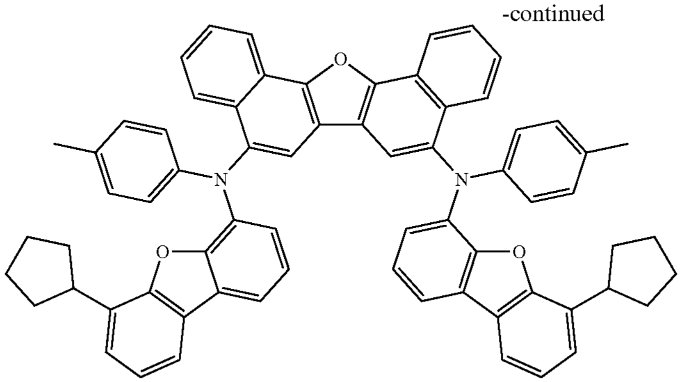
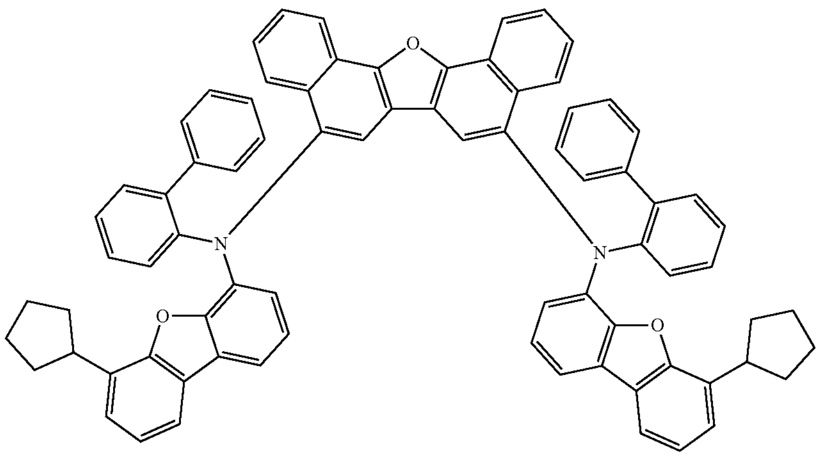
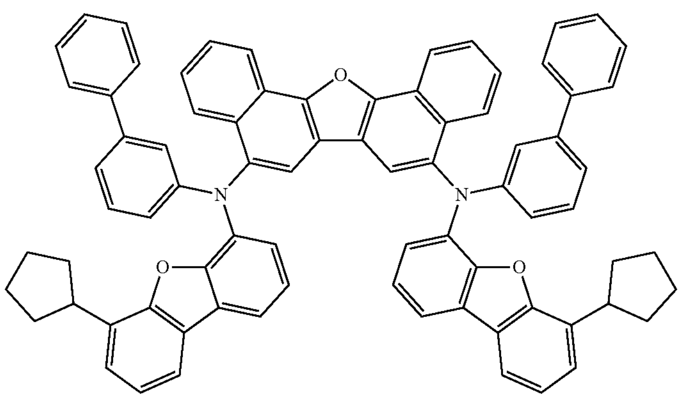
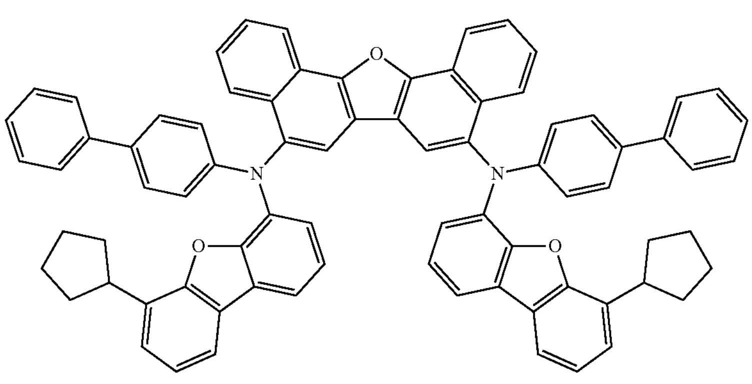

-continued
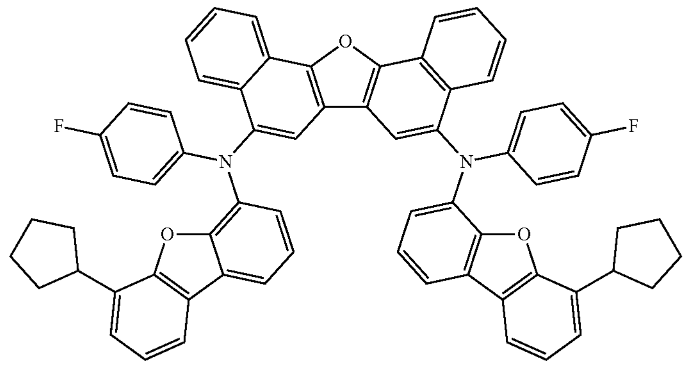
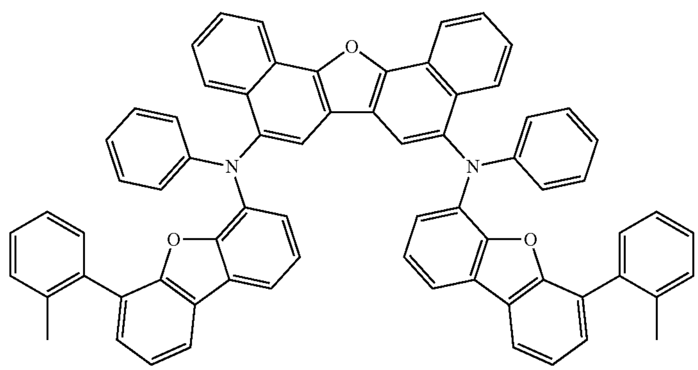
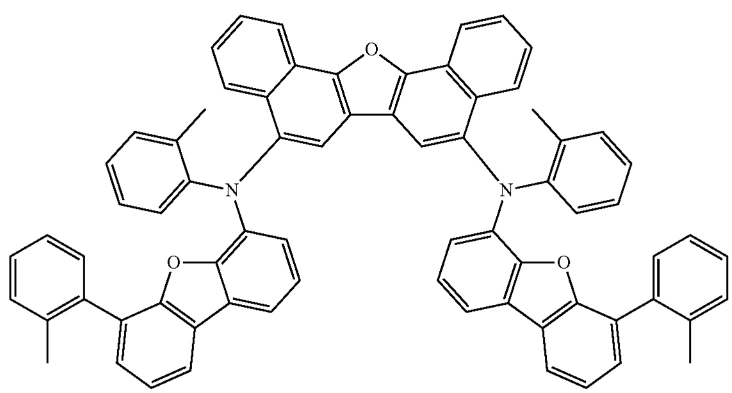
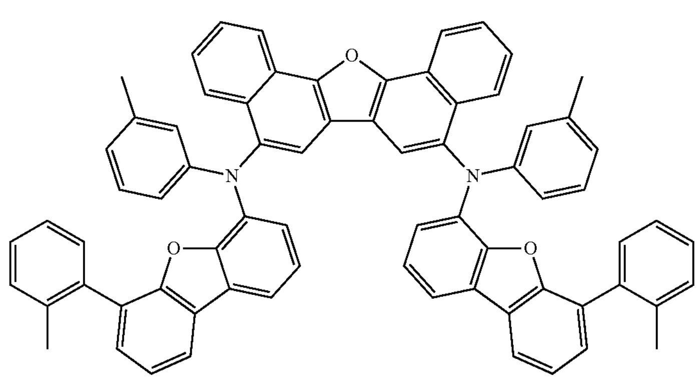

-continued
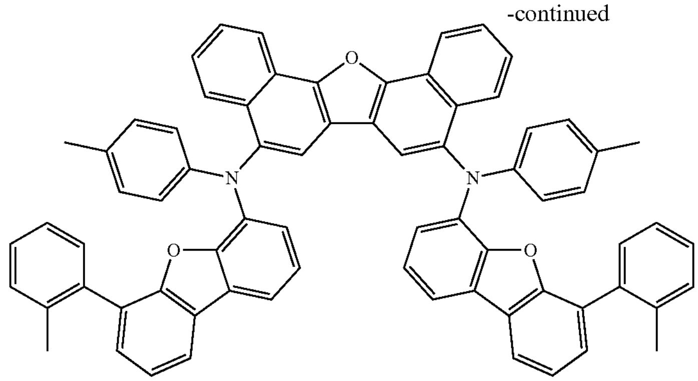
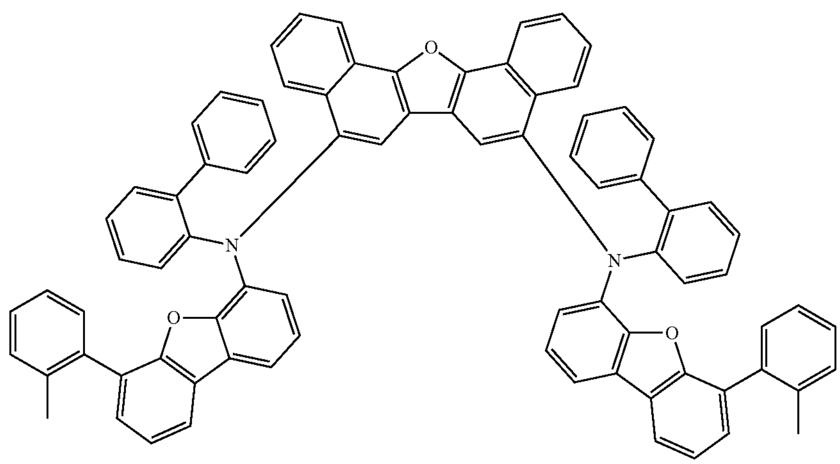
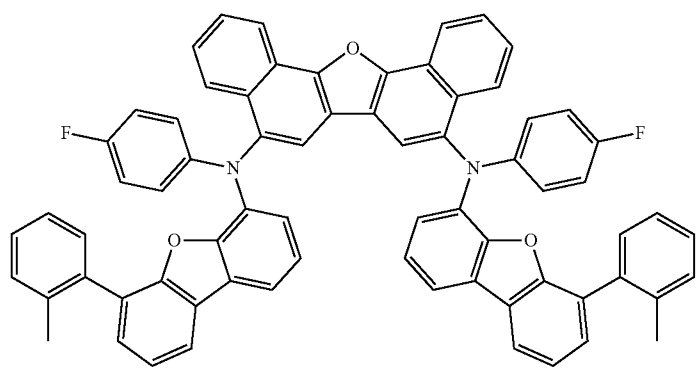
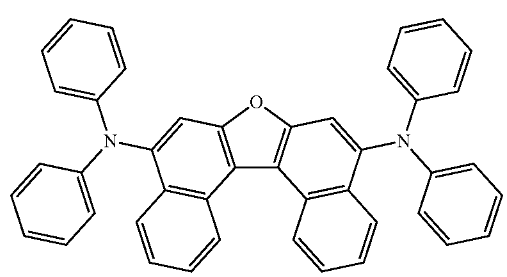
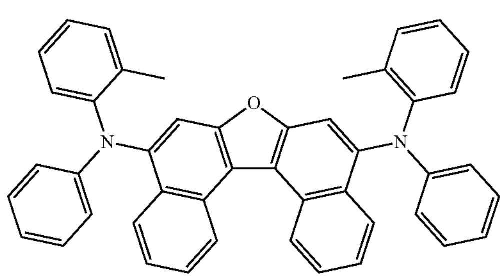
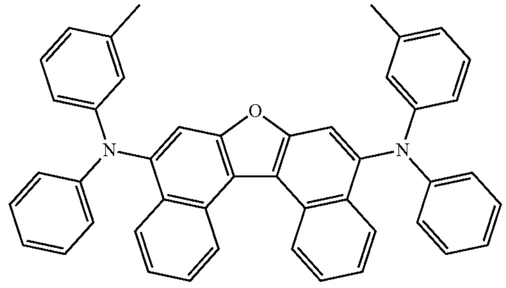

-continued
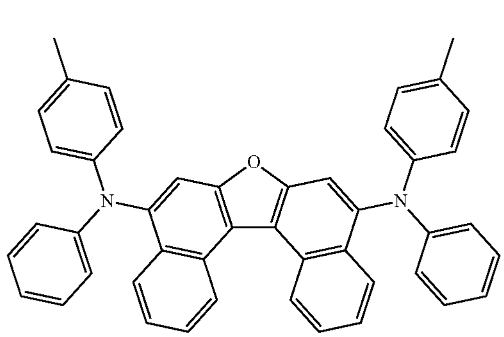
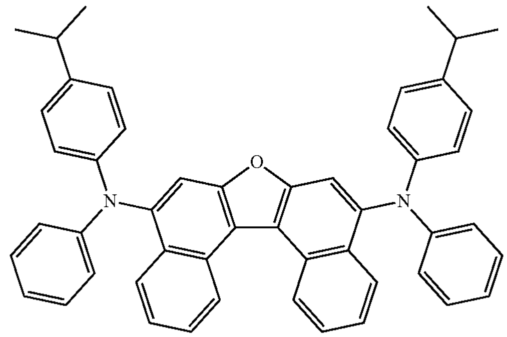
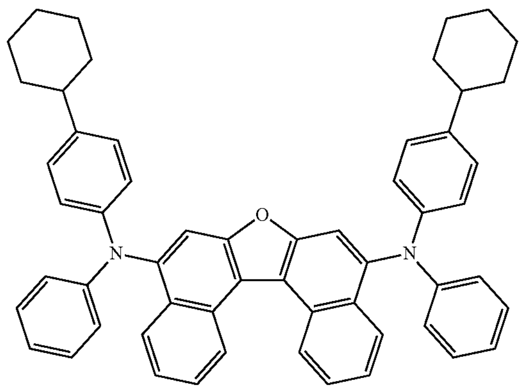
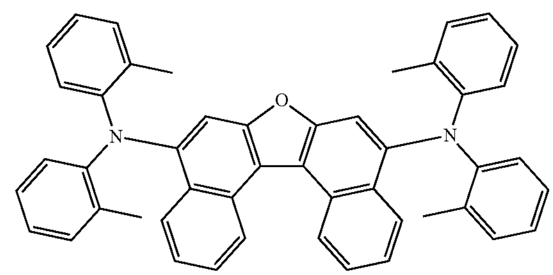
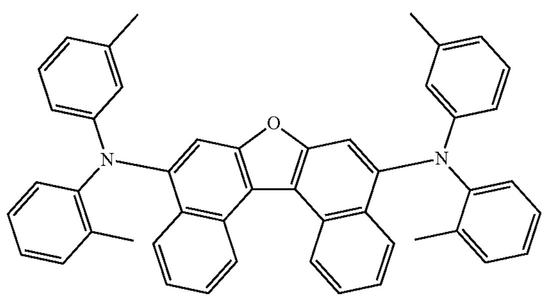
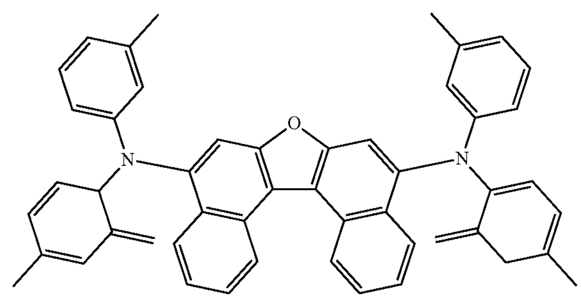
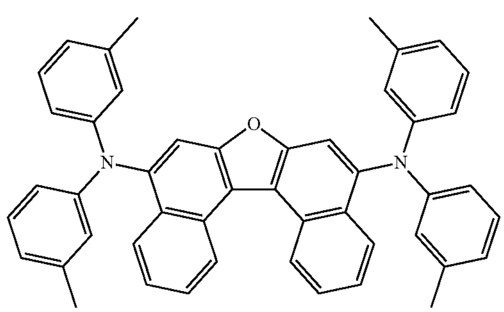
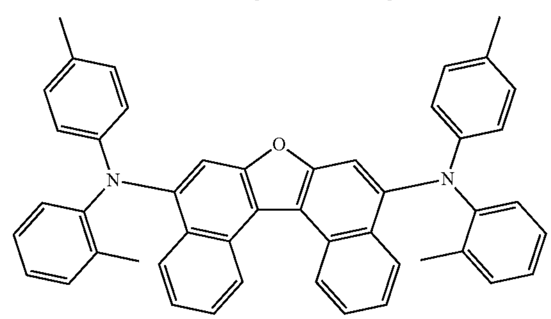
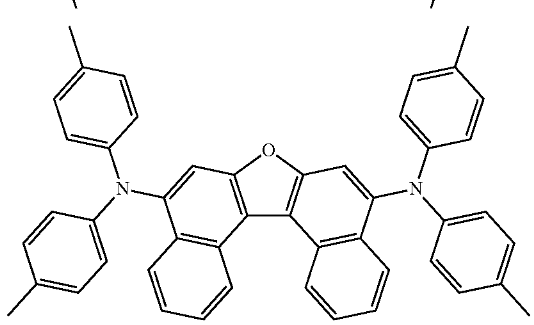
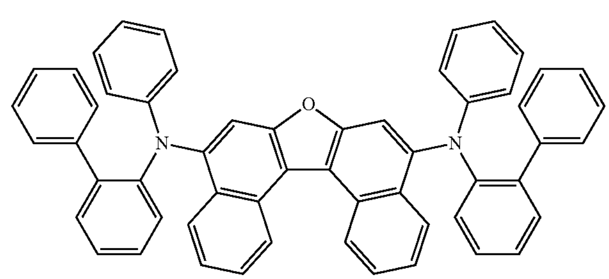

-continued
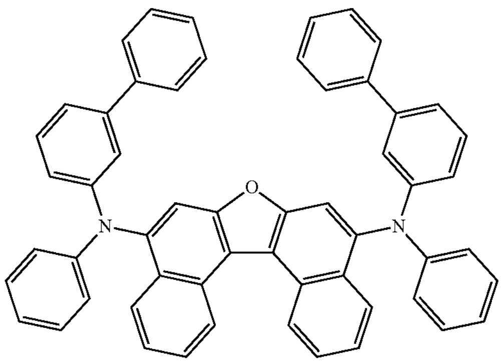
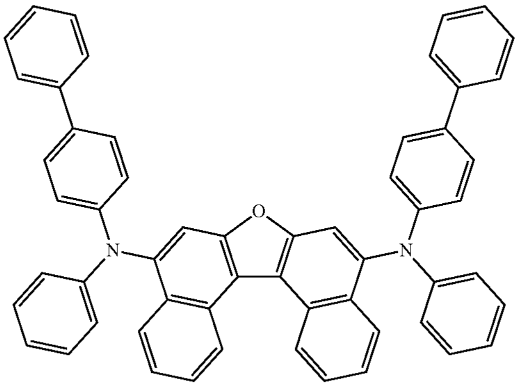
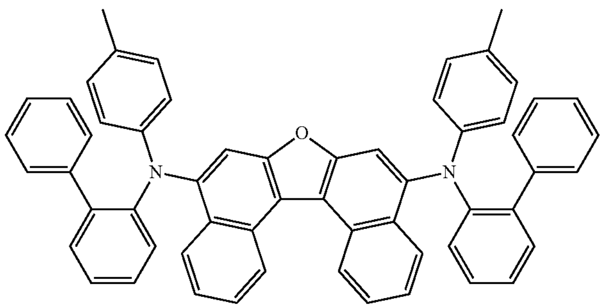
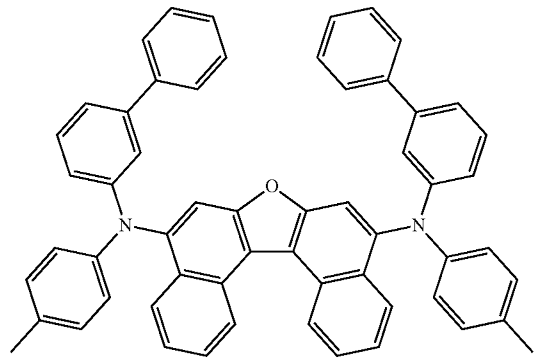
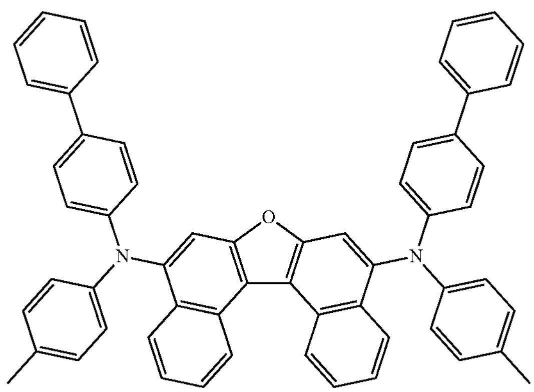
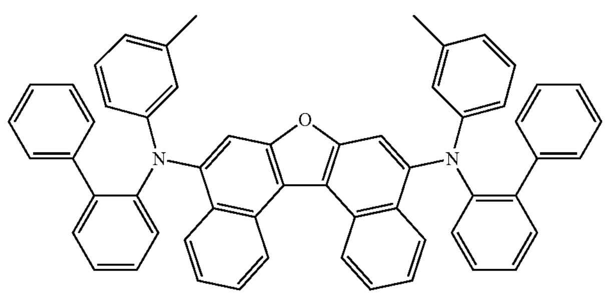
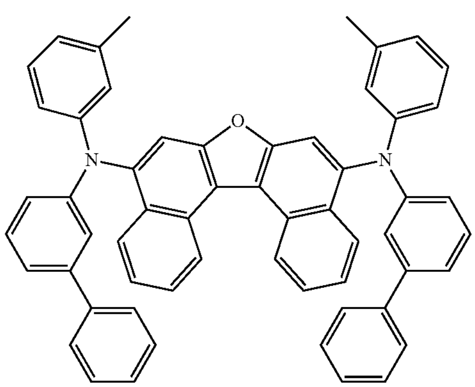
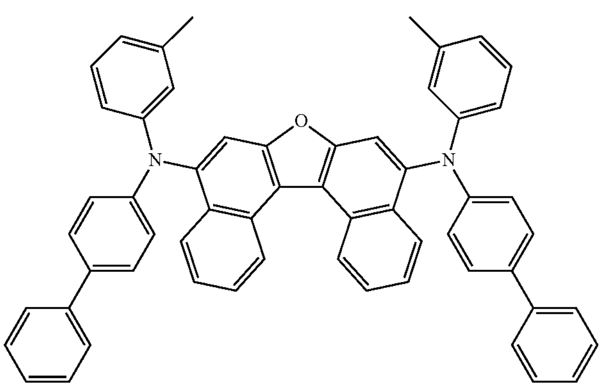

-continued
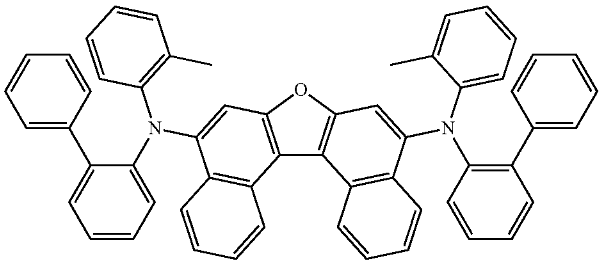
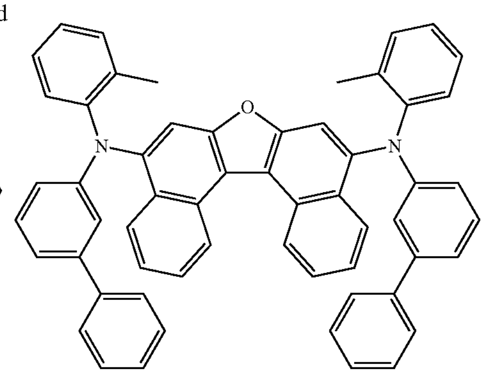
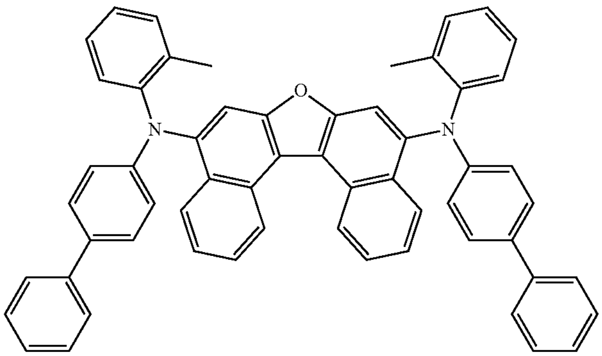
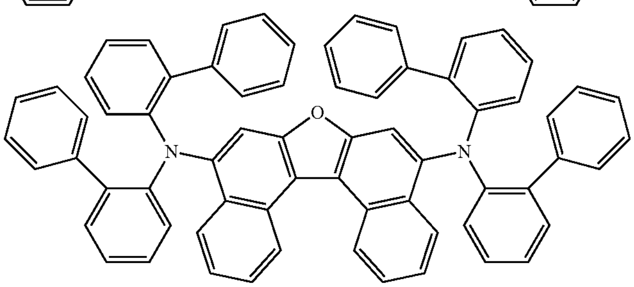
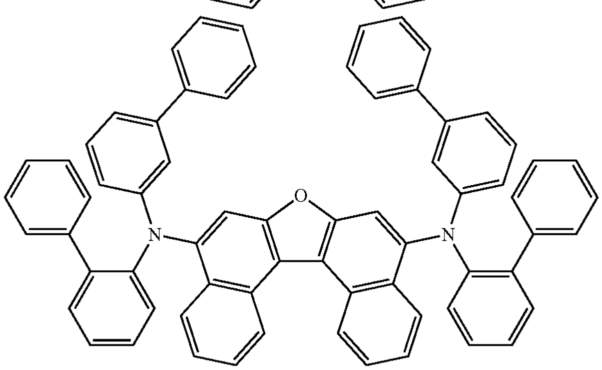
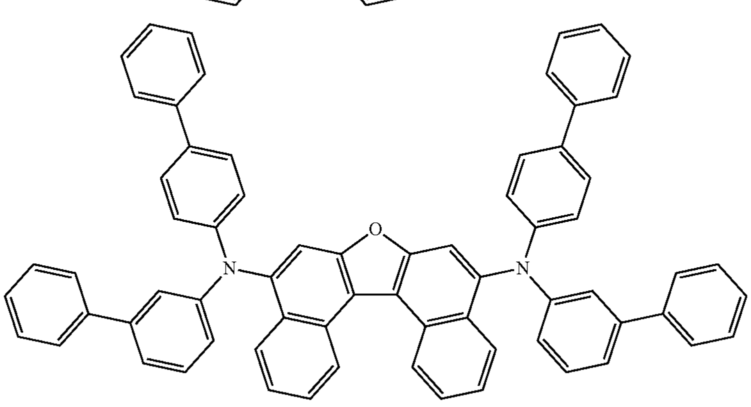

-continued
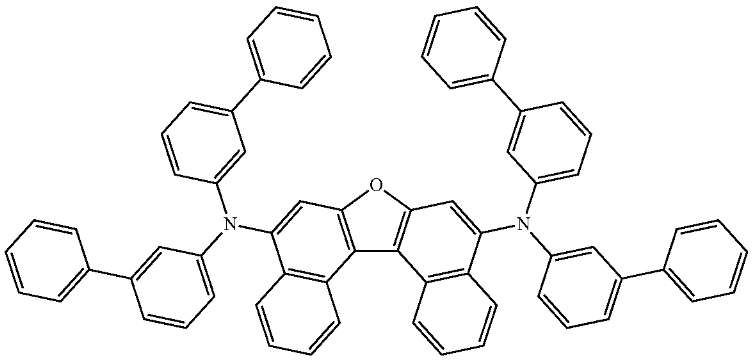
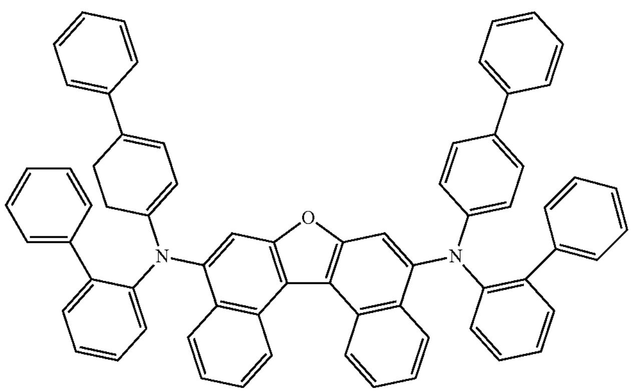
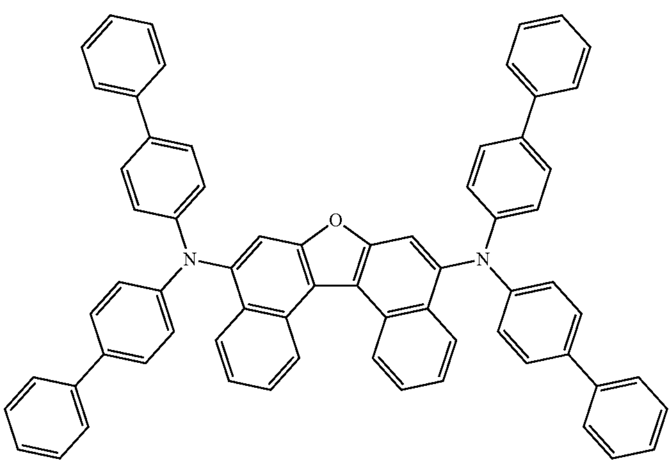
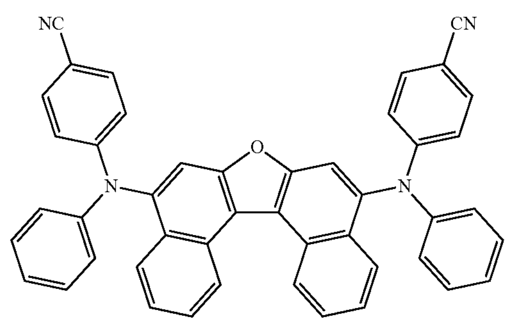
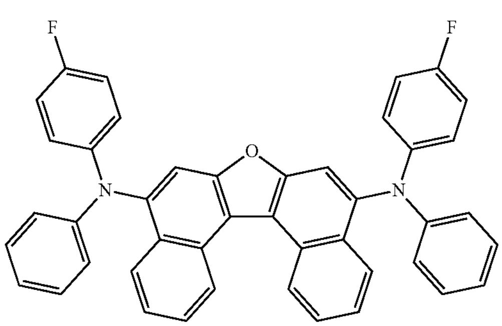
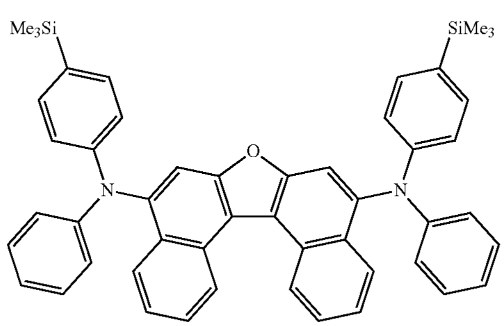

-continued
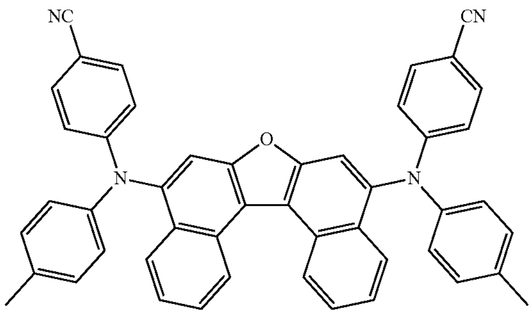
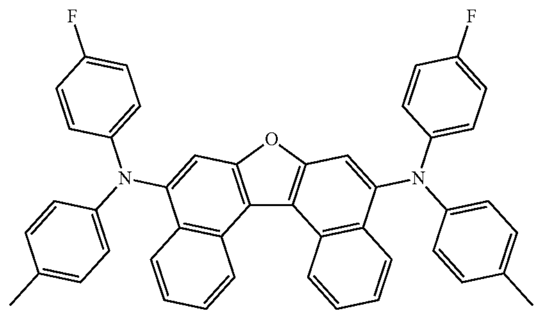
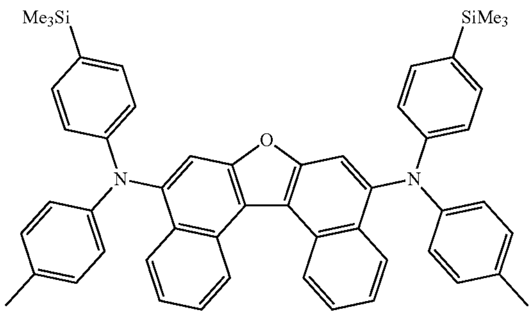
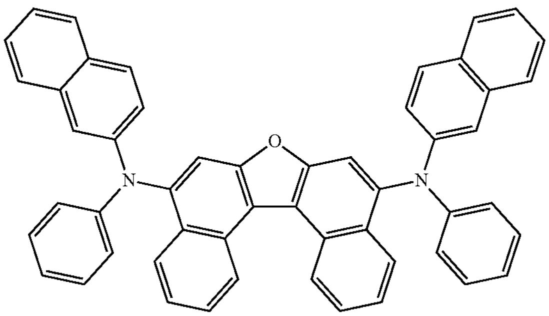
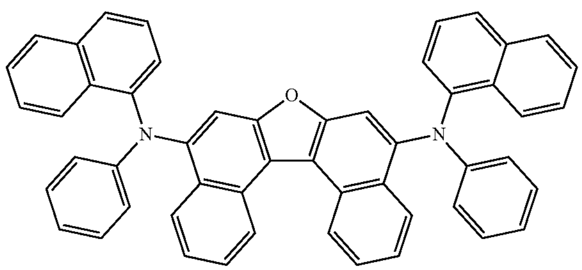
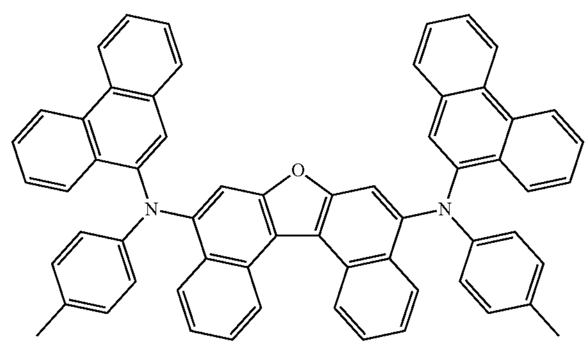
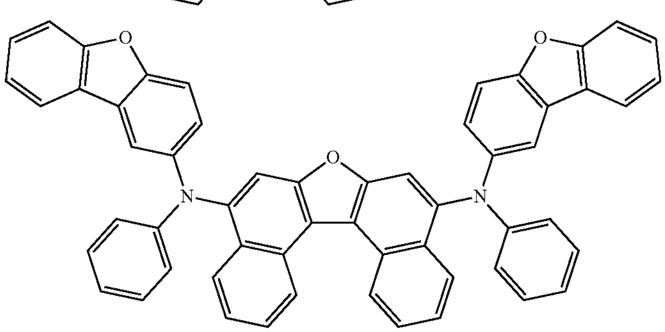
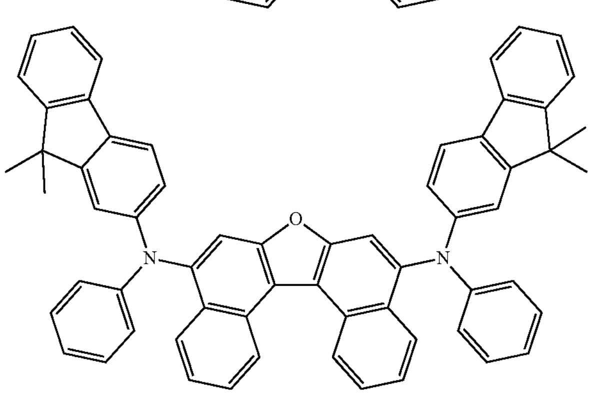

-continued
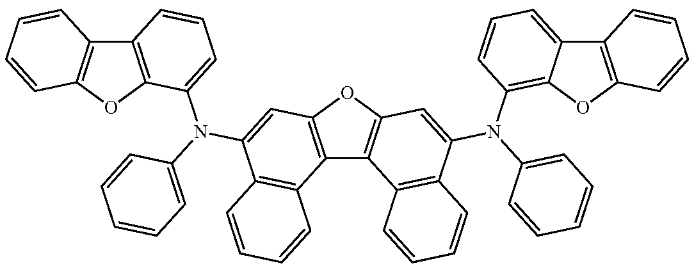
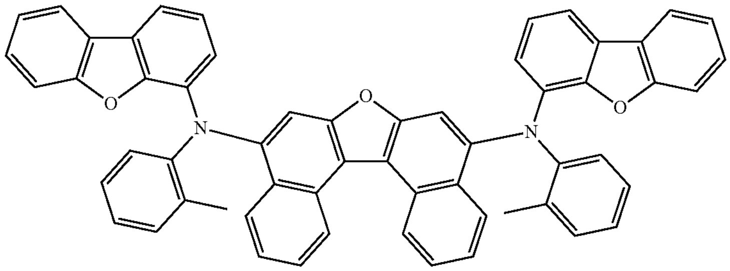
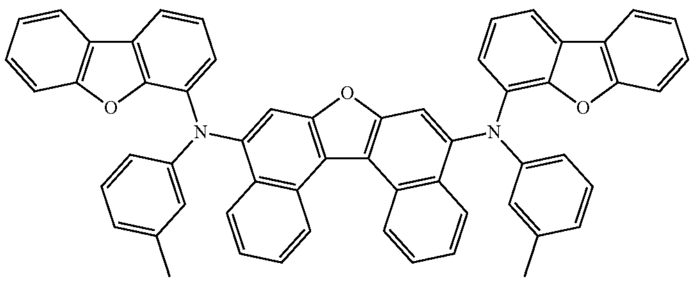
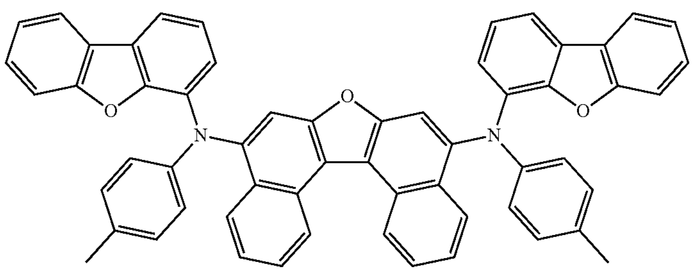
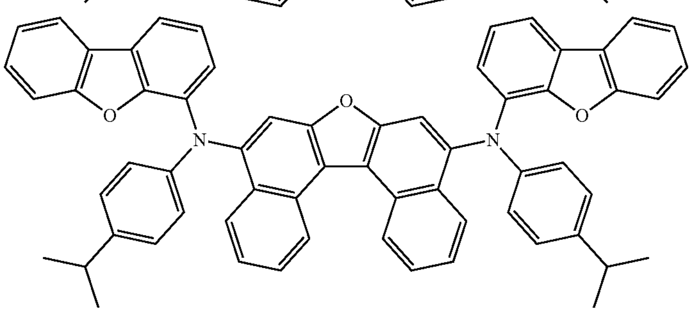
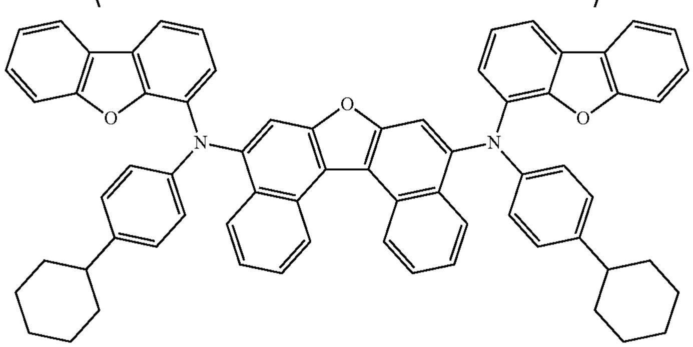

-continued
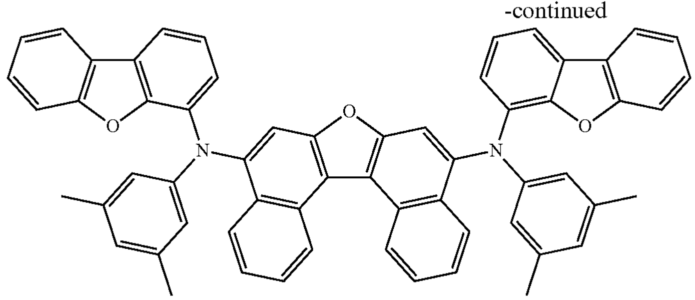
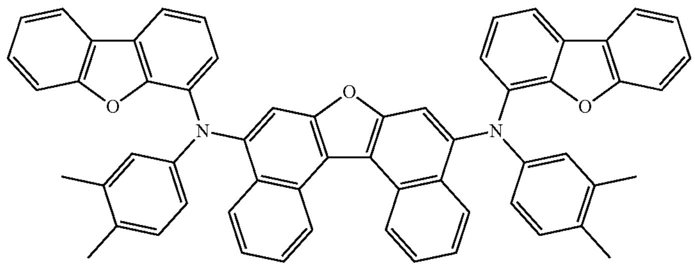
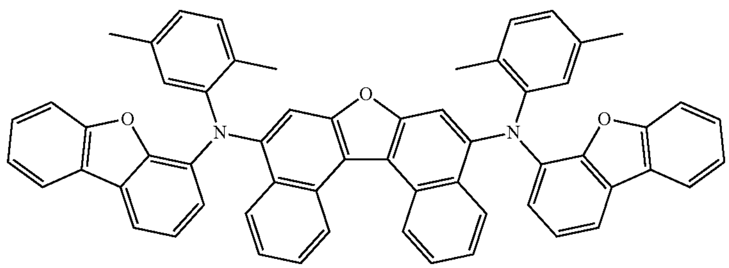
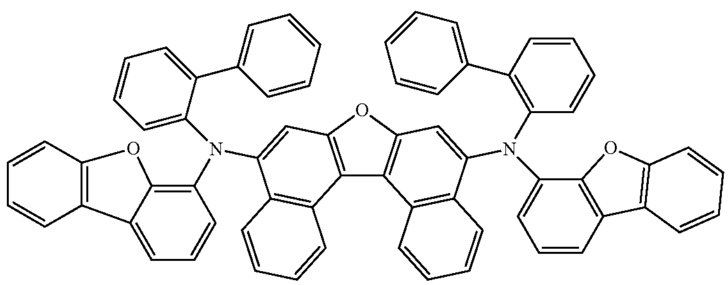
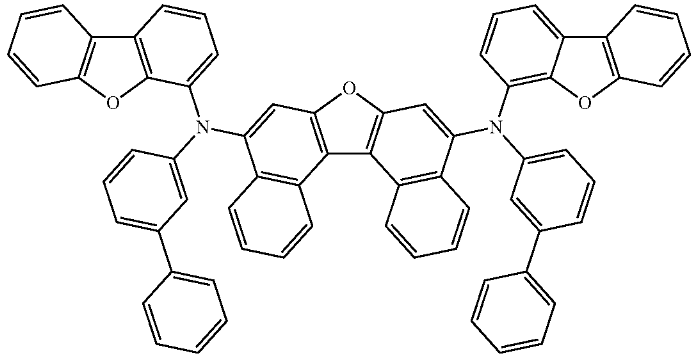

-continued
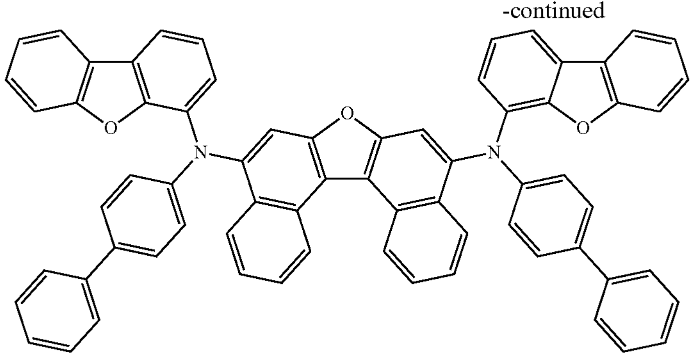
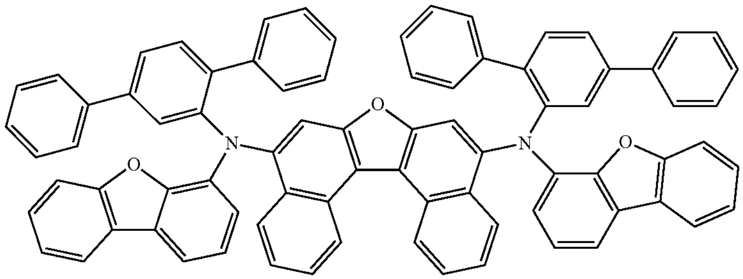
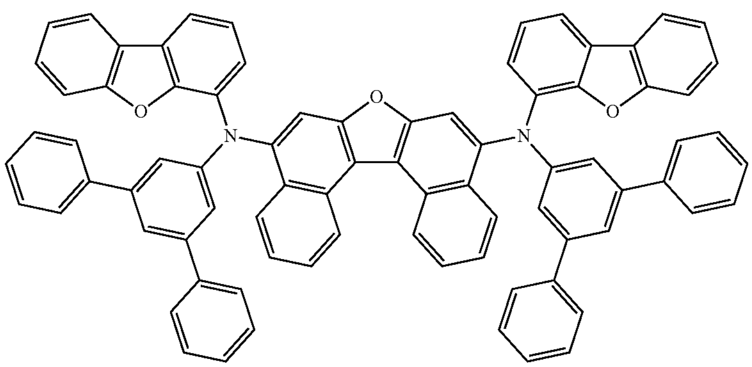
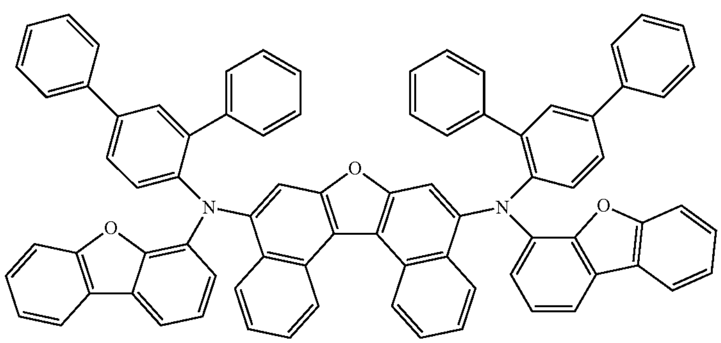
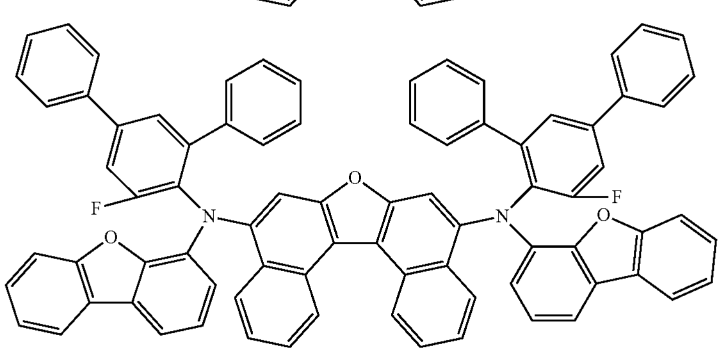

-continued
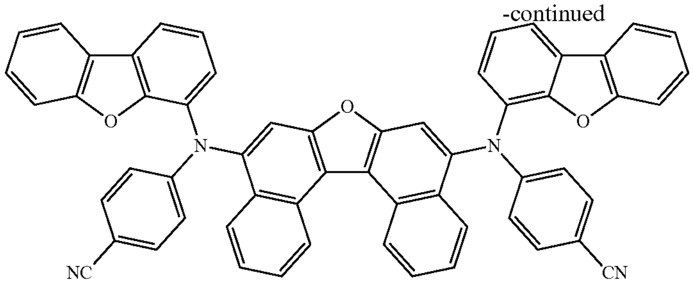
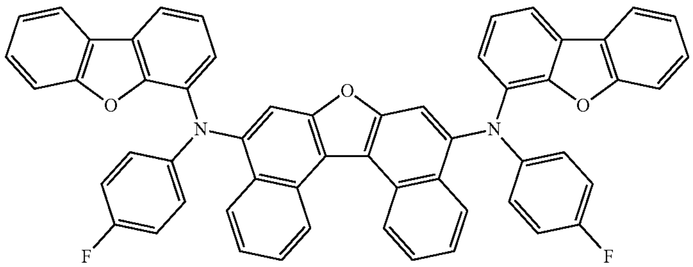
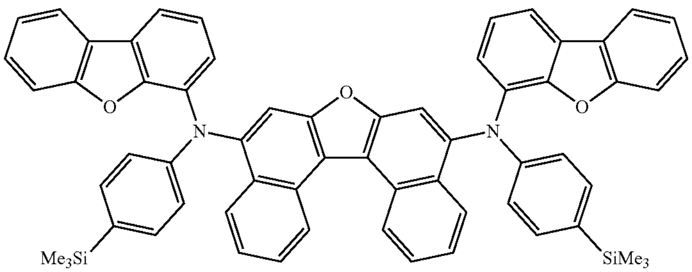
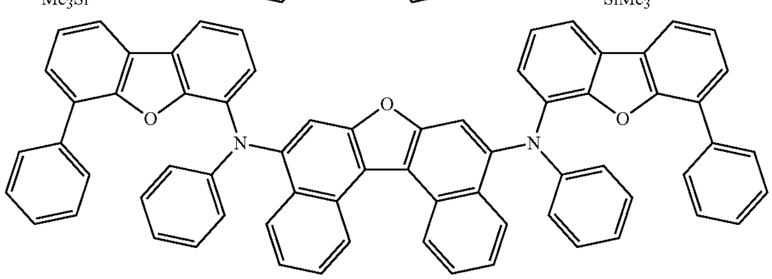
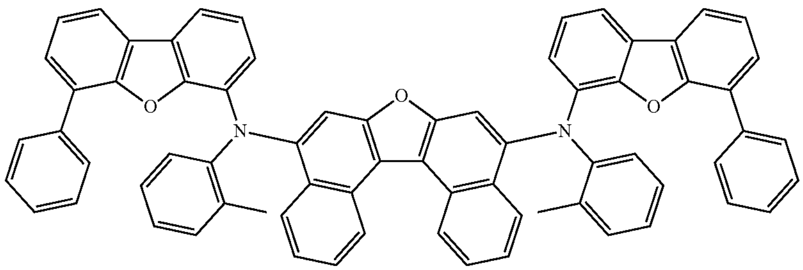
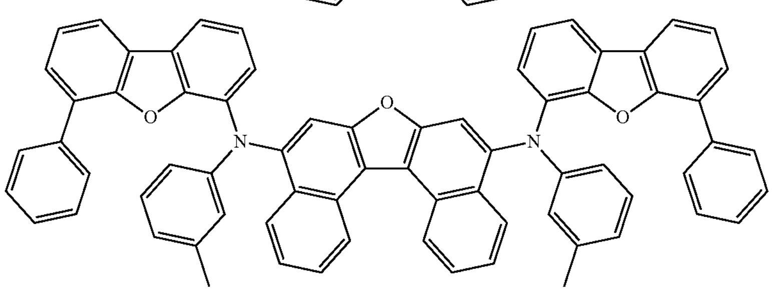

-continued
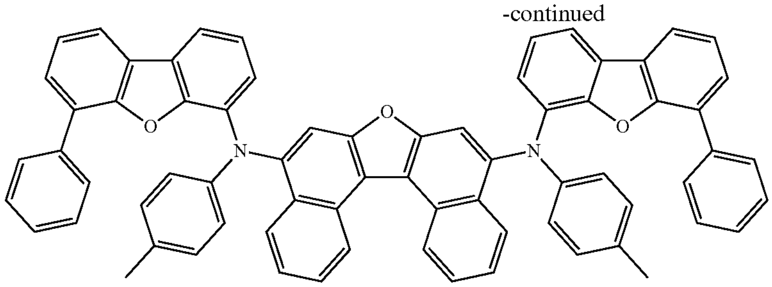
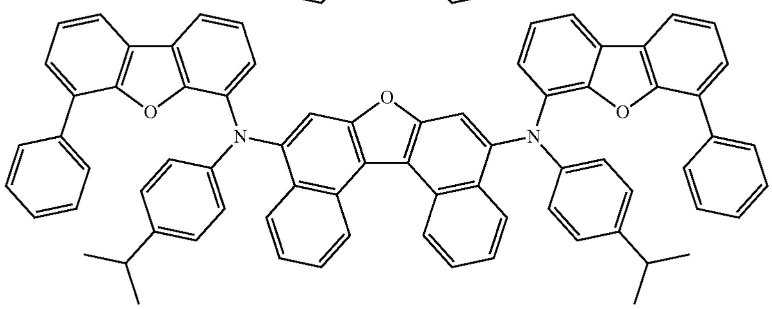
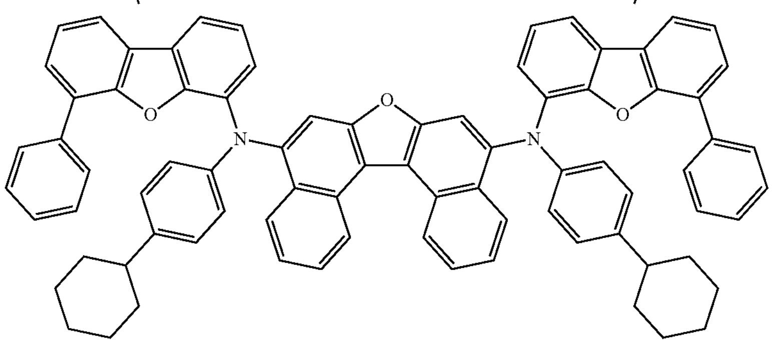
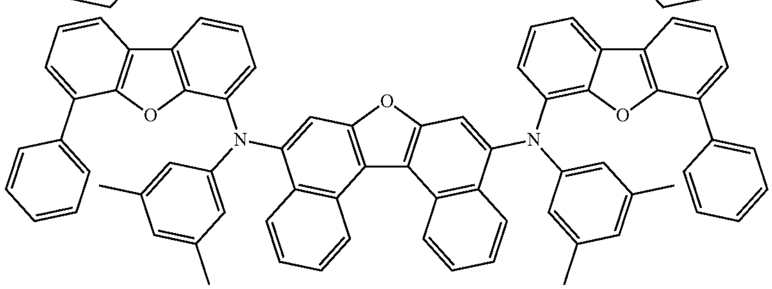
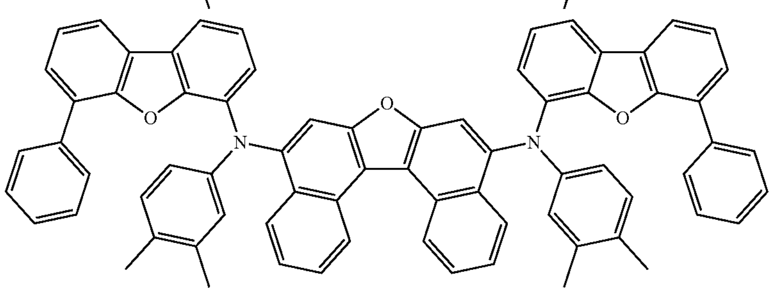
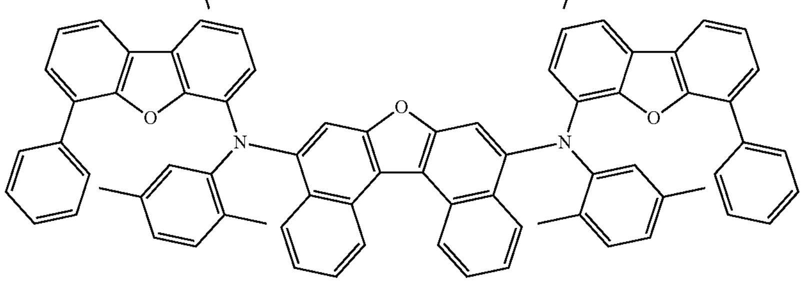

-continued
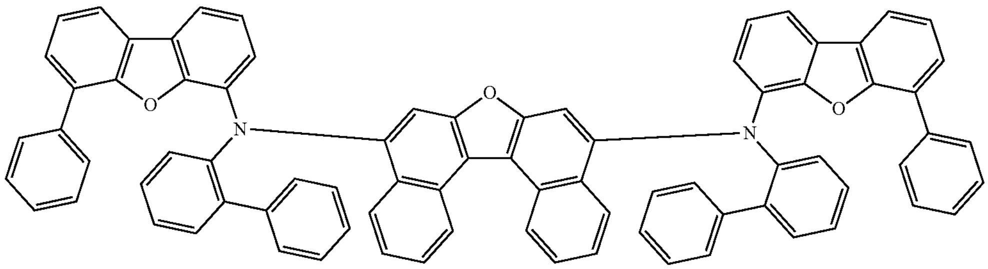
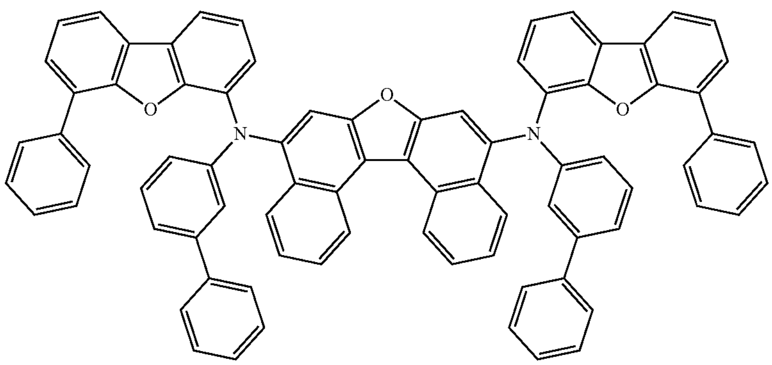
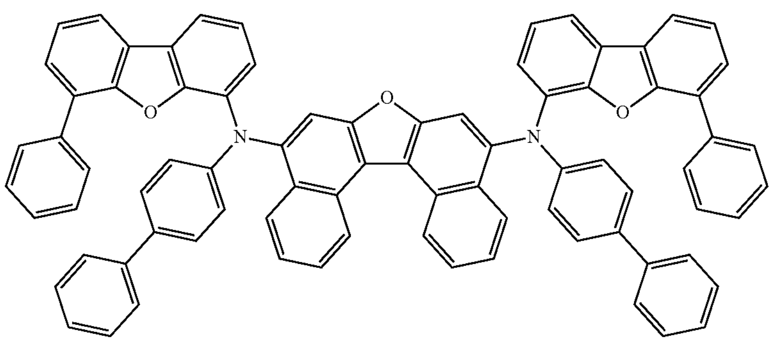
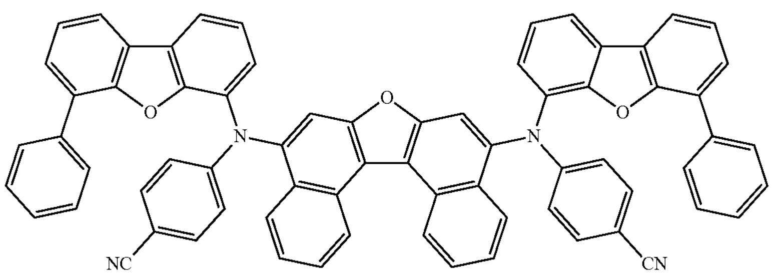
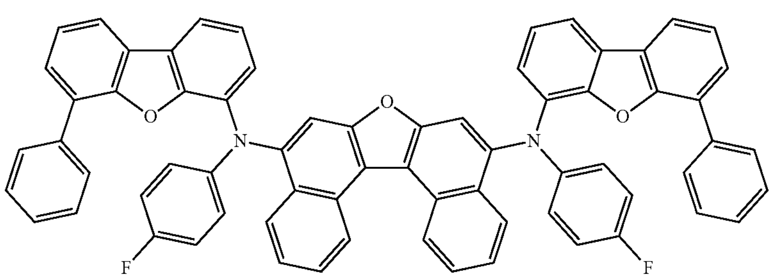

-continued
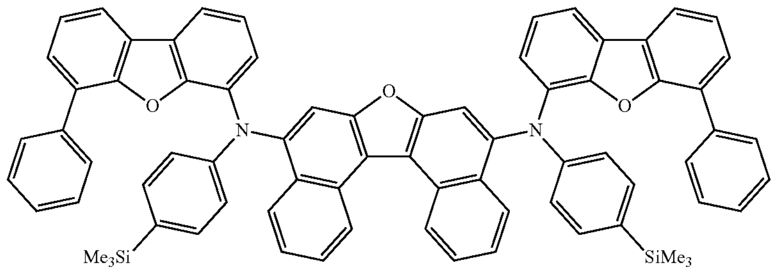
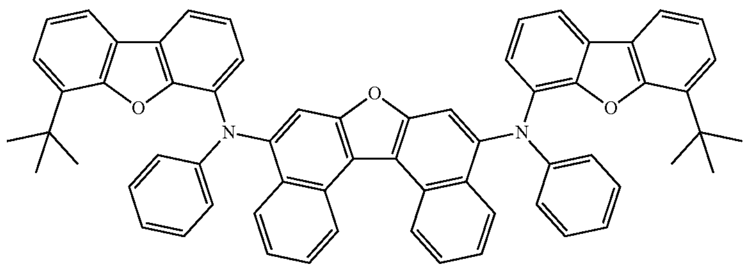
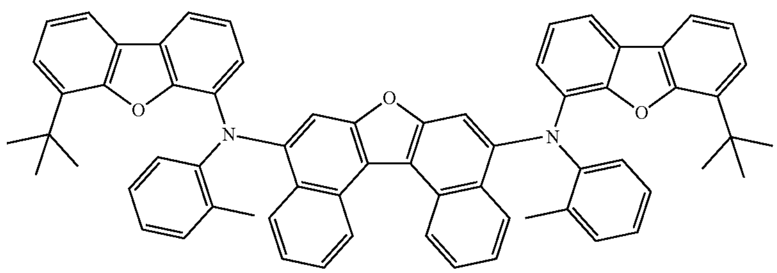
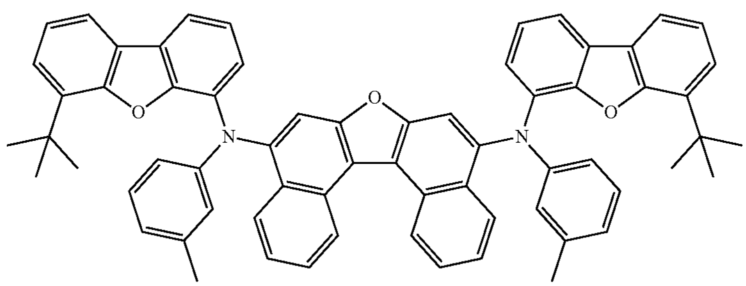
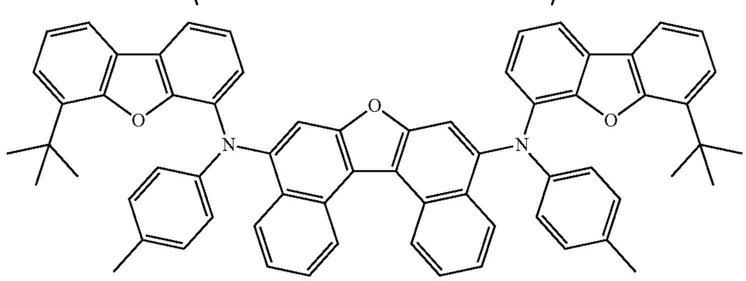
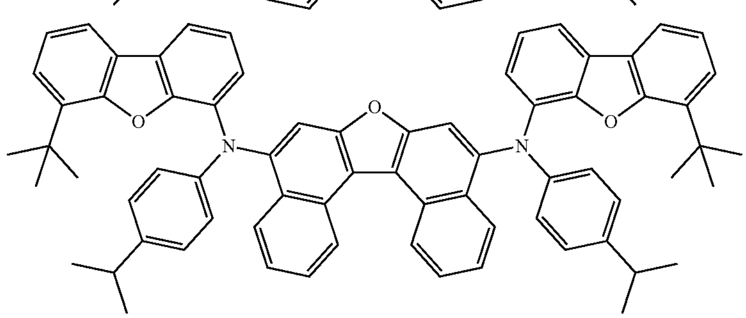

-continued
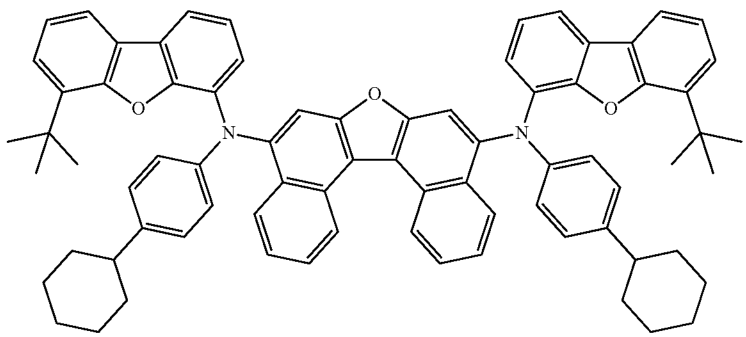
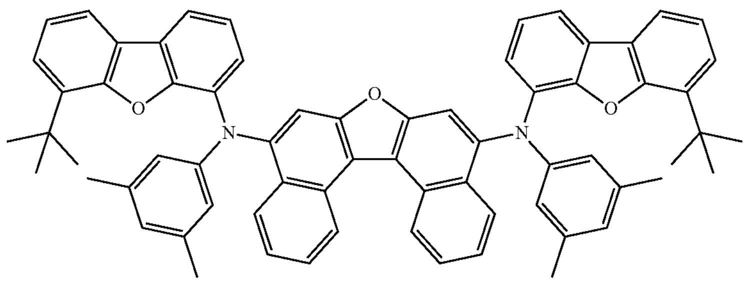
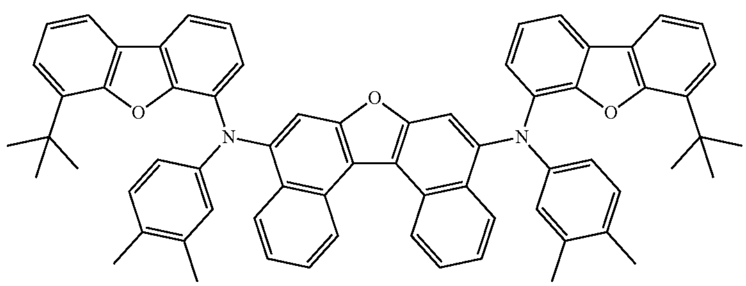
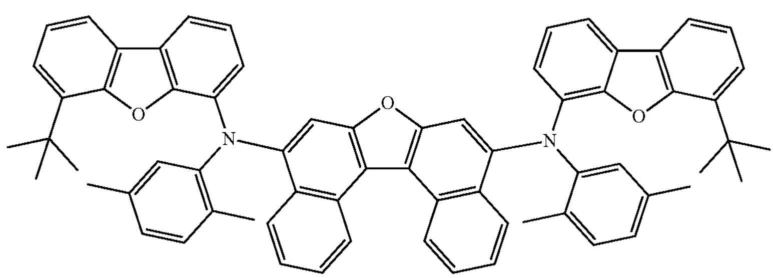
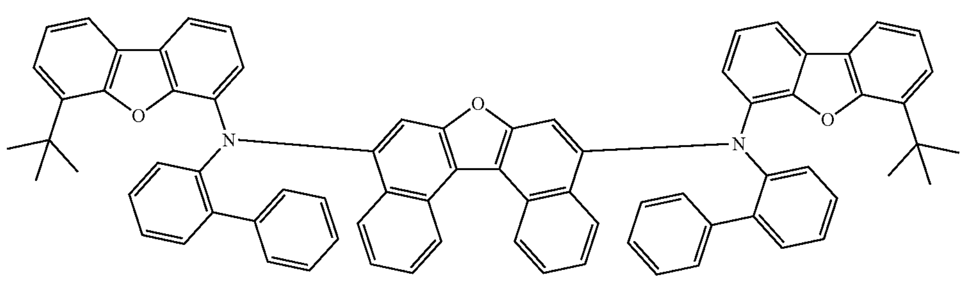

-continued
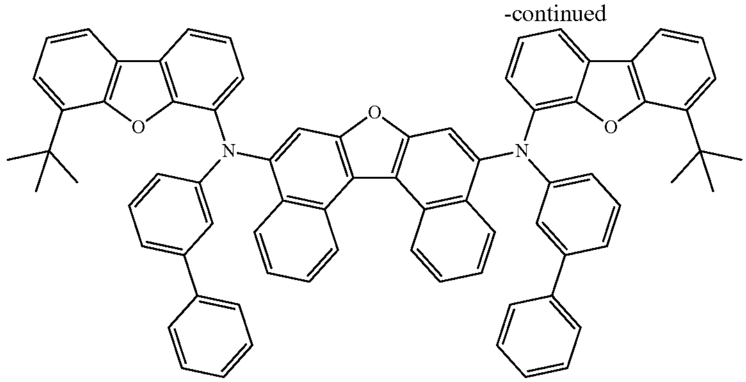
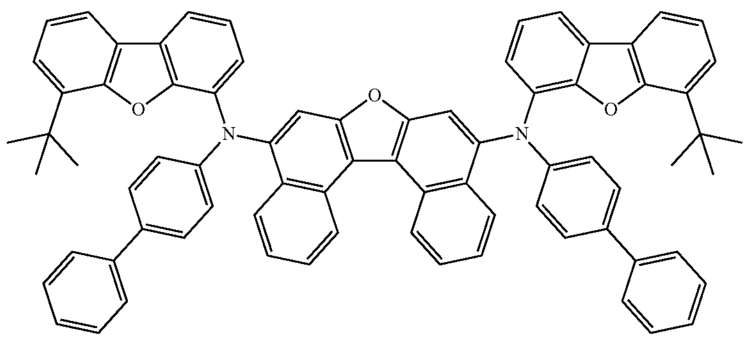
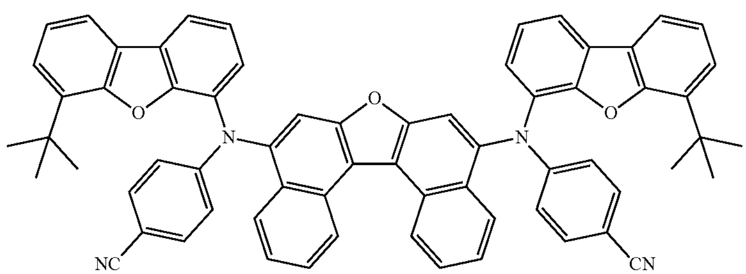
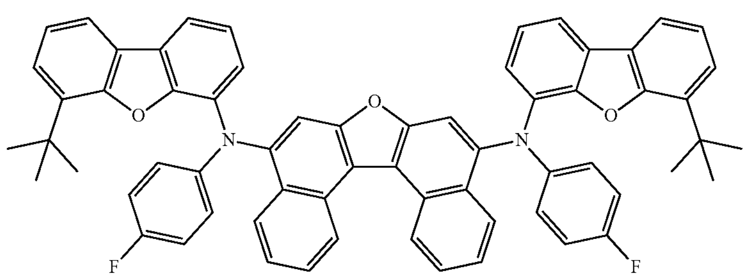
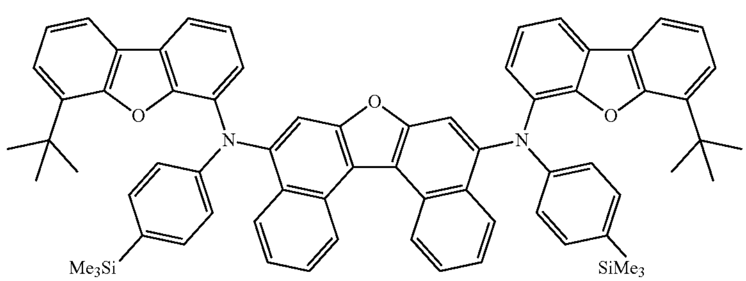

-continued
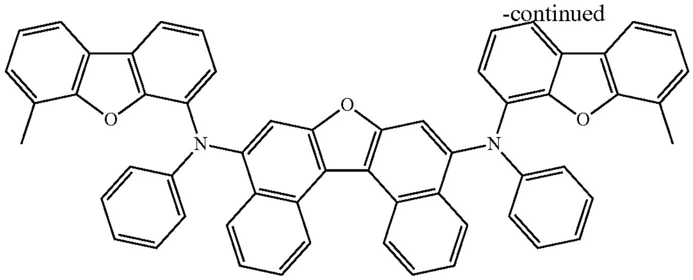
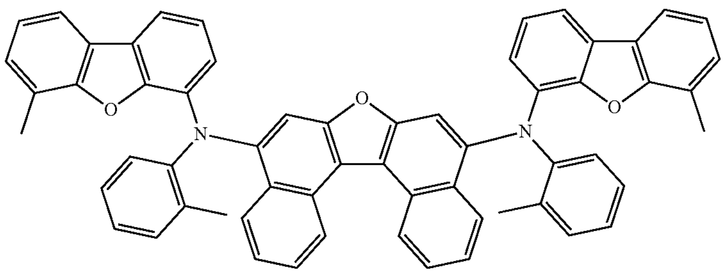
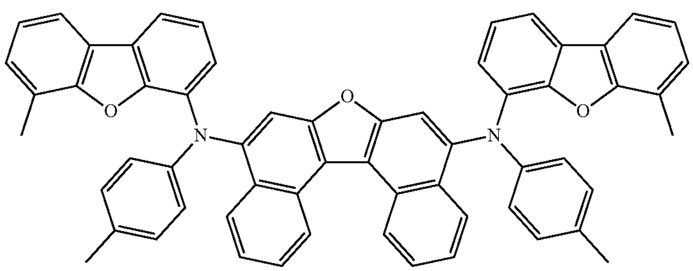
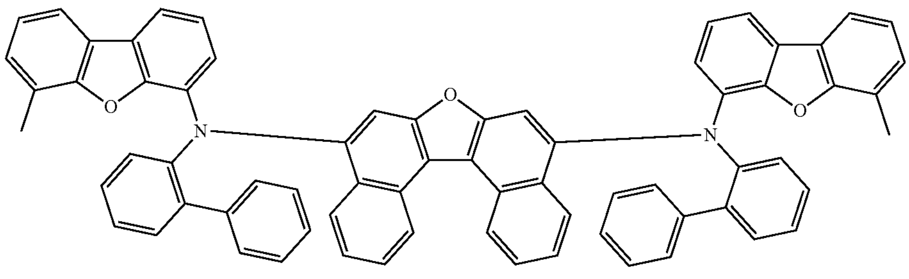
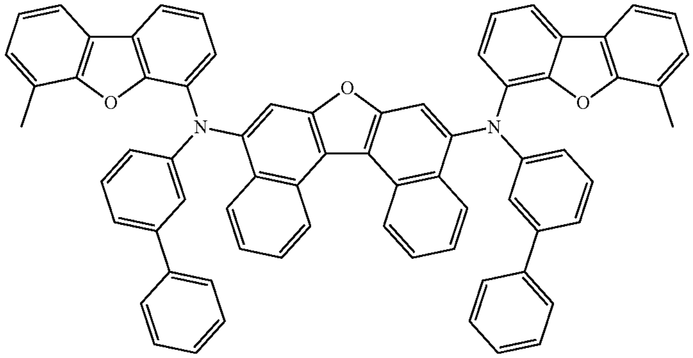

-continued
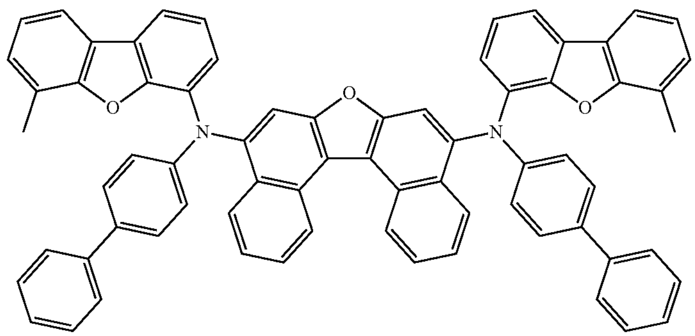
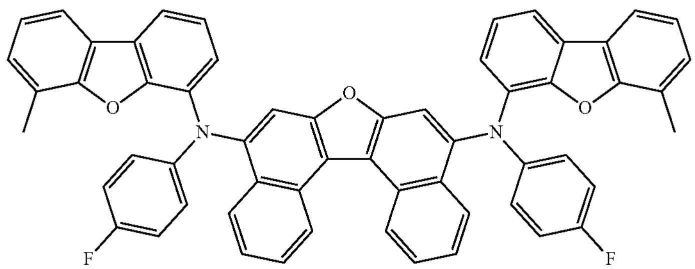
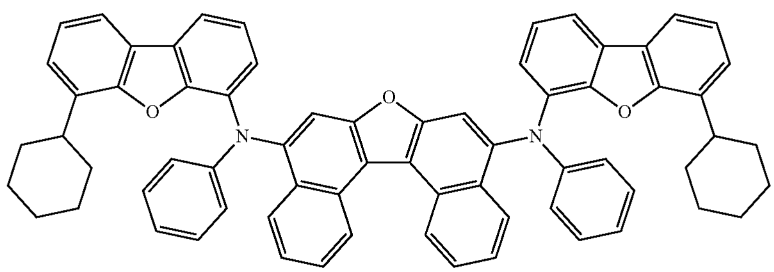
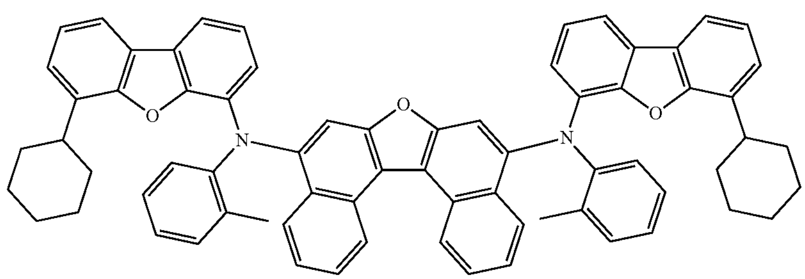
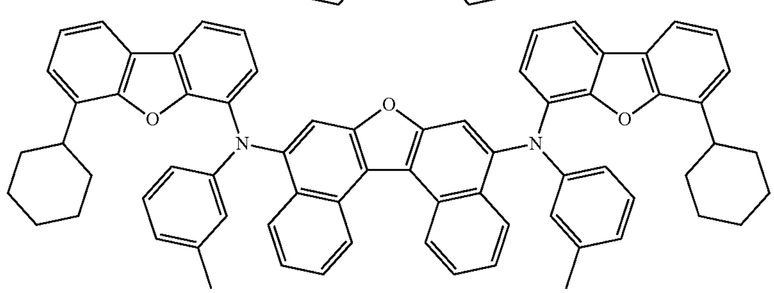
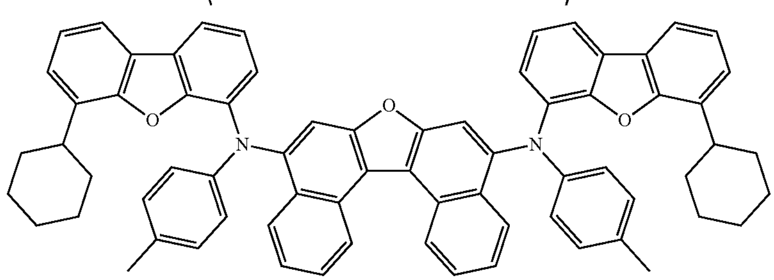

-continued
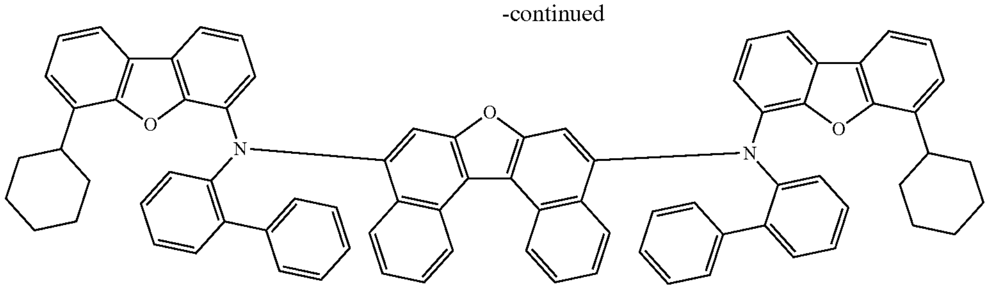
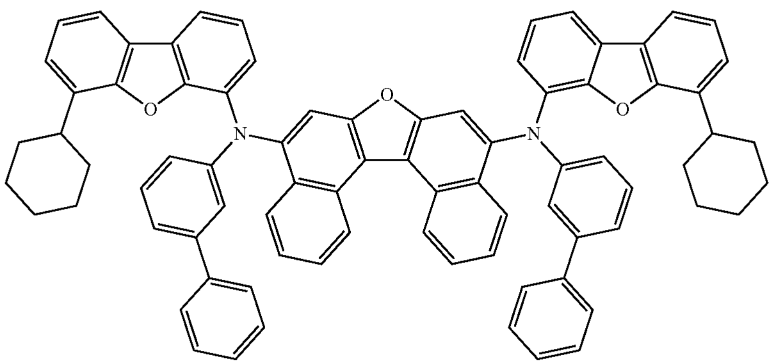
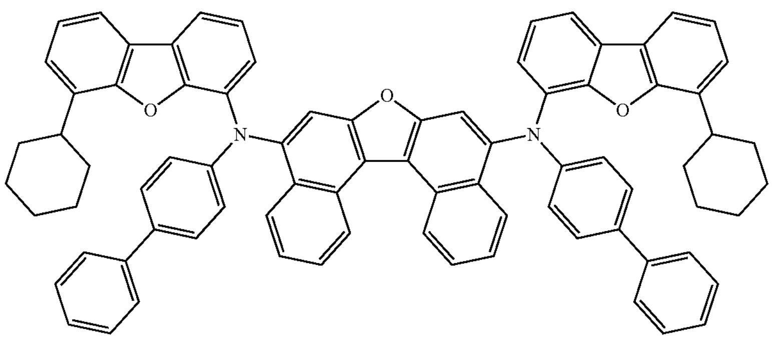
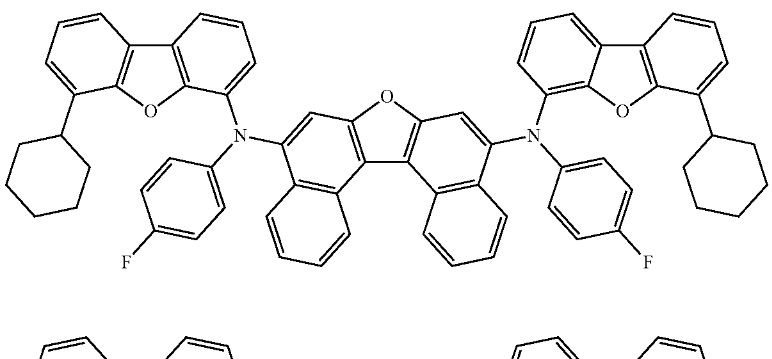
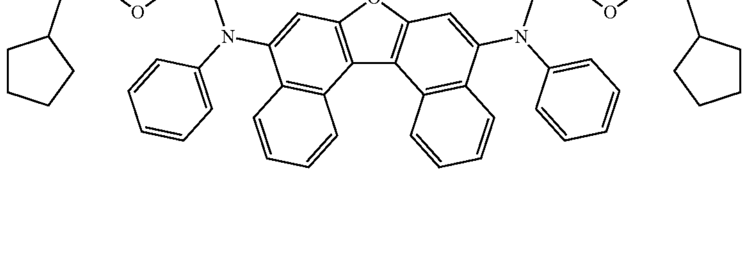

-continued
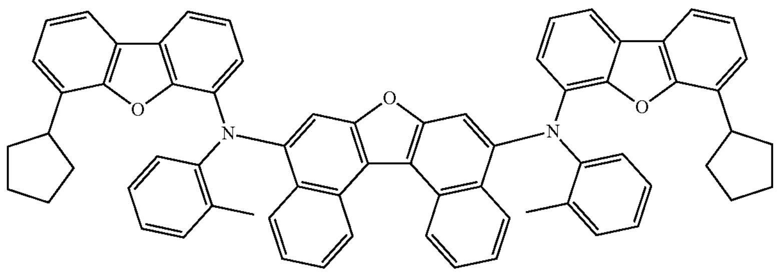
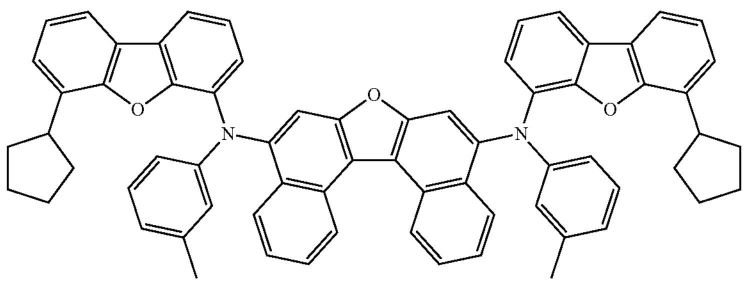
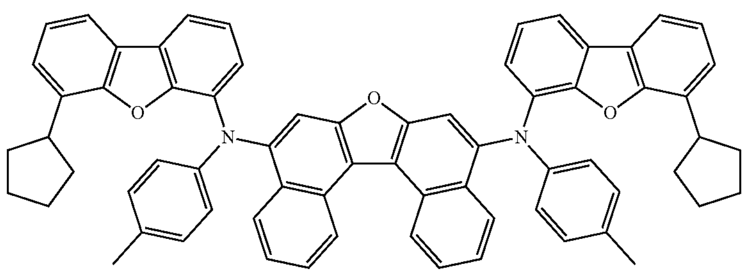
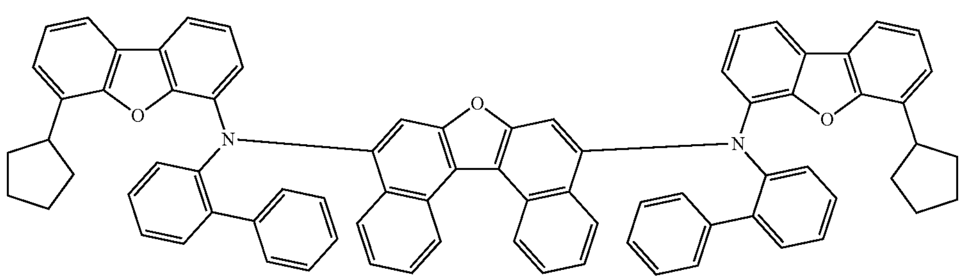
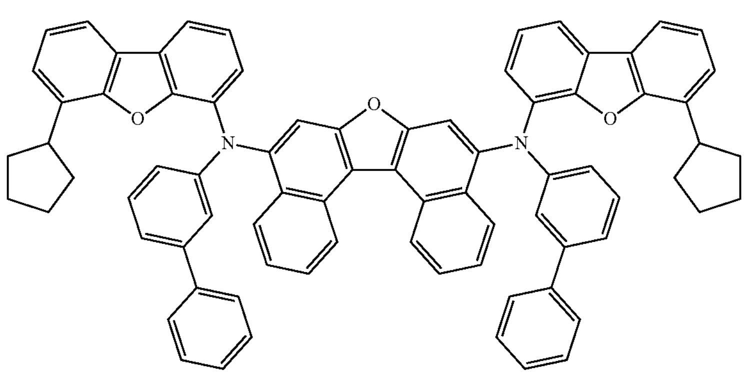

-continued
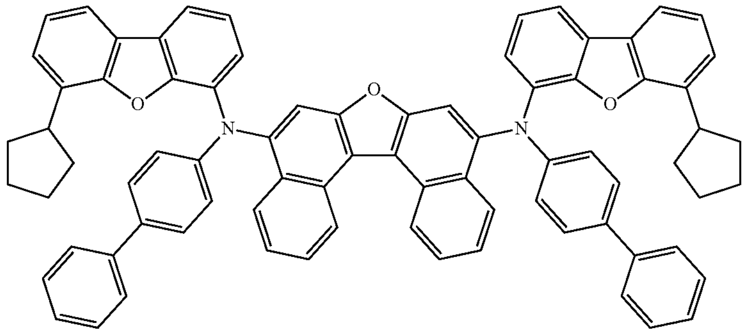
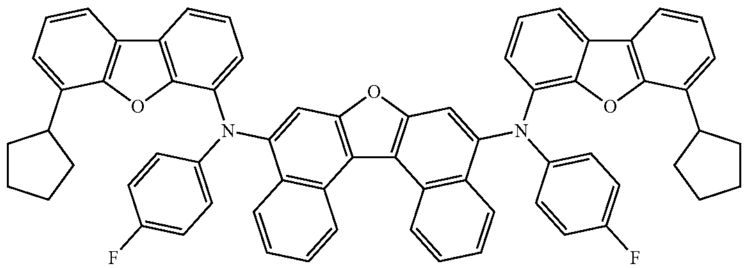
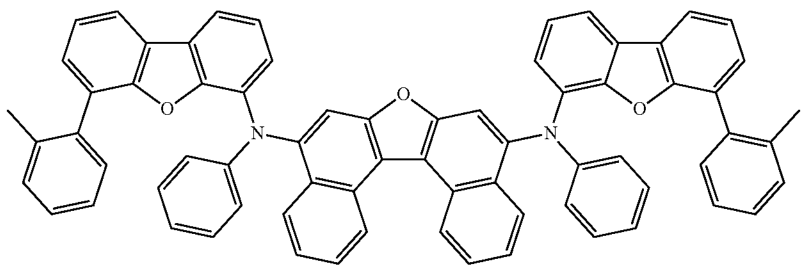
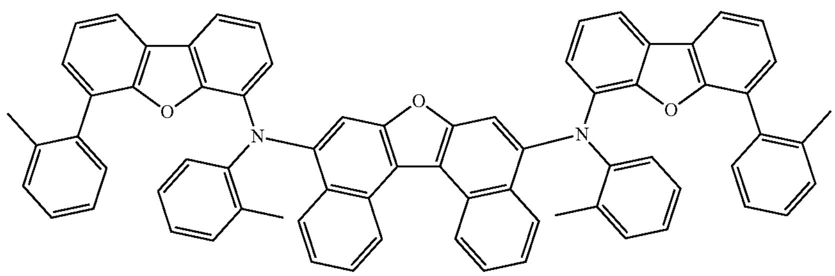
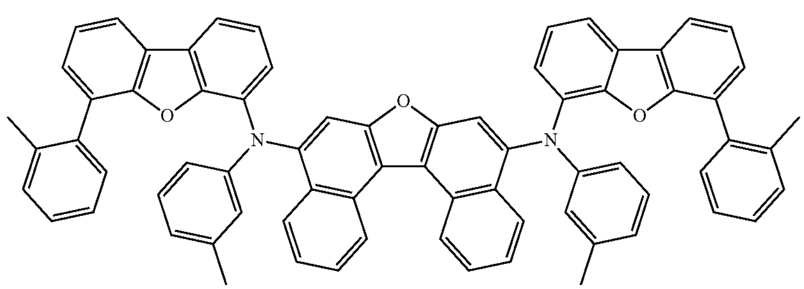
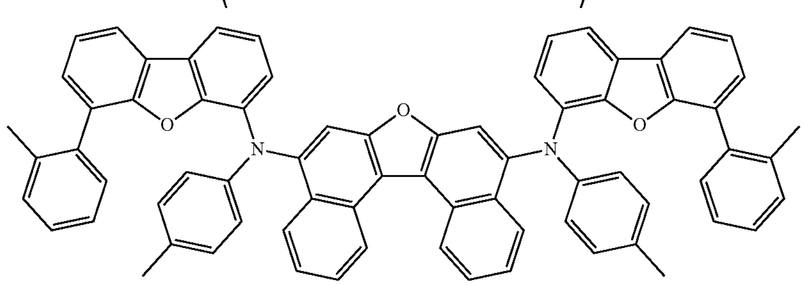

-continued
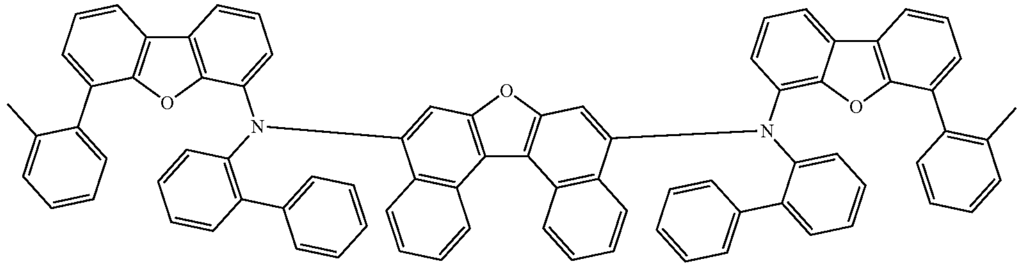
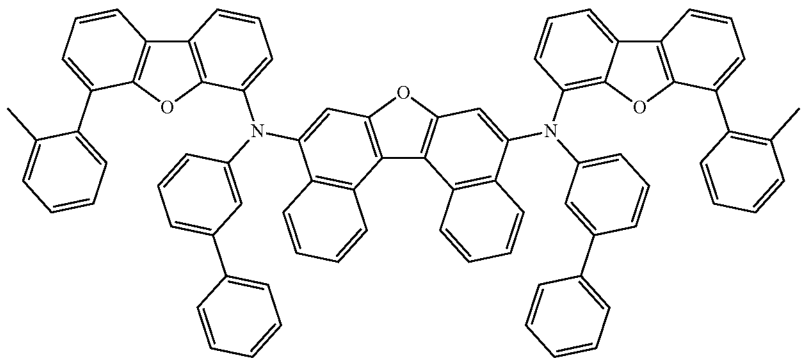
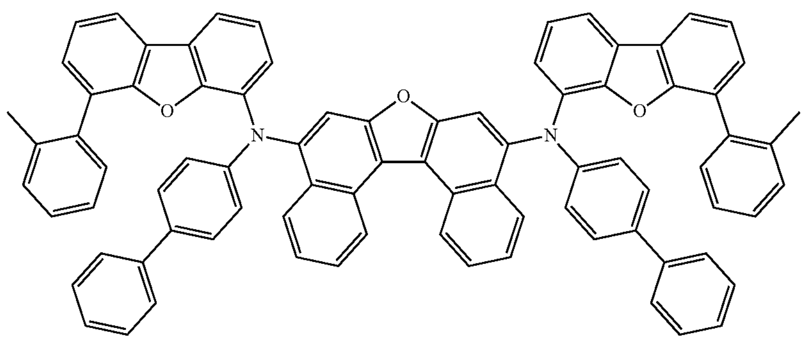
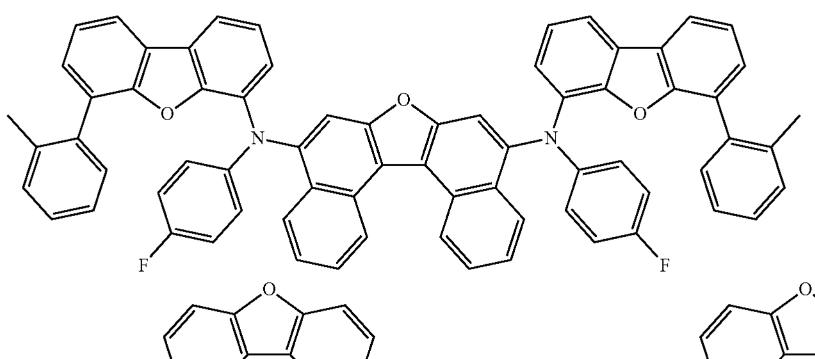
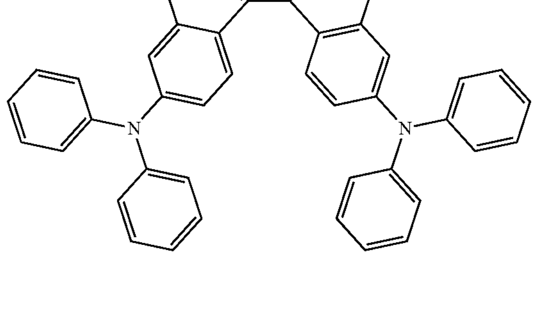
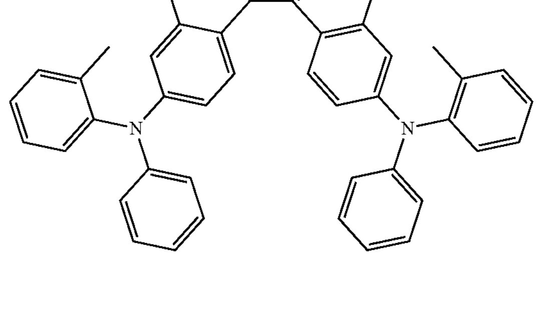

-continued
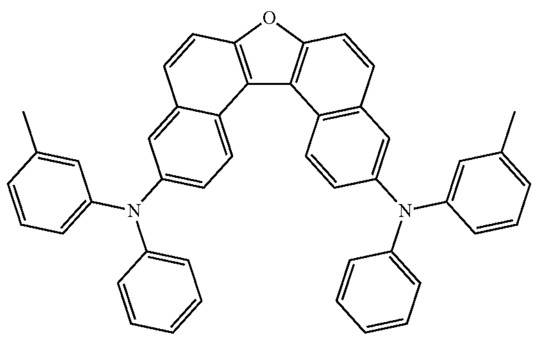
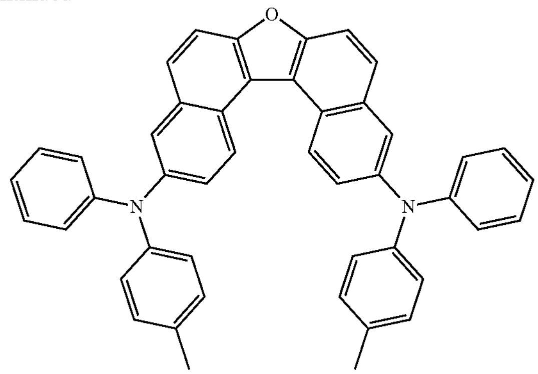
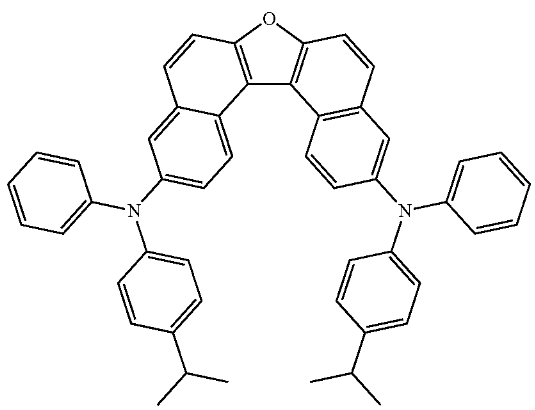
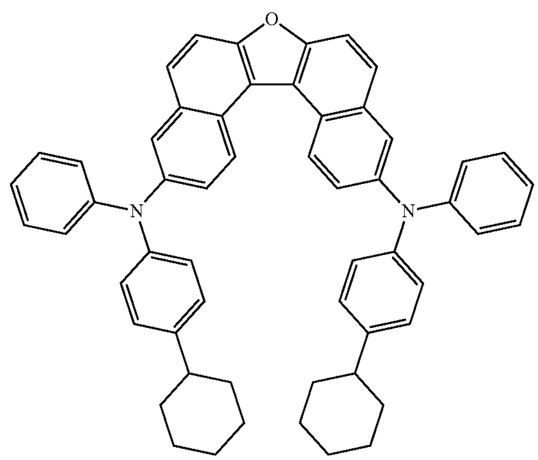
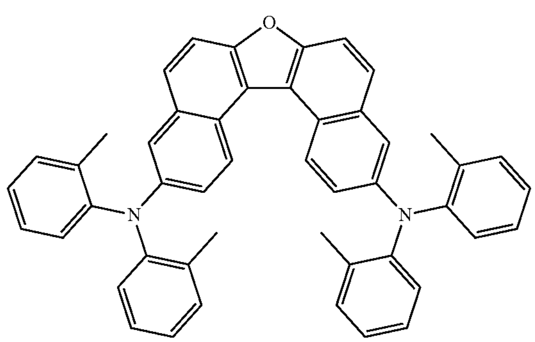
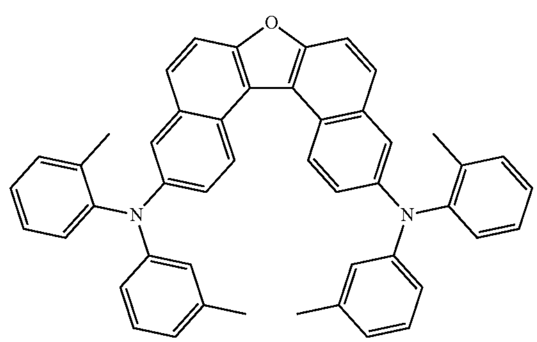
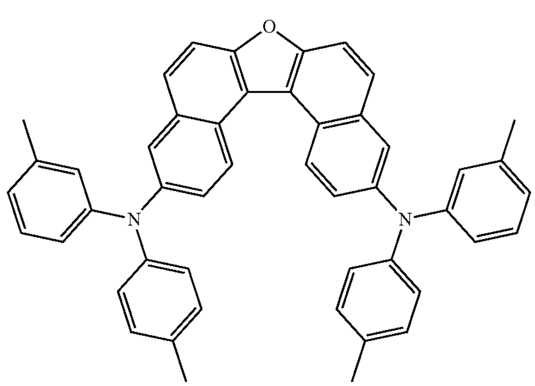
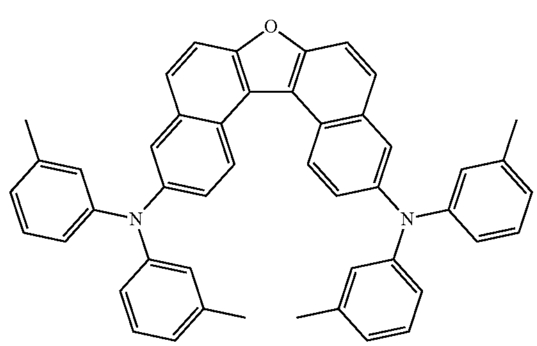

-continued
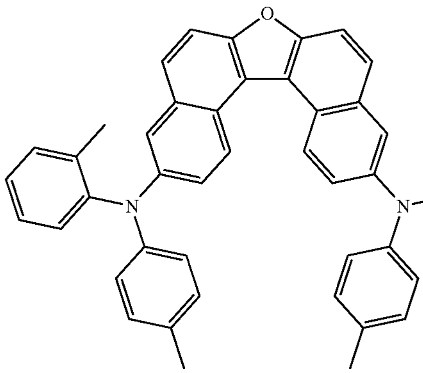
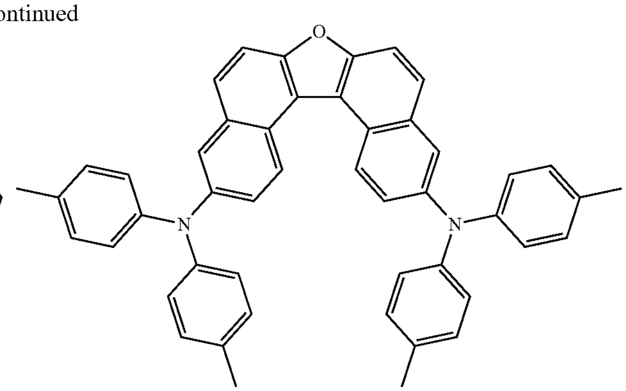
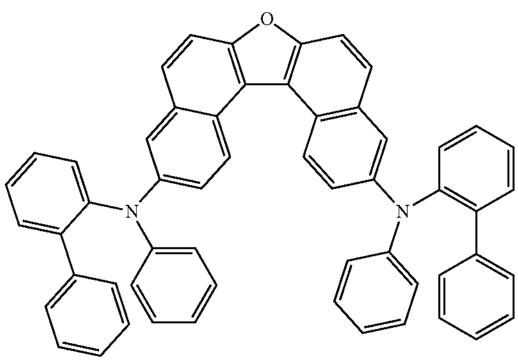
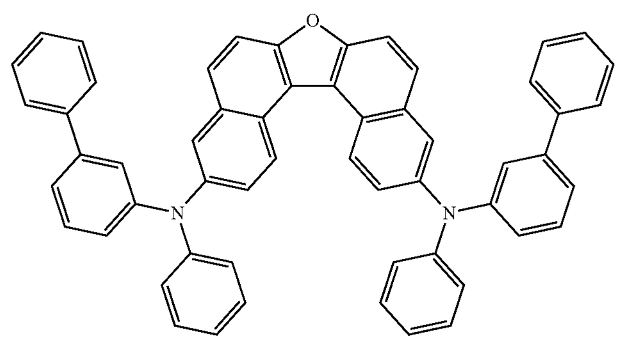
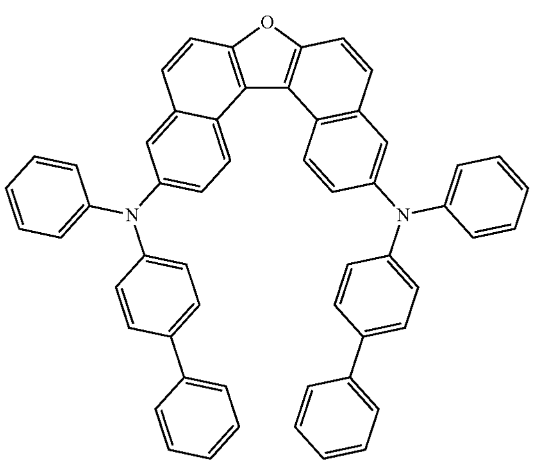
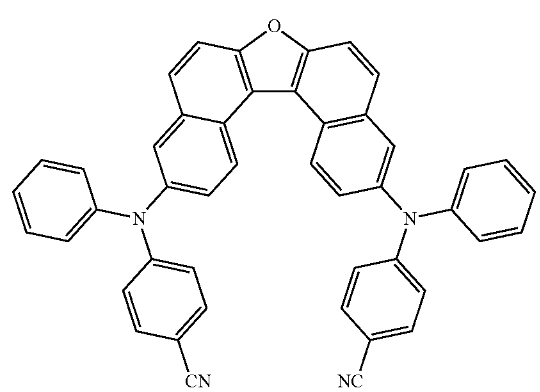
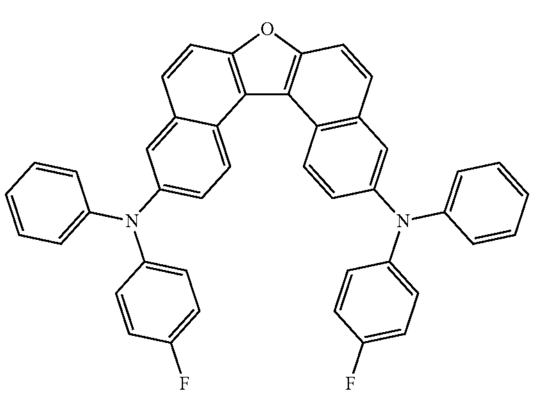
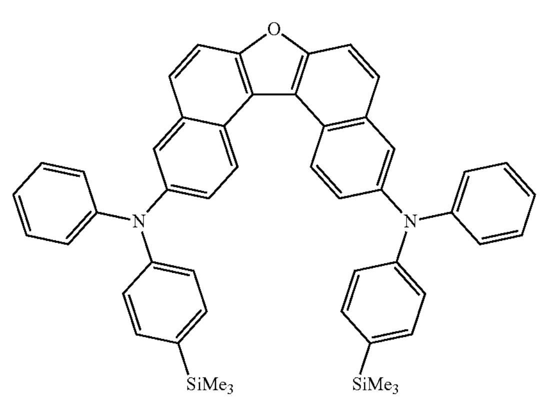

-continued
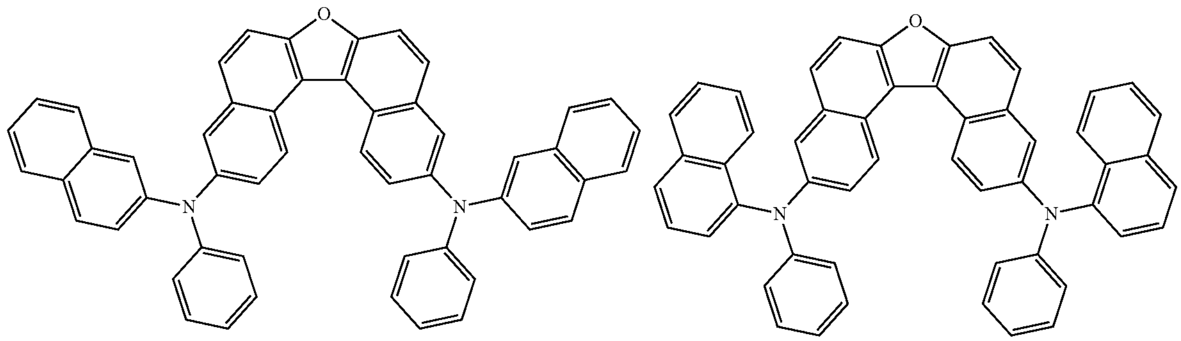
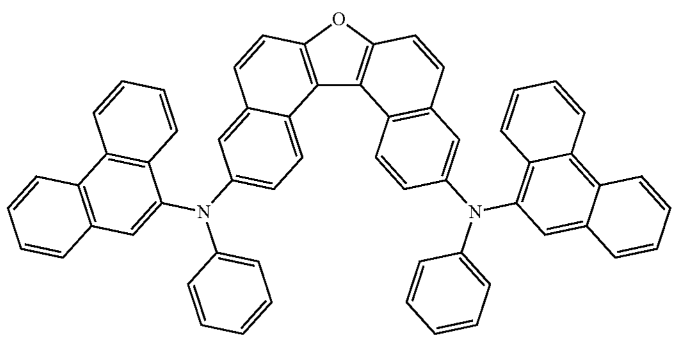
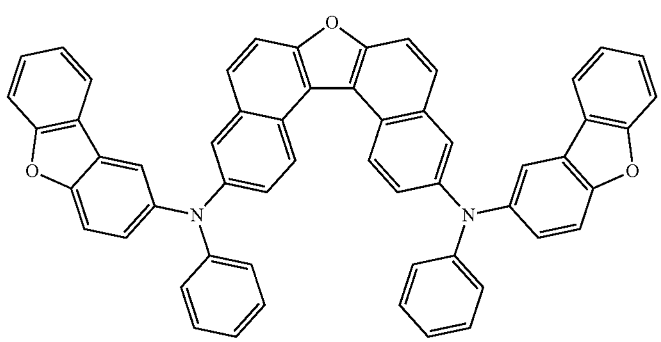
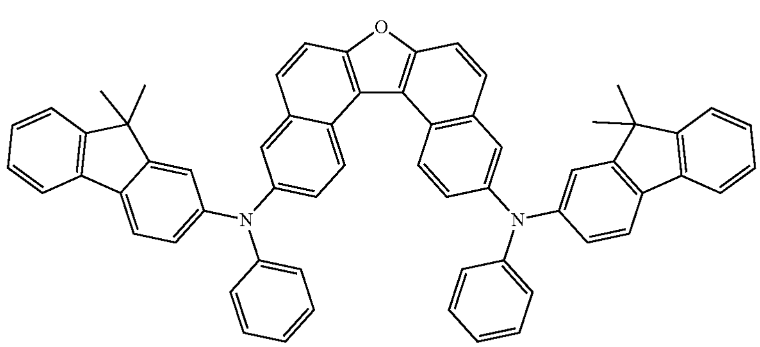

-continued
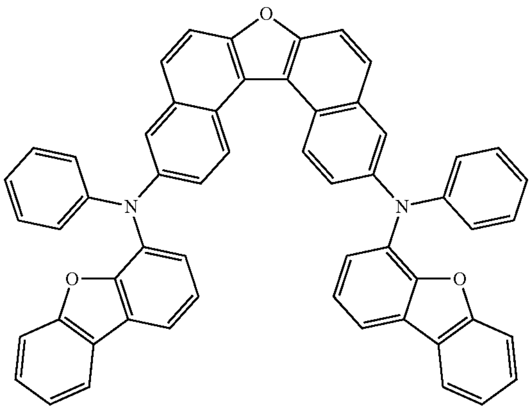
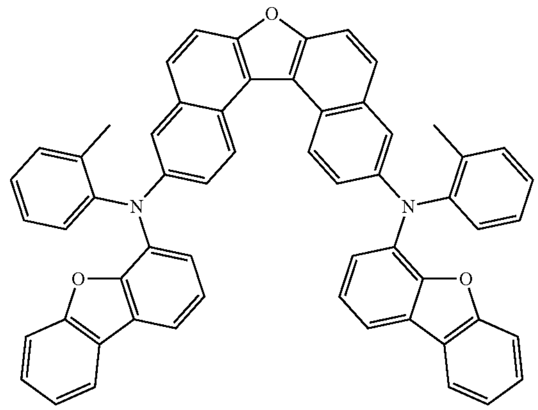
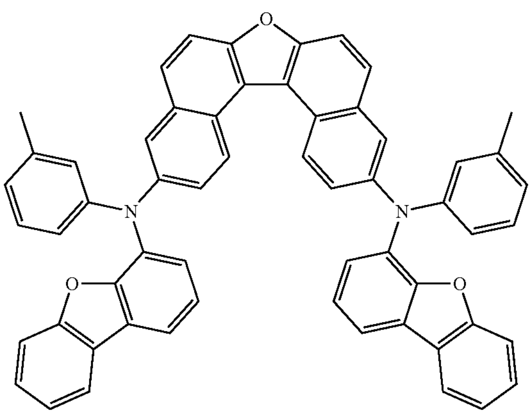
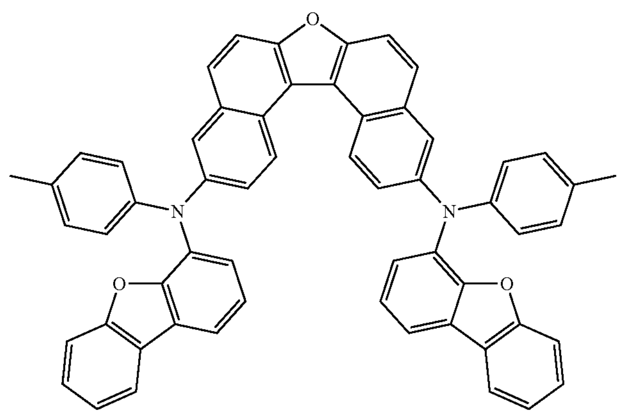
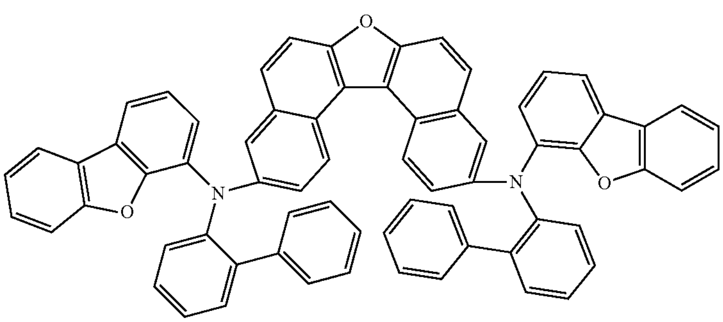
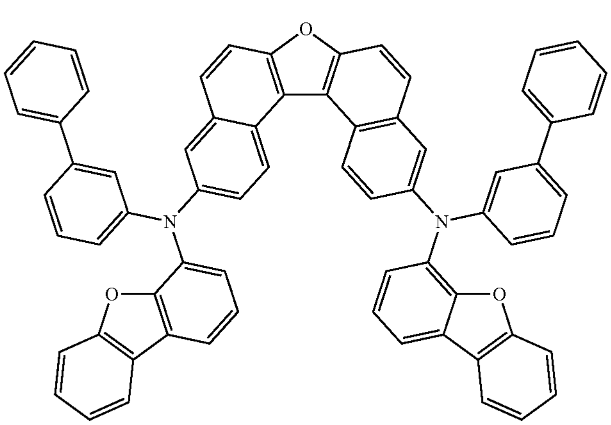

-continued
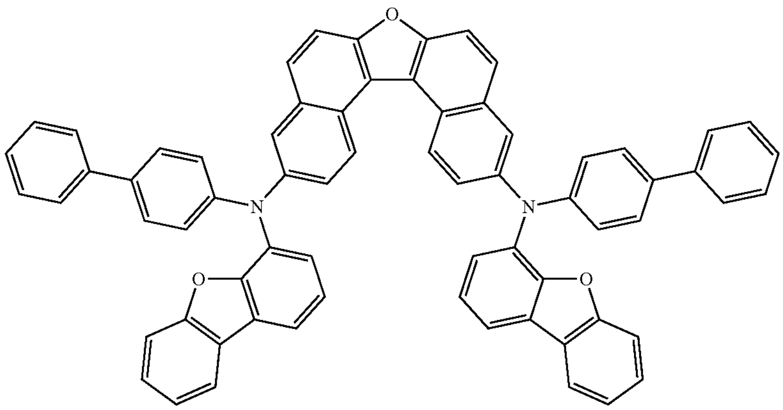
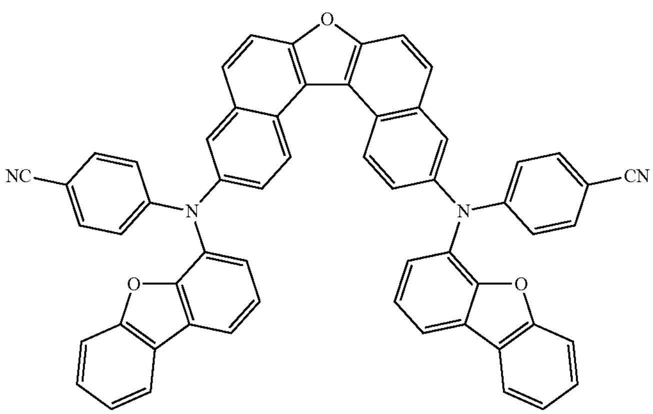
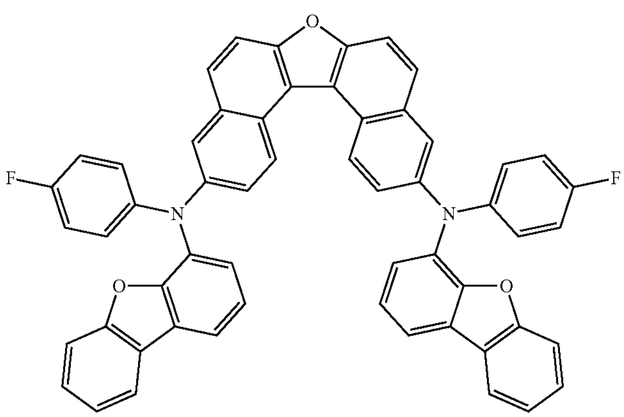
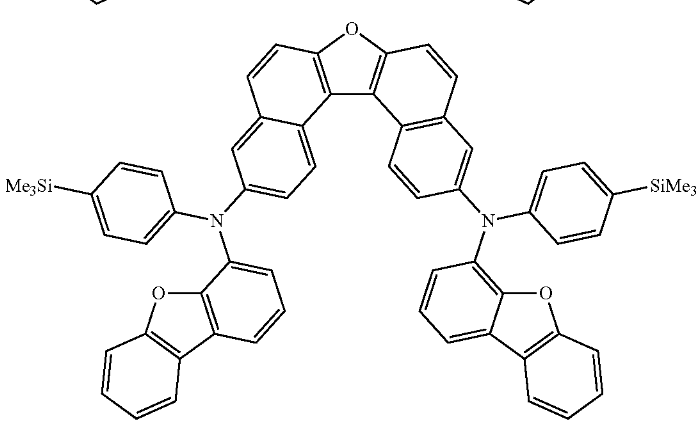

-continued
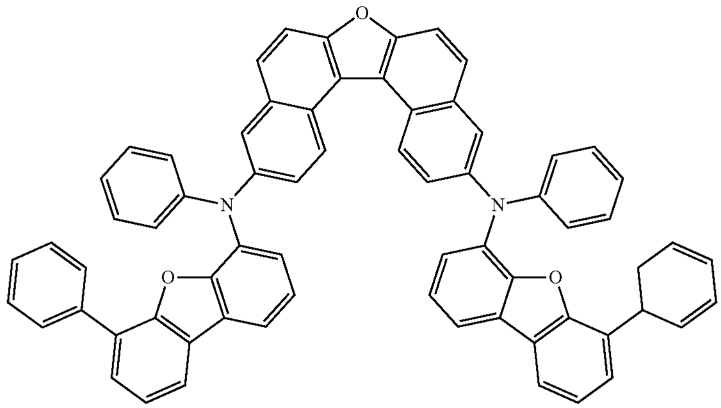
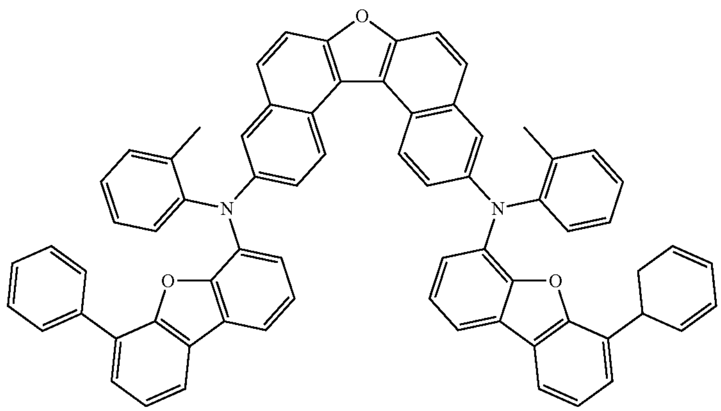
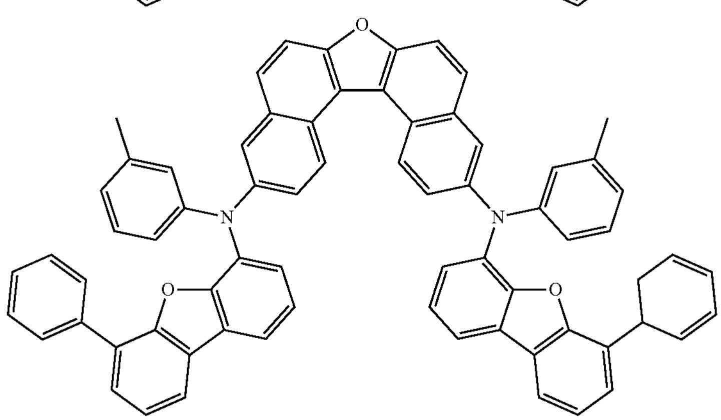
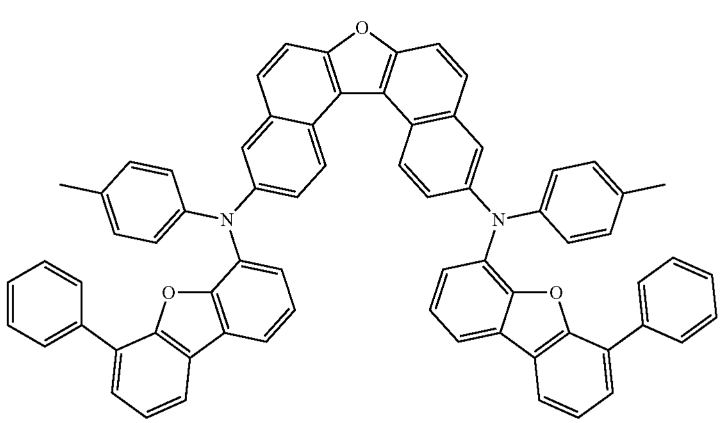

-continued
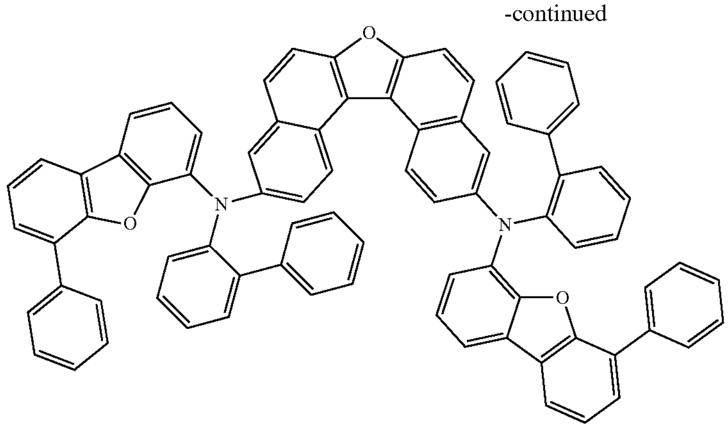
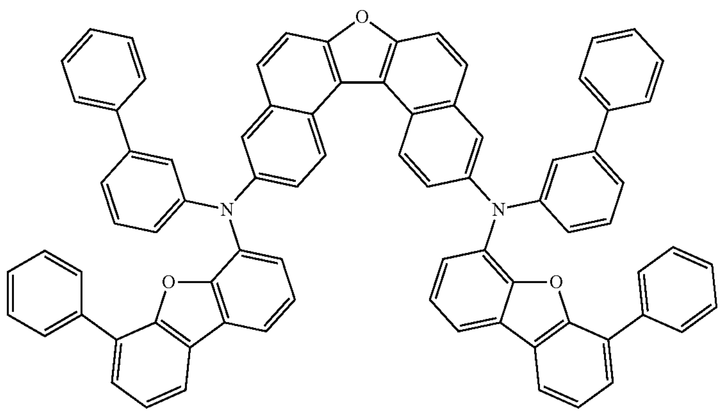
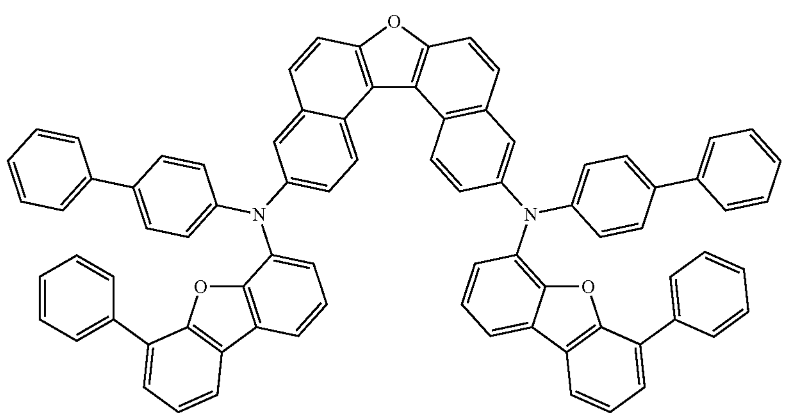
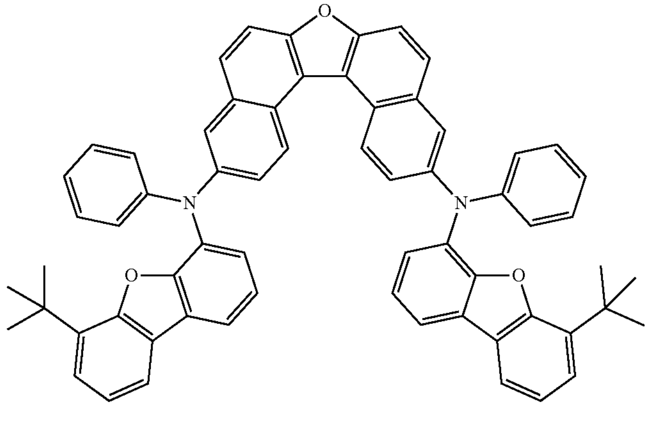

-continued
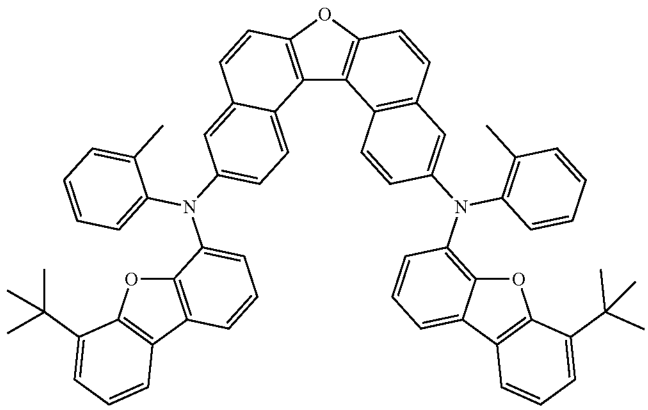
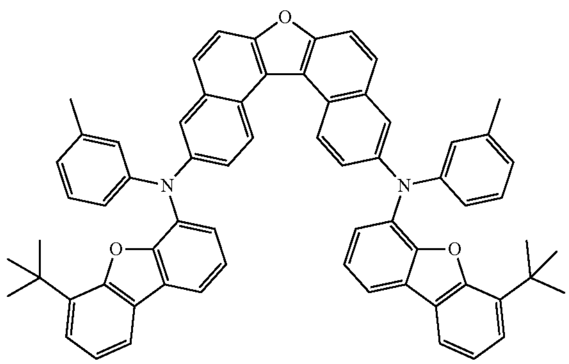
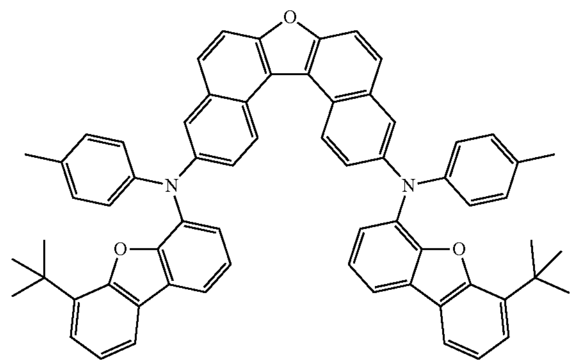
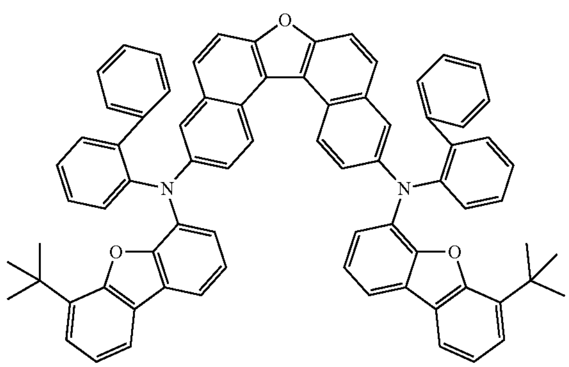
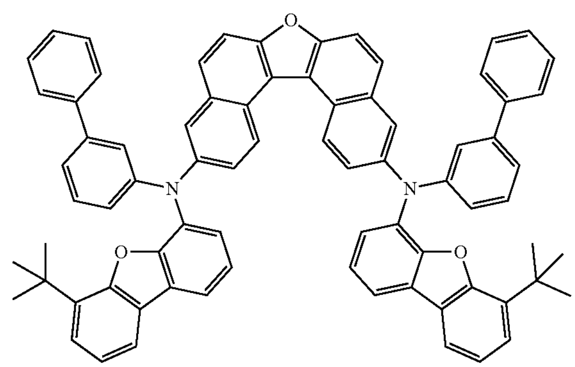
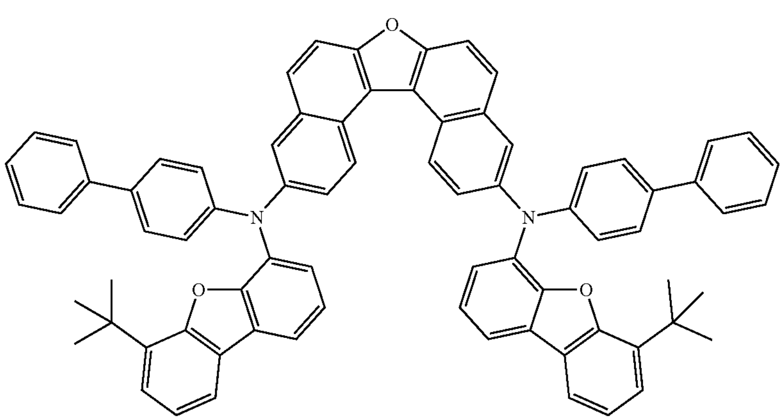

-continued
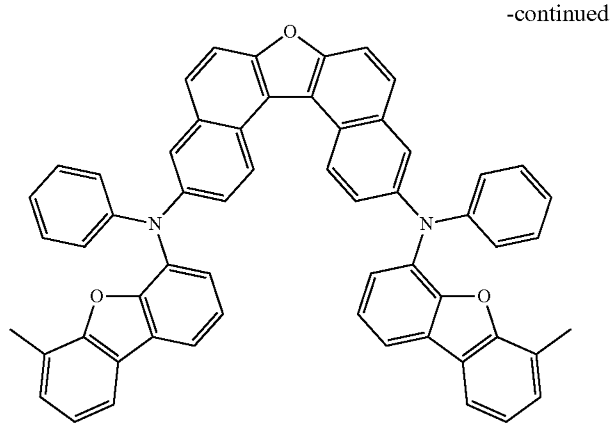
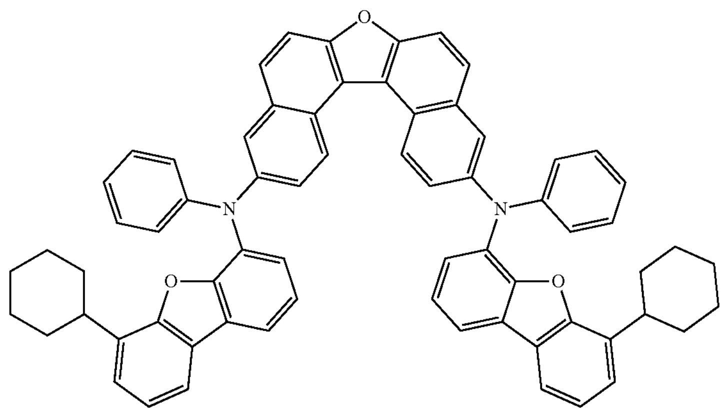
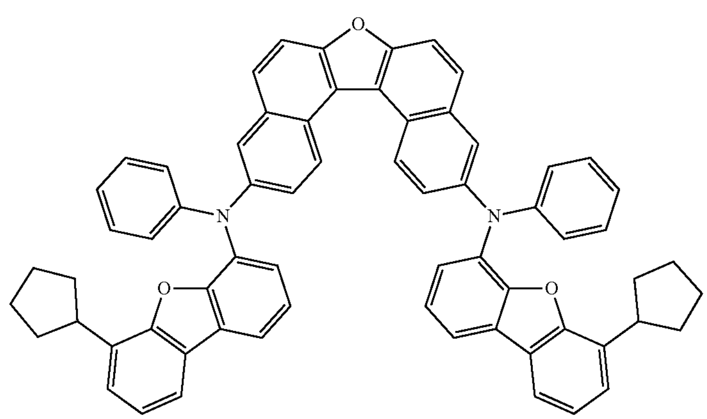
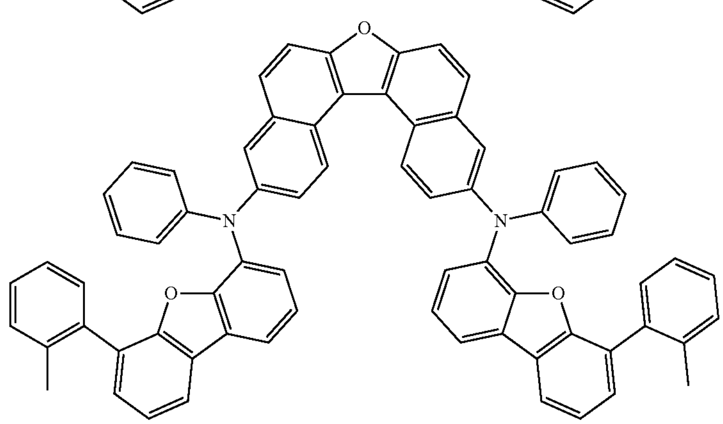

-continued
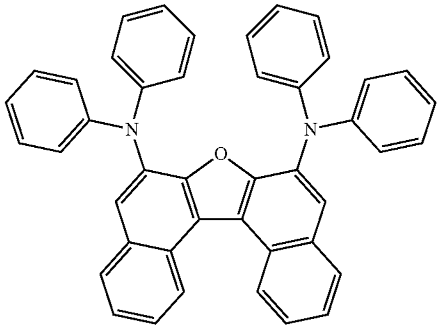
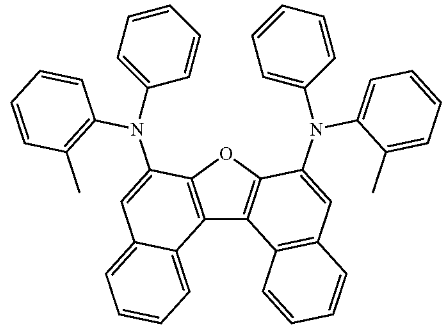
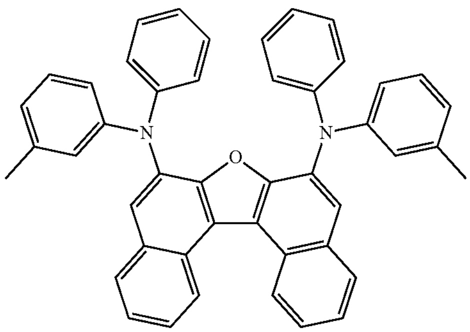
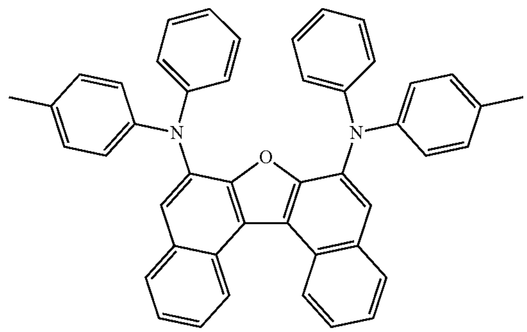
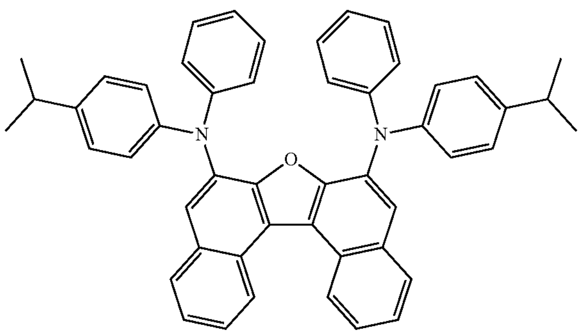
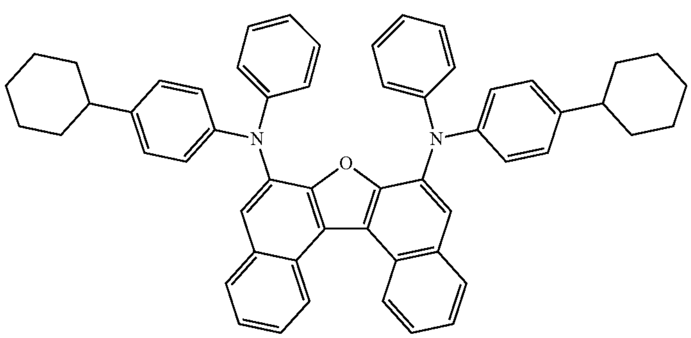
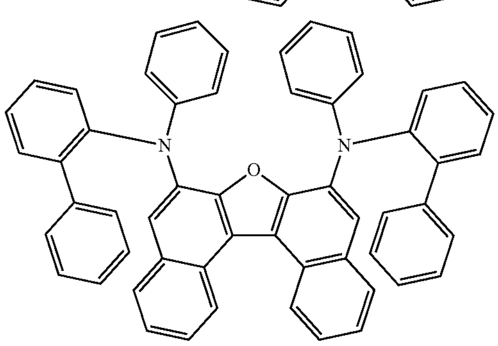
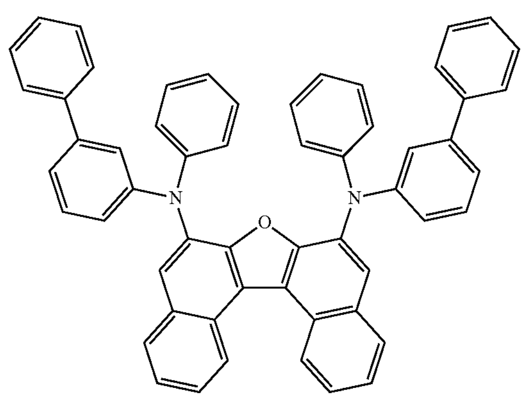

-continued
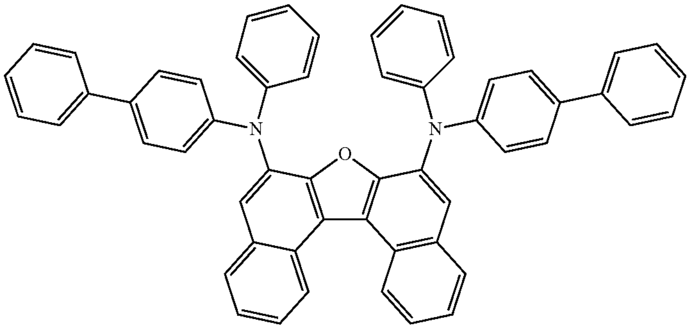
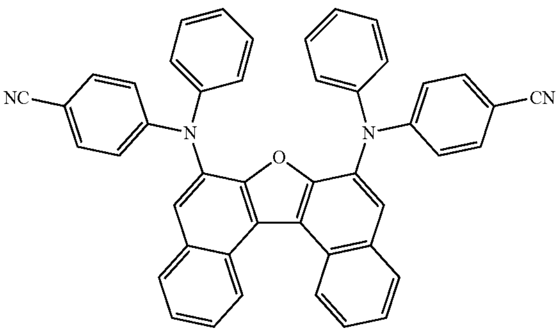
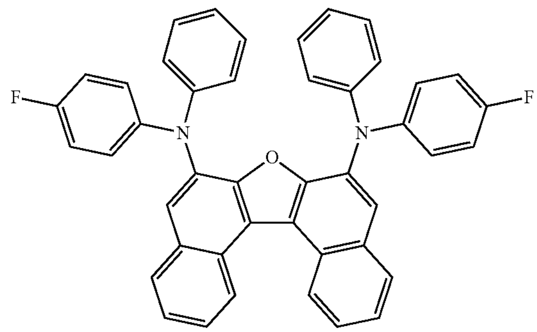
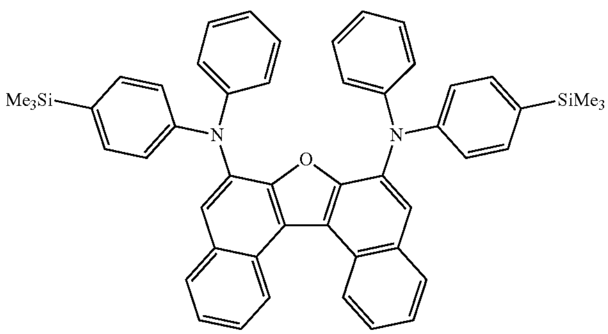
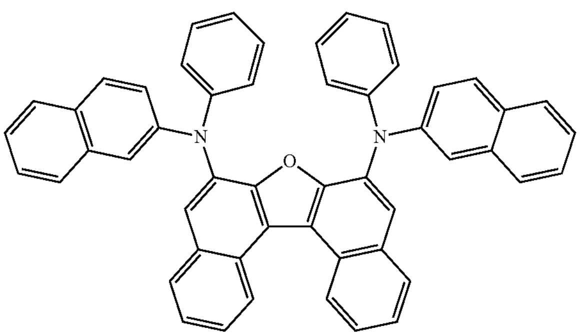
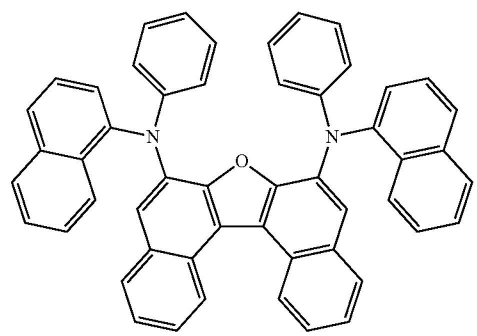
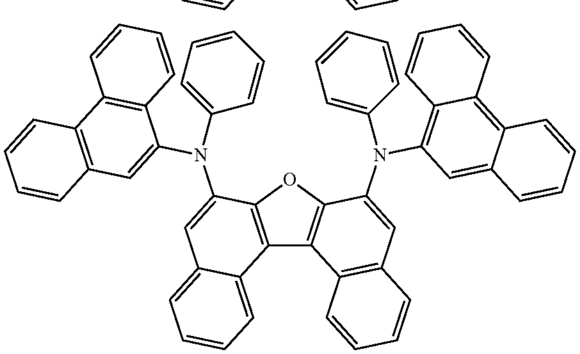

-continued
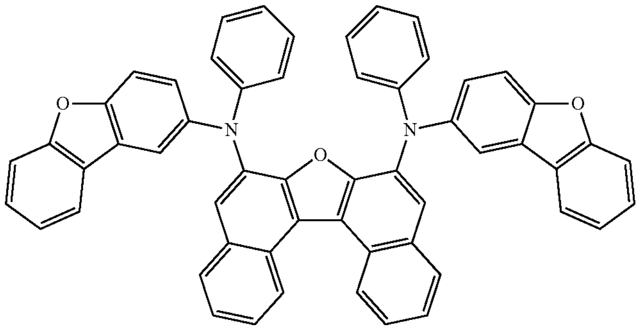
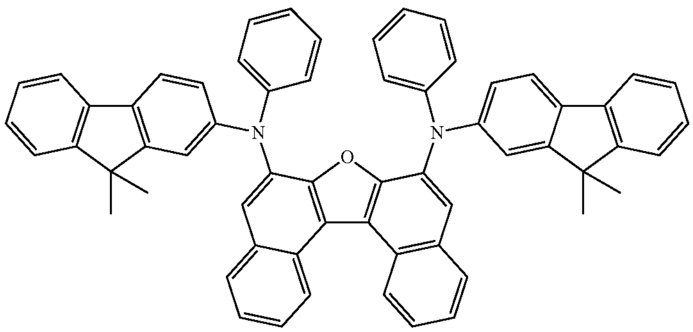
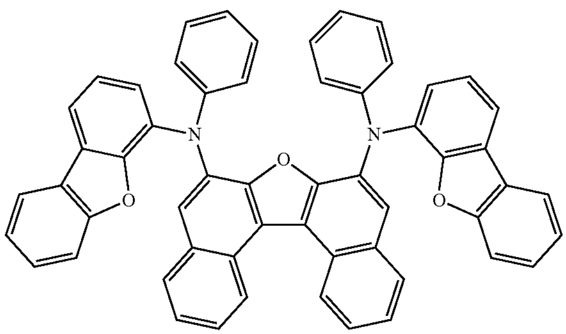
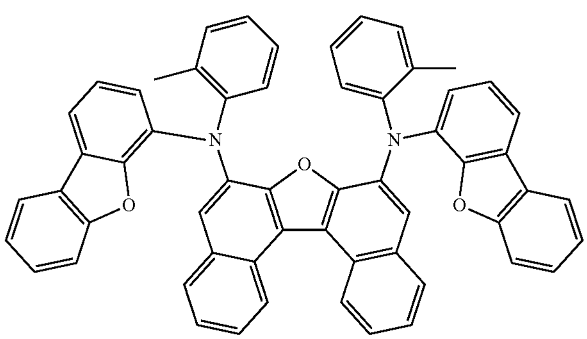
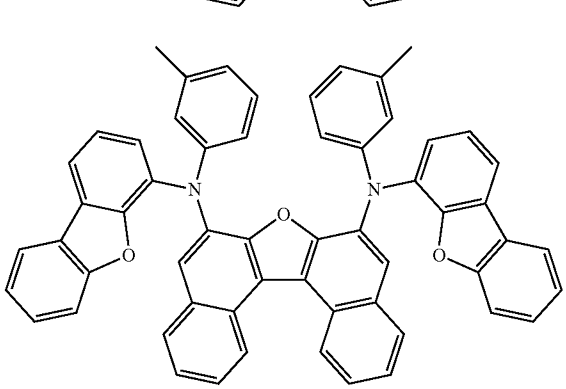
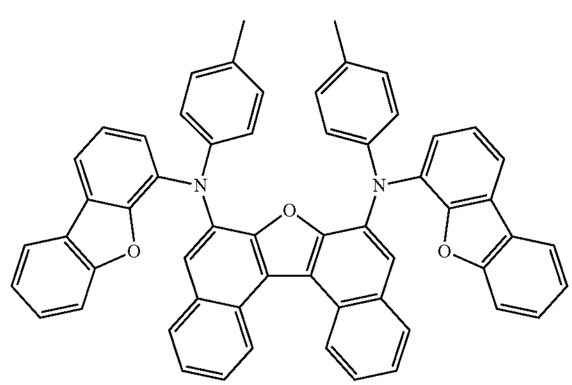

-continued
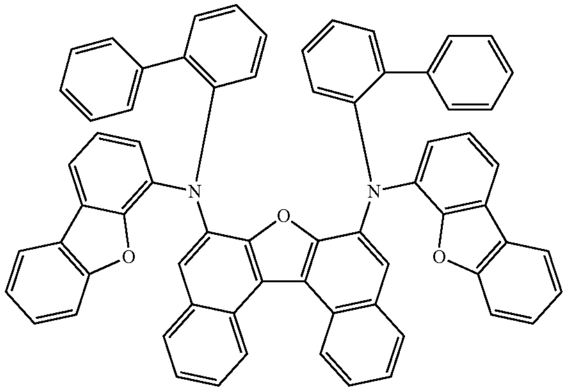
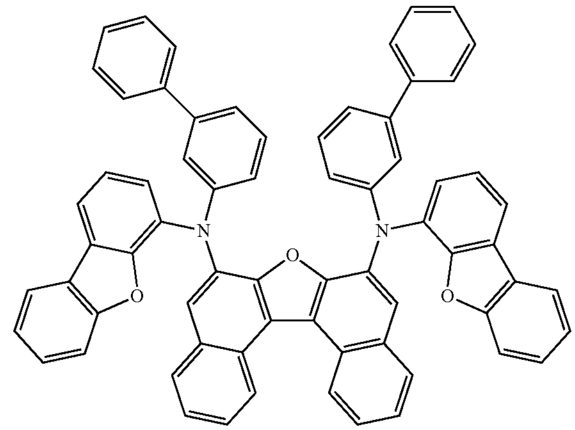
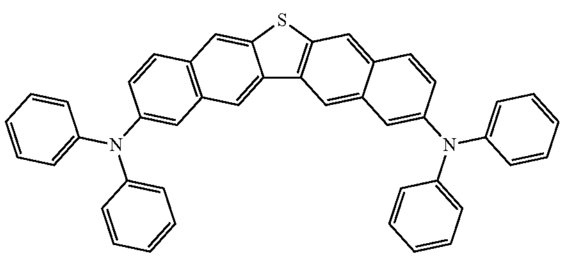
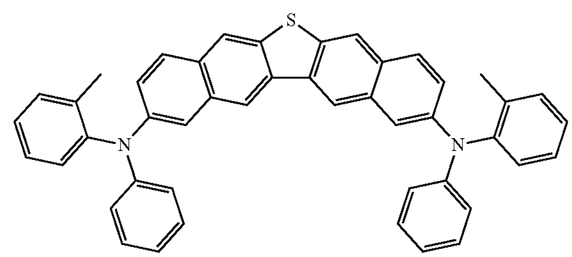
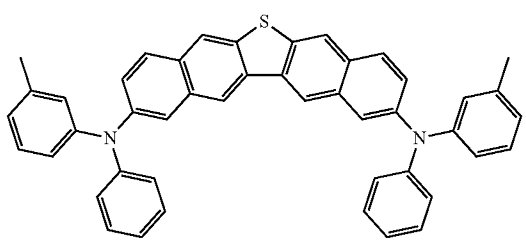
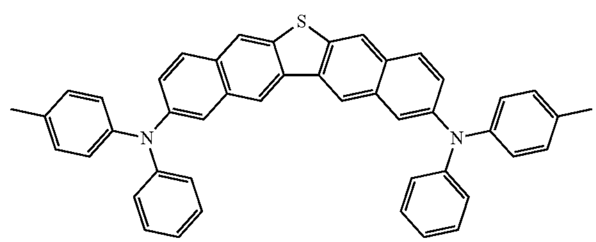
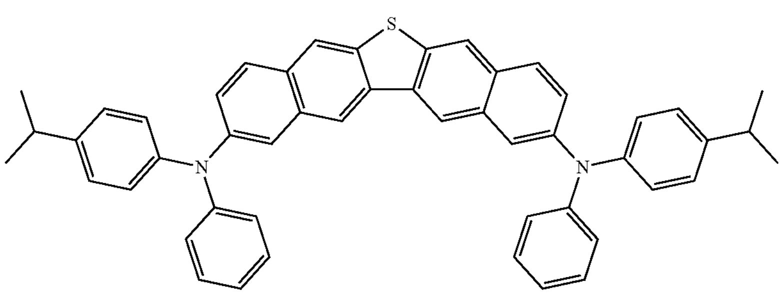
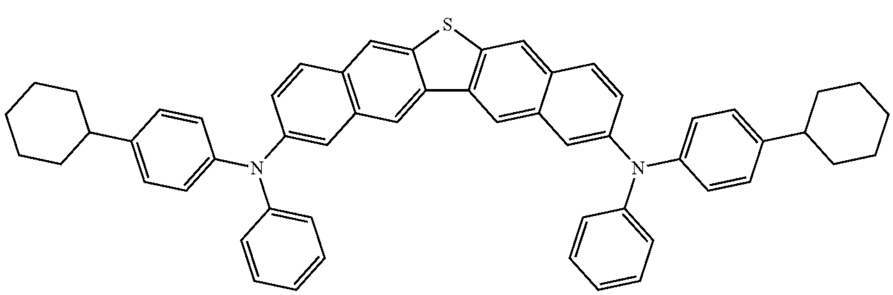

-continued
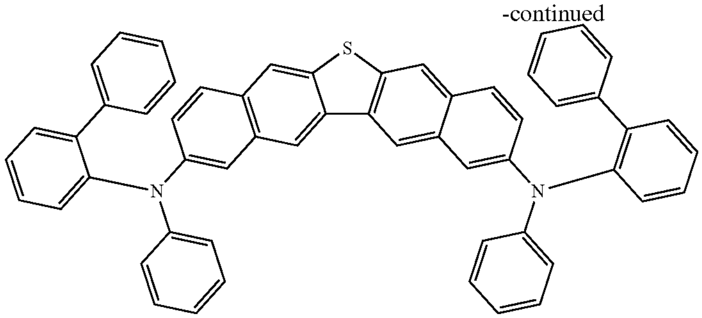
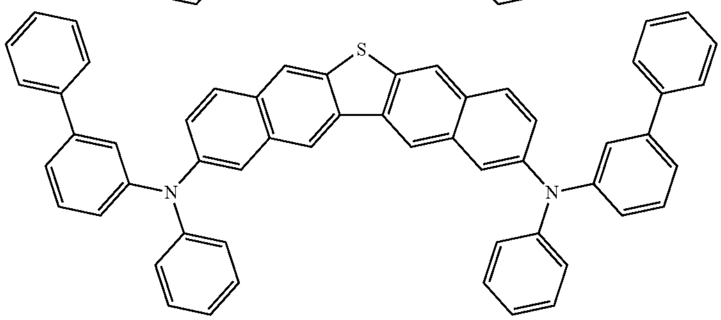
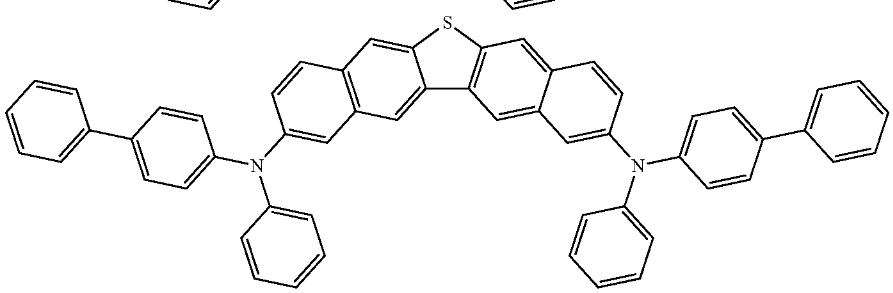
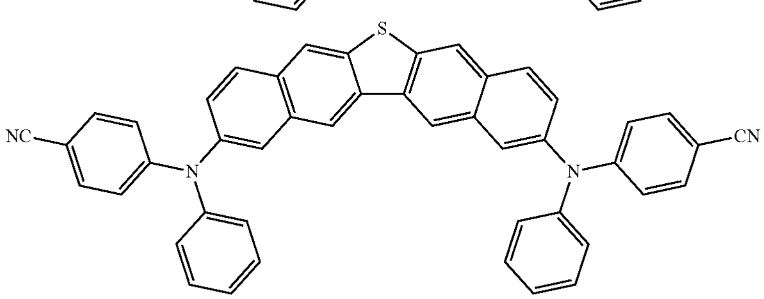
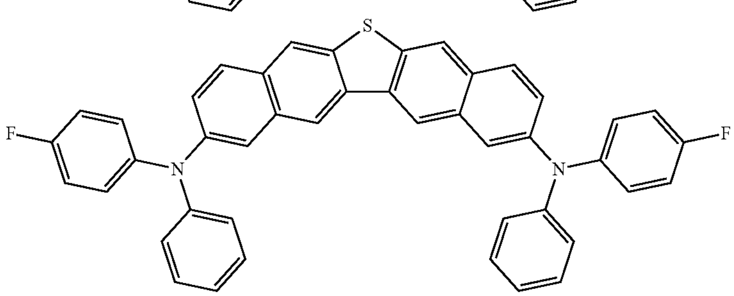
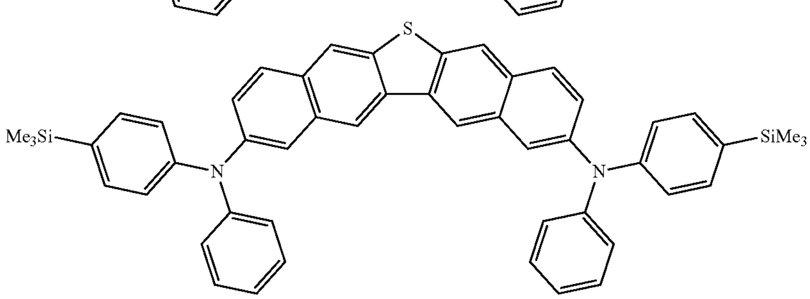

-continued
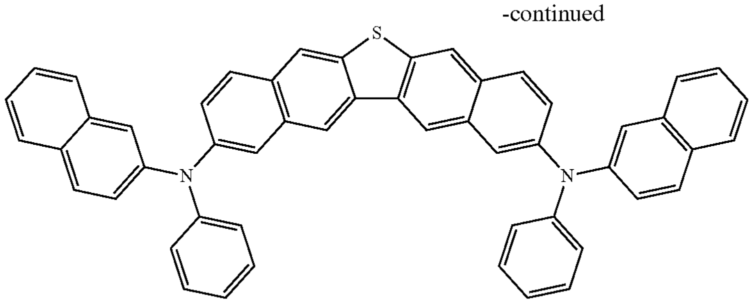
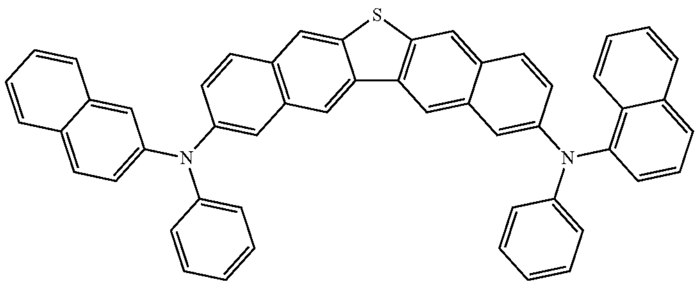
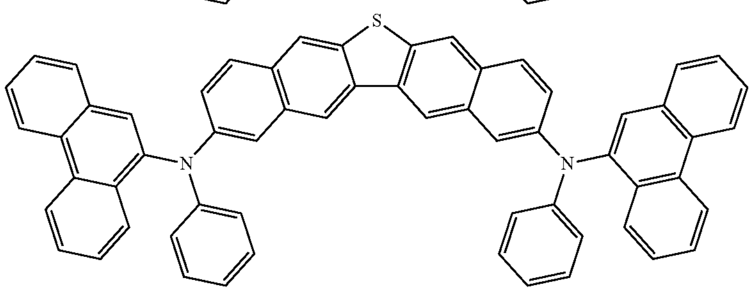
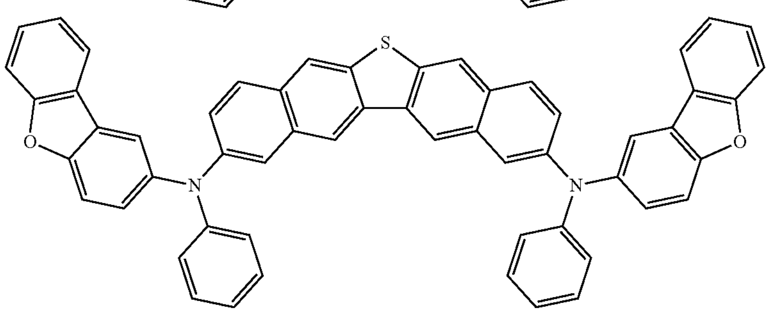
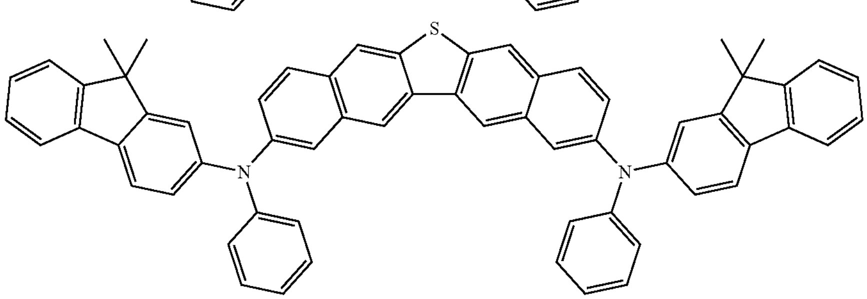
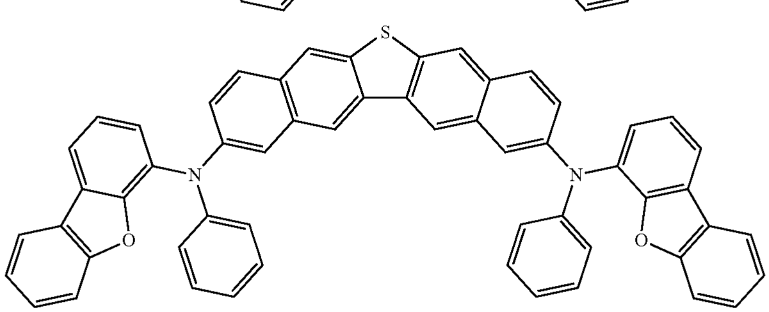

-continued
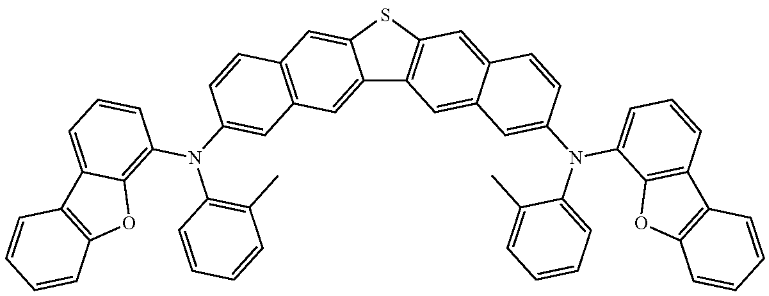
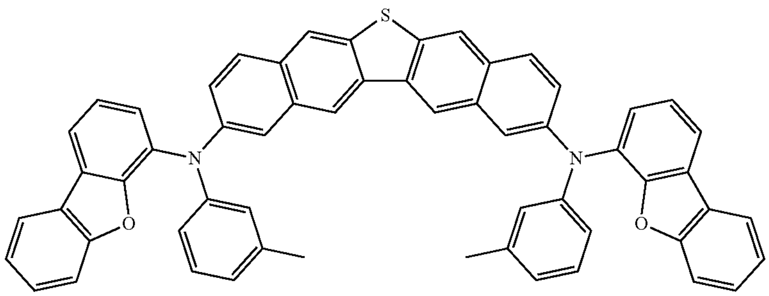
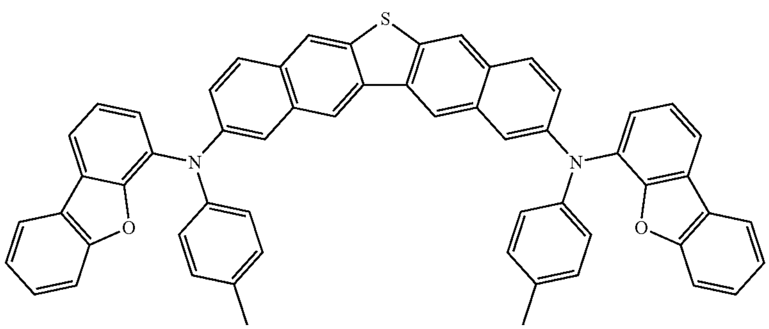
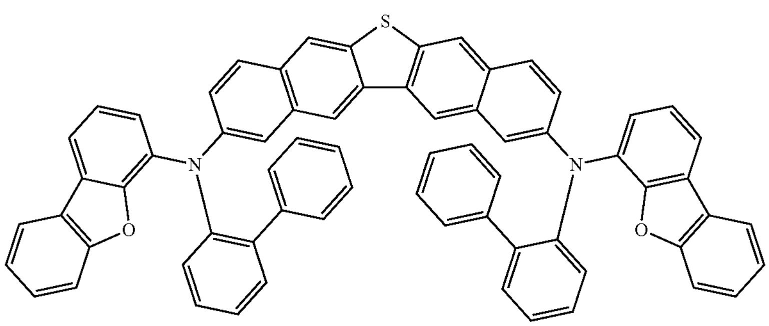
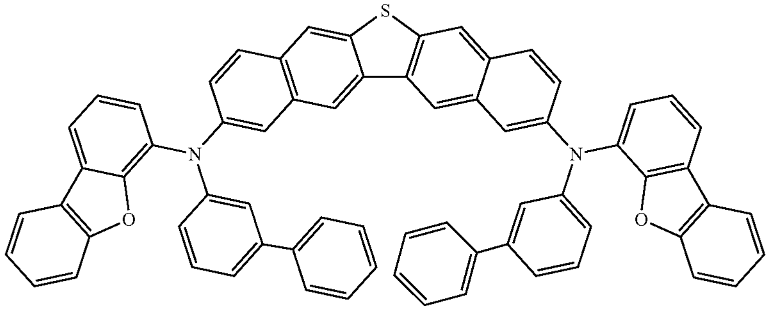

-continued
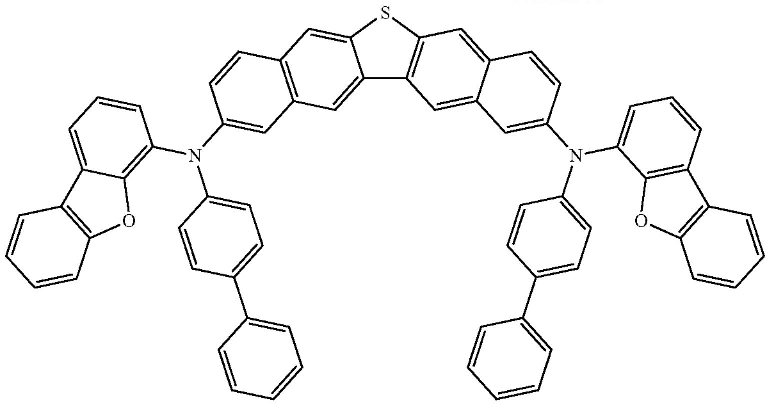
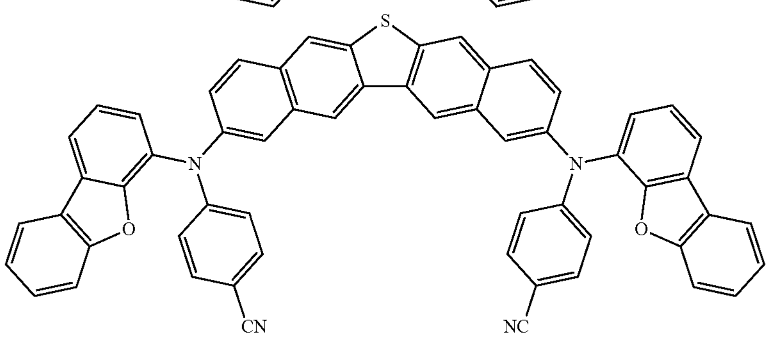
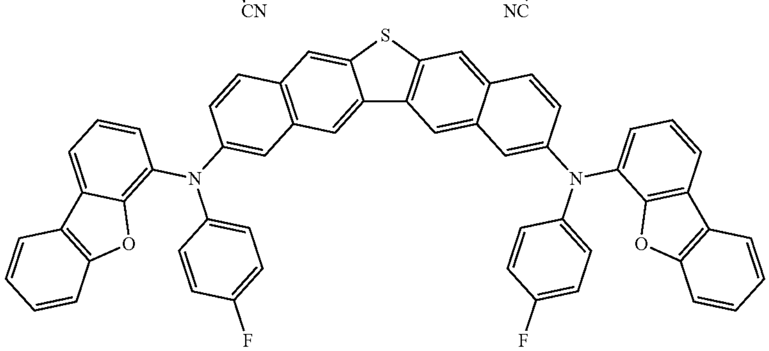
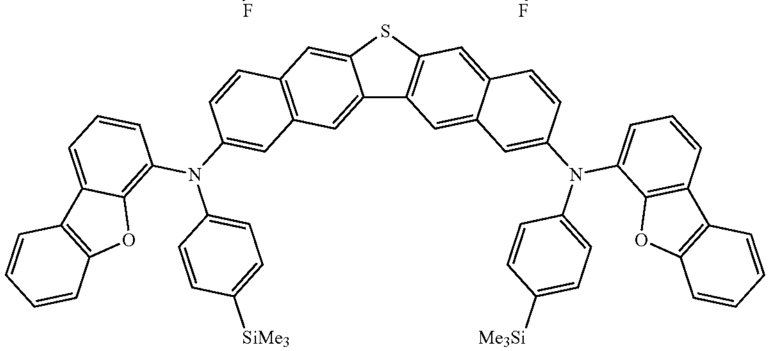
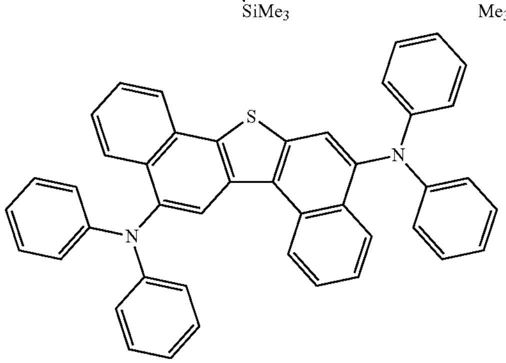
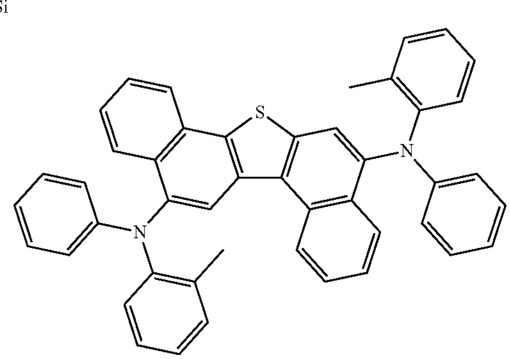

-continued
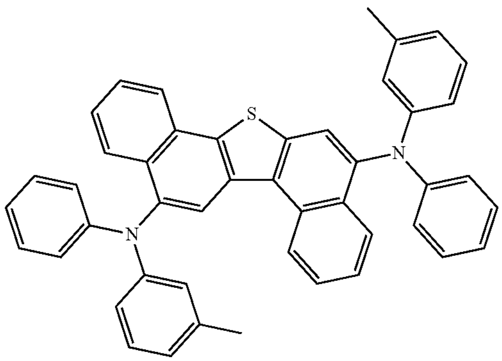
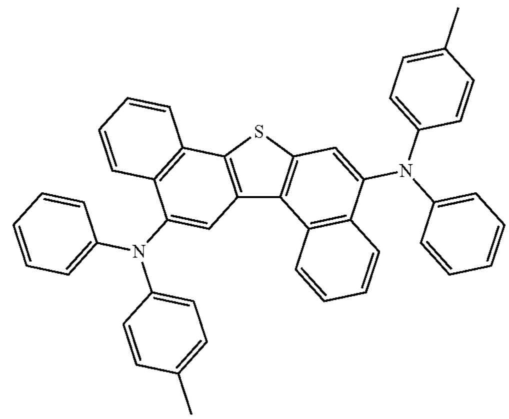
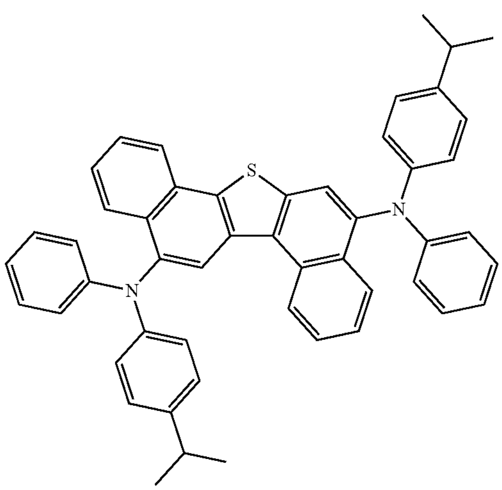
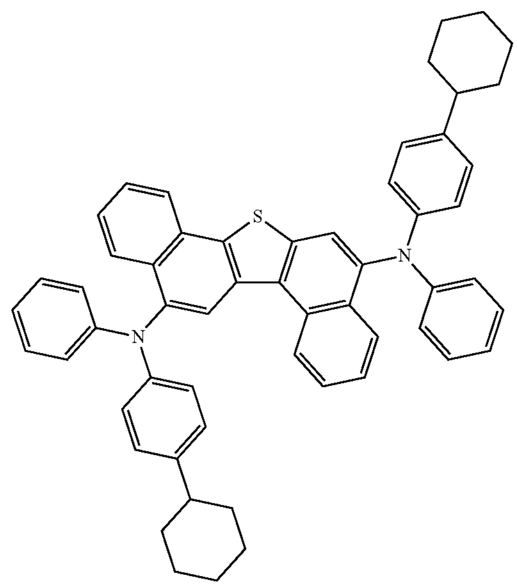
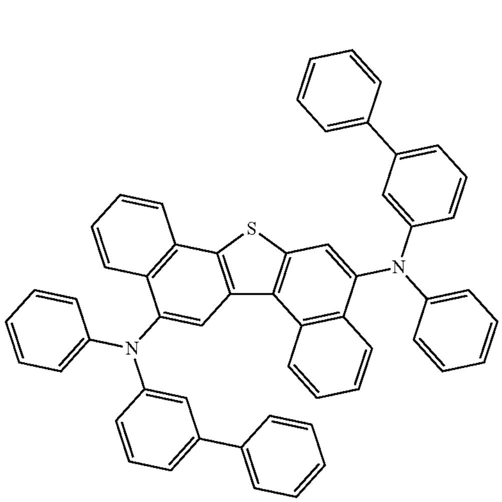
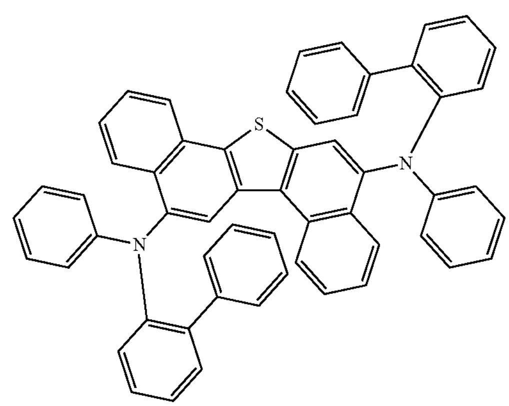

-continued
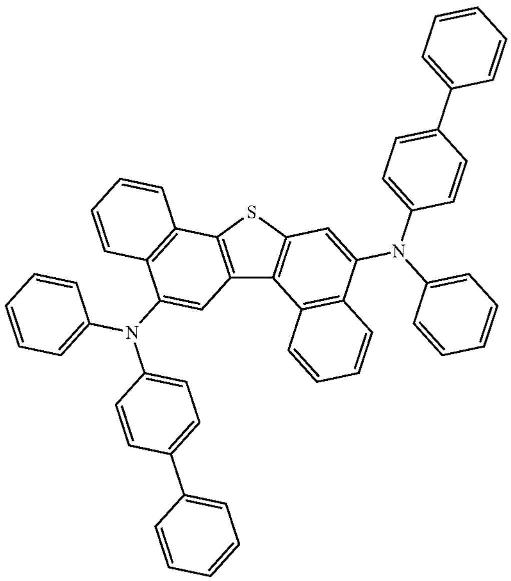
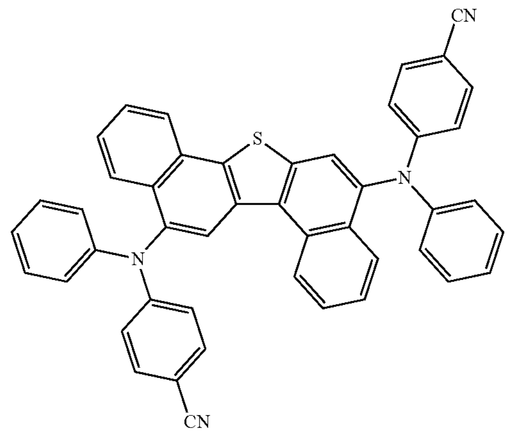
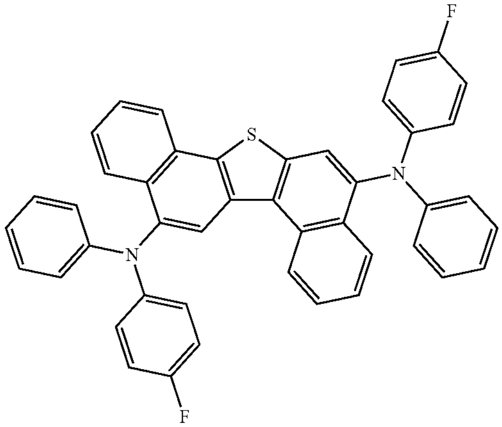
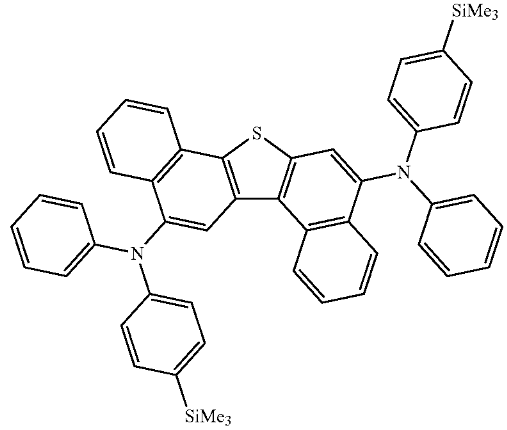
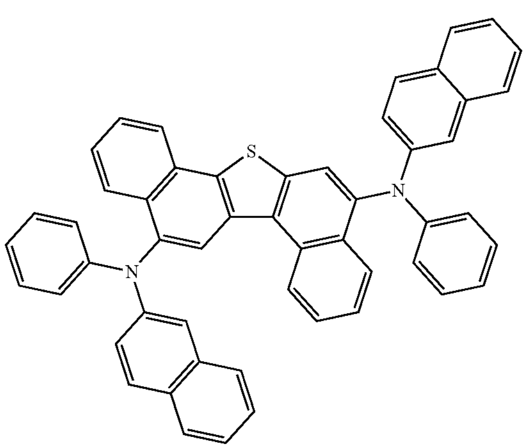
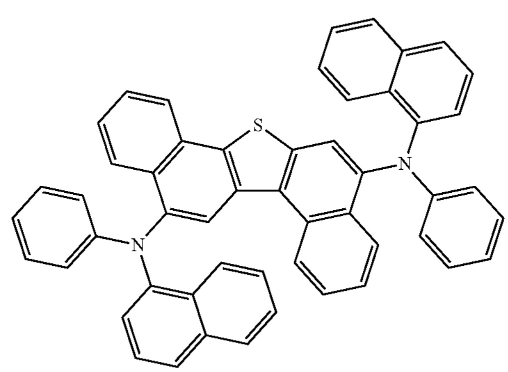

-continued
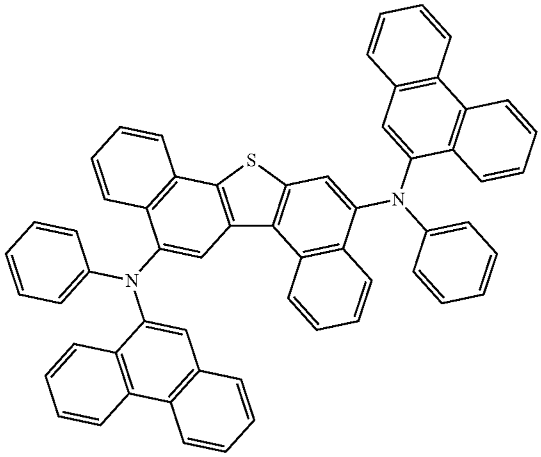
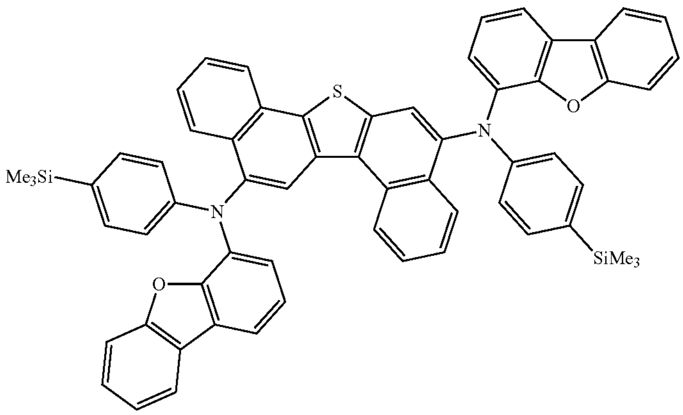
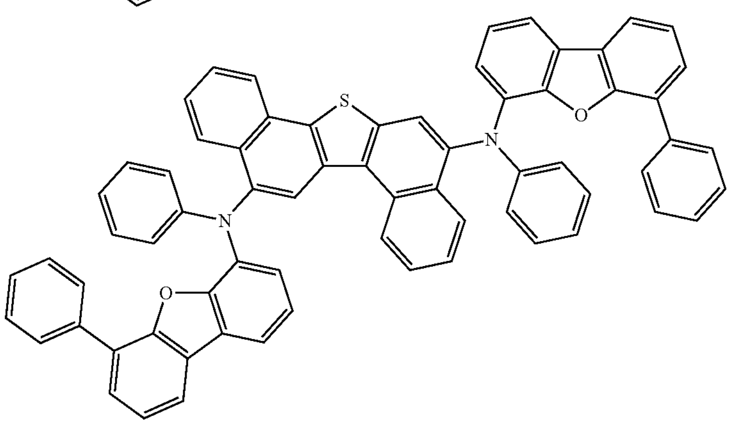
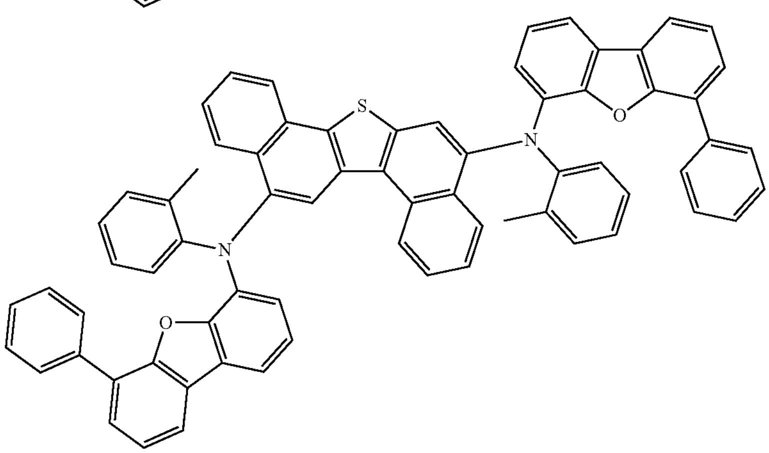

-continued
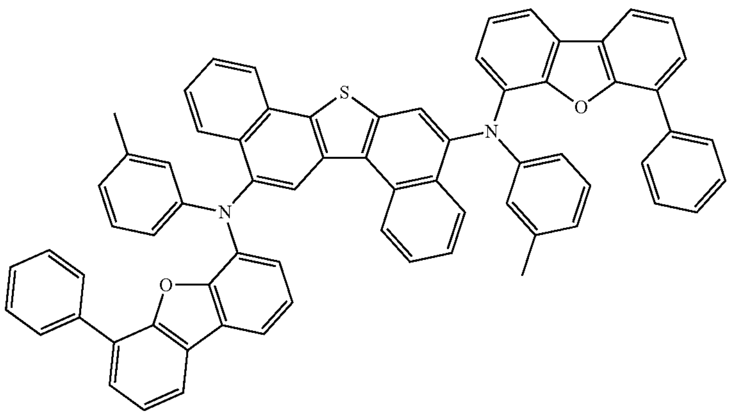
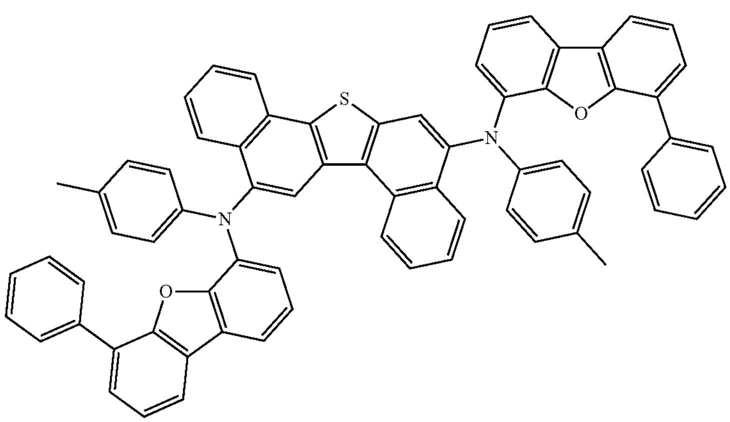
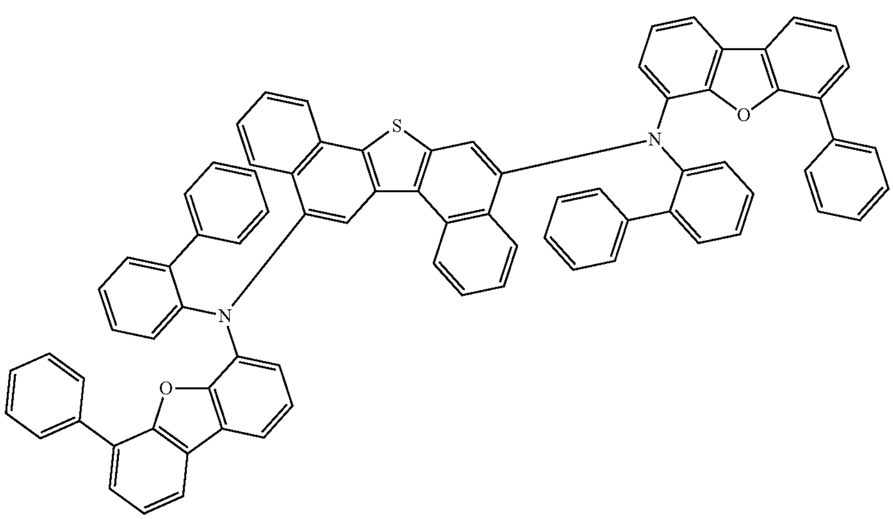

-continued
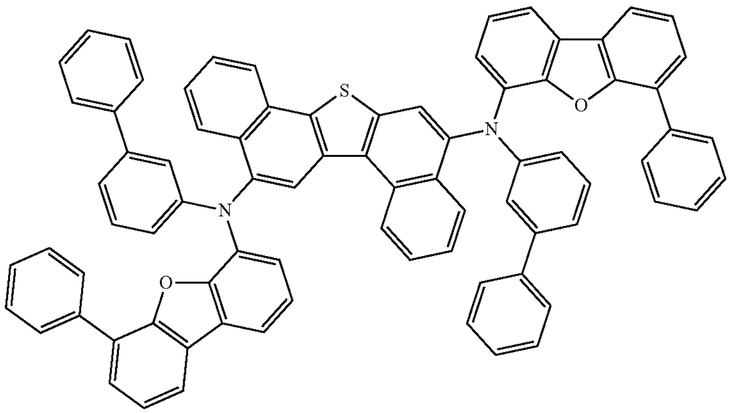
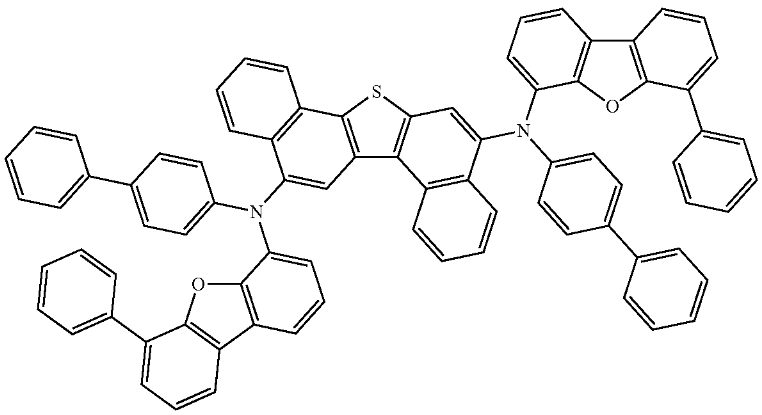
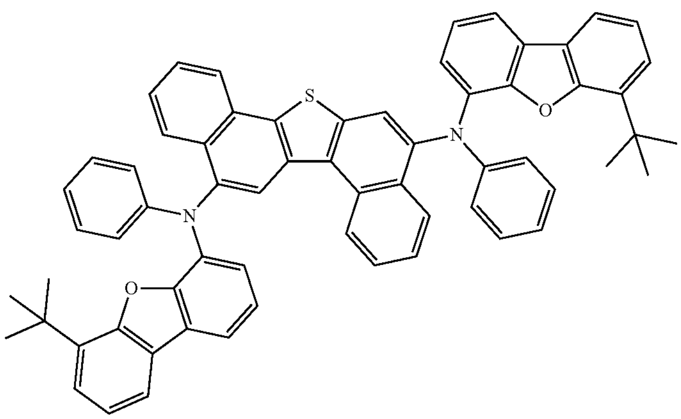
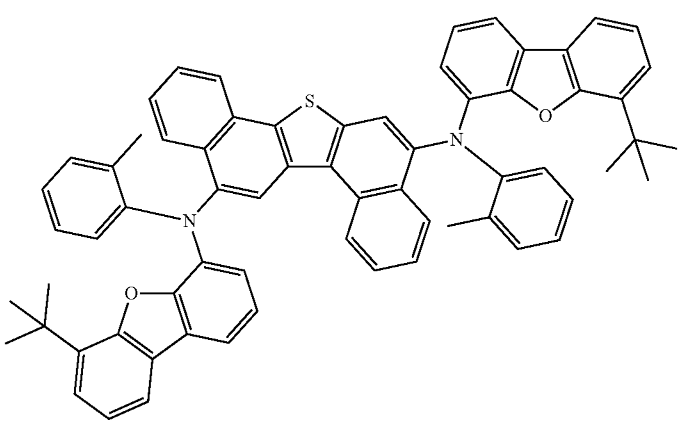

-continued
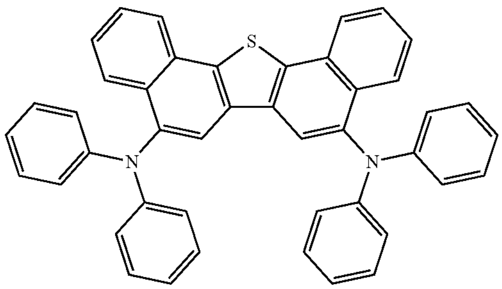
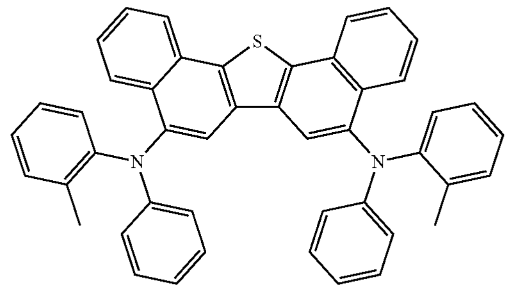
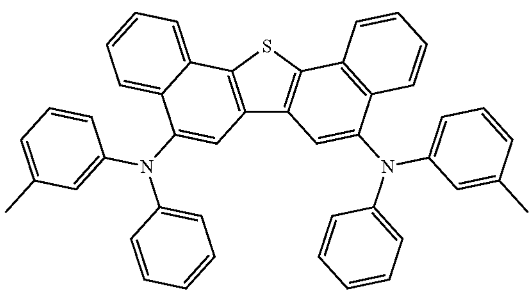
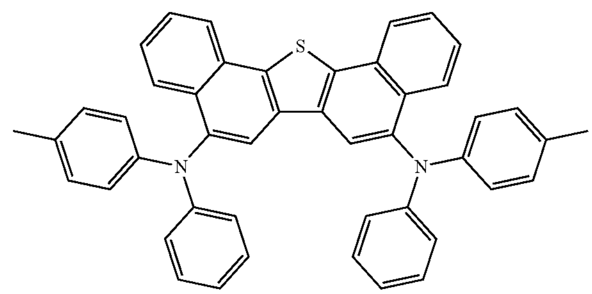
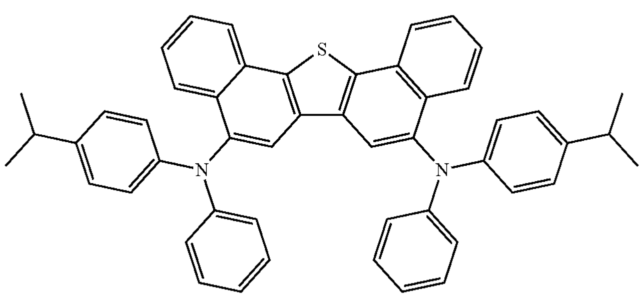
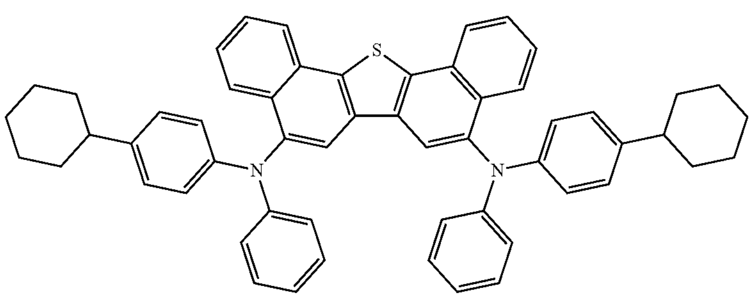
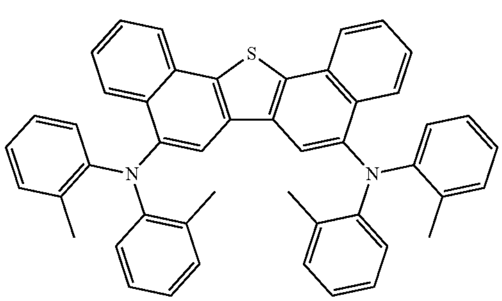
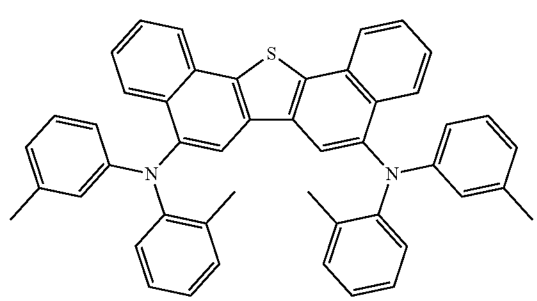

-continued
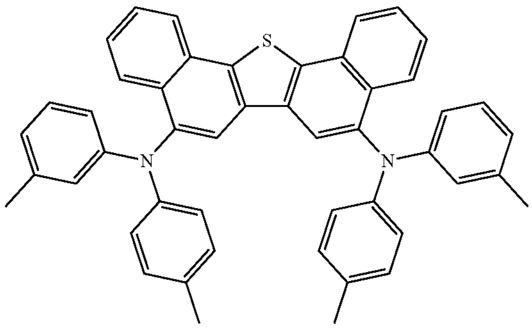
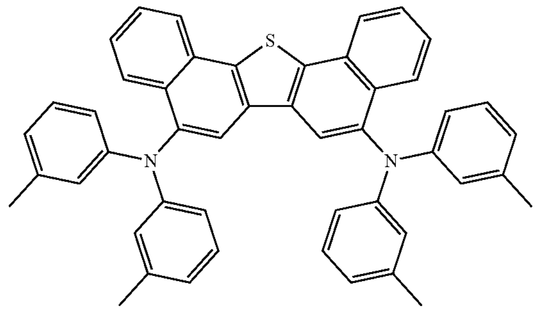
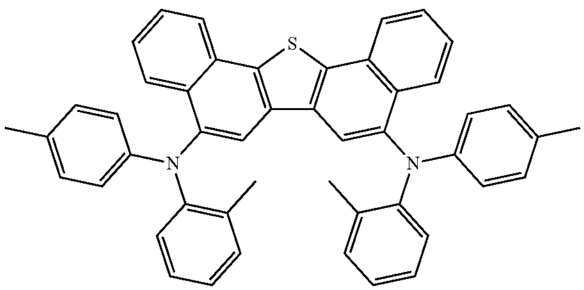
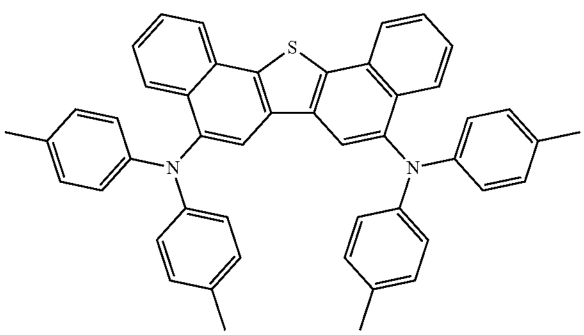
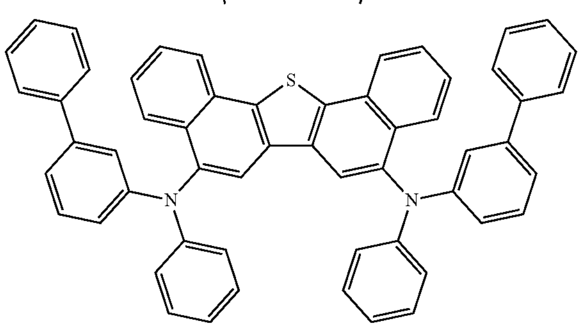
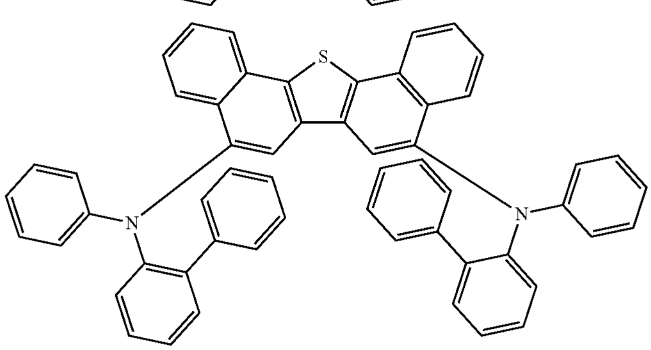

-continued
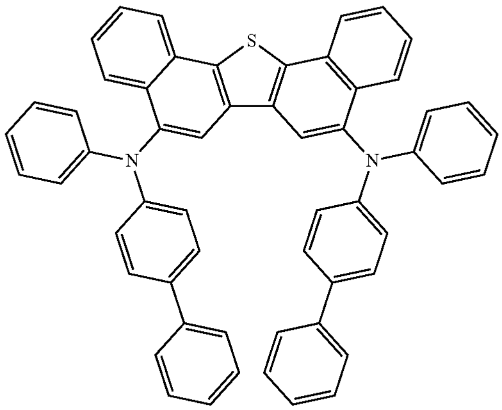
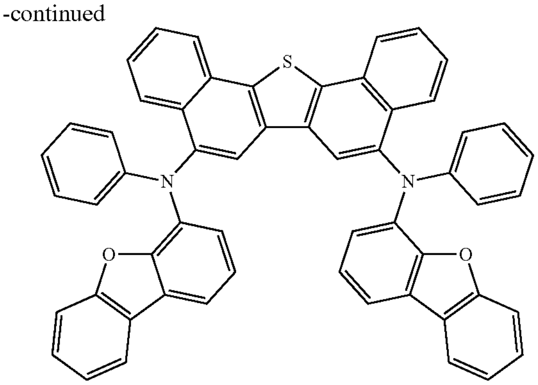
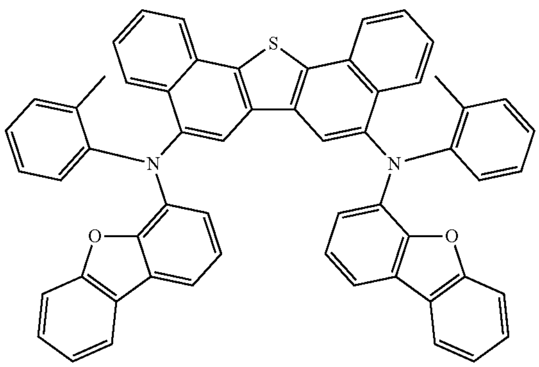
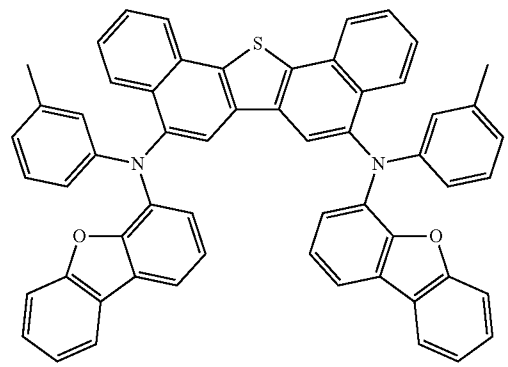
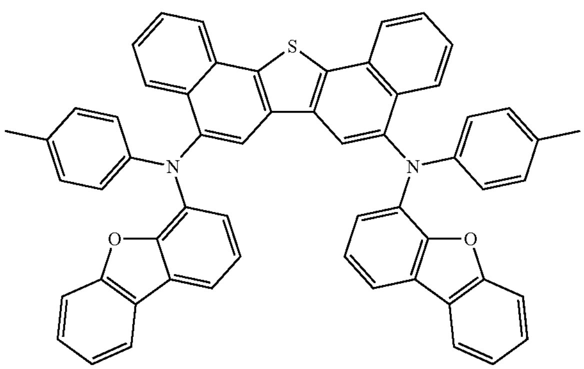
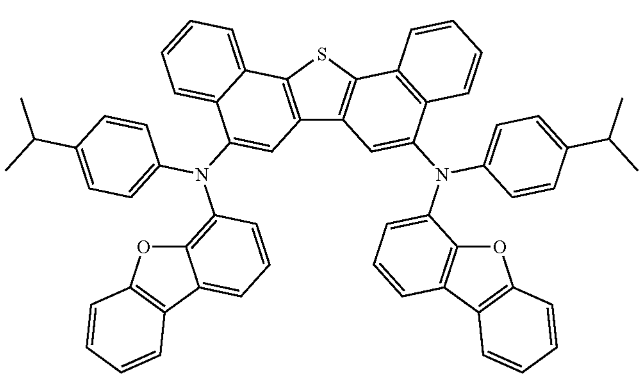

-continued
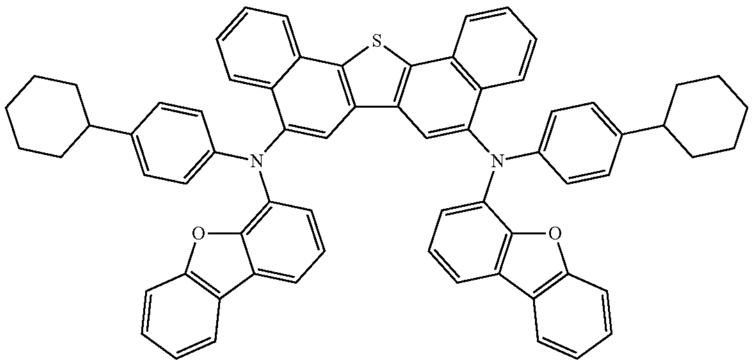
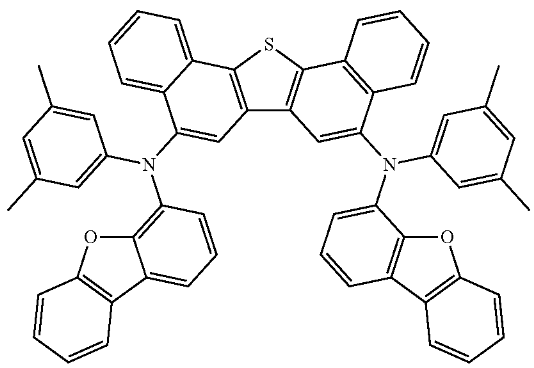
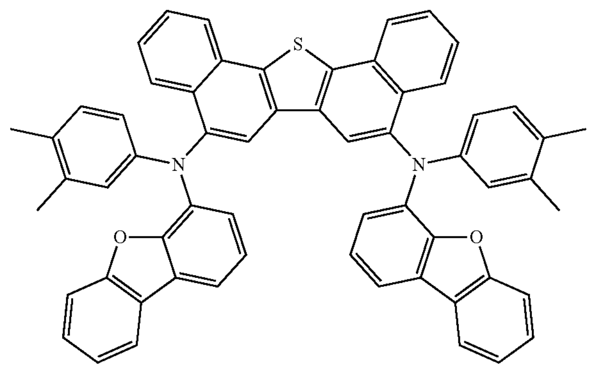
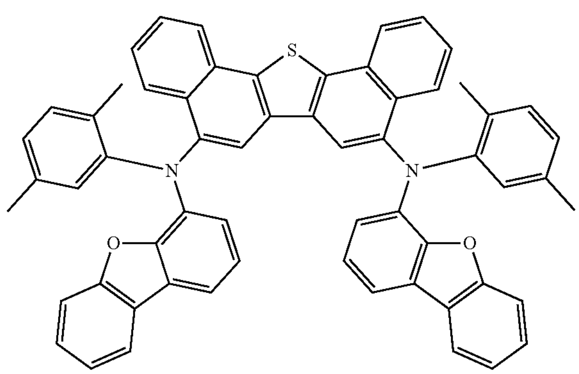
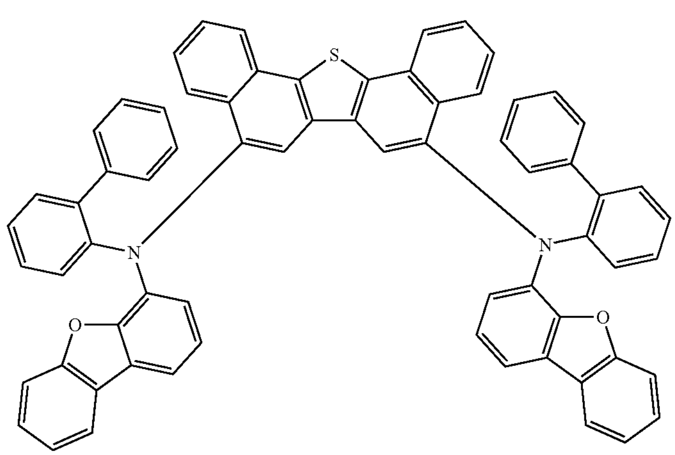

-continued
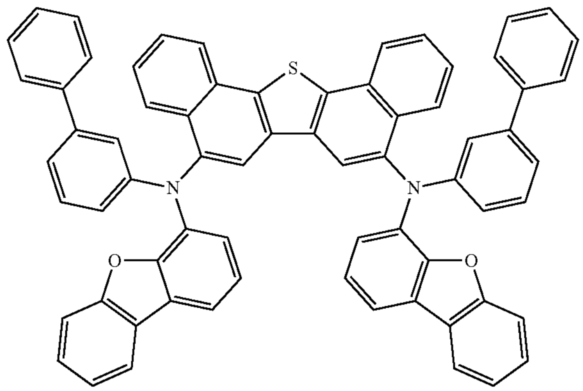
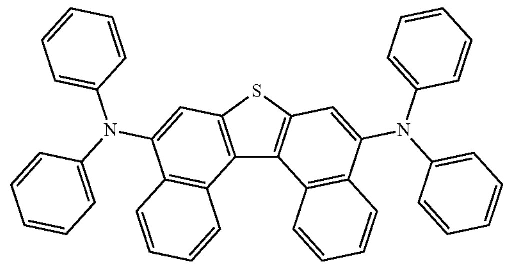
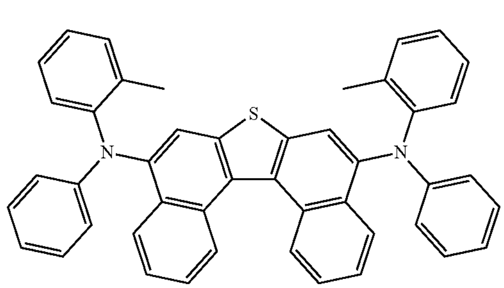
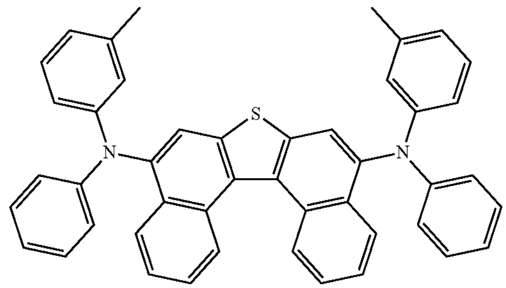
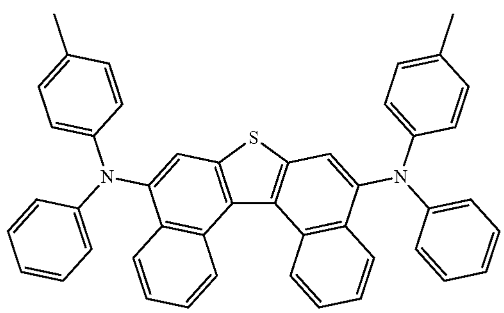
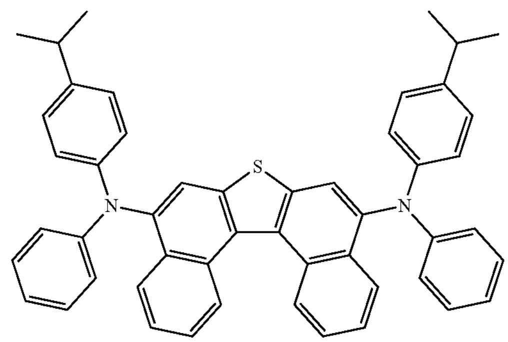
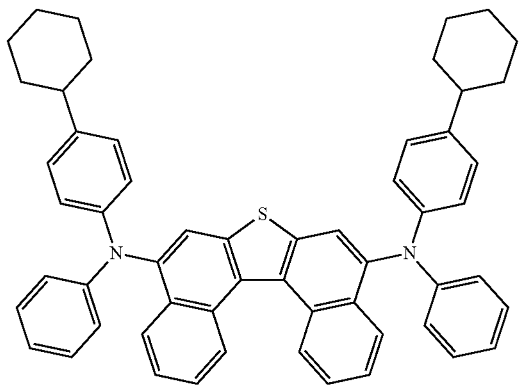
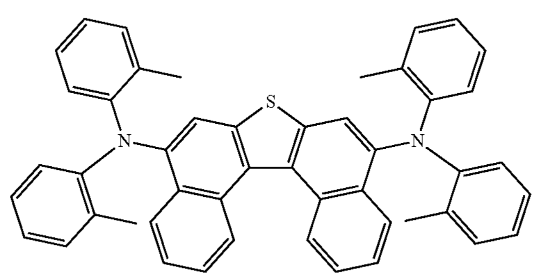
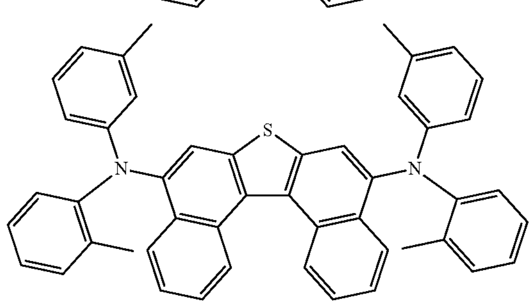
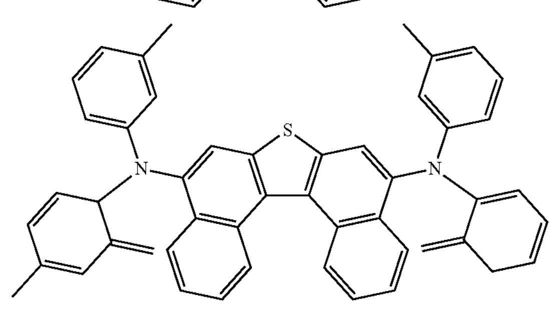

-continued
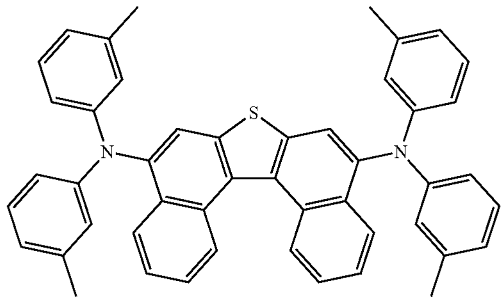
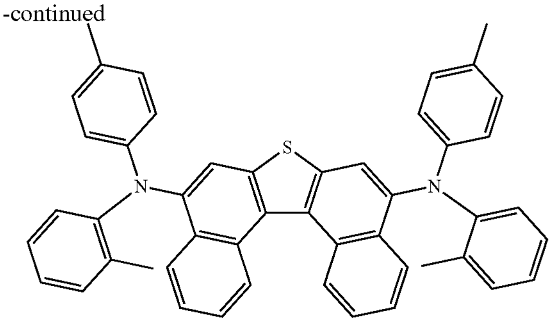
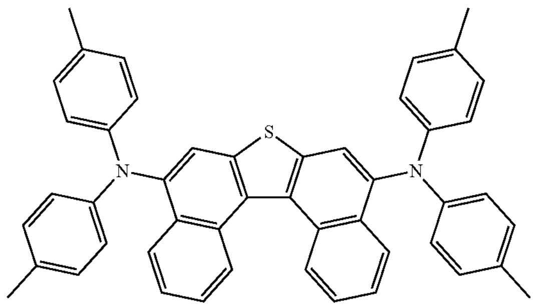
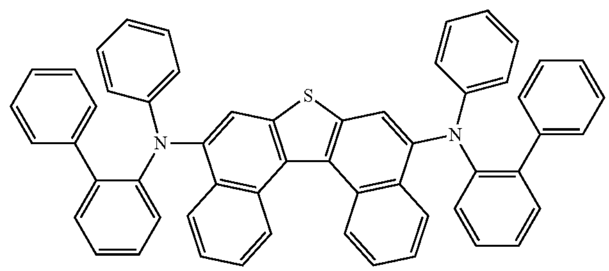
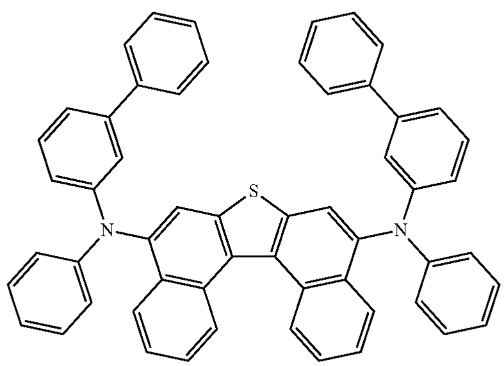
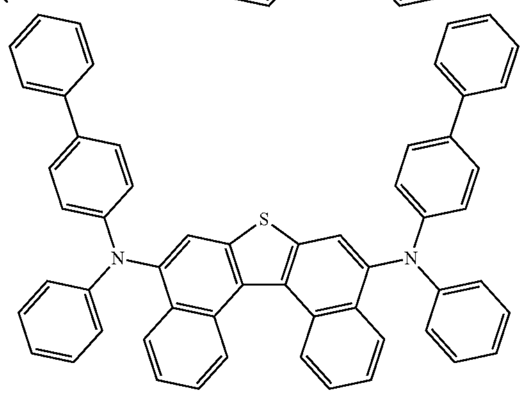
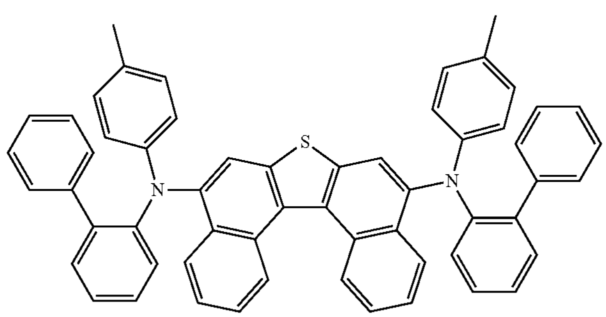
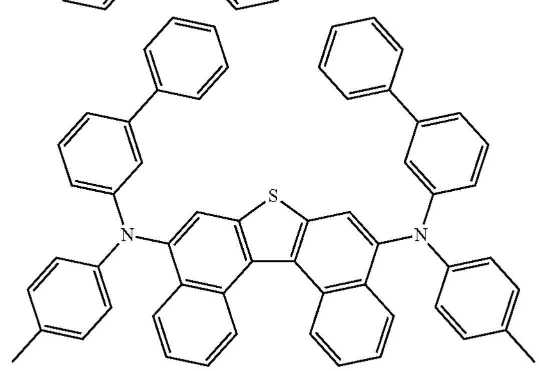
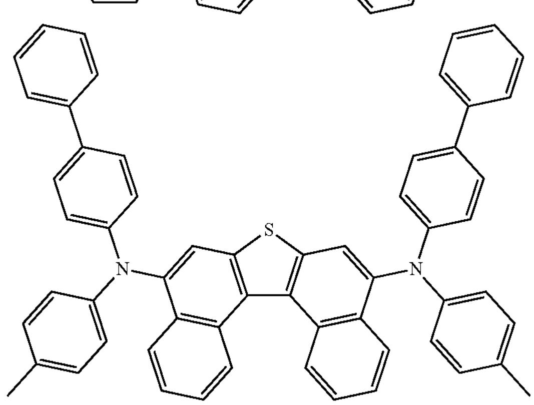

-continued
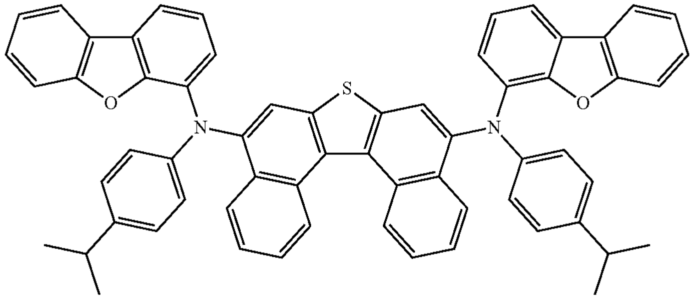
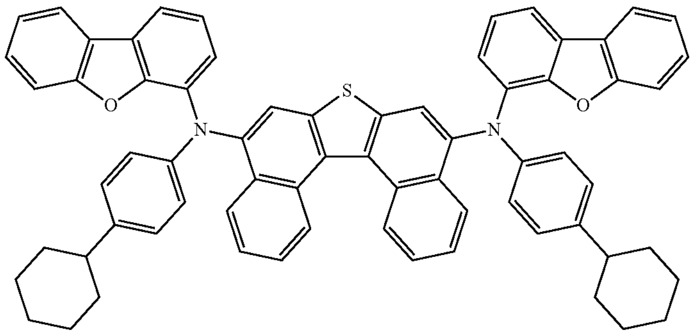
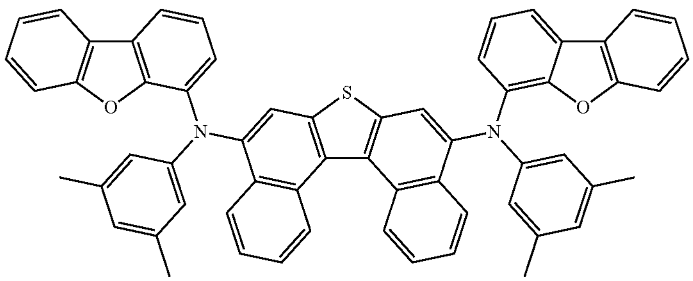
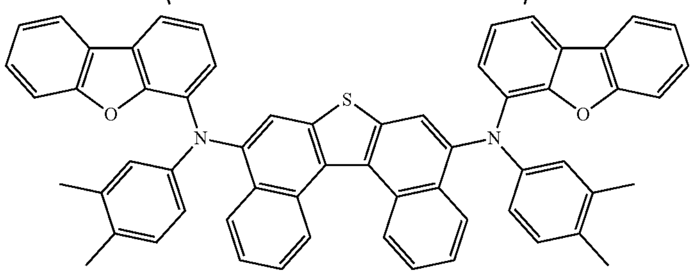
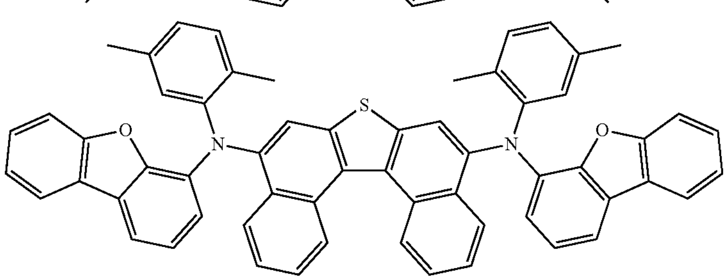
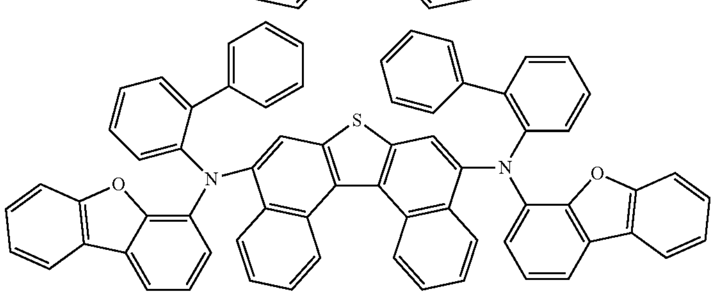

-continued
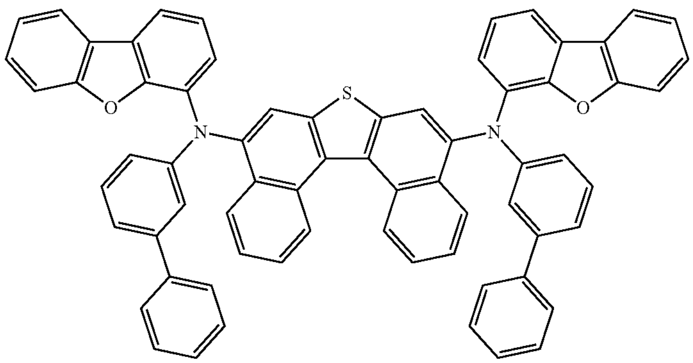
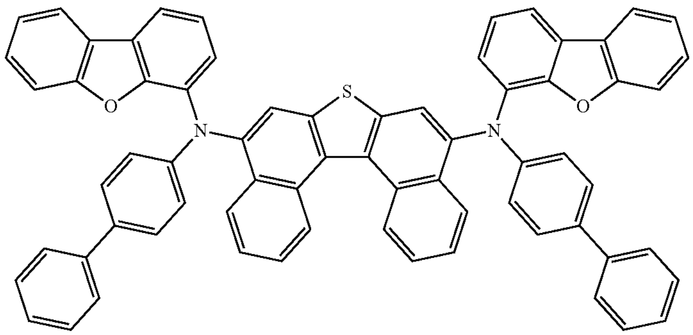
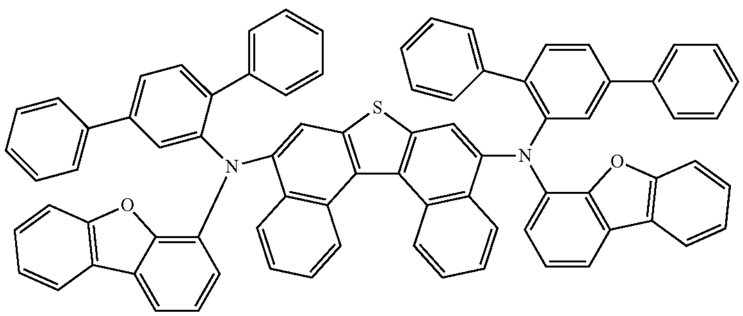
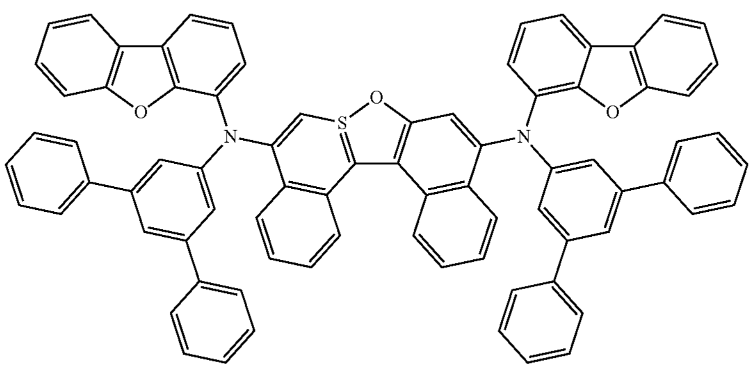
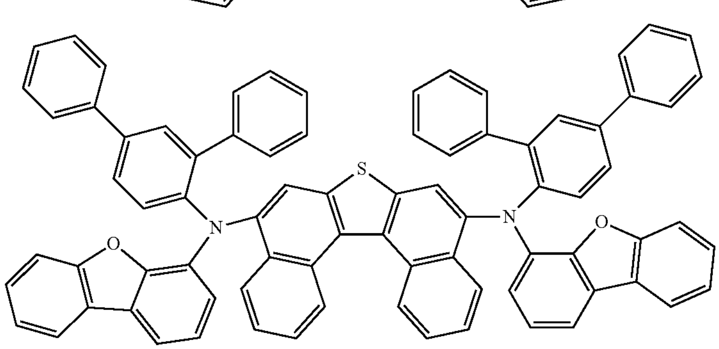

-continued
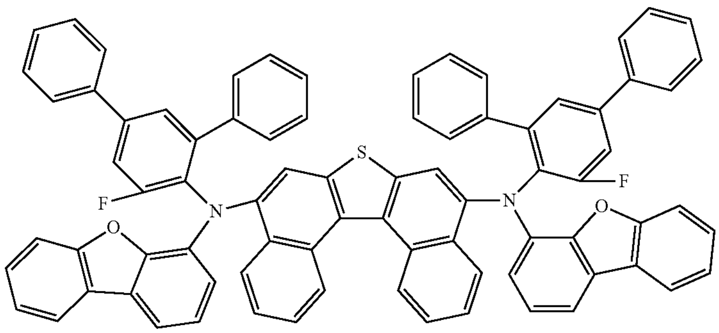
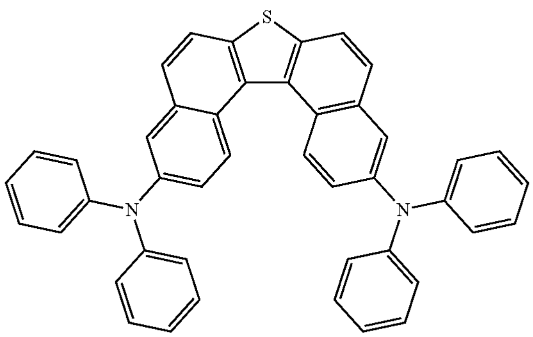
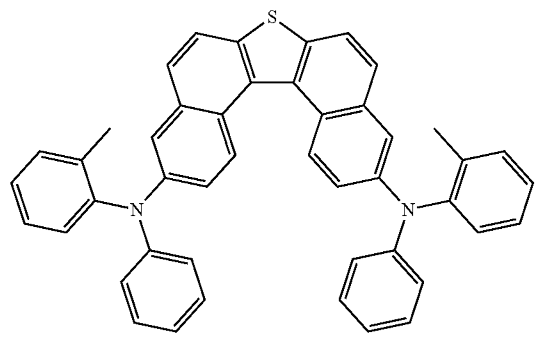
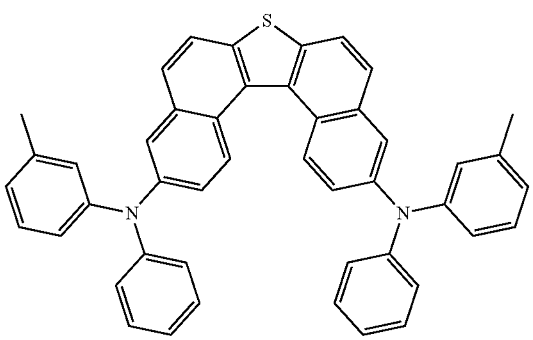
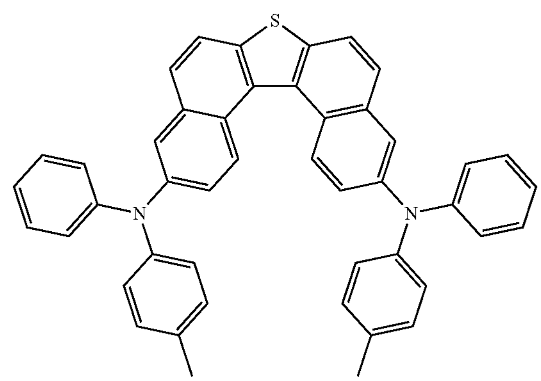
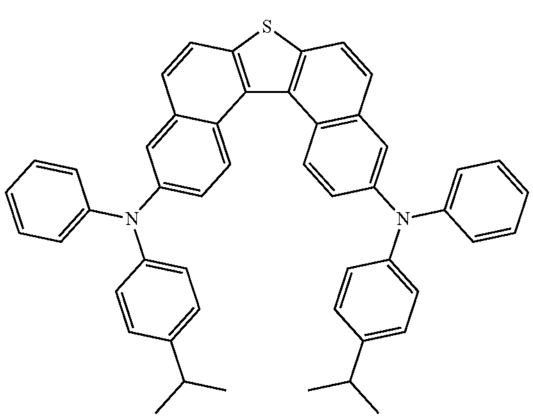
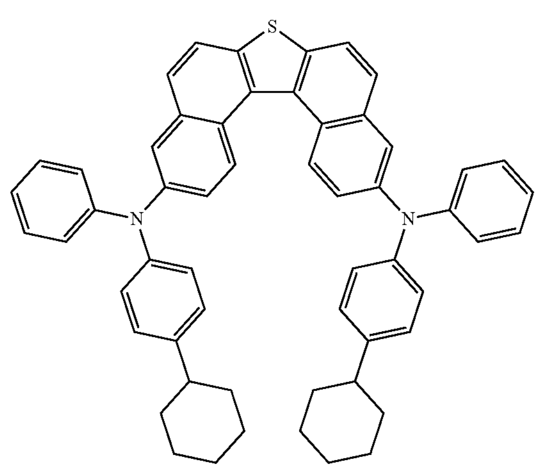

-continued
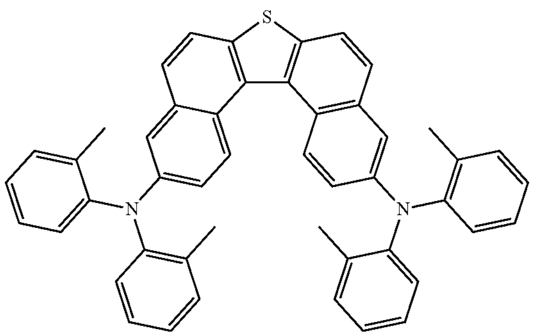
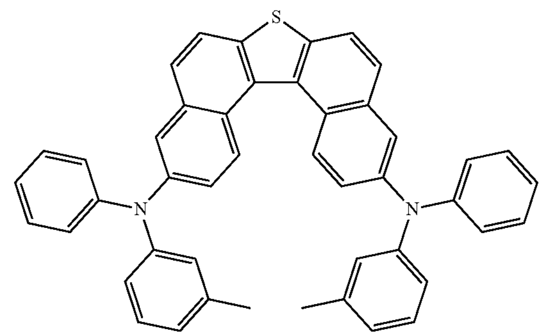
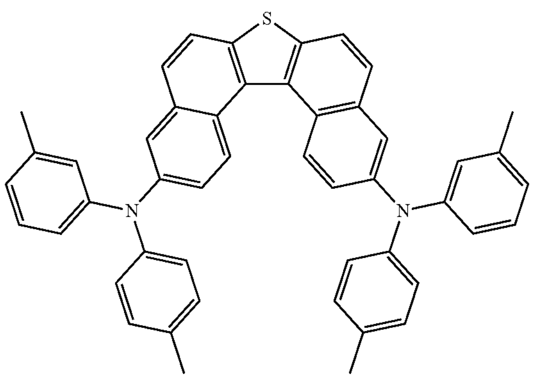
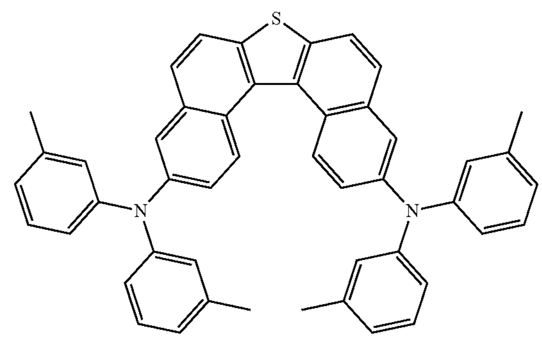
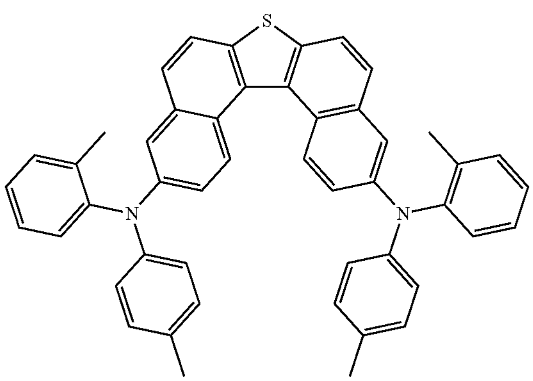
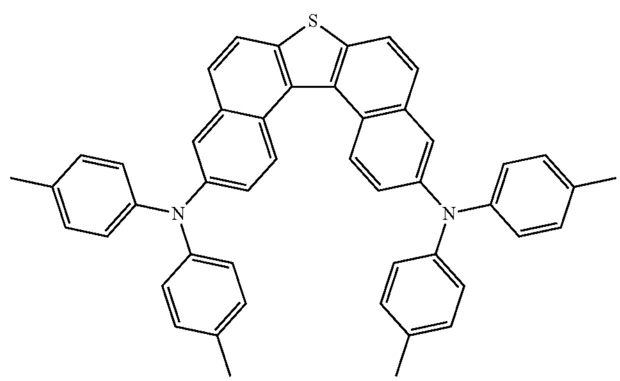
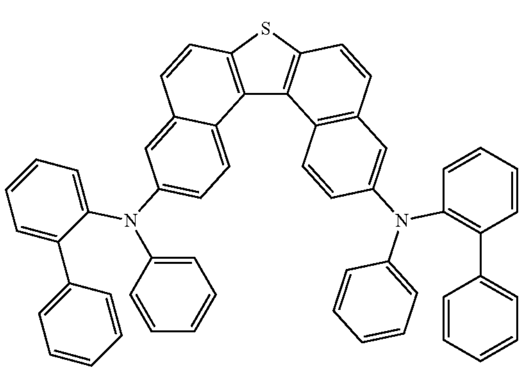
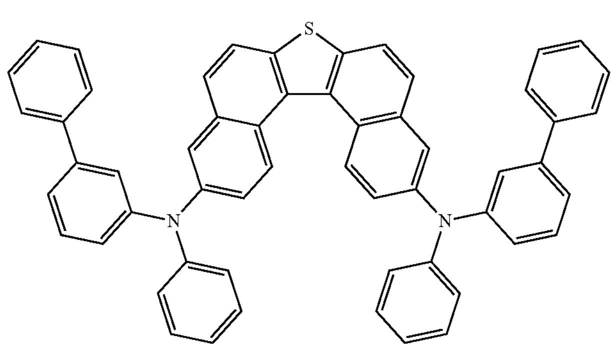

-continued
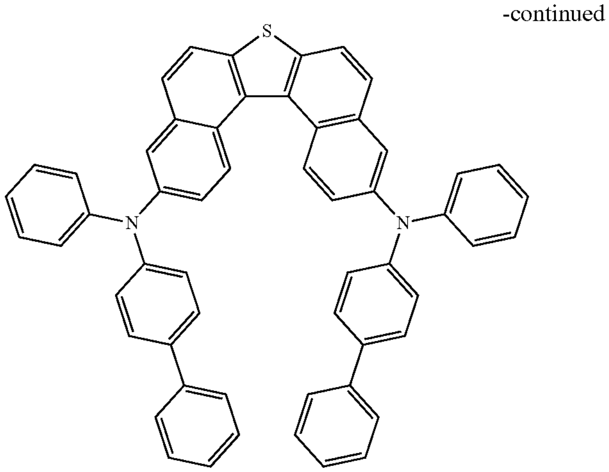
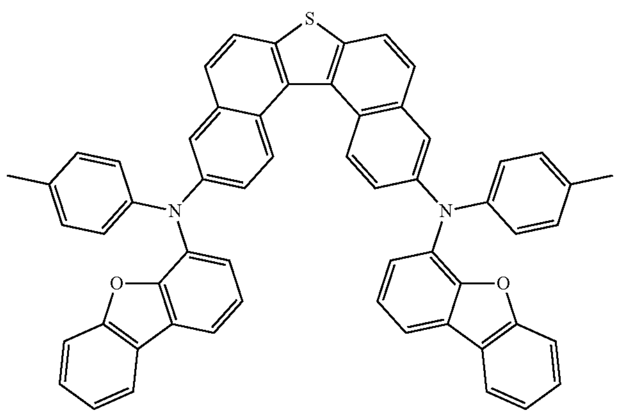
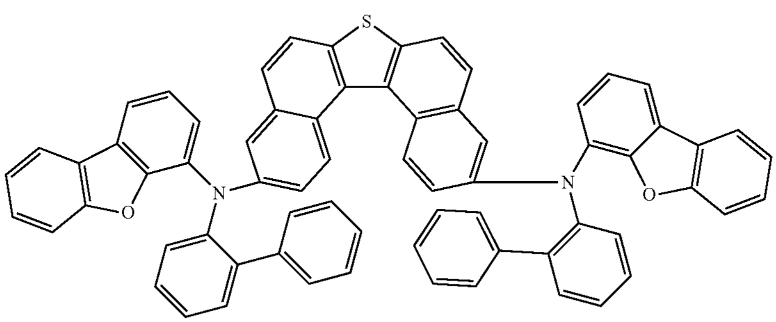
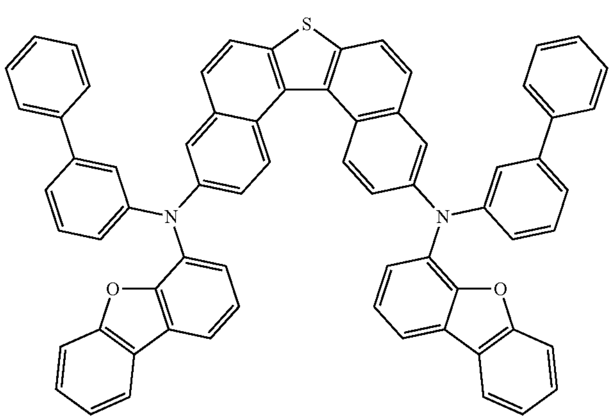

-continued
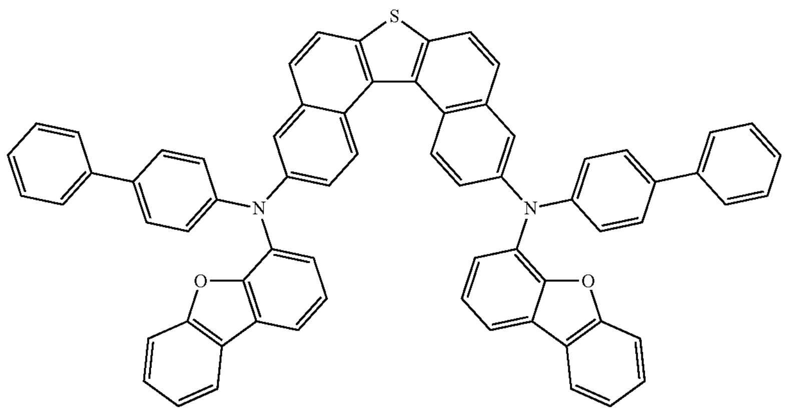
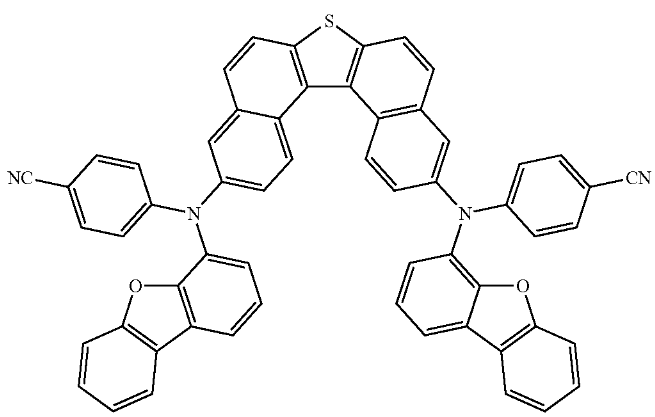
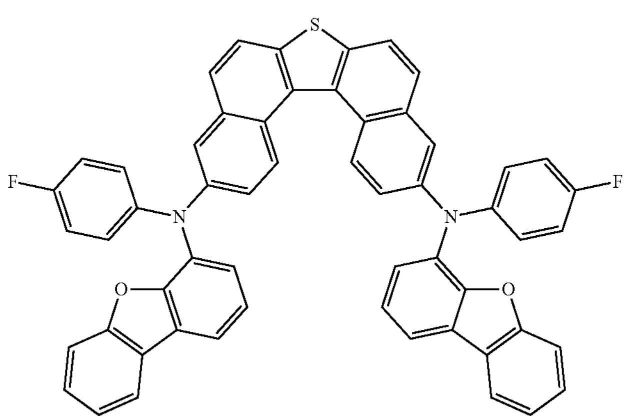
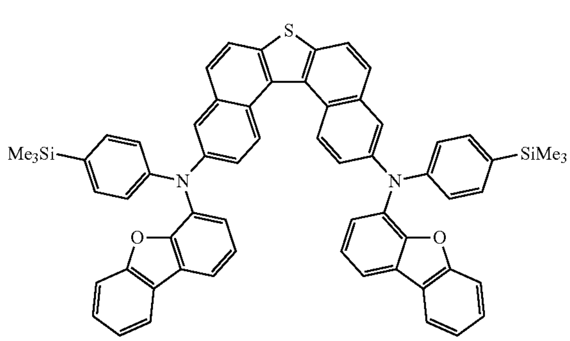
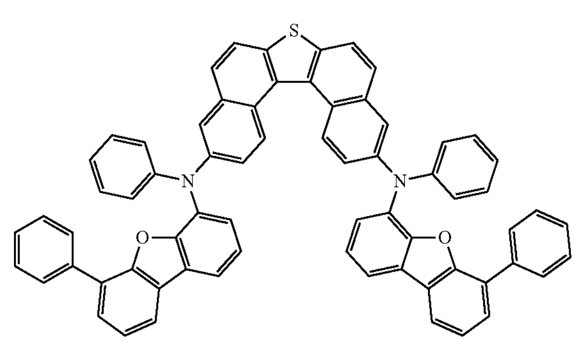

-continued
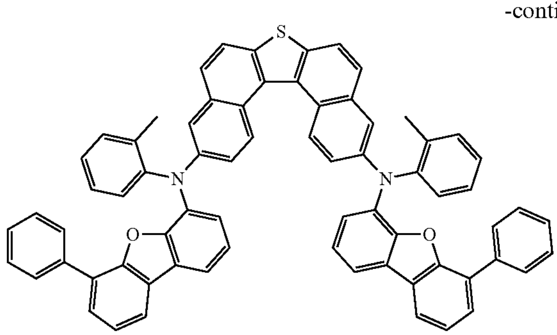
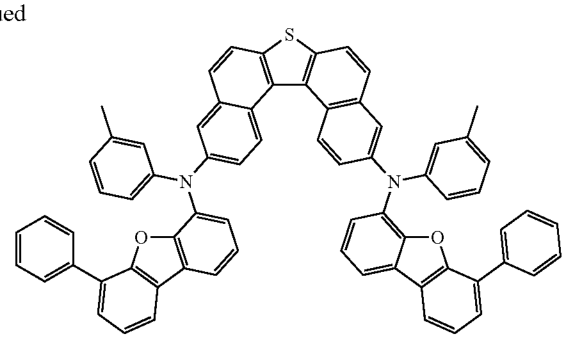
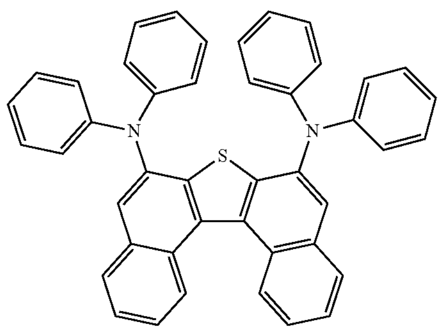
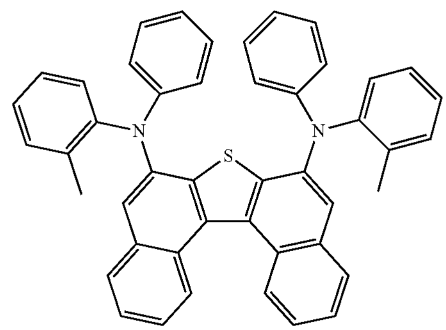
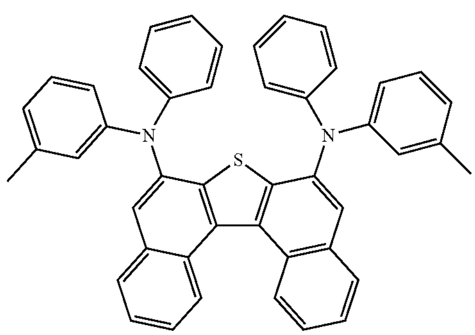
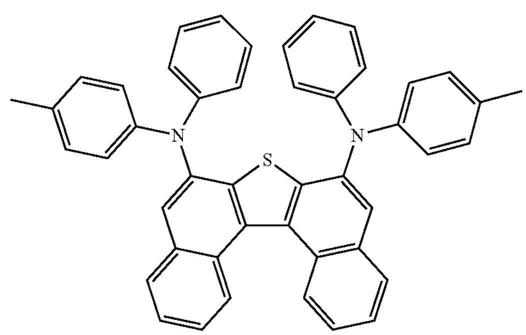
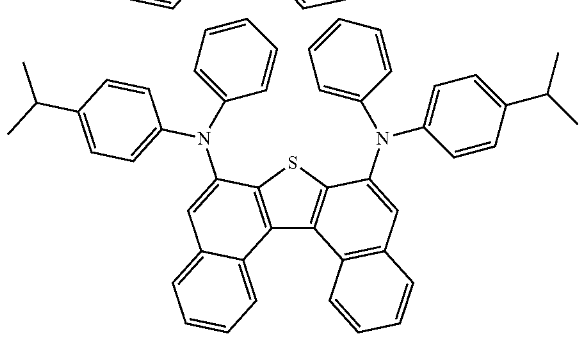
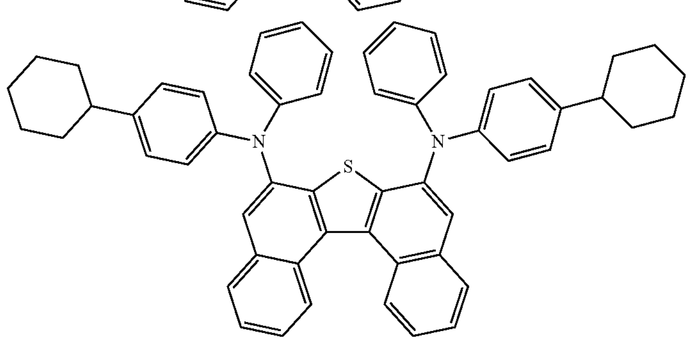

-continued
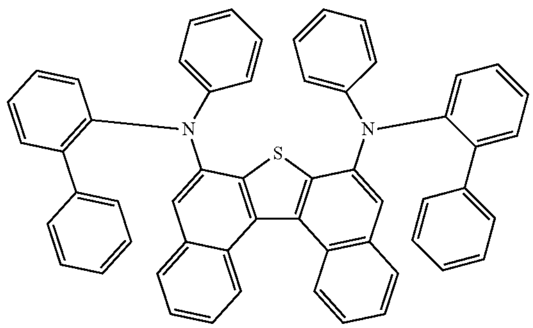
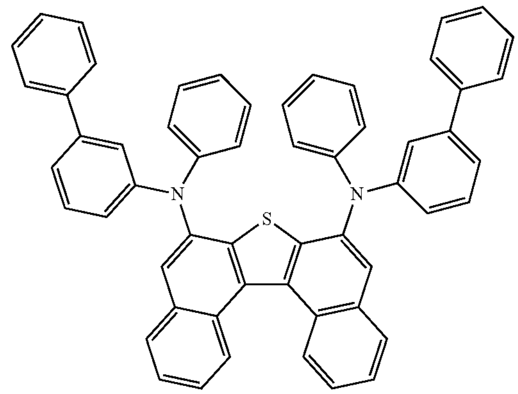
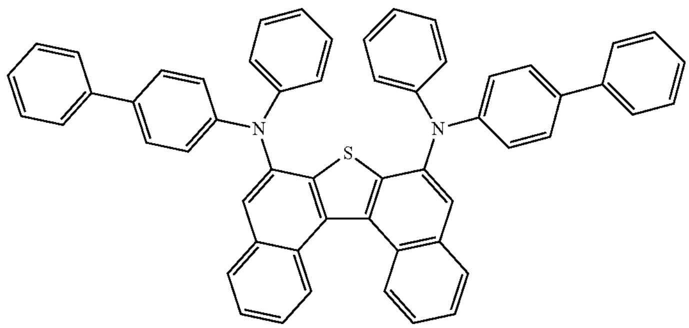
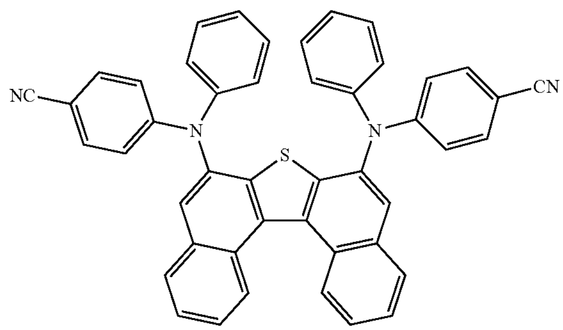
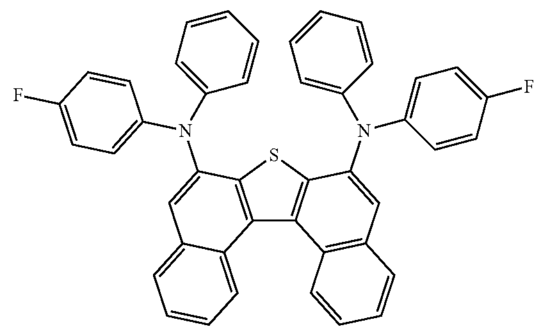
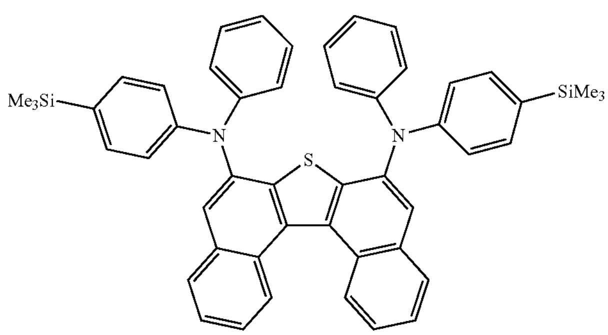
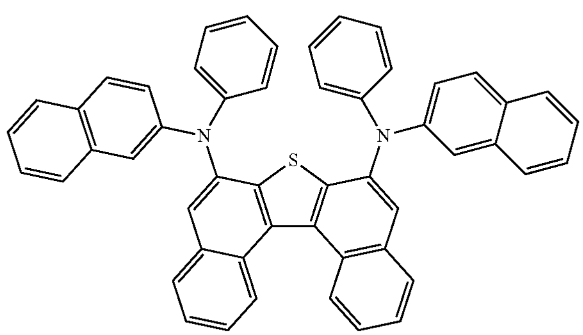
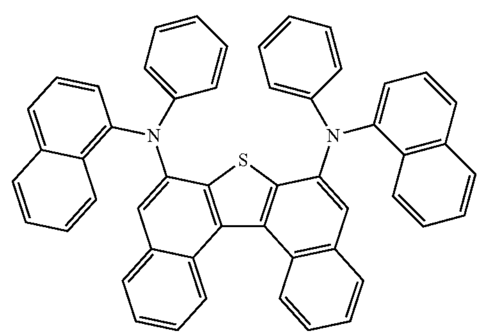

-continued
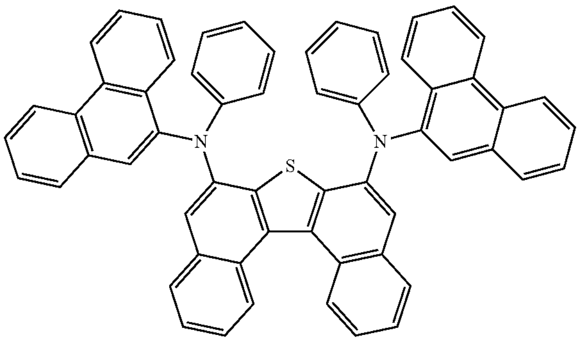
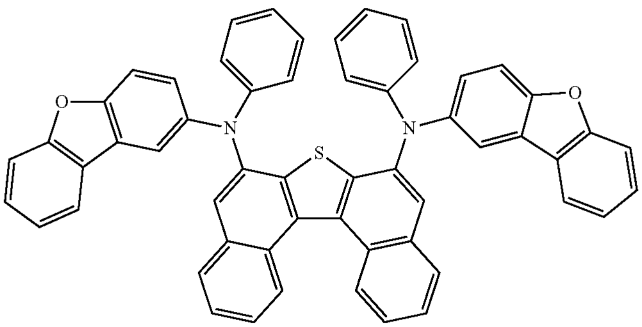
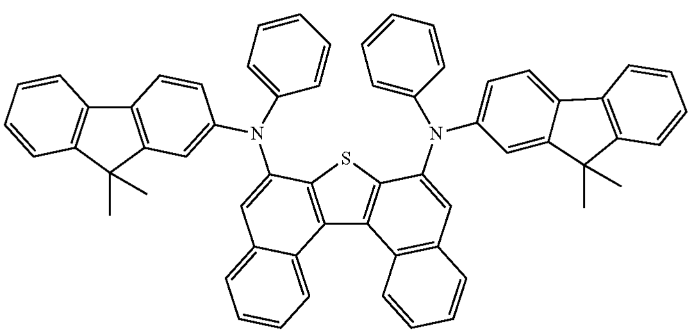
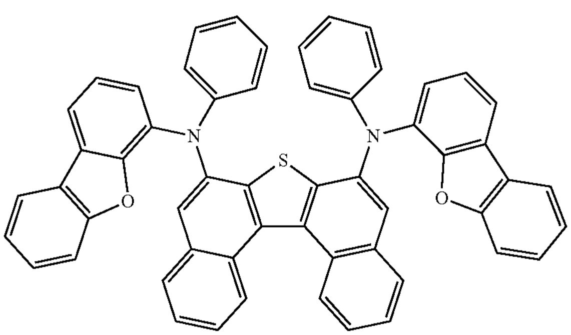
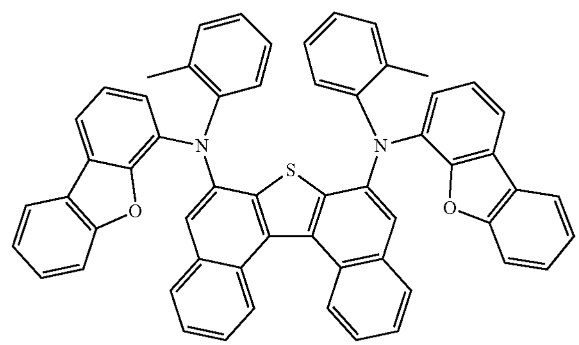
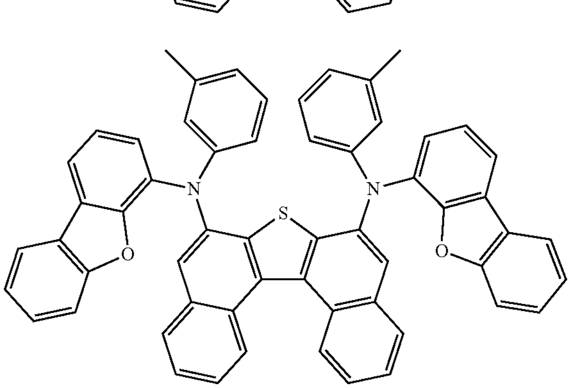
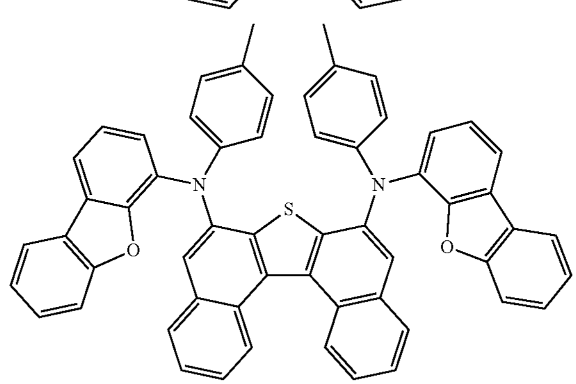

-continued

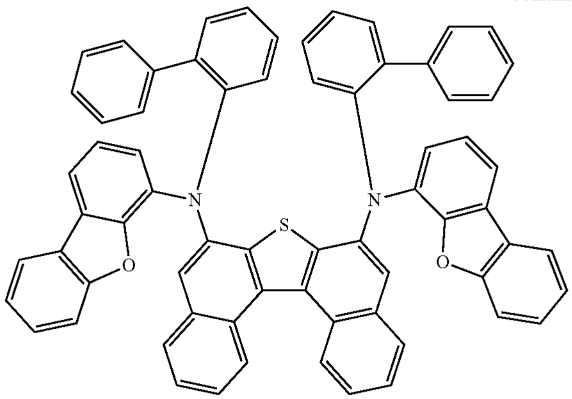

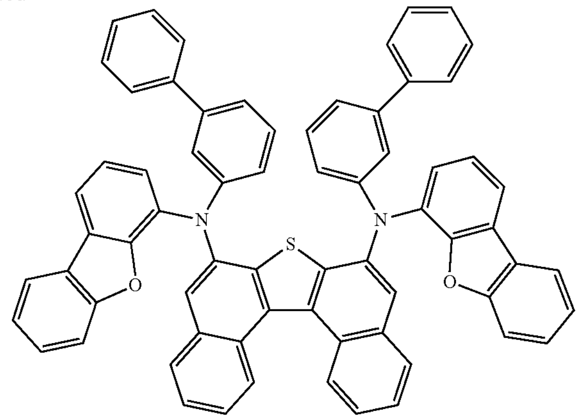

It is not necessary for the emission color of the second compound to be specifically limited. However, the emission of the second compound is preferably a fluorescence whose main peak wavelength is 550 nm or less, more preferably a fluorescence whose main peak wavelength is 480 nm or less.

The main peak wavelength refers to a peak wavelength of an emission spectrum at which the emission spectrum measured for a toluene solution dissolved with the second compound at a concentration ranging from $10^{-5}$ mol/l to $10^{-6}$ mol/l is maximized.

The second compound preferably shows blue fluorescence.

Method of Preparing Second Compound

The second compound can be prepared by a known synthesis method, or by application of known substitution reactions and/or materials depending on a target compound.

Specific examples of the above groups are as defined herein under subtitle "Definitions."

The organic EL device according to an exemplary embodiment of the invention, which includes the cathode, the anode, and the emitting layer between the cathode and the anode, the emitting layer containing the first compound and the second compound satisfying the (a), (b), (c), and (d) as described above, may be made of any typically known materials and have any device arrangement as long as an effect(s) of the invention is not impaired.

In an aspect of the organic EL device according the exemplary embodiment, the emitting layer preferably contains the first compound in a form of a phosphorescent compound, and the second compound in a form of a fluorescent compound satisfying the (a), (b), (c), and (d). In other words, it is preferable that the phosphorescent compound as the first compound and the fluorescent compound as the second compound, which satisfies the (a), (b), (c), and (d), are present in a common emitting layer.

In an aspect of the organic EL device according the exemplary embodiment, the emitting layer preferably contains the first compound in a form of a phosphorescent compound, and the second compound in a form of a fluorescent compound satisfying the (a), (b), (c), and (d), the first and second compounds being capable of blue light emission. In other words, it is preferable that the phosphorescent compound as the first compound and the fluorescent compound as the second compound, which satisfies the (a), (b), (c), and (d), are present in a common emitting layer, the first and second compounds being capable of blue light emission.

Film Thickness of Emitting Layer

A film thickness of the emitting layer of the organic EL device in the present exemplary embodiment is preferably in a range of 5 nm to 50 nm, more preferably in a range of 7 nm to 50 nm, further preferably in a range of 10 nm to 50 nm. When the film thickness of the emitting layer is 5 nm or more, the formation of the emitting layer and adjustment of chromaticity can be easily achieved. When the film thickness of the emitting layer is 50 nm or less, an increase in the drive voltage can be easily reduced.

Content Ratio of Compound in Emitting Layer

When the emitting layer contains the first compound and the second compound, the content ratios of the first and second compounds in the emitting layer are, for instance, preferably determined as follows.

The content ratio of the first compound is preferably in a range from 1 mass % to 99.9 mass %, more preferably in a range from 1 mass % to 50 mass %, further preferably in a range from 3 mass % to 40 mass %, especially preferably in a range from 5 mass % to 30 mass %.

The content ratio of the second compound is preferably in a range from 0.1 mass % to 20 mass %, more preferably in a range from 0.1 mass % to 10 mass %, further preferably in a range from 0.5 mass % to 7.5 mass %, especially preferably in a range from 1 mass % to 5 mass %.

An upper limit of the total of the respective content ratios of the first and second compounds in the emitting layer is 100 mass %.

It should be noted that the emitting layer of the third exemplary embodiment may further contain material(s) other than the first and second compounds.

The emitting layer may include a single type of the first compound or may include two or more types of the first compound. The emitting layer may include a single type of the second compound or may include two or more types of the second compound.

Components usable for the organic EL device according to the exemplary embodiment of the invention and materials of the layers of the organic EL device other than the above-described compounds will be described below.

Substrate

The substrate is used as a support for the organic EL device. For instance, glass, quartz, plastics and the like are usable for the substrate. A flexible substrate is also usable. The flexible substrate refers to a bendable substrate, which may be a plastic substrate made of polycarbonate, polyarylate, polyethersulfone, polypropylene, polyester, polyvinyl fluoride, polyvinyl chloride, polyimide, polyethylene naphthalate or the like. Moreover, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, and a mixture thereof, which have a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N, N'-bis(4-butylphenyl)-N, N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid)(PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N, N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V \cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

When the hole transporting layer includes two or more layers, one of the layers with a larger energy gap is preferably provided closer to the emitting layer. An example of the material with a larger energy gap is HT-2 used in later-described Examples.

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is preferably usable. The above-described substances mostly have an electron mobility of $10^{-6}$ $cm^2/(V \cdot s)$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Moreover, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the anode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method(s)

A method for forming each layer of the organic EL device in the third exemplary embodiment is subject to no limitation except for the above particular description. However, known methods of dry film-forming such as vacuum deposition, sputtering, plasma or ion plating and wet film-forming such as spin coating, dipping, flow coating or ink jet printing are applicable.

Film Thickness

The film thickness of each of the organic layers of the organic EL device according to the exemplary embodiment, which is not specifically limited unless specifically mentioned in the above, is usually preferably in a range from several nanometers to 1 μm because excessively small film thickness is likely to cause defects (e.g. pin holes) and excessively large thickness leads to the necessity of applying high voltage and consequent reduction in efficiency.

Electronic Device

An electronic device according to the third exemplary embodiment is preferably installed with an organic EL device according to the third exemplary embodiment. Examples of the electronic device include a display device and a light-emitting unit.

Examples of the display device include a display component (e.g., an organic EL panel module), TV, mobile phone, tablet and personal computer. Examples of the light-emitting unit include an illuminator and a vehicle light.

The emitting layer of the organic electroluminescence device according to the present exemplary embodiment contains the first compound and the second compound satisfying the (a), (b), (c), and (d). Accordingly, the organic electroluminescence device according to the present exemplary embodiment exhibits enhanced device performance.

Second Exemplary Embodiment

Arrangement(s) of an organic EL device according to a second exemplary embodiment will be detailed below. In the description of the second exemplary embodiment, the same components as those in the first exemplary embodiment will be denoted by the same reference numerals and names to omit or simplify the explanation thereof. It should also be noted that the material(s) and compound(s) as those described in the first exemplary embodiment are usable as the material(s) and compound(s) not specifically described in the second exemplary embodiment.

The organic EL device according to the second exemplary embodiment is different from the organic EL device according to the first exemplary embodiment in that the organic EL device contains a below-described compound as the second compound. The second exemplary embodiment is the same as the first exemplary embodiment in other respects.

Second Compound

The second compound according to the present exemplary embodiment is a fluorescent compound.

The second compound according to the present exemplary embodiment is at least one compound selected from the group consisting of compounds represented by a formula (11), a formula (21), a formula (31), a formula (41), a formula (51), a formula (61), a formula (71) and a formula (81) below. The second compound according to the present exemplary embodiment does not necessarily satisfy the requirements (a), (b), (c), and (d) for the second compound according to the first exemplary embodiment.

Compound Represented by Formula (11)

The compound represented by the formula (11) will be described below.

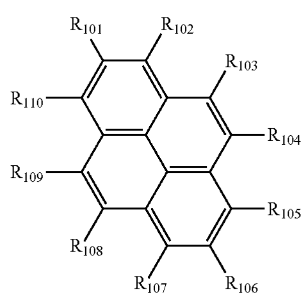

(11)

In the formula (11): at least one combination of adjacent two or more of $R_{101}$ to $R_{110}$ are mutually bonded to form a substituted or unsubstituted monocyclic ring, mutually bonded to form a substituted or unsubstituted fused ring, or not mutually bonded;

$R_{101}$ to $R_{110}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and at least one of $R_{101}$ to $R_{110}$ not forming the substituted or unsubstituted monocyclic ring and not forming the substituted or unsubstituted fused ring is a monovalent group represented by a formula (12) below;

$R_{901}$, $R_{902}$, $R_{903}$, $R_{904}$, $R_{905}$, $R_{906}$, and $R_{907}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

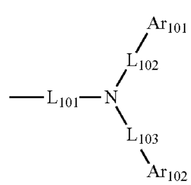

(12)

In the formula (12): $Ar_{101}$ and $Ar_{102}$ are each independently a substituted or unsubstituted aryl group having 6 to 50 ring carbon atoms, or a substituted or unsubstituted heterocyclic group having 5 to 50 ring atoms; and $L_{101}$ to $L_{103}$ are each independently a single bond, a substituted or unsubstituted arylene group having 6 to 30 ring carbon atoms, or a substituted or unsubstituted divalent heterocyclic group having 5 to 30 ring atoms;

In the formula (11), two of $R_{101}$ to $R_{110}$ are preferably groups represented by the formula (12).

In some embodiments, the compound represented by the formula (11) is represented by a formula (13) below.

(13)

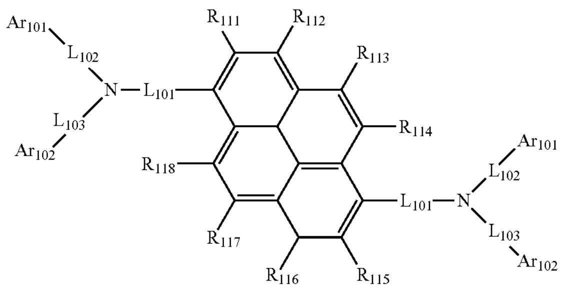

In the formula (13): $R_{111}$ to $R_{118}$ represent the same as $R_{101}$ to $R_{110}$ in the formula (11) that are not the monovalent group represented by the formula (12);

$Ar_{102}$, $L_{101}$, $L_{102}$, and $L_{103}$ represent the same as $Ar_{101}$, $Ar_{102}$, $L_{101}$, $L_{102}$, and $L_{103}$ in the formula (12);

two $Ar_{101}$ are mutually the same or different;

two $Ar_{102}$ are mutually the same or different;

two $L_{101}$ are mutually the same or different;

two $L_{102}$ are mutually the same or different; and two $L_{103}$ are mutually the same or different.

In the formula (11), $L_{101}$ is also preferably a single bond.

In the formula (11), L101 is also preferably a single bond.

In the formula (11), $L_{101}$, $L_{102}$, and $L_{103}$ are each also preferably a single bond.

In some embodiments, the compound represented by the formula (11) is represented by a formula (14) or a formula (15) below.

(14)

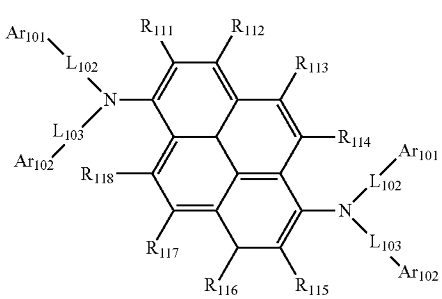

In the formula (14), $R_{111}$ to $R_{118}$ represent the same as $R_{111}$ to $R_{118}$ in the formula (13). $Ar_{101}$, $Ar_{102}$, $L_{102}$, and $L_{103}$ represent the same as $Ar_{101}$, $Ar_{102}$, $L_{102}$, and $L_{103}$ in the formula (13).

(15)

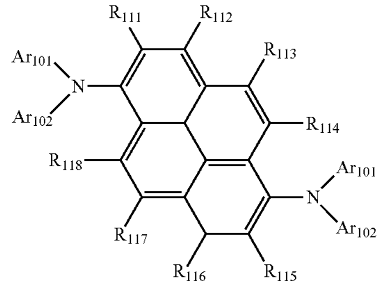

In the formula (15), $R_{111}$ to $R_{118}$ represent the same as $R_{111}$ to $R_{118}$ in the formula (13). $Ar_{101}$ and $Ar_{102}$ represent the same as $Ar_{101}$ and $Ar_{102}$ in the formula (13).

At least one of $Ar_{101}$ and $Ar_{102}$ is preferably a group represented by a formula (16) below.

(16)

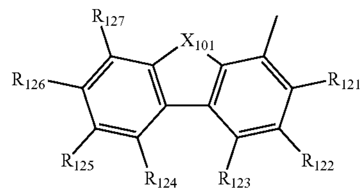

In the formula (16): $X_{101}$ represents an oxygen atom or a sulfur atom;

at least one combination of adjacent two or more of $R_{121}$ to $R_{127}$ are mutually bonded to form a substituted or unsubstituted monocyclic ring, mutually bonded to form a substituted or unsubstituted fused ring, or not mutually bonded;

$R_{121}$ to $R_{127}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted monovalent heterocyclic group having 5 to 50 ring atoms; and $R_{901}$ to $R_{907}$ respectively represent the same as $R_{901}$ to $R_{907}$ of the formula (11).

$X_{101}$ is preferably an oxygen atom.

At least one of $R_{121}$ to $R_{127}$ is also preferably:

a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Further, $R_{121}$ to $R_{127}$ are each also preferably a hydrogen atom.

It is preferable that $Ar_{101}$ is a group represented by the formula (16) and $Ar_{102}$ is a substituted or unsubstituted aryl group having 6 to 50 ring carbon atoms.

In some embodiments, the compound represented by the formula (11) is represented by a formula (17) below.

group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ respectively represent the same as $R_{901}$ to $R_{907}$ of the formula (11);

two $R_{131}$ are mutually the same or different, two $R_{132}$ are mutually the same or different, two $R_{133}$ are mutually the same or different, two $R_{134}$ are mutually the same or different, and two $R_{135}$ are mutually the same or different.

(17)

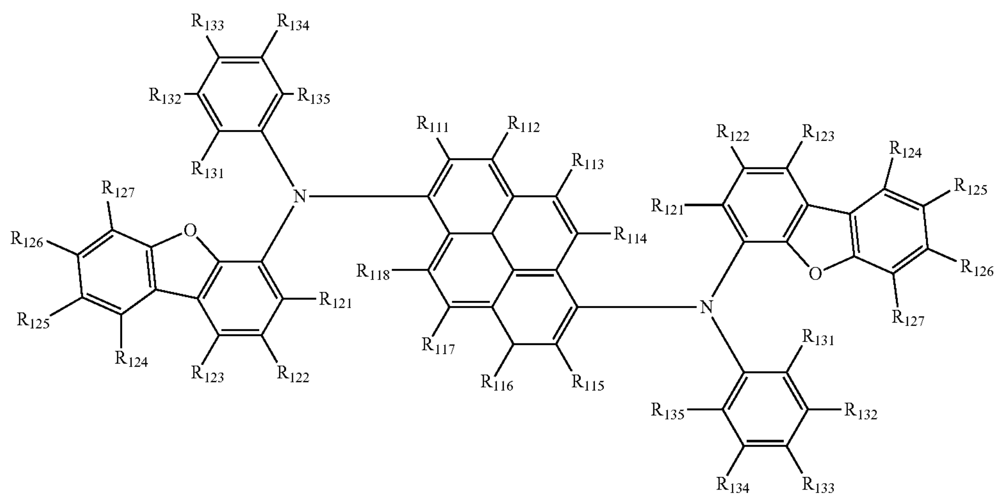

In the formula (17): $R_{111}$ to $R_{118}$ represent the same as $R_{111}$ to $R_{118}$ in the formula (13);

at least one combination of adjacent two or more of $R_{121}$ to $R_{127}$ are mutually bonded to form a substituted or unsubstituted monocyclic ring, mutually bonded to form a substituted or unsubstituted fused ring, or not mutually bonded;

$R_{121}$ to $R_{127}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

two $R_{121}$ are mutually the same or different, two $R_{122}$ are mutually the same or different, two $R_{123}$ are mutually the same or different, two $R_{124}$ are mutually the same or different, two $R_{125}$ are mutually the same or different, two $R_{126}$ are mutually the same or different, and two $R_{127}$ are mutually the same or different;

$R_{901}$ to $R_{907}$ respectively represent the same as $R_{901}$ to $R_{907}$ of the formula (11);

$R_{131}$ to $R_{135}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ respectively represent the same as $R_{901}$ to $R_{907}$ of the formula (11);

two $R_{131}$ are mutually the same or different, two $R_{132}$ are mutually the same or different, two $R_{133}$ are mutually the same or different, two $R_{134}$ are mutually the same or different, and two $R_{135}$ are mutually the same or different.

Specific Examples of Compound Represented by Formula (11)

Specific examples of the compound represented by the formula (11) include compounds shown below. It should however be noted that the invention is not limited by the specific examples of the second compound.

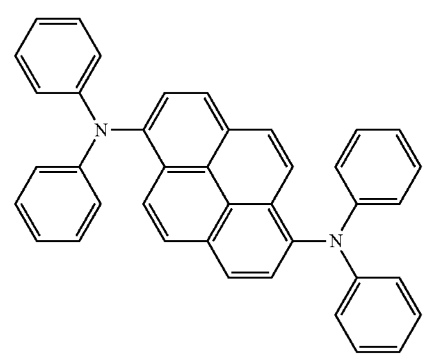

-continued
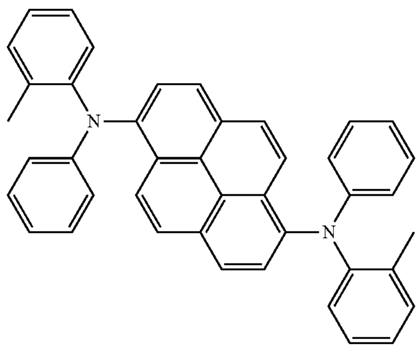
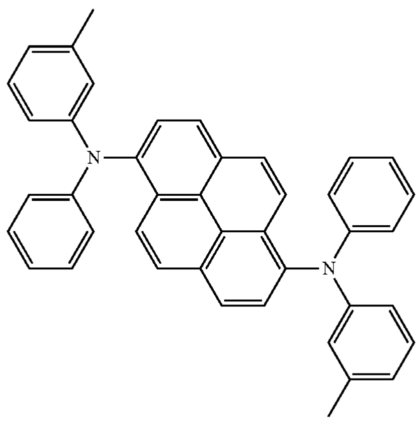
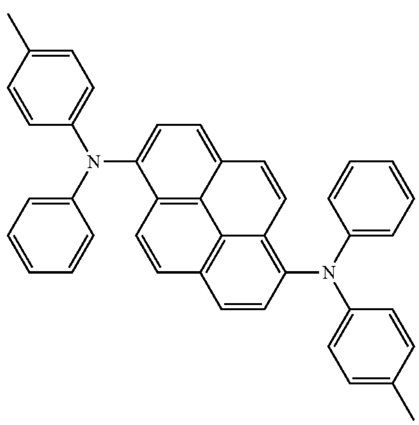
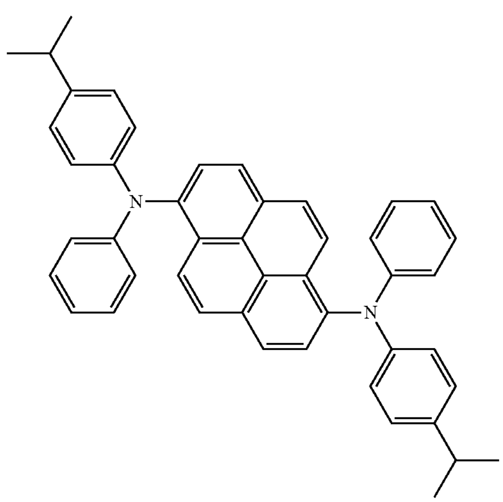
-continued
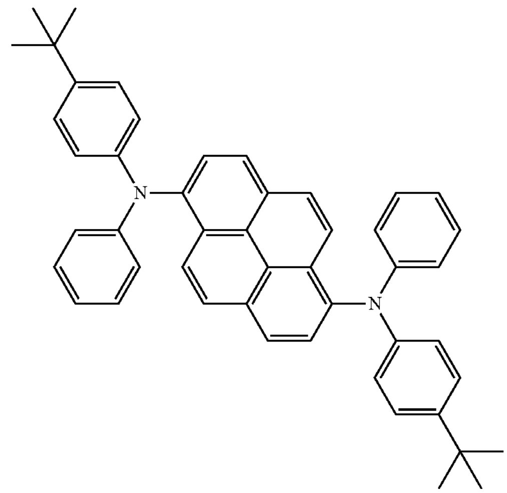
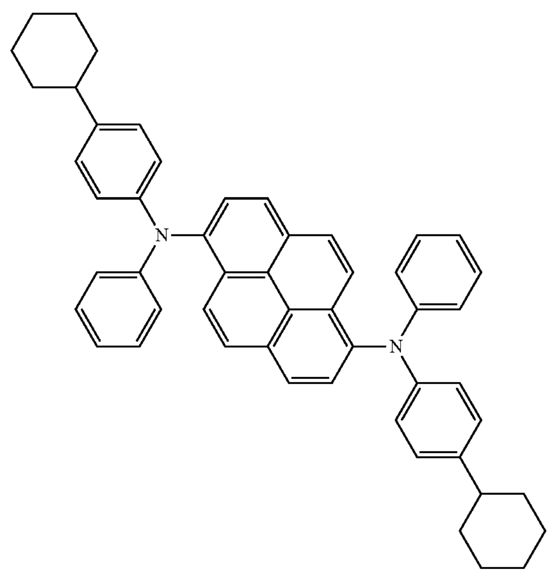
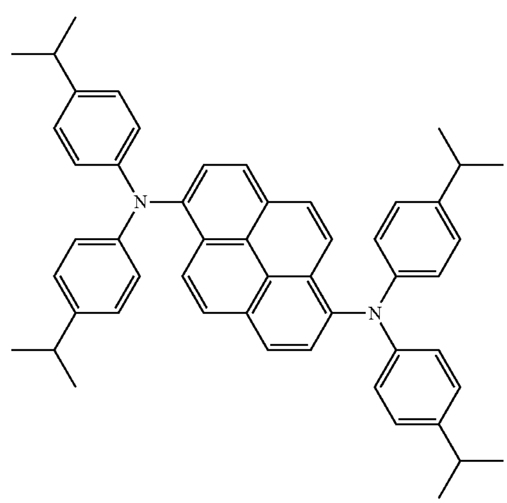

-continued
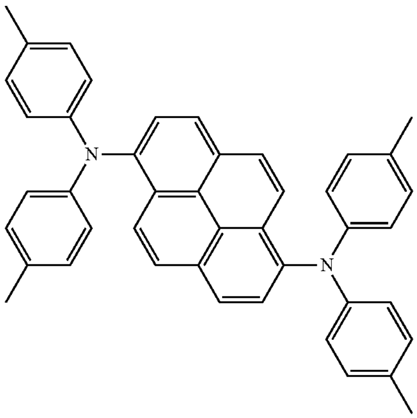
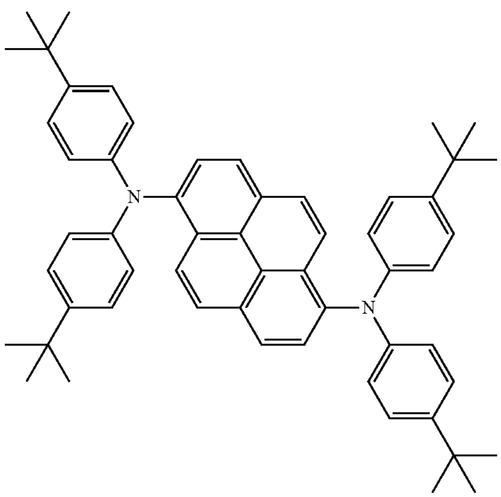
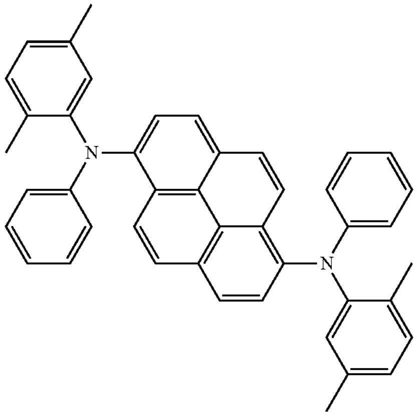
-continued
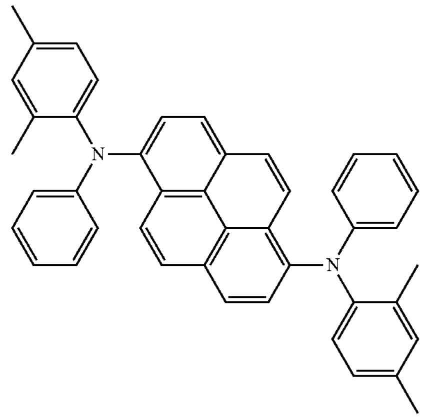
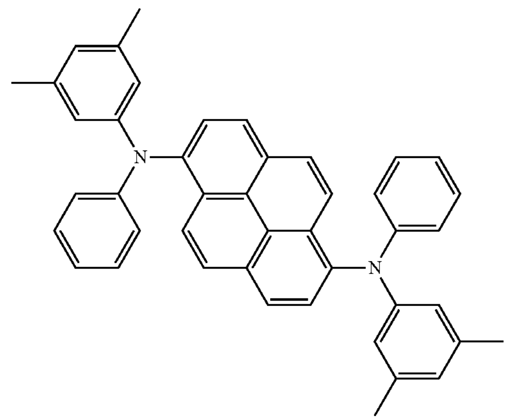
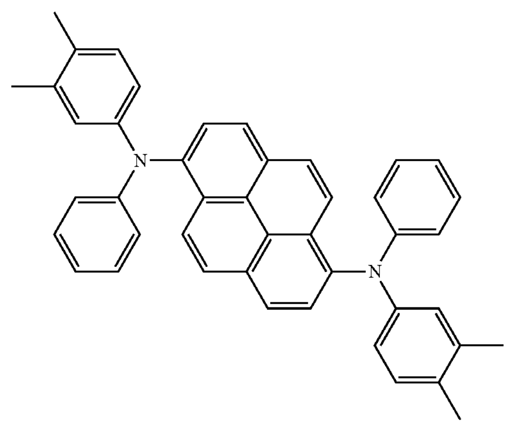
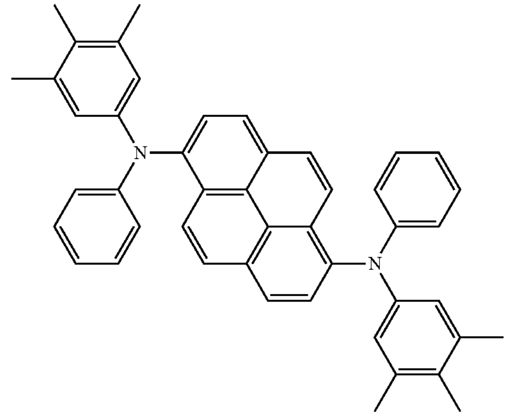

-continued
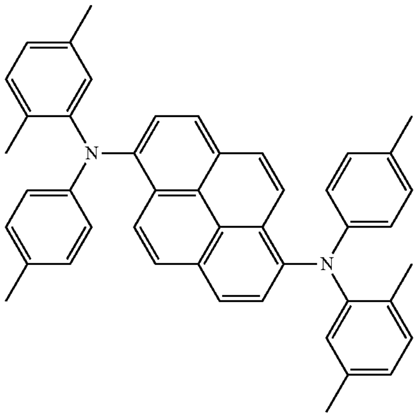
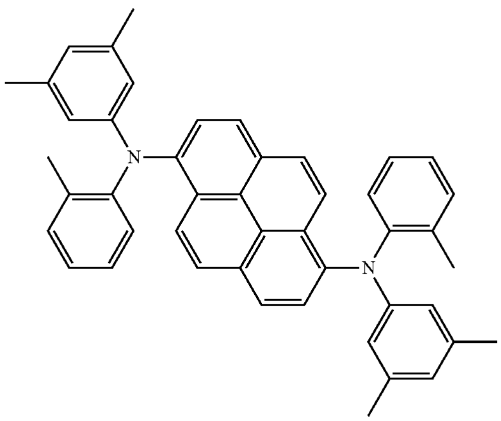
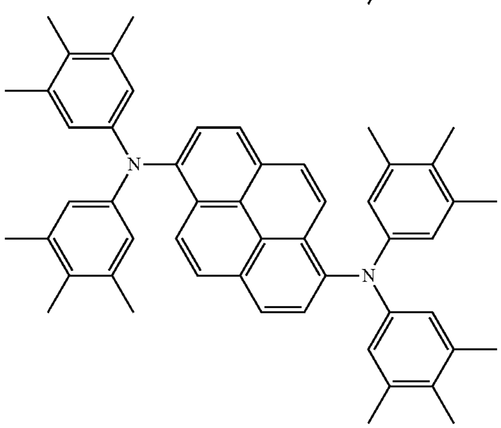
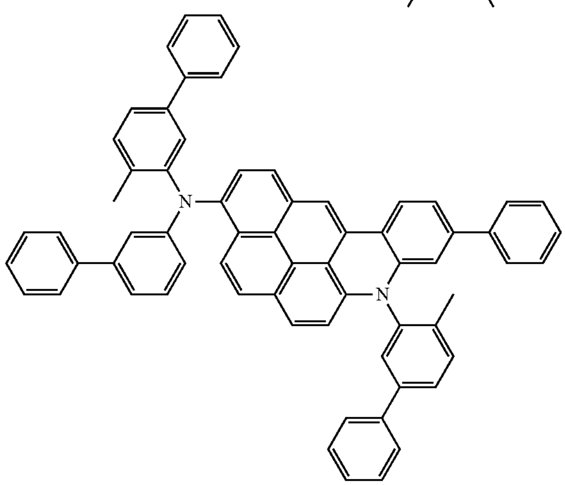
-continued
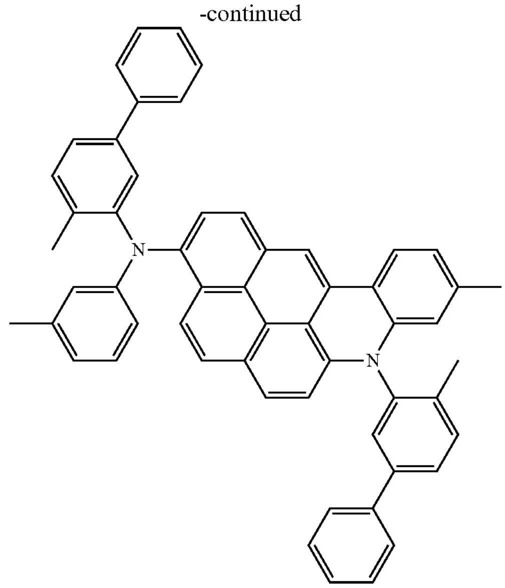
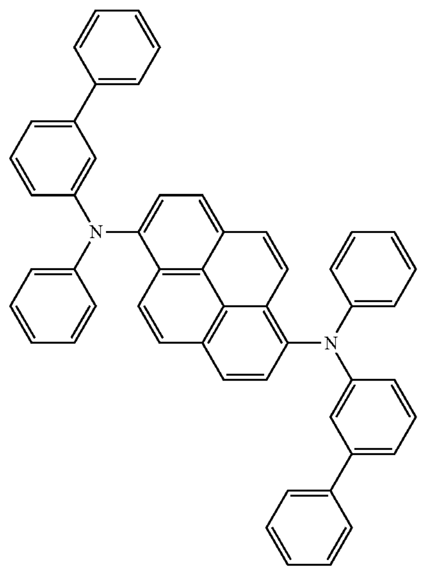
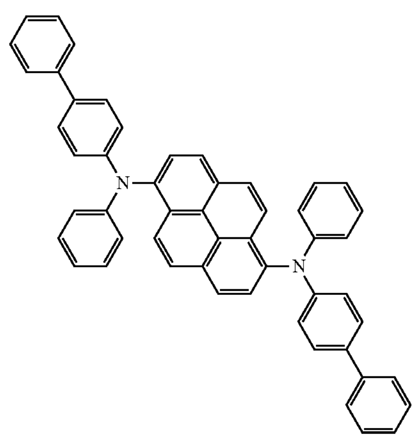

-continued
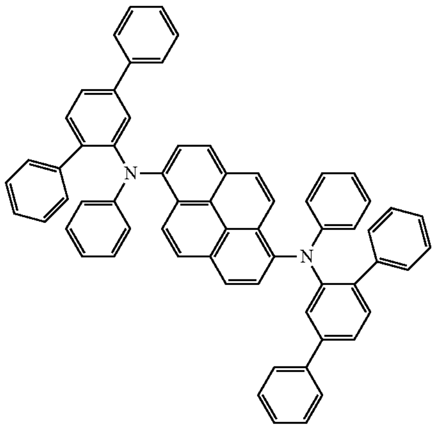
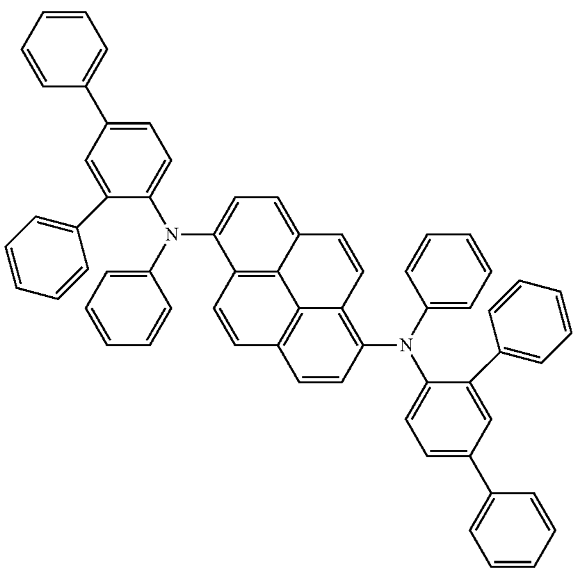
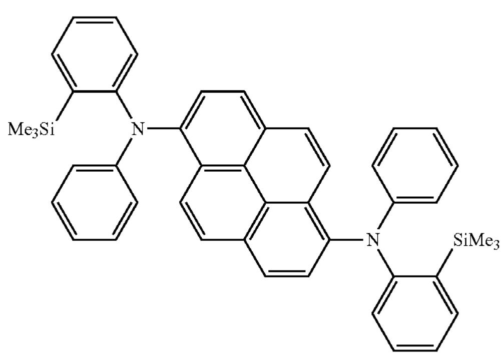
-continued
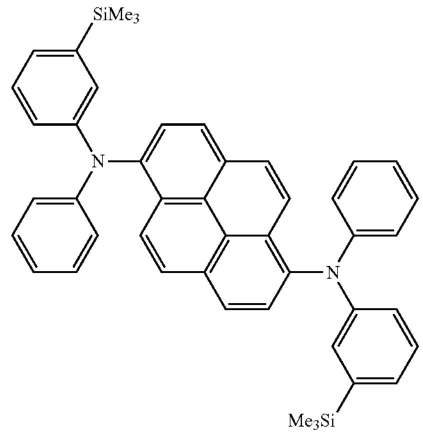
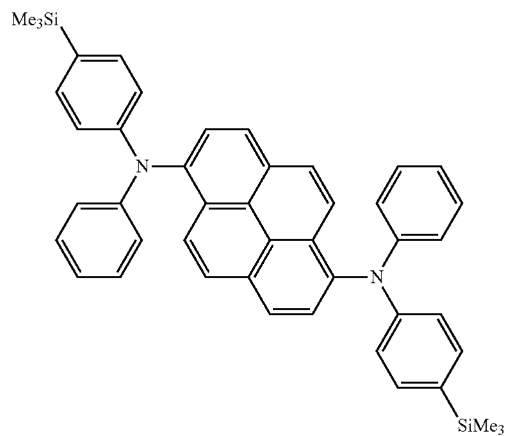
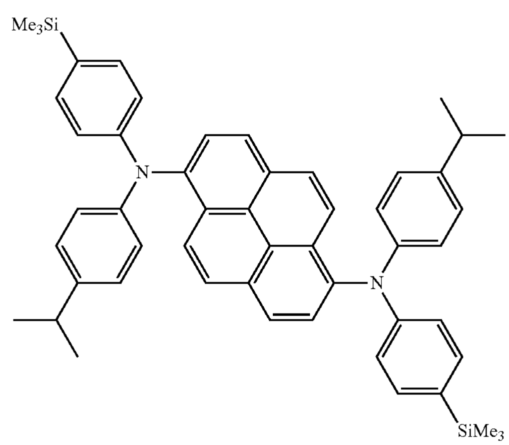
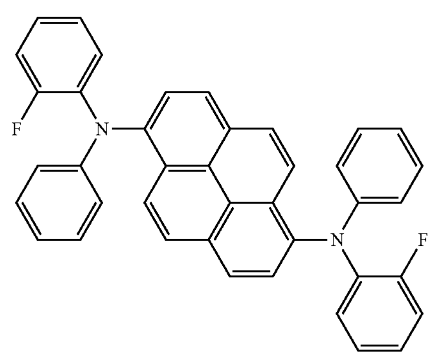

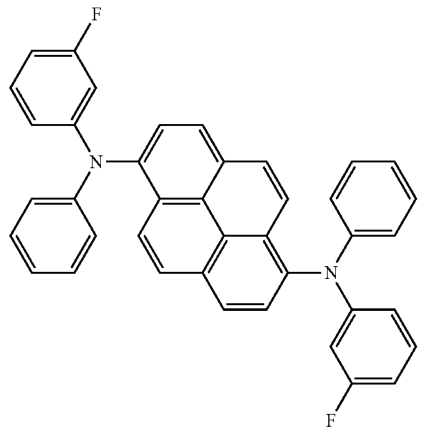
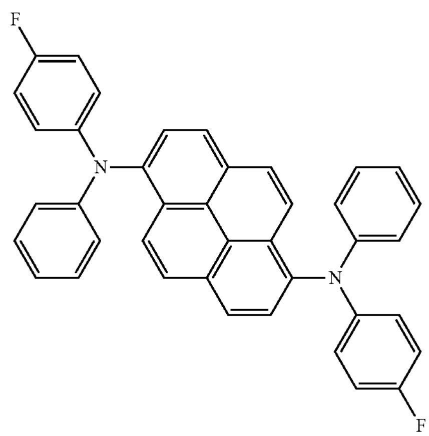
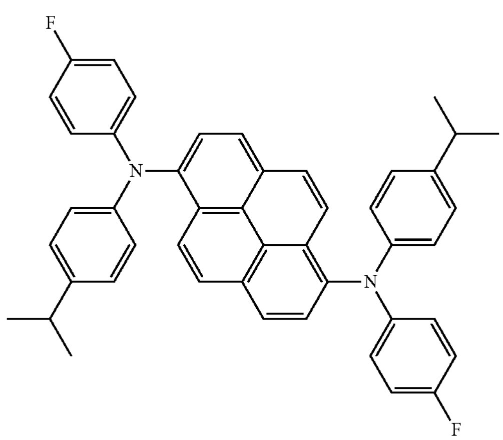
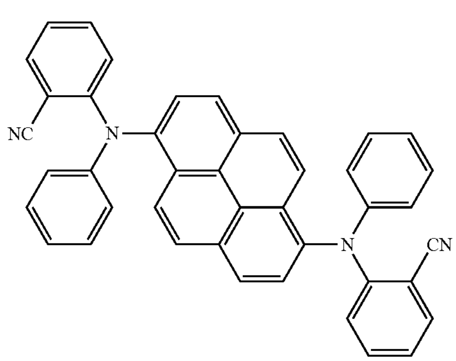
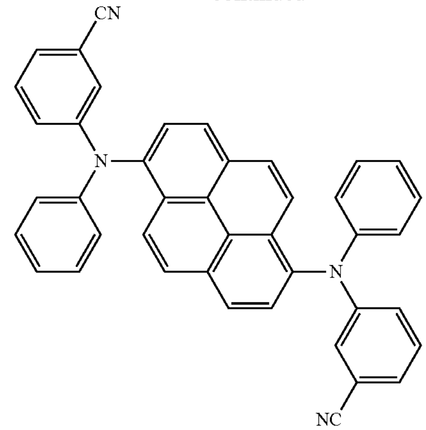
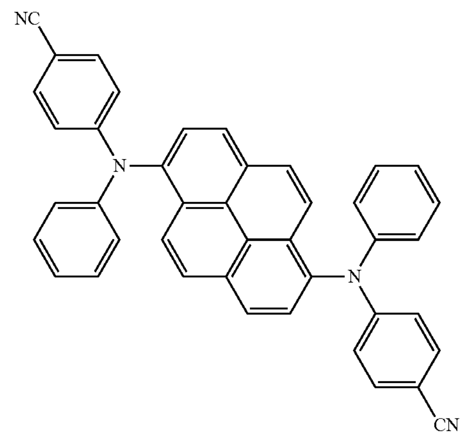
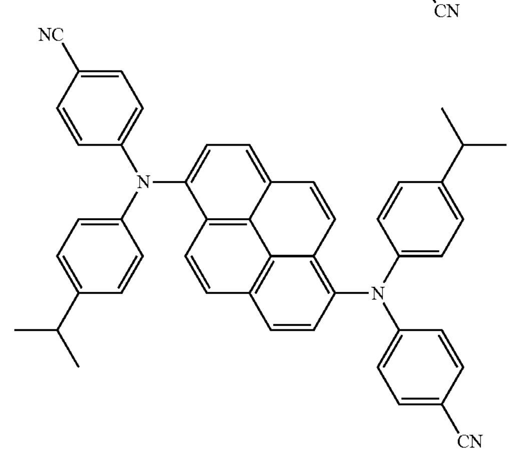
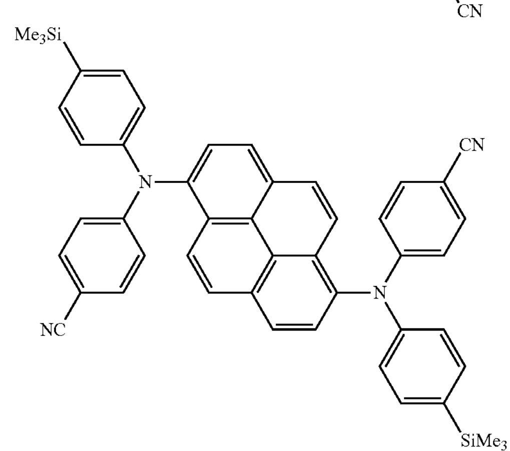

-continued
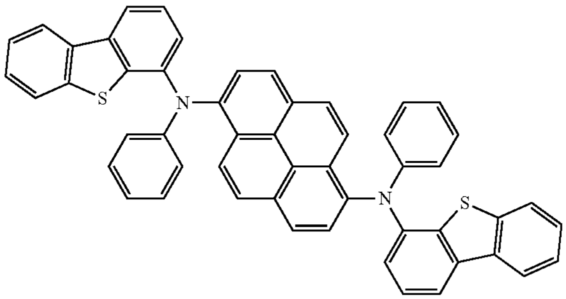
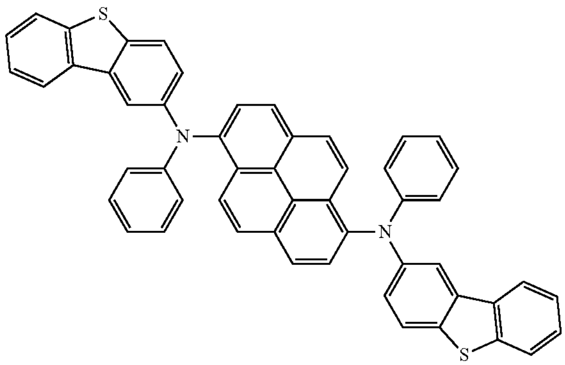
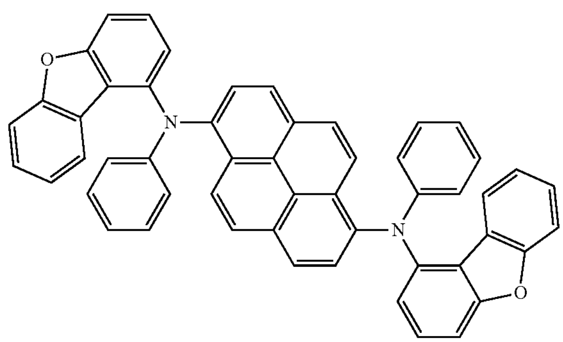
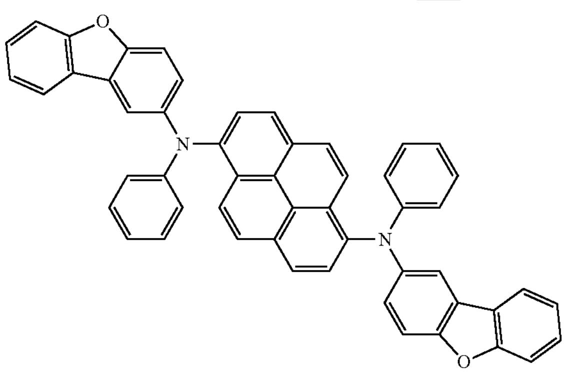
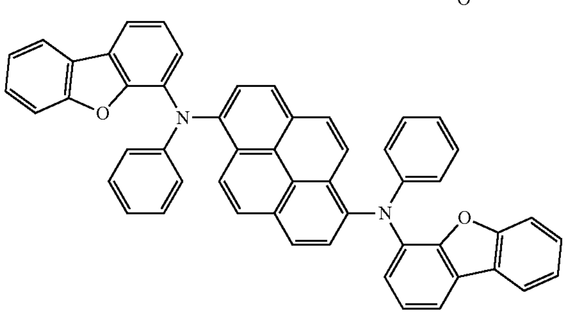
-continued
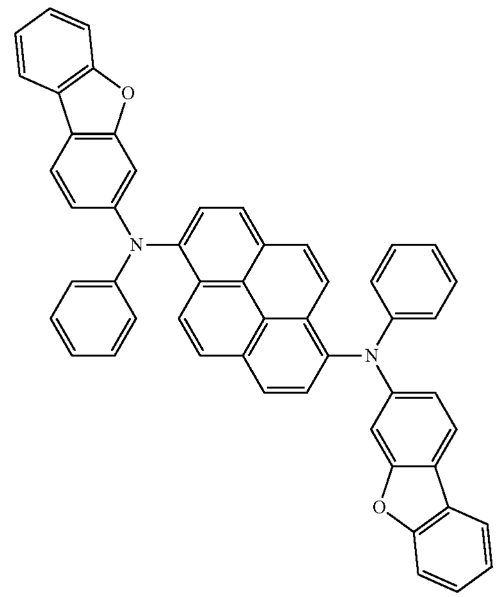
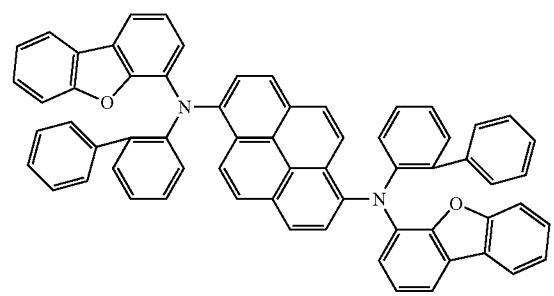
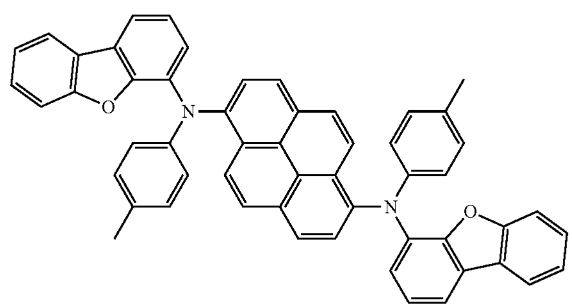
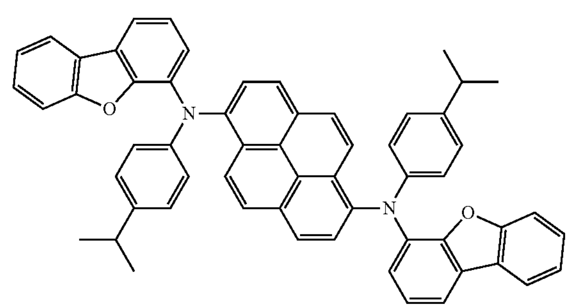

-continued
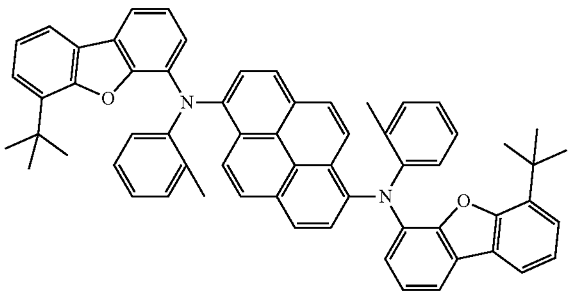
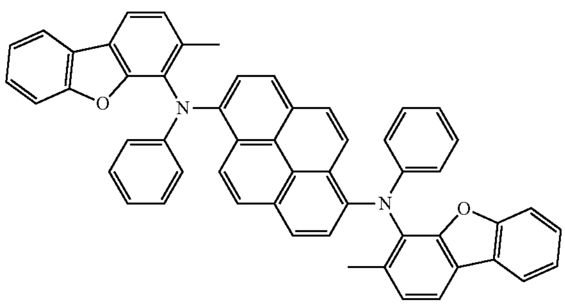
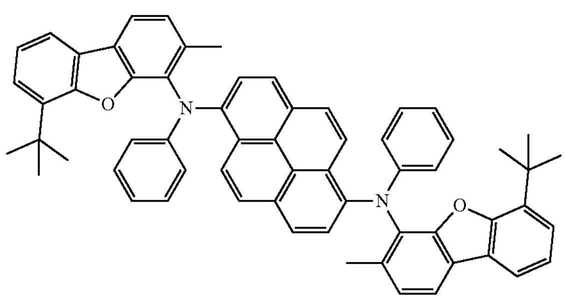
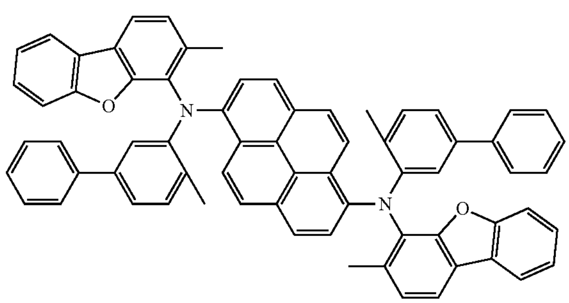
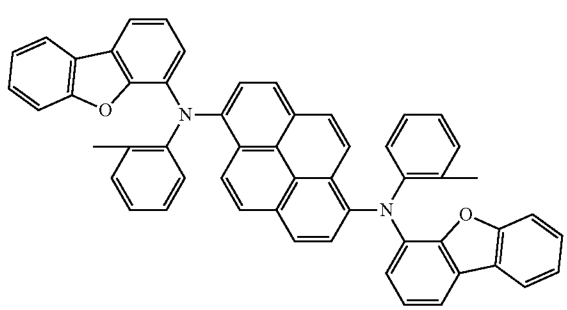
-continued
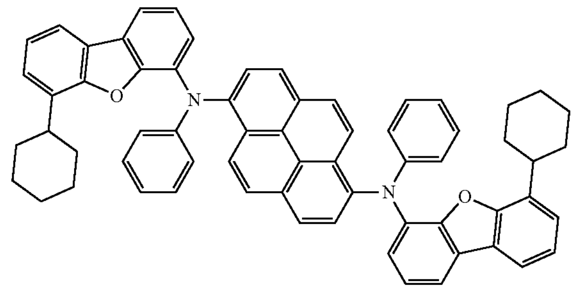
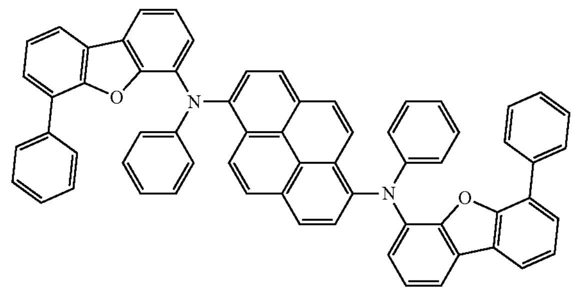
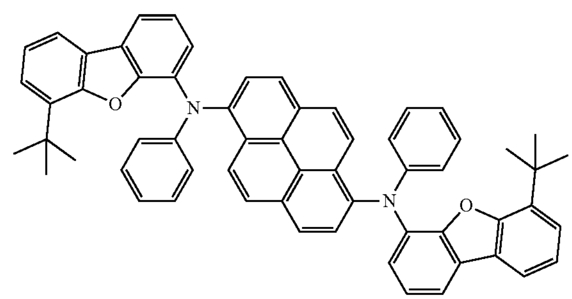
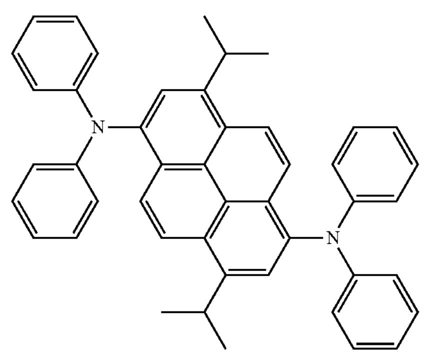
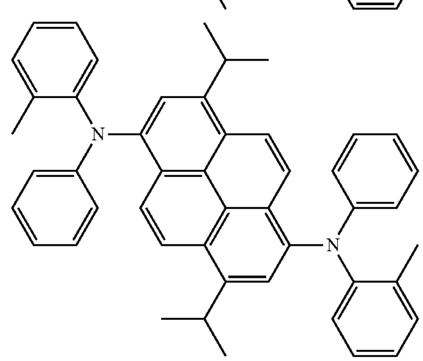

-continued
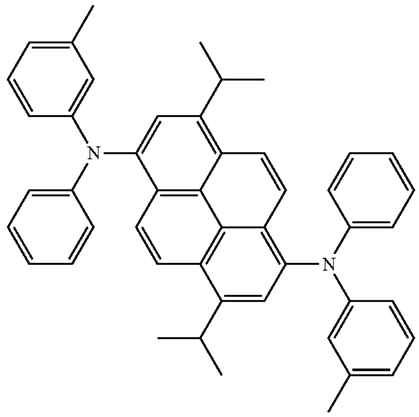
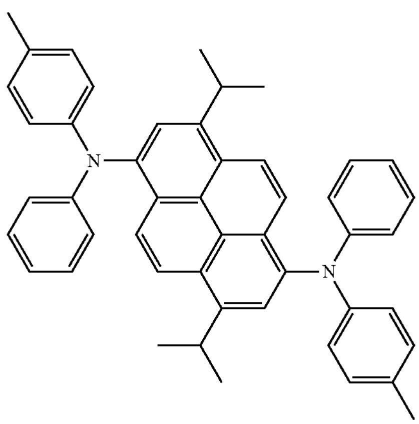
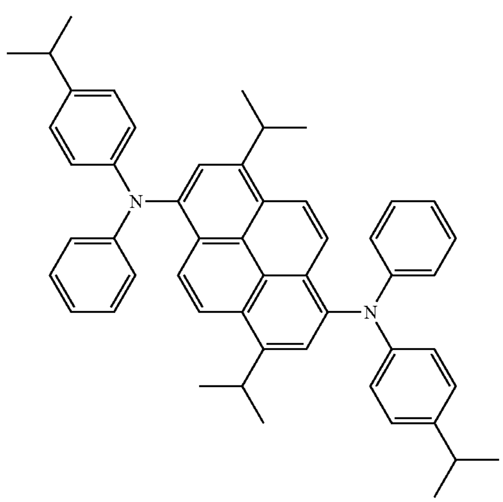
-continued
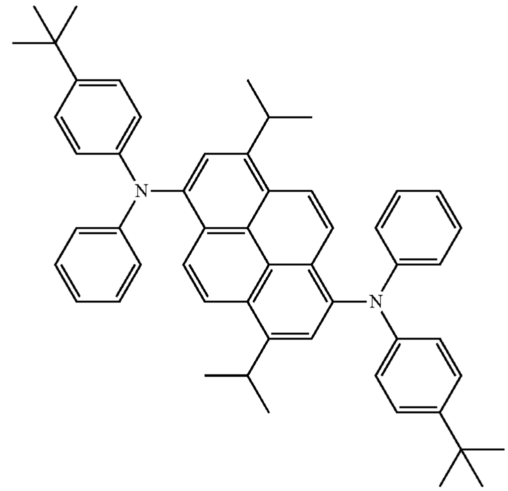
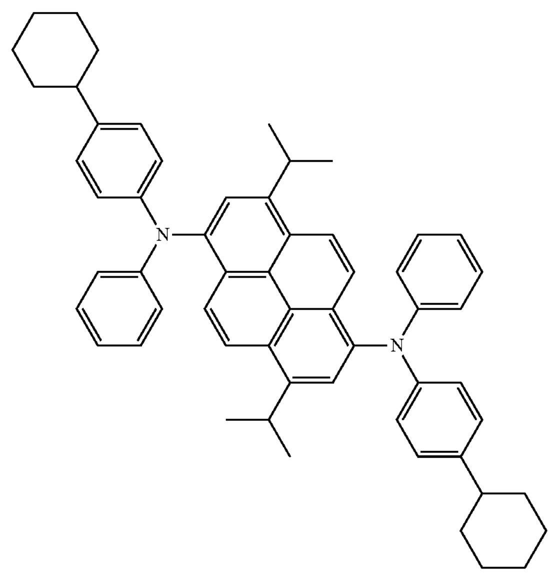
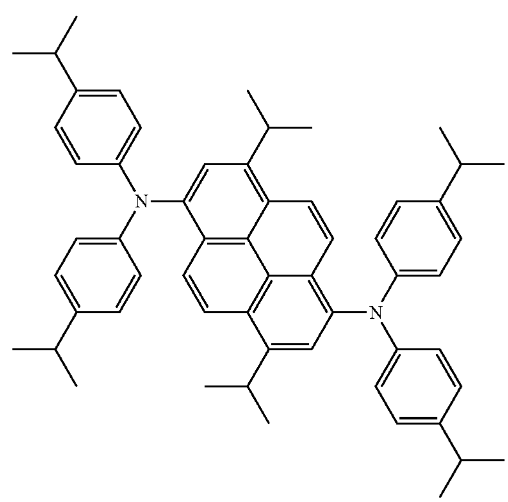

-continued
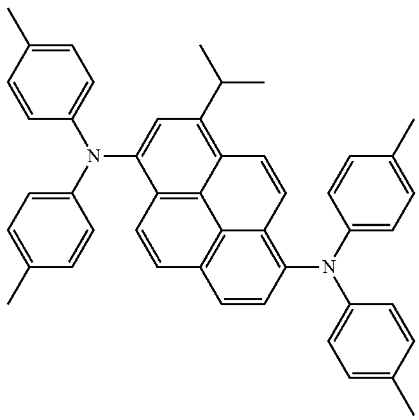
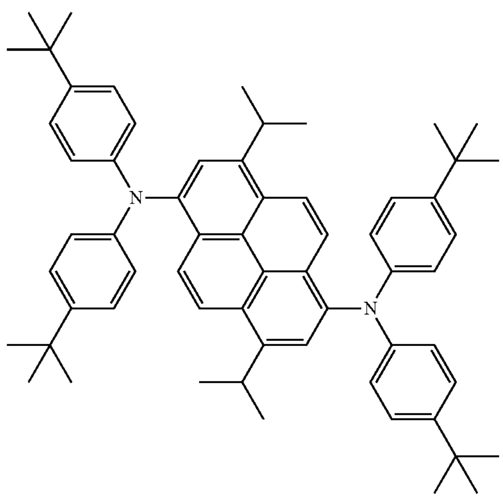
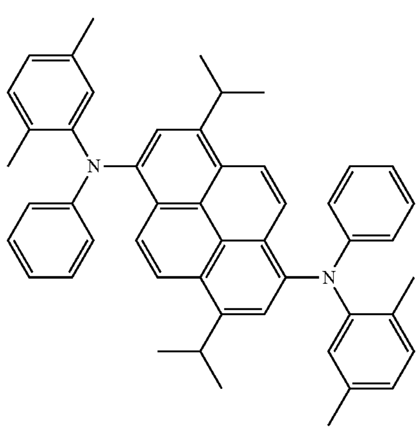
-continued
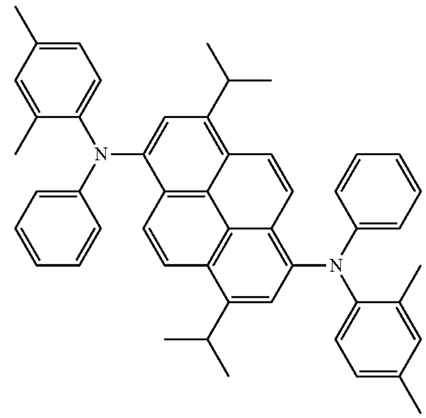
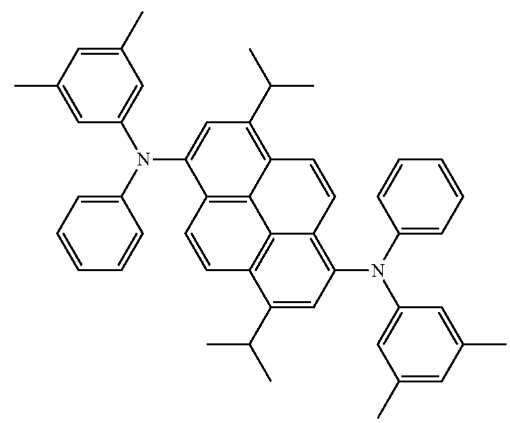
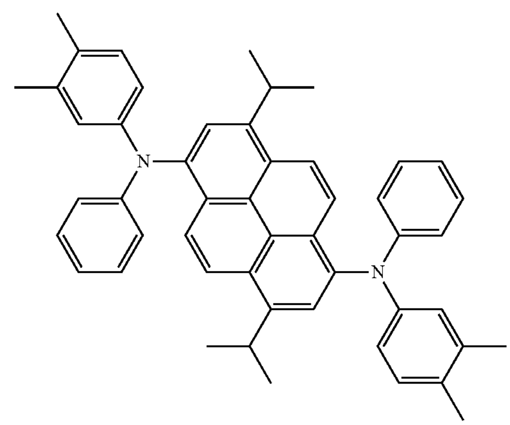
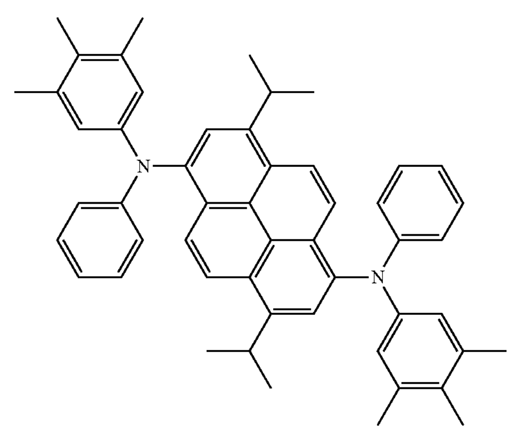

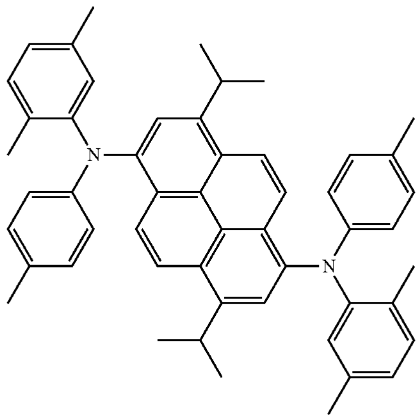
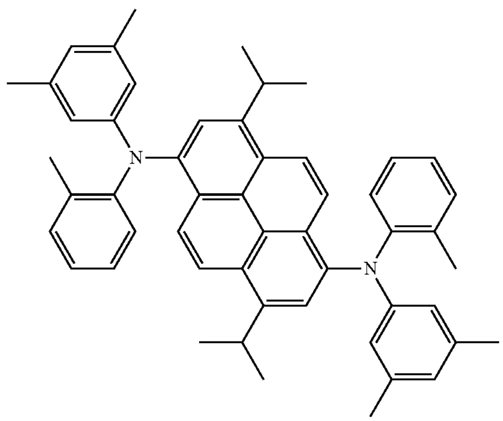
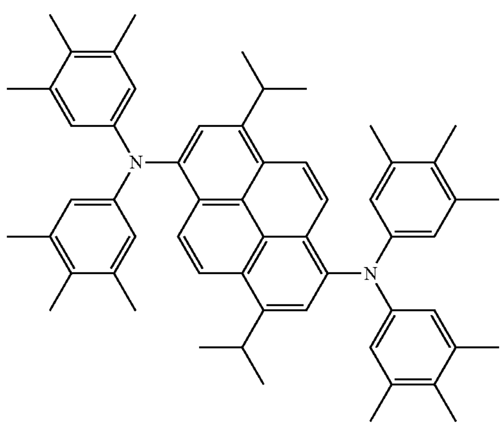
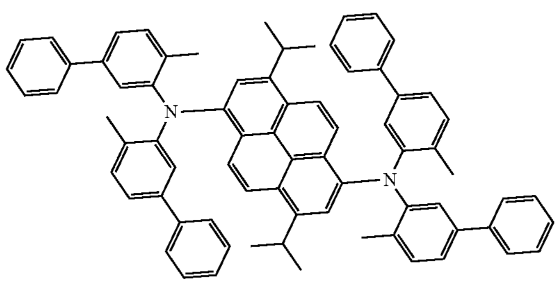
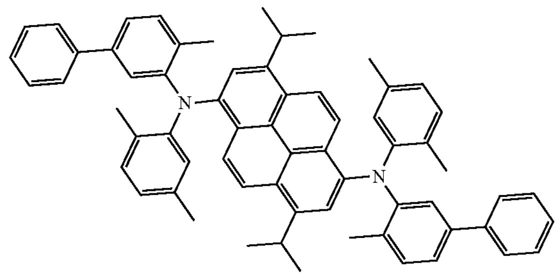
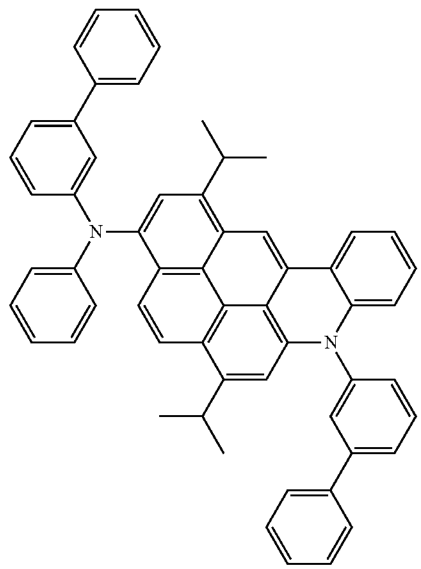
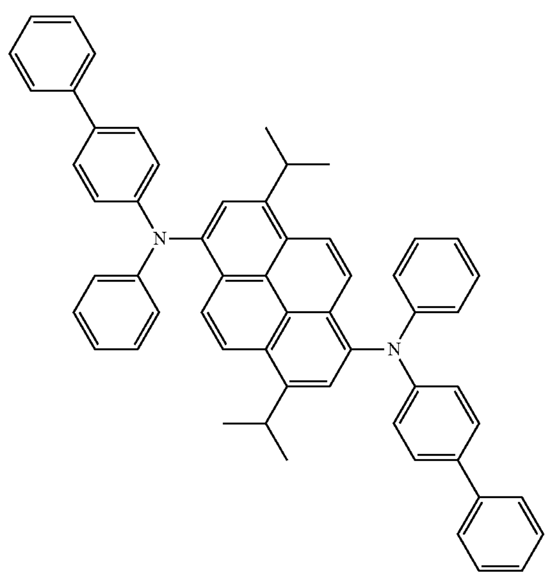 [SMILES: CC(C)c1cc(N(c2ccccc2)c2ccc(-c3ccccc3)cc2)c2ccc3c(C(C)C)cc(N(c4ccccc4)c4ccc(-c5ccccc5)cc4)c4ccc1c2c34]

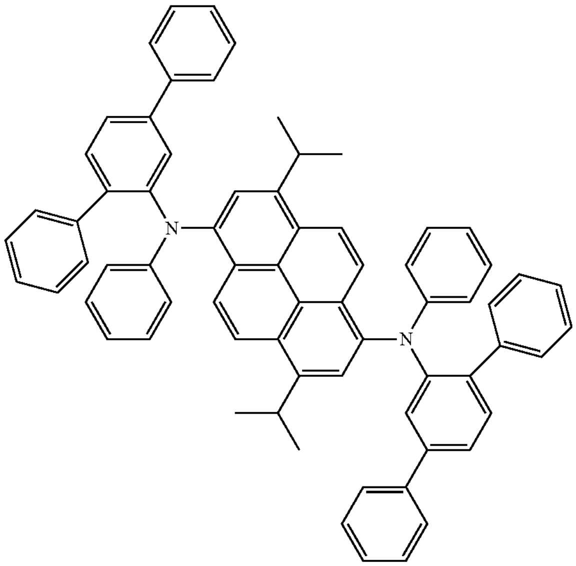
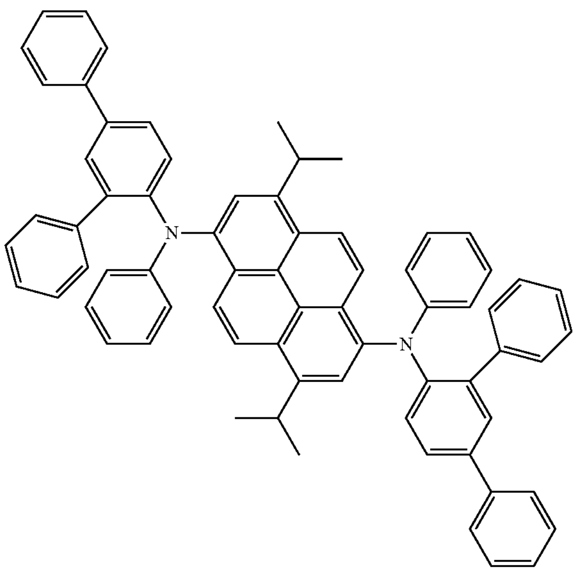
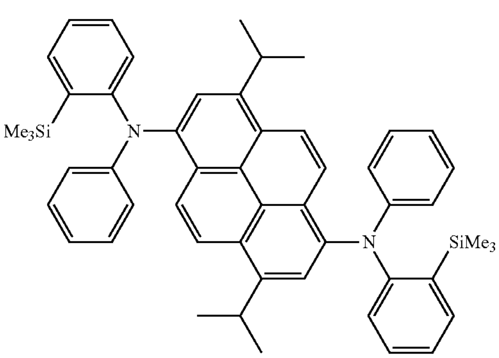
Me3Si
N
N
SiMe3
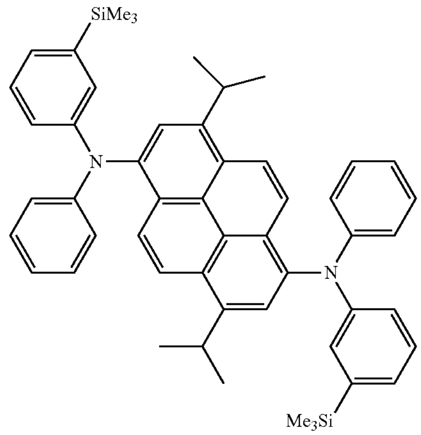
SiMe3
N
N
Me3Si
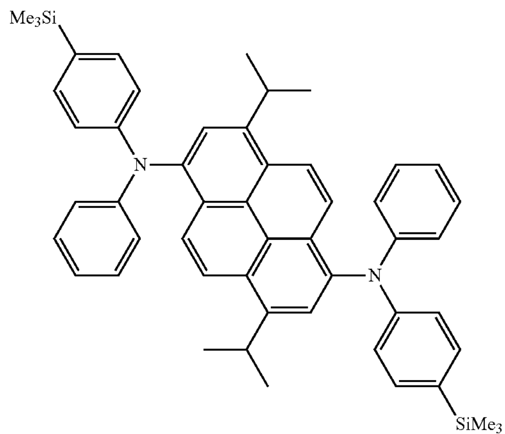
Me3Si
N
N
SiMe3
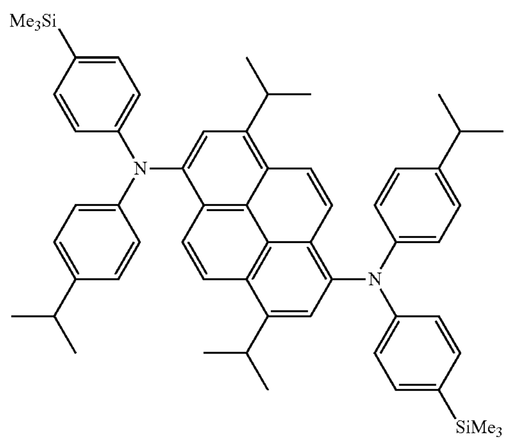
Me3Si
N
N
SiMe3
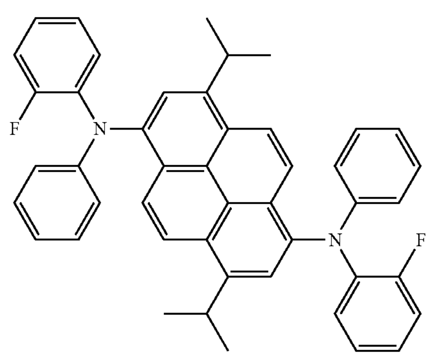
F
N
N
F -continued
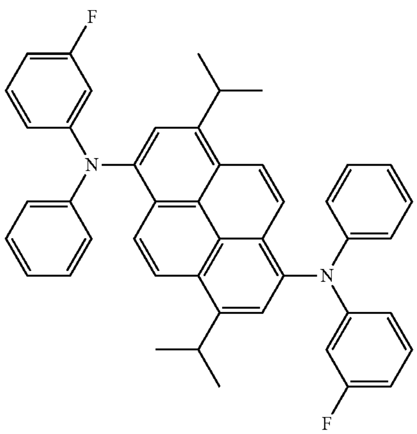
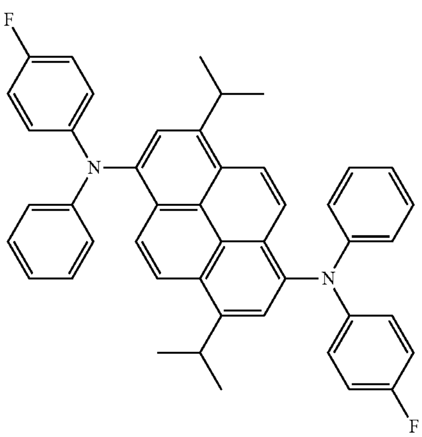
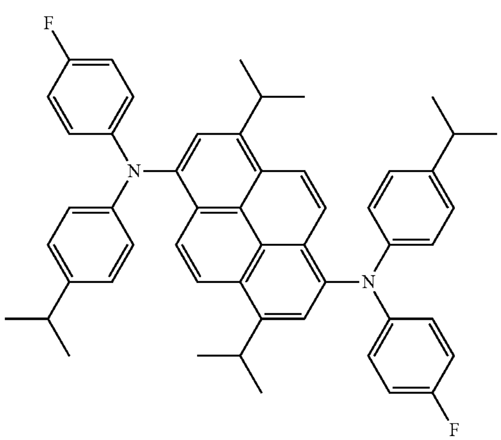
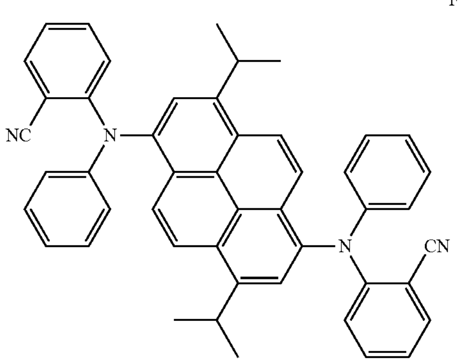
-continued
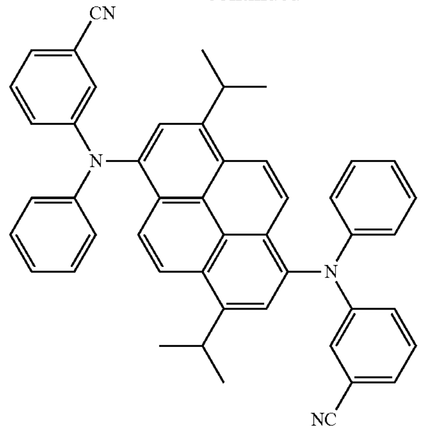
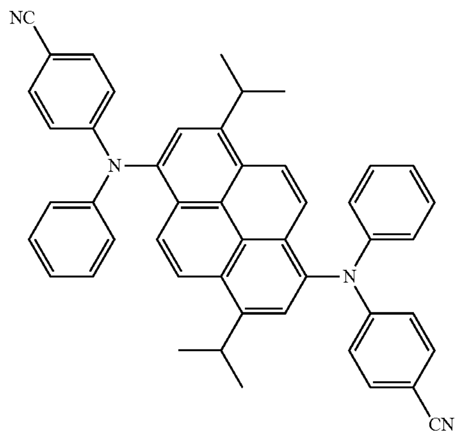
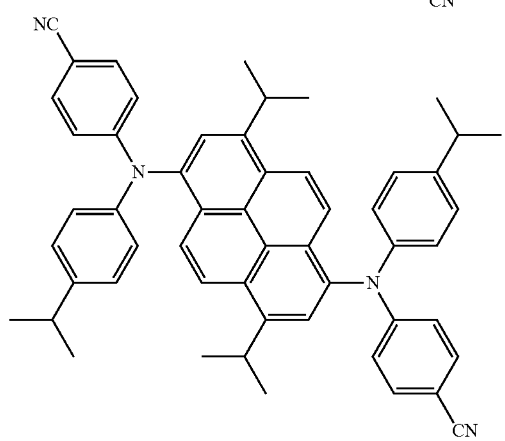
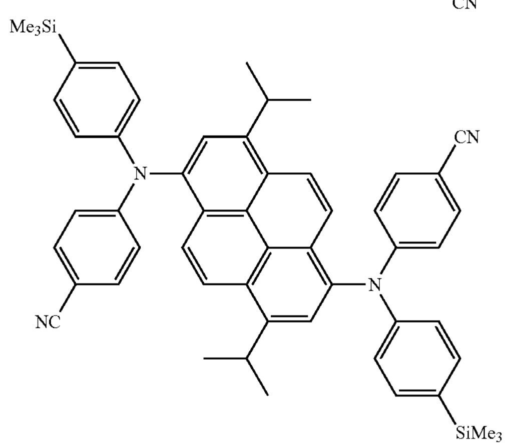

-continued
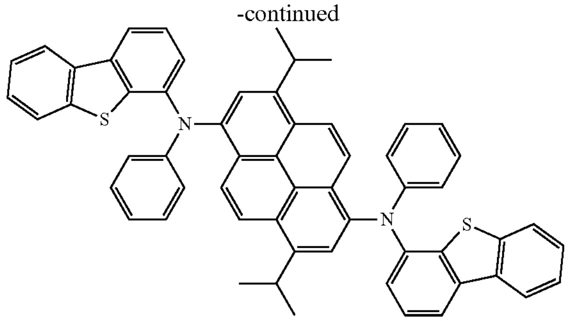
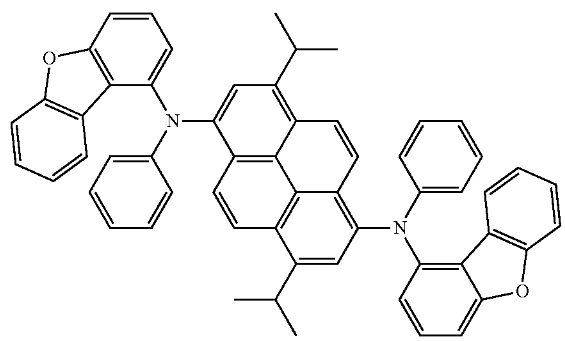
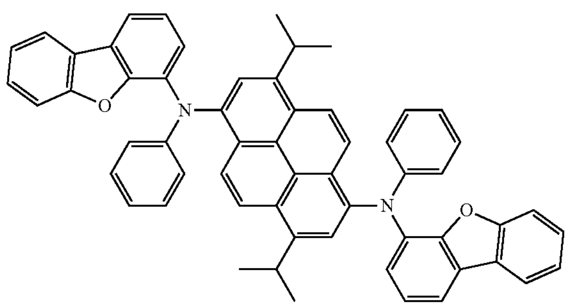
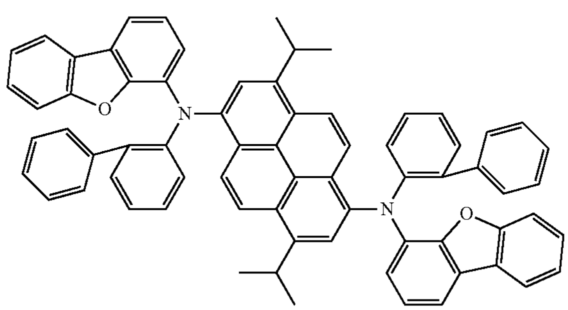
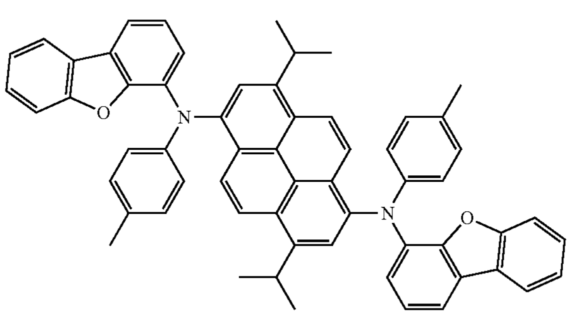
-continued
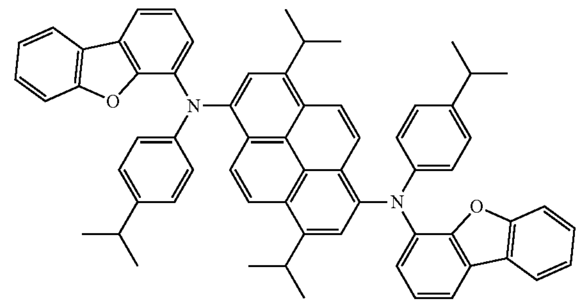
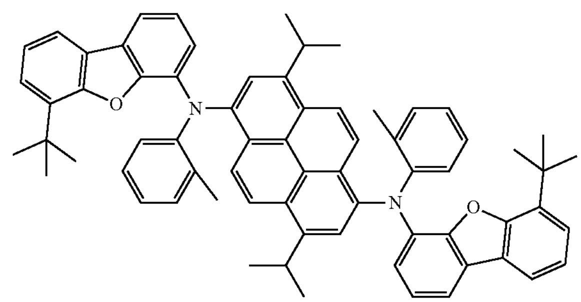
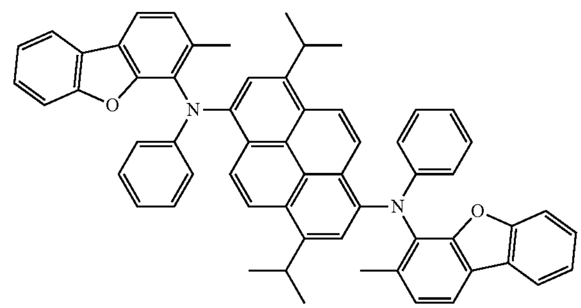
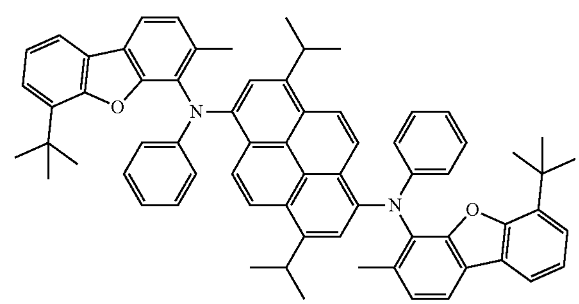
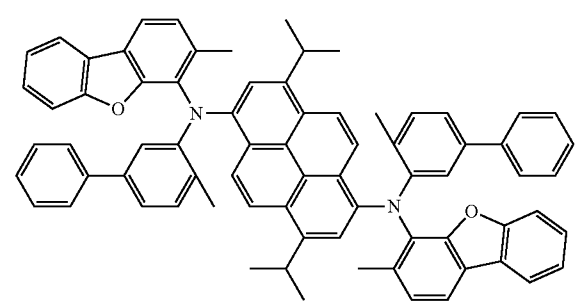

-continued
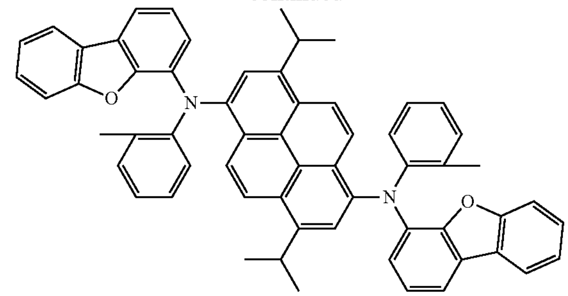
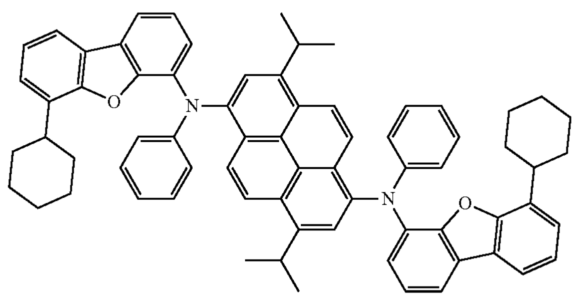
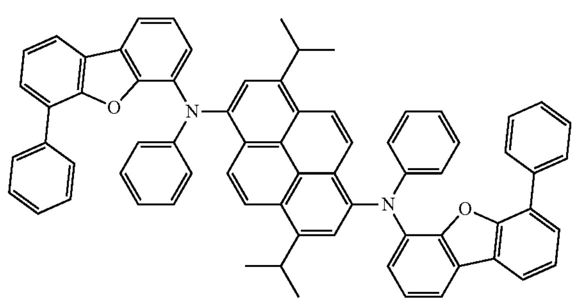
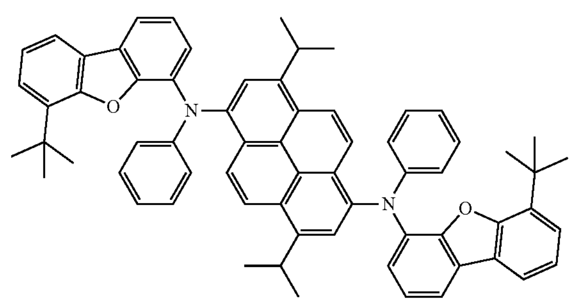 [SMILES: CC(C)c1cc(N(c2ccccc2)c2cccc3c2oc2c(C(C)(C)C)cccc23)c2ccc3c(C(C)C)cc(N(c4ccccc4)c4cccc5c4oc4c(C(C)(C)C)cccc45)c4ccc1c2c34]
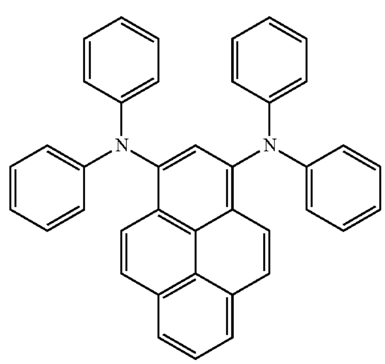
-continued
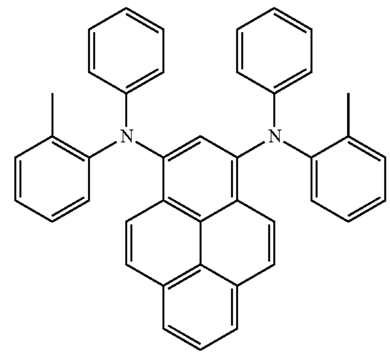
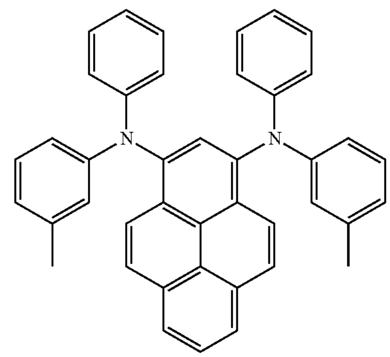
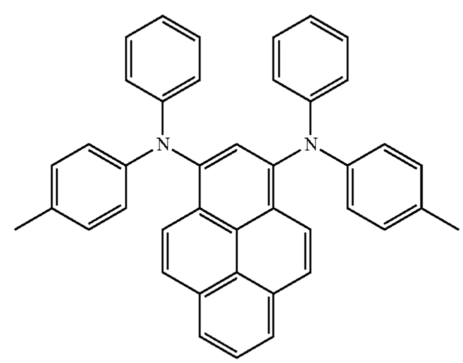
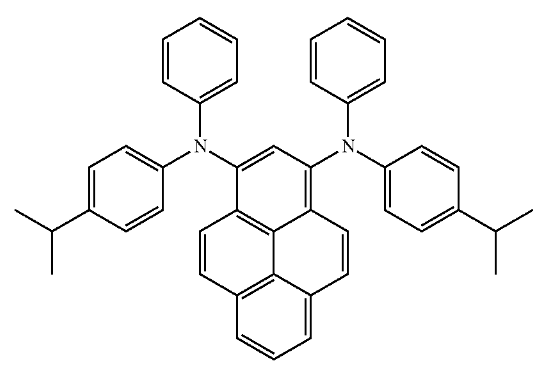

-continued
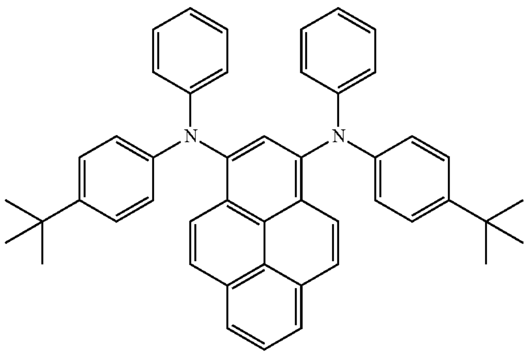
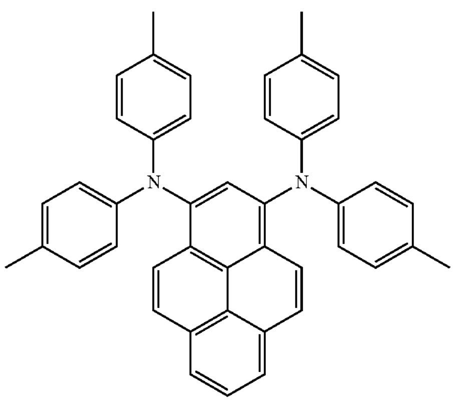
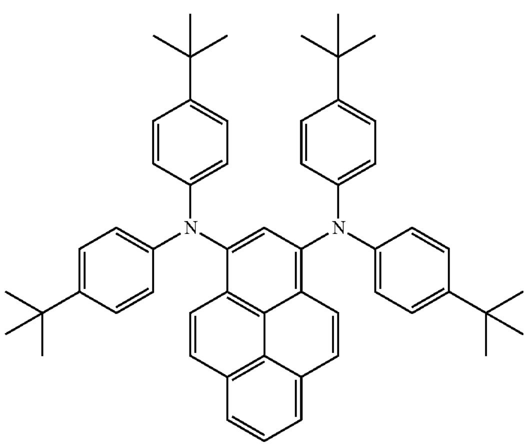
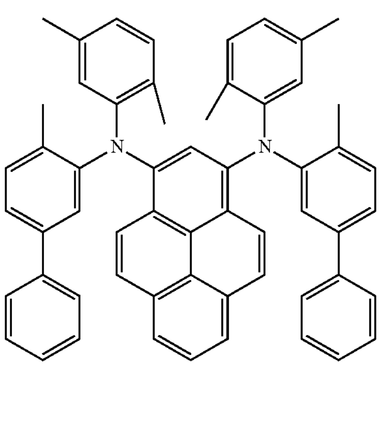
-continued
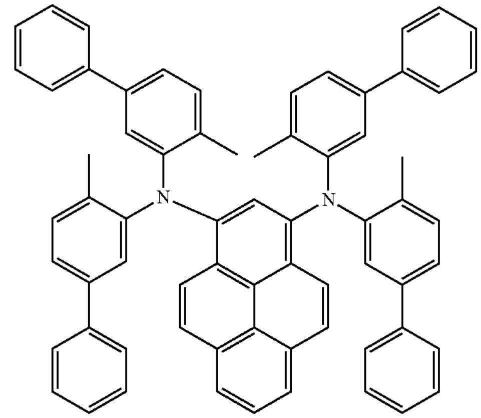
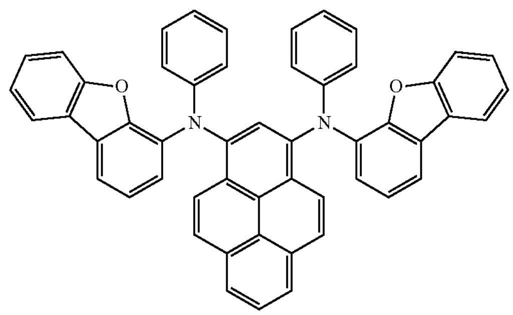
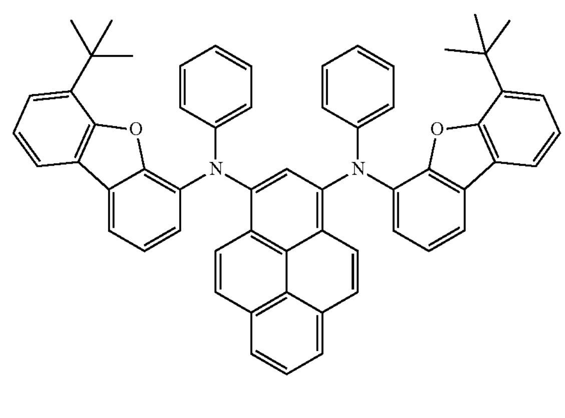
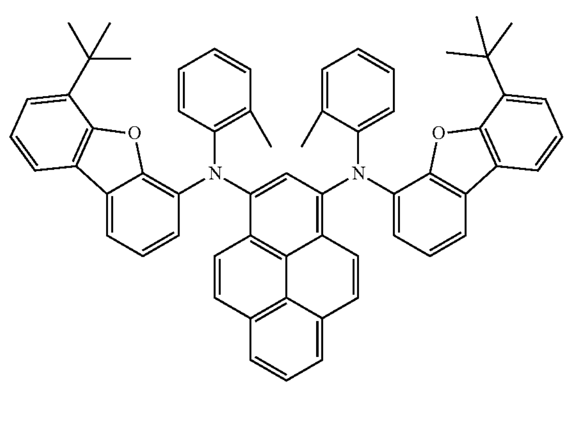

-continued
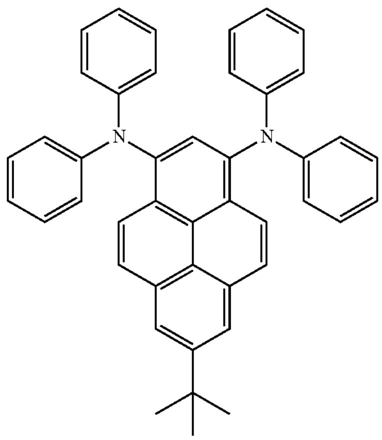
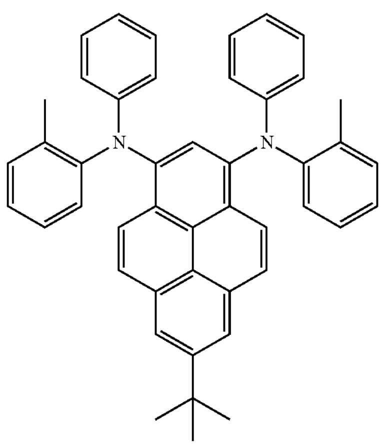
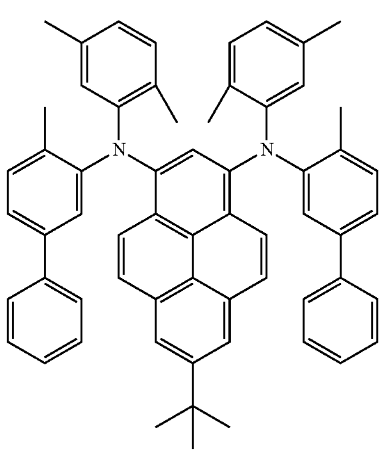
-continued
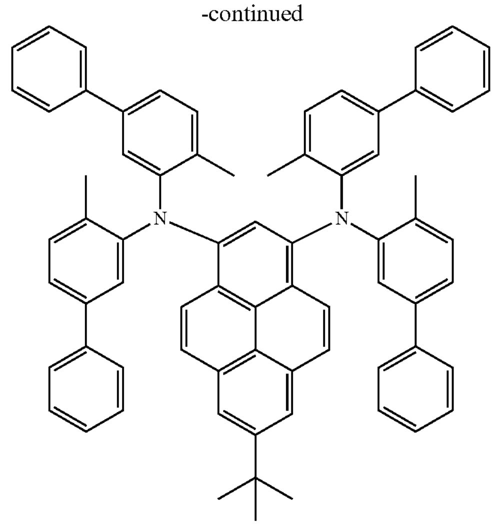
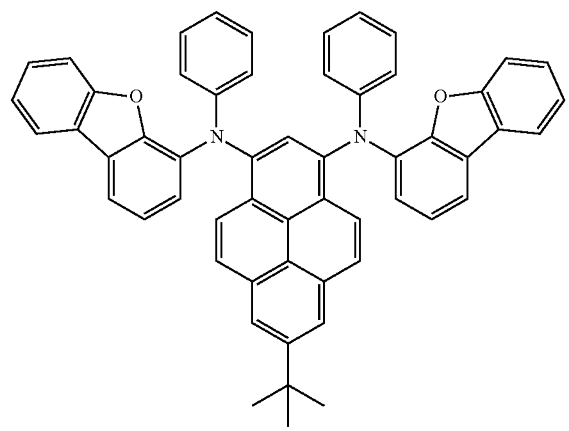
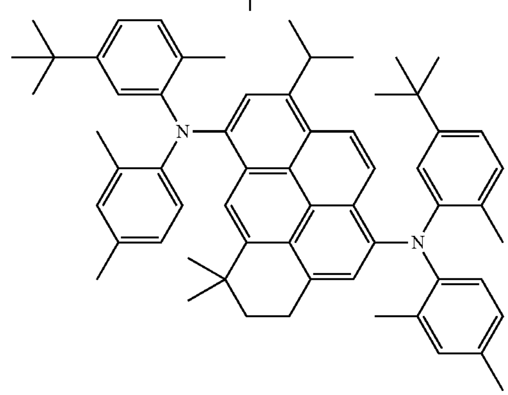
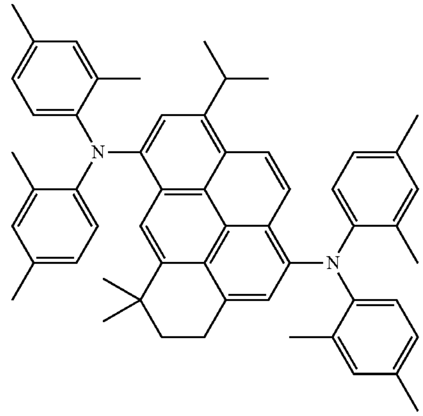

-continued
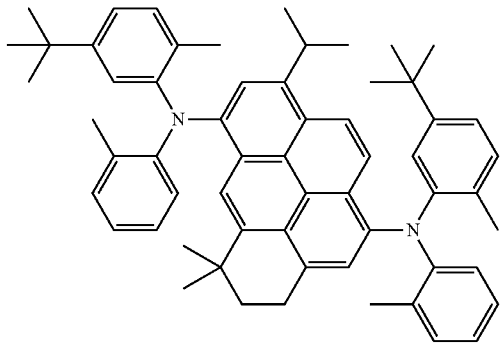
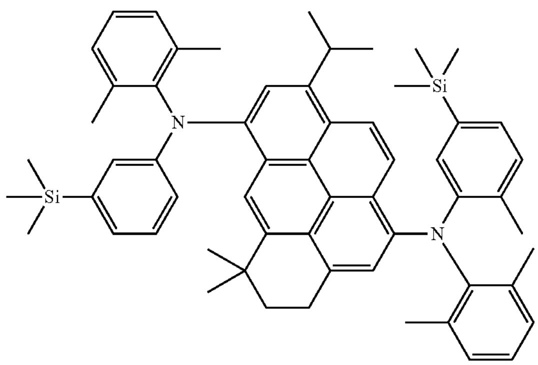
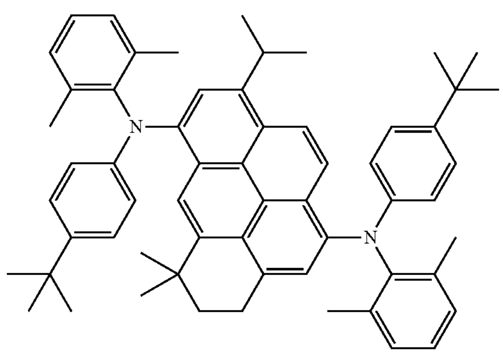
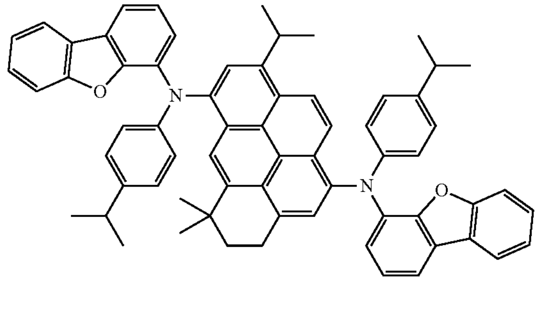
-continued
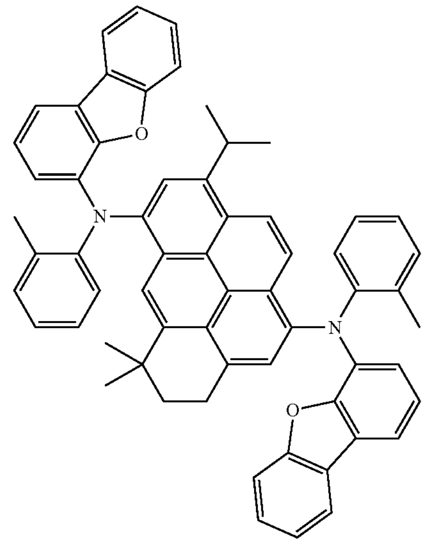
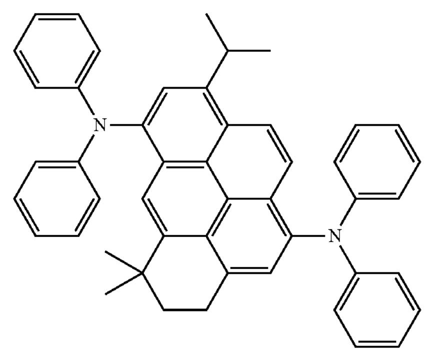
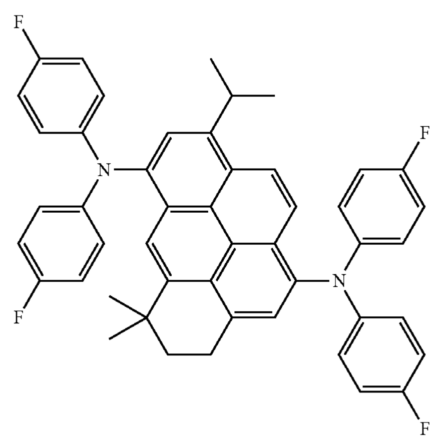
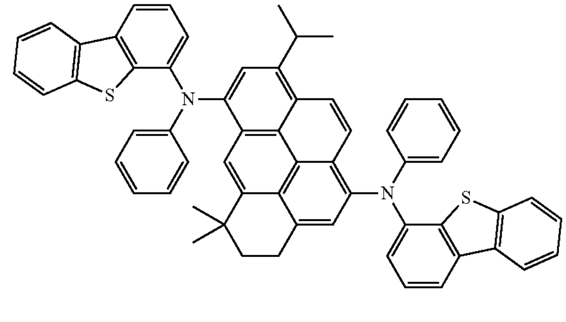

-continued

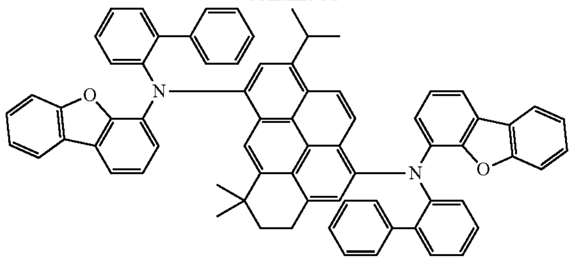

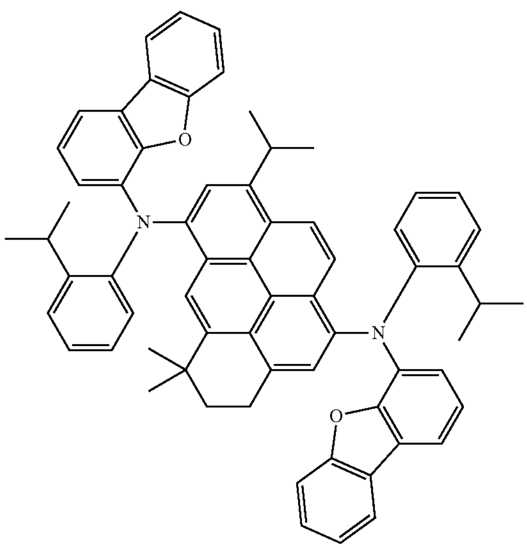

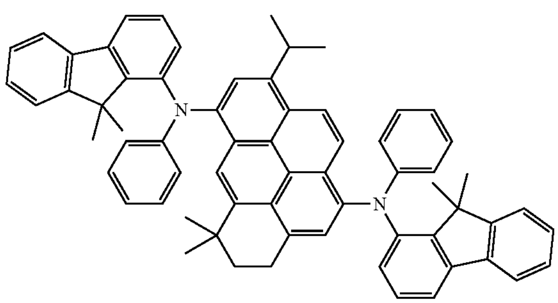

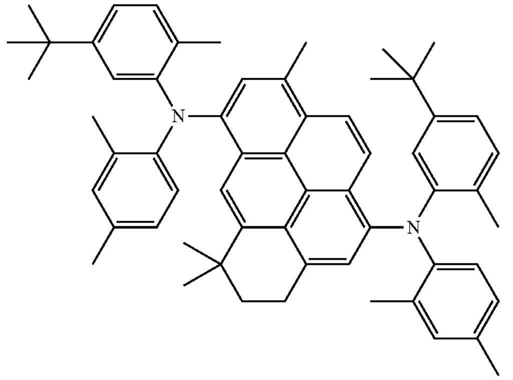

-continued

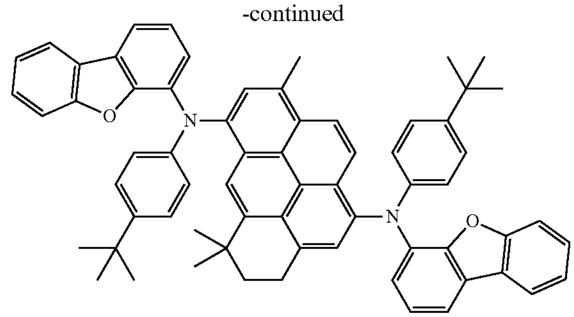

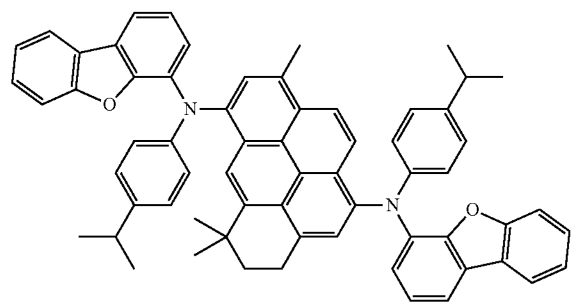

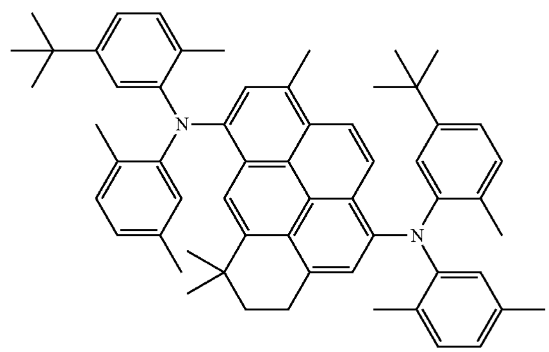

Compound Represented by Formula (71)

The compound represented by the formula (71) will be described below.

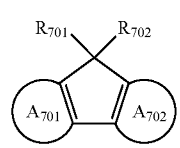

(71)

In the formula (71): a combination of $R_{701}$ and $R_{702}$ are mutually bonded to form a substituted or unsubstituted monocyclic ring, mutually bonded to form a substituted or unsubstituted fused ring, or not mutually bonded;

$A_{701}$ ring and $A_{702}$ ring are each independently a substituted or unsubstituted aromatic hydrocarbon ring having 6 to 50 ring carbon atoms or a substituted or unsubstituted heterocycle having 5 to 50 ring atoms; and at least one of a ring selected from the group consisting of $A_{701}$ ring and $A_{702}$ ring is bonded to a bond * of a structure represented by a formula (72) below;

(72)

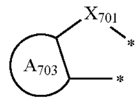

where, in the formula (72): $A_{70}3$ ring is each independently a substituted or unsubstituted aromatic hydrocarbon ring having 6 to 50 ring carbon atoms or a substituted or unsubstituted heterocycle having 5 to 50 ring atoms;

$X_{701}$ is $NR_{703}$, $C(R_{704})(R_{705})$, $Si(R_{706})(R_{707})$, $Ge(R_{708})(R_{709})$, an oxygen atom, a sulfur atom, or a selenium atom;

$R_{701}$ and $R_{702}$ not forming the substituted or unsubstituted monocyclic ring and not forming the substituted or unsubstituted fused ring and $R_{703}$ to $R_{709}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (71) to (72) respectively represent the same as $R_{901}$ to $R_{907}$ of the formula (11).

At least one of a ring selected from the group consisting of $A_{701}$ ring and $A_{702}$ ring is bonded to a bond * of a structure represented by the formula (72). In other words, the ring-forming carbon atoms of the aromatic hydrocarbon ring or the ring atoms of the heterocycle of the $A_{701}$ ring in the exemplary embodiment are bonded to the bonds * in the structure represented by the formula (72). In other words, the ring-forming carbon atoms of the aromatic hydrocarbon ring or the ring atoms of the heterocycle of the $A_{702}$ ring in the exemplary embodiment are bonded to the bonds * in the structure represented by the formula (72).

In some embodiments, the group represented by a formula (73) is bonded to one or both of the $A_{701}$ ring and $A_{702}$ ring.

(73)

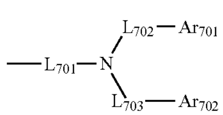

In the formula (73): $Ar_{701}$ and $Ar_{702}$ are each independently a substituted or unsubstituted aryl group having 6 to 50 ring carbon atoms, or a substituted or unsubstituted heterocyclic group having 5 to 50 ring atoms; and $L_{701}$ to $L_{703}$ are each independently a single bond, a substituted or unsubstituted arylene group having 6 to 30 ring carbon atoms, a substituted or unsubstituted heterocyclic group having 5 to 30 ring atoms, or a divalent linking group formed by combining two to four of the above groups.

When a plurality of $Ar_{701}$ are present, the plurality of $Ar_{701}$ are mutually the same or different.

When a plurality of $Ar_{702}$ are present, the plurality of $Ar_{702}$ are mutually the same or different.

When a plurality of $L_{701}$ are present, the plurality of $L_{701}$ are mutually the same or different.

When a plurality of $L_{702}$ are present, the plurality of $L_{702}$ are mutually the same or different.

When a plurality of $L_{703}$ are present, the plurality of $L_{703}$ are mutually the same or different.

In some embodiments, in addition to the $A_{701}$ ring, the ring-forming carbon atoms of the aromatic hydrocarbon ring or the ring atoms of the heterocycle of the $A_{702}$ ring are bonded to the bonds * in the structure represented by the formula (72). In this case, the plurality of structures represented by the formula (72) are mutually the same or different.

In some embodiments, $R_{701}$ and $R_{702}$ are each independently a substituted or unsubstituted aryl group having 6 to 50 ring carbon atoms.

In some embodiments, the combination of $R_{701}$ and $R_{702}$ are mutually bonded to form a substituted or unsubstituted fluorene structure.

In some embodiments, the rings $A_{701}$ and $A_{702}$ are each independently a substituted or unsubstituted aromatic hydrocarbon ring having 6 to 50 ring carbon atoms, example of which is a substituted or unsubstituted benzene ring.

In some embodiments, the ring $A_{703}$ is a substituted or unsubstituted aromatic hydrocarbon ring having 6 to 50 ring carbon atoms, example of which is a substituted or unsubstituted benzene ring.

In some embodiments, $X_{701}$ is an oxygen atom or a sulfur atom.

Specific Examples of Compound Represented by Formula (71)

Specific examples of the compound represented by the formula (71) include compounds shown below. It should however be noted that the invention is not limited by the specific examples of the second compound.

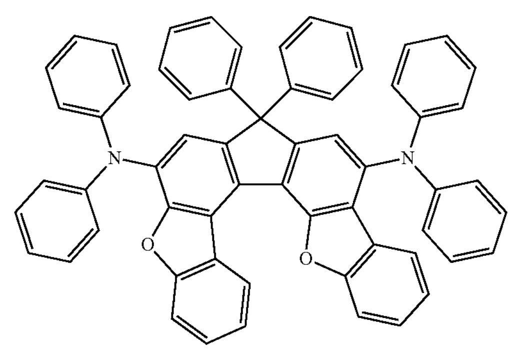

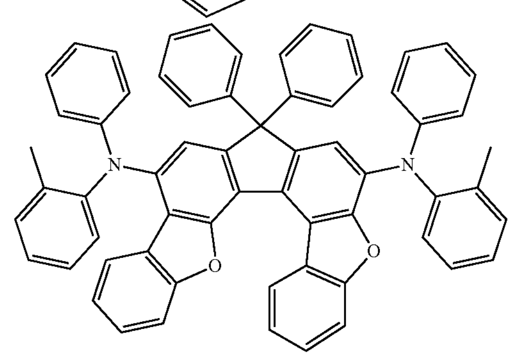

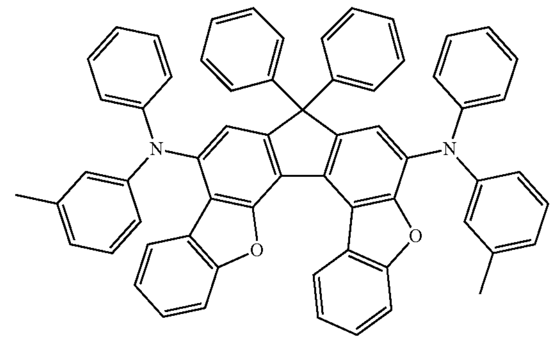
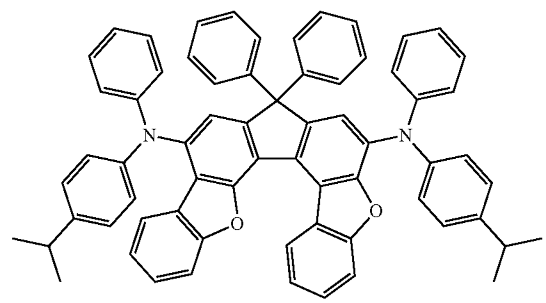
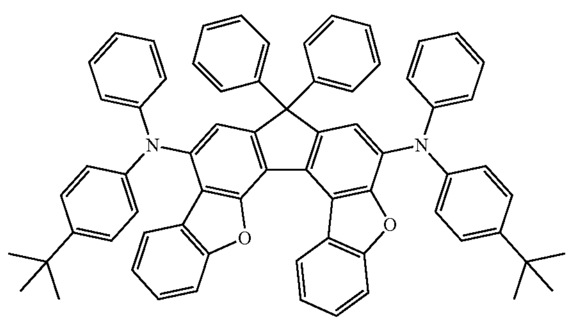
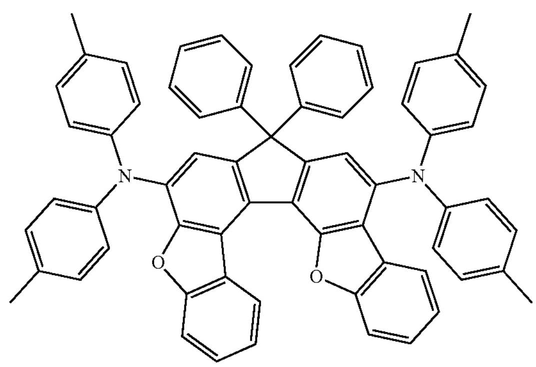
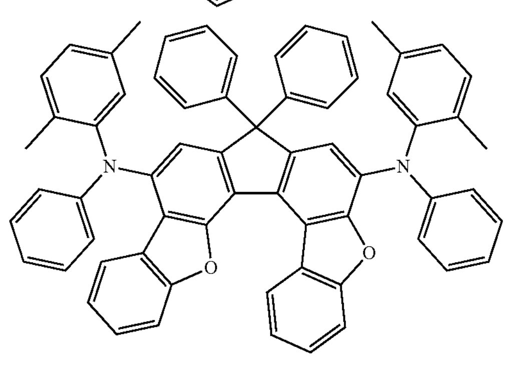
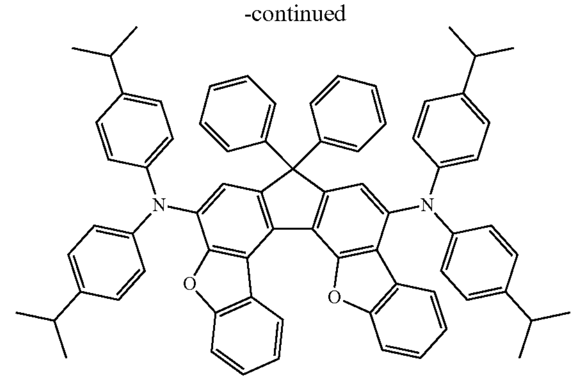
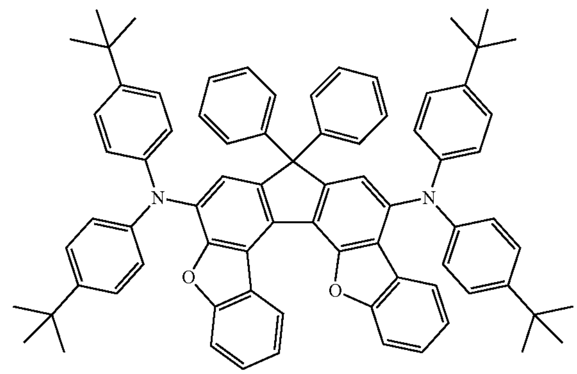
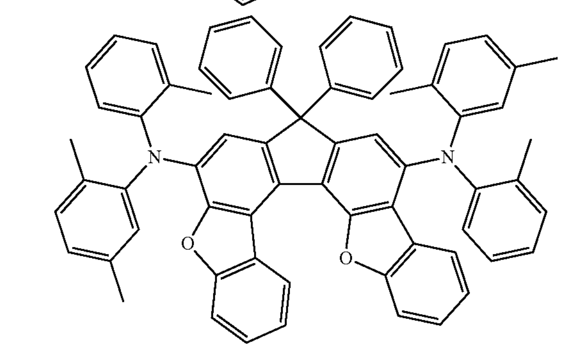
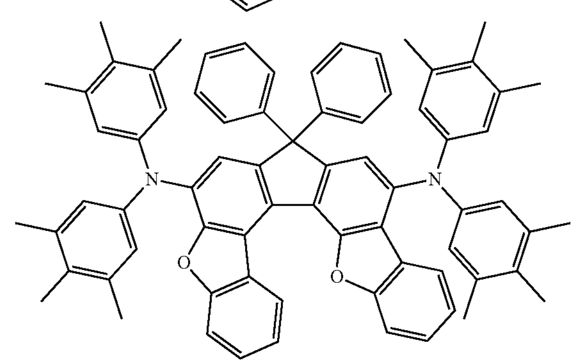
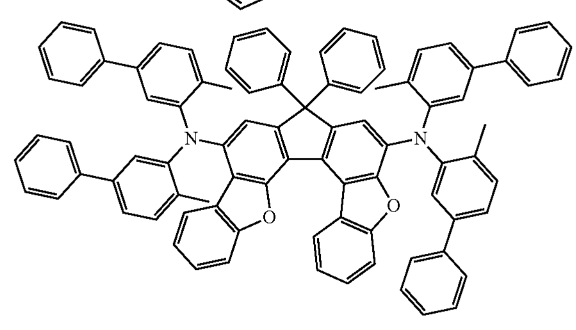

-continued
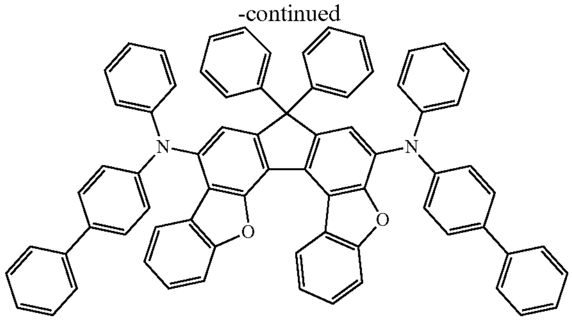
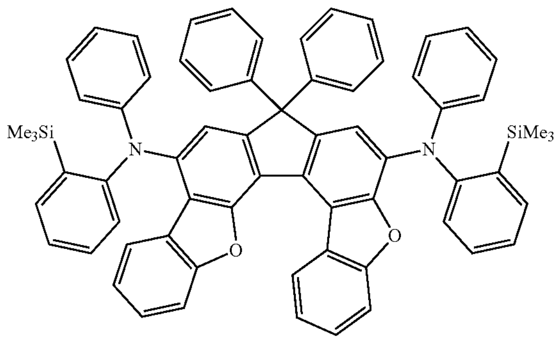
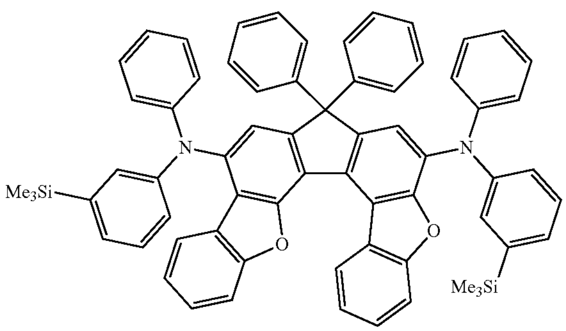
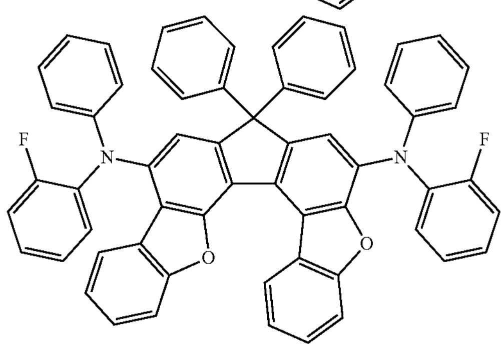
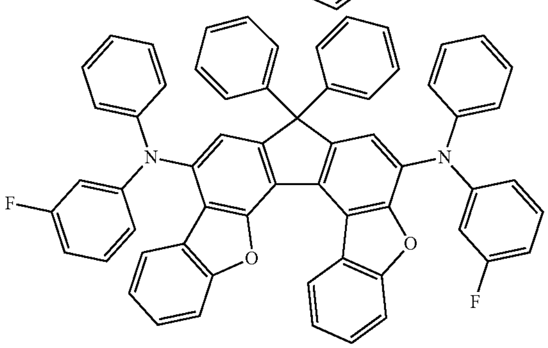
-continued
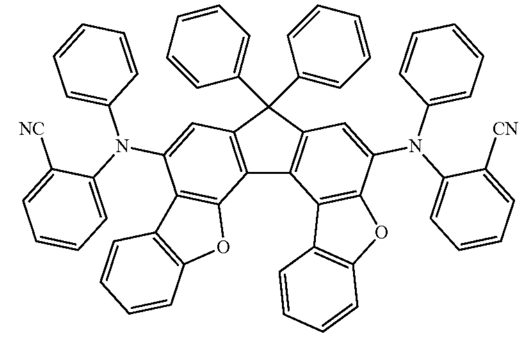
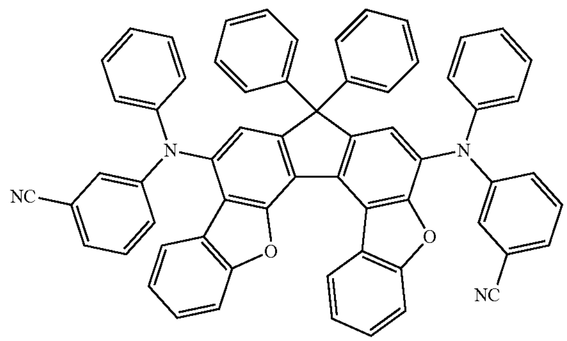
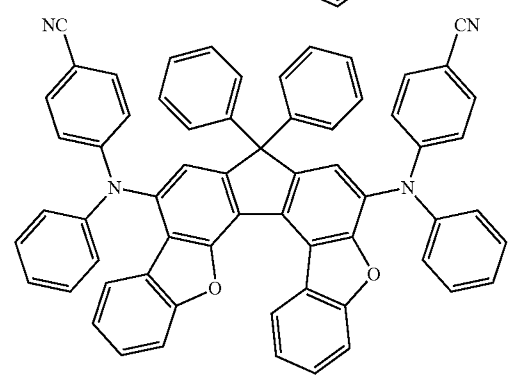
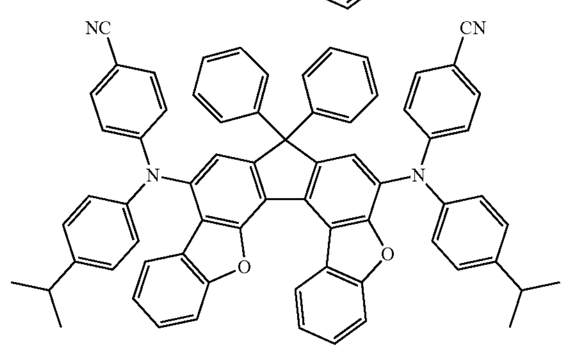
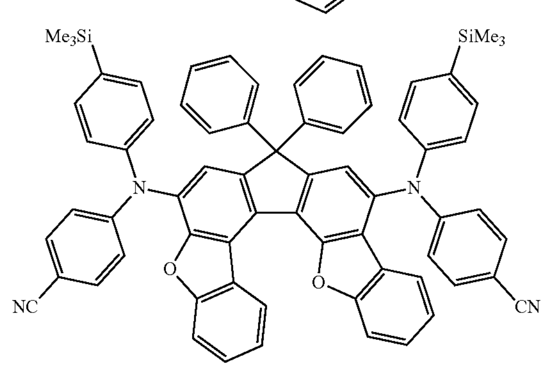

-continued
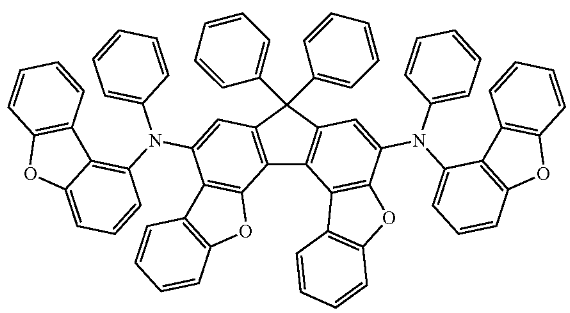
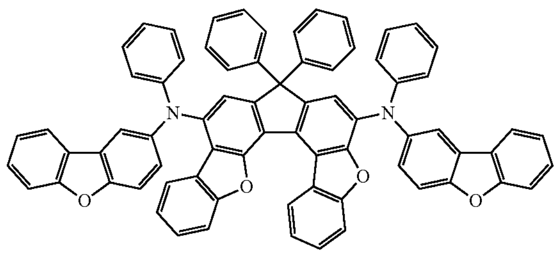
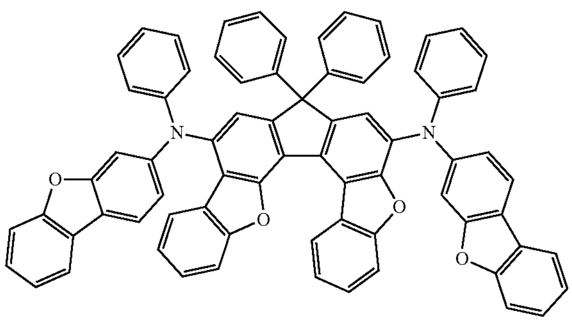
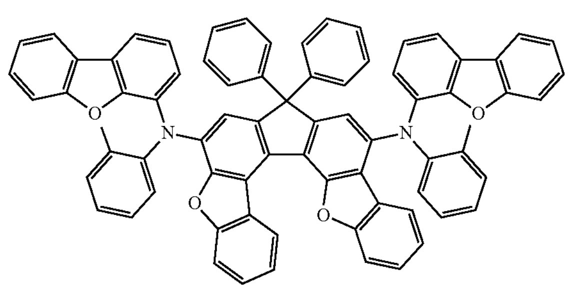
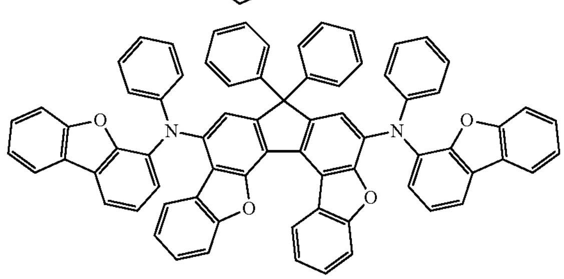
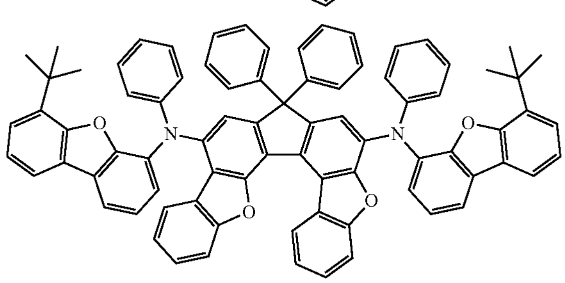
-continued
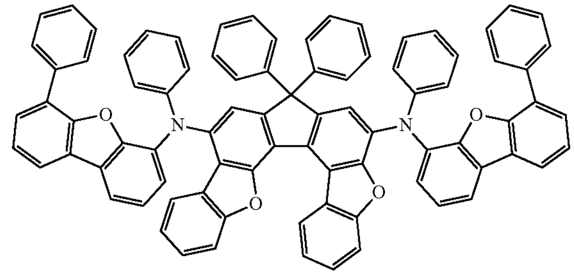
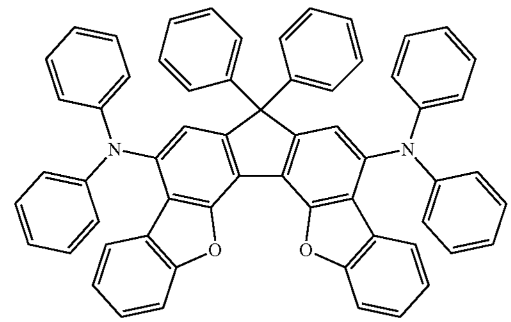
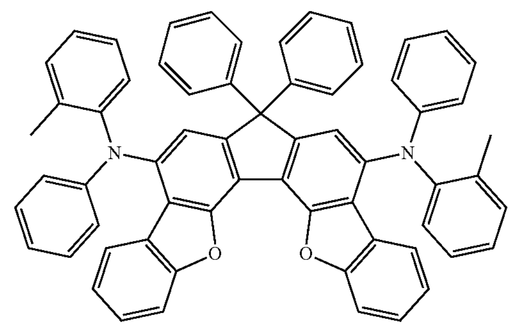
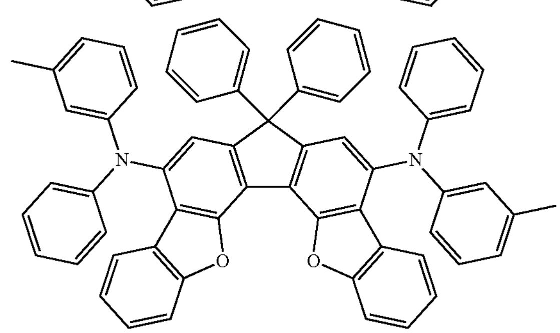
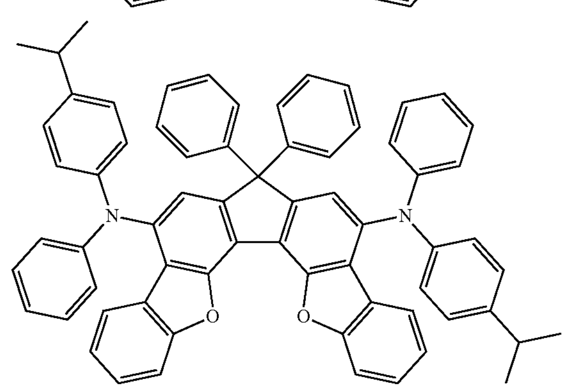

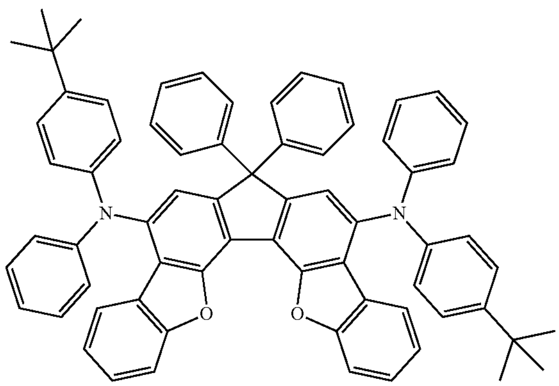
N
N
O
O
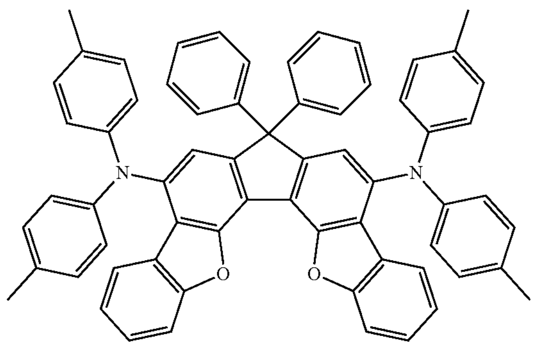
N
N
O
O
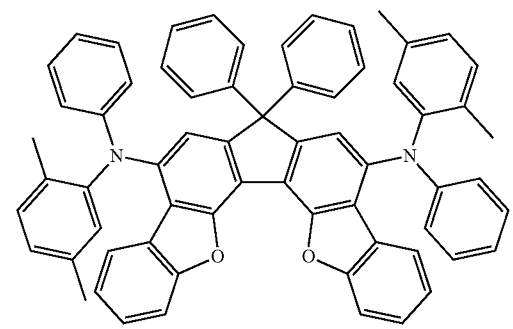
N
N
O
O
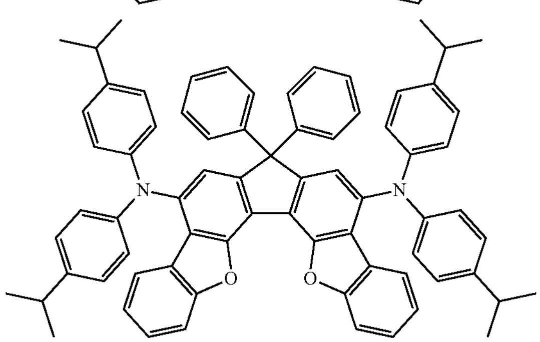
N
N
O
O
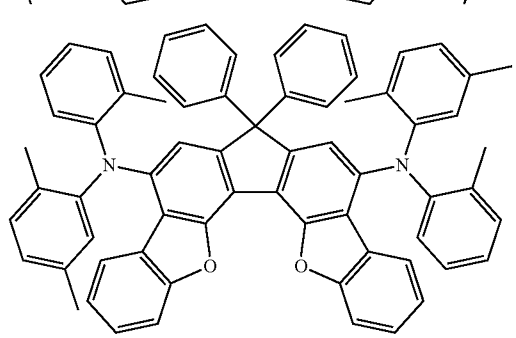
N
N
O
O
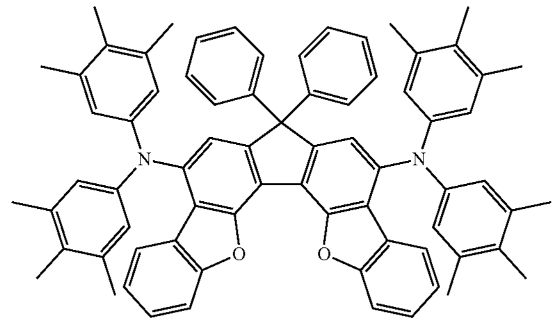
N
N
O
O
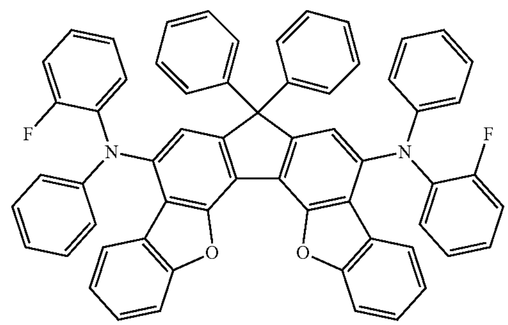
F
N
N
F
O
O
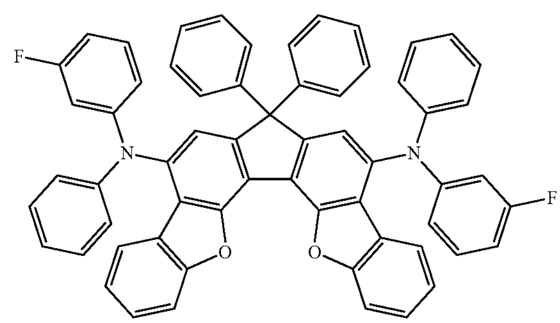
F
N
N
F
O
O
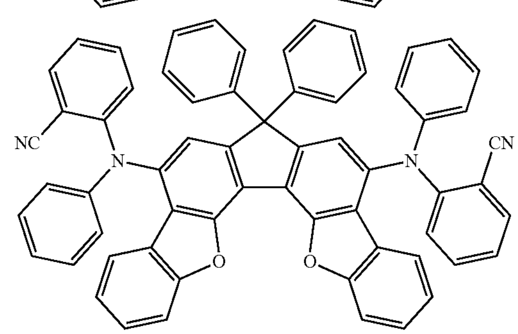
NC
N
N
CN
O
O
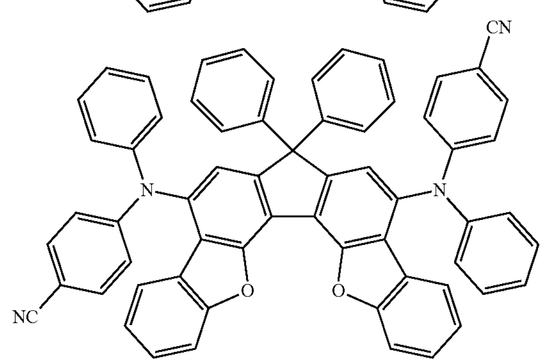
CN
N
N
NC
O
O -continued
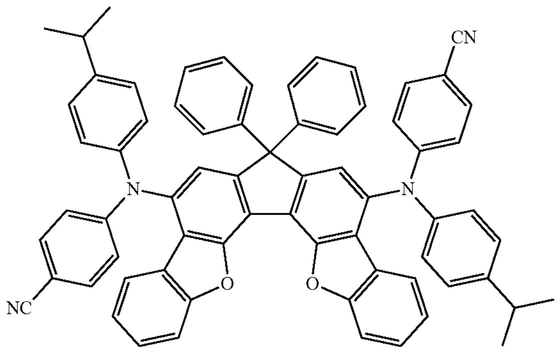
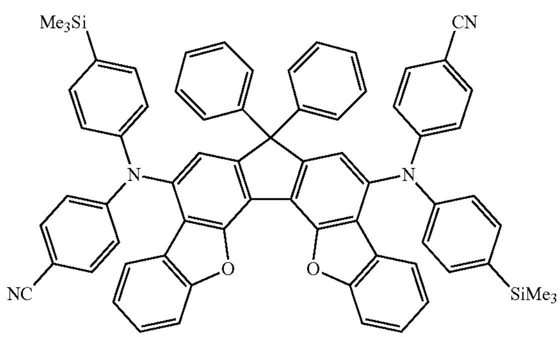
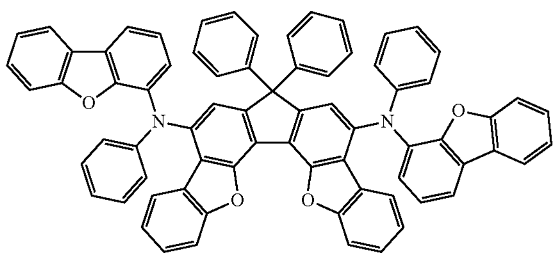
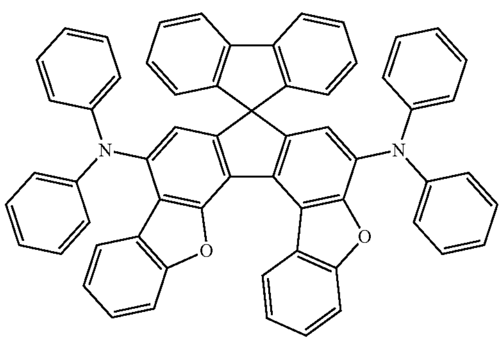
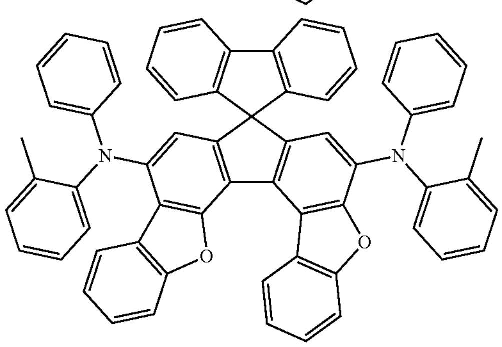
-continued
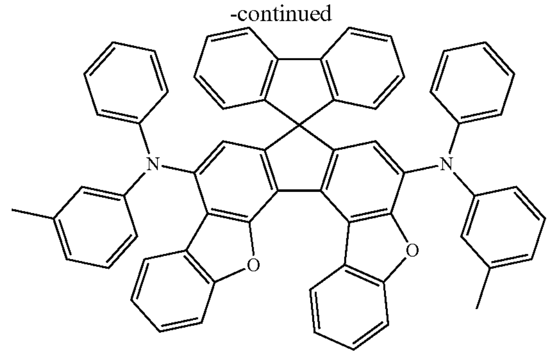
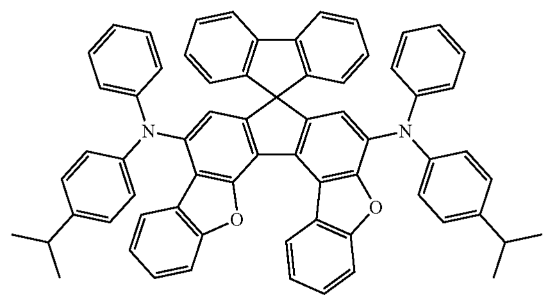
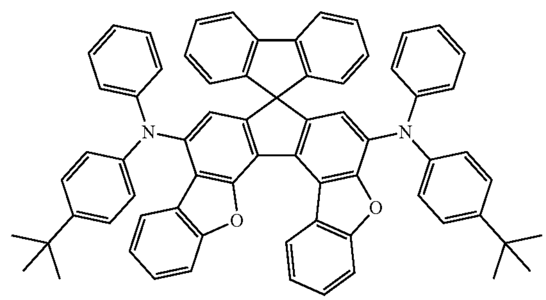
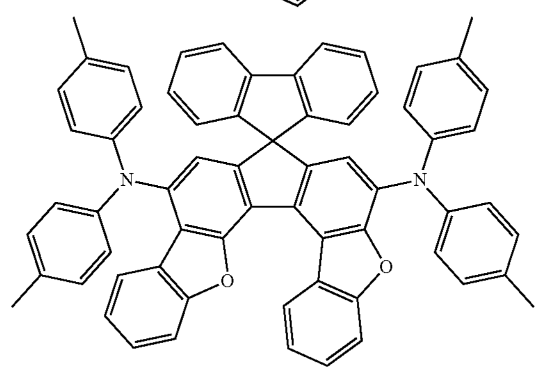
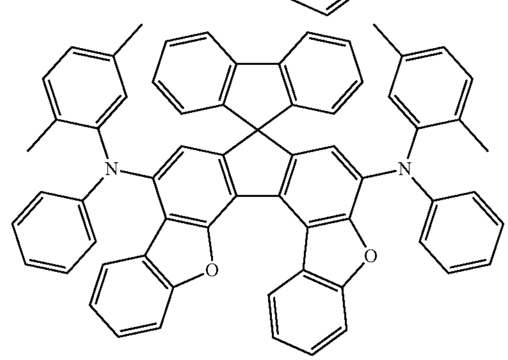

-continued
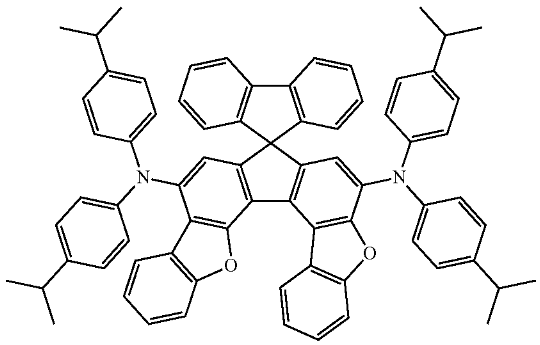
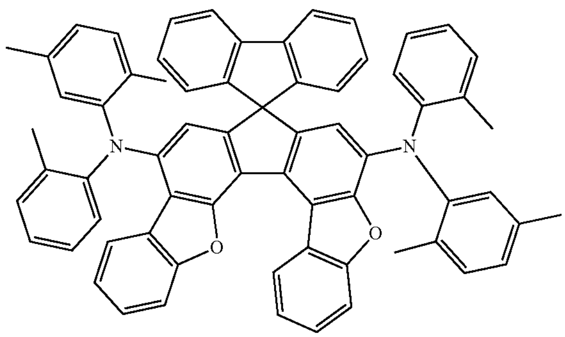
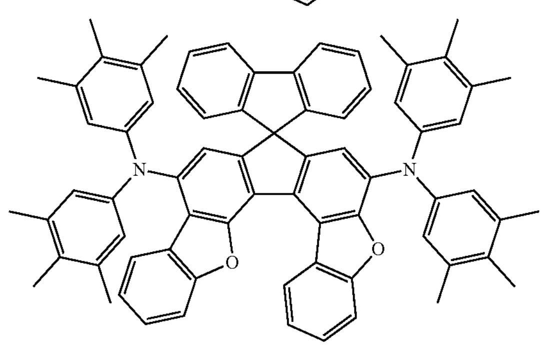
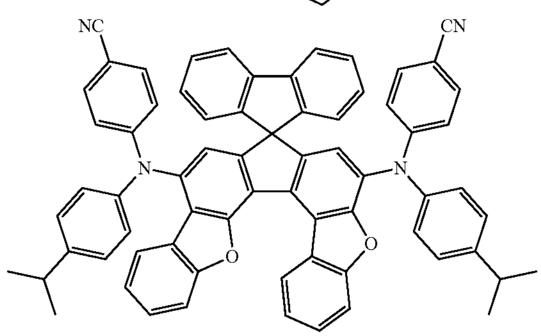
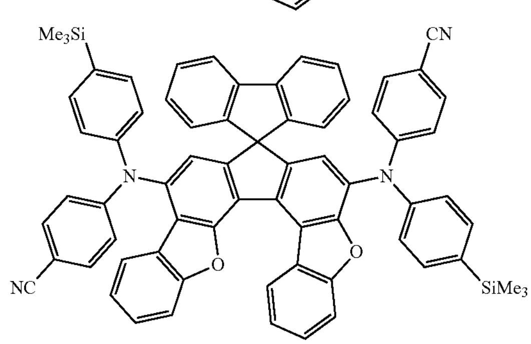
-continued
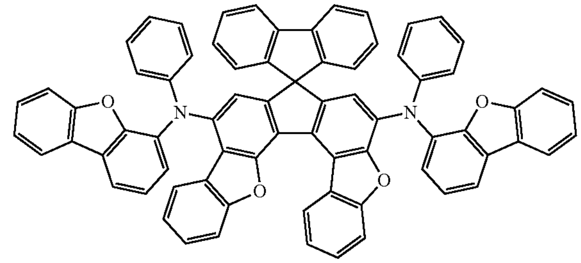
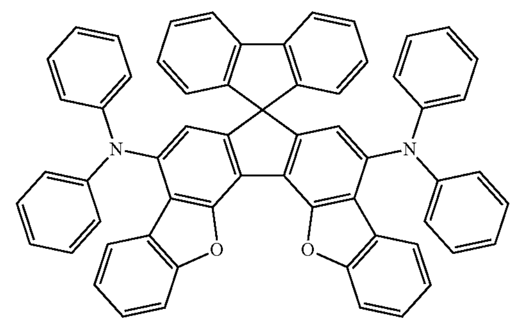
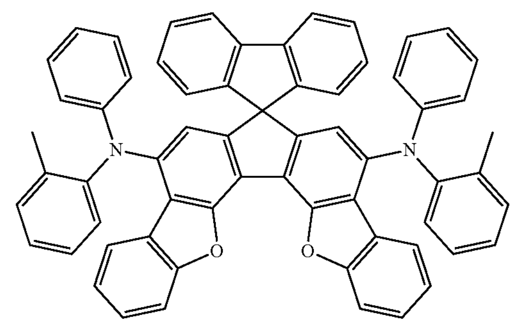
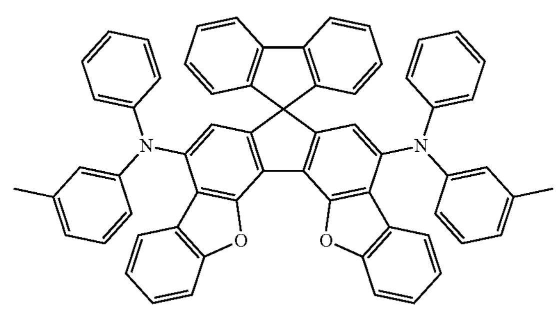
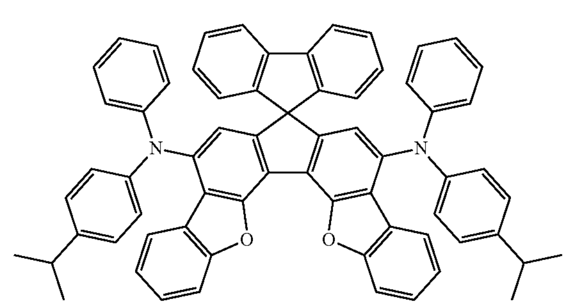

-continued

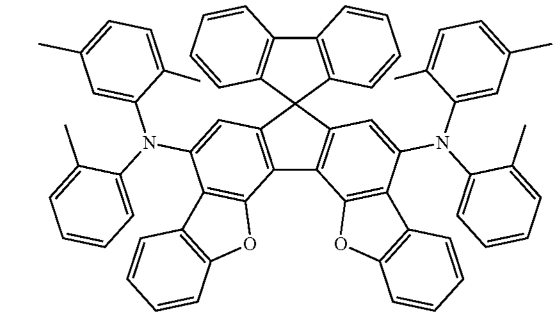

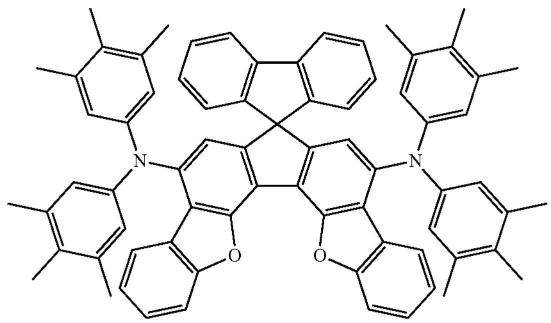

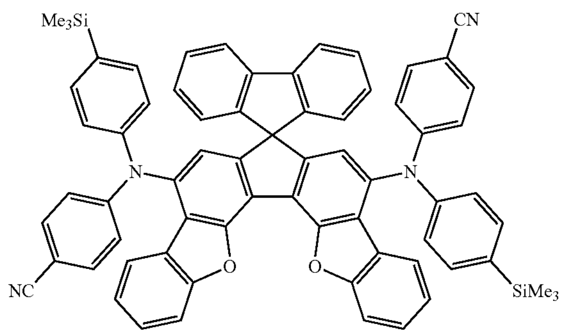

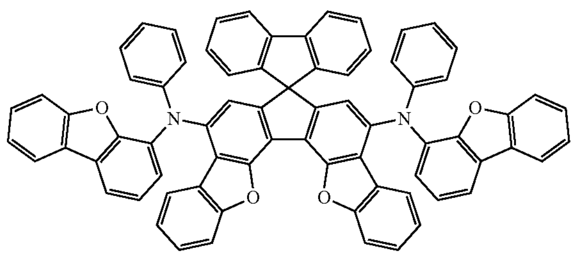

Compound Represented by Formula (81)

The compound represented by the formula (81) will be described below.

(81)

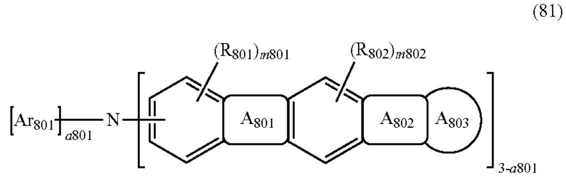

(82)

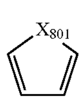

-continued (83)

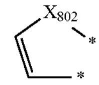

where, in the formula (81): $A_{801}$ ring is a ring represented by the formula (82) and fused at any positions of adjacent rings;

$A_{802}$ ring is a ring represented by the formula (83) and fused at any positions of adjacent rings, two bonds * of the $A_{802}$ ring being bonded to any positions of $A_{803}$ ring;

$X_{801}$ and $X_{802}$ are each independently $C(R_{803})(R_{804})$, $Si(R_{805})(R_{806})$, an oxygen atom, or a sulfur atom;

$A_{803}$ ring is a substituted or unsubstituted aromatic hydrocarbon ring having 6 to 50 ring carbon atoms or a substituted or unsubstituted heterocycle having 5 to 50 ring atoms;

$Ar_{801}$ is a substituted or unsubstituted aryl group having 6 to 50 ring carbon atoms, or a substituted or unsubstituted heterocyclic group having 5 to 50 ring atoms;

$R_{801}$ to $R_{806}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (81) to (83) respectively represent the same as $R_{901}$ to $R_{907}$ of the formula (11);

m801 and m802 are each independently 0, 1, or 2;

when m801 is 2, the two $R_{801}$ are mutually the same or different;

when m802 is 2, the two $R_{802}$ are mutually the same or different;

a801 is 0, 1, or 2;

when a801 is 0 or 1, the structures enclosed by brackets with a subscript of “3-a801” are mutually the same or different; and when m801 is 2, the two $Ar_{801}$ are mutually the same or different.

In some embodiments, $Ar_{801}$ is a substituted or unsubstituted aryl group having 6 to 50 ring carbon atoms.

In some embodiments, the ring $A_{803}$ is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In some embodiments, $R_{803}$ and $R_{804}$ are each independently a substituted or unsubstituted alkyl group having 1 to 50 carbon atoms.

In some embodiments, a801 is 1.

When a801 is 1, “3-a801” is 2.

When a801 is 2, “3-a801” is 1.

When a801 is 0, “3-a801” is 2.

Specific Examples of Compound Represented by Formula (81)

Specific examples of the compound represented by the formula (81) include compounds shown below. It should however be noted that the invention is not limited by the specific examples of the second compound.
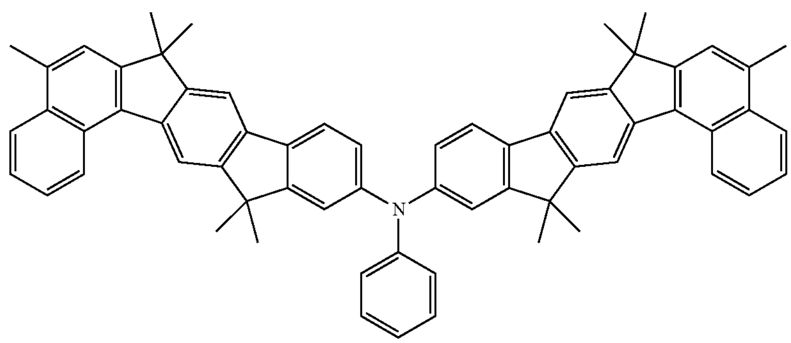
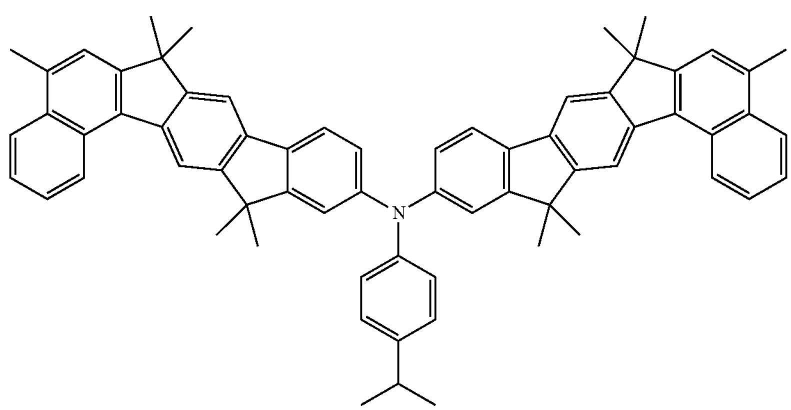
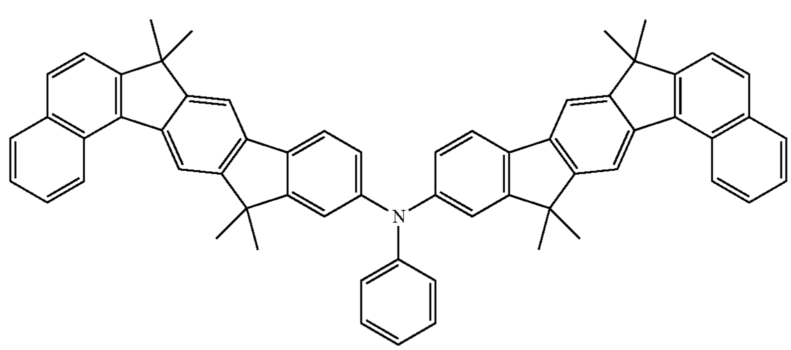
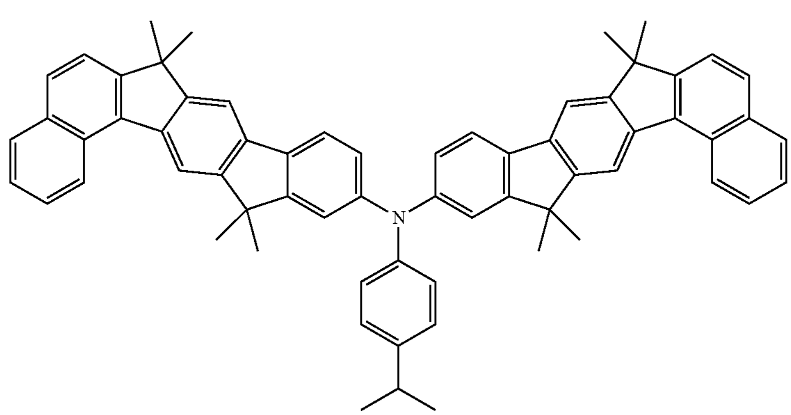

-continued
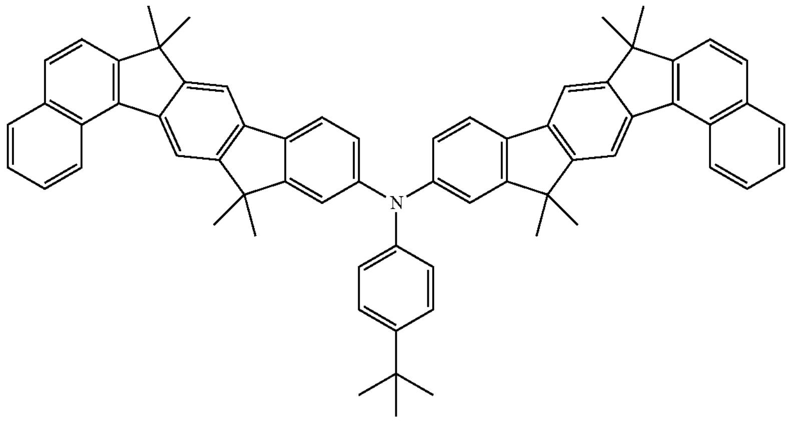
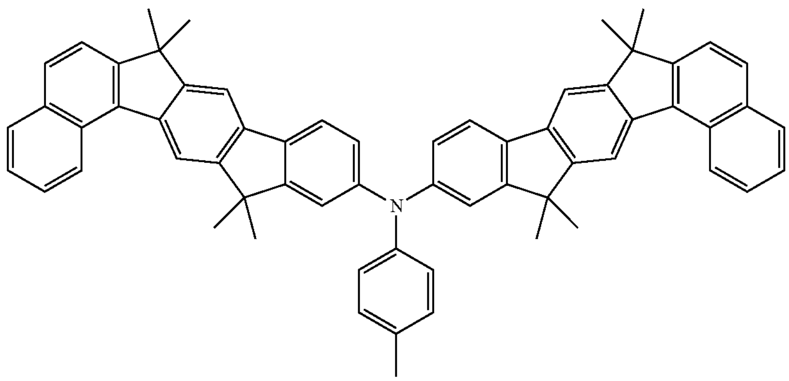 [SMILES: Cc1ccc(N(c2ccc3c(c2)[Si](C)(C)c2cc4c(cc2-3)[Si](C)(C)c2ccc3ccccc3c2-4)c2ccc3c(c2)[Si](C)(C)c2cc4c(cc2-3)[Si](C)(C)c2ccc3ccccc3c2-4)c(C)c1]
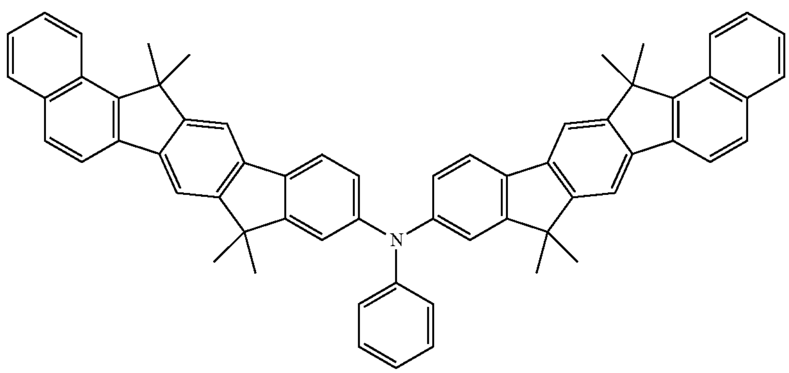
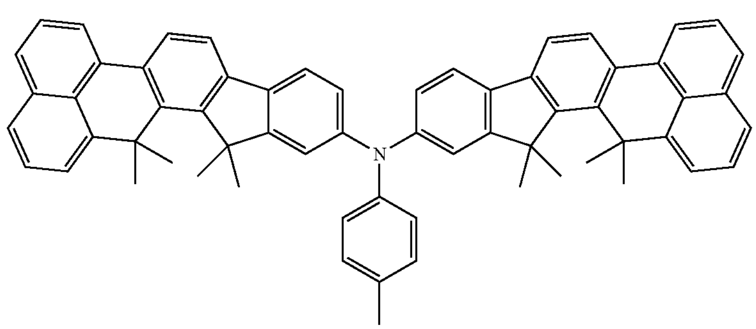

-continued

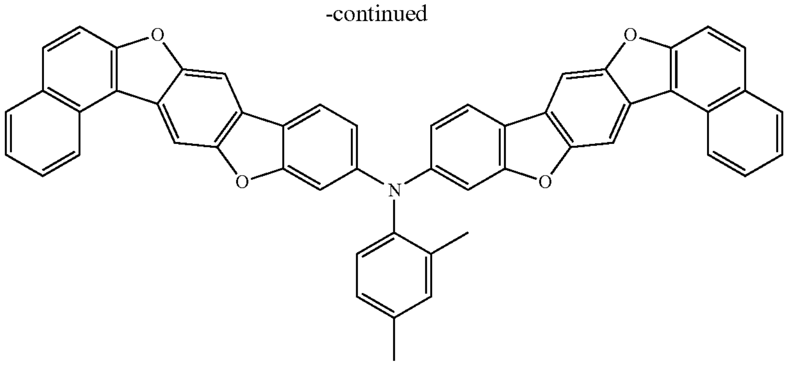

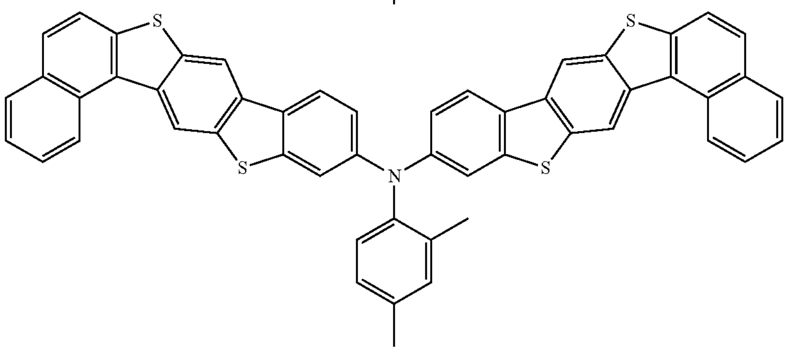

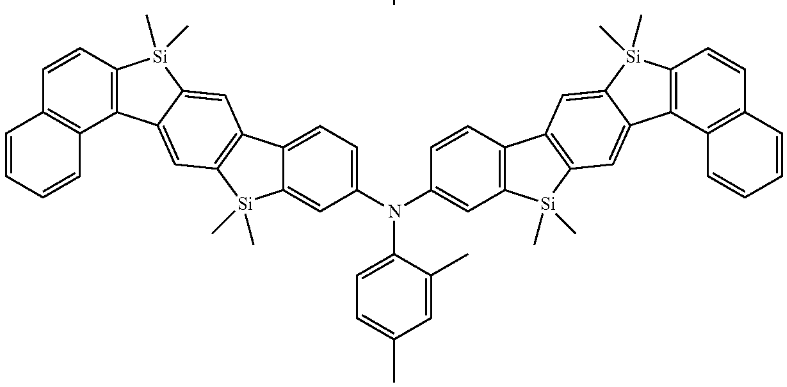

It is not necessary for the emission color of the second compound to be specifically limited. However, the emission of the second compound is preferably a fluorescence whose main peak wavelength is 550 nm or less, more preferably a fluorescence whose main peak wavelength is 480 nm or less.

The main peak wavelength refers to a peak wavelength of an emission spectrum at which the emission spectrum measured for a toluene solution dissolved with the second compound at a concentration ranging from $10^{-5}$ mol/l to $10^{-6}$ mol/l is maximized.

The second compound preferably shows blue fluorescence.

Method of Preparing Second Compound

The second compound can be prepared by a known synthesis method, by application of known substitution reactions and/or materials depending on a target compound.

Specific examples of the above groups are as defined herein under subtitle "Definitions."

The organic EL device according to an aspect of the invention, which includes the cathode, the anode, and the emitting layer between the cathode and the anode, the emitting layer containing the first compound and the at least one second compound formed of at least one selected from the group consisting of the compounds represented by the formulae (11), (21), (31), (41), (51), (61), (71), and (81) as described above, may be made of any typically known materials and have any device arrangement as long as an effect(s) of the invention is not impaired.

In an aspect of the organic EL device according the present exemplary embodiment, the emitting layer preferably contains the first compound in a form of a phosphorescent compound, and the second compound in a form of a fluorescent compound. In other words, it is preferable that the phosphorescent compound as the first compound and the fluorescent compound as the second compound are present in a common emitting layer.

In the organic EL device according the present exemplary embodiment, the emitting layer preferably contains the first compound in a form of a phosphorescent compound, and the second compound in a form of a fluorescent compound, the first and second compounds being capable of blue light emission. In other words, it is preferable that the phosphorescent compound as the first compound and the fluorescent compound as the second compound are present in a common emitting layer, the first and second compounds being capable of blue light emission.

Film Thickness of Emitting Layer

A film thickness of the emitting layer of the organic EL device in the present exemplary embodiment is preferably in a range of 5 nm to 50 nm, more preferably in a range of 7 nm to 50 nm, further preferably in a range of 10 nm to 50 nm. When the film thickness of the emitting layer is 5 nm or more, the formation of the emitting layer and adjustment of chromaticity can be easily achieved. When the film thickness of the emitting layer is 50 nm or less, an increase in the drive voltage can be easily reduced.

Content Ratio of Compound in Emitting Layer

When the emitting layer contains the first compound and the second compound, the content ratios of the first and second compounds in the emitting layer are, for instance, preferably determined as follows.

The content ratio of the first compound is preferably in a range from 1 mass % to 99.9 mass %, more preferably in a range from 1 mass % to 50 mass %, further preferably in a range from 3 mass % to 40 mass %, especially preferably in a range from 5 mass % to 30 mass %.

The content ratio of the second compound is preferably in a range from 0.1 mass % to 20 mass %, more preferably in a range from 0.1 mass % to 10 mass %, further preferably in a range from 0.5 mass % to 7.5 mass %, especially preferably in a range from 1 mass % to 5 mass %.

An upper limit of the total of the respective content ratios of the first and second compounds in the emitting layer is 100 mass %.

It should be noted that the emitting layer of the present exemplary embodiment may further contain material(s) other than the first and second compounds.

The emitting layer may include a single type of the first compound or may include two or more types of the first compound. The emitting layer may include a single type of the second compound or may include two or more types of the second compound.

Components usable for the organic EL device according to the present exemplary embodiment and materials of the layers of the organic EL device other than the above-described compounds are the same as those in the first exemplary embodiment.

Electronic Device

An electronic device according to the present exemplary embodiment is preferably installed with an organic EL device according to the present exemplary embodiment. Examples of the electronic device include a display device and a light-emitting unit.

Examples of the display device include a display component (e.g., an organic EL panel module), TV, mobile phone, tablet and personal computer. Examples of the light-emitting unit include an illuminator and a vehicle light.

The emitting layer of the organic electroluminescence device according to the present exemplary embodiment contains the above-described first compound and the second compound. Accordingly, the organic electroluminescence device according to the present exemplary embodiment exhibits enhanced device performance.

Third Exemplary Embodiment

Arrangement(s) of an organic EL device according to a third exemplary embodiment will be described below. In the description of the third exemplary embodiment, the same components as those in the first and second exemplary embodiments will be denoted by the same reference numerals and names to omit or simplify the explanation thereof. It should also be noted that the material(s) and compound(s) as those described in the first or second exemplary embodiment are usable as the material(s) and compound(s) not specifically described in the third exemplary embodiment.

The organic EL device according to the third exemplary embodiment is different from the organic EL device according to the first and second exemplary embodiments in that the emitting layer further contains a third compound. The third exemplary embodiment is the same as the first or second exemplary embodiment in other respects.

Third Compound

The third compound has a structure different from those of the first and second compounds.

A singlet energy $S_1(M3)$ of the third compound and a singlet energy $S_1(M2)$ of the second compound preferably satisfy a relationship of a numerical formula (Numerical Formula 1) below.

$$S_1(M3)>S_1(M2) \quad \text{(Numerical Formula 1)}$$

The third compound is also preferably a host material (sometimes referred to as a matrix material hereinafter). When the third compound is the host material, at least one of the first and second compounds is preferably a dopant material (sometimes referred to as a guest material, an emitter, or a luminescent material hereinafter).

The third compound is not particularly limited, but is preferably a compound other than an amine compound. Although the third compound may be a carbazole derivative, dibenzofuran derivative, or dibenzothiophene derivative, the third compound is not limited thereto.

It is also preferable that the third compound is a compound having at least one of partial structures represented by formulae (31) and (32) below in one molecule.

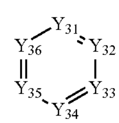

(31)

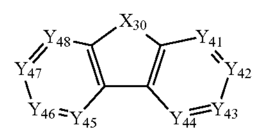

(32)

In the formula (31), $Y_{31}$ to $Y_{36}$ each independently represent a nitrogen atom or a carbon atom bonded to another atom in the molecule of the third compound, and at least one of $Y_{31}$ to $Y_{36}$ is a carbon atom bonded to another atom in the molecule of the third compound.

In the formula (32), $Y_{41}$ to $Y_{48}$ each independently represent a nitrogen atom or a carbon atom bonded to another atom in the molecule of the third compound, and at least one of $Y_{41}$ to $Y_{48}$ is a carbon atom bonded to another atom in the molecule of the third compound.

$X_{30}$ is a nitrogen atom, an oxygen atom or a sulfur atom.

In the formula (32), it is also preferable that at least two of $Y_{41}$ to $Y_{48}$ are carbon atoms bonded to other atoms in the molecule of the third compound to form a cyclic structure including the carbon atoms.

For instance, the partial structure represented by the formula (32) is preferably any one selected from the group consisting of partial structures represented by formulae (321), (322), (323), (324), (325) and (326).

(321)

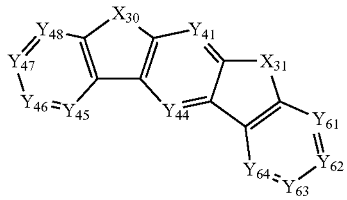

(322)

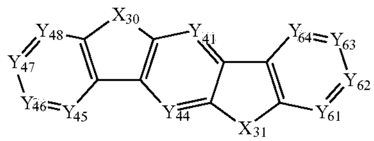

(323)

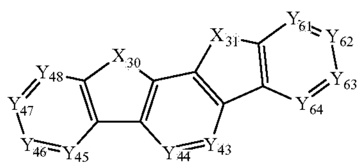

(324)

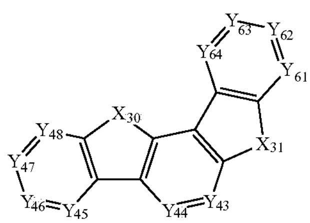

(325)

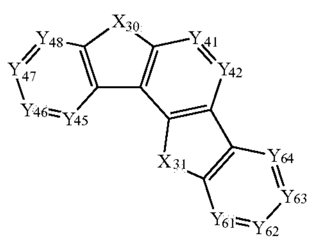

(326)

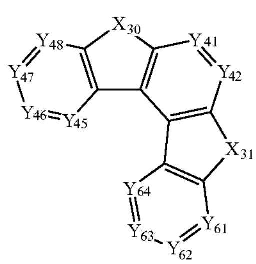

In the formulae (321) to (326), $X_{30}$ is each independently a nitrogen atom, an oxygen atom or a sulfur atom;

$Y_{41}$ to $Y_{48}$ each independently represent a nitrogen atom or a carbon atom bonded to another atom in the molecule of the third compound, $X_{31}$ is each independently a nitrogen atom, an oxygen atom or a sulfur atom; and $Y_{61}$ to $Y_{64}$ each independently represent a nitrogen atom or a carbon atom bonded to another atom in the molecule of the third compound.

In the exemplary embodiments, the third compound preferably has the partial structure represented by the formula (323) among those represented by the formulae (323) to (326).

The partial structure represented by the formula (31) is preferably included in the third compound as at least one group selected from the group consisting of a group represented by a formula (33) and a group represented by a formula (34) below.

It is also preferable that the third compound has at least one of the partial structures represented by the formulae (33) and (34). Since the bonding positions are situated in meta positions as shown in the partial structures represented by the formulae (33) and (34), an energy gap $T_{77K}(M3)$ at 77 [K] of the third compound can be kept high.

(33)

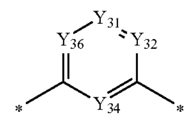

(34)

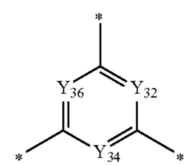

In the formula (33), $Y_{31}$, $Y_{32}$, $Y_{34}$ and $Y_{36}$ are each independently a nitrogen atom or $CR_{31}$.

In the formula (34), $Y_{32}$, $Y_{34}$ and $Y_{36}$ are each independently a nitrogen atom or $CR_{31}$.

In the formulae (33) and (34): $R_{31}$ is each independently a hydrogen atom or a substituent;

$R_{31}$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

The substituted or unsubstituted aryl group having 6 to 30 ring carbon atoms for $R_{31}$ is preferably a non-fused ring.

The mark * in the formulae (33) and (34) shows a bonding position with another atom or another structure in the molecule of the third compound.

In the formula (33), $Y_{31}$, $Y_{32}$, $Y_{34}$ and $Y_{36}$ are each independently preferably $CR_{31}$, in which a plurality of $R_{31}$ are mutually the same or different.

In the formula (34), $Y_{32}$, $Y_{34}$ and $Y_{36}$ are each independently preferably $CR_{31}$, in which a plurality of $R_{31}$ are mutually the same or different.

The substituted germanium group is preferably represented by $—Ge(R_{301})_3$. $R_{301}$ is each independently a substituent. The substituent $R_{301}$ is preferably a substituted or unsubstituted alkyl group having 1 to 30 carbon atoms or a substituted or unsubstituted aryl group having 6 to 30 ring carbon atoms. A plurality of $R_{301}$ are mutually the same or different.

The partial structure represented by the formula (32) is preferably included in the third compound as at least one group selected from the group consisting of groups represented by formulae (35) to (39) and a group represented by a formula (30a).

(35)

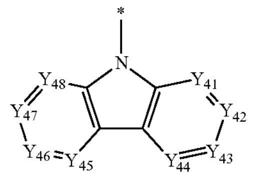

(36)

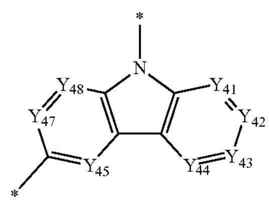

(37)

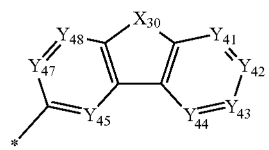

(38)

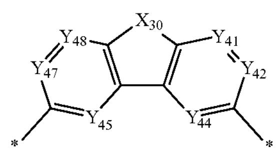

(39)

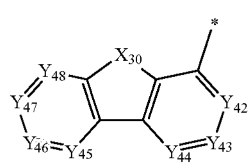

(30a)

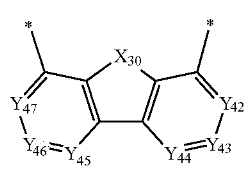

In the formula (35), $Y_{41}$ to $Y_{48}$ are each independently a nitrogen atom or $CR_{32}$.

In the formulae (36) and (37), $Y_{41}$ to $Y_{45}$, $Y_{47}$ and $Y_{48}$ are each independently a nitrogen atom or $CR_{32}$.

In the formula (38), $Y_{41}$, $Y_{42}$, $Y_{44}$, $Y_{45}$, $Y_{47}$ and $Y_{48}$ are each independently a nitrogen atom or $CR_{32}$.

In the formula (39), $Y_{42}$ to $Y_{48}$ are each independently a nitrogen atom or $CR_{32}$.

In the formula (30a), $Y_{42}$ to $Y_{47}$ are each independently a nitrogen atom or $CR_{32}$.

In the formulae (35) to (39) and (30a), $R_{32}$ is each independently a hydrogen atom or a substituent;

$R_{32}$ as the substituent is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group A plurality of $R_{32}$ are mutually the same or different.

In the formulae (37) to (39) and (30a): $X_{30}$ is $NR_{33}$, an oxygen atom, or a sulfur atom;

$R_{33}$ is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a fluorine atom, a cyano group, a nitro group, and a substituted or unsubstituted carboxy group.

A plurality of $R_{33}$ are mutually the same or different.

The substituted or unsubstituted aryl group having 6 to 30 ring carbon atoms for $R_{33}$ is preferably a non-fused ring.

The mark * in the formulae (35) to (39) and (30a) shows a bonding position with another atom or another structure in the molecule of the third compound.

In the formula (35), $Y_{41}$ to $Y_{48}$ are each independently preferably $CR_{32}$. In the formulae (36) and (37), $Y_{41}$ to $Y_{45}$, $Y_{47}$ and $Y_{48}$ are each independently preferably $CR_{32}$. In the formula (38), $Y_{41}$, $Y_{42}$, $Y_{44}$, $Y_{45}$, $Y_{47}$ and $Y_{48}$ are each independently preferably $CR_{32}$. In the formula (39), $Y_{42}$ to $Y_{48}$ are each independently preferably $CR_{32}$. In the formula (30a), $Y_{42}$ to $Y_{47}$ are each independently preferably $CR_{32}$. A plurality of $R_{32}$ are mutually the same or different.

In the third compound, $X_{30}$ is preferably an oxygen atom or a sulfur atom, more preferably an oxygen atom.

In the third compound, $R_{31}$ and $R_{32}$ each independently represent a hydrogen atom or a substituent. $R_{31}$ and $R_{32}$ as the substituents are preferably each independently a group selected from the group consisting of a fluorine atom, a cyano group, a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms. $R_{31}$ and $R_{32}$ are more preferably a hydrogen atom, a cyano group, a substituted or unsubstituted aryl group having 6 to 30 ring carbon atoms, or a substituted or unsubstituted heteroaryl group having 5 to 30 ring atoms. When $R_{31}$ and $R_{32}$ as the substituents are each a substituted or unsubstituted aryl group having 6 to 30 ring carbon atoms, the aryl group is preferably a non-fused ring.

It is also preferable that the third compound is an aromatic hydrocarbon compound or an aromatic heterocyclic compound. Further, the third compound preferably includes no fused aromatic hydrocarbon ring in the molecule thereof.

Method of Preparing Third Compound

The third compound can be prepared by methods disclosed in International Publication No. WO2012/153780, International Publication No. WO2013/038650, and the like. Furthermore, the second compound can be prepared, for instance, by application of known substitution reactions and/or materials depending on a target compound.

Examples of the substituent in the third compound are shown below, but the invention is not limited thereto.

Specific examples of the aryl group (occasionally referred to as an aromatic hydrocarbon group) include a phenyl group, tolyl group, xylyl group, naphthyl group, phenanthryl group, pyrenyl group, chrysenyl group, benzo[c]phenanthryl group, benzo[g]chrysenyl group, benzanthryl group, triphenylenyl group, fluorenyl group, 9,9-dimethylfluorenyl group, benzofluorenyl group, dibenzofluorenyl group, biphenyl group, terphenyl group, quaterphenyl group and fluoranthenyl group, among which a phenyl group, biphenyl group, terphenyl group, quaterphenyl group, naphthyl group, triphenylenyl group and fluorenyl group may be preferable.

Specific examples of the aryl group having a substituent include a tolyl group, xylyl group and 9,9-dimethylfluorenyl group.

As is understood from the specific examples, the aryl group includes both fused aryl group and non-fused aryl group.

Preferable examples of the aryl group include a phenyl group, biphenyl group, terphenyl group, quaterphenyl group, naphthyl group, triphenylenyl group and fluorenyl group.

Specific examples of the heteroaryl group (occasionally referred to as a heterocyclic group, heteroaromatic ring group or aromatic heterocyclic group) include a pyrrolyl group, pyrazolyl group, pyrazinyl group, pyrimidinyl group, pyridazinyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thienyl group, benzothienyl group, dibenzothienyl group, azadibenzothienyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothienyl group, carbazolyl group, pyridyl group, pyrimidinyl group, triazinyl group, azadibenzofuranyl group and azadibenzothienyl group may be preferable.

The heteroaryl group is preferably selected from a dibenzofuranyl group, dibenzothienyl group, carbazolyl group, pyridyl group, pyrimidinyl group, triazinyl group, azadibenzofuranyl group and azadibenzothienyl group, and more preferably a dibenzofuranyl group, dibenzothienyl group, azadibenzofuranyl group and azadibenzothienyl group.

In the third compound, it is also preferable that the substituted silyl group is selected from the group consisting of a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyldimethylsilyl group.

Specific examples of the substituted or unsubstituted triarylsilyl group include triphenylsilyl group and tritolylsilyl group.

In the third compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

In the third compound, the substituted carboxy group is exemplified by a benzoyloxy group.

The substituent for the third compound not defined so far is exemplified by the substituent defined for the first compound. Herein, the term "exemplified" means that preferable number of carbon atoms/number of atoms, specific examples, preferable specific examples and the like of the substituent for the third compound are as defined for the substituent for the first compound.

In the third compound, the substituent meant by "substituted or unsubstituted" is exemplified by the description for the term "substituted or unsubstituted" for the first compound.

Relationship Between First Compound, Second Compound and Third Compound in Emitting Layer The energy gap $T_{77K}$(M3) at 77 [K] of the third compound is preferably larger than the energy gap $T_{77K}$(M2) at 77 [K] of the second compound. In other words, a relationship of the following numerical formula (Numerical Formula 2) is preferably satisfied.

$$T_{77K}(M3) > T_{77K}(M2) \quad \text{(Numerical Formula 2)}$$

When the organic EL device of the present exemplary embodiment emits light, it is preferable that the second compound in the emitting layer mainly emits light.

Content Ratio of Compounds in Emitting Layer

The content ratio of the third compound is preferably in a range from 50 mass % to 99 mass %, and the content ratio of the total of the first and second compounds is preferably in a range from 1 mass % to 50 mass %.

When the third compound is contained, an upper limit of the total of the content ratios of the first, second and third compounds in the emitting layer is 100 mass %. It should be noted that the emitting layer of the present exemplary embodiment may further contain material(s) other than the first, second and third compounds.

The emitting layer of the organic electroluminescence device according to the present exemplary embodiment contains the above-described first compound, second compound, and third compound in the emitting layer. Accordingly, the organic electroluminescence device according to the present exemplary embodiment exhibits enhanced device performance.

The organic EL device according to the third exemplary embodiment is applicable to an electronic device such as a display device and a light-emitting device as in the organic EL devices according to the first and second exemplary embodiments.

Modification of Embodiment(s)

It should be noted that the scope of the invention is not limited to the above-described exemplary embodiment(s). The scope of the invention includes any modification and improvement as long as such modification and improvement are compatible with the invention.

The emitting layer is not limited to a single layer, but may be provided by laminating a plurality of emitting layers. When the organic EL device includes a plurality of emitting layers, it is only necessary that at least one of the emitting layers contains the first and second compounds, where the rest of the emitting layers is a fluorescent emitting layer or a phosphorescent emitting layer with use of emission caused by electron transfer from the triplet excited state directly to the ground state, in some embodiments.

When the organic EL device includes the plurality of emitting layers, the plurality of emitting layers may be adjacent to each other, or provide a so-called tandem-type organic EL device in which a plurality of emitting units are layered through an intermediate layer.

For instance, in some embodiments, a blocking layer is provided adjacent to a side near the anode and/or a side near the cathode of the emitting layer. The blocking layer is preferably provided in contact with the emitting layer to block at least any of holes, electrons, excitons and exciplexes.

For instance, when the blocking layer is provided in contact with the cathode-side of the emitting layer, the blocking layer permits transport of electrons, but blocks holes from reaching a layer provided near the cathode (e.g., the electron transporting layer) beyond the blocking layer.

When the blocking layer is provided in contact with the anode-side of the emitting layer, the blocking layer permits transport of holes, but blocks electrons from reaching a layer provided near the anode (e.g., the hole transporting layer) beyond the blocking layer.

Moreover, the blocking layer may abut on the emitting layer so that excited energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer and the blocking layer are preferably bonded with each other.

Specific structure and shape of the components in the invention may be designed in any manner as long as the object of the invention can be achieved.

EXAMPLES

Example(s) of the invention will be described below. However, the invention is not limited to Example(s).

Compounds

The first compounds used in later-described Examples 1 to 15 are shown below.

PD-1

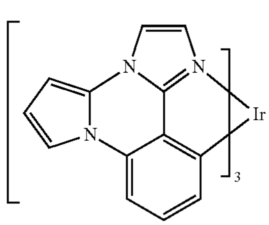

-continued

PD-2

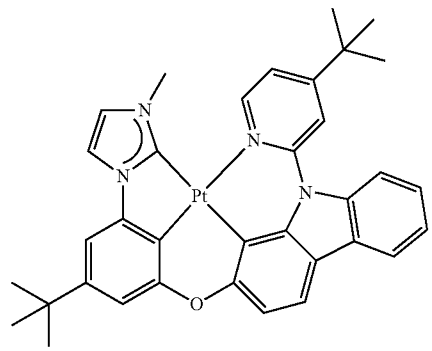

PD-3

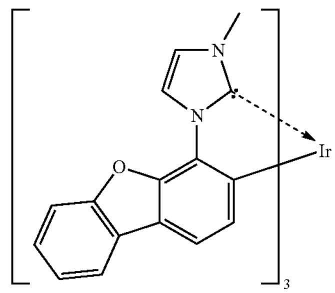

The second compound used in Examples 1 to 15 below, which are compounds represented by the formula (11), the formula (21), the formula (31), the formula (41), the formula (51), the formula (61), the formula (71) and the formula (81) below, are shown below.

FD-1

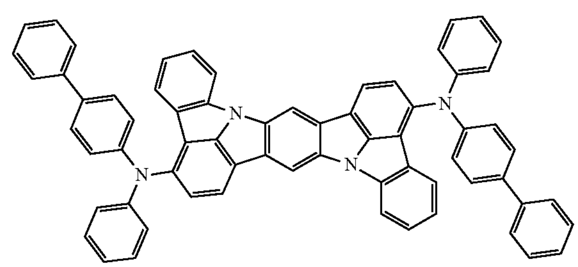

FD-2

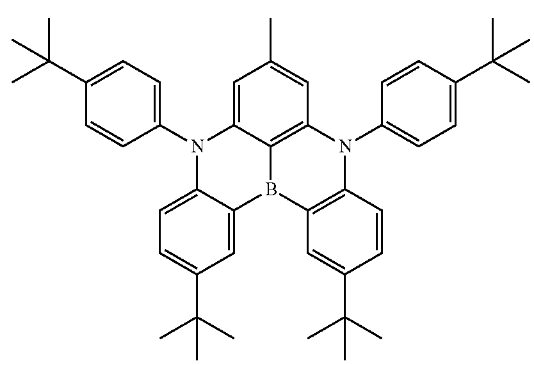

FD-3
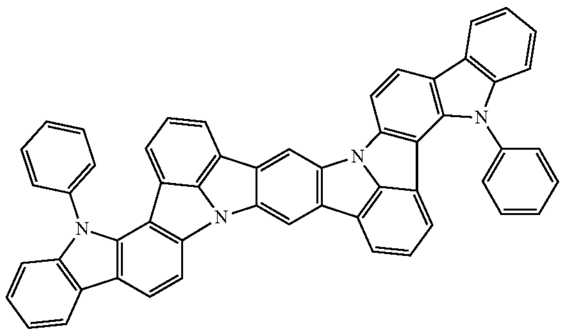
FD-5
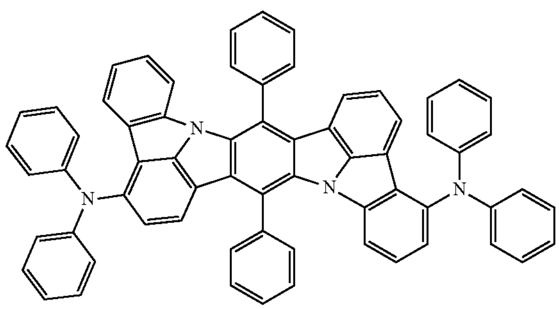
FD-6
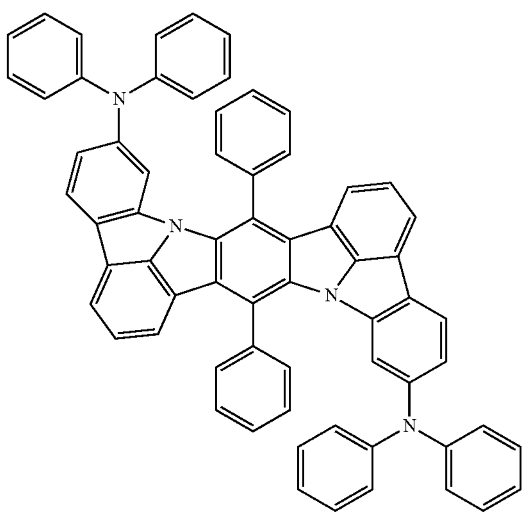
The third compounds used in Examples 1 to 15 below are shown below.
Host-1
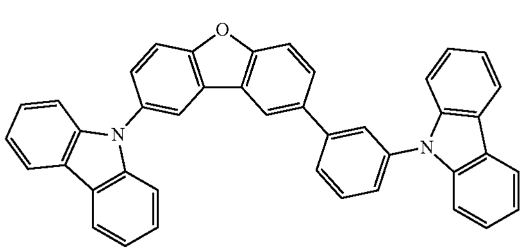
Host-2
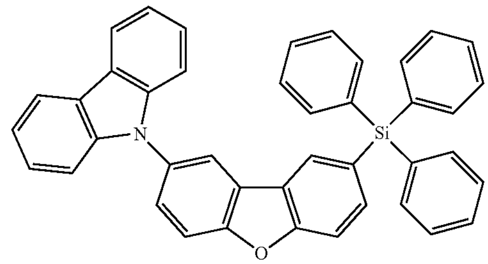
Host-3
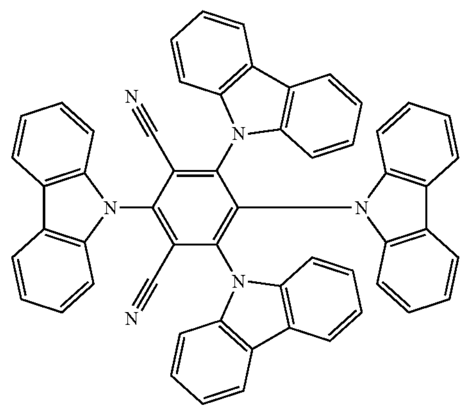
Structures of other compounds used for production of the organic EL devices according to Examples 1 to 15 and Comparatives 1 to 15 are shown below.
HT1
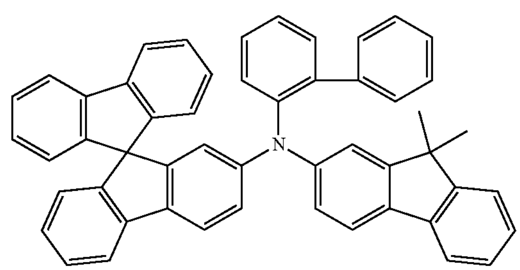
P-dope
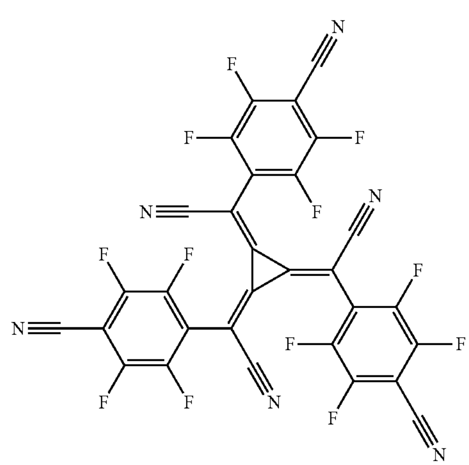

-continued

HT2

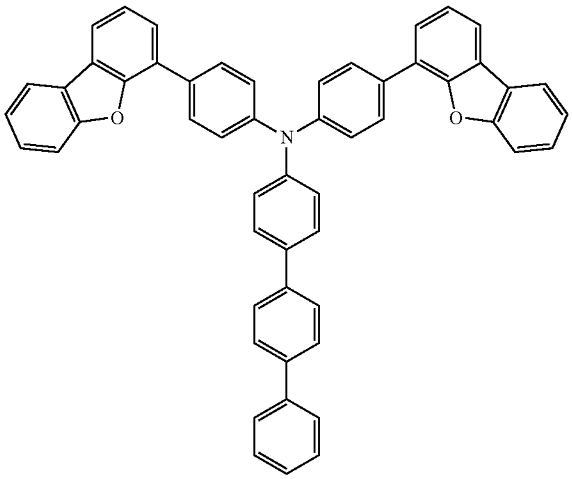

ET1

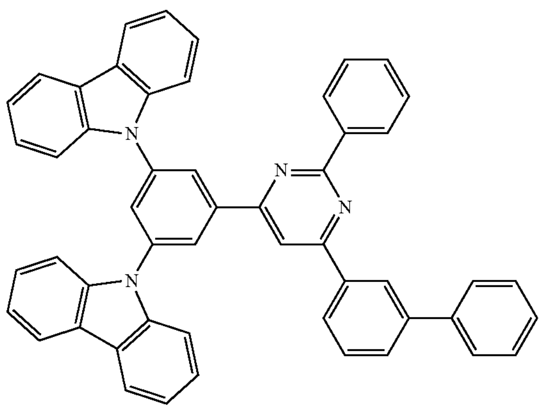

ET2

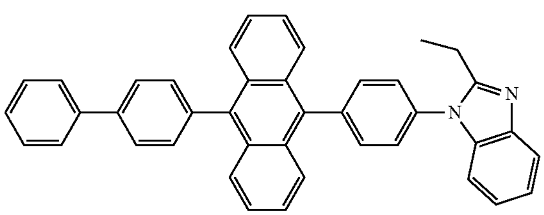

Host-4

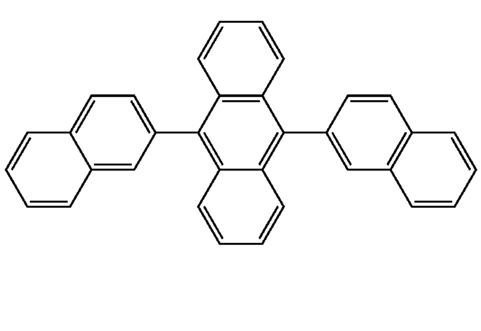

-continued

FD-4

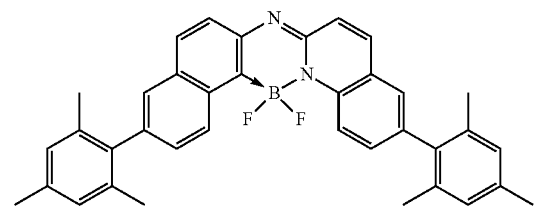

Preparation of Organic EL Device

The organic EL devices were prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 5 minutes. A film of ITO was 130 nm thick.

The cleaned glass substrate having the transparent electrode was attached to a substrate holder of a vacuum deposition apparatus. Initially, the compound HT1 and the compound P-dope were co-deposited on a surface provided with the transparent electrode to cover the transparent electrode, thereby forming a 10-nm-thick film. The content of the compound HT1 in the film was 97 mass %, and the content of the compound P-dope was 3 mass %. This film serves as a hole injecting layer.

Subsequently to the formation of the hole injecting layer, the compound HT1 was vapor-deposited to form a 80-nm-thick HT1 film. The HT1 film serves as a hole transporting layer (first hole transporting layer).

Subsequently to the formation of the HT1 film, a compound HT2 was vapor-deposited to form a 10-nm-thick HT2 film on the HT1 film. The HT2 film serves as an electron blocking layer (second hole transporting layer).

The compound Host-1 as the third compound (host material), the compound PD-1 as the first compound (dopant material), and FD-1 as the second compound (dopant material) were co-deposited on the HT2 film to form a 25-nm-thick Host-1:PD-1:FD-1 film. The compounds were co-deposited so that the content of the compound Host-1 was 74 mass %, the content of the compound PD-1 was 25 mass %, and the content of the compound FD-1 was 1 mass % in the film. This film serves as the emitting layer.

The compound ET1 was vapor-deposited on the emitting layer to form a 10-nm-thick ET1 film. The ET1 film serves as a hole blocking layer.

A compound ET2 was vapor-deposited on the ET1 film to form a 15-nm-thick ET2 film. The ET2 film serves as an electron transporting layer.

LiF was vapor-deposited on the ET2 film to form a 1-nm-thick LiF film.

Metal Al was vapor-deposited on the LiF film to form an 80-nm-thick metal cathode to prepare an organic EL device.

A device arrangement of the organic EL device in Example 1 is roughly shown as follows.

ITO(130)/HT1:P-dope(10,97%:3%)/HT1(80)/HT2 (10)/Host-1: PD-1:FD-1(25,74%:25%: 1%)/ET1 (10)/ET2(15)/LiF(1)/Al(80)

The numerals in parentheses each indicate a film thickness (unit: nm).

The numerals represented by percentage in the same parentheses (97%:3%) each indicate a ratio (mass %) of the compound HT1 and the compound P-dope in the hole injecting layer, and numerals represented by percentage in the same parentheses (74%:25%:1%) each indicate a ratio (mass %) of the compound Host-1, the compound PD-1, and the compound FD-1 in the emitting layer. Similar notations apply to the description below.

Examples 2-15

The organic EL devices in Examples 2-15 were prepared in the same manner as in Example 1 except that the first, second and third compounds in the emitting layer of the organic EL device in Example 1 were exchanged to compounds listed in Table 1.

Comparatives 1 to 15

The organic EL devices in Comparatives 1-15 were prepared in the same manner as in Example 1 except that the first, second and third compounds in the emitting layer of the organic EL device in Example 1 were exchanged to compounds listed in Table 1, or either the second compound or the third compound was not contained in the emitting layer. In the organic EL devices according to Comparatives 1 to 10 and 14, the content of the third compound was 98 mass % and the content of the second compound was 2 mass % in the emitting layer. In the organic EL devices according to Comparatives 11 to 13, the content of the third compound was 95 mass % and the content of the first compound was 5 mass % in the emitting layer. In the organic EL device according to Comparative 15, the content of the third compound was 74 mass %, the content of the first compound in the emitting layer was 25 mass %, and the content of the second compound was 1 mass %.

Evaluation of Organic EL Device

The organic EL devices prepared in Examples 1 to 15 and Comparatives 1 to 15 were evaluated in terms of the items below. Evaluation results are shown in Table 1.

EQE Ratio

Voltage was applied on the organic EL devices such that a current density was 10 mA/cm$^2$, where spectral radiance spectrum was measured by a spectroradiometer (CS-2000 manufactured by Konica Minolta, Inc.). The external quantum efficiency EQE (unit: %) was calculated based on the obtained spectral-radiance spectra, assuming that the spectra was provided under a Lambertian radiation.

The EQE ratios of Examples 1 to 3 and Comparatives 1 to 2 are relative values of the external quantum efficiency EQE of the organic EL devices of Examples and Comparatives to the external quantum efficiency EQE of the organic EL device according to Comparative 2, assuming that the external quantum efficiency EQE of the organic EL device according to Comparative 2 is 1.00.

The EQE ratios of Examples 4 to 6 and Comparatives 3 to 4 are relative values of the external quantum efficiency EQE of the organic EL devices of Examples and Comparatives to the external quantum efficiency EQE of the organic EL device according to Comparative 4, assuming that the external quantum efficiency EQE of the organic EL device according to Comparative 4 is 1.00.

The EQE ratios of Examples 7 to 9 and Comparatives 5 to 6 are relative values of the external quantum efficiency EQE of the organic EL devices of Examples and Comparatives to the external quantum efficiency EQE of the organic EL device according to Comparative 6, assuming that the external quantum efficiency EQE of the organic EL device according to Comparative 6 is 1.00.

The EQE ratios of Examples 10 to 12 and Comparatives 7 to 8 are relative values of the external quantum efficiency EQE of the organic EL devices of Examples and Comparatives to the external quantum efficiency EQE of the organic EL device according to Comparative 8, assuming that the external quantum efficiency EQE of the organic EL device according to Comparative 8 is 1.00.

The EQE ratios of Examples 13 to 15 and Comparatives 9 to 10 are relative values of the external quantum efficiency EQE of the organic EL devices of Examples and Comparatives to the external quantum efficiency EQE of the organic EL device according to Comparative 10, assuming that the external quantum efficiency EQE of the organic EL device according to Comparative 10 is 1.00.

The EQE ratios of Comparatives 11 to 13 are relative values of the external quantum efficiency EQE of the organic EL devices of Comparatives to the external quantum efficiency EQE of the organic EL device according to Comparative 2, assuming that the external quantum efficiency EQE of the organic EL device according to Comparative 2 is 1.00.

The EQE ratios of Comparatives 14 to 15 are relative values of the external quantum efficiency EQE of the organic EL devices of Comparatives to the external quantum efficiency EQE of the organic EL device according to Comparative 15, assuming that the external quantum efficiency EQE of the organic EL device according to Comparative 15 is 1.00.

LT Ratio

Voltage was applied on the resultant organic EL devices such that a current density was 50 mA/cm$^2$, where a time (LT95 (unit: hr)) elapsed before a luminance intensity was reduced to 95% of the initial luminance intensity was measured.

The LT ratios of Examples 1 to 3 and Comparatives 1 to 2 are relative values of LT95 of the organic EL devices of Examples and Comparatives to LT95 of the organic EL device according to Comparative 2, assuming that LT95 of the organic EL device according to Comparative 2 is 1.00.

The LT ratios of Examples 4 to 6 and Comparatives 3 to 4 are relative values of LT95 of the organic EL devices of Examples and Comparatives to LT95 of the organic EL device according to Comparative 4, assuming that LT95 of the organic EL device according to Comparative 4 is 1.00.

The LT ratios of Examples 7 to 9 and Comparatives 5 to 6 are relative values of LT95 of the organic EL devices of Examples and Comparatives to LT95 of the organic EL device according to Comparative 6, assuming that LT95 of the organic EL device according to Comparative 6 is 1.00.

The LT ratios of Examples 10 to 12 and Comparatives 7 to 8 are relative values of LT95 of the organic EL devices of Examples and Comparatives to LT95 of the organic EL device according to Comparative 8, assuming that LT95 of the organic EL device according to Comparative 8 is 1.00.

The LT ratios of Examples 13 to 15 and Comparatives 9 to 10 are relative values of LT95 of the organic EL devices of Examples and Comparatives to LT95 of the organic EL device according to Comparative 10, assuming that LT95 of the organic EL device according to Comparative 10 is 1.00.

The LT ratios of Comparatives 11 to 13 are relative values of LT95 of the organic EL devices of Comparatives to LT95 of the organic EL device according to Comparative 2, assuming that LT95 of the organic EL device according to Comparative 2 is 1.00.

The LT ratios of Comparatives 14 to 15 are relative values of LT95 of the organic EL devices of Comparatives to LT95 of the organic EL device according to Comparative 15, assuming that LT95 of the organic EL device according to Comparative 15 is 1.00.

Δ Half Bandwidth

The measurement method of the Δ half bandwidth is as follows.

A quartz substrate (size: 20 mm×10 mm×1 mm thick) was ultrasonic-cleaned in isopropyl alcohol for five minutes, and then UV/ozone-cleaned for 30 minutes.

After the cleaned quartz substrate was attached to a substrate holder of a vacuum deposition apparatus, the third compound, the first compound and the second compound, which were used for the formation of the emitting layer of the organic EL devices according to Examples and Comparatives, were co-deposited at a ratio of 73 mass %:25 mass %:2 mass %, respectively, thereby forming a 50-nm-thick film Samples for measuring the half bandwidth were thus prepared, and fluorescence spectrum of each of the samples for measuring the half bandwidth was measured. A spectrophotofluorometer F-7000 manufactured by Hitachi High-Tech Science Corporation was used for the fluorescence spectrum measurement.

The half bandwidth (FWHM) was calculated by measuring a width of the wavelength of the measured fluorescence spectrum, at which the intensity of the fluorescence spectrum was half of the peak wavelength of the fluorescence spectrum. The calculated half bandwidth will be referred to as the half bandwidth (unit: nm) of each of Examples or Comparatives.

The Δhalf bandwidths of Examples 1 to 3 and Comparatives 1 to 2 were calculated by dividing the value of the half bandwidth of each of Examples and Comparatives by the value of the half bandwidth of Comparative 2.

The Δhalf bandwidths of Examples 4 to 6 and Comparatives 3 to 4 were calculated by dividing the value of the half bandwidth of each of Examples and Comparatives by the value of the half bandwidth of Comparative 4.

The Δhalf bandwidths of Examples 7 to 9 and Comparatives 5 to 6 were calculated by dividing the value of the half bandwidth of each of Examples and Comparatives by the value of the half bandwidth of Comparative 6.

The Δhalf bandwidths of Examples 10 to 12 and Comparatives 7 to 8 were calculated by dividing the value of the half bandwidth of each of Examples and Comparatives by the value of the half bandwidth of Comparative 8.

The Δhalf bandwidths of Examples 13 to 15 and Comparatives 9 to 10 were calculated by dividing the value of the half bandwidth of each of Examples and Comparatives by the value of the half bandwidth of Comparative 10.

The Δhalf bandwidths of Comparatives 11 to 13 were calculated by dividing the value of the half bandwidth of each of Examples and Comparatives by the value of the half bandwidth of Comparative 13.

The Δhalf bandwidths of Comparatives 14 to 15 were calculated by dividing the value of the half bandwidth of each of Examples and Comparatives by the value of the half bandwidth of Comparative 15.

TABLE 1

| | 2nd Compound | | | | | | | | | |
|---|---|---|---|---|---|---|---|---|---|---|
| | Type | Half Bandwidth [nm] | Ip [eV] | SI [eV] | Peak Top [nm] | 1st Compound | 3rd Compound | EQE Ratio | LT Ratio | ∠Half Bandwidth |
| Ex. 1 | FD-1 | 20 | 5.4 | 2.7 | 452 | PD-1 | Host-1 | 1.43 | 0.65 | 4.00 |
| Ex. 2 | FD-1 | 20 | 5.4 | 2.7 | 452 | PD-2 | Host-3 | 1.74 | 0.65 | 4.00 |
| Ex. 3 | FD-1 | 20 | 5.4 | 2.7 | 452 | PD-3 | Host-2 | 1.36 | 0.75 | 5.00 |
| Comp. 1 | FD-1 | 20 | 5.4 | 2.7 | 452 | — | Host-1 | 0.43 | 0.02 | 0.00 |
| Comp. 2 | FD-1 | 20 | 5.4 | 2.7 | 452 | — | Host-4 | 1.00 | 1.00 | 0.00 |
| Ex. 4 | FD-2 | 23 | 5.3 | 2.7 | 455 | PD-1 | Host-2 | 1.44 | 0.60 | 4.00 |
| Ex. 5 | FD-2 | 23 | 5.3 | 2.7 | 455 | PD-2 | Host-1 | 1.78 | 0.60 | 4.00 |
| Ex. 6 | FD-2 | 23 | 5.3 | 2.7 | 455 | PD-3 | Host-3 | 1.40 | 0.60 | 7.00 |
| Comp. 3 | FD-2 | 23 | 5.3 | 2.7 | 455 | — | Host-2 | 0.47 | 0.03 | 0.00 |
| Comp. 4 | FD-2 | 23 | 5.3 | 2.7 | 455 | — | Host-4 | 1.00 | 1.00 | 0.00 |
| Ex. 7 | FD-3 | 17 | 5.6 | 2.8 | 447 | PD-1 | Host-3 | 1.41 | 0.70 | 2.00 |
| Ex. 8 | FD-3 | 17 | 5.6 | 2.8 | 447 | PD-2 | Host-2 | 1.76 | 0.70 | 2.00 |
| Ex. 9 | FD-3 | 17 | 5.6 | 2.8 | 447 | PD-3 | Host-1 | 1.41 | 0.80 | 3.00 |
| Comp. 5 | FD-3 | 17 | 5.6 | 2.8 | 447 | — | Host-3 | 0.35 | 0.03 | 0.00 |
| Comp. 6 | FD-3 | 17 | 5.6 | 2.8 | 447 | — | Host-4 | 1.00 | 1.00 | 0.00 |
| Ex. 10 | FD-5 | 18 | 5.7 | 2.8 | 447 | PD-1 | Host-1 | 1.41 | 0.70 | 4.00 |
| Ex. 11 | FD-5 | 18 | 5.7 | 2.8 | 447 | PD-2 | Host-3 | 1.76 | 0.70 | 5.00 |
| Ex. 12 | FD-5 | 18 | 5.7 | 2.8 | 447 | PD-3 | Host-2 | 1.41 | 0.84 | 7.00 |
| Comp. 7 | FD-5 | 18 | 5.7 | 2.8 | 447 | — | Host-1 | 0.35 | 0.02 | 0.00 |
| Comp. 8 | FD-5 | 18 | 5.7 | 2.8 | 447 | — | Host-4 | 1.00 | 1.00 | 0.00 |
| Ex. 13 | FD-6 | 19 | 5.6 | 2.8 | 448 | PD-1 | Host-1 | 1.45 | 0.75 | 4.00 |
| Ex. 14 | FD-6 | 19 | 5.6 | 2.8 | 448 | PD-2 | Host-3 | 1.80 | 0.75 | 5.00 |
| Ex. 15 | FD-6 | 19 | 5.6 | 2.8 | 448 | PD-3 | Host-2 | 1.40 | 0.94 | 7.00 |
| Comp. 9 | FD-6 | 19 | 5.6 | 2.8 | 448 | — | Host-1 | 0.40 | 0.02 | 0.00 |
| Comp. 10 | FD-6 | 19 | 5.6 | 2.8 | 448 | — | Host-4 | 1.00 | 1.00 | 0.00 |
| Comp. 11 | — | — | — | — | — | PD-1 | Host-1 | 1.65 | 0.04 | 27.00 |
| Comp. 12 | — | — | — | — | — | PD-2 | Host-2 | 1.96 | 0.05 | 20.00 |
| Comp. 13 | — | — | — | — | — | PD-3 | Host-3 | 1.61 | 0.08 | 24.00 |
| Comp. 14 | FD-4 | 13 | 6.2 | 2.8 | 449 | — | Host-4 | 1.00 | 1.00 | 0.00 |
| Comp. 15 | FD-4 | 13 | 6.2 | 2.8 | 449 | PD-2 | Host-2 | 1.72 | 0.80 | 32.00 |

As shown in Table 1, Examples 1 to 3 (with respect to Comparative 2), Examples 4 to 6 (with respect to Comparative 4), Examples 7 to 9 (with respect to Comparative 6), Examples 10 to 12 (with respect to Comparative 8), and Examples 13 to 15 (with respect to Comparative 10), each of which contains the combination of the first and second compounds, exhibit substantially the same half bandwidth and lifetime and enhanced luminous efficiency.

The organic EL devices such as the organic EL devices of Comparatives 11 to 13, which use only the first compound in the combination of the first and second compounds, show significantly enlarged half bandwidth and significant reduction in lifetime, though showing high luminous efficiency.

The organic EL devices such as the organic EL devices of Comparatives 1, 3, 5, 7, and 9, which use only the second compound in the combination of the first and second compounds, show low luminous efficiency, though showing long lifetime and narrow half bandwidth.

The organic EL device (e.g. Comparative 15), whose emitting layer contains two types of dopants (one of the dopants (compound FD-4) failing to satisfy the requirements (a), (b), (c) and (d) for the second compound) and one host, shows significantly enlarged half bandwidth though showing high luminous efficiency and long lifetime thereof, thus failing to simultaneously satisfying the three characteristics of the luminous efficiency, lifetime and half bandwidth.

The organic EL device (e.g. Comparative 15), whose emitting layer contains two types of dopants (one of the dopants (compound FD-4) failing to be represented by any of the formulae (11), (21), (31), (41), (51), (61), (71), and (81), shows significantly enlarged half bandwidth though showing high luminous efficiency and long lifetime thereof, thus failing to simultaneously satisfying the three characteristics of the luminous efficiency, lifetime and half bandwidth.

The organic EL devices according to Examples 1 to 15, which use energy transfer from the first compound to the second compound, exhibits improved luminous efficiency as compared with the sole use of the second compound, while achieving substantially the same half bandwidth and lifetime characteristics as those of the device using only the second compound.

Evaluation of Compounds

Physical properties of the compounds used in Examples 1 to 15 and Comparatives 1 to 15 were evaluated as follows.

Half Bandwidth (FWHM)

Measurement target materials were each dissolved in toluene at a concentration in a range from $10^{-6}$ mol/L to $10^{-5}$ mol/L to prepare measurement samples. The measurement samples were each put into a quartz cell and were irradiated with excited light at a normal temperature (300K), to measure fluorescence spectrum (ordinate axis: fluorescence intensity, abscissa axis: wavelength) therefrom. A spectrophotofluorometer F-7000 manufactured by Hitachi High-Tech Science Corporation was used for the fluorescence spectrum measurement. The half bandwidth (unit: nm) was calculated by measuring a width of the wavelength of the measured fluorescence spectrum, at which the intensity of the fluorescence spectrum was half of the peak wavelength of the fluorescence spectrum.

Ionization Potential Ip

The ionization potential (unit: eV) was measured under atmosphere using a photoelectron spectroscope ("AC-3" manufactured by RIKEN KEIKI Co., Ltd.). Specifically, the measurement target material was irradiated with light and the amount of electrons generated by charge separation was measured to measure the ionization potential.

Singlet Energy $S_1$

The singlet energy $S_1$ (unit: eV) of each of the compounds FD-1, FD-2, FD-3, and FD-4 was measured by the above-described solution method. The measurement results are shown in Table 1.

Peak Top

The wavelength at which the fluorescence spectrum was maximized in the above-described measurement of the half bandwidth (FWHM) was defined as the peak top (unit: nm).

What is claimed is:

1. An organic electroluminescence device comprising:

an anode;

an emitting layer; and a cathode, wherein the emitting layer comprises a first compound and at least one second compound, and the second compound is a compound satisfying (a), (b), (c), and (d) below, (a) a half bandwidth being 30 nm or less;

(b) ionization potential being 6.0 eV or less;

(c) a singlet energy Si(M2) being 2.6 eV or more; and (d) a peak top in a toluene solution being 465 nm or less.

2. The organic electroluminescence device according to claim 1, wherein the at least one second compound is at least one compound selected from the group consisting of compounds represented by formulae (21), (31), (41), (51), and (61) below, (21)

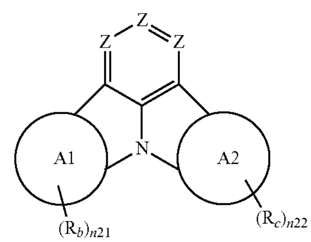

where, in the formula (21): Z are each independently $CR_a$ or N, a plurality of Z being mutually the same or different;

A1 ring and A2 ring are each independently a substituted or unsubstituted aromatic hydrocarbon ring having 6 to 50 ring carbon atoms or a substituted or unsubstituted heterocycle having 5 to 50 ring atoms;

when a plurality of $R_a$ are present, at least one combination of adjacent two or more of $R_a$ are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of $R_b$ are present, at least one combination of adjacent two or more of $R_b$ are mutually bonded to form a substituted or unsubstituted monocyclic ring, mutually bonded to form a substituted or unsubstituted fused ring, or not mutually bonded;

when a plurality of $R_c$ are present, at least one combination of adjacent two or more of $R_c$ are mutually bonded to form a substituted or unsubstituted monocyclic ring, mutually bonded to form a substituted or unsubstituted fused ring, or not mutually bonded;

$R_a$, $R_b$ and $R_c$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$, $R_{902}$, $R_{903}$, $R_{904}$, $R_{905}$, $R_{906}$, and $R_{907}$ in the formula (21) are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different, (31)

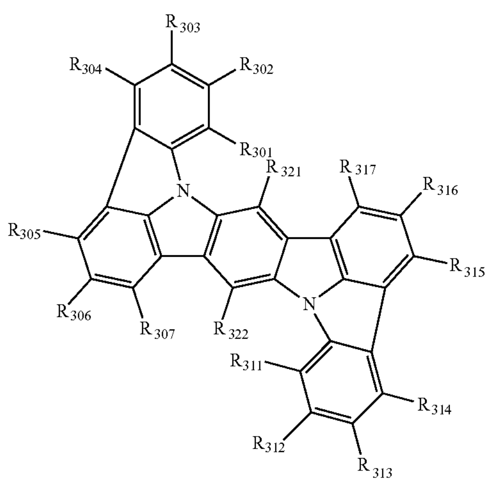

where, in the formula (31): at least one combination of adjacent two or more of $R_{301}$ to $R_{307}$ and $R_{311}$ to $R_{317}$ are mutually bonded to form a substituted or unsubstituted monocyclic ring, mutually bonded to form a substituted or unsubstituted fused ring, or not mutually bonded;

$R_{301}$ to $R_{307}$ and $R_{311}$ to $R_{317}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{321}$ and $R_{322}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formula (31) respectively represent the same as $R_{901}$ to $R_{907}$ of the formula (21);

(41)

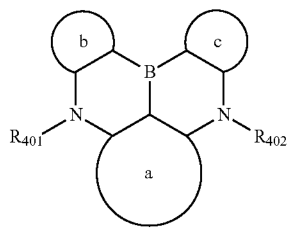

where, in the formula (41): an a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{401}$ and $R_{402}$ are each independently bonded with the a ring, b ring, or c ring to form a substituted or unsubstituted heterocyclic group having 5 to 50 ring atoms, or not bonded with the a ring, b ring or c ring; and $R_{401}$ and $R_{402}$ not forming the substituted or unsubstituted heterocycle having 5 to 50 ring atoms each independently are a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

(51)

p—q—r—s—t (52)

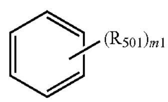

-continued (53)

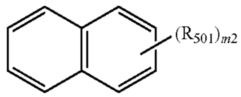

(54)

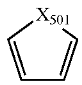

(55)

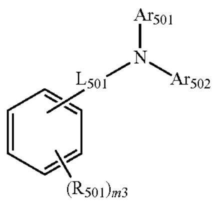

(56)

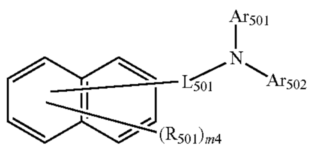

where, in the formula (51): r ring is a ring represented by the formula (52) or the formula (53), the r ring being fused at any position of respective adjacent rings;

q ring and s ring are each independently a ring represented by the formula (54) and fused at any position of respective adjacent rings;

p ring and t ring are each independently a ring represented by the formula (55) or the formula (56) and fused at any position of respective adjacent rings;

m1 in the formula (52) is 2;

m2 in the formula (53) is 4;

m3 in the formula (55) is 3;

m4 in the formula (56) is 5;

when a plurality of $R_{501}$ are present, the plurality of $R_{501}$ are mutually the same or different;

when a plurality of $R_{501}$ are present in the formula (52), the formula (53), the formula (55) or the formula (56), at least one combination of adjacent two or more of the plurality of $R_{501}$ are mutually bonded to form a substituted or unsubstituted monocyclic ring, mutually bonded to form a substituted or unsubstituted fused ring, or not mutually bonded;

$X_{501}$ in the formula (54) is an oxygen atom, a sulfur atom, or $NR_{502}$;

when a plurality of $X_{501}$ are present, the plurality of $X_{501}$ are mutually the same or different;

when a plurality of $R_{502}$ are present, the plurality of $R_{502}$ are mutually the same or different;

$R_{501}$ not forming the substituted or unsubstituted monocyclic ring and not forming the substituted or unsubstituted fused ring and $R_{502}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (52) to (54) respectively represent the same as $R_{901}$ to $R_{907}$ of the formula (21);

in the formulae (55) and (56):

$Ar_{501}$ and $Ar_{502}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $Ar_{501}$ are present, the plurality of $Ar_{501}$ are mutually the same or different;

when a plurality of Arson are present, the plurality of Arson are mutually the same or different;

$L_{501}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms; and when a plurality of $L_{501}$ are present, the plurality of $L_{501}$ are mutually the same or different, (61)

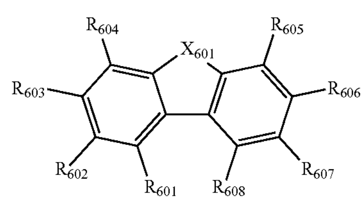

where, in the formula (61): $X_{601}$ is an oxygen atom, a sulfur atom, or $NR_{609}$;

at least one combination of adjacent two or more of $R_{601}$ to $R_{604}$ are mutually bonded to form a substituted or unsubstituted monocyclic ring, mutually bonded to form a substituted or unsubstituted fused ring, or not mutually bonded;

the at least one combination of the adjacent two or more of $R_{601}$ to $R_{604}$ are mutually bonded to form a divalent group represented by a formula (62) below;

at least one combination of adjacent two or more of $R_{605}$ to $R_{608}$ are mutually bonded to form a substituted or unsubstituted monocyclic ring, mutually bonded to form a substituted or unsubstituted fused ring, or not mutually bonded; and the at least one combination of the adjacent two or more of $R_{605}$ to $R_{608}$ are mutually bonded to form a divalent group represented by a formula (63) below;

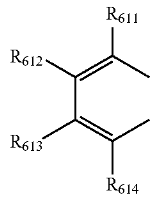

(62)

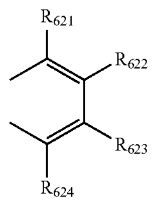

(63)

$R_{601}$ to $R_{604}$ not forming the divalent group represented by the formula (62), not forming the substituted or unsubstituted monocyclic ring and not forming the substituted or unsubstituted fused ring and at least one of $R_{611}$ to $R_{614}$ in the formula (62) are each a monovalent group represented by a formula (64) below, at least one of $R_{605}$ to $R_{608}$ not forming the divalent group represented by the formula (63), not forming the substituted or unsubstituted monocyclic ring and not forming the substituted or unsubstituted fused ring and at least one of $R_{621}$ to $R_{624}$ in the formula (63) are each a monovalent group represented by a formula (64) below,

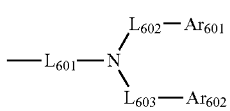

(64)

$R_{601}$ to $R_{608}$ not forming the divalent group represented by the formula (62) or (63), not being the monovalent group represented by the formula (64), not forming the substituted or unsubstituted monocyclic ring and not forming the substituted or unsubstituted fused ring, $R_{611}$ to $R_{614}$ and $R_{621}$ to $R_{624}$ not being the monovalent group represented by the formula (64), and $R_{609}$ are each independently:

a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$) ($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (61) to (64) respectively represent the same as $R_{901}$ to $R_{907}$ of the formula (21), in the formula (64): $Ar_{601}$ and $Ar_{602}$ are each independently a substituted or unsubstituted aryl group having 6 to 50 ring carbon atoms, or a substituted or unsubstituted heterocyclic group having 5 to 50 ring atoms; and $L_{601}$ to $L_{603}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of the substituted or unsubstituted arylene group having 6 to 30 ring carbon atoms and the substituted or unsubstituted divalent heterocyclic group having 5 to 30 ring atoms.

3. The organic electroluminescence device according to claim 2, wherein the a ring, the b ring and the c ring in the formula (41) are each independently a substituted or unsubstituted aromatic hydrocarbon ring having 6 to 50 ring carbon atoms.

4. The organic electroluminescence device according to claim 2, wherein $R_{401}$ and $R_{402}$ in the formula (41) are each independently a substituted or unsubstituted aryl group having 6 to 50 ring carbon atoms, or a substituted or unsubstituted heterocyclic group having 5 to 50 ring atoms.

5. The organic electroluminescence device according to claim 2, wherein $R_{401}$ and $R_{402}$ in the formula (41) are each independently a substituted or unsubstituted aryl group having 6 to 50 ring carbon atoms.

6. The organic electroluminescence device according to claim 2, wherein the compound represented by the formula (41) is represented by a formula (42) below,

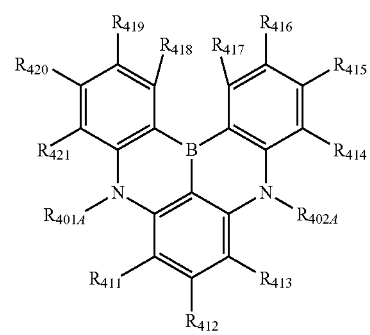

(42)

where, in the formula (42): $R_{401A}$ is bonded with at least one moiety selected from the group consisting of $R_{411}$ and $R_{421}$ to form a substituted or unsubstituted heterocycle, or to form no substituted or unsubstituted heterocycle;

$R_{402A}$ is bonded with at least one moiety selected from the group consisting of $R_{413}$ and $R_{414}$ to form a substituted or unsubstituted heterocycle, or to form no substituted or unsubstituted heterocycle;

$R_{401A}$ and $R_{402A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{411}$ to $R_{421}$ are mutually bonded to form a substituted or unsubstituted monocyclic ring, mutually bonded to form a substituted or unsubstituted fused ring, or not mutually bonded;

$R_{411}$ to $R_{421}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$) ($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ respectively represent the same as $R_{901}$ to $R_{907}$ of the formula (21).

7. The organic electroluminescence device according to claim 2, wherein the compound represented by the formula (41) is represented by a formula (43) below;

(43)

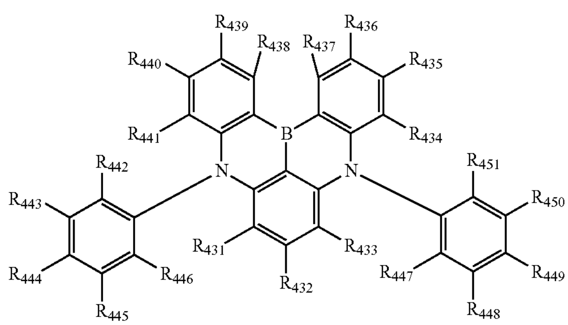

where, in the formula (43): a combination of $R_{431}$ and $R_{446}$ are mutually bonded to form a substituted or unsubstituted heterocycle, or not mutually bonded;

a combination of $R_{433}$ and $R_{447}$ are mutually bonded to form a substituted or unsubstituted heterocycle, or not mutually bonded;

a combination of $R_{434}$ and $R_{451}$ are mutually bonded to form a substituted or unsubstituted heterocycle, or not mutually bonded;

a combination of $R_{441}$ and $R_{442}$ are mutually bonded to form a substituted or unsubstituted heterocycle, or not mutually bonded;

at least one combination of adjacent two or more of $R_{431}$ to $R_{451}$ are mutually bonded to form a substituted or unsubstituted monocyclic ring, mutually bonded to form a substituted or unsubstituted fused ring, or not mutually bonded;

$R_{431}$ to $R_{451}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$) ($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ respectively represent the same as $R_{901}$ to $R_{907}$ of the formula (21).

8. The organic electroluminescence device according to claim 1, wherein the first compound is a metal complex.

9. The organic electroluminescence device according to claim 8, wherein the metal complex as the first compound is an iridium complex, a copper complex, a platinum complex, an osmium complex, or a gold complex.

10. The organic electroluminescence device according to claim 8, wherein the metal complex as the first compound is represented by a formula (100) below, (100)

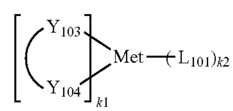

where, in the formula (100): Met represents a metal atom; ($Y_{103}$-$Y_{104}$) is a bidentate ligand;

$Y_{103}$ and $Y_{104}$ are each independently selected from C, N, O, P, and S;

$L_{101}$ is a ligand different from the bidentate ligand represented by ($Y_{103}$-$Y_{104}$);

k1 is an integer ranging from 1 to a maximum number of the ligand capable of being coordinated with the metal Met, and k1+k2 is the maximum number of the ligand capable of being coordinated with the metal Met.

11. The organic electroluminescence device according to claim 8, wherein the metal complex as the first compound is a phosphorescent metal complex comprising a monoanionic bidentate ligand represented by a formula (101) below;

the metal in the phosphorescent metal complex is selected from the group consisting of non-radioactive metals having an atomic number of more than 40; and the monoanionic bidentate ligand is optionally bonded with other ligand to form a tridentate, quadridentate, pentadentate, or hexadentate ligand;

(101)

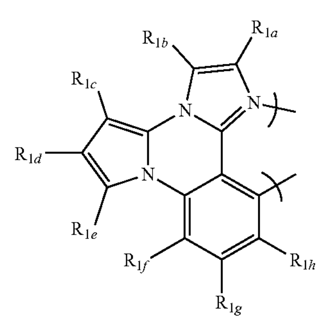

where, in the formula (101):

at least one combination of adjacent two or more of $R_{1a}$, $R_{1b}$, $R_{1c}$, $R_{1d}$, $R_{1e}$, $R_{1f}$, $R_{1g}$, and $R_{1h}$ are mutually bonded to form a substituted or unsubstituted monocyclic ring, mutually bonded to form a substituted or unsubstituted fused ring, or not mutually bonded;

$R_{1a}$, $R_{1b}$, $R_{1c}$, $R_{1d}$, $R_{1e}$, $R_{1f}$, $R_{1g}$, and $R_{1h}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$) ($R_{907}$), a group represented by —B($R_{908}$)($R_{909}$), a halogen atom, a cyano group, a nitro group, a substituted or unsubstituted aryl group having 6 to 50 ring carbon atoms, or a substituted or unsubstituted heterocyclic group having 5 to 50 ring atoms;

at least one combination of adjacent two or more of $R_{1a}$, $R_{1b}$, $R_{1c}$, $R_{1d}$, $R_{1e}$, $R_{1f}$, $R_{1g}$, $R_{1h}$, $R_{901}$, $R_{902}$, $R_{903}$, $R_{904}$, $R_{905}$, $R_{906}$, $R_{907}$, $R_{908}$, and $R_{909}$ are mutually bonded to form a substituted or unsubstituted monocyclic ring, mutually bonded to form a substituted or unsubstituted fused ring, or not mutually bonded; and $R_{901}$, $R_{902}$, $R_{903}$, $R_{904}$, $R_{905}$, $R_{906}$, $R_{907}$, $R_{908}$, and $R_{909}$ not forming the substituted or unsubstituted monocyclic ring and not forming the substituted or unsubstituted fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

12. The organic electroluminescence device according to claim 8, wherein the metal complex as the first compound is represented by a formula (102) below,

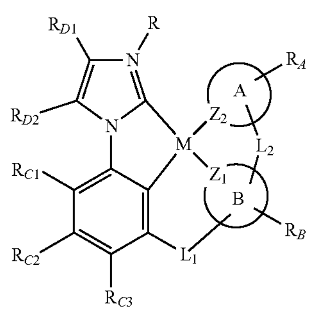

(102)

where, in the formula (102):

M represents a metal atom;

A ring and B ring are each independently a pentacyclic or hexacyclic aromatic ring;

$Z_1$ and $Z_2$ are each independently selected from the group consisting of C and N;

$L_1$ and $L_2$ are each independently a single bond, $BR_{121}$, $NR_{122}$, $PR_{123}$, an oxygen atom, a sulfur atom, a selenium atom, C═O, S═O, $SO_2$, a substituted or unsubstituted alkylene group having 1 to 50 carbon atoms, a substituted or unsubstituted alkenylene group having 2 to 50 carbon atoms, a substituted or unsubstituted cycloalkylene group having 3 to 50 ring carbon atoms, Si($R_{124}$)($R_{125}$), Ge($R_{126}$)($R_{127}$), and a combination of the above groups; and a combination of $R_A$ and $L_2$ are mutually bonded to form a substituted or unsubstituted monocyclic ring, mutually bonded to form a substituted or unsubstituted fused ring, or not mutually bonded;

a combination of $R_B$ and $L_2$ are mutually bonded to form a substituted or unsubstituted monocyclic ring, mutually bonded to form a substituted or unsubstituted fused ring, or not mutually bonded;

when a plurality of $R_A$ are present, at least one combination of adjacent two or more of $R_A$ are mutually bonded to form a substituted or unsubstituted monocyclic ring, mutually bonded to form a substituted or unsubstituted fused ring, or not mutually bonded;

when a plurality of $R_B$ are present, at least one combination of adjacent two or more of $R_B$ are mutually bonded to form a substituted or unsubstituted monocyclic ring, mutually bonded to form a substituted or unsubstituted fused ring, or not mutually bonded;

at least one combination of adjacent two or more of $R_{C1}$, $R_{C2}$, and $R_{C3}$ are mutually bonded to form a substituted or unsubstituted monocyclic ring, mutually bonded to form a substituted or unsubstituted fused ring, or not mutually bonded;

a combination of $R_{D1}$ and $R_{D2}$ are mutually bonded to form a substituted or unsubstituted monocyclic ring, mutually bonded to form a substituted or unsubstituted fused ring, or not mutually bonded;

$R_{121}$ to $R_{127}$ and $R_A$, $R_B$, $R_{C1}$, $R_{C2}$, $R_{C3}$, $R_{D1}$, and $R_{D2}$ not forming the substituted or unsubstituted monocyclic ring and not forming the substituted or unsubstituted fused ring are each independently selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, an acyl group, a carbonyl group, a carboxy group, an ester group, an isonitrile group, a sulfanyl group, a sulfinyl group, a sulfonyl group, a phosphino group, a substituted or unsubstituted aryl group having 6 to 50 ring carbon atoms, a substituted or unsubstituted heterocyclic group having 5 to 50 ring atoms, and a combination of the above groups; and R is selected from the group consisting of a hydrogen atom, a substituted or unsubstituted alkyl group having 1 to 50 carbon atoms, a substituted or unsubstituted cycloalkyl group having 3 to 50 ring carbon atoms, a substituted or unsubstituted aralkyl group, a group represented by —Si($R_{901}$) ($R_{902}$)($R_{903}$), a substituted or unsubstituted aryl group having 6 to 50 ring carbon atoms, a substituted or unsubstituted heterocyclic group having 5 to 50 ring atoms, and a combination of the above groups; and $R_{901}$, $R_{902}$, $R_{903}$, $R_{904}$, $R_{905}$, $R_{906}$, $R_{907}$, $R_{908}$, and $R_{909}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

13. The organic electroluminescence device according to claim 8, wherein the metal complex as the first compound is represented by a formula (103) below,

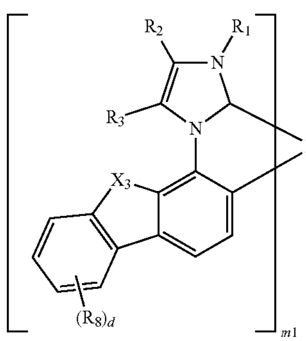

(103)

where, in the formula (103): M represents a metal atom; $X_3$ is an oxygen atom, sulfur atom, $NR_{X1}$ or $C(R_{X2})(R_{X3})$;

$R_{X1}$, $R_{X2}$ and $R_{X3}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

a combination of $R_1$ and $R_2$ or a combination of $R_2$ and $R_3$ are mutually bonded to form a substituted or unsubstituted five-membered ring, mutually bonded to form a substituted or unsubstituted six-membered ring, or not mutually bonded;

at least one combination of adjacent two or more of a plurality of $R_8$ are mutually bonded to form a substituted or unsubstituted five-membered ring, mutually bonded to form a substituted or unsubstituted six-membered ring, or not mutually bonded;

the substituted or unsubstituted five-membered ring and the substituted or unsubstituted six-membered ring are each independently a cycloalkyl, a cycloheteroalkyl, an aryl, or a heteroaryl;

the substituted five-membered ring and the substituted six-membered ring each independently include one or more substituents J, a plurality of substituents J, when present, being mutually the same or different;

at least one combination of adjacent two or more of the plurality of substituents J are mutually bonded to form a substituted or unsubstituted five-membered ring, mutually bonded to form a substituted or unsubstituted six-membered ring, or not mutually bonded;

the substituent(s) J not forming the substituted or unsubstituted five-membered ring and the substituted or unsubstituted six-membered ring are each independently $R_{J1}$, CN, $CF_3$, $C(O)OR_{J2}$, $C(O)R_{J3}$, $C(O)N(R_{J4})(R_{J5})$, $NR(R_{J6})(R_{J7})$, $NO_2$, $ORJ_8$, $SRJ_9$, $SO_2$, $SORJ_{10}$, or $SO_3RJ_{11}$;

$R_{J1}$, $R_{J2}$, $R_{J3}$, $R_{J4}$, $R_{J5}$, $R_{J6}$, $R_{J7}$, $R_{J8}$, $R_{J9}$, $R_{J10}$, and $R_{J11}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

$R_1$ not forming the substituted or unsubstituted five-membered ring and the substituted or unsubstituted six-membered ring are a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a substituted or unsubstituted aryl group having 6 to 50 ring carbon atoms, or a substituted or unsubstituted heterocyclic group having 5 to 50 ring atoms, $R_2$, $R_3$, and $R_8$ not forming the substituted or unsubstituted five-membered ring and the substituted or unsubstituted six-membered ring are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a cyano group, a trifluoromethyl group, a group represented by $CO_2R_{131}$, a group represented by $C(O)R_{132}$, a group represented by $C(O)N(R_{133})(R_{134})$, a group represented by $N(R_{135})(R_{136})$, $NO_2$, a group represented by $OR_{137}$, a group represented by $SR_{138}$, $SO_2$, a group represented by $SOR_{139}$, a group represented by $SO_3R_{140}$, a halogen atom, a substituted or unsubstituted aryl group having 6 to 50 ring carbon atoms, or a substituted or unsubstituted heterocyclic group having 5 to 50 ring atoms;

$R_{131}$ to $R_{140}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

(X—Y) is selected from a photoactive ligand or an auxiliary ligand;

d is 0, 1, 2, 3, or 4;

m1 is a number ranging from 1 to a maximum number of the ligand bondable with the metal M; and m1+m2 is the maximum number of the ligand bondable with the metal M.

14. The organic electroluminescence device according to claim 1, wherein the emitting layer further comprises a third compound.

15. The organic electroluminescence device according to claim 1, further comprising:

a hole transporting layer between the anode and the emitting layer.

16. The organic electroluminescence device according to claim 1, further comprising:

an electron transporting layer between the cathode and the emitting layer.

17. An electronic device comprising the organic electroluminescence device according to claim 1.

18. An organic electroluminescence device comprising:

an anode;

an emitting layer; and a cathode, wherein the emitting layer comprises a first compound and a second compound, the first compound is a metal complex, and the second compound is at least one compound selected from the group consisting of compounds represented by a formula (11), a formula (21), a formula (31), a formula (41), a formula (51), a formula (61), a formula (71) and a formula (81) below, (11)

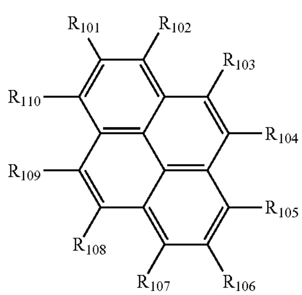

where, in the formula (11): at least one combination of adjacent two or more of $R_{101}$ to $R_{110}$ are mutually bonded to form a substituted or unsubstituted monocyclic ring, mutually bonded to form a substituted or unsubstituted fused ring, or not mutually bonded;

$R_{101}$ to $R_{110}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

at least one of $R_{101}$ to $R_{110}$ not forming the substituted or unsubstituted monocyclic ring and not forming the substituted or unsubstituted fused ring is a monovalent group represented by a formula (12) below;

$R_{901}$, $R_{902}$, $R_{903}$, $R_{904}$, $R_{905}$, $R_{906}$, and $R_{907}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different, (12)

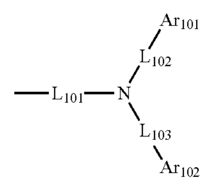

where, in the formula (12): $Ar_{101}$ and $Ar_{102}$ are each independently a substituted or unsubstituted aryl group having 6 to 50 ring carbon atoms, or a substituted or unsubstituted heterocyclic group having 5 to 50 ring atoms;

$L_{101}$ to $L_{103}$ are each independently a single bond, a substituted or unsubstituted arylene group having 6 to 30 ring carbon atoms, or a substituted or unsubstituted divalent heterocyclic group having 5 to 30 ring atoms;

(21)

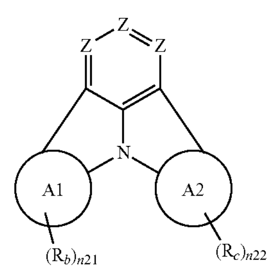

where, in the formula (21): Z are each independently $CR_a$ or N, a plurality of Z being mutually the same or different;

A1 ring and A2 ring are each independently a substituted or unsubstituted aromatic hydrocarbon ring having 6 to 50 ring carbon atoms or a substituted or unsubstituted heterocycle having 5 to 50 ring atoms;

when a plurality of $R_a$ are present, at least one combination of adjacent two or more of $R_a$ are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of $R_b$ are present, at least one combination of adjacent two or more of $R_b$ are mutually bonded to form a substituted or unsubstituted monocyclic ring, mutually bonded to form a substituted or unsubstituted fused ring, or not mutually bonded;

when a plurality of $R_c$ are present, at least one combination of adjacent two or more of $R_c$ are mutually bonded to form a substituted or unsubstituted monocyclic ring, mutually bonded to form a substituted or unsubstituted fused ring, or not mutually bonded;

$R_a$, $R_b$ and $R_c$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formula (21) respectively represent the same as $R_{901}$ to $R_{907}$ of the formula (11);

(31)

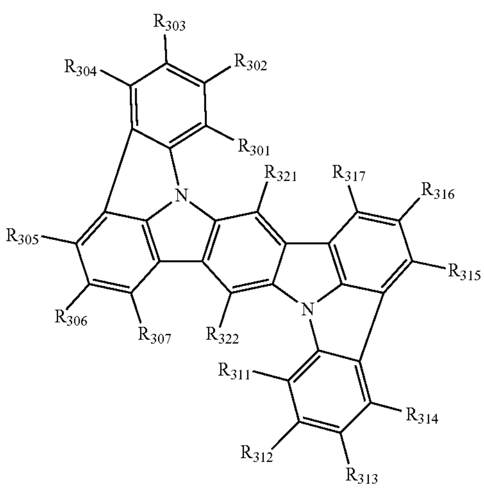

where, in the formula (31): at least one combination of adjacent two or more of $R_{301}$ to $R_{307}$ and $R_{311}$ to $R_{317}$ are mutually bonded to form a substituted or unsubstituted monocyclic ring, mutually bonded to form a substituted or unsubstituted fused ring, or not mutually bonded;

$R_{301}$ to $R_{307}$ and $R_{311}$ to $R_{317}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{321}$ and $R_{322}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formula (31) respectively represent the same as $R_{901}$ to $R_{907}$ of the formula (11);

(41)

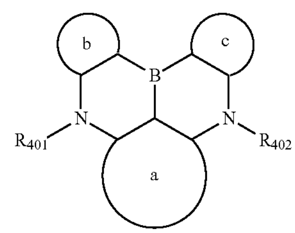

where, in the formula (41): a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{401}$ and $R_{402}$ are each independently bonded with the a ring, b ring, or c ring to form a substituted or unsubstituted heterocyclic group having 5 to 50 ring atoms, or not bonded with the a ring, b ring or c ring;

$R_{401}$ and $R_{402}$ not forming the substituted or unsubstituted heterocycle having 5 to 50 ring atoms each independently are a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

(51)

p-q-r-s-t (52)

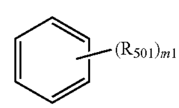

(53)

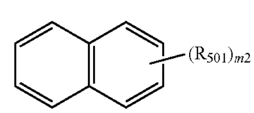

-continued (54)

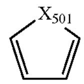

(55)

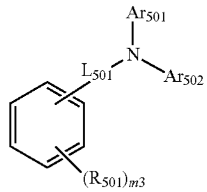

(56)

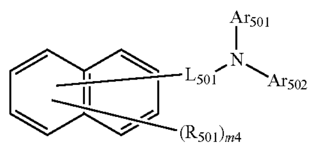

where, in the formula (51): r ring is a ring represented by the formula (52) or the formula (53), the r ring being fused at any position of respective adjacent rings;

q ring and s ring are each independently a ring represented by the formula (54) and fused at any position of respective adjacent rings;

p ring and t ring are each independently a ring represented by the formula (55) or the formula (56) and fused at any position of respective adjacent rings;

m1 in the formula (52) is 2;

m2 in the formula (53) is 4;

m3 in the formula (55) is 3;

m4 in the formula (56) is 5;

when a plurality of $R_{501}$ are present, the plurality of $R_{501}$ are mutually the same or different;

when a plurality of $R_{501}$ are present in the formula (52), the formula (53), the formula (55) or the formula (56), at least one combination of adjacent two or more of the plurality of $R_{501}$ are mutually bonded to form a substituted or unsubstituted monocyclic ring, mutually bonded to form a substituted or unsubstituted fused ring, or not mutually bonded;

$X_{501}$ in the formula (54) is an oxygen atom, a sulfur atom, or $NR_{502}$;

when a plurality of $X_{501}$ are present, the plurality of $X_{501}$ are mutually the same or different;

when a plurality of $R_{502}$ are present, the plurality of $R_{502}$ are mutually the same or different;

$R_{501}$ not forming the substituted or unsubstituted monocyclic ring and not forming the substituted or unsubstituted fused ring and $R_{502}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (52) to (54) respectively represent the same as $R_{901}$ to $R_{907}$ of the formula (11);

in the formulae (55) and (56):

$Ar_{501}$ and $Ar_{502}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $Ar_{501}$ are present, the plurality of $Ar_{501}$ are mutually the same or different;

when a plurality of Arson are present, the plurality of Arson are mutually the same or different;

$L_{501}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms; and when a plurality of $L_{501}$ are present, the plurality of $L_{501}$ are mutually the same or different, (61)

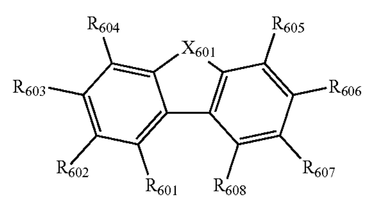

where, in the formula (61): $X_{601}$ is an oxygen atom, a sulfur atom, or $NR_{609}$;

at least one combination of adjacent two or more of $R_{601}$ to $R_{604}$ are mutually bonded to form a substituted or unsubstituted monocyclic ring, mutually bonded to form a substituted or unsubstituted fused ring, or not mutually bonded;

the at least one combination of the adjacent two or more of $R_{601}$ to $R_{604}$ are mutually bonded to form a divalent group represented by a formula (62) below;

at least one combination of adjacent two or more of $R_{605}$ to $R_{608}$ are mutually bonded to form a substituted or unsubstituted monocyclic ring, mutually bonded to form a substituted or unsubstituted fused ring, or not mutually bonded; and the at least one combination of the adjacent two or more of $R_{605}$ to $R_{608}$ are mutually bonded to form a divalent group represented by a formula (63) below;

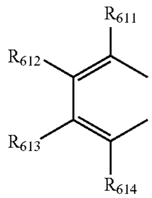

(62)

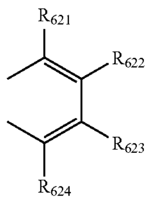

(63)

$R_{601}$ to $R_{604}$ not forming the divalent group represented by the formula (62), not forming the substituted or unsubstituted monocyclic ring and not forming the substituted or unsubstituted fused ring and at least one of $R_{611}$ to $R_{614}$ in the formula (62) are each a monovalent group represented by a formula (64) below;

at least one of $R_{605}$ to $R_{608}$ not forming the divalent group represented by the formula (63), not forming the substituted or unsubstituted monocyclic ring and not forming the substituted or unsubstituted fused ring and at least one of $R_{621}$ to $R_{624}$ in the formula (63) are each a monovalent group represented by a formula (64) below,

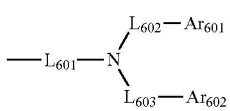

(64)

$R_{601}$ to $R_{608}$ not forming the divalent group represented by the formula (62) and (63), not being the monovalent group represented by the formula (64), not forming the substituted or unsubstituted monocyclic ring and not forming the substituted or unsubstituted fused ring, $R_{611}$ to $R_{614}$ and $R_{621}$ to $R_{624}$ not being the monovalent group represented by the formula (64), and $R_{609}$ are each independently:

a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (61) to (64) respectively represent the same as $R_{901}$ to $R_{907}$ of the formula (11);

in the formula (64): $Ar_{601}$ and $Ar_{602}$ are each independently a substituted or unsubstituted aryl group having 6 to 50 ring carbon atoms, or a substituted or unsubstituted heterocyclic group having 5 to 50 ring atoms;

$L_{601}$ to $L_{603}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of the substituted or unsubstituted arylene group having 6 to 30 ring carbon atoms and the substituted or unsubstituted divalent heterocyclic group having 5 to 30 ring atoms,

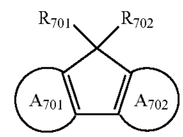

(71)

where, in the formula (71): a combination of $R_{701}$ and $R_{702}$ are mutually bonded to form a substituted or unsubstituted monocyclic ring, mutually bonded to form a substituted or unsubstituted fused ring, or not mutually bonded;

$A_{701}$ ring and $A_{702}$ ring are each independently a substituted or unsubstituted aromatic hydrocarbon ring having 6 to 50 ring carbon atoms or a substituted or unsubstituted heterocycle having 5 to 50 ring atoms; and at least one of a ring selected from the group consisting of $A_{701}$ ring and $A_{702}$ ring is bonded to a bond * of a structure represented by a formula (72) below;

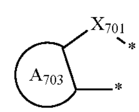

(72)

where, in the formula (72): $A_{703}$ ring is each independently a substituted or unsubstituted aromatic hydrocarbon ring having 6 to 50 ring carbon atoms or a substituted or unsubstituted heterocycle having 5 to 50 ring atoms;

$X_{701}$ is $NR_{703}$, C($R_{704}$)($R_{705}$), Si($R_{706}$)($R_{707}$), Ge($R_{708}$)($R_{709}$), an oxygen atom, a sulfur atom, or a selenium atom;

$R_{701}$ and $R_{702}$ not forming the substituted or unsubstituted monocyclic ring and not forming the substituted or unsubstituted fused ring and $R_{703}$ to $R_{709}$ each independently are a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$) ($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ of the formulae (71) to (72) respectively represent the same as $R_{901}$ to $R_{907}$ of the formula (11), (81)

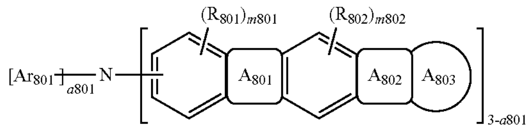

(82)

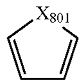

(83)

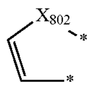

where, in the formula (81): $A_{801}$ ring is a ring represented by the formula (82) and fused at any positions of adjacent rings;

$A_{802}$ ring is a ring represented by the formula (83) and fused at any positions of adjacent rings, two bonds * of the $A_{802}$ ring being bonded to any positions of $A_{803}$ ring;

$X_{801}$ and $X_{802}$ are each independently $C(R_{803})(R_{804})$, $Si(R_{805})(R_{806})$, an oxygen atom, or a sulfur atom;

$A_{803}$ ring is a substituted or unsubstituted aromatic hydrocarbon ring having 6 to 50 ring carbon atoms or a substituted or unsubstituted heterocycle having 5 to 50 ring atoms;

$Ar_{501}$ is a substituted or unsubstituted aryl group having 6 to 50 ring carbon atoms, or a substituted or unsubstituted heterocyclic group having 5 to 50 ring atoms;

$R_{801}$ to $R_{806}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ of the formulae (81) to (83) respectively represent the same as $R_{901}$ to $R_{907}$ of the formula (11);

m801 and m802 are each independently 0, 1, or 2;

when m801 is 2, the two $R_{801}$ are mutually the same or different;

when m802 is 2, the two $R_{802}$ are mutually the same or different;

a801 is 0, 1, or 2;

when a801 is 0 or 1, the structures enclosed by brackets with a subscript of "3-a801" are mutually the same or different; and when m801 is 2, the two $Ar_{501}$ are mutually the same or different.

19. The organic electroluminescence device according to claim 18, wherein, in the formula (11), two of $R_{101}$ to $R_{110}$ are groups represented by the formula (12).

20. The organic electroluminescence device according to claim 18, wherein the compound represented by the formula (11) is represented by a formula (13) below;

(13)

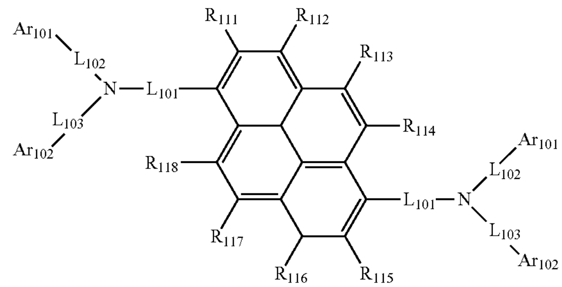

where, in the formula (13): $R_{111}$ to $R_{118}$ represent the same as $R_{101}$ to $R_{110}$ in the formula (11) that are not the monovalent group represented by the formula (12);

$Ar_{101}$, $Ar_{102}$, $L_{101}$, $L_{102}$, and $L_{103}$ represent the same as $Ar_{101}$, $Ar_{102}$, $L_{101}$, $L_{102}$, and $L_{103}$ in the formula (12);

two $Ar_{101}$ are mutually the same or different;

two $Ar_{102}$ are mutually the same or different;

two $L_{101}$ are mutually the same or different;

two $L_{102}$ are mutually the same or different; and two $L_{103}$ are mutually the same or different.

21. The organic electroluminescence device according to claim 20, wherein the compound represented by the formula (13) is represented by a formula (14) below, (14)

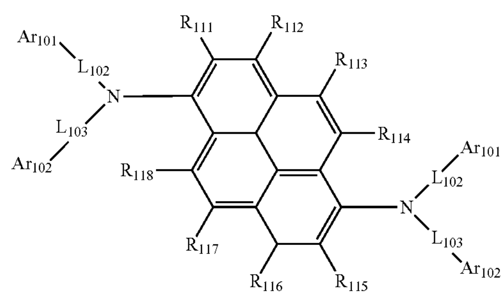

where, in the formula (14), $R_{111}$ to $R_{118}$ represent the same as $R_{111}$ to $R_{118}$ in the formula (13), $Ar_{101}$, $Ar_{102}$, $L_{102}$, and $L_{103}$ represent the same as $Ar_{101}$, $Ar_{102}$, $L_{102}$, and $L_{103}$ in the formula (13).

22. The organic electroluminescence device according to claim 20, wherein the compound represented by the formula (13) is represented by a formula (15) below;

(15)

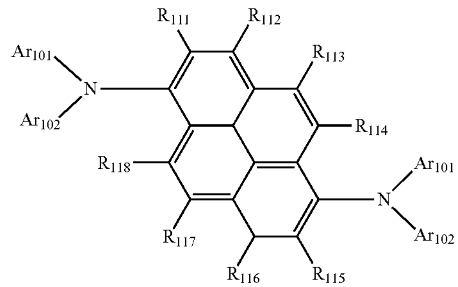

where, in the formula (15), $R_{111}$ to $R_{118}$ respectively represent the same as $R_{111}$ to $R_{118}$ in the formula (13)

and $Ar_{101}$ and $Ar_{102}$ respectively represent the same as $Ar_{101}$ and $Ar_{102}$ in the formula (13).

23. The organic electroluminescence device according to claim 20, wherein the compound represented by the formula (13) is represented by a formula (17) below, (17)

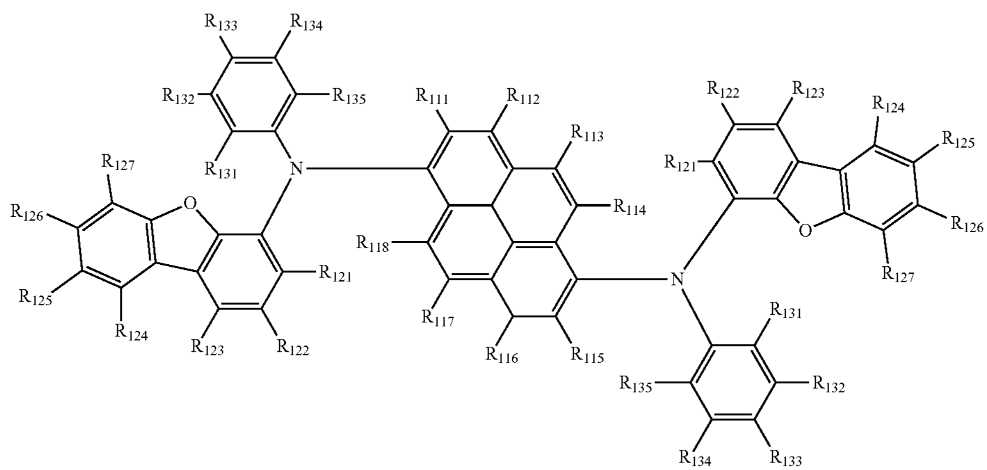

where, in the formula (17): $R_{111}$ to $R_{118}$ represent the same as $R_{111}$ to $R_{118}$ in the formula (13);

at least one combination of adjacent two or more of $R_{121}$ to $R_{127}$ are mutually bonded to form a substituted or unsubstituted monocyclic ring, mutually bonded to form a substituted or unsubstituted fused ring, or not mutually bonded;

$R_{121}$ to $R_{127}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

two $R_{121}$ are mutually the same or different, two $R_{122}$ are mutually the same or different, two $R_{123}$ are mutually the same or different, two $R_{124}$ are mutually the same or different, two $R_{125}$ are mutually the same or different, two $R_{126}$ are mutually the same or different, and two $R_{127}$ are mutually the same or different;

$R_{901}$ to $R_{907}$ respectively represent the same as $R_{901}$ to $R_{907}$ of the formula (11);

$R_{131}$ to $R_{135}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ respectively represent the same as $R_{901}$ to $R_{907}$ of the formula (11);

two $R_{131}$ are mutually the same or different, two $R_{132}$ are mutually the same or different, two $R_{133}$ are mutually the same or different, two $R_{134}$ are mutually the same or different, and two $R_{135}$ are mutually the same or different.

24. The organic electroluminescence device according to claim 18, wherein the a ring, the b ring and the c ring in the formula (41) are each independently a substituted or unsubstituted aromatic hydrocarbon ring having 6 to 50 ring carbon atoms.

25. The organic electroluminescence device according to claim 18, wherein $R_{401}$ and $R_{402}$ in the formula (41) are each independently a substituted or unsubstituted aryl group having 6 to 50 ring carbon atoms, or a substituted or unsubstituted heterocyclic group having 5 to 50 ring atoms.

26. The organic electroluminescence device according to claim 18, wherein $R_{401}$ and $R_{402}$ in the formula (41) are each independently a substituted or unsubstituted aryl group having 6 to 50 ring carbon atoms.

27. The organic electroluminescence device according to claim 18, wherein the compound represented by the formula (41) is represented by a formula (42) below, (42)

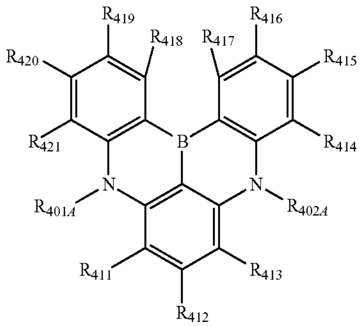

where, in the formula (42): $R_{401A}$ is bonded with at least one moiety selected from the group consisting of $R_{411}$ and $R_{421}$ to form a substituted or unsubstituted heterocycle, or to form no substituted or unsubstituted heterocycle;

$R_{402A}$ is bonded with at least one moiety selected from the group consisting of $R_{413}$ and $R_{414}$ to form a substituted or unsubstituted heterocycle, or to form no substituted or unsubstituted heterocycle;

$R_{401A}$ and $R_{402A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{411}$ to $R_{421}$ are mutually bonded to form a substituted or unsubstituted monocyclic ring, mutually bonded to form a substituted or unsubstituted fused ring, or not mutually bonded;

$R_{411}$ to $R_{421}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$) ($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ respectively represent the same as $R_{901}$ to $R_{907}$ of the formula (11).

28. The organic electroluminescence device according to claim 18, wherein the compound represented by the formula (41) is represented by a formula (43) below, (43)

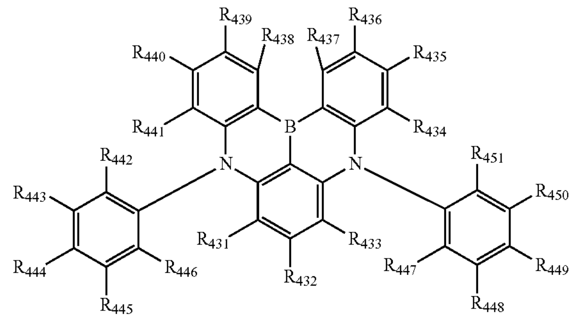

where, in the formula (43): a combination of $R_{431}$ and $R_{446}$ are mutually bonded to form a substituted or unsubstituted heterocycle, or not mutually bonded;

a combination of $R_{433}$ and $R_{447}$ are mutually bonded to form a substituted or unsubstituted heterocycle, or not mutually bonded;

a combination of $R_{434}$ and $R_{451}$ are mutually bonded to form a substituted or unsubstituted heterocycle, or not mutually bonded;

a combination of $R_{441}$ and $R_{442}$ are mutually bonded to form a substituted or unsubstituted heterocycle, or not mutually bonded;

at least one combination of adjacent two or more of $R_{431}$ to $R_{451}$ are mutually bonded to form a substituted or unsubstituted monocyclic ring, mutually bonded to form a substituted or unsubstituted fused ring, or not mutually bonded;

$R_{431}$ to $R_{451}$ not forming the substituted or unsubstituted heterocycle, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$) ($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ respectively represent the same as $R_{901}$ to $R_{907}$ of the formula (11).

29. The organic electroluminescence device according to claim 18, wherein the metal complex as the first compound is an iridium complex, a copper complex, a platinum complex, an osmium complex, or a gold complex.

30. The organic electroluminescence device according to claim 18, wherein the metal complex as the first compound is represented by a formula (100) below, (100)

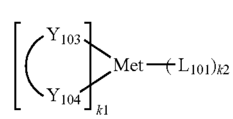

where, in the formula (100): Met represents a metal atom;

$(Y_{103}\text{-}Y_{104})$ is a bidentate ligand;

$Y_{103}$ and $Y_{104}$ are each independently selected from C, N, O, P, and S;

$L_{101}$ is a ligand different from the bidentate ligand represented by $(Y_{103}\text{-}Y_{104})$;

k1 is an integer ranging from 1 to a maximum number of the ligand capable of being coordinated with the metal Met, and k1+k2 is the maximum number of the ligand capable of being coordinated with the metal Met.

31. The organic electroluminescence device according to claim 18, wherein the metal complex as the first compound is a phosphorescent metal complex comprising a monoanionic bidentate ligand represented by a formula (101) below;

the metal in the phosphorescent metal complex is selected from the group consisting of non-radioactive metals having an atomic number of more than 40; and the monoanionic bidentate ligand is optionally bonded with other ligand to form a tridentate, quadridentate, pentadentate, or hexadentate ligand, (101)

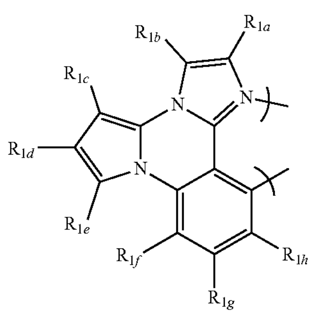

where, in the formula (101):

at least one combination of adjacent two or more of $R_{1a}$, $R_{1b}$, $R_{1c}$, $R_{1d}$, $R_{1e}$, $R_{1f}$, $R_{1g}$, and $R_{1h}$ are mutually bonded to form a substituted or unsubstituted monocyclic ring, mutually bonded to form a substituted or unsubstituted fused ring, or not mutually bonded;

$R_{1a}$, $R_{1b}$, $R_{1c}$, $R_{1d}$, $R_{1e}$, $R_{1f}$, $R_{1g}$, and $R_{1h}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$) ($R_{907}$), a group represented by —B($R_{908}$)($R_{909}$), a halogen atom, a cyano group, a nitro group, a substituted or unsubstituted aryl group having 6 to 50 ring carbon atoms, or a substituted or unsubstituted heterocyclic group having 5 to 50 ring atoms;

at least one combination of adjacent two or more of $R_{1a}$, $R_{1b}$, $R_{1c}$, $R_{1a}$, $R_{1e}$, $R_{1f}$, $R_{1g}$, $R_{1h}$, $R_{901}$, $R_{902}$, $R_{903}$, $R_{904}$, $R_{905}$, $R_{906}$, $R_{907}$, $R_{908}$, and $R_{909}$ are mutually bonded to form a substituted or unsubstituted monocyclic ring, mutually bonded to form a substituted or unsubstituted fused ring, or not mutually bonded; and $R_{901}$, $R_{902}$, $R_{903}$, $R_{904}$, $R_{905}$, $R_{906}$, $R_{907}$, $R_{908}$, and $R_{909}$ not forming the substituted or unsubstituted monocyclic ring and not forming the substituted or unsubstituted fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

32. The organic electroluminescence device according to claim 18, wherein the metal complex as the first compound is represented by a formula (102) below, (102)

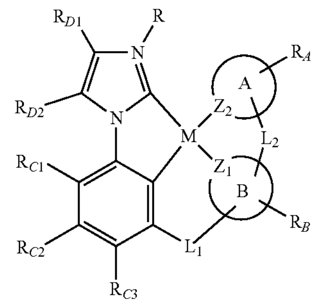

where, in the formula (102):

M represents a metal atom;

A ring and B ring are each independently a pentacyclic or hexacyclic aromatic ring;

$Z_1$ and $Z_2$ are each independently selected from the group consisting of C and N;

$L_1$ and $L_2$ are each independently a single bond, $BR_{121}$, $NR_{122}$, $PR_{123}$, an oxygen atom, a sulfur atom, a selenium atom, C═O, S═O, $SO_2$, a substituted or unsubstituted alkylene group having 1 to 50 carbon atoms, a substituted or unsubstituted alkenylene group having 2 to 50 carbon atoms, a substituted or unsubstituted cycloalkylene group having 3 to 50 ring carbon atoms, Si($R_{124}$)($R_{125}$), Ge($R_{126}$)($R_{127}$), and a combination of the above groups; and a combination of $R_A$ and $L_2$ are mutually bonded to form a substituted or unsubstituted monocyclic ring, mutually bonded to form a substituted or unsubstituted fused ring, or not mutually bonded;

a combination of $R_B$ and $L_2$ are mutually bonded to form a substituted or unsubstituted monocyclic ring, mutually bonded to form a substituted or unsubstituted fused ring, or not mutually bonded;

when a plurality of $R_A$ are present, at least one combination of adjacent two or more of $R_A$ are mutually bonded to form a substituted or unsubstituted monocyclic ring, mutually bonded to form a substituted or unsubstituted fused ring, or not mutually bonded;

when a plurality of $R_B$ are present, at least one combination of adjacent two or more of $R_B$ are mutually bonded to form a substituted or unsubstituted monocyclic ring, mutually bonded to form a substituted or unsubstituted fused ring, or not mutually bonded;

at least one combination of adjacent two or more of $R_{C1}$, $R_{C2}$, and $R_{C3}$ are mutually bonded to form a substituted or unsubstituted monocyclic ring, mutually bonded to form a substituted or unsubstituted fused ring, or not mutually bonded;

a combination of $R_{D1}$ and $R_{D2}$ are mutually bonded to form a substituted or unsubstituted monocyclic ring, mutually bonded to form a substituted or unsubstituted fused ring, or not mutually bonded;

$R_{121}$ to $R_{127}$ and $R_A$, $R_B$, $R_{C1}$, $R_{C2}$, $R_{C3}$, $R_{D1}$, and $R_{D2}$ not forming the substituted or unsubstituted monocyclic ring and not forming the substituted or unsubstituted fused ring are each independently selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, an acyl group, a carbonyl group, a carboxy group, an ester group, an isonitrile group, a sulfanyl group, a sulfinyl group, a sulfonyl group, a phosphino group, a substituted or unsubstituted aryl group having 6 to 50 ring carbon atoms, a substituted or unsubstituted heterocyclic group having 5 to 50 ring atoms, and a combination of the above groups; and R is selected from the group consisting of a hydrogen atom, a substituted or unsubstituted alkyl group having 1 to 50 carbon atoms, a substituted or unsubstituted cycloalkyl group having 3 to 50 ring carbon atoms, a substituted or unsubstituted aralkyl group, a group represented by —Si($R_{901}$)($R_{902}$)($R_{903}$), a substituted or unsubstituted aryl group having 6 to 50 ring carbon atoms, a substituted or unsubstituted heterocyclic group having 5 to 50 ring atoms, and a combination of the above groups; and $R_{901}$, $R_{902}$, $R_{903}$, $R_{904}$, $R_{905}$, $R_{906}$, $R_{907}$, $R_{908}$, and $R_{909}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

33. The organic electroluminescence device according to claim 18, wherein the metal complex as the first compound is represented by a formula (103) below, (103)

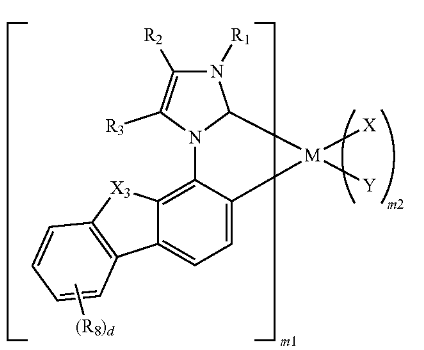

where, in the formula (103): M represents a metal atom; $X_3$ is an oxygen atom, sulfur atom, $NR_{X1}$ or $C(R_{X2})(R_{X3})$;

$R_{X1}$, $R_{X2}$ and $R_{X3}$ are each independently a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, or a substituted or unsubstituted cycloalkyl group having 3 to 50 ring carbon atoms;

a combination of $R_1$ and $R_2$ or a combination of $R_2$ and $R_3$ are mutually bonded to form a substituted or unsubstituted five-membered ring, mutually bonded to form a substituted or unsubstituted six-membered ring, or not mutually bonded;

at least one combination of adjacent two or more of a plurality of $R_8$ are mutually bonded to form a substituted or unsubstituted five-membered ring, mutually bonded to form a substituted or unsubstituted six-membered ring, or not mutually bonded;

the substituted or unsubstituted five-membered ring and the substituted or unsubstituted six-membered ring are each independently a cycloalkyl, a cycloheteroalkyl, an aryl, or a heteroaryl;

the substituted five-membered ring and the substituted six-membered ring each independently include one or more substituents J, a plurality of substituents J, when present, being mutually the same or different;

at least one combination of adjacent two or more of the plurality of substituents J are mutually bonded to form a substituted or unsubstituted five-membered ring, mutually bonded to form a substituted or unsubstituted six-membered ring, or not mutually bonded;

the substituent(s) J not forming the substituted or unsubstituted five-membered ring and the substituted or unsubstituted six-membered ring are each independently $R_{J1}$, CN, $CF_3$, $C(O)OR_{J2}$, $C(O)R_{J3}$, $C(O)N(R_{J4})(R_{J5})$, $NR(R_{J6})(R_{J7})$, $NO_2$, $ORJ_8$, $SRJ_9$, $SO_2$, $SO_2$, $SOR_{J10}$, or $SO_3R_{J11}$;

$R_{J1}$, $R_{J2}$, $R_{J3}$, $R_{J4}$, $R_{J5}$, $R_{J6}$, $R_{J7}$, $R_{J8}$, $R_{J9}$, $R_{J10}$, and $R_{J11}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

$R_1$ not forming the substituted or unsubstituted five-membered ring and the substituted or unsubstituted six-membered ring are a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a substituted or unsubstituted aryl group having 6 to 50 ring carbon atoms, or a substituted or unsubstituted heterocyclic group having 5 to 50 ring atoms, $R_2$, $R_3$, and $R_8$ not forming the substituted or unsubstituted five-membered ring and the substituted or unsubstituted six-membered ring are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a substituted or unsubstituted aralkyl group, a cyano group, a trifluoromethyl group, a group represented by $CO_2R_{131}$, a group represented by $C(O)R_{132}$, a group represented by $C(O)N(R_{133})(R_{134})$, a group represented by $N(R_{135})(R_{136})$, $NO_2$, a group represented by $OR_{137}$, a group represented by $SR_{138}$, $SO_2$, a group represented by $SOR_{139}$, a group represented by $SO_3R_{140}$, a halogen atom, a substituted or unsubstituted aryl group having 6 to 50 ring carbon atoms, or a substituted or unsubstituted heterocyclic group having 5 to 50 ring atoms;

$R_{131}$ to $R_{140}$ are each independently a hydrogen atom, a halogen atom, a substituted or unsubstituted alkyl having 1 to 50 carbon atoms, a substituted or unsubstituted cycloalkyl group having 3 to 50 ring carbon atoms, a substituted or unsubstituted alkenyl group having 2 to 50 carbon atoms, a substituted or unsubstituted alkynyl group having 2 to 50 carbon atoms, a heteroalkyl, a substituted or unsubstituted aralkyl group, a substituted or unsubstituted aryl having 6 to 50 ring carbon atoms, or a substituted or unsubstituted heterocyclic group having 5 to 50 ring atoms;

(X—Y) is selected from a photoactive ligand or an auxiliary ligand;

d is 0, 1, 2, 3, or 4;

m1 is a number ranging from 1 to a maximum number of the ligand bondable with the metal M; and m1+m2 is the maximum number of the ligand bondable with the metal M.

34. The organic electroluminescence device according to claim 18, wherein the emitting layer further comprises a third compound.

35. The organic electroluminescence device according to claim 18, further comprising:

a hole transporting layer between the anode and the emitting layer.

36. The organic electroluminescence device according to claim 18, further comprising:

an electron transporting layer between the cathode and the emitting layer.

37. An electronic device comprising the organic electroluminescence device according to claim 18.

* * * * *